(12) United States Patent
Soliman et al.

(10) Patent No.: US 11,864,295 B2
(45) Date of Patent: Jan. 2, 2024

(54) SELECTIVELY SHIELDED RADIO FREQUENCY MODULE WITH MULTI-MODE STACKED POWER AMPLIFIER STAGE

(71) Applicant: SKYWORKS SOLUTIONS, INC., Irvine, CA (US)

(72) Inventors: Yasser Khairat Soliman, Kanata (CA); Hoang Mong Nguyen, Fountain Valley, CA (US); Anthony James LoBianco, Irvine, CA (US); Gregory Edward Babcock, Ottawa (CA); Darren Roger Frenette, Pakenham (CA); George Khoury, Ottawa (CA); René Rodríguez, Rancho Santa Margarita, CA (US); Leslie Paul Wallis, Ottawa (CA)

(73) Assignee: Skyworks Solutions, Inc., Irvine, CA (US)

( * ) Notice: Subject to any disclaimer, the term of this patent is extended or adjusted under 35 U.S.C. 154(b) by 3 days.

(21) Appl. No.: 17/216,302

(22) Filed: Mar. 29, 2021

(65) Prior Publication Data

US 2021/0217714 A1 Jul. 15, 2021

Related U.S. Application Data

(62) Division of application No. 16/820,401, filed on Mar. 16, 2020, now Pat. No. 11,037,893, which is a
(Continued)

(51) Int. Cl.
*H01L 23/66* (2006.01)
*H05B 47/19* (2020.01)
(Continued)

(52) U.S. Cl.
CPC ............ *H05B 47/19* (2020.01); *F21V 23/006* (2013.01); *H01L 23/552* (2013.01); *H01L 23/66* (2013.01);
(Continued)

(58) Field of Classification Search
CPC ..... H05B 47/19; F21V 23/006; H01L 23/552; H01L 23/66; H01L 2223/665;
(Continued)

(56) References Cited

U.S. PATENT DOCUMENTS 2,293,414 A 8/1942 Strutt et al.
4,079,336 A 3/1978 Gross
(Continued)

FOREIGN PATENT DOCUMENTS

CN 101401206 4/2009
CN 102237342 11/2011
(Continued)

OTHER PUBLICATIONS

U.S. Appl. No. 15/857,217 Published as 2018/0226367 A1 Issued U.S. Pat. No. 10,276,521, filed Dec. 28, 2017, Front End Systems and Related Devices, Integrated Circuits, Modules, and Methods.
(Continued)

*Primary Examiner* — Dhaval V Patel
(74) *Attorney, Agent, or Firm* — Knobbe, Martens, Olson & Bear, LLP

(57) ABSTRACT

Front end systems and related devices, integrated circuits, modules, and methods are disclosed. One such packaged module includes a multi-mode power amplifier circuit in an interior of a radio frequency shielding structure and an antenna external to the radio frequency shielding structure. The multi-mode power amplifier circuit includes a stacked output stage including a transistor stack of two or more transistors. The multi-mode power amplifier circuit also
(Continued)

includes a bias circuit configured to control a bias of at least one transistor of the transistor stack based on a mode of the multi-mode power amplifier circuit. The radio frequency shielding structure can extend above a package substrate. The antenna can be on the package substrate. Other embodiments of front end systems are disclosed, along with related devices, integrated circuits, modules, methods, and components thereof.

20 Claims, 114 Drawing Sheets

Related U.S. Application Data division of application No. 16/354,923, filed on Mar. 15, 2019, now Pat. No. 10,629,553, which is a division of application No. 15/857,217, filed on Dec. 28, 2017, now Pat. No. 10,276,521.

(60) Provisional application No. 62/595,935, filed on Dec. 7, 2017, provisional application No. 62/594,179, filed on Dec. 4, 2017, provisional application No. 62/571,409, filed on Oct. 12, 2017, provisional application No. 62/570,459, filed on Oct. 10, 2017, provisional application No. 62/480,002, filed on Mar. 31, 2017, provisional application No. 62/440,241, filed on Dec. 29, 2016.

(51) Int. Cl.
| | | |
|---|---|---|
| *H03F 3/24* | (2006.01) | |
| *H03F 1/32* | (2006.01) | |
| *H01L 23/552* | (2006.01) | |
| *H04B 1/40* | (2015.01) | |
| *H03F 3/195* | (2006.01) | |
| *H03F 1/22* | (2006.01) | |
| *H03F 1/34* | (2006.01) | |
| *H03F 1/56* | (2006.01) | |
| *H04B 1/04* | (2006.01) | |
| *F21V 23/00* | (2015.01) | |
| *H04W 84/12* | (2009.01) | |
| *H01Q 1/38* | (2006.01) | |
| *H01Q 1/22* | (2006.01) | |
| *H01Q 9/42* | (2006.01) | |

(52) U.S. Cl.
CPC ............... *H03F 1/223* (2013.01); *H03F 1/32* (2013.01); *H03F 1/3205* (2013.01); *H03F 1/347* (2013.01); *H03F 1/565* (2013.01); *H03F 3/195* (2013.01); *H03F 3/245* (2013.01); *H04B 1/0475* (2013.01); *H04B 1/40* (2013.01); *H01L 2223/665* (2013.01); *H01L 2223/6655* (2013.01); *H01L 2223/6677* (2013.01); *H01L 2224/16145* (2013.01); *H01L 2224/16225* (2013.01); *H01L 2224/32145* (2013.01); *H01L 2224/48091* (2013.01); *H01L 2224/48195* (2013.01); *H01L 2224/48227* (2013.01); *H01L 2224/49171* (2013.01); *H01L 2224/73265* (2013.01); *H01L 2924/19104* (2013.01); *H01Q 1/2283* (2013.01); *H01Q 1/38* (2013.01); *H01Q 9/42* (2013.01); *H03F 2200/222* (2013.01); *H03F 2200/294* (2013.01); *H03F 2200/451* (2013.01); *H03F 2200/534* (2013.01); *H04B 2001/0433* (2013.01); *H04W 84/12* (2013.01)

(58) Field of Classification Search
CPC ..... H01L 2223/6655; H01L 2223/6677; H01L 2224/16145; H01L 2224/16225; H01L 2224/32145; H01L 2224/48091; H01L 2224/48195; H01L 2224/48227; H01L 2224/49171; H01L 2224/73265; H01L 2924/19104; H03F 1/223; H03F 1/32; H03F 1/3205; H03F 1/347; H03F 1/565; H03F 3/195; H03F 3/245; H03F 2200/222; H03F 2200/294; H03F 2200/451; H03F 2200/534; H03F 1/26; H03F 1/0205; H04B 1/0475; H04B 1/40; H04B 2001/0433; H04B 1/48; H01Q 1/2283; H01Q 1/38; H01Q 9/42; H01Q 1/24; H04W 84/12
See application file for complete search history.

(56) References Cited

U.S. PATENT DOCUMENTS

| | | |
|---|---|---|
| 4,122,403 A | 10/1978 | Cave |
| 4,159,450 A | 6/1979 | Hoover |
| 5,251,331 A | 10/1993 | Schwent et al. |
| 5,438,684 A | 8/1995 | Schwent et al. |
| 5,500,628 A | 3/1996 | Knecht |
| 5,949,294 A | 9/1999 | Kondo et al. |
| 6,064,249 A | 5/2000 | Duvvury et al. |
| 6,188,277 B1 | 2/2001 | Borodulin et al. |
| 6,229,249 B1 | 5/2001 | Hatanaka et al. |
| 6,388,546 B1 | 5/2002 | Kikokawa et al. |
| 6,392,603 B1 | 5/2002 | Kurz et al. |
| 6,549,077 B1 | 4/2003 | Jou |
| 6,606,483 B1 | 8/2003 | Baker et al. |
| 6,664,864 B2 | 12/2003 | Jiles et al. |
| 6,686,649 B1 | 2/2004 | Mathews et al. |
| 6,744,213 B2 | 6/2004 | Wilcoxson et al. |
| 6,850,196 B2 | 2/2005 | Wong et al. |
| 6,861,731 B2 | 3/2005 | Buijsman et al. |
| 6,873,211 B1* | 3/2005 | Thompson ............ H03G 1/007 330/296 |
| 6,977,552 B2 | 12/2005 | Macedo |
| 7,053,718 B2 | 5/2006 | Dupuis et al. |
| 7,352,247 B2 | 4/2008 | Oh et al. |
| 7,378,780 B2 | 5/2008 | Mizumura et al. |
| 7,409,192 B2 | 8/2008 | Lombardi et al. |
| 7,425,873 B2 | 9/2008 | Yamamoto |
| 7,679,452 B2 | 3/2010 | Perez |
| 7,786,807 B1 | 8/2010 | Li et al. |
| 7,911,269 B2 | 3/2011 | Yang et al. |
| 7,952,433 B2 | 5/2011 | An et al. |
| 8,125,788 B2 | 2/2012 | Hatanaka et al. |
| 8,131,251 B2 | 3/2012 | Burgener et al. |
| 8,199,518 B1 | 6/2012 | Chun et al. |
| 8,289,084 B2 | 10/2012 | Morimoto et al. |
| 8,310,835 B2 | 11/2012 | Lin et al. |
| 8,410,990 B2 | 4/2013 | Kazanchian |
| 8,456,856 B2 | 6/2013 | Lin et al. |
| 8,554,162 B2 | 10/2013 | Lindstrand et al. |
| 8,686,796 B2 | 4/2014 | Presti |
| 8,773,204 B2 | 7/2014 | Cabanillas et al. |
| 8,803,615 B2 | 8/2014 | Cabanillas et al. |
| 8,847,689 B2 | 9/2014 | Zhao et al. |
| 8,912,959 B2 | 12/2014 | Chiu et al. |
| 9,000,847 B2 | 4/2015 | Zhao et al. |
| 9,019,010 B2 | 4/2015 | Costa |
| 9,219,445 B2 | 12/2015 | Nobbe et al. |
| 9,225,303 B1 | 12/2015 | Nieland |
| 9,369,087 B2 | 6/2016 | Burgener et al. |
| 9,660,609 B2 | 5/2017 | Reisner et al. |
| 9,680,416 B2 | 6/2017 | Burgener et al. |
| 9,691,710 B1 | 6/2017 | Deng et al. |
| 9,786,613 B2 | 10/2017 | Stauber |
| 9,825,597 B2 | 11/2017 | Wallis |
| 9,831,414 B2 | 11/2017 | Kojo |
| 9,838,047 B2 | 12/2017 | Oliaei |
| 9,871,007 B2 | 1/2018 | Meyers et al. |
| 9,887,454 B2 | 2/2018 | Ito et al. |

(56) References Cited

U.S. PATENT DOCUMENTS

| | | | |
|---|---|---|---|
| 9,918,386 B2 | 3/2018 | Frenette et al. | |
| 10,062,670 B2 | 8/2018 | Frenette et al. | |
| 10,084,416 B2 | 9/2018 | Wallis | |
| 10,110,168 B2 | 10/2018 | Soliman | |
| 10,110,468 B2 | 10/2018 | Farmanbar | |
| 10,171,053 B2 | 1/2019 | Soliman | |
| 10,211,795 B2 | 2/2019 | Wallis | |
| 10,230,337 B2 | 3/2019 | Wallis | |
| 10,231,341 B2 | 3/2019 | Frenette et al. | |
| 10,256,535 B2 | 4/2019 | Nguyen et al. | |
| 10,276,521 B2 | 4/2019 | Babcock et al. | |
| 10,283,859 B2 | 5/2019 | Nguyen et al. | |
| 10,320,071 B2 | 6/2019 | Nguyen et al. | |
| 10,446,524 B2 | 10/2019 | Frenette et al. | |
| 10,454,432 B2 | 10/2019 | Soliman | |
| 10,530,050 B2 | 1/2020 | Nguyen et al. | |
| 10,629,553 B2 | 4/2020 | Soliman et al. | |
| 10,651,798 B2 | 5/2020 | Soliman | |
| 10,892,718 B2 | 1/2021 | Wallis | |
| 10,931,009 B2 | 2/2021 | Nguyen et al. | |
| 11,037,893 B2 | 6/2021 | Wallis et al. | |
| 11,082,008 B2 | 8/2021 | Soliman | |
| 11,576,248 B2 | 2/2023 | Wallis et al. | |
| 2002/0053947 A1 | 5/2002 | Macedo | |
| 2002/0067205 A1 | 6/2002 | Aparin et al. | |
| 2004/0238857 A1 | 12/2004 | Beroz et al. | |
| 2004/0252064 A1 | 12/2004 | Yuanzhu | |
| 2005/0045729 A1* | 3/2005 | Yamazaki | G06K 19/0704 |
| | | | 257/E23.176 |
| 2005/0078038 A1 | 4/2005 | Takaki et al. | |
| 2005/0184626 A1 | 8/2005 | Chiba et al. | |
| 2006/0006950 A1 | 1/2006 | Burns et al. | |
| 2006/0245308 A1 | 11/2006 | Macroupoulos et al. | |
| 2007/0010300 A1 | 1/2007 | Xue et al. | |
| 2007/0046376 A1 | 3/2007 | Der Heijden | |
| 2007/0075693 A1 | 4/2007 | Xi | |
| 2007/0138629 A1 | 6/2007 | Lam | |
| 2007/0164907 A1* | 7/2007 | Gaucher | H01Q 1/38 |
| | | | 343/700 MS |
| 2007/0273445 A1 | 11/2007 | Sarkar | |
| 2008/0030282 A1 | 2/2008 | Maget et al. | |
| 2008/0061419 A1 | 3/2008 | Enquist et al. | |
| 2008/0084677 A1 | 4/2008 | Ho et al. | |
| 2008/0239597 A1 | 10/2008 | Van Bezooijen et al. | |
| 2008/0291115 A1 | 11/2008 | Doan et al. | |
| 2009/0027741 A1 | 1/2009 | Quah et al. | |
| 2009/0091904 A1 | 4/2009 | Hatanaka et al. | |
| 2009/0267220 A1 | 10/2009 | Kuhlman et al. | |
| 2009/0295645 A1 | 12/2009 | Campero et al. | |
| 2010/0103058 A1 | 4/2010 | Kato et al. | |
| 2010/0117750 A1 | 5/2010 | Fry et al. | |
| 2010/0158084 A1 | 6/2010 | Voinigescu et al. | |
| 2010/0202126 A1 | 8/2010 | Nakamura et al. | |
| 2010/0233975 A1 | 9/2010 | Wu | |
| 2010/0237947 A1 | 9/2010 | Xiong et al. | |
| 2011/0003571 A1 | 1/2011 | Park et al. | |
| 2011/0018635 A1 | 1/2011 | Tasic et al. | |
| 2011/0042798 A1 | 2/2011 | Pagaila et al. | |
| 2011/0043284 A1 | 2/2011 | Zhao et al. | |
| 2011/0076979 A1 | 3/2011 | Wu et al. | |
| 2011/0084378 A1 | 4/2011 | Welch et al. | |
| 2011/0175789 A1 | 7/2011 | Lee et al. | |
| 2011/0273360 A1 | 11/2011 | Campero | |
| 2012/0049894 A1 | 3/2012 | Berchtold et al. | |
| 2012/0062286 A1 | 3/2012 | Ginsburg et al. | |
| 2012/0062325 A1 | 3/2012 | Kim et al. | |
| 2012/0074990 A1 | 3/2012 | Sornin | |
| 2012/0079468 A1 | 3/2012 | Gringauze et al. | |
| 2012/0092220 A1 | 4/2012 | Tani et al. | |
| 2012/0224407 A1 | 9/2012 | Aleksic et al. | |
| 2012/0262239 A1 | 10/2012 | Taghivand et al. | |
| 2012/0274409 A1 | 11/2012 | Eldesouki et al. | |
| 2012/0313821 A1 | 12/2012 | Fischer | |
| 2013/0009704 A1 | 1/2013 | Liao | |
| 2013/0056882 A1 | 3/2013 | Kim et al. | |
| 2013/0084915 A1 | 4/2013 | Asuri et al. | |
| 2013/0093629 A1 | 4/2013 | Chiu et al. | |
| 2013/0100616 A1 | 4/2013 | Zohni et al. | |
| 2013/0162362 A1 | 6/2013 | Harima | |
| 2013/0241662 A1 | 9/2013 | Aleksic et al. | |
| 2013/0331043 A1 | 12/2013 | Perumana et al. | |
| 2013/0334321 A1 | 12/2013 | Kato et al. | |
| 2013/0343022 A1 | 12/2013 | Hu et al. | |
| 2014/0003000 A1 | 1/2014 | McPartlin | |
| 2014/0009204 A1* | 1/2014 | Cebi | H04B 1/40 |
| | | | 327/379 |
| 2014/0015614 A1 | 1/2014 | Oliveira et al. | |
| 2014/0023012 A1 | 1/2014 | Sato | |
| 2014/0043105 A1 | 2/2014 | Zerbe et al. | |
| 2014/0104010 A1 | 4/2014 | Chen et al. | |
| 2014/0124956 A1 | 5/2014 | Lee | |
| 2014/0148434 A1* | 5/2014 | Boyall | A61P 17/06 |
| | | | 544/405 |
| 2014/0151105 A1 | 6/2014 | Kuwahara | |
| 2014/0167232 A1 | 6/2014 | LoBianco et al. | |
| 2014/0175621 A1 | 6/2014 | Chen et al. | |
| 2014/0179239 A1 | 6/2014 | Nickel et al. | |
| 2014/0184334 A1 | 7/2014 | Nobbe et al. | |
| 2014/0225795 A1 | 8/2014 | Yu | |
| 2014/0232477 A1 | 8/2014 | Park et al. | |
| 2014/0252595 A1 | 9/2014 | Yen et al. | |
| 2014/0253242 A1 | 9/2014 | Youssef et al. | |
| 2014/0253382 A1 | 9/2014 | Markish et al. | |
| 2014/0256271 A1 | 9/2014 | Kok | |
| 2014/0266461 A1 | 9/2014 | Youssef et al. | |
| 2014/0266480 A1 | 9/2014 | Li et al. | |
| 2014/0308907 A1 | 10/2014 | Chen | |
| 2014/0348274 A1 | 11/2014 | Youssef et al. | |
| 2015/0015339 A1 | 1/2015 | Gorbachov et al. | |
| 2015/0015863 A1 | 1/2015 | Kempen et al. | |
| 2015/0035600 A1 | 2/2015 | Jin et al. | |
| 2015/0056940 A1 | 2/2015 | Rangarajan et al. | |
| 2015/0061770 A1 | 3/2015 | Luo et al. | |
| 2015/0091658 A1 | 4/2015 | Shima et al. | |
| 2015/0097031 A1 | 4/2015 | Yang et al. | |
| 2015/0097629 A1 | 4/2015 | Chong | |
| 2015/0155831 A1 | 6/2015 | Shirvani | |
| 2015/0162877 A1 | 6/2015 | Ni | |
| 2015/0222012 A1 | 8/2015 | Van Zeijl et al. | |
| 2015/0249051 A1 | 9/2015 | Tsai et al. | |
| 2015/0263421 A1 | 9/2015 | Chiu et al. | |
| 2015/0270806 A1 | 9/2015 | Wagh et al. | |
| 2015/0270943 A1 | 9/2015 | Liu et al. | |
| 2015/0310994 A1 | 10/2015 | Yosui | |
| 2015/0333760 A1 | 11/2015 | Zerbe et al. | |
| 2015/0340992 A1 | 11/2015 | Korol et al. | |
| 2015/0364214 A1 | 12/2015 | Li | |
| 2015/0364429 A1 | 12/2015 | Lee et al. | |
| 2016/0064337 A1 | 3/2016 | Chen et al. | |
| 2016/0079993 A1 | 3/2016 | Zerbe et al. | |
| 2016/0087593 A1* | 3/2016 | Nobbe | H03F 1/56 |
| | | | 330/295 |
| 2016/0099720 A1* | 4/2016 | Bashir | H03B 5/124 |
| | | | 331/8 |
| 2016/0112054 A1 | 4/2016 | Gonzalez et al. | |
| 2016/0149300 A1 | 5/2016 | Ito et al. | |
| 2016/0164476 A1* | 6/2016 | Wang | H03F 1/223 |
| | | | 330/250 |
| 2016/0226496 A1 | 8/2016 | Aleksic et al. | |
| 2016/0337117 A1 | 11/2016 | Liu et al. | |
| 2016/0365994 A1 | 12/2016 | Chen et al. | |
| 2017/0040941 A1 | 2/2017 | Chatwin | |
| 2017/0117907 A1 | 4/2017 | Grollitsch | |
| 2017/0163223 A1* | 6/2017 | Shimamoto | H03F 1/56 |
| 2017/0194317 A1 | 7/2017 | Wallis | |
| 2017/0194918 A1 | 7/2017 | Wallis | |
| 2017/0201291 A1 | 7/2017 | Gu et al. | |
| 2017/0207791 A1 | 7/2017 | Zerbe et al. | |
| 2017/0232345 A1 | 8/2017 | Rofougaran et al. | |
| 2017/0237181 A1 | 8/2017 | Chen et al. | |
| 2017/0278816 A1 | 9/2017 | Li et al. | |
| 2017/0279415 A1 | 9/2017 | Wallis | |
| 2017/0280392 A1 | 9/2017 | Segev et al. | |
| 2017/0288609 A1 | 10/2017 | Soliman | |

(56) References Cited

U.S. PATENT DOCUMENTS

| | | |
|---|---|---|
| 2017/0290011 A1 | 10/2017 | Kushnir et al. |
| 2017/0301630 A1 | 10/2017 | Nguyen et al. |
| 2017/0301653 A1 | 10/2017 | Frenette et al. |
| 2017/0301654 A1 | 10/2017 | Frenette et al. |
| 2017/0301655 A1 | 10/2017 | Frenette et al. |
| 2017/0301985 A1 | 10/2017 | Nguyen et al. |
| 2017/0301986 A1 | 10/2017 | Nguyen et al. |
| 2017/0302224 A1 | 10/2017 | Frenette et al. |
| 2017/0302325 A1 | 10/2017 | Frenette et al. |
| 2017/0303400 A1 | 10/2017 | Frenette et al. |
| 2017/0324160 A1 | 11/2017 | Khoury |
| 2017/0324388 A1 | 11/2017 | Soliman |
| 2018/0026592 A1 | 1/2018 | Wallis |
| 2018/0138872 A1 | 5/2018 | Wallis |
| 2018/0219516 A1 | 8/2018 | Soliman |
| 2018/0226367 A1 | 8/2018 | Babcock et al. |
| 2019/0097594 A1 | 3/2019 | Soliman |
| 2019/0198990 A1 | 6/2019 | Nguyen et al. |
| 2019/0341687 A1 | 11/2019 | Nguyen et al. |
| 2020/0357756 A1 | 11/2020 | Wallis et al. |
| 2021/0143542 A1 | 5/2021 | Nguyen et al. |
| 2021/0211103 A1 | 7/2021 | Wallis |
| 2021/0217713 A1 | 7/2021 | Wallis et al. |

FOREIGN PATENT DOCUMENTS

| | | |
|---|---|---|
| CN | 102469051 | 5/2012 |
| CN | 102577110 | 7/2012 |
| CN | 103050482 | 4/2013 |
| CN | 103247581 | 8/2013 |
| CN | 104936395 | 9/2015 |
| CN | 105409060 | 3/2016 |
| CN | 105409116 | 3/2016 |
| CN | 105515542 | 4/2016 |
| CN | 102884724 | 5/2016 |
| CN | 103748785 | 7/2017 |
| JP | 2009-027741 | 2/2009 |
| JP | 2012-079468 | 4/2012 |
| JP | 2013-179152 | 9/2013 |
| JP | 2014-023012 | 2/2014 |
| JP | 2014-178731 | 9/2014 |
| KR | 10-2005-0084978 A | 8/2005 |
| KR | 10-2010-0059724 | 6/2010 |
| KR | 10-2010-062316 | 6/2010 |
| KR | 10-2012-0133119 A | 12/2012 |
| KR | 10-2015-0028844 A | 3/2015 |
| TW | 577191 | 2/2004 |
| TW | 201517506 | 5/2015 |
| TW | 201603477 | 1/2016 |
| TW | I528736 | 4/2016 |
| WO | WO 2015/015863 | 2/2015 |
| WO | WO 2016/189199 | 12/2016 |

OTHER PUBLICATIONS

U.S. Appl. No. 16/354,923 Published as 2019/0214354 A1 Issued U.S. Pat. No. 10,629,553, filed Mar. 15, 2019, Front End Systems With Linearized Low Noise Amplifier and Injection-Locked Oscillator Power Amplifier Stage.

U.S. Appl. No. 16/820,401 Published as 2020/0357756 A1, filed Mar. 16, 2020, Selectively Shielded Radio Frequency Module With Linearized Low Noise Amplifier.

U.S. Appl. No. 17/215,744, filed Mar. 29, 2021, Front End Systems With Multi-Mode Power Amplifier Stage and Overload Protection of Low Noise Amplifier.

Amkor, System in Package (SIP) Technology Solutions Data Sheet, Rev. Nov. 2015, 4 pages, available at: https://www.amkor.com/index.cfm?objectid=0638A98A-A85E-0A85-F5EF006A6CEEEC13 (accessed on May 24, 2017).

Campbell, E., Bluetooth Radio Design Considerations for Cellular Handset Application, RF Globalnet, Apr. 3, 2001, 13 pages.

Chip Design, Tools, Technologies & Methodologies, "Coordinating from Silicon to Package", Mar. 17, 2008, 11 pages.

EM358x High-Performance, Integrated ZigBee/802.15.4 System-on-Chip Family, Apr. 2014, by Silicon Laboratories, located at https://www.silabs.com/documents/public/data-sheets/EM358x.pdf.

Brown, et al, Trends in RF/Wireless Packaging An Overview, 2004, 98 pages, available at: http://www.iwpc.org/Presentations/IWPC_Trends_Packaging_Final_slides_MTT_S_2004.pdf (accessed on May 3, 2017).

Esswein et al., "An improved swtiched injected-locked oscillator for ranging and communications systems" Proceedings of the 43rd European Microwave Conference 2013 in 4 pages.

Insight SiP, "Application Note AN160601 Use of ISP 1507 Development Kit," Oct. 27, 2016, available at: http://www.insightsip.com/fichiers_insightsip/pdf/ble/ISP1507/isp_ble_AN160601.pdf (accessed: Jul. 24, 2017).

Insight SiP, "ISP 1507 High Performance Bluetooth 5 Ready, NFC & ANT Low Energy Module with MCU & Antenna," Jan. 16, 2017, available at: http://www.insightsip.com/fichiers_insightsip/pdf/ble/ISP1507/isp_ble_DS1507.pdf (accessed: Jul. 24, 2017).

Kim, et al., "Bounded skew clock routing for 3D stacked IC designs: Enabling trade-offs between power and clock skew," International Conference on Green Computing, Chicago, IL, Aug. 2010, 2 pages.

Murata Electronics, "SN8000/SN800UFL Wi-Fi Module: Data Sheet," Version 1.0, Nov. 25, 2013, available at: http://www.mouser.com/pdfdocs/sn80008000ufl_ds_112513.PDF (accessed: Jul. 24, 2017).

Murata Electronics, "SN820X Wi-Fi Network Controller Module Family: User Manual," Version 2.2, Mar. 3, 2014, available at: http://www.mouser.com/pdfdocs/sn820x_manual_030314.PDF (accessed: Jul. 24, 2017).

Murata Electronics, "Bluetooth Low Energy Module Data Sheet," Rev. J, Feb. 27, 2015, available at: http://wireless.murata.com/eng/products/rf-modules-1/bluetooth/type-zy.html PDF (accessed: Jul. 24, 2017).

Qualcomm, 3D VLSI: Next Generation #D Integration Technology, 2015, 60 pages.

SESUB modules for smartphones: Very small and extremely flat, TDK Europe, EPCOS, Nov. 2012, 3 pages.

Stoukatch, et al.: "3D-SIP integration for autonomous sensor nodes," 56th Electronic Components and Technology Conference 2006, San Diego, CA, 2006, 2 pages.

Törmänen et al. "A 13dBm 60GHz-Band Injection Locked PA with 36% PAE in 65nm CMOS" Electrical and Information Technology, Lund University, Proceedings of the Asia-Pacific Microwave Conference 2011, 4 pages.

Weerasekera, et al.: "Extending systems-on-chip to the third dimension: Performance, cost and technological tradeoffs," IEEE/ACM International Conference on Computer-Aided Design, Digest of Technical Papers, ICCAD. 212-219. 10.1109/ICCAD.2007.4397268. Dec. 2007, 9 pages.

International Search Report dated Aug. 18, 2017 for International Application No. PCT/US2017/028209 filed Apr. 18, 2017, 3 pages.

Written Opinion dated Aug. 18, 2017 for International Application No. PCT/US2017/028209 filed Apr. 18, 2017, 16 pages.

International Search Report for International Application No. PCT/US2016/068712, dated Mar. 20, 2017, in 3 pages.

Written Opinion of the International Searching Authority for International Application No. PCT/US2016/068712, dated Mar. 20, 2017, in 8 pages.

International Search Report for International Application No. PCT/US2017/025091, dated Mar. 30, 2017, in 3 pages.

PCT Written Opinion of the International Searching Authority for International Application No. PCT/US2017/025091, dated Mar. 30, 2017, in 7 pages.

Wikipedia contributors, "Common source," Wikipedia, The Free Encyclopedia. Wikipedia, https://en.wikipedia.org/wiki/Common_source (accessed: Jun. 28, 2017).

Wikipedia contributors, "Common emitter," Wikipedia, The Free Encyclopedia. Wikipedia, https://en.wikipedia.org/wiki/Common_emitter (accessed: Jun. 28, 2017).

* cited by examiner

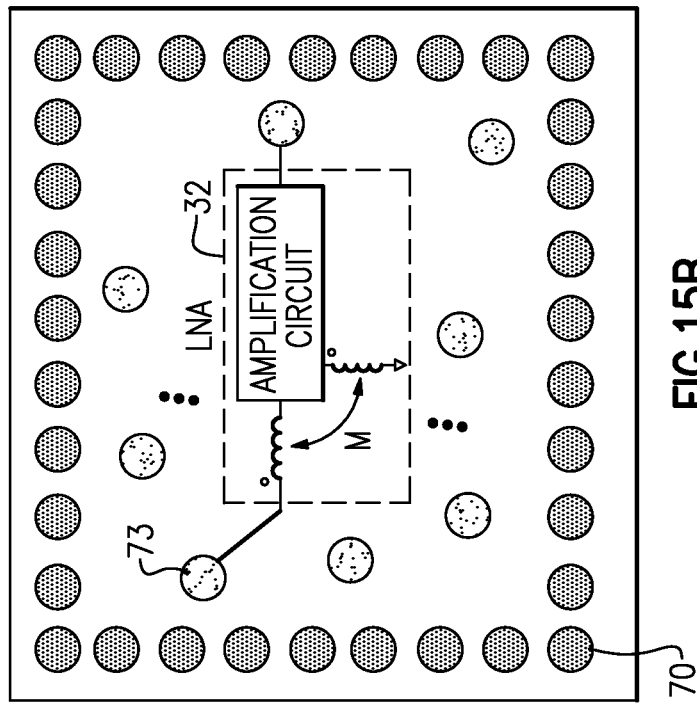
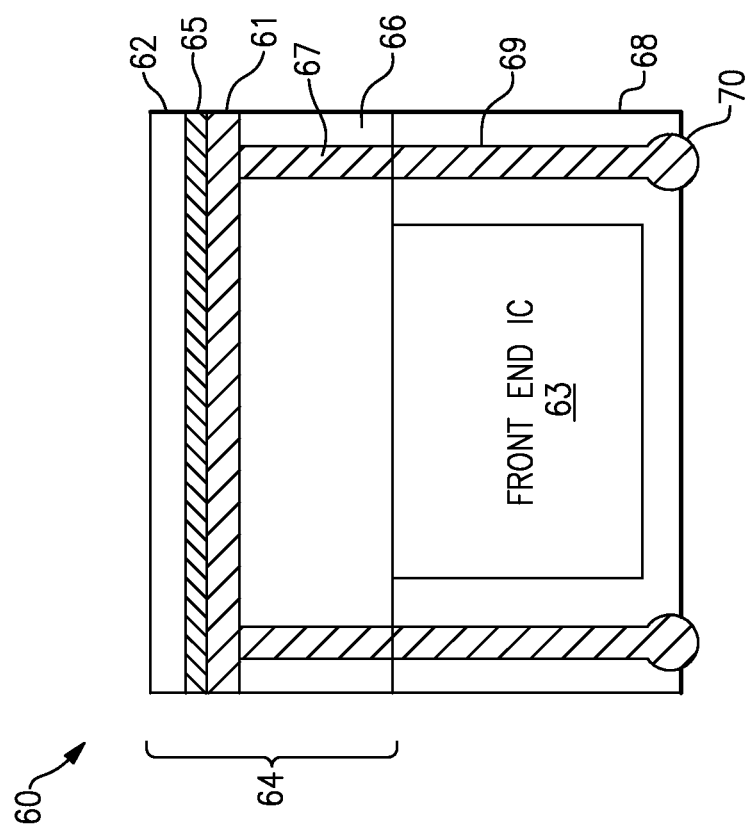
FIG.15B
FIG.15A

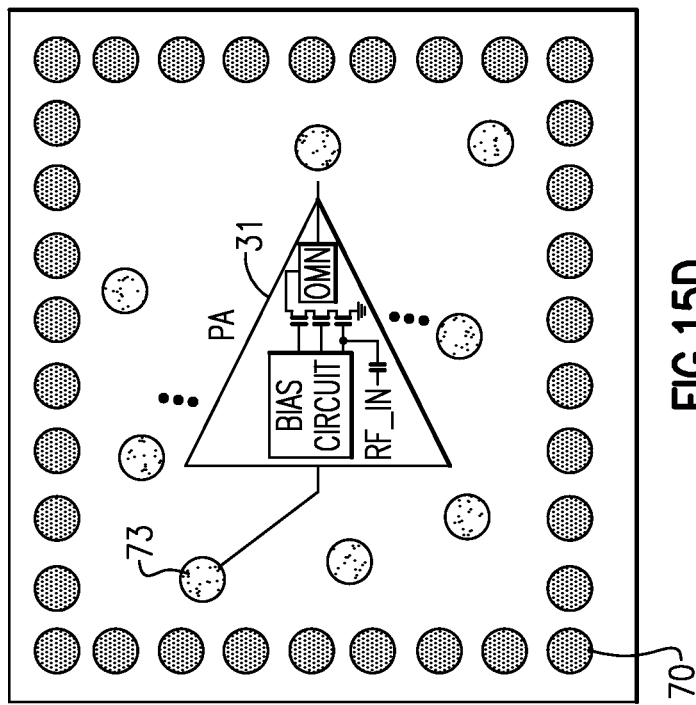
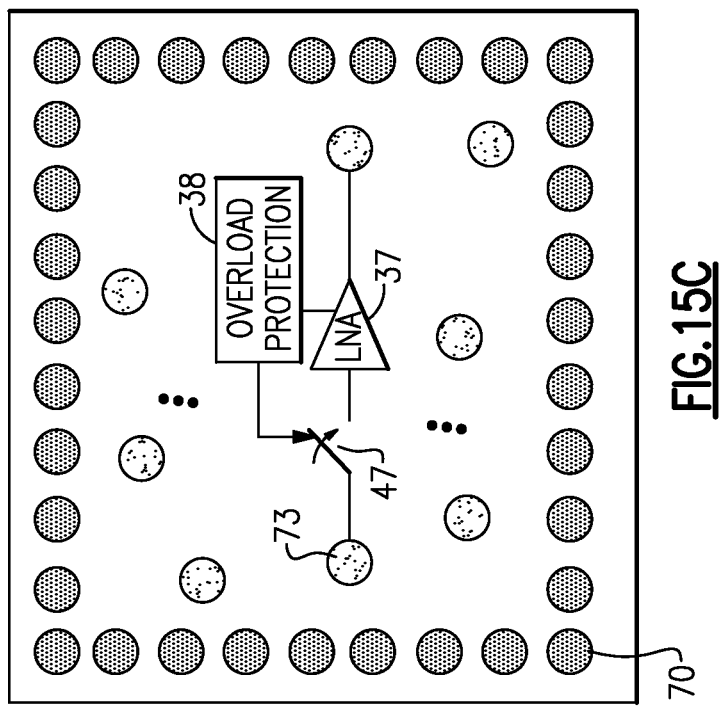

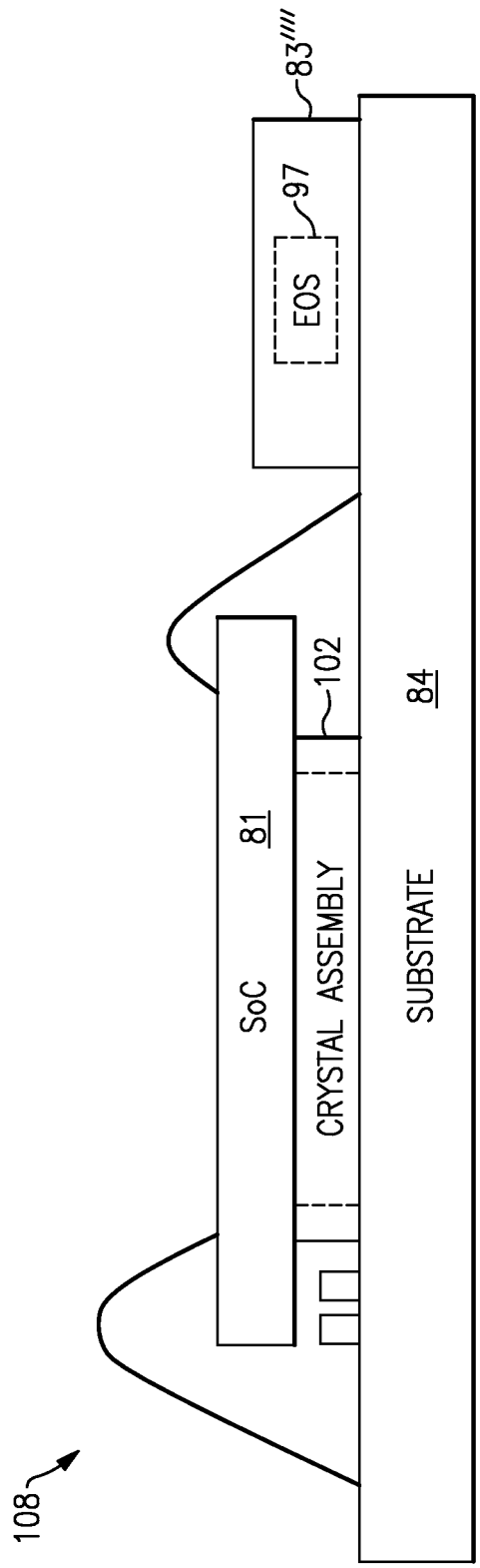

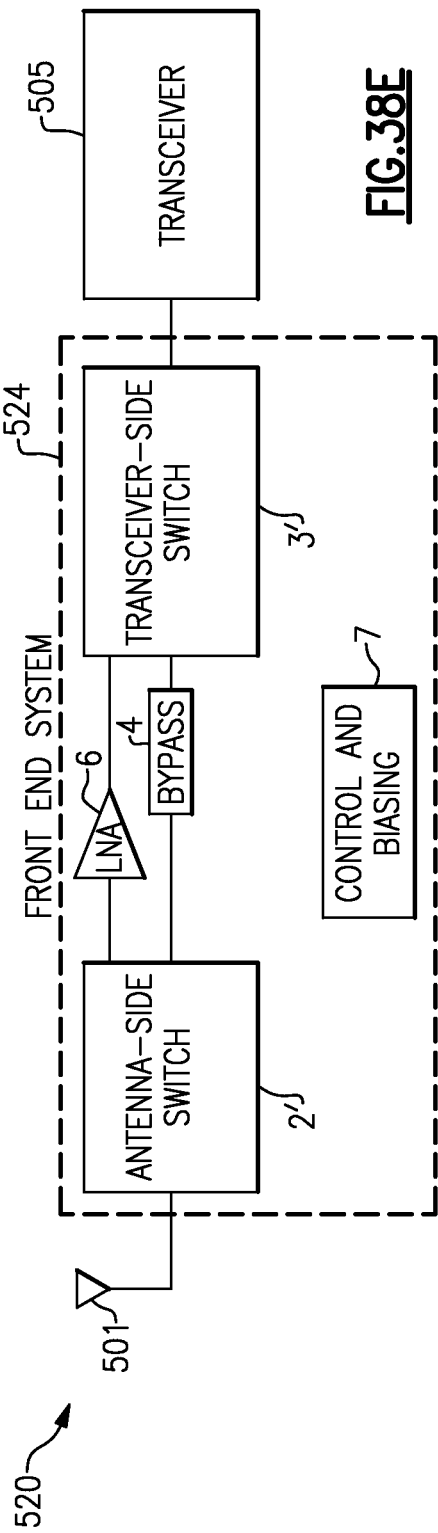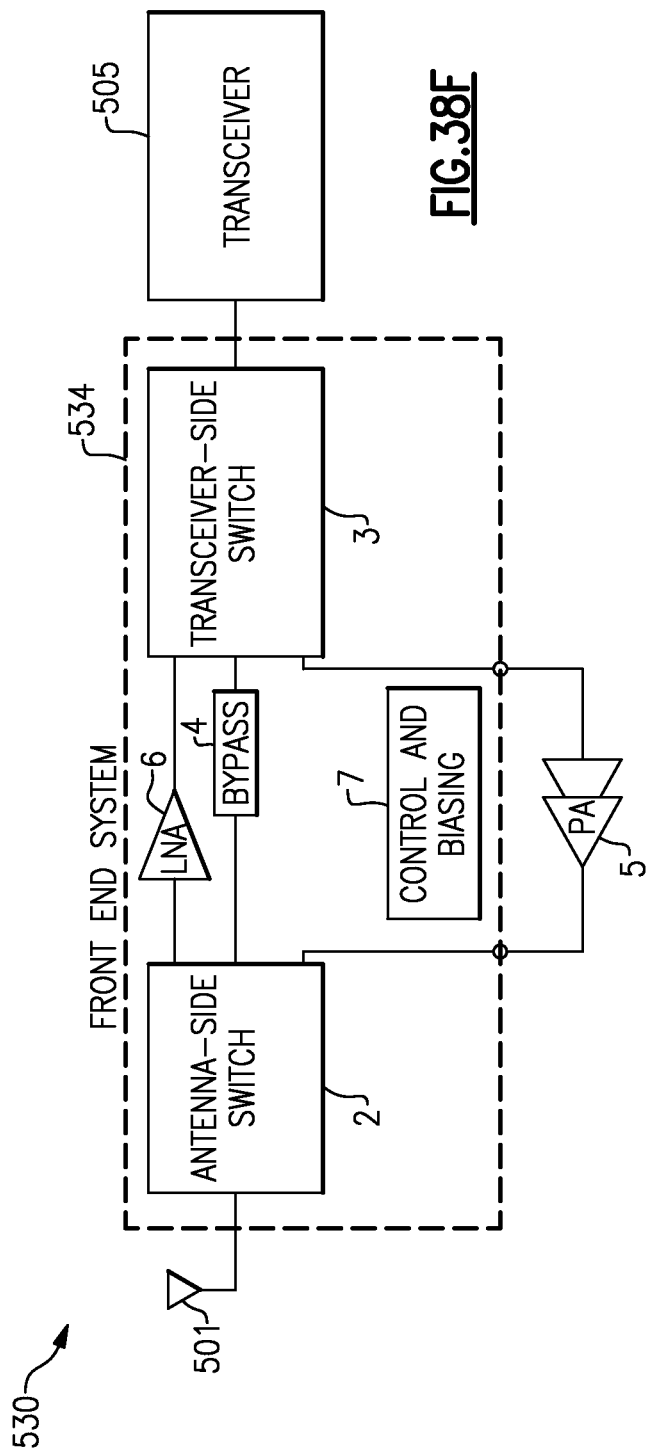

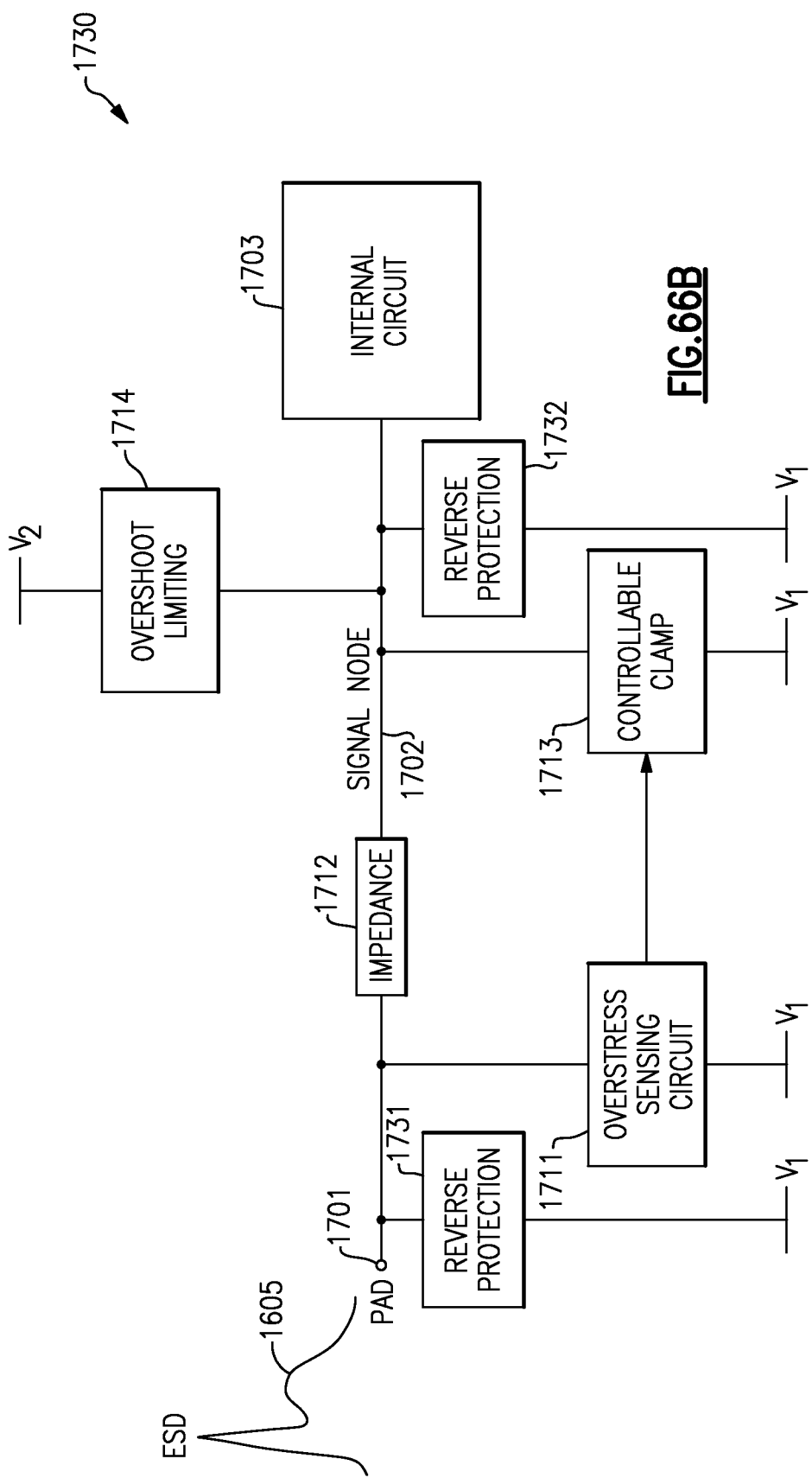

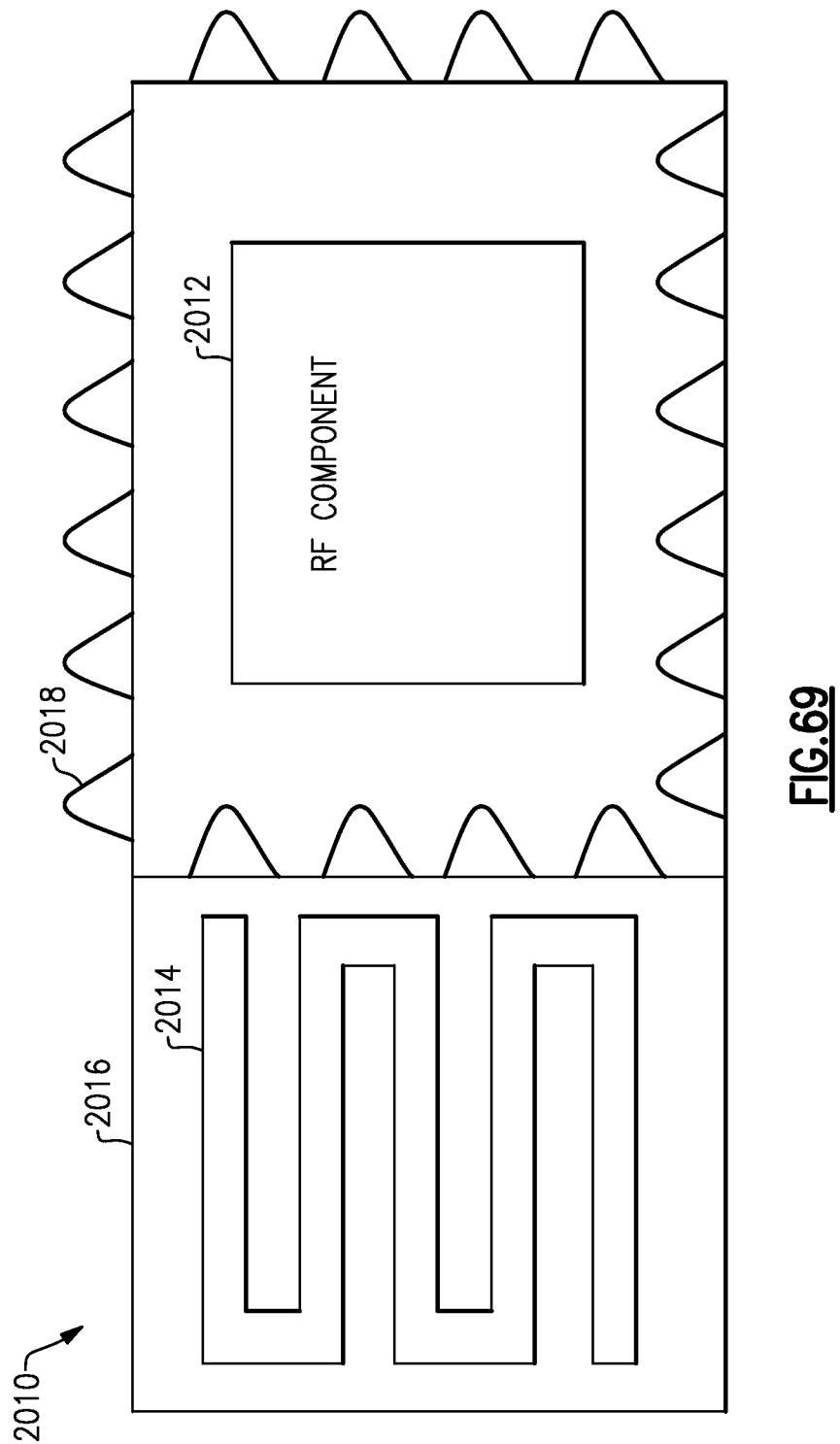

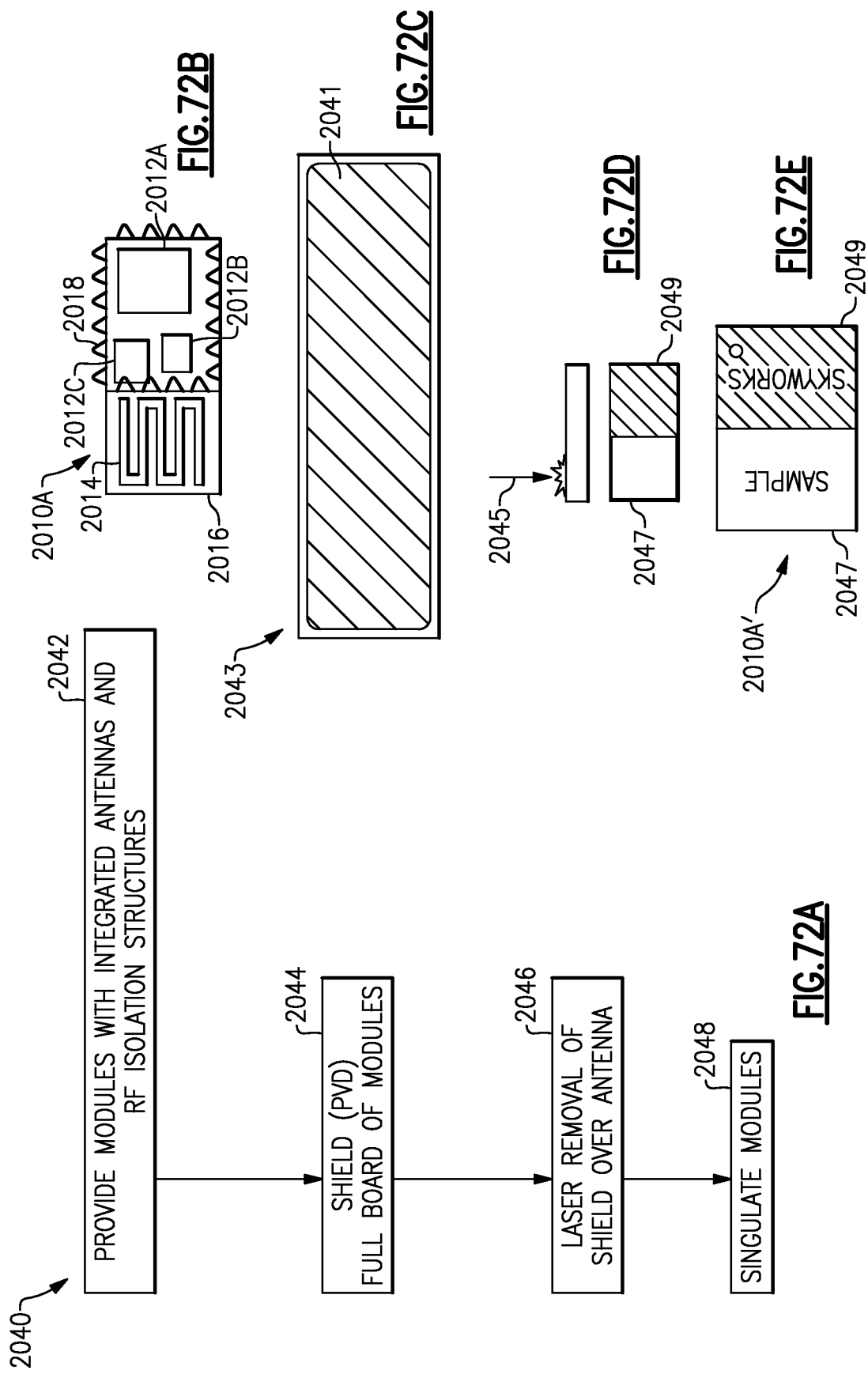

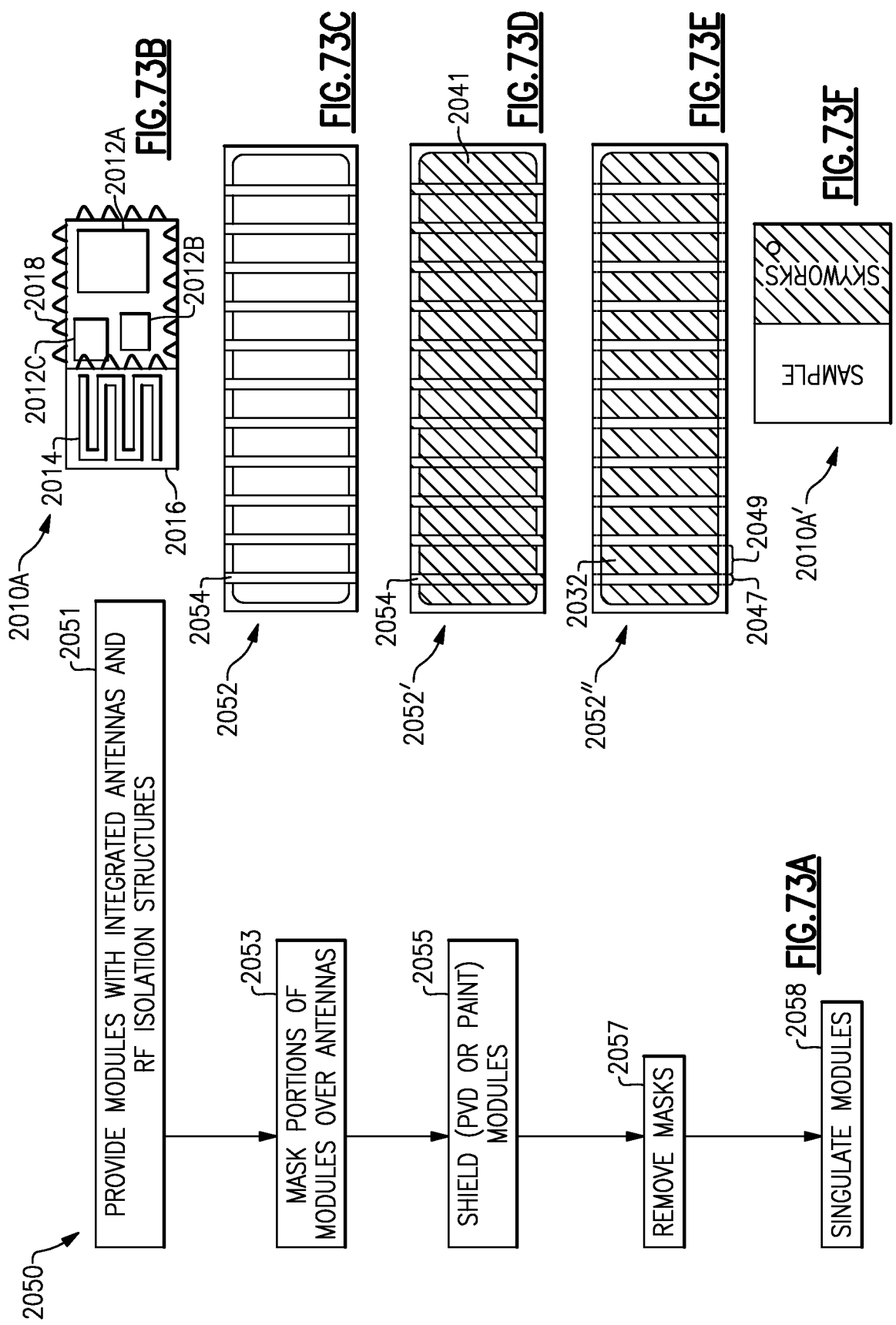

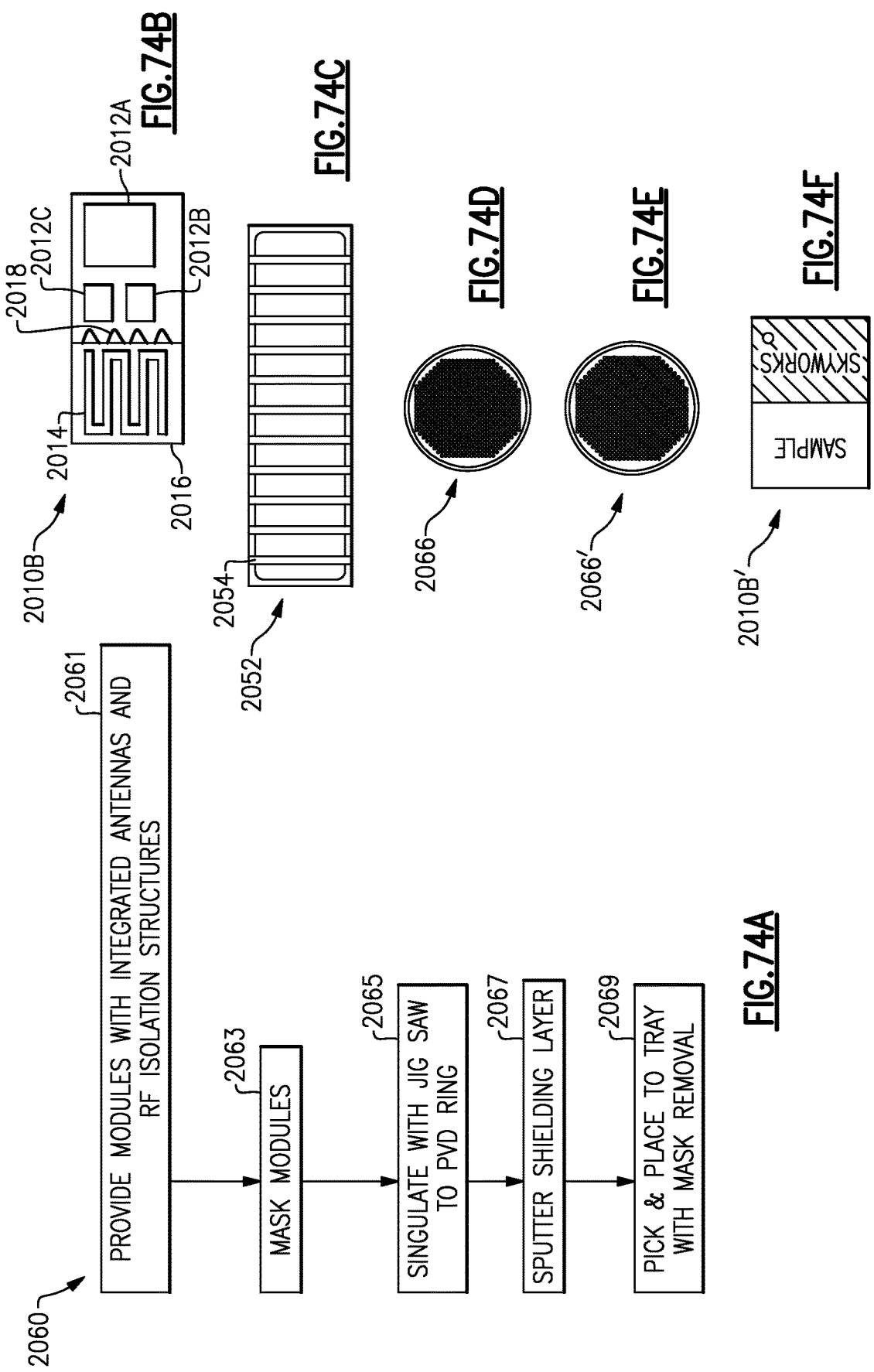

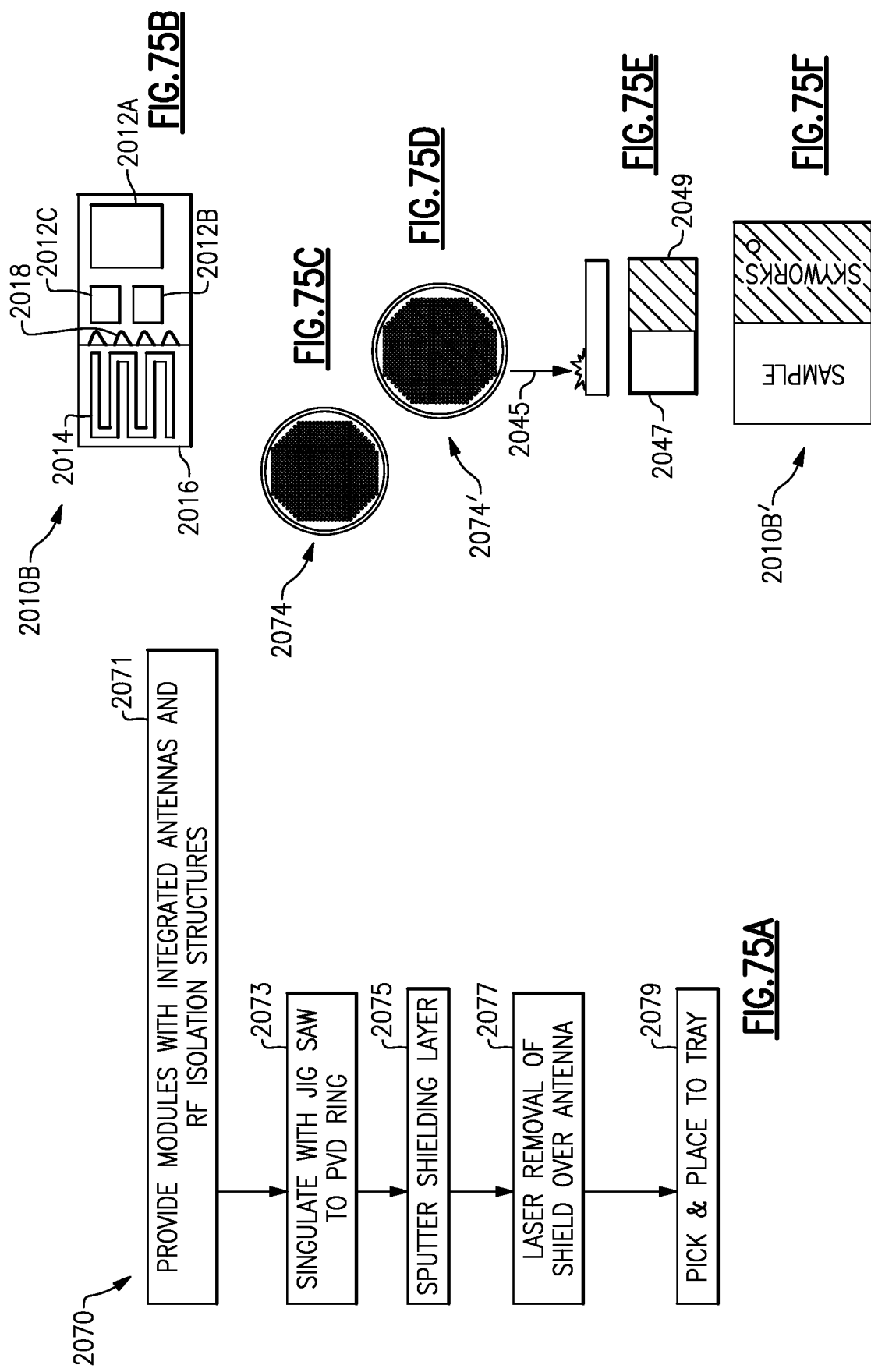

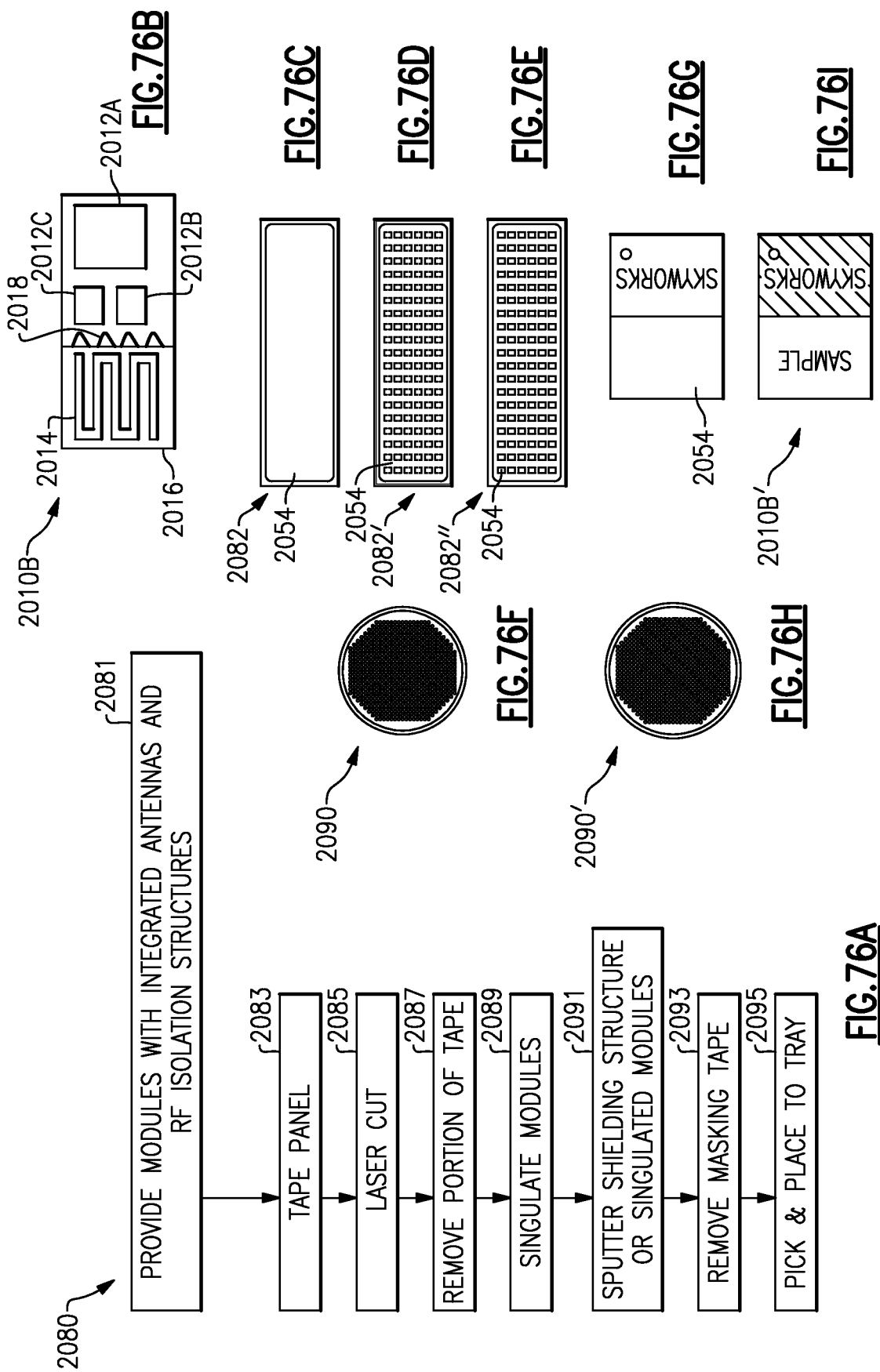

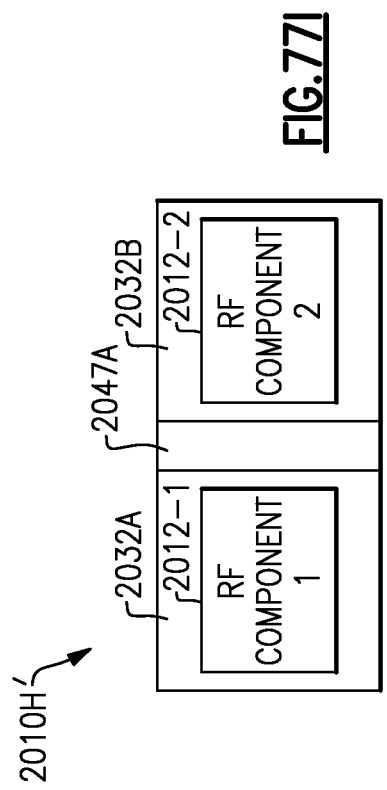
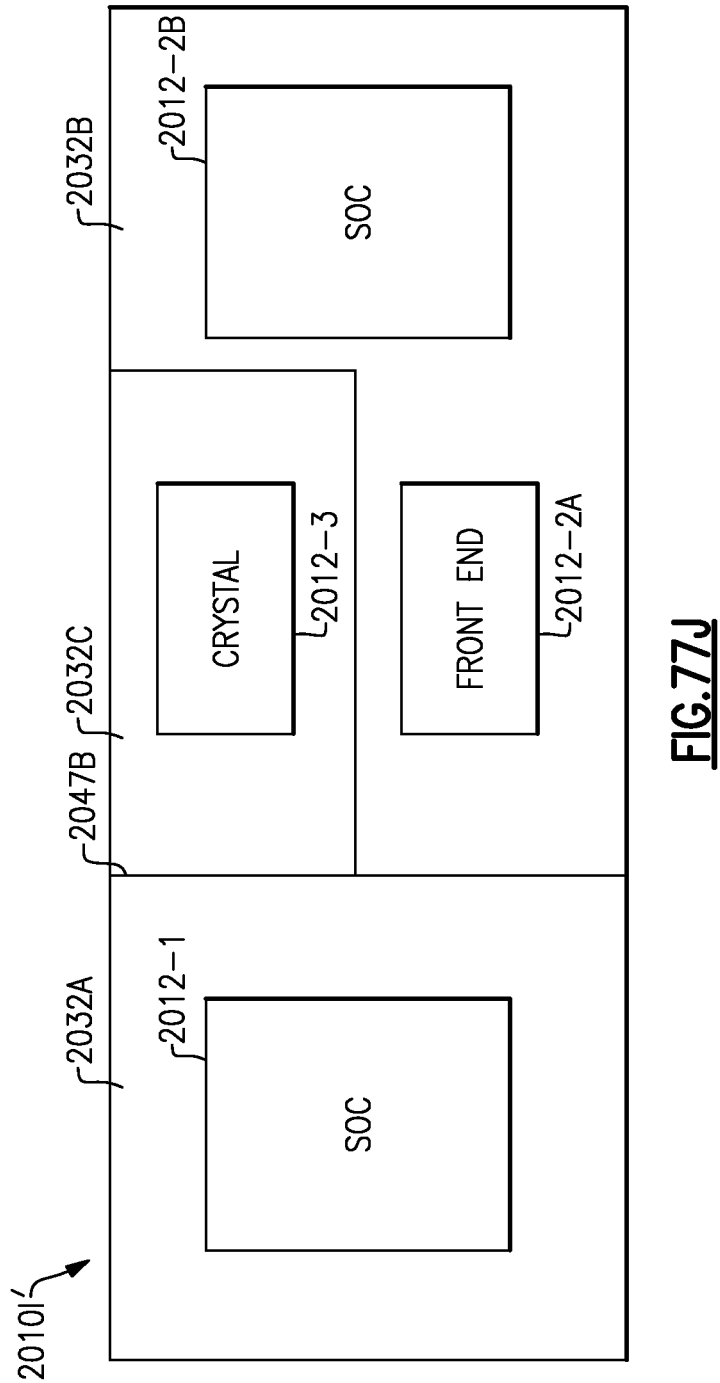
FIG.77I
FIG.77J

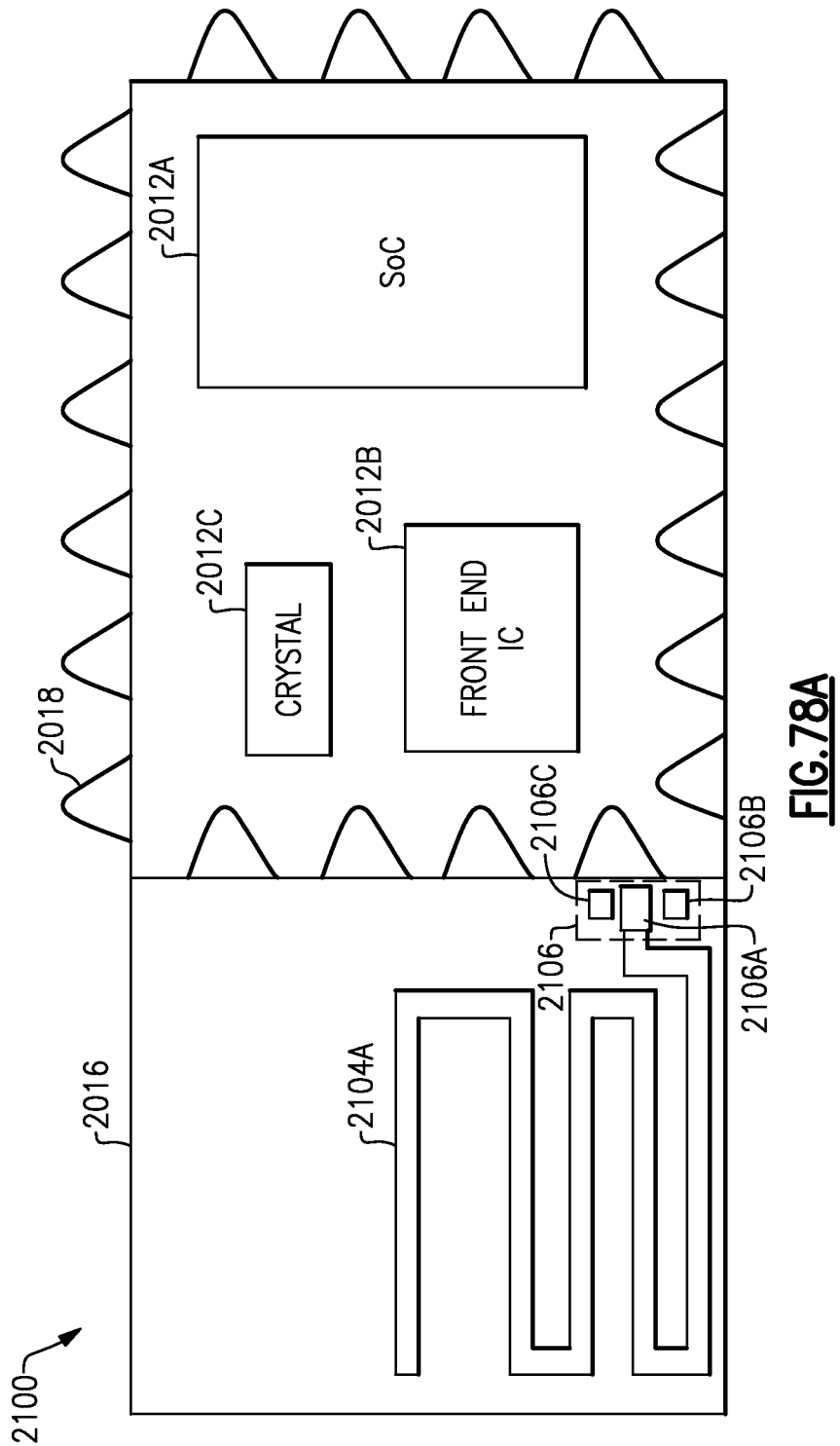

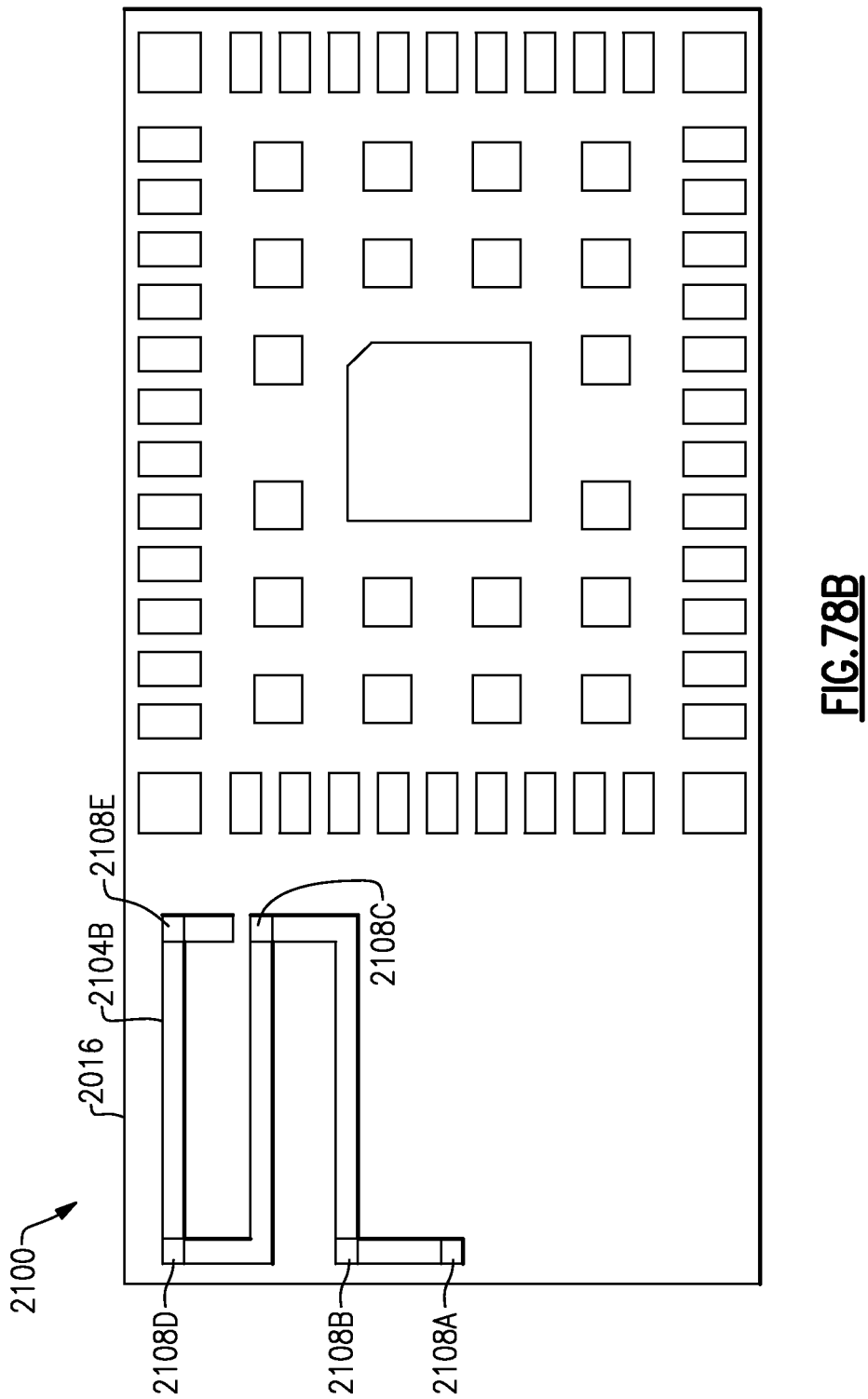

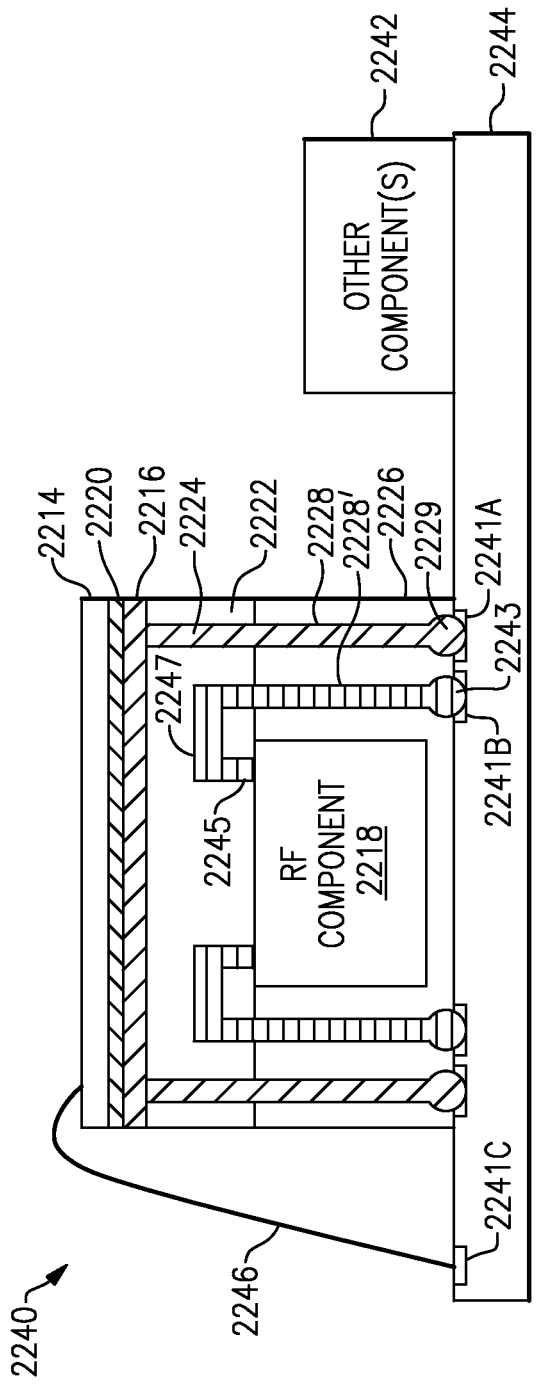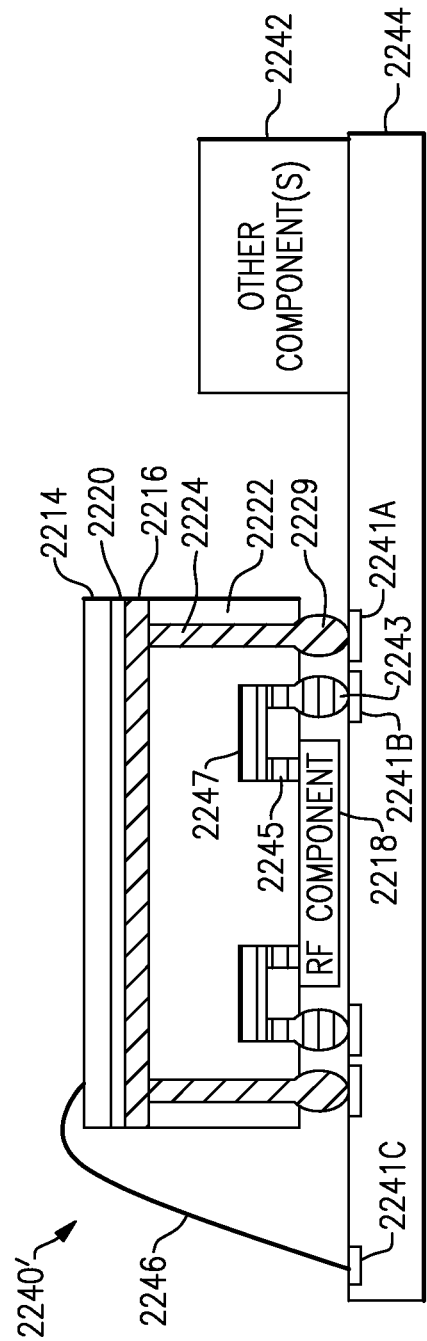

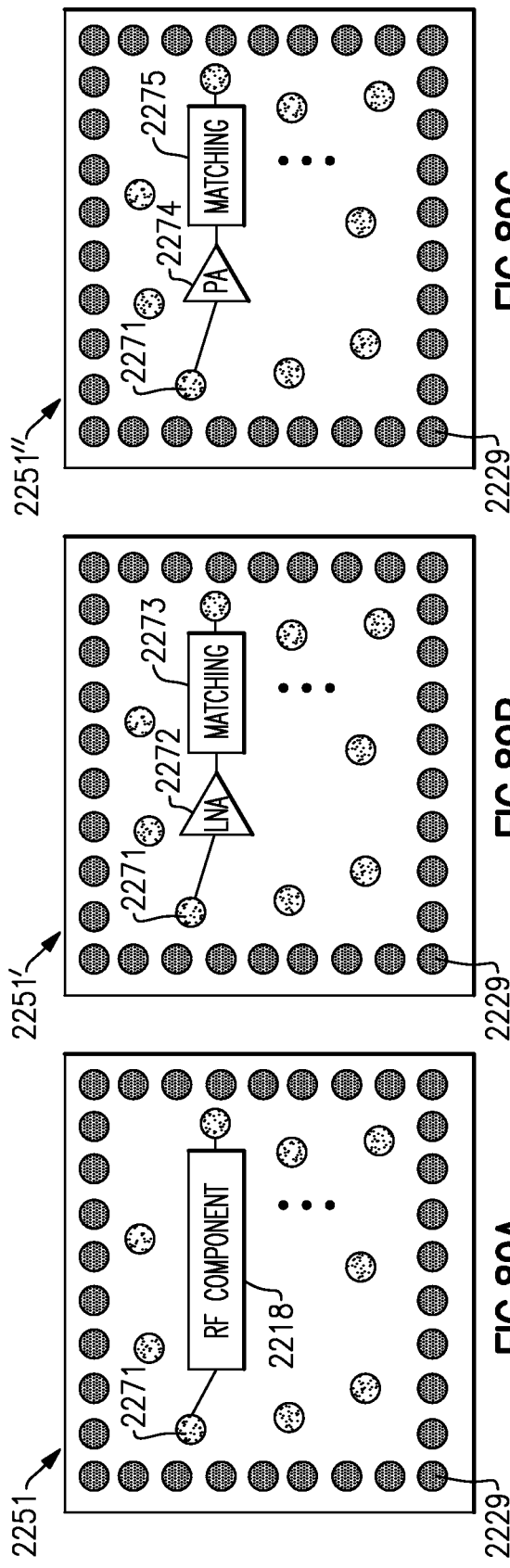
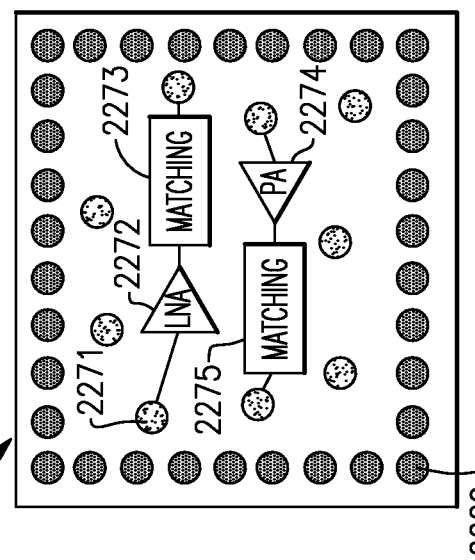

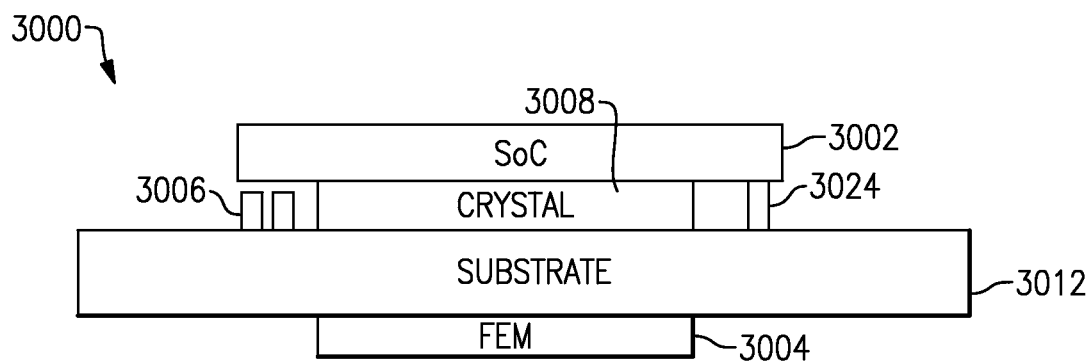
FIG.97
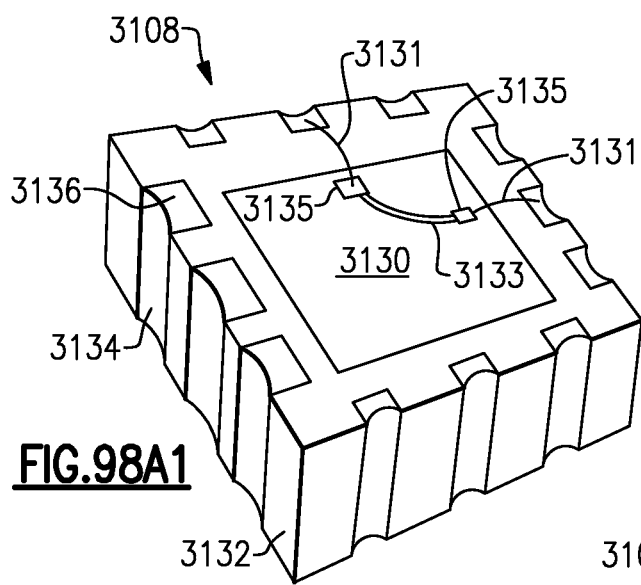
FIG.98A1
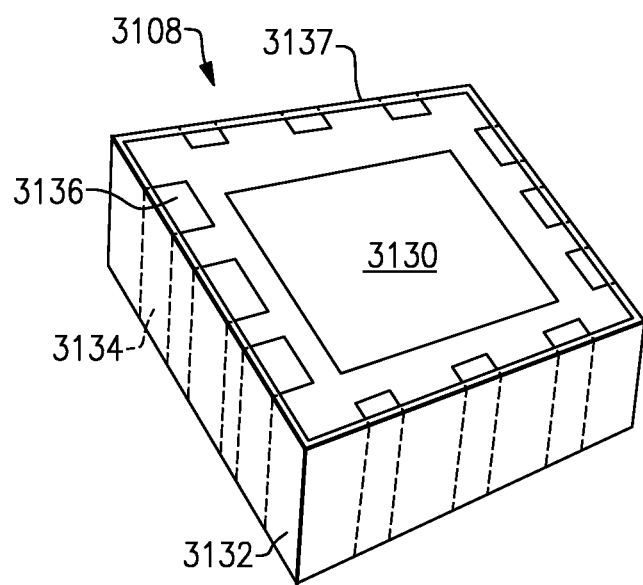
FIG.98A2

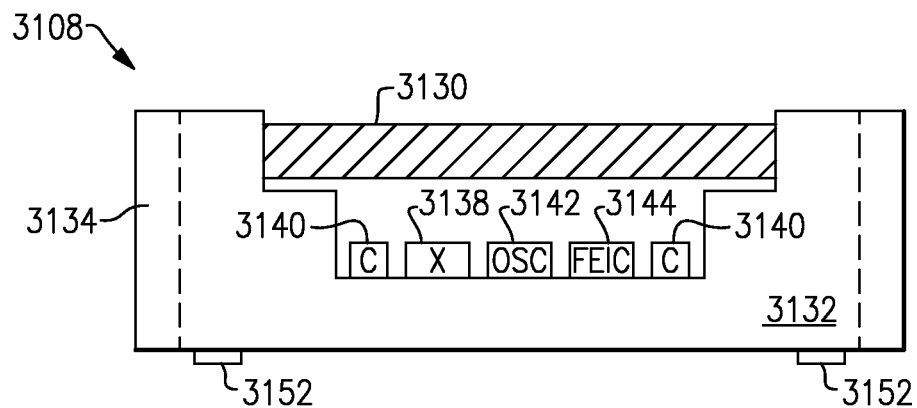
FIG.98B1
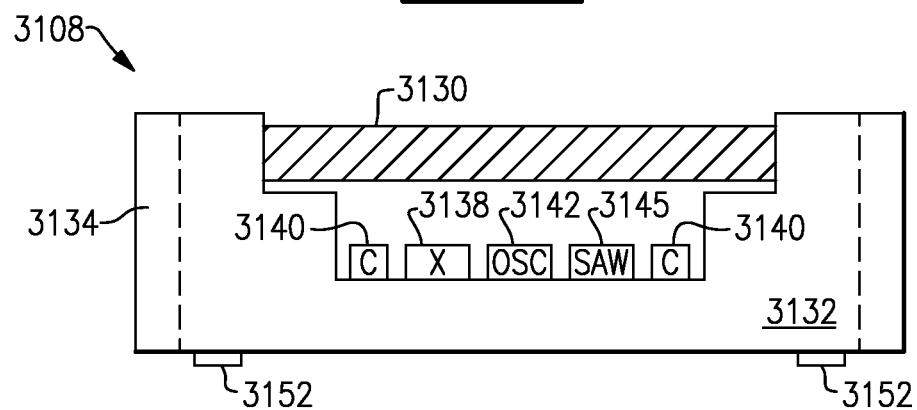
FIG.98B2
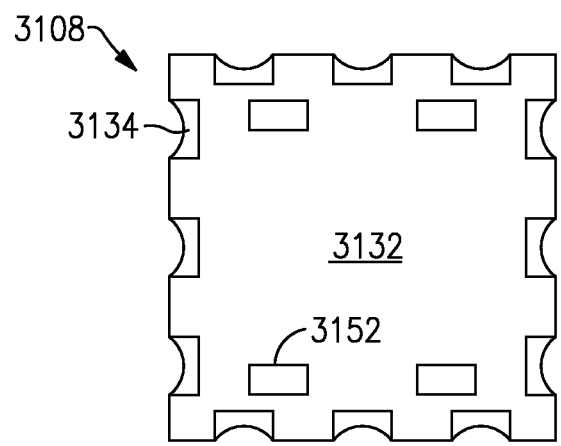
FIG.98C

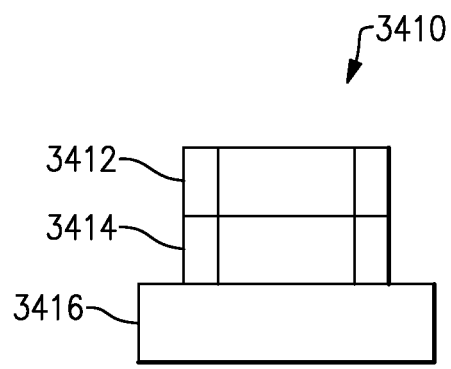
FIG.101A1
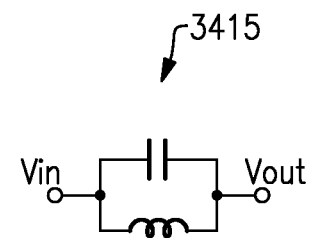
FIG.101A2
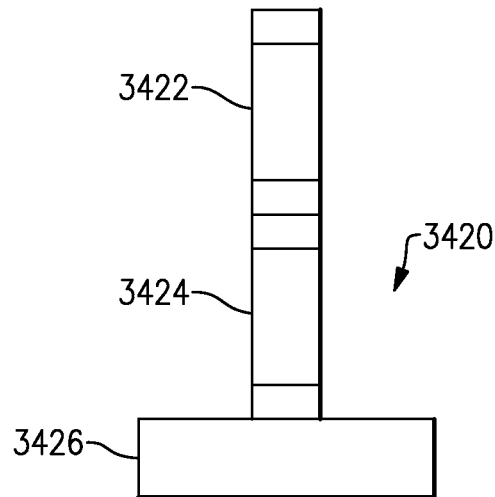
FIG.101B1
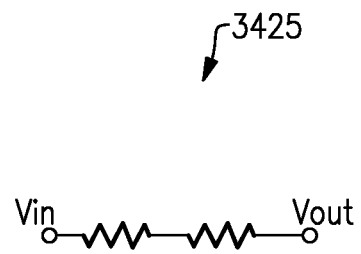
FIG.101B2

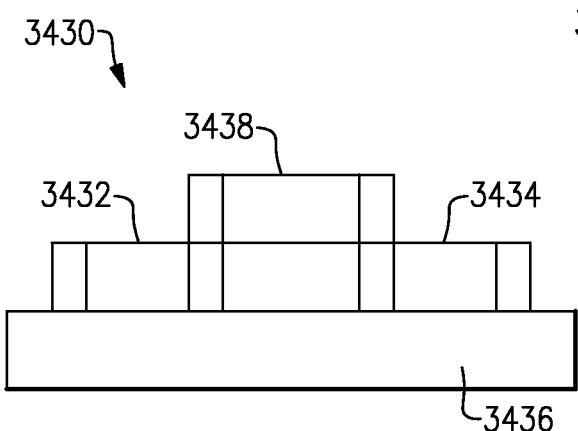
FIG.101C1
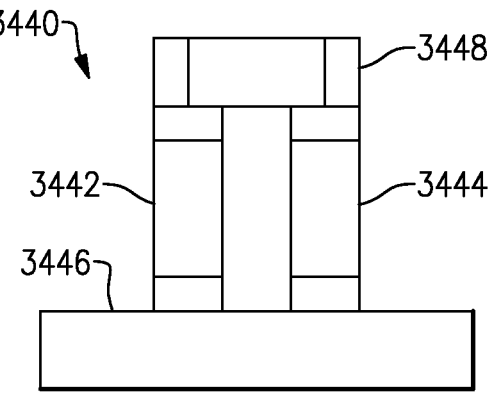
FIG.101C2
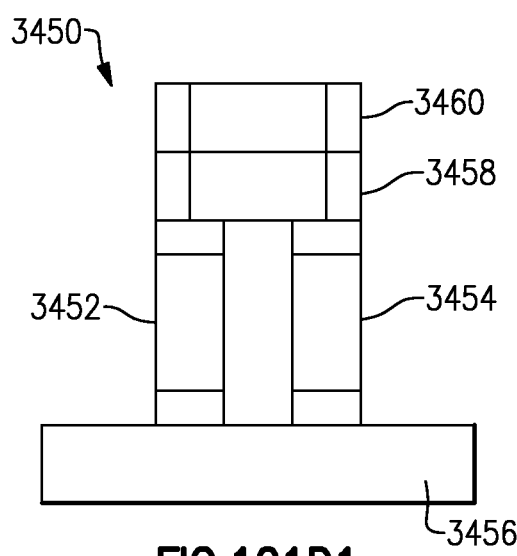
FIG.101D1
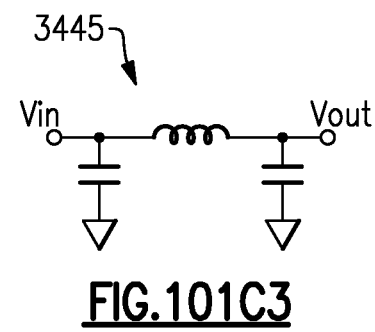
FIG.101C3
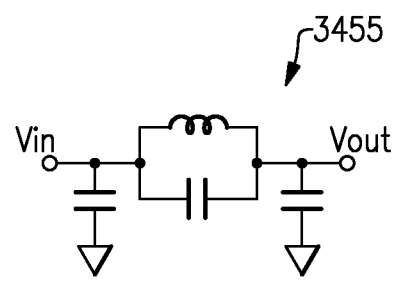
FIG.101D2

SELECTIVELY SHIELDED RADIO FREQUENCY MODULE WITH MULTI-MODE STACKED POWER AMPLIFIER STAGE

CROSS-REFERENCE TO PRIORITY APPLICATIONS

This application is a divisional of U.S. patent application Ser. No. 16/820,401, titled SELECTIVELY SHIELDED RADIO FREQUENCY MODULE WITH LINEARIZED LOW NOISE AMPLIFIER, filed Mar. 16, 2020, which is a divisional of U.S. patent application Ser. No. 16/354,923, titled FRONT END SYSTEMS WITH LINEARIZED LOW NOISE AMPLIFIER AND INJECTION-LOCKED OSCILLATOR POWER AMPLIFIER STAGE, filed Mar. 15, 2019, which is a divisional of U.S. patent application Ser. No. 15/857,217, titled FRONT END SYSTEMS AND RELATED DEVICES, INTEGRATED CIRCUITS, MODULES, AND METHODS, filed Dec. 28, 2017, which claims the benefit of priority under 35 U.S.C. § 119(e) of U.S. Provisional Patent Application No. 62/440,241, titled FRONT END SYSTEMS, filed Dec. 29, 2016; U.S. Provisional Patent Application No. 62/480,002, titled FRONT END SYSTEMS AND RELATED DEVICES, INTEGRATED CIRCUITS, MODULES, AND METHODS, filed Mar. 31, 2017; U.S. Provisional Patent Application No. 62/570,459, titled FRONT END SYSTEMS AND RELATED DEVICES, INTEGRATED CIRCUITS, MODULES, AND METHODS, filed Oct. 10, 2017; U.S. Provisional Patent Application No. 62/571,409, titled FRONT END SYSTEMS AND RELATED DEVICES, INTEGRATED CIRCUITS, MODULES, AND METHODS, filed Oct. 12, 2017; U.S. Provisional Patent Application No. 62/594,179, titled FRONT END SYSTEMS AND RELATED DEVICES, INTEGRATED CIRCUITS, MODULES, AND METHODS, filed Dec. 4, 2017; and U.S. Provisional Patent Application No. 62/595,935, titled FRONT END SYSTEMS AND RELATED DEVICES, INTEGRATED CIRCUITS, MODULES, AND METHODS, filed Dec. 7, 2017. The disclosures of each of these priority applications are hereby incorporated by reference in their entireties herein.

BACKGROUND

Technical Field

Embodiments of this disclosure relate to radio frequency electronic systems, such as front end systems and related devices, integrated circuits, modules, and methods.

Description of Related Technology

A radio frequency electronic system can process radio frequency signals in a frequency range from about 30 kilohertz (kHz) to 300 gigahertz (GHz), such as in a range from about 450 megahertz (MHz) to 6 GHz. A front end system is an example of a radio frequency electronic system. A front end system can be referred to as a radio frequency front end system. A front end system can process signals being transmitted and/or received via one or more antennas. For example, a front end system can include one or more switches, one or more filters, one or more low noise amplifiers, one or more power amplifiers, other circuitry, or any suitable combination thereof in one or more signal paths between one or more antennas and a transceiver. Front end systems can include one or more receive paths and one or more transmit paths.

A front end system can include a low noise amplifier (LNA) in a receive path. The LNA can receive a radio frequency (RF) signal from an antenna. The LNA can be used to boost the amplitude of a relatively weak RF signal. Thereafter, the boosted RF signal can be used for a variety of purposes, including, for example, driving a switch, a mixer, and/or a filter in an RF system. LNAs can be included in a variety of applications, such as base stations or mobile devices, to amplify signals of a relatively wide range of radio frequency signals.

A front end system can include a power amplifier in a transmit path. Power amplifiers can be included in front end systems in a wide variety of communications devices to amplify an RF signal for transmission. An RF signal amplified by a power amplifier can be transmitted via an antenna. Example communications devices having power amplifiers include, but are not limited to, mobile phones, tablets, base stations, network access points, laptops, computers, and televisions. As an example, in mobile phones that communicate using a cellular standard, a wireless local area network (WLAN) standard, and/or any other suitable communication standard, a power amplifier can be used to amplify the RF signal.

Electrical overstress (EOS) events can occur in a front end system. EOS events can arise from a variety of sources, such as external charge sources, supply switching, and/or electromagnetic pulses. EOS events include electrostatic discharge (ESD) events and other transient electrical events associated with relatively high levels of power and/or charge. An EOS event can cause charge build-up in an integrated circuit (IC), leading to high voltage and/or current levels beyond which the IC can reliably tolerate. Absent a protection mechanism, the EOS event can lead to IC damage, such as gate oxide rupture, junction breakdown, and/or metal damage. An IC's robustness to EOS events can be evaluated in a wide variety of ways. For example, specifications for EOS compliance can be set by various organizations, such as the International Electrotechnical Commission (IEC) and/or Joint Electronic Device Engineering Council (JEDEC). For instance, a human body model (HBM) test can be used to evaluate the IC's performance with respect to ESD events arising from the sudden release of electrostatic charge from a person to an IC. An IC's performance with respect to such specifications can be a significant performance metric by which the IC is evaluated.

Some or all of a front end system can be embodied in packaged semiconductor module. Packaged semiconductor modules can include integrated shielding technology within a package. A shielding structure can be formed around a radio frequency component of a front end system. The shielding structure can shield the radio frequency component from electromagnetic radiation that is external to the shielding structure. The shielding structure can shield circuit elements external to the shielding structure from electromagnetic radiation emitted by the radio frequency component. As more components are being integrated together with each other in a radio frequency module, shielding components from each other in a compact and efficient manner can be challenging.

A system in a package (SiP) can include integrated circuits and/or discrete components within a common package. Some or all of a front end system can be implemented in a SiP. An example SiP can include a system-on-a-chip (SoC), a crystal for clocking purposes, and a front-end module (FEM) that includes a front end system. In certain SiPs, a SoC and a crystal can consume a relatively large amount of physical area. This can create a relatively large footprint for the SiP.

SUMMARY OF CERTAIN INVENTIVE ASPECTS

The innovations described in the claims each have several features, no single one of which is solely responsible for its desirable attributes. Without limiting the scope of the claims, some prominent features of this disclosure will now be briefly described.

One aspect of this disclosure is a packaged module that includes a low noise amplifier within a package and a multi-mode power amplifier circuit within the package. The low noise amplifier includes a first inductor, an amplification circuit, and a second inductor magnetically coupled to the first inductor to provide negative feedback to linearize the low noise amplifier. The multi-mode power amplifier circuit includes a stacked output stage including a transistor stack of two or more transistors. The multi-mode power amplifier circuit also includes a bias circuit configured to control a bias of at least one transistor of the transistor stack based on a mode of the multi-mode power amplifier circuit.

The packaged module can further include a package substrate, a radio frequency shielding structure extending above the package substrate and enclosing the low noise amplifier and the multi-mode power amplifier circuit, and an antenna on the package substrate external to the radio frequency shielding structure. The antenna can be a multi-layer antenna. The packaged module can include a die supported by a package substrate and a crystal supported by the package substrate, in which the crystal is disposed between the die and the package substrate, and in which the die includes the low noise amplifier and the multi-mode power amplifier.

Another aspect of this disclosure is a front end system that includes a low noise amplifier in a receive path of the front end system and a multi-mode power amplifier circuit in a transmit path of the front end system. The low noise amplifier includes a first inductor, an amplification circuit, and a second inductor magnetically coupled to the first inductor to provide negative feedback to linearize the low noise amplifier. The multi-mode power amplifier circuit includes a stacked output stage including a transistor stack of two or more transistors. The multi-mode power amplifier circuit also includes a bias circuit configured to control a bias of at least one transistor of the transistor stack based on a mode of the multi-mode power amplifier circuit.

The bias circuit can be configured to bias a transistor of the transistor stack to a linear region of operation in a first mode and as a switch in a second mode. The bias circuit can be configured to bias the transistor in a saturation region of operation in the second mode. The second mode can be associated with a lower power than the first mode. The stacked output stage can be configured to receive a supply voltage having a lower voltage level in the second mode relative to the first mode. The stacked output stage can be operable in at least three different modes. The transistor stack can include at least three transistors in series.

The amplification circuit can be configured to receive a radio frequency signal by way of the first inductor. The low noise amplifier can include an input matching circuit including the first inductor. The input matching circuit can further include a series inductor having a first end configured to receive the radio frequency signal and a second end electrically coupled to the first inductor. The matching circuit can include a direct current blocking capacitor configured to provide the radio frequency signal to the series inductor. The matching circuit can include a shunt capacitor electrically coupled to the first end of the series inductor. The first inductor and the second inductor can together function as a transformer having a primary winding in series with an input of the amplification circuit and a secondary winding connected between a transistor of the amplification circuit and a low voltage reference.

The amplification circuit can include a common source amplifier and the second inductor can be a source degeneration inductor. The amplification circuit can include a cascode transistor in series with the common source amplifier.

The amplification circuit can include a common emitter amplifier and the second inductor can be an emitter degeneration inductor. The amplification circuit can include a cascode transistor in series with the common emitter amplifier.

The front end system can include a radio frequency switch coupled to the low noise amplifier and the multi-mode power amplifier circuit. The radio frequency switch can be configured to electrically couple an antenna port to the transmit path in a first state and to electrically couple the antenna port to the receive path in a second state.

A wireless communication device can include the front end system. A single integrated circuit can include the front end system. The single integrated circuit can be a semiconductor-on-insulator die. The front end system can be embodied in a packaged module.

Another aspect of this disclosure is a front end system that includes a low noise amplifier in a receive path of the front end system and a power amplifier in a transmit path of the front end system. The low noise amplifier includes a first inductor, an amplification circuit, and a second inductor magnetically coupled to the first inductor to provide negative feedback to linearize the low noise amplifier. The power amplifier includes an injection-locked oscillator driver stage.

The amplification circuit can receive a radio frequency signal by way of the first inductor. The low noise amplifier can include an input matching circuit that includes the first inductor. The input matching circuit can further include a series inductor having a first end configured to receive the radio frequency signal and a second end electrically coupled to the first inductor. The input matching circuit can further include a shunt capacitor electrically coupled to the first end of the series inductor. The input matching circuit can further include a direct current blocking capacitor configured to provide the radio frequency signal to the series inductor.

The amplification circuit can include a common source amplifier and the second inductor can be a source degeneration inductor. The amplification circuit can further include a cascode transistor in series with the common source amplifier.

The amplification circuit can include a common emitter amplifier and the second inductor can be an emitter degeneration inductor. The amplification circuit can further include a cascode transistor in series with the common emitter amplifier.

The injection-locked oscillator driver stage can include an output balun configured to provide a differential to singled-ended signal conversion. The injection-locked oscillator driver stage can be powered by a substantially fixed supply voltage. The injection-locked oscillator driver stage can be configured to receive a single-ended input signal, and the injection-locked oscillator driver stage can include an input transformer configured to convert the single-ended input signal to a differential input signal.

The injection-locked oscillator driver stage can include a negative transconductance circuit electrically connected to an inductor-capacitor tank, in which the negative transconductance circuit configured to provide energy to the inductor-capacitor tank to maintain oscillation. The negative transconductance circuit can include a pair of cross-coupled metal-oxide-semiconductor transistors. The injection-locked oscillator driver stage can further include a signal injecting circuit configured to provide signal injection to the inductor-capacitor tank based on a radio frequency input signal.

The front end system can further include a radio frequency switch coupled to the low noise amplifier and the power amplifier. The radio frequency switch can be configured to electrically couple an antenna port to the transmit path in a first state and to electrically couple the antenna port to the receive path in a second state.

A wireless communication device can include the front end system. A single integrated circuit can include the front end system. The single integrated circuit can be a semiconductor-on-insulator die. The front end system can be embodied in a packaged module.

Another aspect of this disclosure is a front end integrated circuit that includes a low noise amplifier including a first inductor, an amplification circuit, and a second inductor magnetically coupled to the first inductor to provide negative feedback to linearize the low noise amplifier, the low noise amplifier being controllable by a control signal; an input pad configured to receive the control signal; and an overstress protection circuit including an overstress sensing circuit electrically connected between the input pad and a first supply node, an impedance element electrically connected between the input pad and a signal node, and a controllable clamp electrically connected between the signal node and the first supply node, the overstress sensing circuit configured to activate the controllable clamp in response to detecting an electrical overstress event at the input pad.

The amplification circuit can receive a radio frequency signal by way of the first inductor. The low noise amplifier can include an input matching circuit that includes the first inductor. The input matching circuit can further include a series inductor having a first end configured to receive the radio frequency signal and a second end electrically coupled to the first inductor. The input matching circuit can further include a shunt capacitor electrically coupled to the first end of the series inductor. The input matching circuit can further include a direct current blocking capacitor configured to provide the radio frequency signal to the series inductor.

The amplification circuit can include a common source amplifier and the second inductor can be a source degeneration inductor. The amplification circuit can further include a cascode transistor in series with the common source amplifier.

The amplification circuit can include a common emitter amplifier and the second inductor can be an emitter degeneration inductor. The amplification circuit can further include a cascode transistor in series with the common emitter amplifier.

The overstress sensing circuit can include a plurality of diodes and a first field-effect transistor configured to activate in response to the electrical overstress event generating a flow of current through the plurality of diodes. The controllable clamp can include a second field-effect transistor electrically connected with the first field-effect transistor as a current mirror. The impedance element can include a resistor. The overstress protection circuit can further include an overshoot limiting circuit electrically connected between the signal node and a second supply node. The overstress protection circuit can include at least one diode configured to control a trigger voltage of the overshoot limiting circuit. The first supply node can be a ground rail and the second supply node can be a power supply rail.

A wireless communication device can include the front end integrated circuit. A packaged module can include the front end integrated circuit. The front end integrated circuit can be embodied on a semiconductor-on-insulator die.

Another aspect of this disclosure is a packaged module that includes a package substrate, a radio frequency shielding structure extending above the package substrate, a front end integrated circuit positioned in an interior of the radio frequency shielding structure, and an antenna on the package substrate external to the radio frequency shielding structure. The front end integrated circuit includes a low noise amplifier that includes a first inductor, an amplification circuit, and a second inductor magnetically coupled to the first inductor to provide negative feedback to linearize the low noise amplifier.

The radio frequency shielding structure can include a plurality of wire bonds disposed between the antenna and the front end integrated circuit. The radio frequency shielding structure can include wire bond walls disposed around at least two sides of the front end integrated circuit. The radio frequency shielding structure can include a shielding layer substantially parallel to the package substrate, and the front end integrated circuit can be disposed between the shielding layer and the package substrate. The shielding layer can include copper. The packaged module can further include a protective layer over the shielding layer such that the shielding layer is disposed between the protective layer and the front end integrated circuit. The protective layer can include titanium.

The antenna can be a multi-layer antenna. A first portion of the antenna can be on a first side of the package substrate and a second portion of the antenna can be on a second side of the package substrate, in which the second side opposes the first side.

The amplification circuit can receive a radio frequency signal by way of the first inductor. The low noise amplifier can include an input matching circuit that includes the first inductor. The input matching circuit can further include a series inductor having a first end configured to receive the radio frequency signal and a second end electrically coupled to the first inductor. The input matching circuit can further include a shunt capacitor electrically coupled to the first end of the series inductor. The input matching circuit can further include a direct current blocking capacitor configured to provide the radio frequency signal to the series inductor.

The amplification circuit can include a common source amplifier and the second inductor can be a source degeneration inductor. The amplification circuit can further include a cascode transistor in series with the common source amplifier.

The amplification circuit can include a common emitter amplifier and the second inductor can be an emitter degeneration inductor. The amplification circuit can further include a cascode transistor in series with the common emitter amplifier.

A wireless communication device can include the packaged module. A system board can include the packaged module. The low noise amplifier can be embodied on a semiconductor-on-insulator die.

Another aspect of this disclosure is a packaged module that includes a multi-layer substrate including a ground plane, an antenna on a first side of the multi-layer substrate, and a front end integrated circuit on a second side of the multi-layer substrate. The front end integrated circuit includes a low noise amplifier that includes a first inductor, an amplification circuit, and a second inductor magnetically coupled to the first inductor to provide negative feedback to linearize the low noise amplifier. The ground plane is positioned between the antenna and the front end integrated circuit.

The amplification circuit can receive a radio frequency signal by way of the first inductor. The low noise amplifier can include an input matching circuit that includes the first inductor. The input matching circuit can further include a series inductor having a first end configured to receive the radio frequency signal and a second end electrically coupled to the first inductor. The input matching circuit can further include a shunt capacitor electrically coupled to the first end of the series inductor. The input matching circuit can further include a direct current blocking capacitor configured to provide the radio frequency signal to the series inductor.

The amplification circuit can include a common source amplifier and the second inductor can be a source degeneration inductor. The amplification circuit can further include a cascode transistor in series with the common source amplifier.

The amplification circuit can include a common emitter amplifier and the second inductor can be an emitter degeneration inductor. The amplification circuit can further include a cascode transistor in series with the common emitter amplifier.

The packaged module can include conductive features disposed around the front end integrated circuit and electrically connected to the ground plane, the conductive features and the ground plane can be operable to provide shielding to the front end integrated circuit. The conductive features can include solder bumps. The packaged module can include a molding material around the front end integrated circuit, and a via extending through the molding material to electrically connect the ground plane and a solder bump of the solder bumps. The antenna can be a folded quarter wave antenna. The antenna can be a loop antenna.

A wireless communication device can include the packaged module. A system board can include the packaged module. The front end integrated circuit can be embodied on a semiconductor-on-insulator die.

Another aspect of this disclosure is a packaged module that includes a package substrate, a first integrated circuit supported by the package substrate, a crystal supported by the package substrate, and a second integrated circuit supported by the package substrate. The first integrated circuit is disposed between the crystal and the package substrate. The second integrated circuit includes a low noise amplifier that includes a first inductor, an amplification circuit, and a second inductor magnetically coupled to the first inductor to provide negative feedback to linearize the low noise amplifier.

The amplification circuit can receive a radio frequency signal by way of the first inductor. The low noise amplifier can include an input matching circuit that includes the first inductor. The input matching circuit can further include a series inductor having a first end configured to receive the radio frequency signal and a second end electrically coupled to the first inductor. The input matching circuit can further include a shunt capacitor electrically coupled to the first end of the series inductor. The input matching circuit can further include a direct current blocking capacitor configured to provide the radio frequency signal to the series inductor.

The amplification circuit can include a common source amplifier and the second inductor can be a source degeneration inductor. The amplification circuit can further include a cascode transistor in series with the common source amplifier.

The amplification circuit can include a common emitter amplifier and the second inductor can be an emitter degeneration inductor. The amplification circuit can further include a cascode transistor in series with the common emitter amplifier.

The crystal, the first integrated circuit, and the second integrated circuit can be disposed on a first side of the package substrate. The crystal and the first integrated circuit can be disposed on a first side of the package substrate, and the second integrated circuit can be disposed on a second side of the package substrate opposite the first side. The first integrated circuit can include a microprocessor and at least one of radio frequency transmitter circuitry or radio frequency receiver circuitry.

A wireless communication device can include the packaged module. A system board can include the packaged module. The second integrated circuit can be a semiconductor-on-insulator die.

Another aspect of this disclosure is a packaged module that includes a package substrate, a first integrated circuit supported by the package substrate, a crystal assembly supported by the package substrate and disposed between the first integrated circuit and the package substrate, and a second integrated circuit supported by the package substrate. The second integrated circuit includes a low noise amplifier that includes a first inductor, an amplification circuit, and a second inductor magnetically coupled to the first inductor to provide negative feedback to linearize the low noise amplifier.

The amplification circuit can receive a radio frequency signal by way of the first inductor. The low noise amplifier can include an input matching circuit that includes the first inductor. The input matching circuit can further include a series inductor having a first end configured to receive the radio frequency signal and a second end electrically coupled to the first inductor. The input matching circuit can further include a shunt capacitor electrically coupled to the first end of the series inductor. The input matching circuit can further include a direct current blocking capacitor configured to provide the radio frequency signal to the series inductor.

The amplification circuit can include a common source amplifier and the second inductor can be a source degeneration inductor. The amplification circuit can further include a cascode transistor in series with the common source amplifier.

The amplification circuit can include a common emitter amplifier and the second inductor can be an emitter degeneration inductor. The amplification circuit can further include a cascode transistor in series with the common emitter amplifier.

The crystal assembly can include a crystal, an input terminal configured to receive a first signal, an output terminal configured to output a second signal, a conductive pillar, and an enclosure configured to enclose the crystal. The conductive pillar can be formed at least partially within a side of the enclosure and extending from a top surface to a bottom surface of the enclosure, and the conductive pillar can be configured to conduct a third signal distinct from the first and second signals. The crystal assembly can include a plurality of the conductive pillars along one or more of the sides of the enclosure, in which each conductive pillar of the plurality of the conductive pillars extends from the top surface of the enclosure to the bottom surface of the enclosure.

The crystal assembly, the first integrated circuit, and the second integrated circuit can be disposed on a first side of the package substrate. The crystal assembly and the first integrated circuit can be disposed on a first side of the package substrate, and the second integrated circuit can be disposed on a second side of the package substrate opposite the first side. The first integrated circuit can be disposed between the crystal assembly and the second integrated circuit.

A wireless communication device can include the packaged module. A system board can include the packaged module. The first integrated circuit can include a microprocessor and at least one of radio frequency transmitter circuitry or radio frequency receiver circuitry. The second integrated circuit can be a semiconductor-on-insulator die.

Another aspect of this disclosure is a packaged module that includes a package substrate, a front end integrated circuit supported by the package substrate, and a stacked filter assembly supported by the package substrate. The front end integrated circuit includes a low noise amplifier that includes a first inductor, an amplification circuit, and a second inductor magnetically coupled to the first inductor to provide negative feedback to linearize the low noise amplifier. The stacked filter assembly is configured to filter a signal associated with the front end integrated circuit.

The amplification circuit can receive a radio frequency signal by way of the first inductor. The low noise amplifier can include an input matching circuit that includes the first inductor. The input matching circuit can further include a series inductor having a first end configured to receive the radio frequency signal and a second end electrically coupled to the first inductor. The input matching circuit can further include a shunt capacitor electrically coupled to the first end of the series inductor. The input matching circuit can further include a direct current blocking capacitor configured to provide the radio frequency signal to the series inductor.

The amplification circuit can include a common source amplifier and the second inductor can be a source degeneration inductor. The amplification circuit can further include a cascode transistor in series with the common source amplifier.

The amplification circuit can include a common emitter amplifier and the second inductor can be an emitter degeneration inductor. The amplification circuit can further include a cascode transistor in series with the common emitter amplifier.

The stacked filter assembly can include a plurality of passive components each packaged as a surface mount device. At least one passive component can be in direct communication with the package substrate and at least another passive component can be supported above the package substrate by the at least one passive component that is in the direct communication with the package substrate. The stacked filter assembly can include at least one of a pi-filter circuit, a bandpass filter circuit, a band reject filter circuit, or a notch filter circuit.

The packaged module can include an other integrated circuit supported by the package substrate. The stacked filter assembly, the front end integrated circuit, and the other integrated circuit can be disposed on a first side of the package substrate. The stacked filter assembly and the other circuit can be disposed on a first side of the package substrate, and the front end integrated circuit can be disposed on a second side of the package substrate opposite the first side. The other integrated circuit can be disposed between the stacked filter assembly and the second integrated circuit. The other integrated circuit can include a microprocessor and at least one of radio frequency transmitter circuitry or radio frequency receiver circuitry.

A wireless communication device can include the packaged module. A system board can include the packaged module. The other integrated circuit can include a microprocessor and at least one of radio frequency transmitter circuitry or radio frequency receiver circuitry. The front end integrated circuit can be a semiconductor-on-insulator die.

Another aspect of this disclosure is a front end system that includes a low noise amplifier in a receive path of the front end system, a switch coupled to the low noise amplifier, an overload protection circuit configured to adjust an impedance of the switch based on a signal level of the low noise amplifier to provide overload protection for the low noise amplifier, and a multi-mode power amplifier circuit in a transmit path of the front end system. The multi-mode power amplifier circuit includes a stacked output stage including a transistor stack of two or more transistors. The multi-mode power amplifier circuit includes a bias circuit configured to control a bias of at least one transistor of the transistor stack based on a mode of the multi-mode power amplifier circuit.

The switch can be an antenna-side switch. The antenna-side switch can have a first throw electrically coupled to an input of the low noise amplifier and a second throw electrically coupled to an output of the multi-mode power amplifier circuit.

The bias circuit can be configured to bias a transistor of the transistor stack to a linear region of operation in a first mode and as a switch in a second mode. The bias circuit can be configured to bias the transistor in a saturation region of operation in the second mode. The second mode can be associated with a lower power than the first mode. The stacked output stage can be configured to receive a supply voltage having a lower voltage level in the second mode relative to the first mode. The stacked output stage can be operable in at least three different modes. The transistor stack can include at least three transistors in series.

The overload protection circuit can be configured to increase the impedance of the switch responsive to detecting that the signal level indicates an overload condition. The overload protection circuit can be configured to provide a feedback signal to an analog control input of the switch to adjust the impedance of the switch. The front end system can include a limiter enable circuit coupled between an output of the overload protection circuit and the analog control input of the switch. The overload protection circuit can be configured to provide the feedback signal to the analog control input by way of the limiter enable circuit. The limiter enable circuit can be configured to receive a switch enable signal, and to disconnect the output of the overload protection circuit from the analog control input and turn off the switch responsive to the switch enable signal being disabled.

The switch can include a field effect transistor having a gate configured as an analog control input. The signal level can be an output signal level of the low noise amplifier. The signal level can be an input signal level of the low noise amplifier.

The overload protection circuit can include a detector and an error amplifier, in which the detector configured to generate a detection signal based on detecting the signal level, and in which the error amplifier is configured to generate a feedback signal for the switch based on the detection signal. The detection signal can include a detection current. The error amplifier can be configured to generate the feedback signal based on amplifying a difference between the detection current and a reference current.

A wireless communication device can include the front end system. The front end system can be embodied on a single integrated circuit. The single integrated circuit can be a semiconductor-on-insulator die. The front end system can be embodied in a packaged module.

Another aspect of this disclosure is a front end system that includes a low noise amplifier in a receive path of the front end system, a switch coupled to the low noise amplifier, an overload protection circuit configured to adjust an impedance of the switch based on a signal level of the low noise amplifier to provide overload protection for the low noise amplifier, and a power amplifier in a transmit path of the front end system. The power amplifier includes an injection-locked oscillator driver stage.

The switch can be an antenna-side switch. The antenna-side switch can have a first throw electrically coupled to an input of the low noise amplifier and a second throw electrically coupled to an output of the multi-mode power amplifier circuit.

The overload protection circuit can be configured to increase the impedance of the switch responsive to detecting that the signal level indicates an overload condition. The overload protection circuit can be configured to provide a feedback signal to an analog control input of the switch to adjust the impedance of the switch. The front end system can include a limiter enable circuit coupled between an output of the overload protection circuit and the analog control input of the switch. The overload protection circuit can be configured to provide the feedback signal to the analog control input by way of the limiter enable circuit. The limiter enable circuit can be configured to receive a switch enable signal, and to disconnect the output of the overload protection circuit from the analog control input and turn off the switch responsive to the switch enable signal being disabled.

The switch can include a field effect transistor having a gate configured as an analog control input. The signal level can be an output signal level of the low noise amplifier. The signal level can be an input signal level of the low noise amplifier.

The overload protection circuit can include a detector and an error amplifier, in which the detector configured to generate a detection signal based on detecting the signal level, and in which the error amplifier is configured to generate a feedback signal for the switch based on the detection signal. The detection signal can include a detection current. The error amplifier can be configured to generate the feedback signal based on amplifying a difference between the detection current and a reference current.

The injection-locked oscillator driver stage can include an output balun configured to provide a differential to single-ended signal conversion. The injection-locked oscillator driver stage can be powered by a substantially fixed supply voltage. The injection-locked oscillator driver stage can be configured to receive a single-ended input signal, and the injection-locked oscillator driver stage can include an input transformer configured to convert the single-ended input signal to a differential input signal.

The injection-locked oscillator driver stage can include a negative transconductance circuit electrically connected to an inductor-capacitor tank, in which the negative transconductance circuit configured to provide energy to the inductor-capacitor tank to maintain oscillation. The negative transconductance circuit can include a pair of cross-coupled metal-oxide-semiconductor transistors. The injection-locked oscillator driver stage can further include a signal injecting circuit configured to provide signal injection to the inductor-capacitor tank based on a radio frequency input signal.

A wireless communication device can include the front end system. The front end system can be embodied on a single integrated circuit. The single integrated circuit can be a semiconductor-on-insulator die. The front end system can be embodied in a packaged module.

Another aspect of this disclosure is a front end integrated circuit that includes a low noise amplifier system, an input pad configured to receive a control signal, and an overstress protection circuit. The low noise amplifier system includes a switch, a low noise amplifier including an input electrically coupled to the switch, and an overload protection circuit configured to adjust an impedance of the switch based on a signal level of the low noise amplifier. The low noise amplifier is controllable by the control signal. The overstress protection circuit includes an overstress sensing circuit electrically connected between the input pad and a first supply node, an impedance element electrically connected between the input pad and a signal node, and a controllable clamp electrically connected between the signal node and the first supply node. The overstress sensing circuit is configured to activate the controllable clamp in response to detecting an electrical overstress event at the input pad.

The switch can be an antenna-side switch.

The overload protection circuit can be configured to increase the impedance of the switch responsive to detecting that the signal level indicates an overload condition. The overload protection circuit can be configured to provide a feedback signal to an analog control input of the switch to adjust the impedance of the switch. The front end system can include a limiter enable circuit coupled between an output of the overload protection circuit and the analog control input of the switch. The overload protection circuit can be configured to provide the feedback signal to the analog control input by way of the limiter enable circuit. The limiter enable circuit can be configured to receive a switch enable signal, and to disconnect the output of the overload protection circuit from the analog control input and turn off the switch responsive to the switch enable signal being disabled.

The switch can include a field effect transistor having a gate configured as an analog control input. The signal level can be an output signal level of the low noise amplifier. The signal level can be an input signal level of the low noise amplifier.

The overload protection circuit can include a detector and an error amplifier, in which the detector configured to generate a detection signal based on detecting the signal level, and in which the error amplifier is configured to generate a feedback signal for the switch based on the detection signal. The detection signal can include a detection current. The error amplifier can be configured to generate the feedback signal based on amplifying a difference between the detection current and a reference current.

The overstress sensing circuit can include a plurality of diodes and a first field-effect transistor configured to activate in response to the electrical overstress event generating a flow of current through the plurality of diodes. The controllable clamp can include a second field-effect transistor electrically connected with the first field-effect transistor as a current mirror. The impedance element can include a resistor. The overstress protection circuit can further include an overshoot limiting circuit electrically connected between the signal node and a second supply node. The overstress protection circuit can include at least one diode configured to control a trigger voltage of the overshoot limiting circuit.

The first supply node can be a ground rail and the second supply node can be a power supply rail.

A wireless communication device can include the front end integrated circuit. A system board can include the front end integrated circuit. The front end integrated circuit can be embodied on a semiconductor-on-insulator die.

Another aspect of this disclosure is a packaged module that includes a package substrate, a radio frequency shielding structure extending above the package substrate, a front end integrated circuit positioned in an interior of the radio frequency shielding structure, and an antenna on the package substrate external to the radio frequency shielding structure. The front end integrated circuit includes a switch, a low noise amplifier including an input electrically coupled to the switch, and an overload protection circuit configured to adjust an impedance of the switch based on a signal level of the low noise amplifier.

The radio frequency shielding structure can include a plurality of wire bonds disposed between the antenna and the front end integrated circuit. The radio frequency shielding structure can include wire bond walls disposed around at least two sides of the front end integrated circuit. The radio frequency shielding structure can include a shielding layer substantially parallel to the package substrate, and the front end integrated circuit can be disposed between the shielding layer and the package substrate. The shielding layer can include copper. The packaged module can further include a protective layer over the shielding layer such that the shielding layer is disposed between the protective layer and the front end integrated circuit. The protective layer can include titanium.

The antenna can be a multi-layer antenna. A first portion of the antenna can be on a first side of the package substrate and a second portion of the antenna can be on a second side of the package substrate, in which the second side opposes the first side.

The switch can be an antenna-side switch electrically coupled to the antenna. The antenna-side switch can be configured to selectively electrically couple the low noise amplifier to the antenna.

The overload protection circuit can be configured to increase the impedance of the switch responsive to detecting that the signal level indicates an overload condition. The overload protection circuit can be configured to provide a feedback signal to an analog control input of the switch to adjust the impedance of the switch. The front end system can include a limiter enable circuit coupled between an output of the overload protection circuit and the analog control input of the switch. The overload protection circuit can be configured to provide the feedback signal to the analog control input by way of the limiter enable circuit. The limiter enable circuit can be configured to receive a switch enable signal, and to disconnect the output of the overload protection circuit from the analog control input and turn off the switch responsive to the switch enable signal being disabled.

The switch can include a field effect transistor having a gate configured as an analog control input. The signal level can be an output signal level of the low noise amplifier. The signal level can be an input signal level of the low noise amplifier.

The overload protection circuit can include a detector and an error amplifier, in which the detector configured to generate a detection signal based on detecting the signal level, and in which the error amplifier is configured to generate a feedback signal for the switch based on the detection signal. The detection signal can include a detection current. The error amplifier can be configured to generate the feedback signal based on amplifying a difference between the detection current and a reference current.

A wireless communication device can include the packaged module. A system board can include the packaged module. The front end integrated circuit can be embodied on a semiconductor-on-insulator die.

Another aspect of this disclosure is a packaged module that includes a multi-layer substrate including a ground plane, an antenna on a first side of the multi-layer substrate, and a front end integrated circuit on a second side of the multi-layer substrate. The front end integrated circuit includes a switch and an overload protection circuit configured to adjust an impedance of the switch based on a signal level of the low noise amplifier. The ground plane is positioned between the antenna and the front end integrated circuit.

The switch can be an antenna-side switch and the low noise amplifier can include an input electrically coupled to the antenna via the antenna-side switch.

The overload protection circuit can be configured to increase the impedance of the switch responsive to detecting that the signal level indicates an overload condition. The overload protection circuit can be configured to provide a feedback signal to an analog control input of the switch to adjust the impedance of the switch. The front end system can include a limiter enable circuit coupled between an output of the overload protection circuit and the analog control input of the switch. The overload protection circuit can be configured to provide the feedback signal to the analog control input by way of the limiter enable circuit. The limiter enable circuit can be configured to receive a switch enable signal, and to disconnect the output of the overload protection circuit from the analog control input and turn off the switch responsive to the switch enable signal being disabled.

The switch can include a field effect transistor having a gate configured as an analog control input. The signal level can be an output signal level of the low noise amplifier. The signal level can be an input signal level of the low noise amplifier.

The overload protection circuit can include a detector and an error amplifier, in which the detector configured to generate a detection signal based on detecting the signal level, and in which the error amplifier is configured to generate a feedback signal for the switch based on the detection signal. The detection signal can include a detection current. The error amplifier can be configured to generate the feedback signal based on amplifying a difference between the detection current and a reference current.

The packaged module can include conductive features disposed around the front end integrated circuit and electrically connected to the ground plane, the conductive features and the ground plane can be operable to provide shielding to the front end integrated circuit. The conductive features can include solder bumps. The packaged module can include a molding material around the front end integrated circuit, and a via extending through the molding material to electrically connect the ground plane and a solder bump of the solder bumps. The antenna can be a folded quarter wave antenna. The antenna can be a loop antenna.

A wireless communication device can include the packaged module. A system board can include the packaged module. The front end integrated circuit can be embodied on a semiconductor-on-insulator die.

Another aspect of this disclosure is a packaged module that includes a package substrate, a first integrated circuit supported by the package substrate, a crystal supported by the package substrate, and a second integrated circuit supported by the package substrate. The first integrated circuit is disposed between the crystal and the package substrate. The second integrated circuit includes a switch, a low noise amplifier electrically coupled to the switch, and an overload protection circuit configured to adjust an impedance of the switch based on a signal level of the low noise amplifier to provide overload protection.

The switch can be an antenna-side switch and the low noise amplifier can include an input electrically coupled to the switch.

The overload protection circuit can be configured to increase the impedance of the switch responsive to detecting that the signal level indicates an overload condition. The overload protection circuit can be configured to provide a feedback signal to an analog control input of the switch to adjust the impedance of the switch. The front end system can include a limiter enable circuit coupled between an output of the overload protection circuit and the analog control input of the switch. The overload protection circuit can be configured to provide the feedback signal to the analog control input by way of the limiter enable circuit. The limiter enable circuit can be configured to receive a switch enable signal, and to disconnect the output of the overload protection circuit from the analog control input and turn off the switch responsive to the switch enable signal being disabled.

The switch can include a field effect transistor having a gate configured as an analog control input. The signal level can be an output signal level of the low noise amplifier. The signal level can be an input signal level of the low noise amplifier.

The overload protection circuit can include a detector and an error amplifier, in which the detector configured to generate a detection signal based on detecting the signal level, and in which the error amplifier is configured to generate a feedback signal for the switch based on the detection signal. The detection signal can include a detection current. The error amplifier can be configured to generate the feedback signal based on amplifying a difference between the detection current and a reference current.

The crystal, the first integrated circuit, and the second integrated circuit can be disposed on a first side of the package substrate. The crystal and the first integrated circuit can be disposed on a first side of the package substrate, and the second integrated circuit can be disposed on a second side of the package substrate opposite the first side. The first integrated circuit can include a microprocessor and at least one of radio frequency transmitter circuitry or radio frequency receiver circuitry.

A wireless communication device can include the packaged module. A system board can include the packaged module. The second integrated circuit can be a semiconductor-on-insulator die.

Another aspect of this disclosure is a packaged module that includes a package substrate, a first integrated circuit supported by the package substrate, a crystal assembly supported by the package substrate and disposed between the first integrated circuit and the package substrate, and a second integrated circuit supported by the package substrate. The second integrated circuit includes a switch, a low noise amplifier electrically coupled to the switch, and an overload protection circuit configured to adjust an impedance of the switch based on a signal level of the low noise amplifier to provide overload protection.

The switch can be an antenna-side switch and the low noise amplifier can include an input electrically coupled to the switch.

The overload protection circuit can be configured to increase the impedance of the switch responsive to detecting that the signal level indicates an overload condition. The overload protection circuit can be configured to provide a feedback signal to an analog control input of the switch to adjust the impedance of the switch. The front end system can include a limiter enable circuit coupled between an output of the overload protection circuit and the analog control input of the switch. The overload protection circuit can be configured to provide the feedback signal to the analog control input by way of the limiter enable circuit. The limiter enable circuit can be configured to receive a switch enable signal, and to disconnect the output of the overload protection circuit from the analog control input and turn off the switch responsive to the switch enable signal being disabled.

The switch can include a field effect transistor having a gate configured as an analog control input. The signal level can be an output signal level of the low noise amplifier. The signal level can be an input signal level of the low noise amplifier.

The overload protection circuit can include a detector and an error amplifier, in which the detector configured to generate a detection signal based on detecting the signal level, and in which the error amplifier is configured to generate a feedback signal for the switch based on the detection signal. The detection signal can include a detection current. The error amplifier can be configured to generate the feedback signal based on amplifying a difference between the detection current and a reference current.

The crystal assembly can include a crystal, an input terminal configured to receive a first signal, an output terminal configured to output a second signal, a conductive pillar, and an enclosure configured to enclose the crystal. The conductive pillar can be formed at least partially within a side of the enclosure and extending from a top surface to a bottom surface of the enclosure, and the conductive pillar can be configured to conduct a third signal distinct from the first and second signals. The crystal assembly can include a plurality of the conductive pillars along one or more of the sides of the enclosure, in which each conductive pillar of the plurality of the conductive pillars extends from the top surface of the enclosure to the bottom surface of the enclosure.

The crystal assembly, the first integrated circuit, and the second integrated circuit can be disposed on a first side of the package substrate. The crystal assembly and the first integrated circuit can be disposed on a first side of the package substrate, and the second integrated circuit can be disposed on a second side of the package substrate opposite the first side. The first integrated circuit can be disposed between the crystal assembly and the second integrated circuit.

A wireless communication device can include the packaged module. A system board can include the packaged module. The first integrated circuit can include a microprocessor and at least one of radio frequency transmitter circuitry or radio frequency receiver circuitry. The second integrated circuit can be a semiconductor-on-insulator die.

Another aspect of this disclosure is a packaged module that includes a package substrate, a front end integrated circuit supported by the package substrate, and a stacked filter assembly supported by the package substrate. The front end integrated circuit includes a switch, a low noise amplifier electrically coupled to the switch, and an overload protection circuit configured to adjust an impedance of the switch based on a signal level of the low noise amplifier to provide overload protection. The stacked filter assembly is configured to filter a signal associated with the front end integrated circuit.

The switch can be an antenna-side switch and the low noise amplifier can include an input electrically coupled to the switch.

The overload protection circuit can be configured to increase the impedance of the switch responsive to detecting that the signal level indicates an overload condition. The overload protection circuit can be configured to provide a feedback signal to an analog control input of the switch to adjust the impedance of the switch. The front end system can include a limiter enable circuit coupled between an output of the overload protection circuit and the analog control input of the switch. The overload protection circuit can be configured to provide the feedback signal to the analog control input by way of the limiter enable circuit. The limiter enable circuit can be configured to receive a switch enable signal, and to disconnect the output of the overload protection circuit from the analog control input and turn off the switch responsive to the switch enable signal being disabled.

The switch can include a field effect transistor having a gate configured as an analog control input. The signal level can be an output signal level of the low noise amplifier. The signal level can be an input signal level of the low noise amplifier.

The overload protection circuit can include a detector and an error amplifier, in which the detector configured to generate a detection signal based on detecting the signal level, and in which the error amplifier is configured to generate a feedback signal for the switch based on the detection signal. The detection signal can include a detection current. The error amplifier can be configured to generate the feedback signal based on amplifying a difference between the detection current and a reference current.

The stacked filter assembly can include a plurality of passive components each packaged as a surface mount device. At least one passive component can be in direct communication with the package substrate and at least another passive component can be supported above the package substrate by the at least one passive component that is in the direct communication with the package substrate. The stacked filter assembly can include at least one of a pi-filter circuit, a bandpass filter circuit, a band reject filter circuit, or a notch filter circuit.

The packaged module can include an other integrated circuit supported by the package substrate. The stacked filter assembly, the front end integrated circuit, and the other integrated circuit can be disposed on a first side of the package substrate. The stacked filter assembly and the other circuit can be disposed on a first side of the package substrate, and the front end integrated circuit can be disposed on a second side of the package substrate opposite the first side. The other integrated circuit can be disposed between the stacked filter assembly and the second integrated circuit. The other integrated circuit can include a microprocessor and at least one of radio frequency transmitter circuitry or radio frequency receiver circuitry.

A wireless communication device can include the packaged module. A system board can include the packaged module. The other integrated circuit can include a microprocessor and at least one of radio frequency transmitter circuitry or radio frequency receiver circuitry. The front end integrated circuit can be a semiconductor-on-insulator die.

Another aspect of this disclosure is a front end integrated circuit that includes a multi-mode power amplifier circuit, an input pad configured to receive a control signal, and an overstress protection circuit. The multi-mode power amplifier circuit includes a stacked output stage including a transistor stack of two or more transistors. The multi-mode power amplifier circuit includes also includes a bias circuit configured to control a bias of at least one transistor of the transistor stack based on a mode of the multi-mode power amplifier circuit. The multi-mode power amplifier circuit is controllable by the control signal. The overstress protection circuit includes an overstress sensing circuit electrically connected between the input pad and a first supply node, an impedance element electrically connected between the input pad and a signal node, and a controllable clamp electrically connected between the signal node and the first supply node. The overstress sensing circuit is configured to activate the controllable clamp in response to detecting an electrical overstress event at the input pad.

The bias circuit can be configured to bias a transistor of the transistor stack to a linear region of operation in a first mode and as a switch in a second mode. The bias circuit can be configured to bias the transistor in a saturation region of operation in the second mode. The second mode can be associated with a lower power than the first mode. The stacked output stage can be configured to receive a supply voltage having a lower voltage level in the second mode relative to the first mode. The stacked output stage can be operable in at least three different modes. The transistor stack can include at least three transistors in series.

The overstress sensing circuit can include a plurality of diodes and a first field-effect transistor configured to activate in response to the electrical overstress event generating a flow of current through the plurality of diodes. The controllable clamp can include a second field-effect transistor electrically connected with the first field-effect transistor as a current mirror. The impedance element can include a resistor. The overstress protection circuit can further include an overshoot limiting circuit electrically connected between the signal node and a second supply node. The overstress protection circuit can include at least one diode configured to control a trigger voltage of the overshoot limiting circuit. The first supply node can be a ground rail and the second supply node can be a power supply rail.

A wireless communication device can include the front end integrated circuit. A packaged module can include the front end integrated circuit. The front end integrated circuit can be embodied on a semiconductor-on-insulator die.

Another aspect of this disclosure is a packaged module that includes a package substrate, a radio frequency shielding structure extending above the package substrate, a front end integrated circuit positioned in an interior of the radio frequency shielding structure, and an antenna on the package substrate external to the radio frequency shielding structure. The front end integrated circuit includes a multi-mode power amplifier circuit that includes a stacked output stage including a transistor stack of two or more transistors, and a bias circuit that controls a bias of at least one transistor of the transistor stack based on a mode of the multi-mode power amplifier circuit.

The bias circuit can be configured to bias a transistor of the transistor stack to a linear region of operation in a first mode and as a switch in a second mode. The bias circuit can be configured to bias the transistor in a saturation region of operation in the second mode. The second mode can be associated with a lower power than the first mode. The stacked output stage can be configured to receive a supply voltage having a lower voltage level in the second mode relative to the first mode. The stacked output stage can be operable in at least three different modes. The transistor stack can include at least three transistors in series.

The radio frequency shielding structure can include a plurality of wire bonds disposed between the antenna and the front end integrated circuit. The radio frequency shielding structure can include wire bond walls disposed around at least two sides of the front end integrated circuit. The radio frequency shielding structure can include a shielding layer substantially parallel to the package substrate, and the front end integrated circuit can be disposed between the shielding layer and the package substrate. The shielding layer can include copper. The packaged module can further include a protective layer over the shielding layer such that the shielding layer is disposed between the protective layer and the front end integrated circuit. The protective layer can include titanium.

The antenna can be a multi-layer antenna. A first portion of the antenna can be on a first side of the package substrate and a second portion of the antenna can be on a second side of the package substrate, in which the second side opposes the first side.

A wireless communication device can include the packaged module. A system board can include the packaged module. The front end integrated circuit can be embodied on a semiconductor-on-insulator die.

Another aspect of this disclosure is a packaged module that includes a multi-layer substrate including a ground plane, an antenna on a first side of the multi-layer substrate, and a front end integrated circuit on a second side of the multi-layer substrate. The front end integrated circuit includes a multi-mode power amplifier circuit including a stacked output stage including a transistor stack of two or more transistors, and a bias circuit configured to a bias of at least one transistor of the transistor stack based on a mode of the multi-mode power amplifier circuit. The ground plane is positioned between the antenna and the front end integrated circuit.

The bias circuit can be configured to bias a transistor of the transistor stack to a linear region of operation in a first mode and as a switch in a second mode. The bias circuit can be configured to bias the transistor in a saturation region of operation in the second mode. The second mode can be associated with a lower power than the first mode. The stacked output stage can be configured to receive a supply voltage having a lower voltage level in the second mode relative to the first mode. The stacked output stage can be operable in at least three different modes. The transistor stack can include at least three transistors in series.

The packaged module can include conductive features disposed around the front end integrated circuit and electrically connected to the ground plane, the conductive features and the ground plane can be operable to provide shielding to the front end integrated circuit. The conductive features can include solder bumps. The packaged module can include a molding material around the front end integrated circuit, and a via extending through the molding material to electrically connect the ground plane and a solder bump of the solder bumps. The antenna can be a folded quarter wave antenna. The antenna can be a loop antenna.

A wireless communication device can include the packaged module. A system board can include the packaged module. The front end integrated circuit can be embodied on a semiconductor-on-insulator die.

Another aspect of this disclosure is a packaged module that includes a package substrate, a first integrated circuit supported by the package substrate, a crystal supported by the package substrate, and a second integrated circuit supported by the package substrate. The first integrated circuit is disposed between the crystal and the package substrate. The second integrated circuit includes a multi-mode power amplifier circuit including a stacked output stage including a transistor stack of two or more transistors, and a bias circuit configured to control a bias of at least one transistor of the transistor stack based on a mode of the multi-mode power amplifier circuit.

The bias circuit can be configured to bias a transistor of the transistor stack to a linear region of operation in a first mode and as a switch in a second mode. The bias circuit can be configured to bias the transistor in a saturation region of operation in the second mode. The second mode can be associated with a lower power than the first mode. The stacked output stage can be configured to receive a supply voltage having a lower voltage level in the second mode relative to the first mode. The stacked output stage can be operable in at least three different modes. The transistor stack can include at least three transistors in series.

The crystal, the first integrated circuit, and the second integrated circuit can be disposed on a first side of the package substrate. The crystal and the first integrated circuit can be disposed on a first side of the package substrate, and the second integrated circuit can be disposed on a second side of the package substrate opposite the first side. The first integrated circuit can include a microprocessor and at least one of radio frequency transmitter circuitry or radio frequency receiver circuitry.

A wireless communication device can include the packaged module. A system board can include the packaged module. The second integrated circuit can be a semiconductor-on-insulator die.

Another aspect of this disclosure is a packaged module that includes a package substrate, a first integrated circuit supported by the package substrate, a crystal assembly supported by the package substrate and disposed between the first integrated circuit and the package substrate, and a second integrated circuit supported by the package substrate. The second integrated circuit includes a multi-mode power amplifier circuit including a stacked output stage including a transistor stack of two or more transistors, and a bias circuit configured to control a bias of at least one transistor of the transistor stack based on a mode of the multi-mode power amplifier circuit.

The bias circuit can be configured to bias a transistor of the transistor stack to a linear region of operation in a first mode and as a switch in a second mode. The bias circuit can be configured to bias the transistor in a saturation region of operation in the second mode. The second mode can be associated with a lower power than the first mode. The stacked output stage can be configured to receive a supply voltage having a lower voltage level in the second mode relative to the first mode. The stacked output stage can be operable in at least three different modes. The transistor stack can include at least three transistors in series.

The crystal assembly can include a crystal, an input terminal configured to receive a first signal, an output terminal configured to output a second signal, a conductive pillar, and an enclosure configured to enclose the crystal. The conductive pillar can be formed at least partially within a side of the enclosure and extending from a top surface to a bottom surface of the enclosure, and the conductive pillar can be configured to conduct a third signal distinct from the first and second signals. The crystal assembly can include a plurality of the conductive pillars along one or more of the sides of the enclosure, in which each conductive pillar of the plurality of the conductive pillars extends from the top surface of the enclosure to the bottom surface of the enclosure.

The crystal assembly, the first integrated circuit, and the second integrated circuit can be disposed on a first side of the package substrate. The crystal assembly and the first integrated circuit can be disposed on a first side of the package substrate, and the second integrated circuit can be disposed on a second side of the package substrate opposite the first side. The first integrated circuit can be disposed between the crystal assembly and the second integrated circuit.

A wireless communication device can include the packaged module. A system board can include the packaged module. The first integrated circuit can include a microprocessor and at least one of radio frequency transmitter circuitry or radio frequency receiver circuitry. The second integrated circuit can be a semiconductor-on-insulator die.

Another aspect of this disclosure is a packaged module that includes a package substrate, a front end integrated circuit supported by the package substrate, and a stacked filter assembly supported by the package substrate. The front end integrated circuit includes a multi-mode power amplifier circuit including a stacked output stage including a transistor stack of two or more transistors, and a bias circuit configured to control a bias of at least one transistor of the transistor stack based on a mode of the multi-mode power amplifier circuit. The stacked filter assembly is configured to filter a signal associated with the front end integrated circuit.

The bias circuit can be configured to bias a transistor of the transistor stack to a linear region of operation in a first mode and as a switch in a second mode. The bias circuit can be configured to bias the transistor in a saturation region of operation in the second mode. The second mode can be associated with a lower power than the first mode. The stacked output stage can be configured to receive a supply voltage having a lower voltage level in the second mode relative to the first mode. The stacked output stage can be operable in at least three different modes. The transistor stack can include at least three transistors in series.

The stacked filter assembly can include a plurality of passive components each packaged as a surface mount device. At least one passive component can be in direct communication with the package substrate and at least another passive component can be supported above the package substrate by the at least one passive component that is in the direct communication with the package substrate. The stacked filter assembly can include at least one of a pi-filter circuit, a bandpass filter circuit, a band reject filter circuit, or a notch filter circuit.

The packaged module can include an other integrated circuit supported by the package substrate. The stacked filter assembly, the front end integrated circuit, and the other integrated circuit can be disposed on a first side of the package substrate. The stacked filter assembly and the other circuit can be disposed on a first side of the package substrate, and the front end integrated circuit can be disposed on a second side of the package substrate opposite the first side. The other integrated circuit can be disposed between the stacked filter assembly and the second integrated circuit. The other integrated circuit can include a microprocessor and at least one of radio frequency transmitter circuitry or radio frequency receiver circuitry.

A wireless communication device can include the packaged module. A system board can include the packaged module. The other integrated circuit can include a microprocessor and at least one of radio frequency transmitter circuitry or radio frequency receiver circuitry. The front end integrated circuit can be a semiconductor-on-insulator die.

Another aspect of this disclosure is a front end integrated circuit that includes a power amplifier including an injection-locked oscillator driver stage, an input pad configured to receive a control signal, and an overstress protection circuit. The power amplifier is controllable by the control signal. The overstress protection circuit includes an overstress sensing circuit electrically connected between the input pad and a first supply node, an impedance element electrically connected between the input pad and a signal node, and a controllable clamp electrically connected between the signal node and the first supply node. The overstress sensing circuit is configured to activate the controllable clamp in response to detecting an electrical overstress event at the input pad.

The injection-locked oscillator driver stage can include an output balun configured to provide a differential to singled-ended signal conversion. The injection-locked oscillator driver stage can be powered by a substantially fixed supply voltage. The injection-locked oscillator driver stage can be configured to receive a single-ended input signal, and the injection-locked oscillator driver stage can include an input transformer configured to convert the single-ended input signal to a differential input signal.

The injection-locked oscillator driver stage can include a negative transconductance circuit electrically connected to an inductor-capacitor tank, in which the negative transconductance circuit configured to provide energy to the inductor-capacitor tank to maintain oscillation. The negative transconductance circuit can include a pair of cross-coupled metal-oxide-semiconductor transistors. The injection-locked oscillator driver stage can further include a signal injecting circuit configured to provide signal injection to the inductor-capacitor tank based on a radio frequency input signal.

The overstress sensing circuit can include a plurality of diodes and a first field-effect transistor configured to activate in response to the electrical overstress event generating a flow of current through the plurality of diodes. The controllable clamp can include a second field-effect transistor electrically connected with the first field-effect transistor as a current mirror. The impedance element can include a resistor. The overstress protection circuit can further include an overshoot limiting circuit electrically connected between the signal node and a second supply node. The overstress protection circuit can include at least one diode configured to control a trigger voltage of the overshoot limiting circuit. The first supply node can be a ground rail and the second supply node can be a power supply rail.

A wireless communication device can include the front end integrated circuit. A system board can include the front end integrated circuit. The front end integrated circuit can be embodied on a semiconductor-on-insulator die.

Another aspect of this disclosure is a packaged module that includes a package substrate, a radio frequency shielding structure extending above the package substrate, a front end integrated circuit positioned in an interior of the radio frequency shielding structure, and an antenna on the package substrate external to the radio frequency shielding structure. The front end integrated circuit includes an injection-locked oscillator driver stage;

The injection-locked oscillator driver stage can include an output balun configured to provide a differential to singled-ended signal conversion. The injection-locked oscillator driver stage can be powered by a substantially fixed supply voltage. The injection-locked oscillator driver stage can be configured to receive a single-ended input signal, and the injection-locked oscillator driver stage can include an input transformer configured to convert the single-ended input signal to a differential input signal.

The injection-locked oscillator driver stage can include a negative transconductance circuit electrically connected to an inductor-capacitor tank, in which the negative transconductance circuit configured to provide energy to the inductor-capacitor tank to maintain oscillation. The negative transconductance circuit can include a pair of cross-coupled metal-oxide-semiconductor transistors. The injection-locked oscillator driver stage can further include a signal injecting circuit configured to provide signal injection to the inductor-capacitor tank based on a radio frequency input signal.

The radio frequency shielding structure can include a plurality of wire bonds disposed between the antenna and the front end integrated circuit. The radio frequency shielding structure can include wire bond walls disposed around at least two sides of the front end integrated circuit. The radio frequency shielding structure can include a shielding layer substantially parallel to the package substrate, and the front end integrated circuit can be disposed between the shielding layer and the package substrate. The shielding layer can include copper. The packaged module can further include a protective layer over the shielding layer such that the shielding layer is disposed between the protective layer and the front end integrated circuit. The protective layer can include titanium.

The antenna can be a multi-layer antenna. A first portion of the antenna can be on a first side of the package substrate and a second portion of the antenna can be on a second side of the package substrate, in which the second side opposes the first side.

A wireless communication device can include the packaged module. A system board can include the packaged module. The front end integrated circuit can be embodied on a semiconductor-on-insulator die.

Another aspect of this disclosure is a packaged module that includes a multi-layer substrate including a ground plane, an antenna on a first side of the multi-layer substrate, and a front end integrated circuit on a second side of the multi-layer substrate. The front end integrated circuit includes an injection-locked oscillator driver stage, the ground plane positioned between the antenna and the front end integrated circuit.

The injection-locked oscillator driver stage can include an output balun configured to provide a differential to singled-ended signal conversion. The injection-locked oscillator driver stage can be powered by a substantially fixed supply voltage. The injection-locked oscillator driver stage can be configured to receive a single-ended input signal, and the injection-locked oscillator driver stage can include an input transformer configured to convert the single-ended input signal to a differential input signal.

The injection-locked oscillator driver stage can include a negative transconductance circuit electrically connected to an inductor-capacitor tank, in which the negative transconductance circuit configured to provide energy to the inductor-capacitor tank to maintain oscillation. The negative transconductance circuit can include a pair of cross-coupled metal-oxide-semiconductor transistors. The injection-locked oscillator driver stage can further include a signal injecting circuit configured to provide signal injection to the inductor-capacitor tank based on a radio frequency input signal.

The packaged module can include conductive features disposed around the front end integrated circuit and electrically connected to the ground plane, the conductive features and the ground plane can be operable to provide shielding to the front end integrated circuit. The conductive features can include solder bumps. The packaged module can include a molding material around the front end integrated circuit, and a via extending through the molding material to electrically connect the ground plane and a solder bump of the solder bumps. The antenna can be a folded quarter wave antenna. The antenna can be a loop antenna.

A wireless communication device can include the packaged module. A system board can include the packaged module. The front end integrated circuit can be embodied on a semiconductor-on-insulator die.

Another aspect of this disclosure is a packaged module that includes a package substrate, a first integrated circuit supported by the package substrate, a crystal supported by the package substrate, and a second integrated circuit supported by the package substrate. The first integrated circuit is disposed between the crystal and the package substrate. The second integrated circuit includes a power amplifier including an injection-locked oscillator driver stage.

The injection-locked oscillator driver stage can include an output balun configured to provide a differential to singled-ended signal conversion. The injection-locked oscillator driver stage can be powered by a substantially fixed supply voltage. The injection-locked oscillator driver stage can be configured to receive a single-ended input signal, and the injection-locked oscillator driver stage can include an input transformer configured to convert the single-ended input signal to a differential input signal.

The injection-locked oscillator driver stage can include a negative transconductance circuit electrically connected to an inductor-capacitor tank, in which the negative transconductance circuit configured to provide energy to the inductor-capacitor tank to maintain oscillation. The negative transconductance circuit can include a pair of cross-coupled metal-oxide-semiconductor transistors. The injection-locked oscillator driver stage can further include a signal injecting circuit configured to provide signal injection to the inductor-capacitor tank based on a radio frequency input signal.

The crystal, the first integrated circuit, and the second integrated circuit can be disposed on a first side of the package substrate. The crystal and the first integrated circuit can be disposed on a first side of the package substrate, and the second integrated circuit can be disposed on a second side of the package substrate opposite the first side. The first integrated circuit can include a microprocessor and at least one of radio frequency transmitter circuitry or radio frequency receiver circuitry.

A wireless communication device can include the packaged module. A system board can include the packaged module. The second integrated circuit can be a semiconductor-on-insulator die.

Another aspect of this disclosure is a packaged module that includes a package substrate, a first integrated circuit supported by the package substrate, a crystal assembly supported by the package substrate and disposed between the first integrated circuit and the package substrate, and a second integrated circuit supported by the package substrate. The second integrated circuit includes a power amplifier including an injection-locked oscillator driver stage.

The injection-locked oscillator driver stage can include an output balun configured to provide a differential to singled-ended signal conversion. The injection-locked oscillator driver stage can be powered by a substantially fixed supply voltage. The injection-locked oscillator driver stage can be configured to receive a single-ended input signal, and the injection-locked oscillator driver stage can include an input transformer configured to convert the single-ended input signal to a differential input signal.

The injection-locked oscillator driver stage can include a negative transconductance circuit electrically connected to an inductor-capacitor tank, in which the negative transconductance circuit configured to provide energy to the inductor-capacitor tank to maintain oscillation. The negative transconductance circuit can include a pair of cross-coupled metal-oxide-semiconductor transistors. The injection-locked oscillator driver stage can further include a signal injecting circuit configured to provide signal injection to the inductor-capacitor tank based on a radio frequency input signal.

The crystal assembly can include a crystal, an input terminal configured to receive a first signal, an output terminal configured to output a second signal, a conductive pillar, and an enclosure configured to enclose the crystal. The conductive pillar can be formed at least partially within a side of the enclosure and extending from a top surface to a bottom surface of the enclosure, and the conductive pillar can be configured to conduct a third signal distinct from the first and second signals. The crystal assembly can include a plurality of the conductive pillars along one or more of the sides of the enclosure, in which each conductive pillar of the plurality of the conductive pillars extends from the top surface of the enclosure to the bottom surface of the enclosure.

The crystal assembly, the first integrated circuit, and the second integrated circuit can be disposed on a first side of the package substrate. The crystal assembly and the first integrated circuit can be disposed on a first side of the package substrate, and the second integrated circuit can be disposed on a second side of the package substrate opposite the first side. The first integrated circuit can be disposed between the crystal assembly and the second integrated circuit.

A wireless communication device can include the packaged module. A system board can include the packaged module. The first integrated circuit can include a microprocessor and at least one of radio frequency transmitter circuitry or radio frequency receiver circuitry. The second integrated circuit can be a semiconductor-on-insulator die.

Another aspect of this disclosure is a packaged module that includes a package substrate, a front end integrated circuit supported by the package substrate, and a stacked filter assembly supported by the package substrate. The front end integrated circuit includes a power amplifier including an injection-locked oscillator driver stage. The stacked filter assembly is configured to filter a signal associated with the front end integrated circuit.

The injection-locked oscillator driver stage can include an output balun configured to provide a differential to singled-ended signal conversion. The injection-locked oscillator driver stage can be powered by a substantially fixed supply voltage. The injection-locked oscillator driver stage can be configured to receive a single-ended input signal, and the injection-locked oscillator driver stage can include an input transformer configured to convert the single-ended input signal to a differential input signal.

The injection-locked oscillator driver stage can include a negative transconductance circuit electrically connected to an inductor-capacitor tank, in which the negative transconductance circuit configured to provide energy to the inductor-capacitor tank to maintain oscillation. The negative transconductance circuit can include a pair of cross-coupled metal-oxide-semiconductor transistors. The injection-locked oscillator driver stage can further include a signal injecting circuit configured to provide signal injection to the inductor-capacitor tank based on a radio frequency input signal.

The stacked filter assembly can include a plurality of passive components each packaged as a surface mount device. At least one passive component can be in direct communication with the package substrate and at least another passive component can be supported above the package substrate by the at least one passive component that is in the direct communication with the package substrate. The stacked filter assembly can include at least one of a pi-filter circuit, a bandpass filter circuit, a band reject filter circuit, or a notch filter circuit.

The packaged module can include an other integrated circuit supported by the package substrate. The stacked filter assembly, the front end integrated circuit, and the other integrated circuit can be disposed on a first side of the package substrate. The stacked filter assembly and the other circuit can be disposed on a first side of the package substrate, and the front end integrated circuit can be disposed on a second side of the package substrate opposite the first side. The other integrated circuit can be disposed between the stacked filter assembly and the second integrated circuit. The other integrated circuit can include a microprocessor and at least one of radio frequency transmitter circuitry or radio frequency receiver circuitry.

A wireless communication device can include the packaged module. A system board can include the packaged module. The other integrated circuit can include a microprocessor and at least one of radio frequency transmitter circuitry or radio frequency receiver circuitry. The front end integrated circuit can be a semiconductor-on-insulator die.

Another aspect of this disclosure is a packaged module that includes a package substrate, a radio frequency shielding structure extending above the package substrate, a front end integrated circuit positioned in an interior of the radio frequency shielding structure, and an antenna on the package substrate external to the radio frequency shielding structure. The front end integrated circuit includes a pad, an overstress protection circuit, and an internal circuit electrically connected to a signal node. The overstress protection circuit includes an overstress sensing circuit electrically connected between the pad and a first supply node, an impedance element electrically connected between the pad and the signal node, and a controllable clamp electrically connected between the signal node and the first supply node. The overstress sensing circuit is configured to activate the controllable clamp in response to detecting an electrical overstress event at the pad.

The overstress sensing circuit can include a plurality of diodes and a first field-effect transistor configured to activate in response to the electrical overstress event generating a flow of current through the plurality of diodes. The controllable clamp can include a second field-effect transistor electrically connected with the first field-effect transistor as a current mirror. The impedance element can include a resistor. The overstress protection circuit can further include an overshoot limiting circuit electrically connected between the signal node and a second supply node. The overstress protection circuit can include at least one diode configured to control a trigger voltage of the overshoot limiting circuit. The first supply node can be a ground rail and the second supply node can be a power supply rail.

The radio frequency shielding structure can include a plurality of wire bonds disposed between the antenna and the front end integrated circuit. The radio frequency shielding structure can include wire bond walls disposed around at least two sides of the front end integrated circuit. The radio frequency shielding structure can include a shielding layer substantially parallel to the package substrate, and the front end integrated circuit can be disposed between the shielding layer and the package substrate. The shielding layer can include copper. The packaged module can further include a protective layer over the shielding layer such that the shielding layer is disposed between the protective layer and the front end integrated circuit. The protective layer can include titanium.

The antenna can be a multi-layer antenna. A first portion of the antenna can be on a first side of the package substrate and a second portion of the antenna can be on a second side of the package substrate, in which the second side opposes the first side.

A wireless communication device can include the packaged module. A system board can include the packaged module. The front end integrated circuit can be embodied on a semiconductor-on-insulator die.

Another aspect of this disclosure is a packaged module that includes a multi-layer substrate including a ground plane, an antenna on a first side of the multi-layer substrate, and a front end integrated circuit on a second side of the multi-layer substrate. The front end integrated circuit includes a pad, an overstress protection circuit, and an internal circuit electrically connected to a signal node. The overstress protection circuit includes an overstress sensing circuit electrically connected between the pad and a first supply node, an impedance element electrically connected between the pad and the signal node, and a controllable clamp electrically connected between the signal node and the first supply node. The overstress sensing circuit is configured to activate the controllable clamp in response to detecting an electrical overstress event at the pad. The ground plane is positioned between the antenna and the front end integrated circuit.

The overstress sensing circuit can include a plurality of diodes and a first field-effect transistor configured to activate in response to the electrical overstress event generating a flow of current through the plurality of diodes. The controllable clamp can include a second field-effect transistor electrically connected with the first field-effect transistor as a current mirror. The impedance element can include a resistor. The overstress protection circuit can further include an overshoot limiting circuit electrically connected between the signal node and a second supply node. The overstress protection circuit can include at least one diode configured to control a trigger voltage of the overshoot limiting circuit. The first supply node can be a ground rail and the second supply node can be a power supply rail.

The packaged module can include conductive features disposed around the front end integrated circuit and electrically connected to the ground plane, the conductive features and the ground plane can be operable to provide shielding to the front end integrated circuit. The conductive features can include solder bumps. The packaged module can include a molding material around the front end integrated circuit, and a via extending through the molding material to electrically connect the ground plane and a solder bump of the solder bumps. The antenna can be a folded quarter wave antenna. The antenna can be a loop antenna.

A wireless communication device can include the packaged module. A system board can include the packaged module. The front end integrated circuit can be embodied on a semiconductor-on-insulator die.

Another aspect of this disclosure is a packaged module that includes a package substrate, a first integrated circuit supported by the package substrate, a crystal supported by the package substrate, and a second integrated circuit supported by the package substrate. The first integrated circuit is disposed between the crystal and the package substrate. The second integrated circuit includes a pad, an overstress protection circuit, and an internal circuit electrically connected to a signal node. The overstress protection circuit includes an overstress sensing circuit electrically connected between the pad and a first supply node, an impedance element electrically connected between the pad and the signal node, and a controllable clamp electrically connected between the signal node and the first supply node. The overstress sensing circuit is configured to activate the controllable clamp in response to detecting an electrical overstress event at the pad.

The overstress sensing circuit can include a plurality of diodes and a first field-effect transistor configured to activate in response to the electrical overstress event generating a flow of current through the plurality of diodes. The controllable clamp can include a second field-effect transistor electrically connected with the first field-effect transistor as a current mirror. The impedance element can include a resistor. The overstress protection circuit can further include an overshoot limiting circuit electrically connected between the signal node and a second supply node. The overstress protection circuit can include at least one diode configured to control a trigger voltage of the overshoot limiting circuit. The first supply node can be a ground rail and the second supply node can be a power supply rail.

The crystal, the first integrated circuit, and the second integrated circuit can be disposed on a first side of the package substrate. The crystal and the first integrated circuit can be disposed on a first side of the package substrate, and the second integrated circuit can be disposed on a second side of the package substrate opposite the first side. The first integrated circuit can include a microprocessor and at least one of radio frequency transmitter circuitry or radio frequency receiver circuitry.

A wireless communication device can include the packaged module. A system board can include the packaged module. The second integrated circuit can be a semiconductor-on-insulator die.

Another aspect of this disclosure is a packaged module that includes a package substrate, a first integrated circuit supported by the package substrate, a crystal assembly supported by the package substrate and disposed between the first integrated circuit and the package substrate, and a second integrated circuit supported by the package substrate. The second integrated circuit includes a pad, an overstress protection circuit, and an internal circuit electrically connected to a signal node. The overstress protection circuit includes an overstress sensing circuit electrically connected between the pad and a first supply node, an impedance element electrically connected between the pad and the signal node, and a controllable clamp electrically connected between the signal node and the first supply node. The overstress sensing circuit is configured to activate the controllable clamp in response to detecting an electrical overstress event at the pad.

The overstress sensing circuit can include a plurality of diodes and a first field-effect transistor configured to activate in response to the electrical overstress event generating a flow of current through the plurality of diodes. The controllable clamp can include a second field-effect transistor electrically connected with the first field-effect transistor as a current mirror. The impedance element can include a resistor. The overstress protection circuit can further include an overshoot limiting circuit electrically connected between the signal node and a second supply node. The overstress protection circuit can include at least one diode configured to control a trigger voltage of the overshoot limiting circuit. The first supply node can be a ground rail and the second supply node can be a power supply rail.

The crystal assembly can include a crystal, an input terminal configured to receive a first signal, an output terminal configured to output a second signal, a conductive pillar, and an enclosure configured to enclose the crystal. The conductive pillar can be formed at least partially within a side of the enclosure and extending from a top surface to a bottom surface of the enclosure, and the conductive pillar can be configured to conduct a third signal distinct from the first and second signals. The crystal assembly can include a plurality of the conductive pillars along one or more of the sides of the enclosure, in which each conductive pillar of the plurality of the conductive pillars extends from the top surface of the enclosure to the bottom surface of the enclosure.

The crystal assembly, the first integrated circuit, and the second integrated circuit can be disposed on a first side of the package substrate. The crystal assembly and the first integrated circuit can be disposed on a first side of the package substrate, and the second integrated circuit can be disposed on a second side of the package substrate opposite the first side. The first integrated circuit can be disposed between the crystal assembly and the second integrated circuit.

A wireless communication device can include the packaged module. A system board can include the packaged module. The first integrated circuit can include a microprocessor and at least one of radio frequency transmitter circuitry or radio frequency receiver circuitry. The second integrated circuit can be a semiconductor-on-insulator die.

Another aspect of this disclosure is a packaged module that includes a package substrate, a front end integrated circuit supported by the package substrate, and a stacked filter assembly supported by the package substrate. The front end integrated circuit includes a pad, an overstress protection circuit, and an internal circuit electrically connected to a signal node. The overstress protection circuit includes an overstress sensing circuit electrically connected between the pad and a first supply node, an impedance element electrically connected between the pad and the signal node, and a controllable clamp electrically connected between the signal node and the first supply node. The overstress sensing circuit is configured to activate the controllable clamp in response to detecting an electrical overstress event at the pad. The stacked filter assembly is configured to filter a signal associated with the front end integrated circuit.

The overstress sensing circuit can include a plurality of diodes and a first field-effect transistor configured to activate in response to the electrical overstress event generating a flow of current through the plurality of diodes. The controllable clamp can include a second field-effect transistor electrically connected with the first field-effect transistor as a current mirror. The impedance element can include a resistor. The overstress protection circuit can further include an overshoot limiting circuit electrically connected between the signal node and a second supply node. The overstress protection circuit can include at least one diode configured to control a trigger voltage of the overshoot limiting circuit. The first supply node can be a ground rail and the second supply node can be a power supply rail.

The stacked filter assembly can include a plurality of passive components each packaged as a surface mount device. At least one passive component can be in direct communication with the package substrate and at least another passive component can be supported above the package substrate by the at least one passive component that is in the direct communication with the package substrate. The stacked filter assembly can include at least one of a pi-filter circuit, a bandpass filter circuit, a band reject filter circuit, or a notch filter circuit.

The packaged module can include an other integrated circuit supported by the package substrate. The stacked filter assembly, the front end integrated circuit, and the other integrated circuit can be disposed on a first side of the package substrate. The stacked filter assembly and the other circuit can be disposed on a first side of the package substrate, and the front end integrated circuit can be disposed on a second side of the package substrate opposite the first side. The other integrated circuit can be disposed between the stacked filter assembly and the second integrated circuit. The other integrated circuit can include a microprocessor and at least one of radio frequency transmitter circuitry or radio frequency receiver circuitry.

A wireless communication device can include the packaged module. A system board can include the packaged module. The other integrated circuit can include a microprocessor and at least one of radio frequency transmitter circuitry or radio frequency receiver circuitry. The front end integrated circuit can be a semiconductor-on-insulator die.

Another aspect of this disclosure is a low noise amplifier system that includes a low noise amplifier, a switch, and an overload protection circuit. The low noise amplifier includes a first inductor, an amplification circuit configured to amplify a radio frequency signal, and a second inductor magnetically coupled to the first inductor to provide negative feedback to linearize the low noise amplifier. The switch is coupled to the amplification circuit. The overload protection circuit is configured to adjust an impedance of the switch based on a signal level associated with the radio frequency signal to provide overload protection for the low noise amplifier.

The switch can be an input switch configured to provide the radio frequency signal to the amplification circuit for amplification. The overload protection circuit can provide a feedback signal to an analog control input of the input switch to adjust the impedance of the input switch. The overload protection circuit can increase the impedance of the input switch responsive to detecting that the signal level indicates an overload condition. The low noise amplifier system can also include limiter enable circuit coupled between an output of the overload protection circuit and the analog control input of the input switch, in which the overload protection circuit is configured to provide the feedback signal to the analog control input by way of the limiter enable circuit. The limiter enable circuit can receive a switch enable signal and disconnect the output of the overload protection circuit from the analog control input and turn off the input switch responsive to the switch enable signal being disabled. The input switch can include a field effect transistor having a gate configured as the analog control input.

The signal level can be an output signal level of the low noise amplifier. Alternatively, the signal level can be an input signal level of the low noise amplifier.

The overload protection circuit can include a detector and an error amplifier. The detector can generate a detection signal based on detecting the signal level. The error amplifier can generate a feedback signal for the switch based on the detection signal. The detector can include a bipolar transistor configured to saturate in response to an overload condition of the low noise amplifier. The detector can include a capacitor configured to filter a current flowing through the bipolar transistor, and the detector can generate the detection signal based on a voltage across the capacitor. The detection signal can include a detection current. The error amplifier can generate the feedback signal based on amplifying a difference between the detection current and a reference current.

The switch can provide the radio frequency signal to the amplification circuit by way of a matching circuit that includes the first inductor. The matching circuit can include a direct current blocking capacitor and a series inductor in series between the direct current blocking capacitor and the first inductor. The direct current blocking capacitor, the series inductor, and the first inductor can be arranged in series between the switch and a control terminal of the amplification circuit.

The first inductor and the second inductor can together function as a transformer having a primary winding in series with an input of the amplification circuit and a secondary winding connected between a transistor of the amplification circuit and a low voltage reference. The second inductor can be configured as a degeneration inductor. The switch can be in series with the second inductor. For instance, the second inductor can be in arranged in series between the switch and the amplification circuit.

The amplification circuit can include a field effect transistor having a source, and the second inductor can be configured as a source degeneration inductor. The first inductor and the second inductor can together function as a transformer having a primary winding in series with a gate of the field effect transistor and a secondary winding connected at the source of the field effect transistor.

The amplification circuit can include a bipolar transistor having an emitter, and the second inductor can be configured as an emitter degeneration inductor. The first inductor and the second inductor can together function as a transformer having a primary winding in series with a base of the bipolar transistor and a secondary winding connected at the emitter of the bipolar transistor.

The low noise amplifier system can include a series inductor arranged in series between the switch and the first inductor. The low noise amplifier system can include a direct current blocking capacitor electrically connected between the switch and the series inductor. The low noise amplifier system can include a shunt capacitor electrically connected to a node between the switch and the series inductor.

Another aspect of this disclosure is a front end system comprising that includes a low noise amplifier, an input switch, and an overload protection circuit. The low noise amplifier includes a first inductor, an amplification circuit configured to receive a radio frequency signal by way of the first inductor and to amplify the radio frequency signal, and a second inductor magnetically coupled to the first inductor to provide negative feedback to linearize the low noise amplifier. The input switch has a control input arranged to control an impedance of the input switch. The input switch includes a first throw coupled to the first inductor. The overload protection circuit is configured to provide a feedback signal to the control input of the input switch based on based on a signal level associated with the low noise amplifier.

The front end system can include a bypass path. The input switch can include a second throw electrically connected to the bypass path. The front end system can further include a power amplifier. The input switch can further include a third throw electrically connected to the power amplifier. The low noise amplifier, the bypass path, the multi-throw switch, and the power amplifier can be embodied on a single die.

The front end system can include an output switch having at least a first throw electrically connected to an output of the low noise amplifier.

The input switch can electrically connect an input of the low noise amplifier to an antenna in a first state.

The low noise amplifier, the input switch, and the overload protection circuit can be embodied on a single die.

The front end system can include a package enclosing the low noise amplifier, the input switch, and the overload protection circuit.

In the front end system, the control input can be an analog input.

The front end system can include one or more suitable features of any of the low noise amplifier systems discussed herein.

Another aspect of this disclosure is a wireless communication device that includes a front end system and an antenna in communication with the front end system. The front end system comprising that includes a low noise amplifier, an input switch, and an overload protection circuit. The low noise amplifier includes a first inductor, an amplification circuit configured to receive a radio frequency signal by way of the first inductor and to amplify the radio frequency signal, and a second inductor magnetically coupled to the first inductor to provide negative feedback to linearize the low noise amplifier. The input switch has a control input arranged to control an impedance of the input switch. The input switch includes a first throw coupled to the first inductor. The overload protection circuit is configured to provide a feedback signal to the control input of the input switch based on based on a signal level associated with the low noise amplifier.

The front end system can be configured to process Bluetooth signals. The front end system can be configured to process ZigBee signals. The front end system can be configured to process Wi-Fi signals.

The front end system can include one or more suitable features of any of the front end systems discussed herein.

The wireless communication device can be a mobile phone. The wireless communication device can be configured for wireless communication over a personal area network.

Another aspect of this disclosure is a method of providing overload protection in a low noise amplifier system. The method includes amplifying a radio frequency signal using the low noise amplifier, the low noise amplifier including first and second inductors magnetically coupled to each other to provide negative feedback to linearize the low noise amplifier; detecting that a signal level associated with the low noise amplifier is indicative of an overload condition; and increasing an impedance of a switch coupled to an amplification circuit of the low noise amplifier responsive to said detecting to thereby provide overload protection.

Detecting the signal level can include detecting an output signal level of the low noise amplifier. Alternatively, detecting the signal level can include detecting an input signal level of the low noise amplifier.

The switch can be an input switch configured to provide the radio frequency signal to the low noise amplifier. The method can include selectively connecting an output of an overload protection circuit to an analog control input of the input switch. The method can also include disconnecting the output of the overload protection circuit from the analog control input responsive to a switch enable signal being disabled.

The method can include generating a feedback signal based on detecting the signal level associated with the low noise amplifier using an error amplifier of the overload protection circuit, in which increasing the impedance of the switch is responsive to the feedback signal. Detecting can include generating a detection current. Generating the feedback signal can include amplifying a difference between the detection current and a reference current.

Detecting the signal level can include saturating a bipolar transistor in response to the overload condition. Detecting the signal level can also include filtering a current flowing through the bipolar transistor using a capacitor and controlling the detected signal level based on a voltage across the capacitor.

The switch can include a field effect transistor. Increasing the impedance of the switch can include providing an analog signal to a gate of the field effect transistor.

The second inductor can be a source degeneration inductor. Alternatively, the second inductor can be an emitter degeneration inductor. The switch can be arranged in series with the second inductor.

The switch can be an input switch configured to provide the radio frequency signal to the low noise amplifier. A series inductor can be arranged in series between the input switch and the first inductor. The method can include blocking a direct current signal component associated with the radio frequency signal using a blocking capacitor electrically connected between the input switch and the series inductor. A shunt capacitor can be electrically connected to a node between the input switch and the series inductor.

Another aspect of this disclosure is a radio frequency amplifier that includes an input terminal configured to receive a radio frequency input signal, an output terminal configured to provide a radio frequency output signal, a driver stage including an injection-locked oscillator configured to amplify the radio frequency input signal to generate an amplified radio frequency signal, and a stacked output stage configured to further amplify the amplified radio frequency to generate the output radio frequency signal. The stacked output stage includes a transistor stack of at least a first transistor and a second transistor in series with one another.

The stacked output stage can be operable in at least a first mode and a second mode. The radio frequency amplifier can include a bias circuit configured to bias the second transistor to a linear region of operation in the first mode, and to bias the second transistor as a switch in the second mode. The bias circuit can be configured to bias the second transistor in a saturation region of operation in the second mode. The bias circuit can be configured to dynamically generate biases for the first transistor and for the second transistor based on a mode control signal. The second transistor can be a field effect transistor and the bias circuit can be configured to bias the second transistor such that the second transistor has a drain-to-source voltage of less than 75 mV in the second mode. The second transistor can be a field effect transistor and the bias circuit can be configured to bias the second transistor such that the second transistor has a drain-to-source voltage of less than 100 mV in the second mode. The second mode can be associated with a lower power than the first mode. The stacked output stage can be operable in at least three different modes. The stacked output stage can be configured to receive a supply voltage, in which the supply voltage has a lower voltage level in the second mode relative to the first mode. The radio frequency amplifier can include a switch configured to provide the amplified radio frequency signal to the second transistor in the first mode, and to provide the amplified radio frequency signal to the first transistor in the second mode.

The stacked output stage can include a third transistor in series with the first and second transistors. The second transistor can be arranged in series between the first transistor and the third transistor. The first transistor, the second transistor, and the third transistor can be silicon-on-insulator transistors. The second transistor can be a field effect transistor having a source electrically connected to the first transistor and a drain electrically connected to the third transistor. The first transistor can be a common source transistor, the second transistor can be a common gate transistor, and the third transistor can be a common gate transistor. The first transistor can be a common emitter transistor, the second transistor can be a common base transistor, and the third transistor can be a common base transistor. The transistor stack can include at least four transistors in series with each other.

The first transistor and the second transistor can be semiconductor-on-insulator transistors. The first transistor can be a common source transistor, and the second transistor can be a common gate transistor. The first transistor can be a common emitter transistor, and the second transistor can be a common base transistor.

The driver stage can be a power amplifier input stage, and the stacked output stage can be a power amplifier output stage.

The radio frequency amplifier can include an output matching network electrically connected to the output terminal. The output matching network can be a class F output matching network. The output matching network can be a class AB output matching network.

The stacked output stage can have an adjustable supply voltage that changes with a mode of the radio frequency amplifier.

The radio frequency amplifier can include an interstage matching network providing impedance matching between an output of the driver stage and an input to the stacked output stage.

The injection-locked oscillator can include an output balun configured to provide a differential to singled-ended signal conversion. The radio frequency input signal can be a single-ended input signal, and the injection-locked oscillator can include an input transformer configured to convert the single-ended input signal to a differential input signal.

The driver stage can be powered by a substantially fixed supply voltage. The stacked output stage can have an adjustable supply voltage that changes with a mode of the radio frequency amplifier.

The radio frequency input signal can be a modulated signal having a substantially constant signal envelope.

The injection-locked oscillator can include a negative transconductance circuit electrically connected to an inductor-capacitor tank, and the negative transconductance circuit can be configured to provide energy to the inductor-capacitor tank to maintain oscillations. The negative transconductance circuit can include a pair of cross-coupled metal-oxide-semiconductor transistors. The injection-locked oscillator can further include a bias metal-oxide-semiconductor transistor having a gate bias voltage that controls a bias current of the negative transconductance circuit. The injection-locked oscillator can include a signal injecting circuit configured to provide signal injection to the inductor-capacitor tank based on the radio frequency input signal. The injection-locked oscillator can include an output transformer configured to generate an amplified radio frequency signal at the output of the driver stage. The inductor-capacitor tank can include an inductor associated with an inductance of the output transformer and a capacitor associated with a parasitic capacitance of the negative transconductance circuit.

Another aspect of this disclosure is a method of radio frequency signal amplification. The method includes receiving a radio frequency input signal as an input to a radio frequency amplifier, the radio frequency amplifier including a driver stage and a stacked output stage; amplifying the radio frequency input signal to generate an amplified radio frequency signal using an injection-locked oscillator of the driver stage; and further amplifying the amplified radio frequency signal using a transistor stack of the output stage, the transistor stack including at least a first transistor and a second transistor in series with one another.

The method can further include operating the stacked output stage in a selected mode chosen from at least a first mode and a second mode. The method can further include biasing the second transistor to a linear region of operation in the first mode, and biasing the second transistor as a switch in the second mode. The method can further include biasing the second transistor in a saturation region of operation in the second mode. The second mode can be associated with a lower power than the first mode.

The method can further include providing the stacked output stage with an adjustable supply voltage having a lower voltage level in the second mode relative to the first mode. The method can include providing output matching at an output of the radio frequency amplifier using an output matching network. The method can include providing interstage matching between an output of the driver stage and an input to the stacked output stage using an interstage matching network.

The method can include providing a differential to singled-ended signal conversion at an output of the injection-locked oscillator. The method can include powering the driver stage using a substantially fixed supply voltage. The method can include changing an adjustable supply voltage of the stacked output stage based on a mode of the radio frequency amplifier. Receiving the radio frequency input signal can include receiving a modulated signal having a substantially constant signal envelope. The method can include providing a single-ended to differential signal conversion at an input of the injection-locked oscillator using an input transformer. The method can include maintaining oscillators of an inductor-capacitor tank of the injection-locked oscillator using a negative transconductance circuit. The method can include controlling a bias current of the negative transconductance circuit by controlling a gate bias of a bias metal-oxide-semiconductor transistor. The method can include injecting the radio frequency input signal into the inductor-capacitor tank using a signal injecting circuit.

Another aspect of this disclosure is a front end system that includes a low noise amplifier, a power amplifier including a driver stage and a stacked output stage, and a switch electrically connected to the low noise amplifier and the power amplifier. The driver stage includes an injection-locked oscillator configured to amplify a radio frequency input signal to generate an amplified radio frequency signal. The stacked output stage is configured to further amplify the amplified radio frequency to generate an output radio frequency signal. The stacked output stage includes a transistor stack of at least a first transistor and a second transistor in series with one another.

The front end system can be implemented on a multi-chip module. The front end system can be implemented on an integrated circuit. The low noise amplifier and the power amplifier can be embodied on a single die. The die can be a semiconductor-on-insulator die. The front end system can include a package enclosing the power amplifier, the low noise amplifier, and the switch.

The switch can be a first multi-throw switch having at least a first throw electrically coupled to the power amplifier and a second throw electrically coupled to the low noise amplifier. The first multi-throw switch can further include a third throw. The front end system can include a bypass path electrically coupled to the third throw. The front end system can further include a second multi-throw switch having at least a first throw electrically connected to the power amplifier and a second throw electrically connected to the low noise amplifier. The first multi-throw switch can be configured to electrically connect an output of the power amplifier to an antenna in a first state, and the first multi-throw switch can be configured to electrically connect the low noise amplifier to the antenna in a second state. The first multi-throw switch can have at least two poles.

The front end system can include an antenna electrically coupled to the switch.

The front end system can include a supply control circuit configured to generate a supply voltage for the stacked output stage. The supply control circuit can include a DC-to-DC converter.

The stacked output stage can be operable in at least a first mode and a second mode. The front end system can include a bias circuit configured to bias the second transistor to a linear region of operation in the first mode, and to bias the second transistor as a switch in the second mode. The bias circuit can be configured to bias the second transistor in a saturation region of operation in the second mode. The bias circuit can be configured to dynamically generate biases for the first transistor and for the second transistor based on a mode control signal. The second transistor can be a field effect transistor and the bias circuit can be configured to bias the second transistor such that the second transistor has a drain-to-source voltage of less than 75 mV in the second mode. The second transistor can be a field effect transistor and the bias circuit can be configured to bias the second transistor such that the second transistor has a drain-to-source voltage of less than 100 mV in the second mode. The second mode can be associated with a lower power than the first mode. The stacked output stage can be operable in at least three different modes. The stacked output stage can be configured to receive a supply voltage, in which the supply voltage has a lower voltage level in the second mode relative to the first mode. The front end system can include a switch configured to provide the amplified radio frequency signal to the second transistor in the first mode, and to provide the amplified radio frequency signal to the first transistor in the second mode.

The stacked output stage can include a third transistor in series with the first and second transistors. The second transistor can be arranged in series between the first transistor and the third transistor. The first transistor, the second transistor, and the third transistor can be silicon-on-insulator transistors. The second transistor can be a field effect transistor having a source electrically connected to the first transistor and a drain electrically connected to the third transistor. The first transistor can be a common source transistor, the second transistor can be a common gate transistor, and the third transistor can be a common gate transistor. The first transistor can be a common emitter transistor, the second transistor can be a common base transistor, and the third transistor can be a common base transistor. The transistor stack can include at least four transistors in series with each other.

The first transistor and the second transistor can be semiconductor-on-insulator transistors. The first transistor can be a common source transistor, and the second transistor can be a common gate transistor. The first transistor can be a common emitter transistor, and the second transistor can be a common base transistor.

The stacked output stage can have an adjustable supply voltage that changes with a mode of the front end system.

The front end system can include an interstage matching network providing impedance matching between an output of the driver stage and an input to the stacked output stage.

The injection-locked oscillator can include an output balun configured to provide a differential to singled-ended signal conversion. The radio frequency input signal can be a single-ended input signal, and the injection-locked oscillator can include an input transformer configured to convert the single-ended input signal to a differential input signal.

The driver stage can be powered by a substantially fixed supply voltage. The stacked output stage can have an adjustable supply voltage that changes with a mode of the front end system.

The radio frequency input signal can be a modulated signal having a substantially constant signal envelope.

The front end system can include an output matching network electrically connected to an output of the stacked output stage.

The radio frequency input signal can be a single-ended input signal, and the injection-locked oscillator can include an input transformer configured to convert the single-ended input signal to a differential input signal.

The injection-locked oscillator can include a negative transconductance circuit electrically connected to an inductor-capacitor tank, and the negative transconductance circuit can be configured to provide energy to the inductor-capacitor tank to maintain oscillations. The negative transconductance circuit can include a pair of cross-coupled metal-oxide-semiconductor transistors. The injection-locked oscillator can further include a bias metal-oxide-semiconductor transistor having a gate bias voltage that controls a bias current of the negative transconductance circuit. The injection-locked oscillator can include a signal injecting circuit configured to provide signal injection to the inductor-capacitor tank based on the radio frequency input signal. The injection-locked oscillator can include an output transformer configured to generate an amplified radio frequency signal at the output of the driver stage. The inductor-capacitor tank can include an inductor associated with an inductance of the output transformer and a capacitor associated with a parasitic capacitance of the negative transconductance circuit.

Another aspect of this disclosure is a wireless communication device that includes a power amplifier including a driver stage and a stacked output stage, a transmitter configured to provide a radio frequency input signal to the power amplifier, a switch, and an antenna electrically connected to an output of the stacked output stage via the switch. The driver stage includes an injection-locked oscillator configured to amplify a radio frequency input signal to generate an amplified radio frequency signal. The stacked output stage is configured to further amplify the amplified radio frequency to generate an output radio frequency signal. The stacked output stage includes a transistor stack of at least a first transistor and a second transistor in series with one another.

The wireless communication device can include a supply control circuit configured to generate the second supply voltage. The supply control circuit can be configured to receive a mode control signal from the transmitter.

A wireless personal area network system can include the power amplifier and the transmitter, and the radio frequency input signal is a wireless personal area network signal. A wireless local area network system can include the power amplifier and the transmitter, and the radio frequency input signal can be a wireless local area network signal. The power amplifier can includes one or more features of the power amplifiers discussed herein.

Another aspect of this disclosure is packaged module for use in a wireless communication device. The packaged module includes a first die supported by a substrate and including at least a microprocessor and one or more of radio frequency transmitter circuitry and radio frequency receiver circuitry, a crystal supported by the substrate, and a second die supported by the substrate and implementing at least a portion of a radio frequency front end including a radio frequency power amplifier. The first die is disposed between the crystal and the substrate. The substrate is disposed between the first die and the second die.

The packaged module can include an overmold enclosing the first die and the crystal. A wireless communication device can include the packaged module. A system board assembly can include the packaged module.

Another aspect of this disclosure is packaged radio frequency module that includes a radio frequency shielding structure extending above a package substrate, a first die supported by the package substrate and in an interior of the radio frequency shielding structure, an antenna supported by the package substrate external to the radio frequency shielding structure, and a crystal supported by the package substrate. The first die is disposed between the crystal and the package substrate. The first die includes a radio frequency component.

The packaged radio frequency module can include an overmold enclosing the first die, the crystal, and the antenna. A wireless communication device can include the packaged radio frequency module. A system board assembly can include the packaged radio frequency module.

Another aspect of this disclosure is a packaged radio frequency module that includes a radio frequency shielding structure extending above a package substrate, a first die supported by the package substrate and in an interior of the radio frequency shielding structure, an antenna supported by the package substrate external to the radio frequency shielding structure, and a crystal supported by the package substrate. The crystal is disposed between the first die and the package substrate. The first die includes a radio frequency component.

The packaged radio frequency module can include an overmold enclosing the first die, the crystal, and the antenna. A wireless communication device can include the packaged radio frequency module. A system board assembly can include the packaged radio frequency module.

Another aspect of this disclosure is a packaged radio frequency module for use in a wireless communication device. The packaged radio frequency module includes a radio frequency shielding structure extending above a package substrate, a first integrated circuit die supported by the package substrate and in an interior of the radio frequency shielding structure, an antenna supported by the package substrate external to the radio frequency shielding structure, and a second integrated circuit die supported by the package substrate. The package substrate is disposed between the first integrated circuit die and the second integrated circuit die.

The first integrated circuit die can implement at least a portion of a radio frequency front end including a radio frequency power amplifier and the second integrated circuit die can implement at least a portion of a radio frequency baseband subsystem. The packaged radio frequency module can include an overmold enclosing the first integrated circuit die and the antenna. A wireless communication device can include the packaged radio frequency module. A system board assembly can include the packaged radio frequency module.

Another aspect of this disclosure is a packaged radio frequency module for use in a wireless communication device. The packaged radio frequency module includes a radio frequency shielding structure extending above a package substrate; a first wireless device component supported by the package substrate and in an interior of the radio frequency shielding structure; an antenna supported by the package substrate external to the radio frequency shielding structure; and a second wireless device component supported by and spaced from the package substrate, the first wireless device component between the second wireless device component and a first surface of the package substrate, at least a first overhanging portion of the second wireless device component extending beyond at least a portion of the periphery of the first wireless device component.

The first wireless device component can include a radio frequency component. The packaged radio frequency module can include an overmold enclosing the first wireless device component, the antenna, and the second wireless device component. A wireless communication device can include the packaged radio frequency module. A system board assembly can include the packaged radio frequency module.

Another aspect of this disclosure is a packaged radio frequency module for use in a wireless communication device. The packaged radio frequency module includes a multi-layer substrate having a first side and a second side opposite to the first side, the multi-layer substrate including a ground plane; an antenna on the first side of the multi-layer substrate; a first die including at least a radio frequency component, the first die disposed on the second side of the multi-layer substrate such that the ground plane is positioned between the antenna and the radio frequency component; a crystal disposed on the second side of the multi-layer substrate such that the first die is positioned between the crystal and the second side of the multi-layer substrate; and conductive features disposed around the radio frequency component and electrically connected to the ground plane.

The packaged radio frequency module can include an overmold enclosing the first die and the crystal. The first die can include a microprocessor. The conductive features and the ground plane can be configured to provide shielding for the radio frequency component. A wireless communication device can include the packaged radio frequency module. A system board assembly can include the packaged radio frequency module.

Another aspect of this disclosure is a radio frequency module that includes a multi-layer substrate having a first side and a second side opposite to the first side, the multi-layer substrate including a ground plane; an antenna on the first side of the multi-layer substrate; a first die including at least radio frequency receiver circuitry disposed on the second side of the multi-layer substrate such that the ground plane is positioned between the antenna and the radio frequency receiver circuitry; conductive features disposed around the radio frequency receiver circuitry and electrically connected to the ground plane; and a stacked filter assembly configured as a filter circuit that is in communication with the radio frequency receiver circuitry, the stacked filter assembly disposed on the second side of the multi-layer substrate.

The first die can include a microprocessor. The conductive features and the ground plane can be configured to provide shielding for the radio frequency receiver circuitry. The stacked filter assembly can include a plurality of passive components. Each passive component of the plurality of passive components can be packaged as a surface mount device. At least one passive component can be in direct communication with the second side of the multi-layer substrate and at least another passive component can be supported above the second side of the multi-layer substrate by the at least one passive component that is in the direct communication with the second side of the multi-layer substrate. The radio frequency module can include an overmold enclosing the first die and the stacked filter assembly. A wireless communication device can include the packaged radio frequency module. A system board assembly can include the packaged radio frequency module.

Another aspect of this disclosure is a radio frequency module that includes a multi-layer substrate having a first side and a second side opposite to the first side, the multi-layer substrate including a ground plane; an antenna on the first side of the multi-layer substrate; a first integrated circuit die implementing a radio frequency power amplifier, the first integrated circuit die disposed on the second side of the multi-layer substrate such that the ground plane is positioned between the antenna and the radio frequency power amplifier; conductive features disposed around at least the radio frequency power amplifier and electrically connected to the ground plane; and a second integrated circuit die disposed on the first side of the multi-layer substrate.

At least a portion of a radio frequency front end can include the radio frequency power amplifier. The conductive features and the ground plane can be configured to provide shielding for the radio frequency power amplifier. The second integrated circuit die can implement at least a portion of a radio frequency baseband subsystem. The radio frequency module can include an overmold enclosing the second integrated circuit die and the antenna. A wireless communication device can include the packaged radio frequency module. A system board assembly can include the packaged radio frequency module.

Another aspect of this disclosure is a packaged module for use in a wireless communication device. The packaged module includes a first die supported by a substrate; and a crystal assembly configured to provide a clock signal for use in the first die, the crystal assembly supported by the substrate and disposed between the first die and the substrate, the crystal assembly including a crystal, a conductive pillar, and an enclosure configured to enclose the crystal, the conductive pillar formed at least partially within a side of the enclosure and extending from a top surface to a bottom surface of the enclosure.

The first die can include at least a microprocessor and one or more of radio frequency transmitter circuitry and radio frequency receiver circuitry. The clock signal can be provided for use in the at least one of the microprocessor and the one or more of the radio frequency transmitter circuitry and the radio frequency receiver circuitry. The crystal assembly can further include an input terminal configured to receive a first signal and an output terminal configured to output the clock signal, the conductive pillar configured to conduct a third signal distinct from the first signal and the clock signal. The packaged module can include an overmold enclosing the first die and the crystal assembly. A wireless communication device can include the packaged module. A system board assembly can include the packaged module.

Another aspect of this disclosure is a packaged module for use in a wireless communication device. The packaged module includes a first die supported by a substrate; and a crystal assembly configured to provide a clock signal for use in the first die, the crystal assembly supported by the substrate, the first die disposed between the crystal assembly and the substrate, the crystal assembly including a crystal, a conductive pillar, and an enclosure configured to enclose the crystal, the conductive pillar formed at least partially within a side of the enclosure and extending from a top surface to a bottom surface of the enclosure.

The first die can include at least a microprocessor and one or more of radio frequency transmitter circuitry and radio frequency receiver circuitry. The clock signal can be provided for use in the at least one of the microprocessor and the one or more of the radio frequency transmitter circuitry and the radio frequency receiver circuitry. The crystal assembly can further include an input terminal configured to receive a first signal and an output terminal configured to output the clock signal, the conductive pillar configured to conduct a third signal distinct from the first signal and the clock signal. The packaged module can include an overmold enclosing the first die and the crystal assembly. A wireless communication device can include the packaged module. A system board assembly can include the packaged module.

Another aspect of this disclosure is a packaged module for use in a wireless communication device. The packaged module includes a first die supported by a substrate; a crystal assembly configured to provide a clock signal for use the first die, the crystal assembly supported by the substrate and disposed between the first die and the substrate, the crystal assembly including a crystal, a conductive pillar, and an enclosure configured to enclose the crystal, the conductive pillar formed at least partially within a side of the enclosure and extending from a top surface to a bottom surface of the enclosure; and a stacked filter assembly supported by the substrate and, the stacked filter assembly including a plurality of passive components, at least one passive component being in direct communication with the substrate and at least another passive component supported above the substrate by the at least one passive component that is in the direct communication with the substrate.

The first die can include at least one of the microprocessor and the radio frequency receiver circuitry. The clock signal can be provided for use in the at least one of the microprocessor and the radio frequency receiver circuitry. The stacked filter assembly can be configured as a filter circuit that is in communication with the radio frequency receiver circuitry. The crystal assembly can further include an input terminal configured to receive a first signal and an output terminal configured to output the clock signal, the conductive pillar configured to conduct a third signal distinct from the first signal and the clock signal. Each passive component of the plurality of passive components can be packaged as a surface mount device. The packaged module can include an overmold enclosing the first die, the crystal assembly, and the stacked filter assembly. A wireless communication device can include the packaged module. A system board assembly can include the packaged module.

Another aspect of this disclosure is a packaged module for use in a wireless communication device. The packaged module includes a first integrated circuit die supported by a substrate; a crystal assembly configured to provide a clock signal to the first integrated circuit die, the crystal assembly supported by the substrate and disposed between the first integrated circuit die and the substrate, the crystal assembly including a crystal, a conductive pillar, and an enclosure configured to enclose the crystal, the conductive pillar formed at least partially within a side of the enclosure and extending from a top surface to a bottom surface of the enclosure; and a second integrated circuit die supported by the substrate, the substrate disposed between the first integrated circuit die and the second integrated circuit die.

The first integrated circuit die can implement at least a portion of a radio frequency baseband subsystem. The clock signal can be provided for the at least a portion of the radio frequency baseband subsystem. The crystal assembly can further include an input terminal configured to receive a first signal and an output terminal configured to output the clock signal, the conductive pillar configured to conduct a third signal distinct from the first signal and the clock signal. The second integrated circuit die can implement at least a portion of a radio frequency front end including a radio frequency power amplifier. The packaged module can include an overmold enclosing the first integrated circuit die and the crystal assembly. A wireless communication device can include the packaged module. A system board assembly can include the packaged module.

Another aspect of this disclosure is a packaged module for use in a wireless communication device. The packaged module includes a first wireless device component supported by a substrate; a second wireless device component supported by and spaced from the substrate, the first wireless device component between the second wireless device component and the substrate, at least a first overhanging portion of the second wireless device component extending beyond at least a portion of the periphery of the first wireless device component; and a crystal assembly supported by the substrate and disposed between the at least the first overhanging portion of the second wireless device component and the substrate, the crystal assembly including a crystal, a conductive pillar, and an enclosure configured to enclose the crystal, the conductive pillar formed at least partially within a side of the enclosure and extending from a top surface to a bottom surface of the enclosure.

The crystal assembly can further include an input terminal configured to receive a first signal and an output terminal configured to output a second signal, the conductive pillar configured to conduct a third signal distinct from the first and second signals. The packaged module can include an overmold enclosing the first wireless device component, the second wireless device component, and the crystal assembly. A wireless communication device can include the packaged module. A system board assembly can include the packaged module.

Another aspect of this disclosure is a packaged module for use in a wireless communication device. The packaged module includes a first die supported by a substrate; a stacked filter assembly supported by the substrate, the stacked filter assembly including a plurality of passive components, at least one passive component being in direct communication with the substrate and at least another passive component supported above the substrate by the at least one passive component that is in the direct communication with the substrate; and a crystal supported by the substrate, the first die disposed between the crystal and the substrate.

The first die can include at least a microprocessor and radio frequency receiver circuitry. The stacked filter assembly can be configured as a filter circuit that is in communication with the radio frequency receiver circuitry. Each passive component of the plurality of passive components can be packaged as a surface mount device. The packaged module can include an overmold enclosing the first die, the stacked filter assembly, and the crystal. A wireless communication device can include the packaged module. A system board assembly can include the packaged module.

Another aspect of this disclosure is a packaged module for use in a wireless communication device. The packaged module includes a first die supported by a substrate; a stacked filter assembly supported by the substrate and including a plurality of passive components, at least one passive component being in direct communication with the substrate and at least another passive component supported above the substrate by the at least one passive component that is in the direct communication with the substrate; and a crystal supported by the substrate and disposed between the first die and the substrate.

The first die can include at least a microprocessor and radio frequency receiver circuitry. The stacked filter assembly can be configured as a filter circuit that is in communication with the radio frequency receiver circuitry. Each passive component of the plurality of passive components can be packaged as a surface mount device. The packaged module can include an overmold enclosing the first die, the stacked filter assembly, and the crystal. A wireless communication device can include the packaged module. A system board assembly can include the packaged module.

Another aspect of this disclosure is a packaged module for use in a wireless communication device. The packaged module includes a first die supported by a substrate; a stacked filter assembly supported by the substrate, the stacked filter assembly including a plurality of passive components, at least one passive component being in direct communication with the substrate and at least another passive component supported above the substrate by the at least one passive component that is in the direct communication with the substrate; and a second die supported by the substrate, the substrate disposed between the first die and the second die.

The first die can include at least a microprocessor and radio frequency receiver circuitry. The stacked filter assembly can be configured as a filter circuit that is in communication with the radio frequency receiver circuitry. The second die can implement at least a portion of a radio frequency front end including a radio frequency power amplifier. Each passive component of the plurality of passive components can be packaged as a surface mount device. The packaged module can include an overmold enclosing the first die and the stacked filter assembly. A wireless communication device can include the packaged module. A system board assembly can include the packaged module.

Another aspect of this disclosure is a packaged module for a radio frequency wireless device. The packaged module includes a first wireless device component supported by a substrate and including at least a microprocessor and radio frequency receiver circuitry; a second wireless device component supported by and spaced from the substrate, the first wireless device component between the second wireless device component and the substrate, at least a first overhanging portion of the second wireless device component extending beyond at least a portion of the periphery of the first wireless device component; and a stacked filter assembly supported by the substrate and configured as a filter circuit that is in communication with the radio frequency receiver circuitry, the stacked filter assembly including a plurality of passive components, at least one passive component being in direct communication with the substrate, the stacked filter assembly disposed between the at least a first overhanging portion and the substrate.

Each passive component of the plurality of passive components can be packaged as a surface mount device. At least another passive component can be supported above the substrate by the at least one passive component that is in the direct communication with the substrate. The packaged module can include an overmold enclosing the first wireless device component, the second wireless device component, and the stacked filter assembly. A wireless communication device can include the packaged module. A system board assembly can include the packaged module.

Another aspect of this disclosure is a packaged module for use in a wireless communication device. The packaged module includes a first die supported by a substrate and including at least one of a microprocessor, radio frequency transmitter circuitry, and radio frequency receiver circuitry; a crystal configured to provide a timing signal for use in the first die, the crystal supported by the substrate and disposed between the first die and the substrate; and a second die supported by the substrate and implementing at least a portion of a radio frequency front end including a radio frequency power amplifier, the substrate disposed between the first die and the second die.

The packaged module can include an overmold enclosing the first die and the crystal. A wireless communication device can include the packaged module. A system board assembly can include the packaged module.

Another aspect of this disclosure is a packaged module for use in a radio frequency wireless device. The packaged module includes a first wireless device component supported by a substrate; a second wireless device component supported by and spaced from the substrate and implementing at least a portion of a radio frequency baseband subsystem, the first wireless device component positioned between the second wireless device component and the substrate, at least a first overhanging portion of the second wireless device component extending beyond at least a portion of the periphery of the first wireless device component; and a third wireless device component supported by the substrate and implementing at least a portion of a radio frequency front end including a radio frequency power amplifier, the substrate disposed between the second wireless device component and the third wireless device component.

The packaged module can include an overmold enclosing the first wireless device component and the second wireless device component. A wireless communication device can include the packaged module. A system board assembly can include the packaged module.

Another aspect of this disclosure is a packaged module for use in a wireless communication device. The packaged module includes a first wireless device component supported by a substrate; a second wireless device component supported by and spaced from the substrate, the first wireless device component between the second wireless device component and the substrate, at least a first overhanging portion of the second wireless device component extending beyond at least a portion of the periphery of the first wireless device component; and a crystal supported by the substrate, the first wireless device component and the second wireless device component disposed between the crystal and the substrate.

The packaged module can include an overmold enclosing the first wireless device component, the second wireless device component, and the crystal. A wireless communication device can include the packaged module. A system board assembly can include the packaged module.

Another aspect of this disclosure is a packaged module for use in a wireless communication device. The packaged module includes a first wireless device component supported by a substrate; a second wireless device component supported by and spaced from the substrate, the first wireless device component positioned between the second wireless device component and the substrate, at least a first overhanging portion of the second wireless device component extending beyond at least a portion of the periphery of the first wireless device component; and a crystal supported by the substrate, the crystal disposed within the at least the first overhanging portion of the second wireless device component and between the second wireless device component and the substrate.

The packaged module can include an overmold enclosing the first wireless device component, the second wireless device component, and the crystal. A wireless communication device can include the packaged module. A system board assembly can include the packaged module.

Another aspect of this disclosure is a packaged radio frequency module for use in a wireless communication device. The packaged radio frequency module includes a radio frequency shielding structure extending above a package substrate; a first die supported by the package substrate and in an interior of the radio frequency shielding structure, the first die including a radio frequency component; an antenna supported by the package substrate external to the radio frequency shielding structure; and a crystal assembly supported by the package substrate and disposed between the first die and the package substrate, the crystal assembly including a crystal, a conductive pillar, and an enclosure configured to enclose the crystal, the conductive pillar formed at least partially within a side of the enclosure and extending from a top surface to a bottom surface of the enclosure.

The packaged radio frequency module can include an overmold enclosing the first die, the crystal assembly, and the antenna. The crystal assembly can further include an input terminal configured to receive a first signal, an output terminal configured to output a second signal, and the conductive pillar is configured to conduct a third signal distinct from the first and second signals. A wireless communication device can include the packaged radio frequency module. A system board assembly can include the packaged radio frequency module.

Another aspect of this disclosure is a packaged radio frequency module for use in a wireless communication device. The packaged radio frequency module includes a radio frequency shielding structure extending above a package substrate; a first die supported by the package substrate and in an interior of the radio frequency shielding structure, the first die including radio frequency receiver circuitry; an antenna supported by the package substrate external to the radio frequency shielding structure; and a stacked filter assembly supported by the package substrate and configured as a filter circuit that is in communication with the radio frequency receiver circuitry, the stacked filter assembly including a plurality of passive components, at least one passive component being in direct communication with the package substrate and at least another passive component supported above the package substrate by the at least one passive component that is in the direct communication with the package substrate.

Each passive component of the plurality of passive components can be packaged as a surface mount device. The packaged radio frequency module can include an overmold enclosing the first die, the stacked filter assembly, and the antenna. The wireless communication device can include the packaged radio frequency module. A system board assembly can include the packaged radio frequency module Another aspect of this disclosure is a packaged radio frequency module for use in a wireless communication device. The packaged radio frequency module includes a multi-layer substrate having a first side and a second side opposite to the first side, the multi-layer substrate including a ground plane; an antenna on the first side of the multi-layer substrate; a first die including at least a radio frequency component, the first die disposed on the second side of the multi-layer substrate such that the ground plane is positioned between the antenna and the radio frequency component; a crystal disposed on the second side of the multi-layer substrate such that the crystal is positioned between the first die and the second side of the multi-layer substrate; and conductive features disposed around the radio frequency component and electrically connected to the ground plane.

The first die can include a microprocessor. The conductive features and the ground plane can be configured to provide shielding for the radio frequency component. The packaged radio frequency module can include an overmold enclosing the first die and the crystal. A wireless communication device can include the packaged radio frequency module. A system board assembly can include the packaged radio frequency module.

Another aspect of this disclosure is a radio frequency module that includes a multi-layer substrate having a first side and a second side opposite to the first side, the multi-layer substrate including a ground plane; an antenna on the first side of the multi-layer substrate; a first die including at least a radio frequency component disposed on the second side of the multi-layer substrate such that the ground plane is positioned between the antenna and the radio frequency component; conductive features disposed around the radio frequency component and electrically connected to the ground plane; and a crystal assembly disposed on the second side of the multi-layer substrate such that the crystal assembly is positioned between the first die and the second side of the multi-layer substrate, the crystal assembly including a crystal, a conductive pillar, and an enclosure configured to enclose the crystal, the conductive pillar formed at least partially within a side of the enclosure and extending from a top surface to a bottom surface of the enclosure.

The conductive features and the ground plane can be configured to provide shielding for the radio frequency component. The crystal assembly can further include an input terminal configured to receive a first signal, an output terminal configured to output a second signal, the conductive pillar configured to conduct a third signal distinct from the first and second signals. The packaged radio frequency module can include an overmold enclosing the first die and the crystal assembly. A wireless communication device can include the radio frequency module. A system board assembly can include the radio frequency module.

Another aspect of this disclosure is a radio frequency module that includes a multi-layer substrate including a ground plane and having a first side and a second side opposite to the first side, an antenna on the first side of the multi-layer substrate, a radio frequency component disposed on the second side of the multi-layer substrate such that the ground plane is positioned between the antenna and the radio frequency component, a first wireless device component spaced from the second side of the multi-layer substrate, and conductive features disposed around the radio frequency component and electrically connected to the ground plane. The radio frequency component is positioned between the first wireless device component and the second side of the multi-layer substrate, at least a first overhanging portion of the first wireless device component extends beyond at least a portion of the periphery of the radio frequency component.

The conductive features and the ground plane can be configured to provide shielding for the radio frequency component. The radio frequency module can include an overmold enclosing the radio frequency component and the first wireless device component. A wireless communication device can include the radio frequency module. A system board assembly can include the radio frequency module.

For purposes of summarizing the disclosure, certain aspects, advantages and novel features of the inventions have been described herein. It is to be understood that not necessarily all such advantages may be achieved in accordance with any particular embodiment. Thus, the any of innovations may be embodied or carried out in a manner that achieves or optimizes one advantage or group of advantages as taught herein without necessarily achieving other advantages as may be taught or suggested herein.

The present application hereby incorporates by reference the entire disclosures of U.S. Provisional Patent Application No. 62/440,241, titled FRONT END SYSTEMS, filed Dec. 29, 2016; U.S. Provisional Patent Application No. 62/480,002, titled FRONT END SYSTEMS AND RELATED DEVICES, INTEGRATED CIRCUITS, MODULES, AND METHODS, filed Mar. 31, 2017; U.S. Provisional Patent Application No. 62/570,549, titled FRONT END SYSTEMS AND RELATED DEVICES, INTEGRATED CIRCUITS, MODULES, AND METHODS, filed Oct. 10, 2017; U.S. Provisional Patent Application No. 62/571,409, titled FRONT END SYSTEMS AND RELATED DEVICES, INTEGRATED CIRCUITS, MODULES, AND METHODS, filed Oct. 12, 2017; U.S. Provisional Patent Application No. 62/594,179, titled FRONT END SYSTEMS AND RELATED DEVICES, INTEGRATED CIRCUITS, MODULES, AND METHODS, filed Dec. 4, 2017; and U.S. Provisional Patent Application No. 62/595,935, titled FRONT END SYSTEMS AND RELATED DEVICES, INTEGRATED CIRCUITS, MODULES, AND METHODS, filed Dec. 7, 2017.

The present application also hereby incorporates by reference the entire disclosures of: U.S. patent application Ser. No. 15/585,631, titled SHIELDED RADIO FREQUENCY COMPONENT WITH INTEGRATED ANTENNA, filed May 5, 2017; U.S. patent application Ser. No. 15/389,097, titled IMPEDANCE TRANSFORMATION CIRCUIT FOR AMPLIFIER, filed Dec. 22, 2016; U.S. patent application Ser. No. 15/458,423, titled APPARATUS AND METHODS FOR OVERLOAD PROTECTION OF LOW NOISE AMPLIFIERS, filed Mar. 14, 2017; U.S. patent application Ser. No. 15/393,590, titled APPARATUS AND METHODS FOR ELECTRICAL OVERSTRESS PROTECTION, filed Dec. 29, 2016; U.S. patent application Ser. No. 15/474,905, titled MULTI-MODE STACKED AMPLIFIER, filed Mar. 30, 2017; U.S. patent application Ser. No. 15/584,463, titled APPARATUS AND METHODS FOR POWER AMPLIFIERS WITH AN INJECTION-LOCKED OSCILLATOR DRIVER STAGE, filed May 2, 2017; U.S. patent application Ser. No. 15/490,346, titled SELECTIVE SHIELDING OF RADIO FREQUENCY MODULES, filed Apr. 18, 2017; U.S. patent application Ser. No. 15/490,349, titled METHODS FOR SELECTIVELY SHIELDING RADIO FREQUENCY MODULES, filed Apr. 18, 2017; U.S. patent application Ser. No. 15/490,436, titled SELECTIVELY SHIELDING RADIO FREQUENCY MODULE WITH MULTI-LAYER ANTENNA, filed Apr. 18, 2017; U.S. patent application Ser. No. 15/489,506, titled RADIO FREQUENCY SYSTEM-IN-PACKAGE INCLUDING A STACKED SYSTEM-ON-CHIP, filed Apr. 17, 2017; U.S. patent application Ser. No. 15/489,532, titled SYSTEM IN PACKAGE WITH VERTICALLY ARRANGED RADIO FREQUENCY COMPONENTRY, filed Apr. 17, 2017; U.S. patent application Ser. No. 15/489,607, titled REDUCED FORM FACTOR RADIO FREQUENCY SYSTEM-IN-PACKAGE, filed Apr. 17, 2017; U.S. patent application Ser. No. 15/489,631, titled CRYSTAL PACKAGING WITH CONDUCTIVE PILLARS, filed Apr. 17, 2017; U.S. patent application Ser. No. 15/489,563, titled SURFACE MOUNT DEVICE STACKING FOR REDUCED FORM FACTOR, filed Apr. 17, 2017; U.S. patent application Ser. No. 15/489,528, titled RADIO FREQUENCY SYSTEM-IN-PACKAGE WITH STACKED CLOCKING CRYSTAL, filed Apr. 17, 2017; U.S. patent application Ser. No. 15/654,050, titled IMPEDANCE TRANSFORMATION CIRCUIT AND OVERLOAD PROTECTION FOR LOSE NOISE AMPLIFIER, filed Jul. 19, 2017; U.S. patent application Ser. No. 15/855,065, titled RADIO FREQUENCY AMPLIFIERS WITH INJECTION-LOCKED OSCILLATOR DRIVER STAGE AND A STACKED OUTPUT STAGE, filed Dec. 27, 2017; and U.S. Provisional Patent Application No. 62/573,524, titled RADIO FREQUENCY MODULES, filed Oct. 17, 2017.

Any combination of features described in the patent applications that are incorporated by reference can be implemented in combination with one or more aspects described herein.

BRIEF DESCRIPTION OF THE DRAWINGS

FIG. 15A is a cross section of a packaged module that includes a ground plane between an antenna and a front end integrated circuit according to an embodiment.

FIGS. 15B to 15F are example cross sections of the packaged module of FIG. 15A that include various front end integrated circuits according to certain embodiments. In FIG. 15B, the front end integrated circuit includes a low noise amplifier with magnetically coupled inductors. In FIG. 15C, the front end integrated circuit includes a low noise amplifier and an overload protection circuit. In FIG. 15D, the front end integrated circuit includes a multi-mode power amplifier. In FIG. 15E, the front end integrated circuit includes a power amplifier that includes an injection-locked oscillator driver stage. In FIG. 15F, the front end integrated circuit includes an overstress protection circuit.

FIG. 25 is a cross section of a packaged module that includes an integrated circuit, a crystal assembly under the integrated circuit, and an other integrated circuit that includes an overstress protection circuit according to an embodiment.

FIG. 38E illustrates a schematic block diagram of another example of a radio frequency system.

FIG. 38F illustrates a schematic block diagram of another example of a radio frequency system.

FIG. 61A shows a graph of power added efficiency (PAE) and gain versus output power. FIG. 61B shows a graph of current consumption versus output power. FIG. 61C shows a graph of power level versus output power.

FIG. 66B is a schematic diagram of an IC interface including an EOS protection circuit according to another embodiment.

FIG. 69 is a schematic diagram of an example radio frequency module that includes a radio frequency component and an integrated antenna according to an embodiment.

FIG. 72A is a flow diagram of an illustrative process that includes forming a shielding layer over a radio frequency component of a module and leaving an antenna unshielded according to an embodiment.

FIGS. 72B, 72C, 72D, and 72E illustrate an example module or strip of modules corresponding to various stages of the process of FIG. 72A according to an embodiment.

FIG. 73A is a flow diagram of another illustrative process that includes forming a shielding layer over a radio frequency component of a module and leaving an antenna unshielded according to an embodiment.

FIGS. 73B, 73C, 73D, 73E, and 73F illustrate an example module or strip of modules corresponding to various stages of the process of FIG. 73A according to an embodiment.

FIG. 74A is a flow diagram of another illustrative process that includes forming a shielding layer over a radio frequency component of a module and leaving an antenna unshielded according to an embodiment.

FIGS. 74B, 74C, 74D, 74E, and 74F illustrate an example module, strip of modules, or group of modules corresponding to various stages of the process of FIG. 74A according to an embodiment.

FIG. 75A is a flow diagram of another illustrative process that includes forming a shielding layer over a radio frequency component of a module and leaving an antenna unshielded according to an embodiment.

FIGS. 75B, 75C, 75D, 75E, and 75F illustrate an example module or group of modules corresponding to various stages of the process of FIG. 75A according to an embodiment.

FIG. 76A is a flow diagram of another illustrative process that includes forming a shielding layer over a radio frequency component of a module and leaving an antenna unshielded according to an embodiment.

FIGS. 76B, 76C, 76D, 76E, 76F, 76G, 76H, and 76I illustrate an example module, strip of modules, or group of modules corresponding to various stages of the process of FIG. 76A according to an embodiment.

Figure 77A:
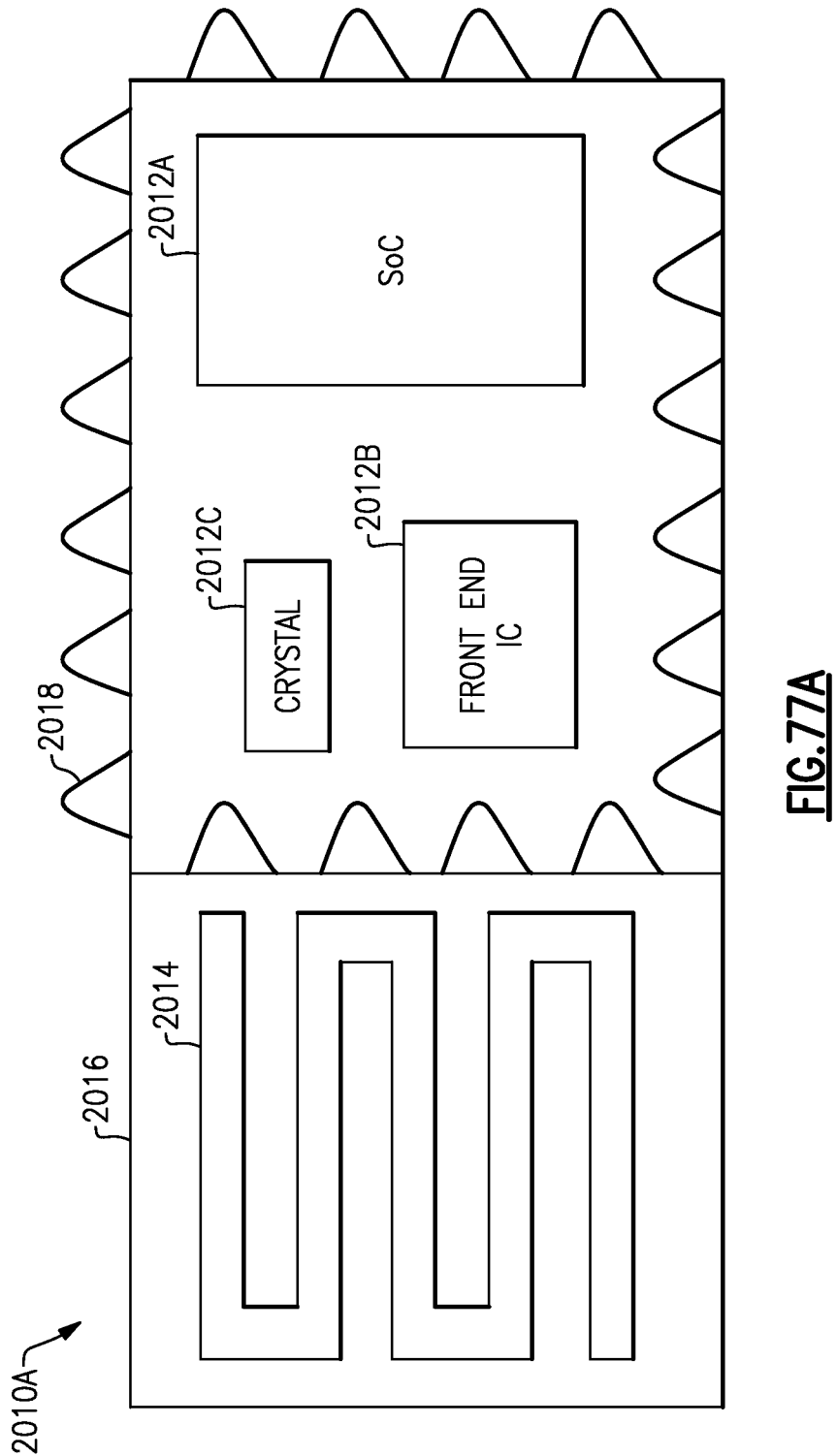

FIG. 77A is a schematic diagram of an example of a radio frequency module according to an embodiment.

Figure 77B:
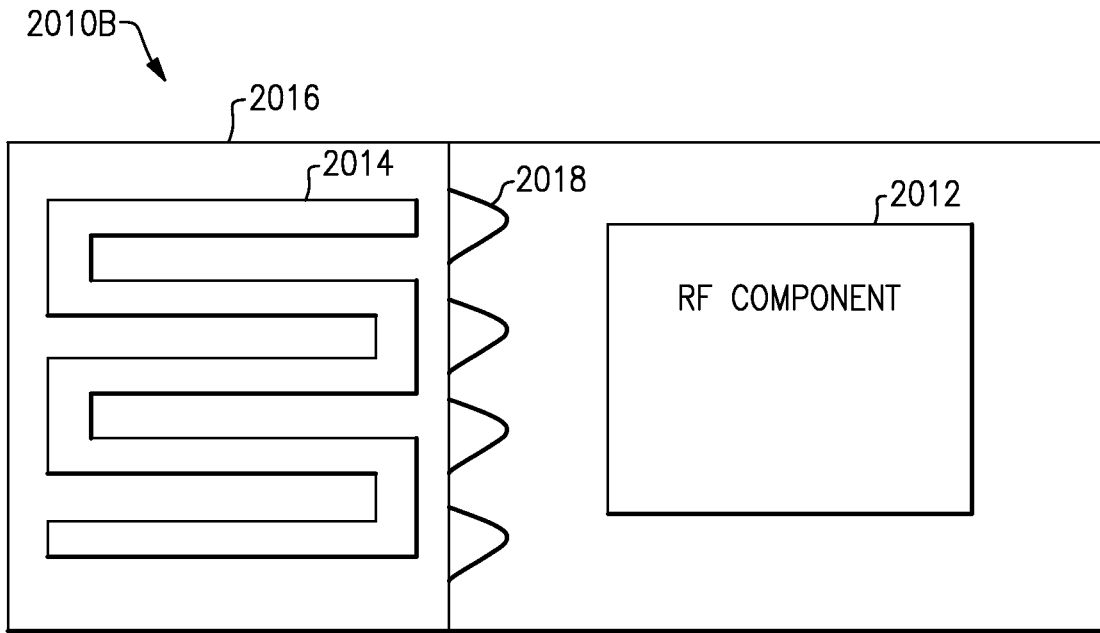
Figure 77C:
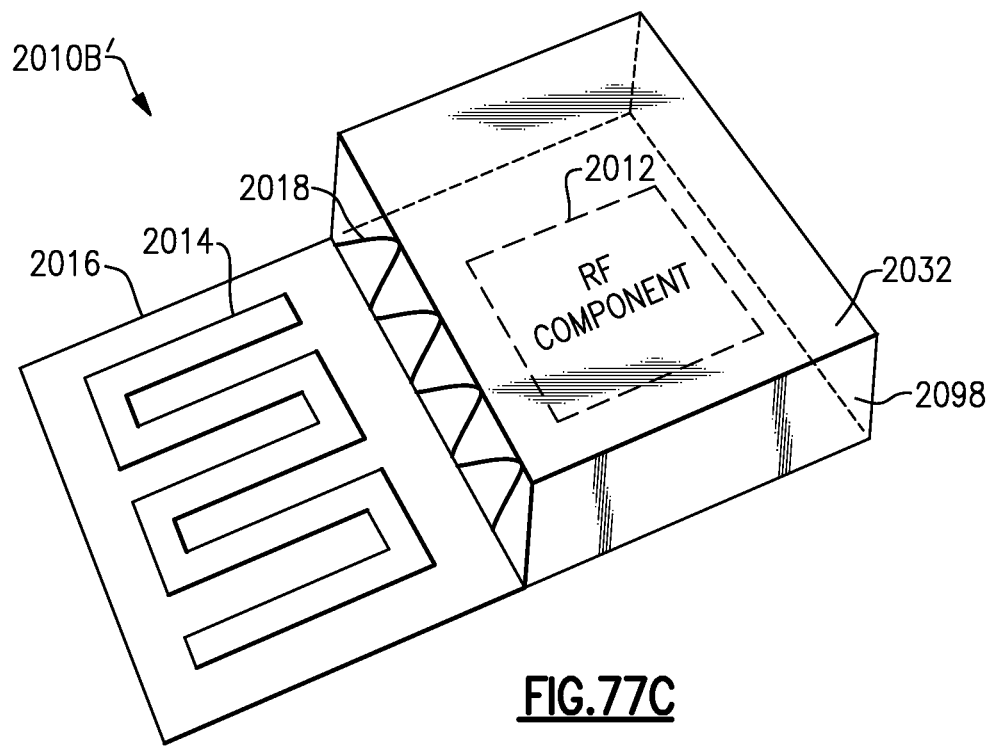

FIG. 77B is a schematic diagram of an example of a radio frequency module according to an embodiment. FIG. 77C is another view of the radio frequency module of FIG. 77B after a shielding layer and a conformal structure are formed.

Figure 77D:
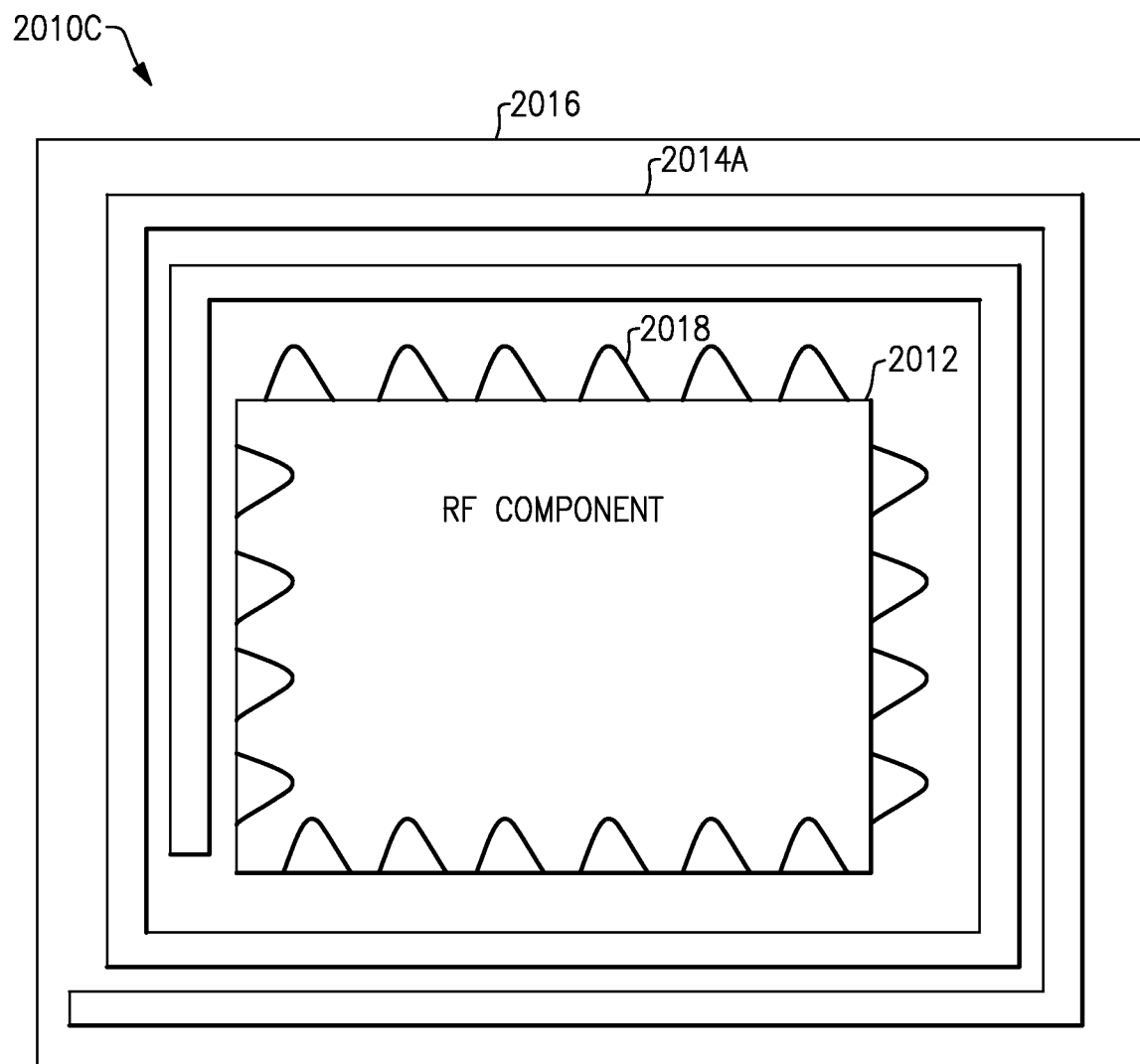

FIG. 77D is a schematic diagram of an example of a selectively shielded radio frequency module according to an embodiment.

Figure 77E:
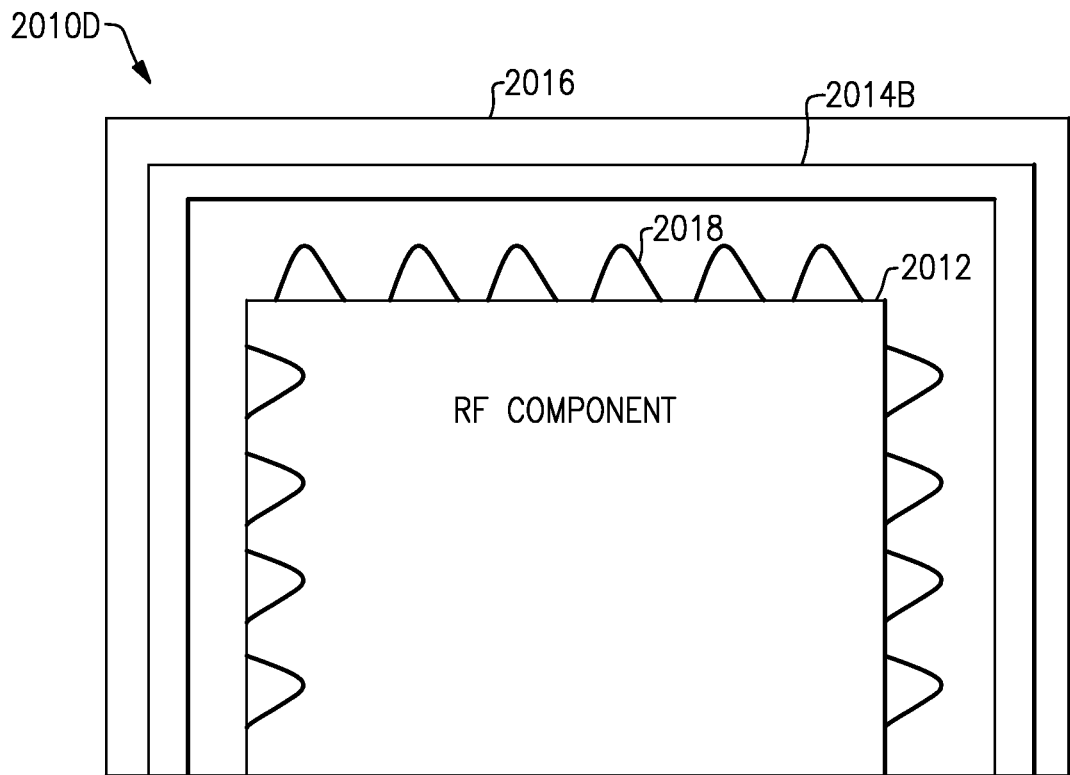

FIG. 77E is a schematic diagram of an example of a selectively shielded radio frequency module according to an embodiment.

Figure 77F:
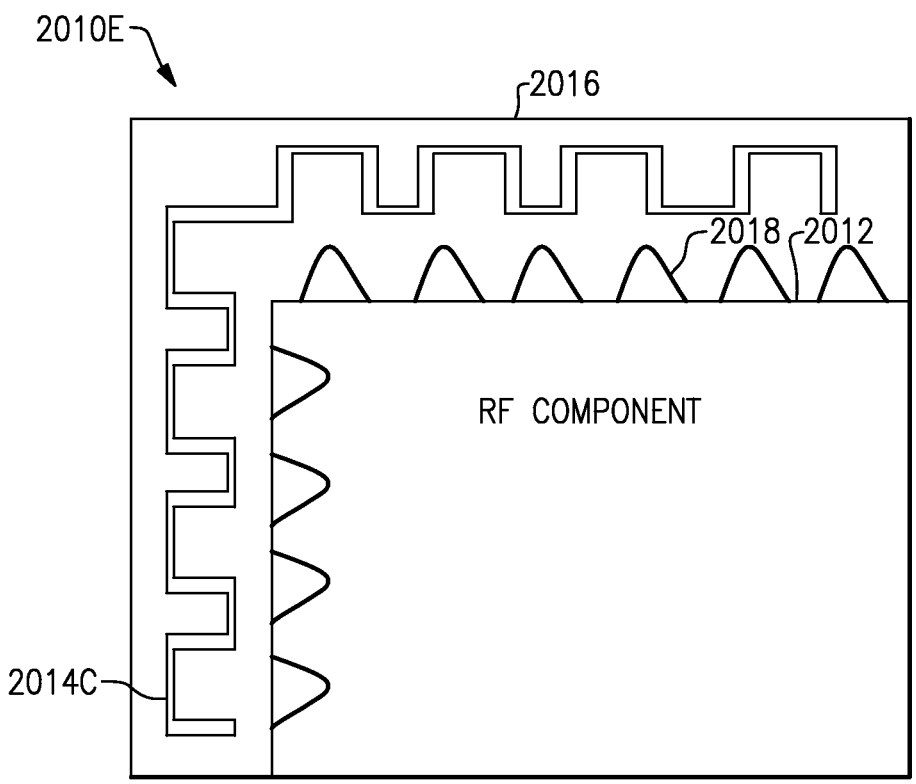

FIG. 77F is a schematic diagram of an example of a selectively shielded radio frequency module according to an embodiment.

Figure 77G:
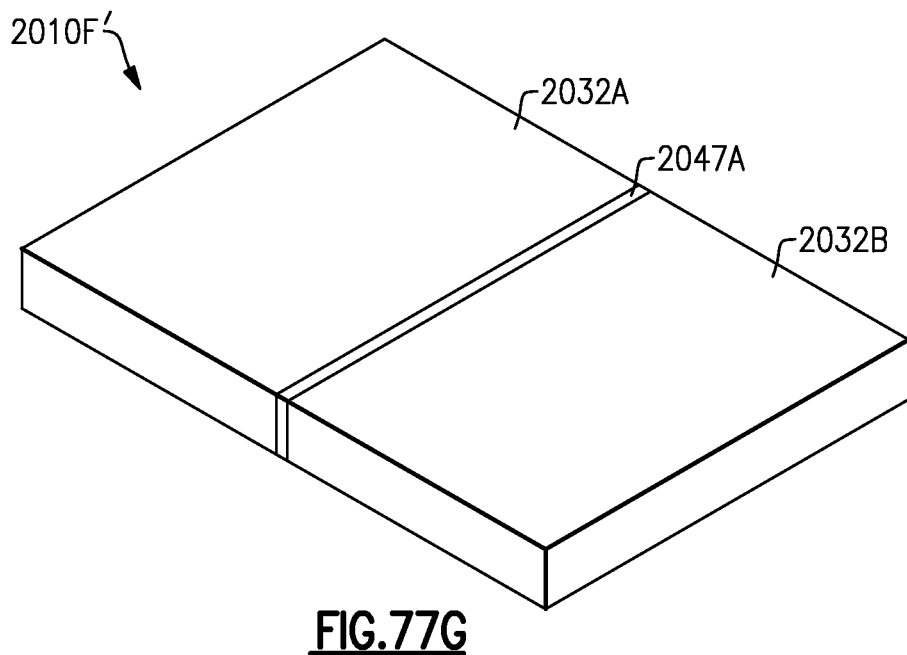

FIG. 77G illustrates an example of a shielded radio frequency module with an ablation pattern leaving a portion of the radio frequency module unshielded according to an embodiment.

Figure 77H:
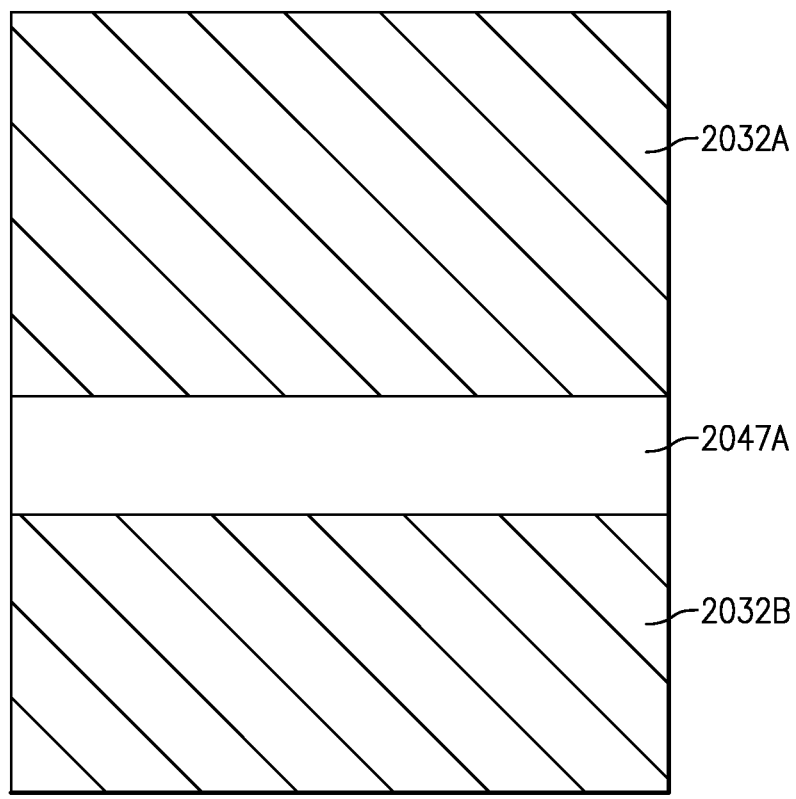

FIG. 77H illustrates an example of a selectively shielded radio frequency module according to an embodiment.

FIG. 77I illustrates an example of a selectively shielded radio frequency module with an unshielded portion between two shielded portions according to an embodiment.

FIG. 77J illustrates an example of a selectively shielded radio frequency module with an unshielded portion between shielded portions according to an embodiment.

FIGS. 78A and 78B illustrate a radio frequency module that includes an integrated antenna implemented on opposing sides of a package substrate according to an embodiment. FIG. 78A is a top view of the radio frequency module. FIG. 78B is a bottom view of the radio frequency module.

Figure 79A:
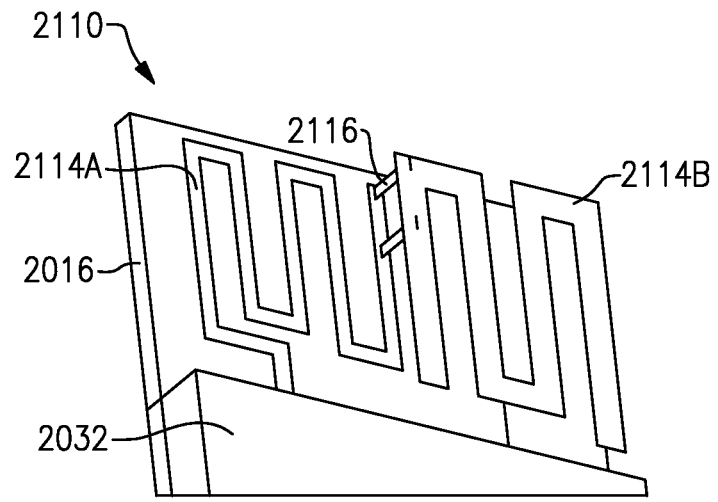
Figure 79B:
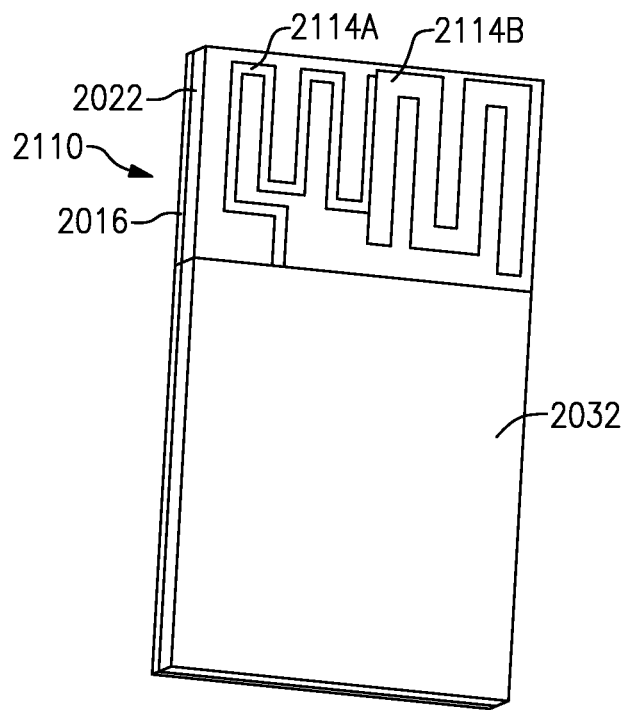

FIG. 79A illustrates a radio frequency module that includes an integrated antenna partially implemented over molding material according to an embodiment. FIG. 79B illustrates another view of the radio frequency module of FIG. 79A.

Figure 80:
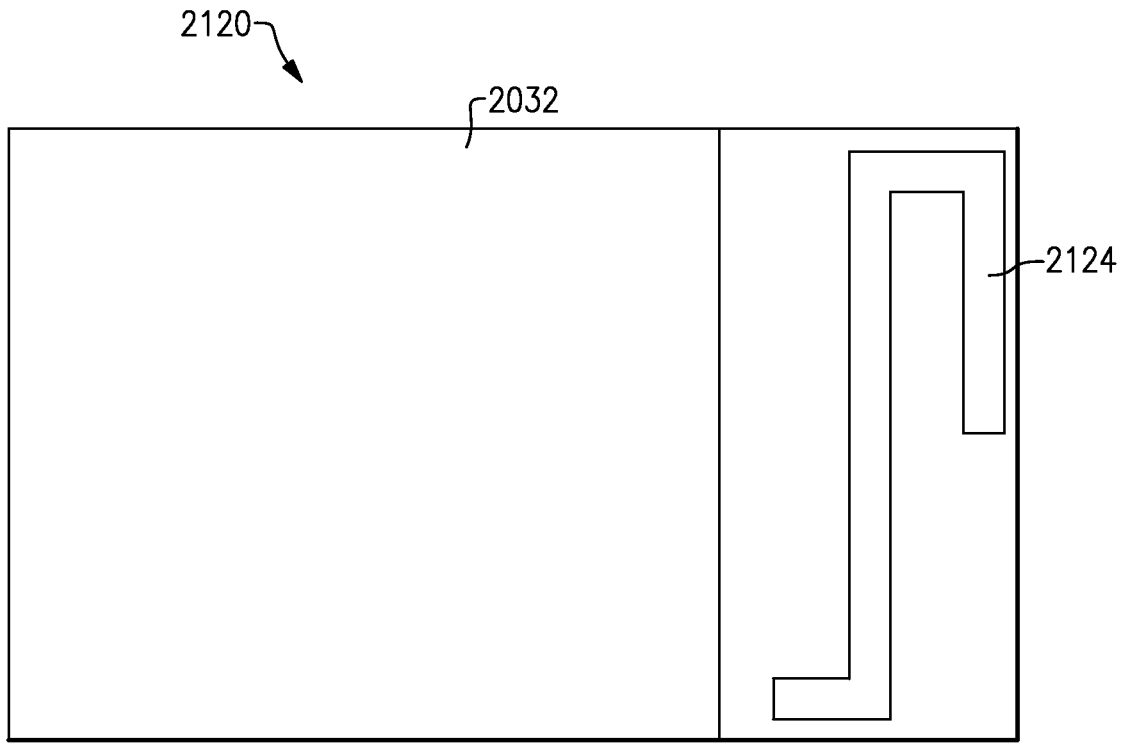

FIG. 80 illustrates an RF module with an integrated antenna shielded from an RF component according to an embodiment.

Figure 81A:
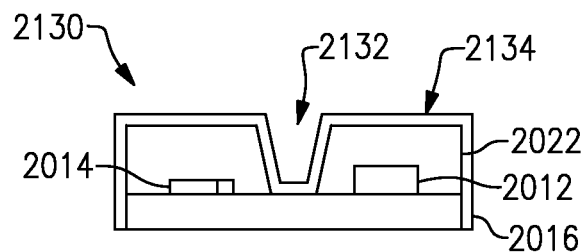
Figure 81B:
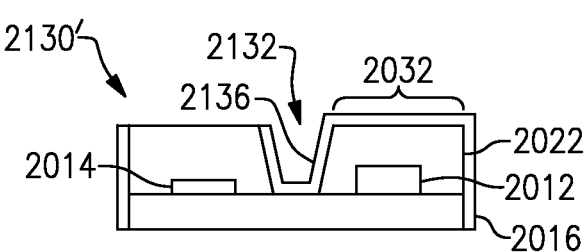

FIG. 81A illustrates an RF module with a through mold via according to an embodiment. FIG. 81B illustrates an RF module after the conductive layer shown in FIG. 81A is removed over an antenna according to an embodiment.

Figure 82A:
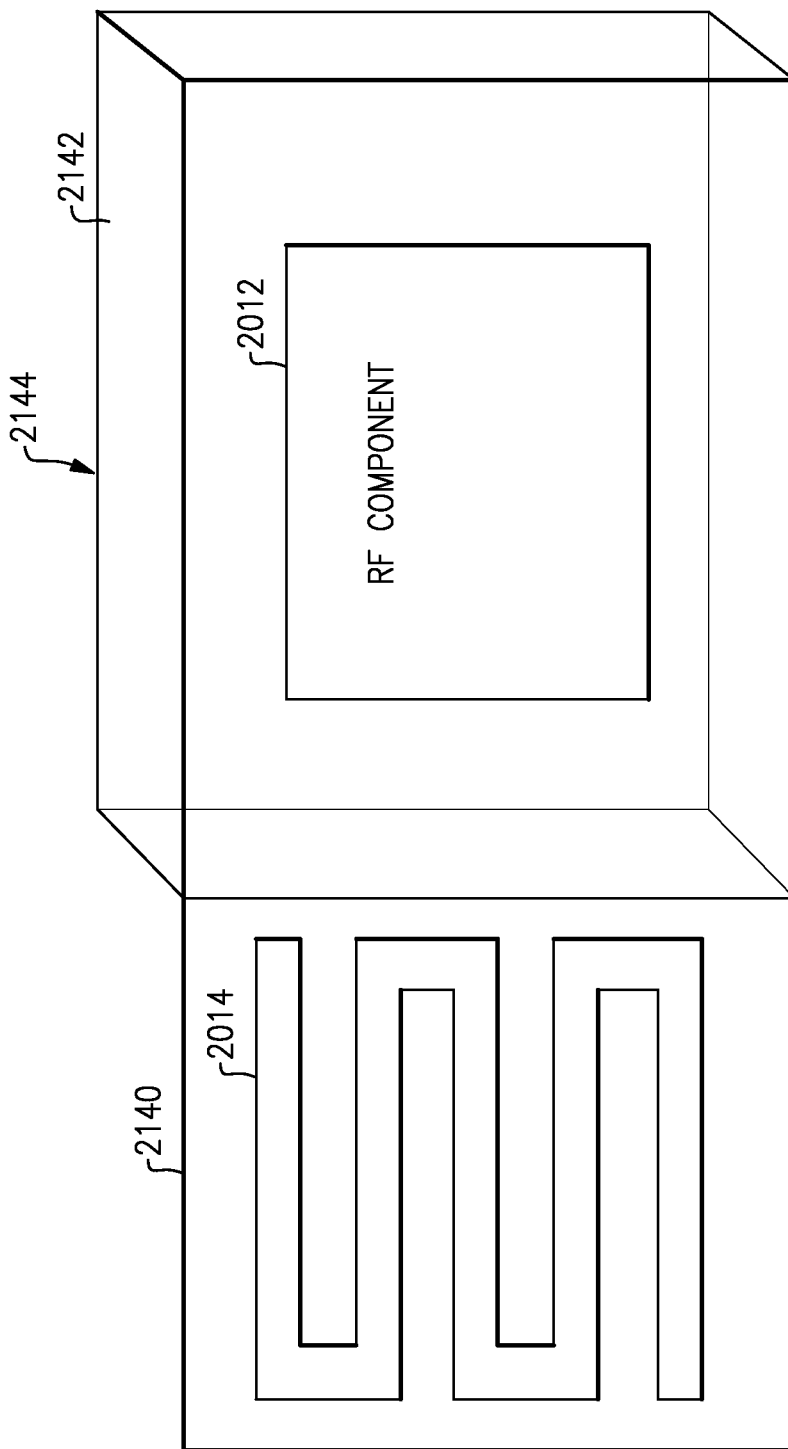
Figure 82B:
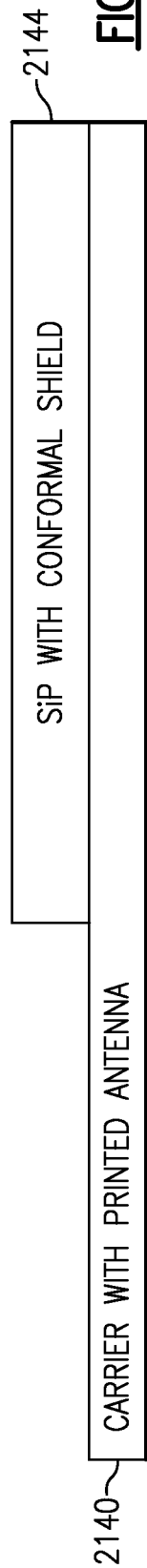

FIG. 82A is a top view of a shielded RF component on a carrier with a printed antenna according to an embodiment. FIG. 82B is a side view of the shielded RF component on the carrier with the printed antenna.

Figure 83A:
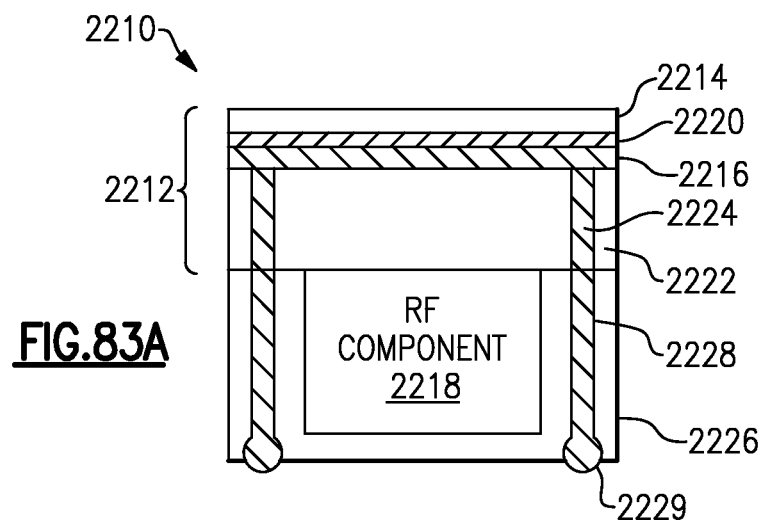

FIG. 83A shows a cross section of an antenna in a package system according to an embodiment.

Figure 83B:
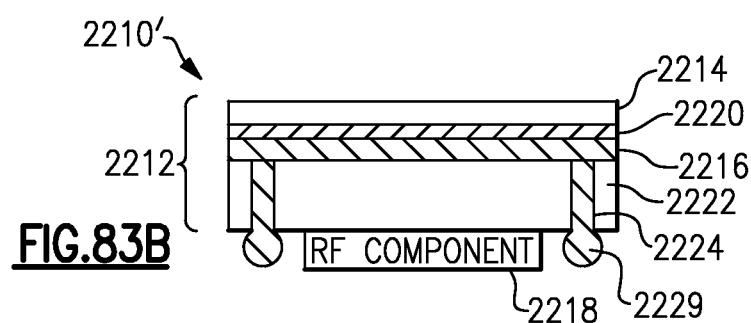

FIG. 83B shows a cross section of an antenna in a package system according to an embodiment.

Figure 84:
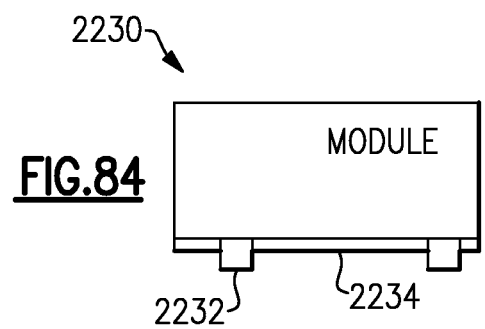

FIG. 84 shows a cross section of an antenna in a package system with solder bumps providing standoff according to an embodiment.

Figure 85A:
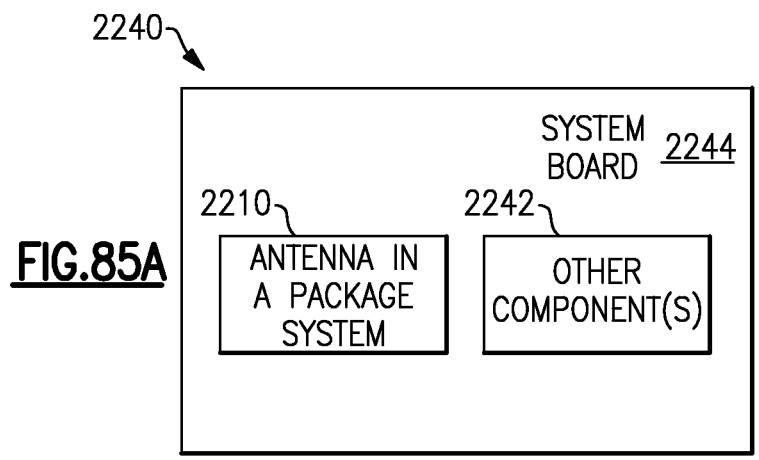

FIG. 85A illustrates a system board assembly with an antenna in a package module and another component disposed on a system board according to an embodiment.

FIG. 85B illustrates cross section of a system board assembly with an antenna in a package module and another component disposed on a system board according to an embodiment.

FIG. 85C illustrates cross section of a system board assembly with an antenna in a package module and another component disposed on a system board according to an embodiment.

Figure 86:
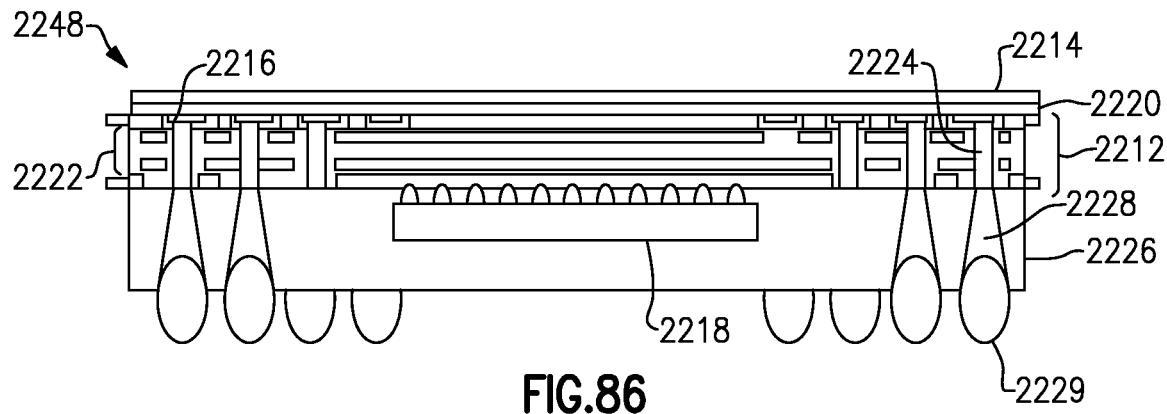

FIG. 86 is a cross sectional view of an antenna in a package system according to an embodiment.

Figure 87A:
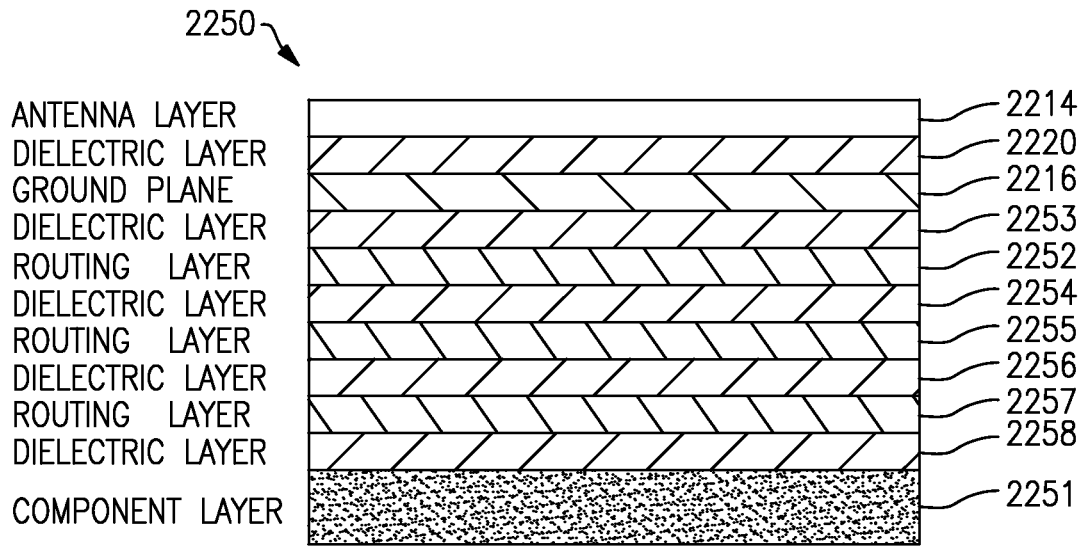

FIG. 87A is an example cross sectional view of layers radio frequency circuit assembly with an integrated antenna according to an embodiment.

Figure 87B:
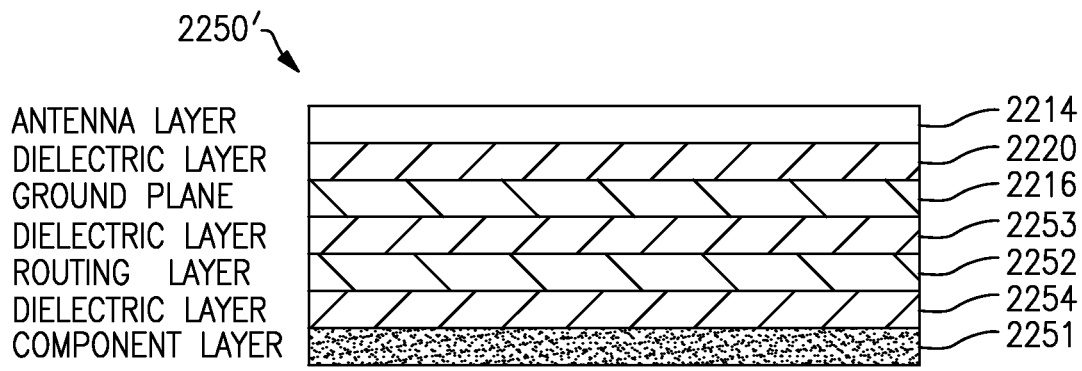

FIG. 87B is example cross sectional view of layers radio frequency circuit assembly with an integrated antenna according to another embodiment.

Figure 88A:
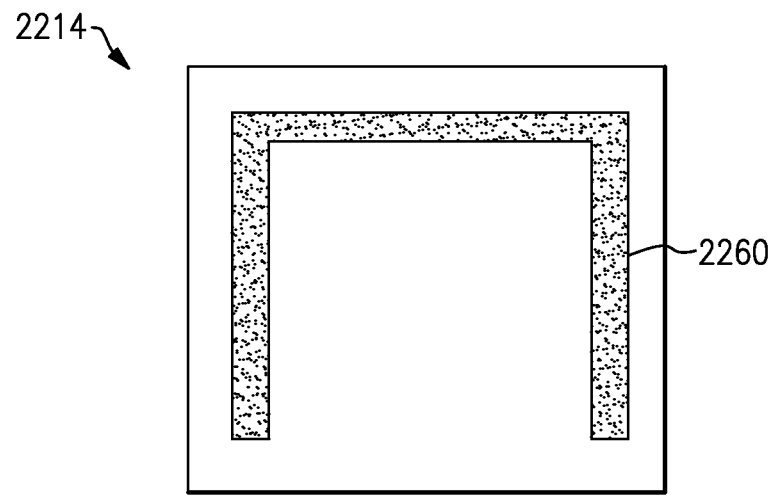

FIG. 88A illustrates an example printed antenna of a radio frequency circuit assembly according to an embodiment.

Figure 88B:
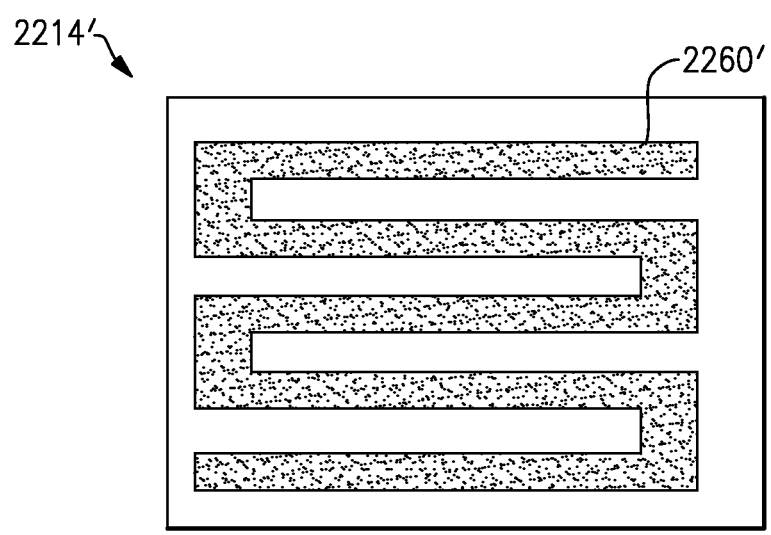

FIG. 88B illustrates an example printed antenna of a radio frequency circuit assembly according to another embodiment.

FIG. 89A is an illustrate example of radio frequency component layer of a radio frequency circuit assembly according to an embodiment.

FIG. 89B is an illustrate example of radio frequency component layer of a radio frequency circuit assembly according to another embodiment.

FIG. 89C is an illustrate example of radio frequency component layer of a radio frequency circuit assembly according to another embodiment.

FIG. 89D is an illustrate example of radio frequency component layer of a radio frequency circuit assembly according to another embodiment.

Figure 90A:
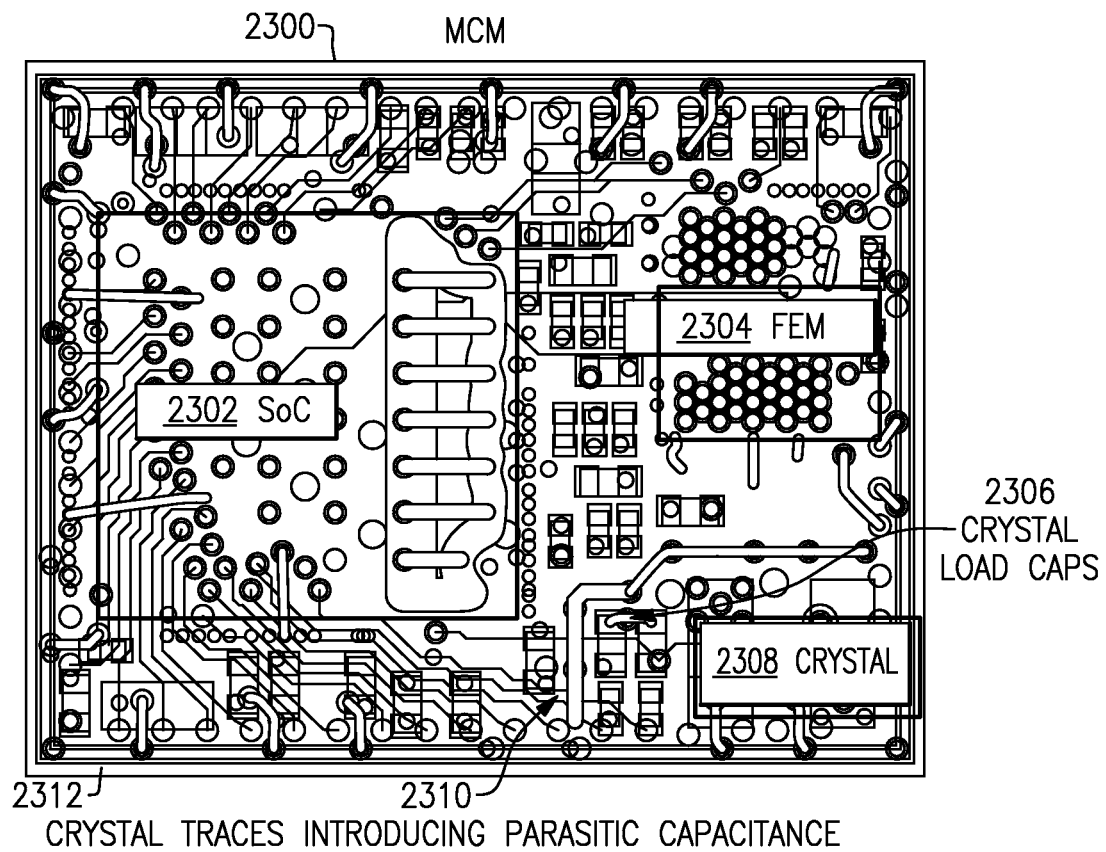
Figure 90B:
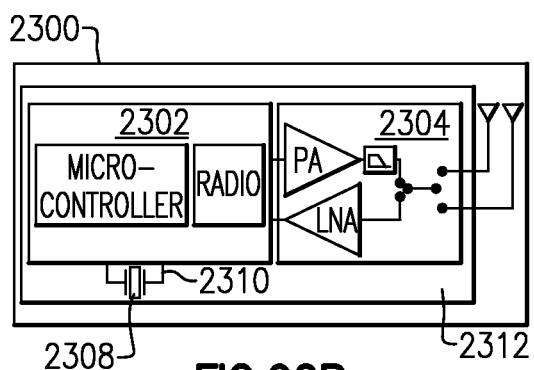
Figure 90C:
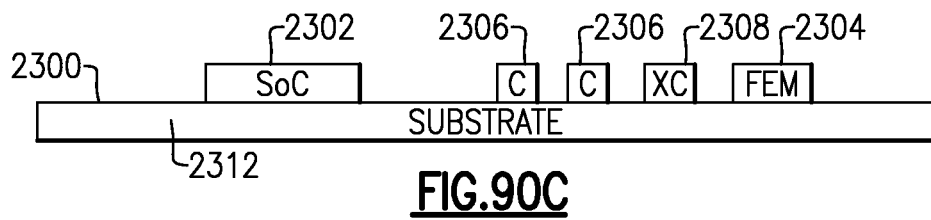

FIG. 90A illustrates a top view of a multi-chip module. FIG. 90B illustrates a block diagram of the multi-chip module. FIG. 90C illustrates a side view of the multi-chip module.

Figure 91:
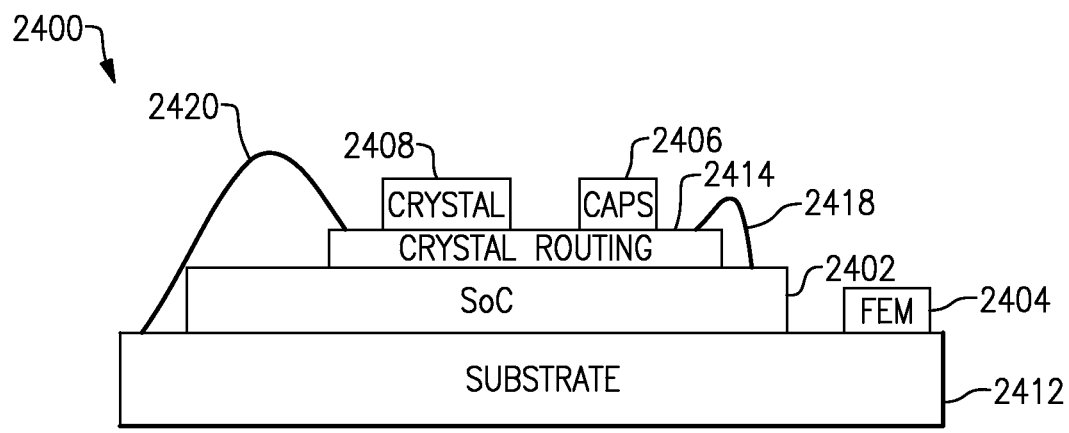

FIG. 91 illustrates an embodiment of a system-in-a-package for use in a wireless device, according to certain embodiments.

Figure 92:
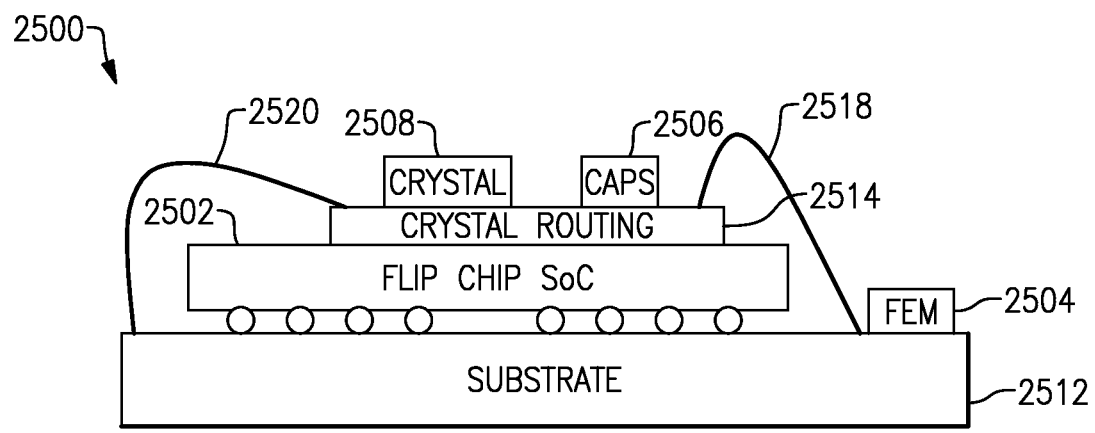

FIG. 92 illustrates another embodiment of a system-in-a-package for use in a wireless device, according to certain embodiments.

Figure 93:
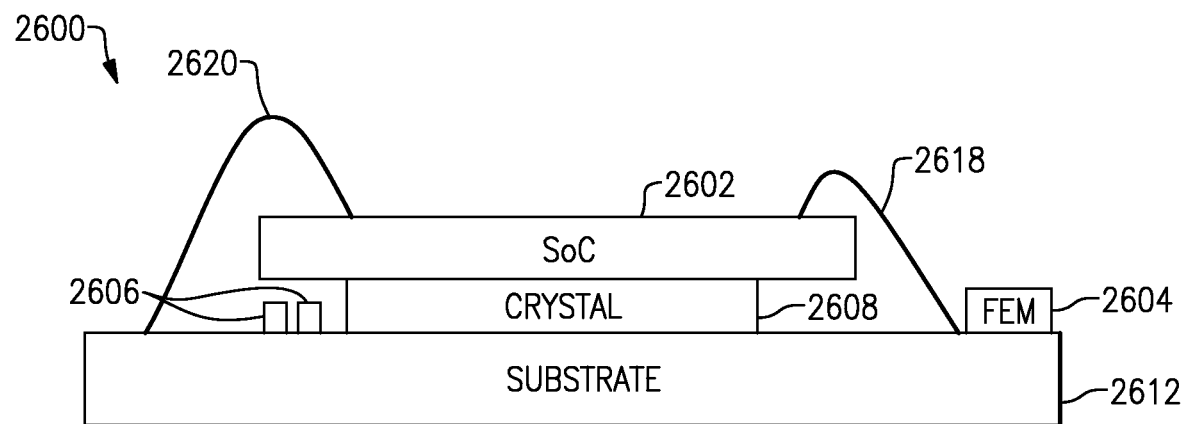

FIG. 93 illustrates another embodiment of a system-in-a-package for use in a wireless device, according to certain embodiments.

Figure 94A:
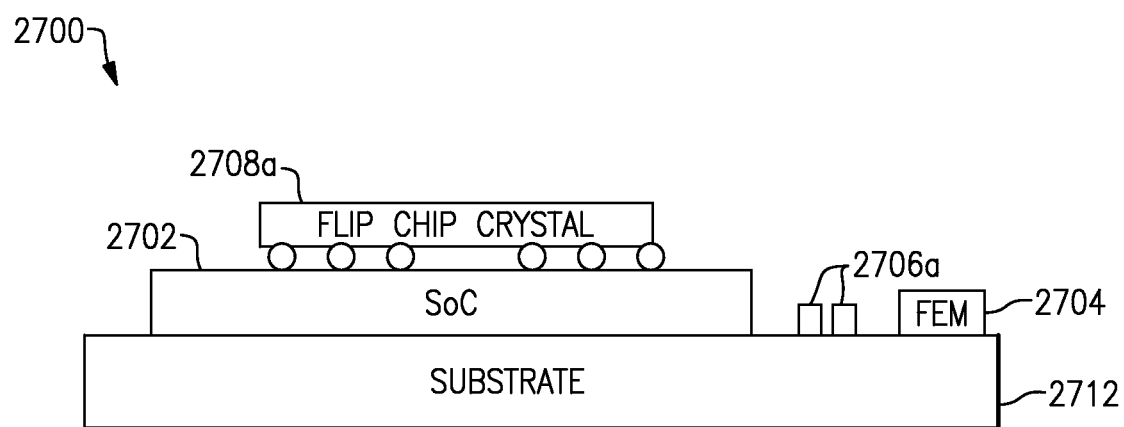

FIG. 94A illustrates another embodiment of a system-in-a-package for use in a wireless device, according to certain embodiments.

Figure 94B:
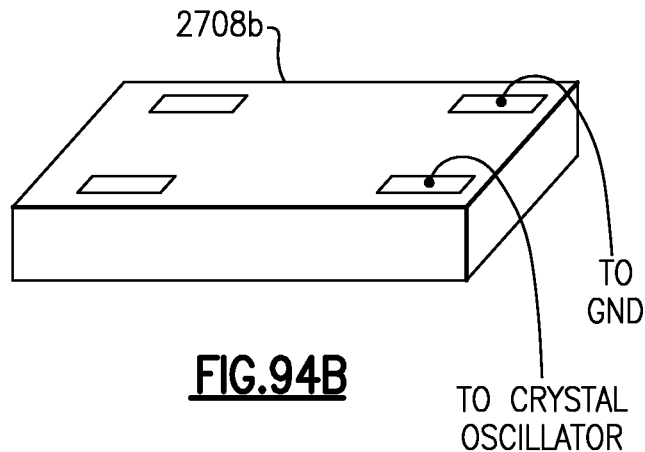

FIG. 94B illustrates another embodiment of a surface mount crystal for use in a system-in-a-package, according to certain embodiments.

Figure 94C:
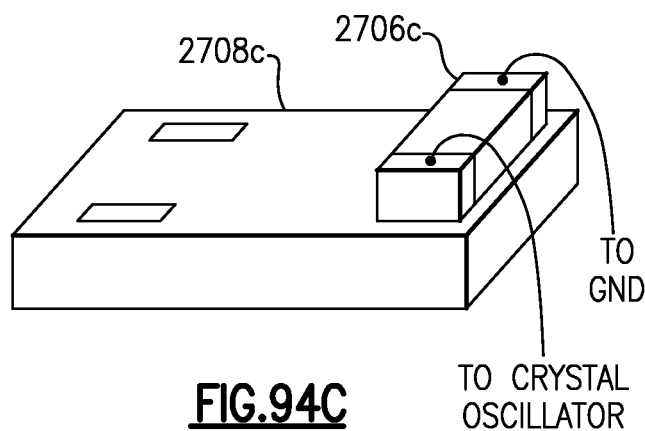

FIG. 94C illustrates another embodiment of a surface mount crystal for use in a system-in-a-package, according to certain embodiments.

Figure 94D:
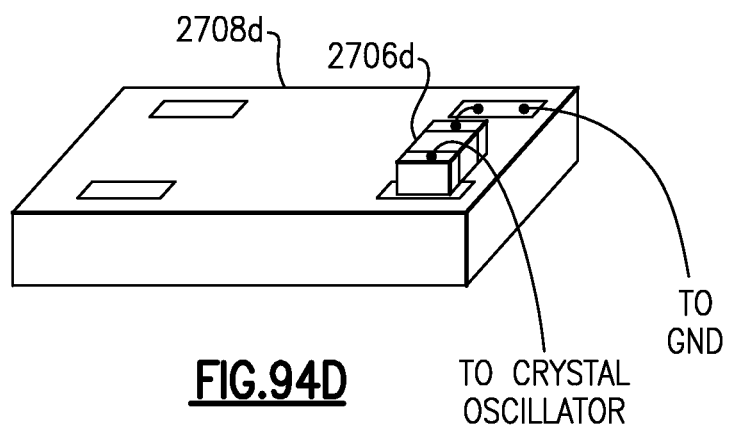

FIG. 94D illustrates another embodiment of a surface mount crystal for use in a system-in-a-package, according to certain embodiments.

Figure 95:
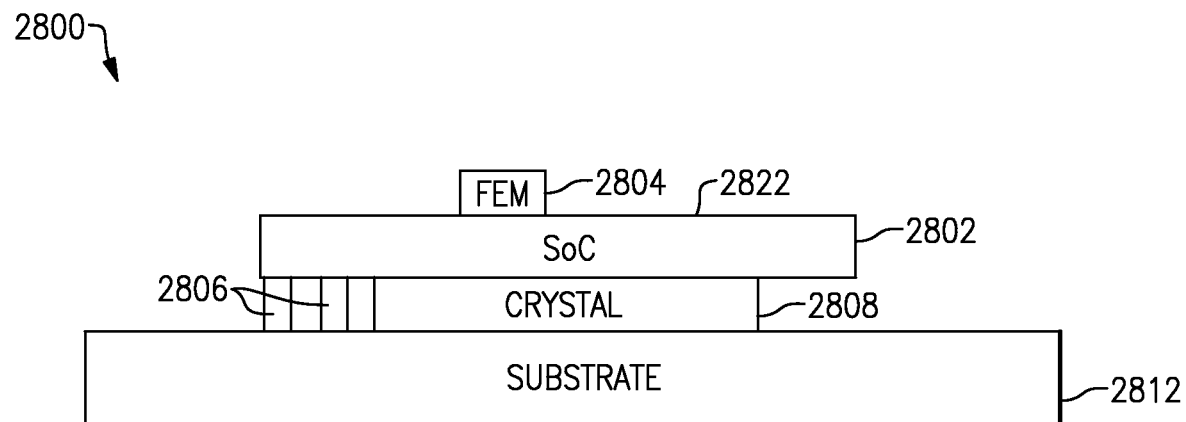

FIG. 95 illustrates another embodiment of a system-in-a-package for use in a wireless device, according to certain embodiments.

Figure 96:
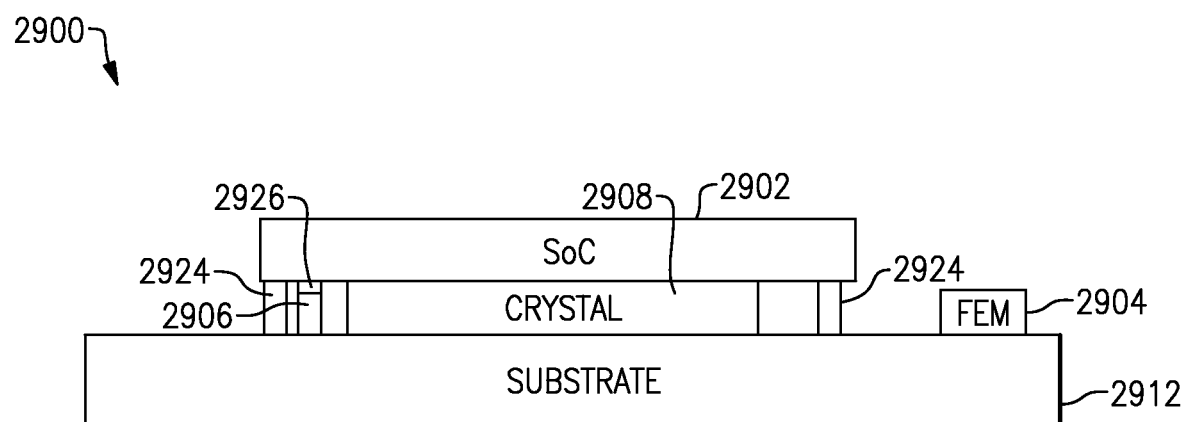

FIG. 96 illustrates another embodiment of a system-in-a-package for use in a wireless device, according to certain embodiments.

FIG. 97 illustrates another embodiment of a system-in-a-package for use in a wireless device, according to certain embodiments.

FIG. 98A1 illustrates an example crystal assembly with conductive pillars, according to certain embodiments.

Figure 2:
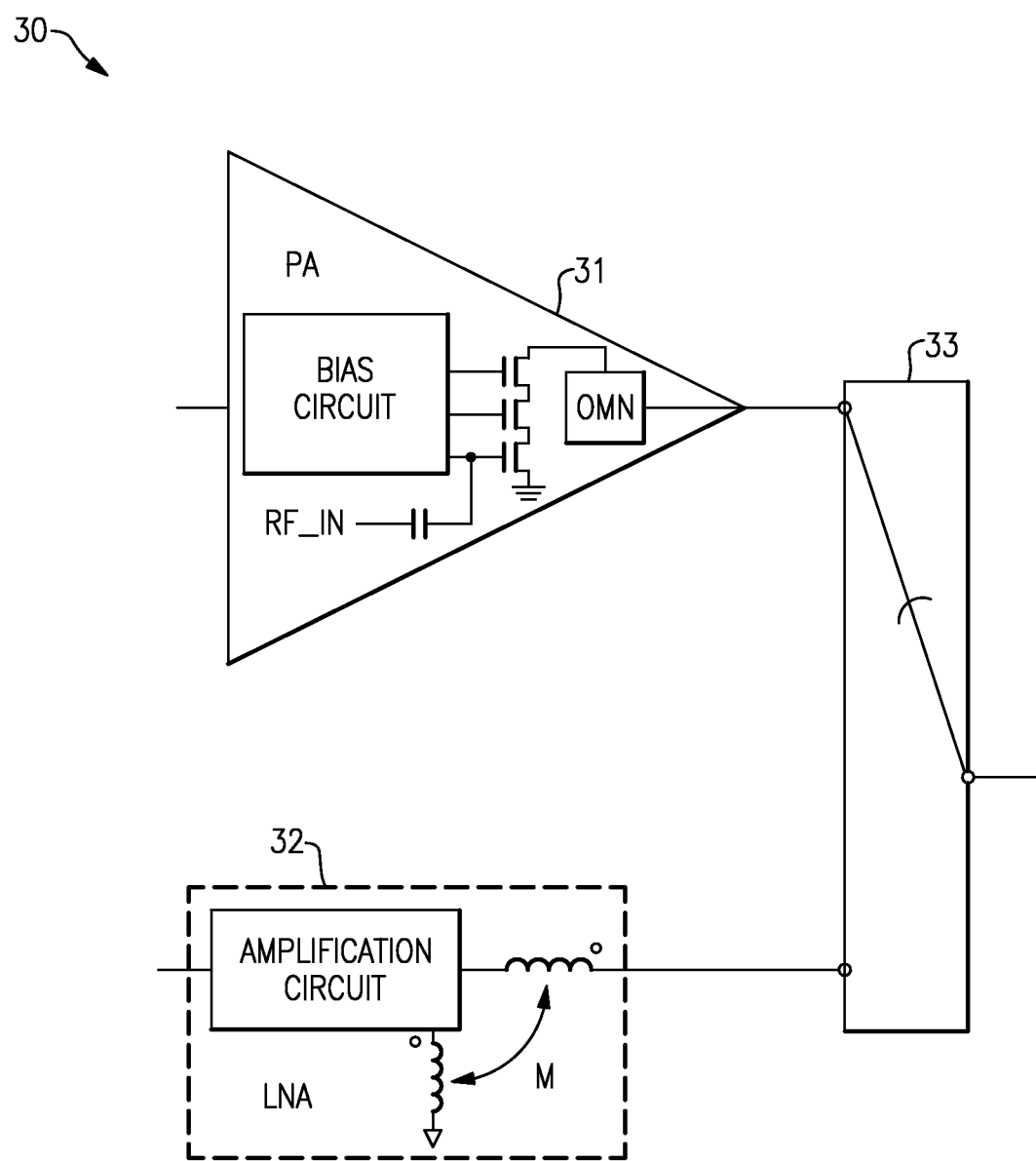
FIG. 2 is a schematic block diagram of a front end system that includes a multi-mode power amplifier and a low noise amplifier with magnetically coupled inductors according to an embodiment.

FIG. 98A2 illustrates an example crystal assembly with a conductive layer in communication with the conductive pillars on one or more sides, according to certain embodiments.

FIG. 98B1 illustrates a cross sectional view of an example assembly including a crystal and a front end integrated circuit, according to certain embodiments.

FIG. 98B2 illustrates a cross sectional view of an example assembly including a crystal and a surface acoustic wave (SAW) device, according to certain embodiments.

FIG. 98C illustrates a bottom view of an example crystal assembly, according the certain embodiments.

Figure 98D:
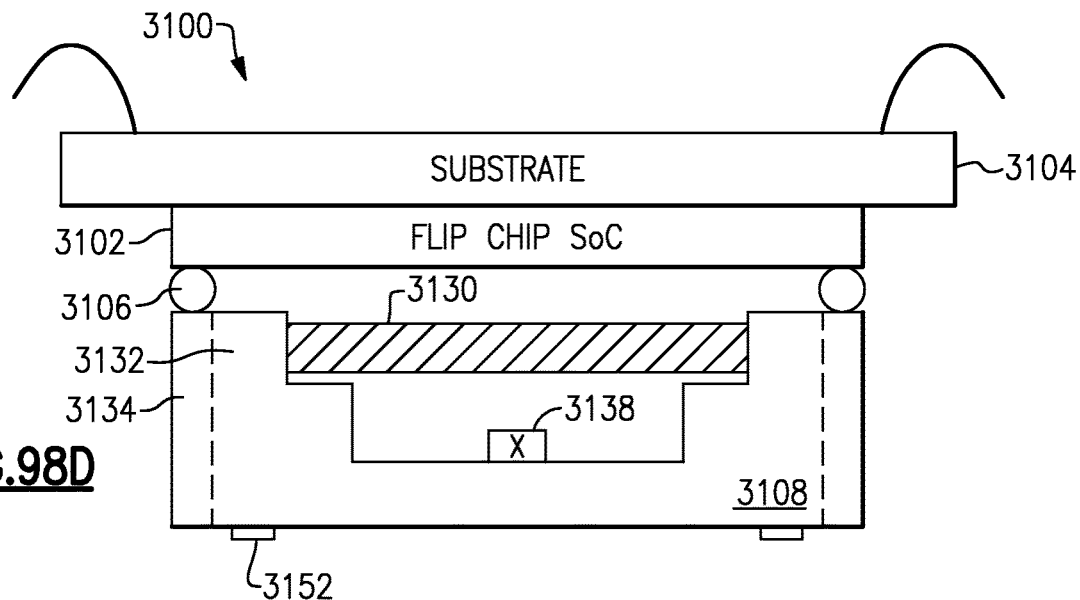

FIG. 98D illustrates an example system-in-a-package comprising a flip chip assembly above a crystal assembly, according to certain embodiments.

Figure 98E:
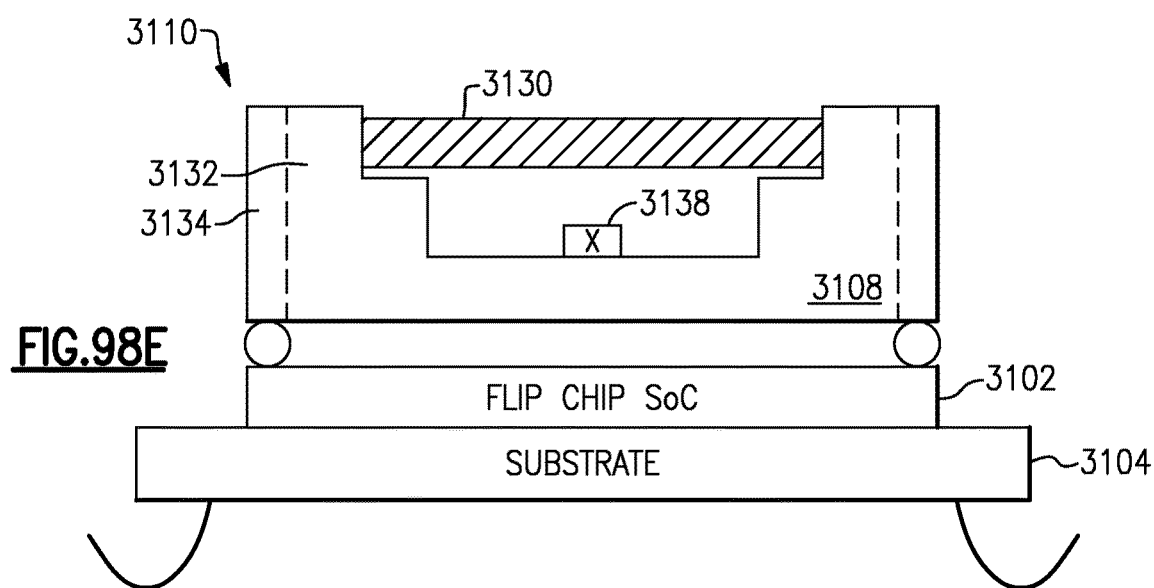

FIG. 98E illustrates an example system-in-a-package comprising a flip chip assembly beneath a crystal assembly, according to certain embodiments.

Figure 98F:
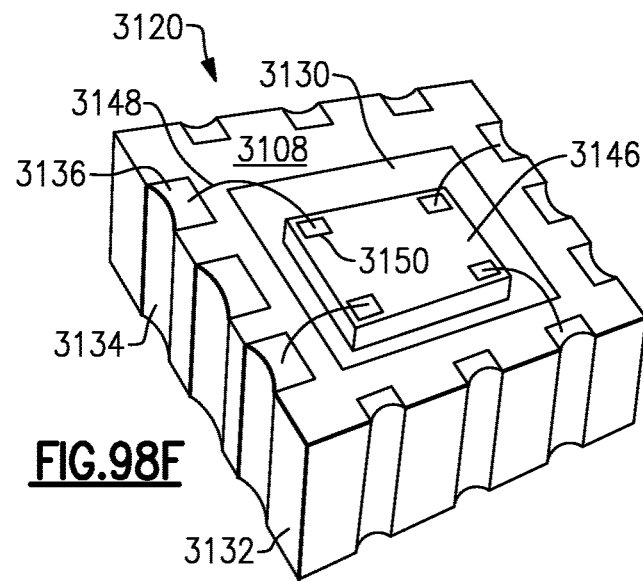

FIG. 98F illustrates an example circuit assembly comprising a FEIC mounted to the lid of a crystal assembly, according to certain embodiments.

Figure 99:
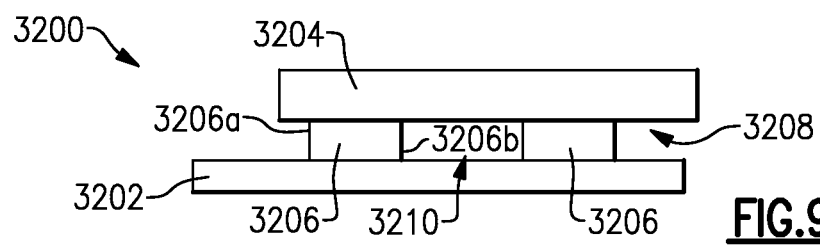

FIG. 99 illustrates an example stacked assembly including supports, according to certain embodiments.

Figure 100A:
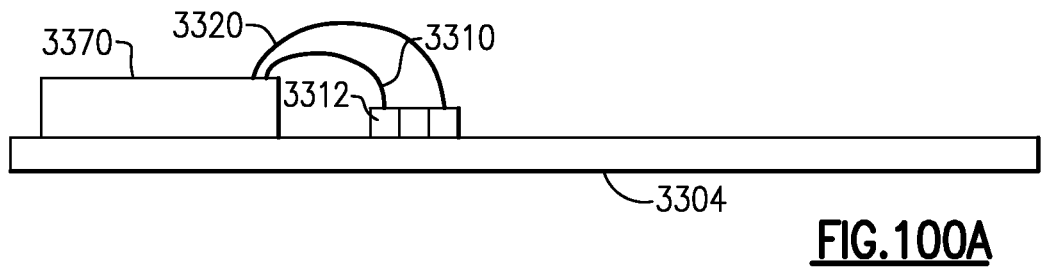
Figure 100B:
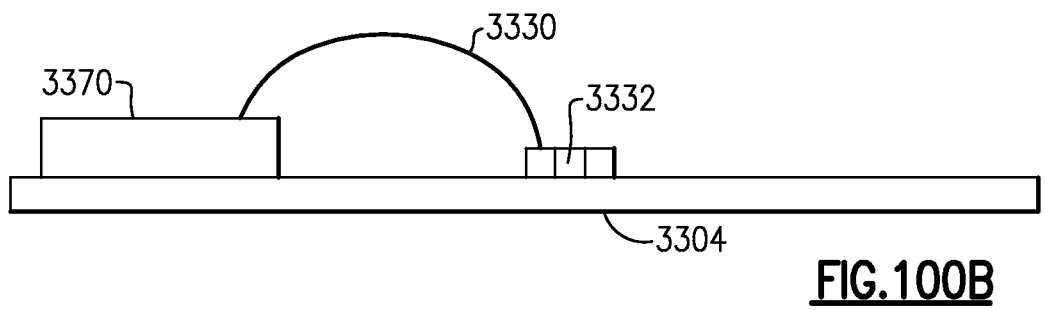
Figure 100C:
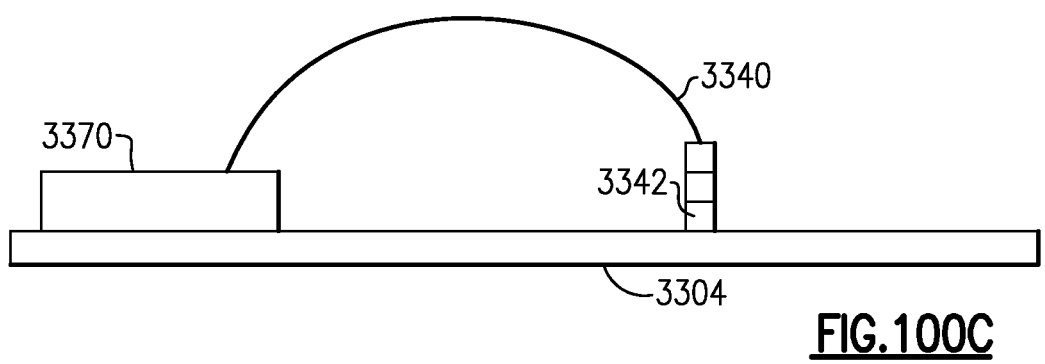
Figure 100D:
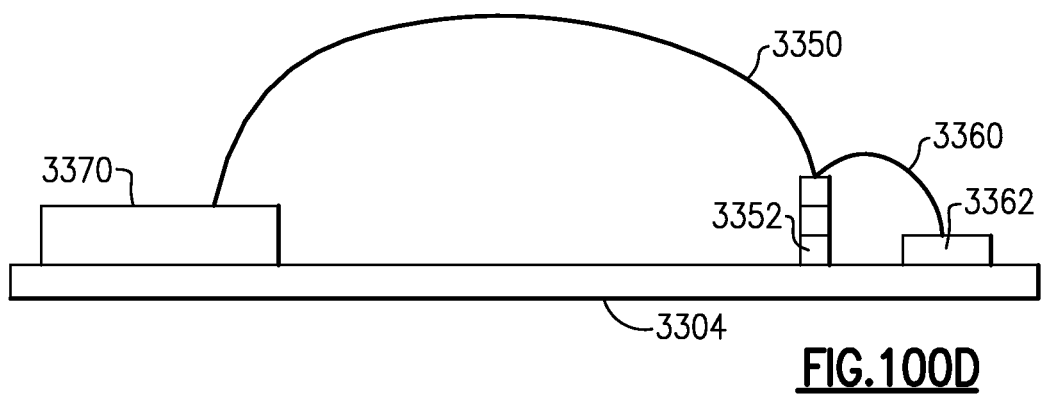

FIGS. 100A-100D illustrate example bonding configurations for surface mount devices, according to certain embodiments. FIG. 100A illustrates wires bond bonded between a bond source and a surface mount device. FIG. 100B illustrates wire bond bonded between a bond source and a horizontally oriented surface mount device. FIG. 100C illustrates wire bond bonded between a bond source and a vertically oriented surface mount device. FIG. 100D illustrates a wire bond bonded between a bond source and a vertically oriented surface mount device and another wire bond bonded between the surface mount device and a bondable device.

FIG. 101A1 illustrates a first example stacking configuration for surface mount devices, according to certain embodiments.

FIG. 101A2 illustrates an example circuit diagram for the stacking configuration of FIG. 101A1, according to certain embodiments.

FIG. 101B1 illustrates a second example stacking configuration for surface mount devices, according to certain embodiments.

FIG. 101B2 illustrates an example circuit diagram for the stacking configuration of FIG. 101B1, according to certain embodiments.

FIG. 101C1 illustrates a third example stacking configuration for surface mount devices, according to certain embodiments.

FIG. 101C2 illustrates a fourth example stacking configuration for surface mount devices, according to certain embodiments.

Figure 3:
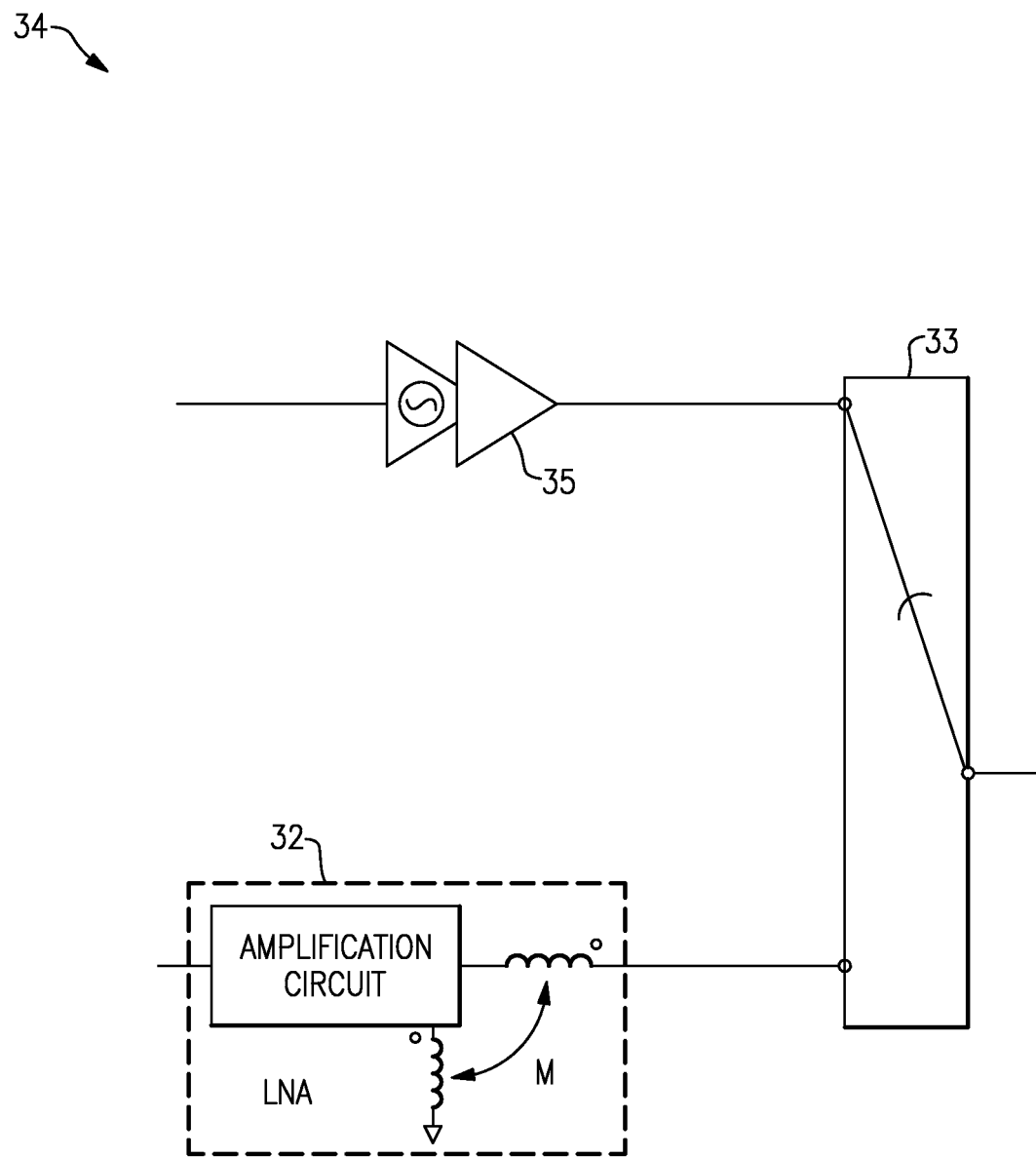
FIG. 3 is a schematic block diagram of a front end system that includes a power amplifier with an injection-locked oscillator driver stage and a low noise amplifier with magnetically coupled inductors according to an embodiment.

FIG. 101C3 illustrates an example circuit diagram for the stacking configuration of FIGS. 101C1 and 101C2, according to certain embodiments.

FIG. 101D1 illustrates a fifth example stacking configuration for surface mount devices, according to certain embodiments.

FIG. 101D2 illustrates an example circuit diagram for the stacking configuration of FIG. 101D1, according to certain embodiments.

Figure 101E:
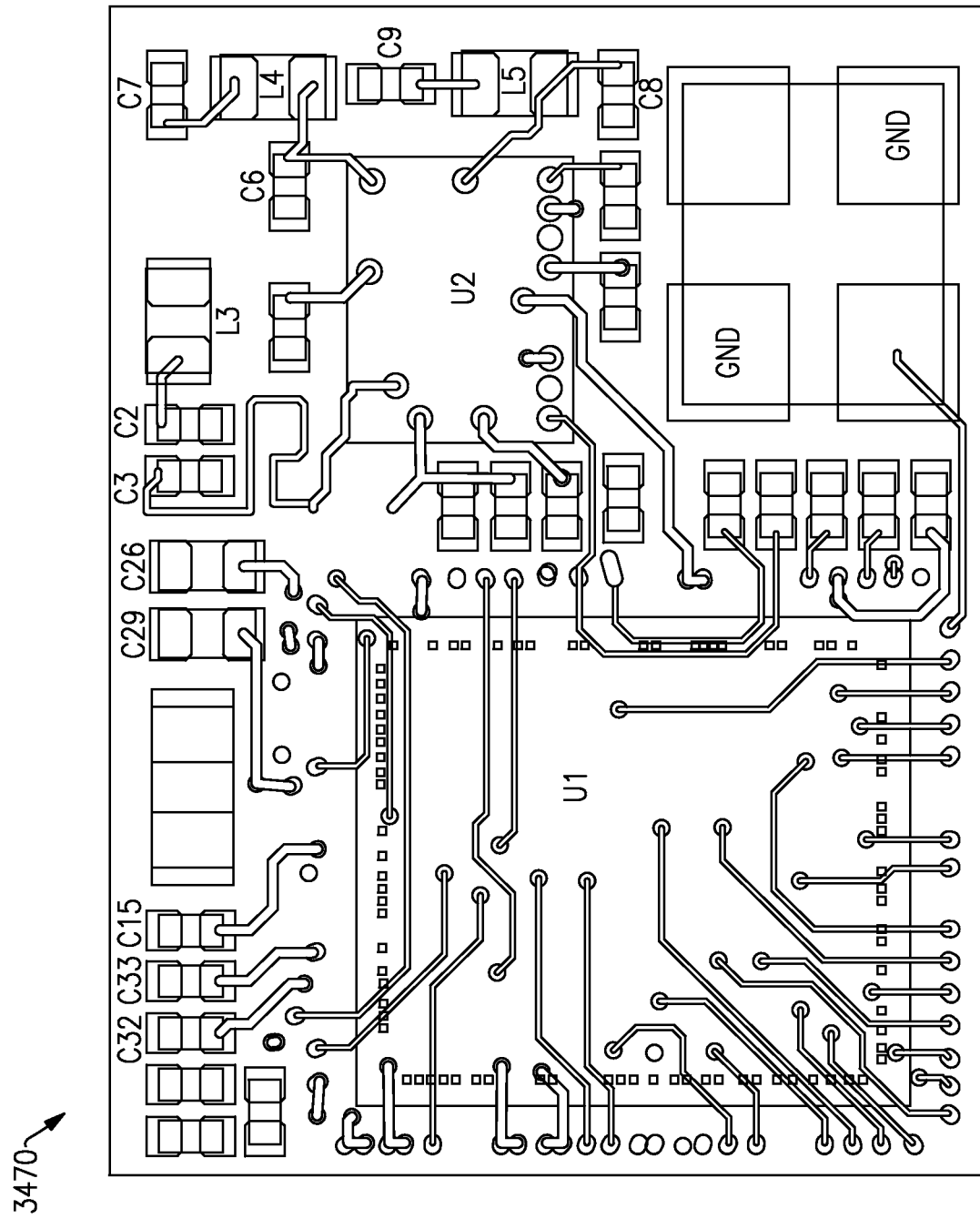

FIG. 101E illustrates an example circuit board layout, according to certain embodiments.

Figure 101F:
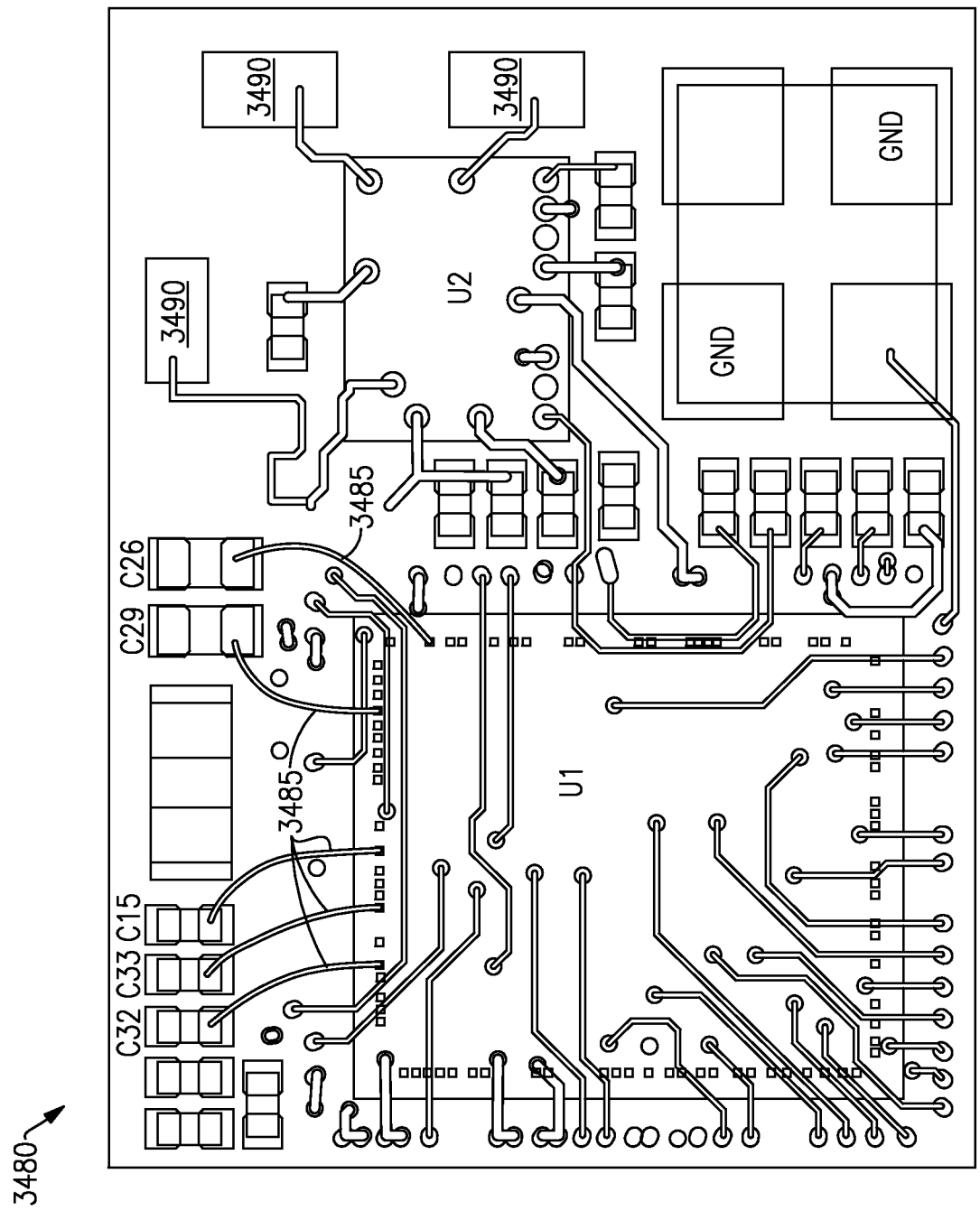

FIG. 101F illustrates an example circuit board layout with example bonding configurations and example stacking configurations, according to certain embodiments.

Figure 102:
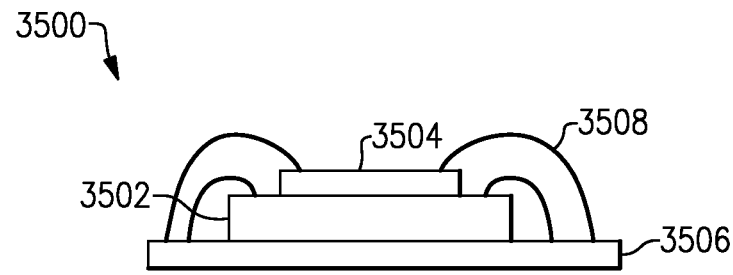

FIG. 102 illustrates an embodiment of a stacked assembly, according to certain embodiments.

Figure 103:
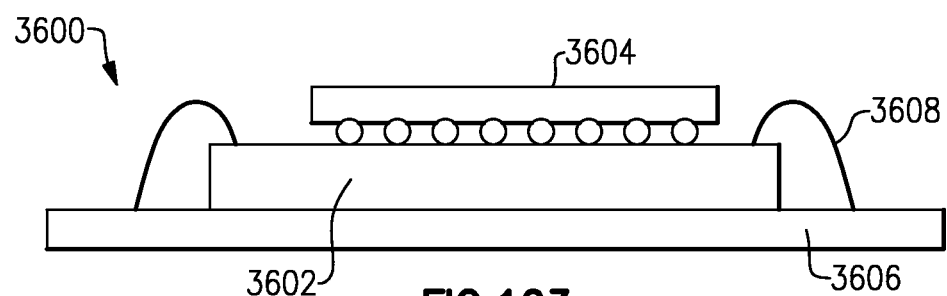

FIG. 103 illustrates another embodiment of a stacked assembly, according to certain embodiments.

Figure 104:
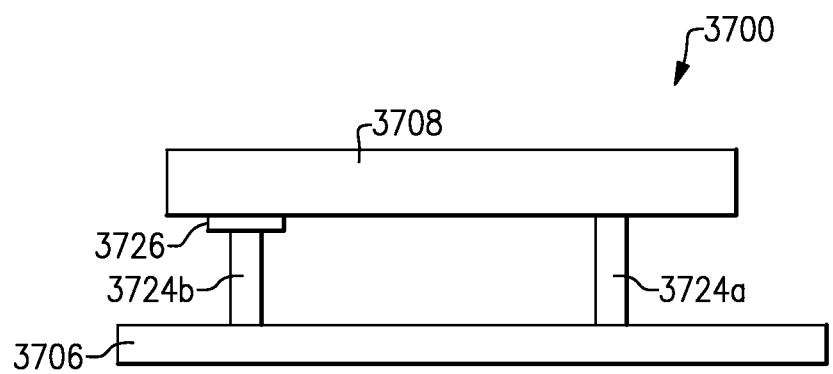

FIG. 104 illustrates an example stacked assembly including supports and spacers, according to certain embodiments.

Figure 105:
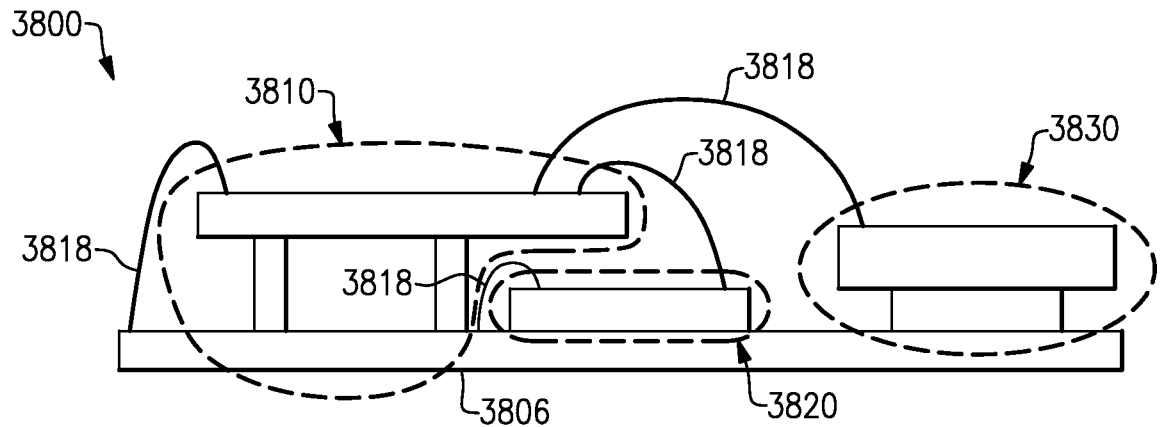

FIG. 105 illustrates an example circuit assembly including a plurality of stacked assemblies, according to certain embodiments.

Figure 106:
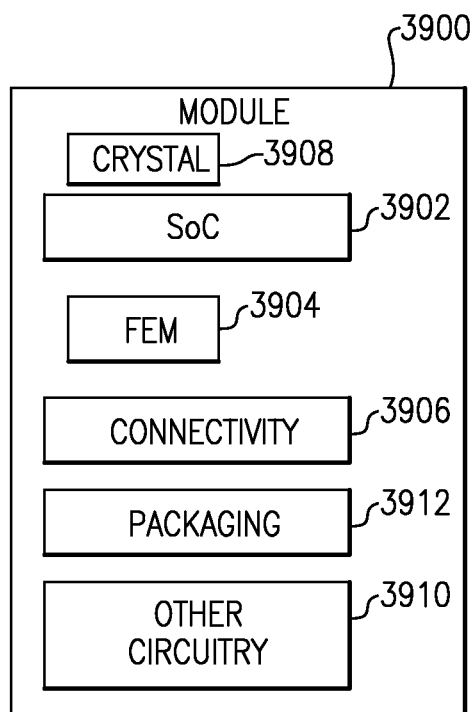

FIG. 106 is an example block diagram of a system-in-a-package for use in a wireless device, according to certain embodiments.

Figure 107:
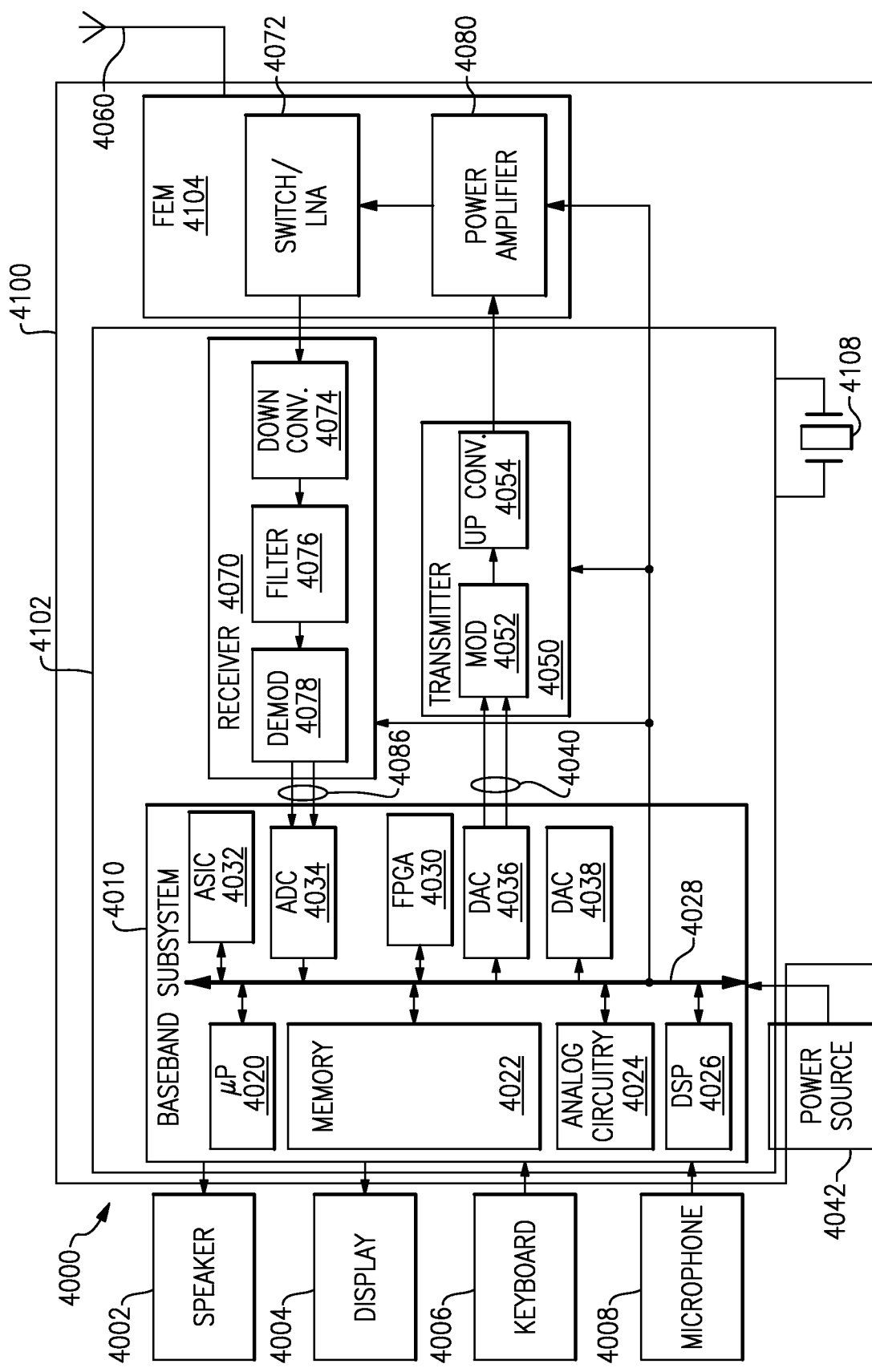

FIG. 107 is an example block diagram illustrating a simplified wireless device including a system-in-a-package, according to certain embodiments.

DETAILED DESCRIPTION OF CERTAIN EMBODIMENTS

The following description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings. The headings provided herein are for convenience only and do not necessarily affect the scope or meaning of the claims.

Front End Systems

A front end system can be used to handle signals being transmitted and/or received via one or more antennas. For example, a front end system can include switches, filters, amplifiers, and/or other circuitry in signal paths between one or more antennas and a transceiver.

Implementing one or more features described herein in a front end system can achieve a number of advantages, including, but not limited to, one or more of higher power added efficiency (PAE), more compact layout, lower cost, higher linearity, superior robustness to overstress, and/or enhanced integration. Moreover, implementing one or more features described herein in a front end system can achieve desirable figure of merit (FOM) and/or other metrics by which front end systems are rated. Although some features are described herein in connection with front end systems for illustrative purposes, it will be understood that the principles and advantages described herein can be applied to a wide variety of other electronics.

Figure 1A:
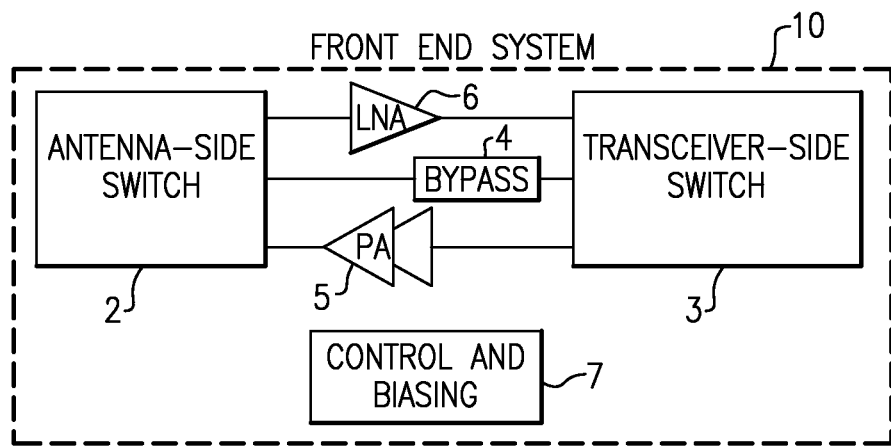
FIG. 1A illustrates a schematic block diagram of one example of a front end system.

FIG. 1A illustrates a schematic block diagram of one example of a front end system 10. The front end system 10 includes an antenna-side switch 2, a transceiver-side switch 3, a bypass circuit 4, a power amplifier 5, a low noise amplifier (LNA) 6, and a control and biasing circuit 7. The front end system 10 can incorporate one or more features described in the sections herein.

Although one example of a front end system is shown in FIG. 1A, a front end system can be adapted in a wide variety of ways. For example, a front end system can include more or fewer components and/or signals paths. Accordingly, the teachings herein are applicable to front end systems implemented in a wide variety of ways.

In certain implementations, a front end system, such as the front end system 10 of FIG. 1A, is implemented on an integrated circuit or semiconductor die. In such implementations, the front end system can be referred to as a front end integrated circuit (FEIC). In other implementations, a front end system is implemented as a module. In such implementations, the front end system can be referred to as a front end module (FEM).

Accordingly, in some implementations, the front end system 10 is implemented in a packaged module. Such packaged modules can include a relatively low cost laminate and one or more dies that combine low noise amplifiers with power amplifiers and/or switch functions. Some such packaged modules can be multi-chip modules. In certain implementations, some or the all of the illustrated components of the front end system 10 can be embodied on a single integrated circuit or die. Such a die can be manufactured using any suitable process technology. As one example, the die can be a semiconductor-on-insulator die, such as a silicon-on-insulator (SOI) die.

As shown in FIG. 1A, the front end system 10 includes multiple signal paths between the antenna-side switch 2 and the transceiver-side switch 3. For example, the illustrated front end system 10 includes a bypass signal path that includes the bypass circuit 4, a transmit signal path that includes the power amplifier 5, and a receive signal path that includes the LNA 6. Although an example with three signal paths is shown, a front end system can include more or fewer signal paths.

The antenna-side switch 2 is used to control connection of the signal paths to an antenna (not shown in FIG. 1A). For example, the antenna-side switch 2 can be used to connect a particular one of the transmit signal path, the receive signal path, or the bypass signal path to an antenna. Additionally, the transceiver-side switch 3 is used to control connection of the signal paths to a transceiver (not shown in FIG. 1A). For example, the transceiver-side switch 3 can be used to connect a particular one of the transmit signal path, the receive signal path, or the bypass signal path to a transceiver. In certain implementations, the antenna-side switch 2 and/or the transceiver-side switch 3 are implemented as multi-throw switches.

Figure 1B:
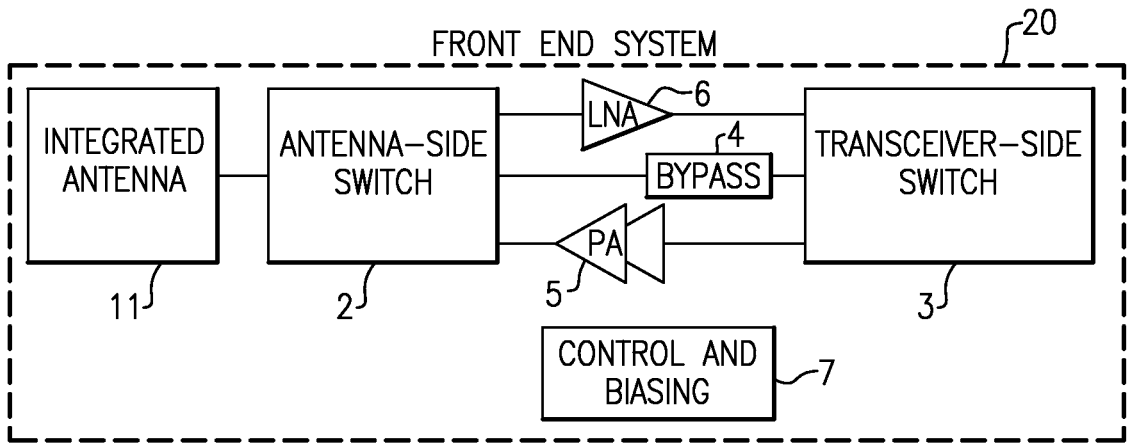
FIG. 1B illustrates a schematic block diagram of another example of a front end system.

FIG. 1B illustrates a schematic block diagram of another example of a front end system 20. The front end system 20 of FIG. 1B is similar to the front end system 10 of FIG. 1A, except that the front end system 20 further includes an integrated antenna 11. In certain implementations, a front end system includes an integrated antenna. For example, a front end system can be implemented on a module along with one or more integrated antennas.

With reference to FIGS. 1A and 1B, the bypass network 4 can include any suitable network for matching and/or bypassing the receive signal path and the transmit signal path. The bypass network 4 can be implemented, for instance, by a passive impedance network or by a conductive trace or wire.

The LNA 6 can be used to amplify a received signal from the antenna. The LNA 6 can be implemented in a wide variety of ways.

In certain embodiments, the LNA 6 is implemented in accordance with one or more features of Section I (Low Noise Amplifier with Impedance Transformation Circuit). For example, the LNA 6 can be implemented with magnetic coupling between a degeneration inductor (e.g., a source degeneration inductor or an emitter degeneration inductor) and a series input inductor. These magnetically coupled inductors can in effect provide a transformer, with a primary winding in series with the input and a secondary winding electrically connected where the degeneration inductor is electrically connected to the amplifying device (e.g., at the source of a field effect transistor amplifying device or at the emitter of a bipolar transistor amplifying device). Providing magnetically coupled inductors in this manner allows the input match inductor to have a relatively low inductance value and corresponding small size. Moreover, negative feedback provided by the magnetically coupled inductors can provide increased linearity to the LNA 6.

In certain embodiments, the LNA 6 and the antenna-side switch 2 are implemented in accordance with one or more features of Section II (Overload Protection of Low Noise Amplifier). For example, the antenna-side switch 2 can include an analog control input for controlling an impedance between an antenna and an input to the LNA 6. Additionally, an overload protection circuit is included to provide feedback to the switch's analog control input based on detecting a signal level of the LNA 6. Thus, the overload protection circuit detects whether or not the LNA 6 is overloaded. Additionally, when the overload protection circuit detects an overload condition, the overload protection circuit provides feedback to the analog control input of the switch to increase the impedance of the switch and reduce the magnitude of the input signal received by the LNA 6. Implementing the LNA 6 and the antenna-side switch 2 in this manner limits large current and/or voltage swing conditions manifesting within amplification transistors of the LNA 6.

The power amplifier 5 can be used to amplify a transmit signal received from a transceiver for transmission via an antenna. The power amplifier 5 can be implemented in a wide variety of ways.

In certain implementations, the power amplifier 5 is implemented in accordance with one or more features of Section III (Multi-Mode Power Amplifier). For example, the power amplifier 5 can include a stacked output stage and a bias circuit that biases the stacked transistors of the stacked output stage based on mode. In one example, the bias circuit can bias a transistor in a stack to a linear region of operation in a first mode, and bias the transistor as a switch in a second mode. Accordingly, the bias circuit can bias the stacked output stage such that the stacked output stage behaves like there are fewer transistors in the stack in the second mode relative to the first mode. Such operation can result in meeting design specifications for different power modes, in which a supply voltage provided to the stacked output stage changes based on mode.

In certain implementations, the power amplifier 5 is implemented in accordance with one or more features of Section IV (Power Amplifier with Injection-Locked Oscillator Driver Stage). For example the power amplifier 5 can include a driver stage implemented using an injection-locked oscillator and an output stage having an adjustable supply voltage that changes with a mode of the power amplifier 5. By implementing the power amplifier 5 in this manner, the power amplifier 5 exhibits excellent efficiency, including in a low power mode. For example, in the low power mode, the adjustable supply voltage used to power the output stage is decreased, and the driver stage has a relatively large impact on overall efficiency of the power amplifier 5. By implementing the power amplifier 5 in this manner, the power amplifier's efficiency can be enhanced, particularly in applications in which the power amplifier's output stage operates with large differences in supply voltage in different modes of operation.

With continuing reference to FIGS. 1A and 1B, the control and biasing circuit 7 can be used to control and bias various front end circuitry. For example, the control and biasing circuit 7 can receive control signal(s) for controlling the LNA 6, the antenna-side switch 2, the transceiver-side switch 3, and/or the power amplifier 5. The control signals can be provided to the control and biasing circuit 7 in a variety of ways, such as over an input pad of a die. In one example, the control signals include at least one of a mode signal or a bias control signal.

The front end system 10 of FIG. 1A and the front end system 20 of FIG. 1B can be implemented on one or more semiconductor dies. In certain implementations, at least one of the semiconductor dies includes pins or pads protected using an electrical overstress (EOS) protection circuit implemented in accordance with one or more features of Section V (Electrical Overstress Protection). For example, an EOS protection circuit can include an overstress sensing circuit electrically connected between a pad of a semiconductor die and a first supply node, an impedance element electrically connected between the pad and a signal node, a controllable clamp electrically connected between the signal node and the first supply node and selectively activatable by the overstress sensing circuit, and an overshoot limiting circuit electrically connected between the signal node and a second supply node. The overstress sensing circuit activates the controllable clamp when an EOS event is detected at the pad. Thus, the EOS protection circuit is arranged to divert charge associated with the EOS event away from the signal node to provide EOS protection. By implementing a front end system in this manner can achieve enhanced EOS protection, lower static power dissipation, and/or a more compact chip layout. In certain implementations, the pad is an input pad that receives a control signal for controlling the power amplifier 5 and/or LNA 6.

In accordance with certain embodiments, the front end systems of FIG. 1A and/or 1B can include RF shielding and/or RF isolation structures. In certain implementations, the front end systems of FIG. 1A and/or 1B are implemented in accordance with one or more features of Section VI (Selective Shielding of Radio Frequency Modules). For example, the front end system can be implemented as a radio frequency module that is partially shielded. Additionally, a shielding layer is included over a shielded portion of the radio frequency module and an unshielded portion of the radio frequency module is unshielded. The shielding layer can shield certain components of the front end system (for instance, the power amplifier 5 and/or LNA 6) and leave other components (for instance, the integrated antenna 11) unshielded.

In certain implementations, the front end systems of FIG. 1A and/or 1B are implemented in accordance with one or more features of Section VII (Shielded Radio Frequency Component with Integrated Antenna). For example, the front end system can include a laminated substrate including an antenna is printed on a top layer and a ground plane for shielding on a layer underneath the top layer. Additionally, at least one electronic component of the front end can be disposed along a bottom layer of the laminate substrate, and solder bumps are disposed around the electronic component and electrically connected to the ground plane. The solder bumps can attach the module to a carrier or directly to a system board. The electronic component can be surrounded by solder bumps, and the outside edges of the electronic component can have ground solder bumps that are connected to the ground plane by way of vias. Accordingly, a shielding structure with can be completed when the module is placed onto a carrier or system board, and the shielding structure can serve as a Faraday cage around the electronic component.

In certain embodiments, the front end systems disclosed herein are implemented on a semiconductor die as front end integrated circuit (FEIC). In certain implementations, a FEIC is implemented in accordance with one or more features of Section VIII (Packaged Module with Stacked Components). For example, the FEIC can be included in a packaged module that stacks multiple chips and passive components, such as capacitors and resistors, into a compact area on a package substrate. By implementing an FEIC in such a packaged module, a smaller footprint and/or a more compact substrate area can be achieved.

In accordance with certain embodiments, a packaged module includes a FEIC, a crystal oscillator and a system on a chip (SoC), such as a transceiver die. In certain implementations, the packaged module is implemented in accordance with one or more features of Section VIII. For example, the SoC can be stacked over a crystal assembly to save space and provide shorter crystal traces. The crystal assembly includes the crystal oscillator housed in a housing that includes one or more conductive pillars for routing signals from the SoC to a substrate and/or to provide thermal conductivity.

In accordance with certain embodiments, a packaged module includes a FEIC, a filter assembly and a SoC. In certain implementations, the packaged module is implemented in accordance with one or more features of Section VIII. For example, the filter assembly can be stacked with other dies and components of the packaged module to reduce a footprint of the packaged module. Furthermore, stacking the filter assembly in this manner can reduce lengths of signal carrying conductors, thereby reducing parasitics and enhancing signaling performance.

Front end systems discussed herein can include a power amplifier and a low noise amplifier. Such a front end system can operate with improved performance and/or efficiency. The front end system can be a front end module and/or a front end integrated circuit. In certain embodiments, the power amplifier and the low noise amplifier can be embodied on a common semiconductor-on-insulator die, such as a common silicon-on-insulator die. The power amplifier and the low noise amplifier can both be coupled to a common switch. The common switch can be an antenna-side switch, for example. The power amplifier can be implemented in accordance with any suitable principles and advantages discussed herein. The low noise amplifier can be implemented in accordance with any suitable principles and advantages discussed herein. Some example front end systems that include a power amplifier and a low noise amplifier will be described with reference to FIGS. 2 to 5.

FIG. 2 is a schematic block diagram of a front end system 30 that includes a multi-mode power amplifier 31 and a low noise amplifier 32 with magnetically coupled inductors according to an embodiment. The multi-mode power amplifier 31 is in a transmit path of the front end system 30. The multi-mode power amplifier 31 is an example of the power amplifier 5 discussed above. The multi-mode power amplifier 31 includes a stacked output stage including a transistor stack of two or more transistors. The multi-mode power amplifier 31 also includes a bias circuit configured to control a bias of at least one transistor of the transistor stack based on a mode of the multi-mode power amplifier. The multi-mode power amplifier 31 can include any suitable combination of features discussed in Section III. The low noise amplifier 32 is in a receive path of the front end system 30. The low noise amplifier 32 is an example of the low noise amplifier 6 discussed above. The low noise amplifier 32 includes a first inductor, an amplification circuit, and a second inductor magnetically coupled to the first inductor to provide negative feedback to linearize the low noise amplifier. The low noise amplifier 32 can include any suitable combination of features discussed in Section I. The front end system 30 also includes a radio frequency switch 33. The radio frequency switch 33 is an example of the antenna-side switch 2 discussed above. The radio frequency switch 33 can be any suitable multi-throw switch configured to pass radio frequency signals. The radio frequency switch 33 can electrically couple a common node to the transmit path in a first state and to electrically couple the common node to the receive path in a second state. The common node can be an antenna port of the radio frequency switch 33.

FIG. 3 is a schematic block diagram of a front end system 34 that includes a power amplifier 35 an injection-locked oscillator driver stage and a low noise amplifier 32 with magnetically coupled inductors according to an embodiment. The power amplifier 35 is in a transmit path of the front end system 34. The power amplifier 35 is an example of the power amplifier 5 discussed above. The power amplifier 35 includes an injection-locked oscillator driver stage. The power amplifier 35 can include any suitable combination of features discussed in Section IV. The low noise amplifier 32 is in a receive path of the front end system 34. The low noise amplifier 32 is an example of the low noise amplifier 6 discussed above. The low noise amplifier 32 includes a first inductor, an amplification circuit, and a second inductor magnetically coupled to the first inductor to provide negative feedback to linearize the low noise amplifier. The low noise amplifier 32 can include any suitable combination of features discussed in Section I. The front end system 34 also includes a radio frequency switch 33. The radio frequency switch 33 is an example of the antenna-side switch 2 discussed above. The radio frequency switch 33 can be any suitable multi-throw switch configured to pass radio frequency signals. The radio frequency switch 33 can electrically couple a common node to the transmit path in a first state and to electrically couple the common node to the receive path in a second state. The common node can be an antenna port of the radio frequency switch 33.

Figure 4:
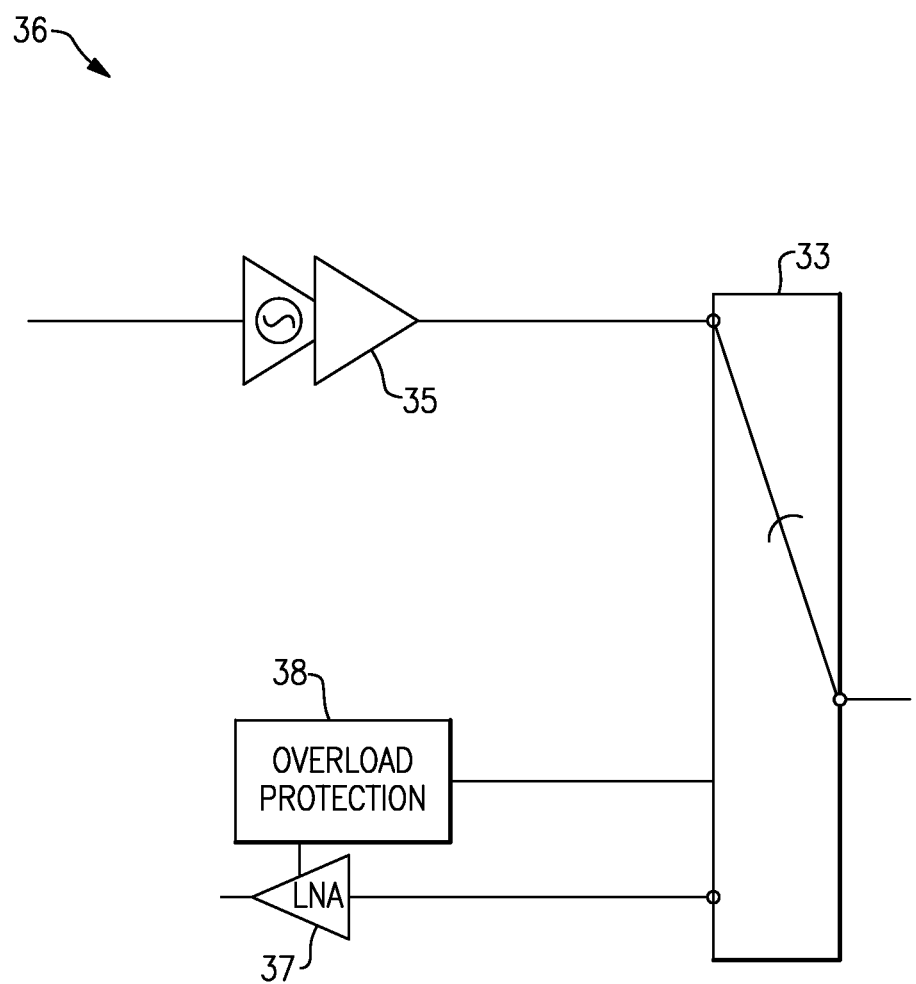
FIG. 4 is a schematic block diagram of a front end system that includes an antenna-side switch, a power amplifier, a low noise amplifier, and an overload protection circuit according to an embodiment.

FIG. 4 is a schematic block diagram of a front end system 36 that includes a radio frequency switch 33, a power amplifier 35, a low noise amplifier 37, and an overload protection circuit 38 according to an embodiment. The radio frequency switch 33 is an example of the antenna-side switch 2 discussed above. The low noise amplifier 37 is an example of the low noise amplifier 6 discussed above. The low noise amplifier 37 includes an input electrically coupled to a first throw of the radio frequency switch 33. The overload protection circuit 38 is configured to adjust an impedance of the radio frequency switch 33 based on a signal level of the low noise amplifier 37. The low noise amplifier 37 and/or the overload protection circuit 38 can include any suitable combination of features discussed in Section II. The power amplifier 35 is an example of the power amplifier 5 discussed above. The power amplifier 35 includes an output electrically coupled to a second throw of the radio frequency switch 33. The power amplifier 35 includes an injection-locked oscillator driver stage. The power amplifier 35 can include any suitable combination of features discussed in Section IV.

Figure 5:
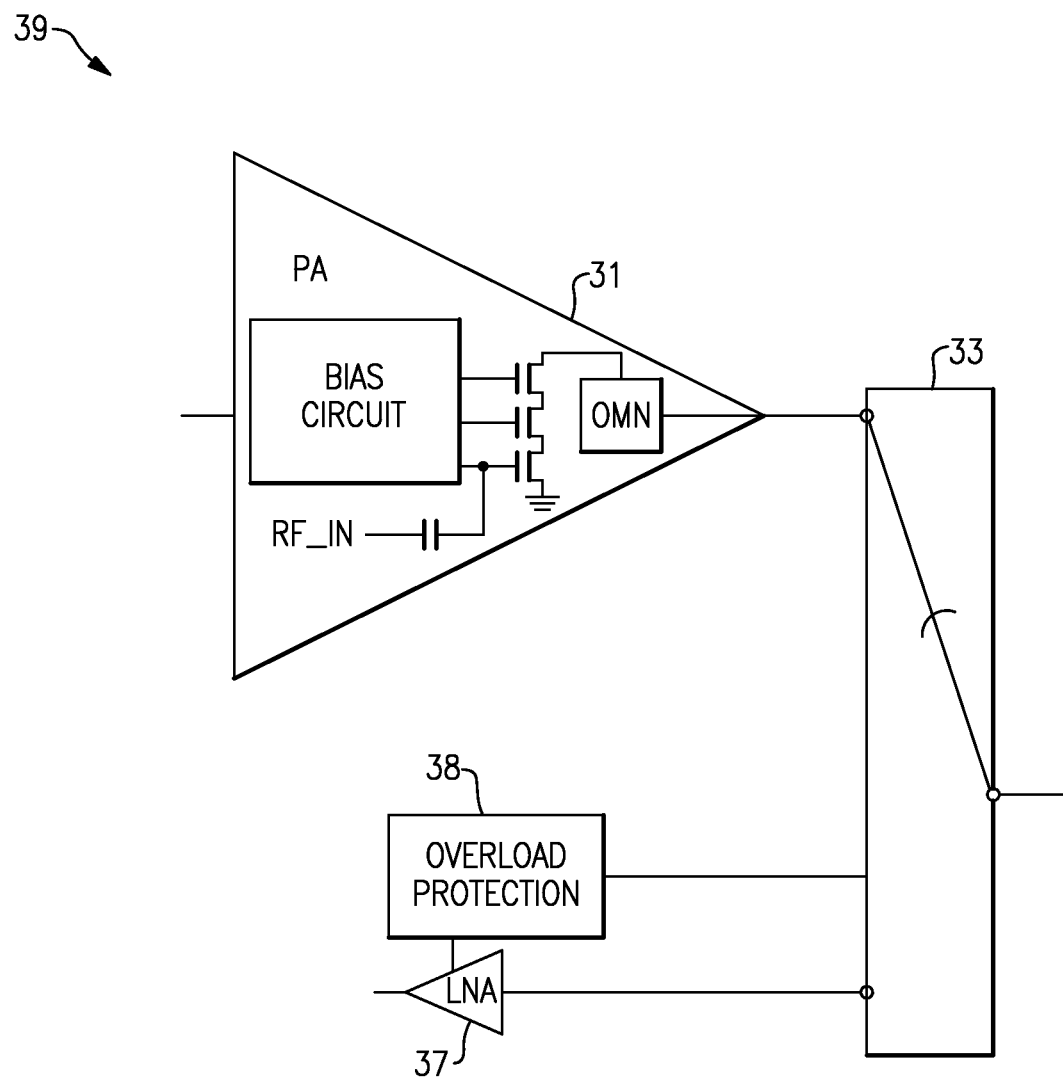
FIG. 5 is a schematic block diagram of a front end system that includes a radio frequency switch, a low noise amplifier, an overload protection circuit, and a multi-mode power amplifier according to an embodiment.

FIG. 5 is a schematic block diagram of a front end system 39 that includes a radio frequency switch 33, a low noise amplifier 37, an overload protection circuit 38, and a multi-mode power amplifier 31 according to an embodiment. The radio frequency switch 33 is an example of the antenna-side switch 2 discussed above. The low noise amplifier 37 is an example of the low noise amplifier 6 discussed above. The low noise amplifier 37 includes an input electrically coupled to a first throw of the radio frequency switch 33. The overload protection circuit 38 is configured to adjust an impedance of the radio frequency switch 33 based on a signal level of the low noise amplifier 37. The low noise amplifier 37 and/or the overload protection circuit 38 can include any suitable combination of features discussed in Section II. The multi-mode power amplifier 31 is an example of the power amplifier 5 discussed above. The multi-mode power amplifier 31 includes a stacked output stage including a transistor stack of two or more transistors. The multi-mode power amplifier 31 also includes a bias circuit configured to control a bias of at least one transistor of the transistor stack based on a mode of the multi-mode power amplifier. The multi-mode power amplifier 31 can include any suitable combination of features discussed in Section III.

Front end integrated circuits can include overstress protection. An overstress protection circuit can provide electrical overstress protection to an input/output pad of the front end integrated circuit. Such a front end integrated circuit can include a power amplifier implemented in accordance with any suitable principles and advantages discussed herein and/or a low noise amplifier implemented in accordance with any suitable principles and advantages discussed herein. Some example front end integrated circuits that include overstress protection circuits will be described with reference to FIGS. 6 to 9.

Figure 6:
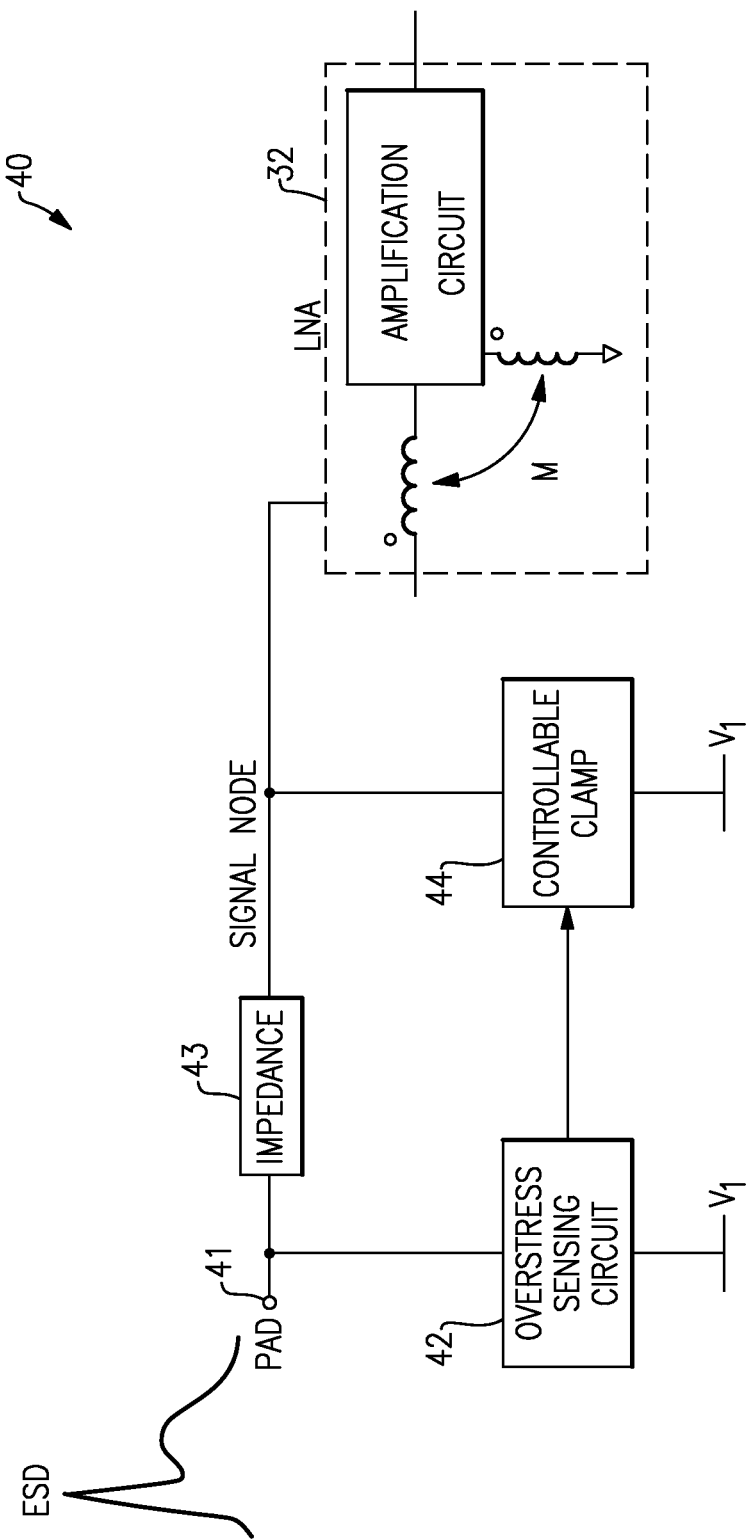
FIG. 6 is a schematic block diagram of a front end integrated circuit that includes an overstress protection circuit and a low noise amplifier with magnetically coupled inductors according to an embodiment.

FIG. 6 is a schematic block diagram of a front end integrated circuit 40 that includes an overstress protection circuit and a low noise amplifier 32 with magnetically coupled inductors according to an embodiment. The low noise amplifier 32 is an example of the low noise amplifier 6 discussed above. The low noise amplifier 32 includes a first inductor, an amplification circuit, and a second inductor magnetically coupled to the first inductor to provide negative feedback to linearize the low noise amplifier. The low noise amplifier 32 is controllable by a control signal. The low noise amplifier 32 can include any suitable combination of features discussed in Section I. The front end integrated circuit 40 also includes an input pad 41 configured to receive the control signal. The overstress protection circuit includes an overstress sensing circuit 42 electrically connected between the input pad 41 and a first supply node $V_1$, an impedance element 43 electrically connected between the input pad 41 and a signal node, and a controllable clamp 44 electrically connected between the signal node and the first supply node $V_1$. The overstress sensing circuit 42 is configured to activate the controllable clamp 44 in response to detecting an electrical overstress event at the input pad 41. An electrostatic discharge (ESD) event is an example of an electrical overstress event. The input pad 41 and/or the overstress protection circuit can include any suitable combination of features discussed in Section V.

Figure 7:
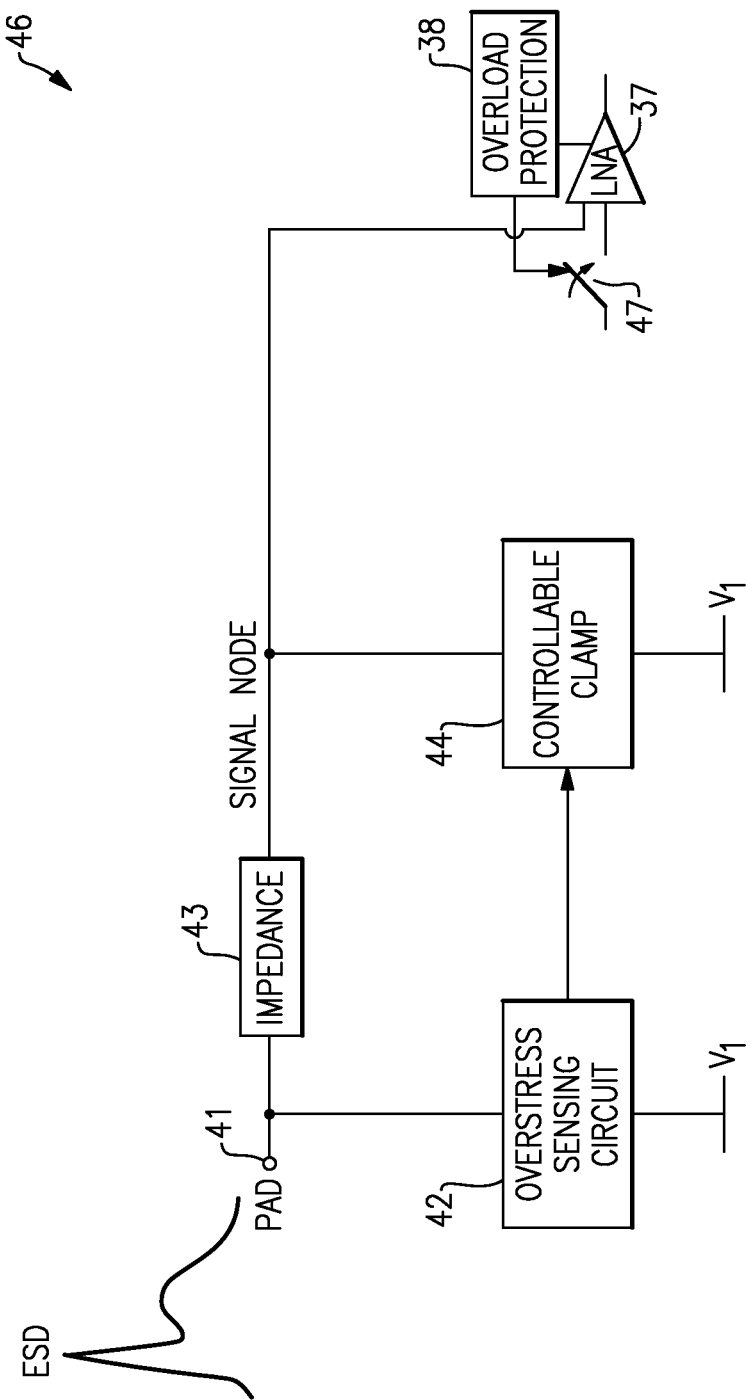
FIG. 7 is a schematic block diagram of a front end integrated circuit that includes an overstress protection circuit and a low noise amplifier system according to an embodiment.

FIG. 7 is a schematic block diagram of a front end integrated circuit 46 that includes an overstress protection circuit and a low noise amplifier system according to an embodiment. The low noise amplifier system includes an antenna-side switch 47, a low noise amplifier 37 including an input electrically coupled to the antenna-side switch 47, and an overload protection circuit 38 configured to adjust an impedance of the antenna-side switch 47 based on a signal level of the low noise amplifier 37. The low noise amplifier 37 is controllable by a control signal. The low noise amplifier 37 is an example of the low noise amplifier 6 discussed above. The antenna-side switch 47 is an example of the antenna-side switch 2 discussed above. The low noise amplifier 37, the overload protection circuit 38, and/or the antenna-side switch 47 can include any suitable combination of features discussed in Section II. The front end integrated circuit 46 also includes an input pad 41 configured to receive the control signal. The overstress protection circuit includes an overstress sensing circuit 42 electrically connected between the input pad 41 and a first supply node $V_1$, an impedance element 43 electrically connected between the input pad 41 and a signal node, and a controllable clamp 44 electrically connected between the signal node and the first supply node $V_1$. The overstress sensing circuit 42 is configured to activate the controllable clamp 44 in response to detecting an electrical overstress event at the input pad 41. An electrostatic discharge (ESD) event is an example of an electrical overstress event. The input pad 41 and/or the overstress protection circuit can include any suitable combination of features discussed in Section V.

Figure 8:
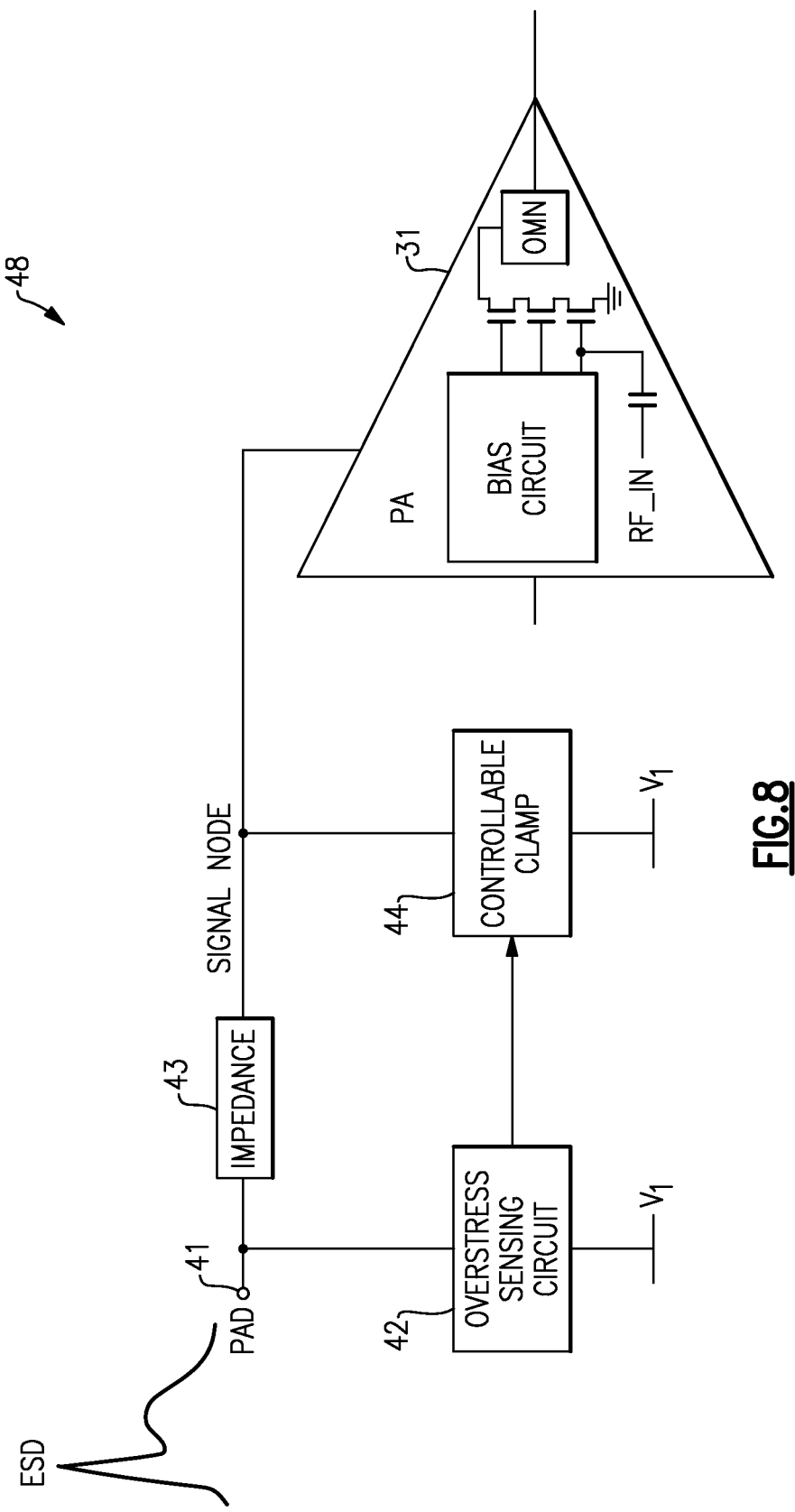
FIG. 8 is a schematic block diagram of a front end integrated circuit that includes an overstress protection circuit and a multi-mode power amplifier according to an embodiment.

FIG. 8 is a schematic block diagram of a front end integrated circuit 48 that includes an overstress protection circuit and a multi-mode power amplifier 31 according to an embodiment. The multi-mode power amplifier 31 is an example of the power amplifier 5 discussed above. The multi-mode power amplifier 31 includes a stacked output stage including a transistor stack of two or more transistors. The multi-mode power amplifier 31 also includes a bias circuit configured to control a bias of at least one transistor of the transistor stack based on a mode of the multi-mode power amplifier 31. The multi-mode power amplifier 31 is controllable by a control signal. The multi-mode power amplifier 31 can include any suitable combination of features discussed in Section III. The front end integrated circuit 48 also includes an input pad 41 configured to receive the control signal. The overstress protection circuit includes an overstress sensing circuit 42 electrically connected between the input pad 41 and a first supply node $V_1$, an impedance element 43 electrically connected between the input pad 41 and a signal node, and a controllable clamp 44 electrically connected between the signal node and the first supply node $V_1$. The overstress sensing circuit 42 is configured to activate the controllable clamp 44 in response to detecting an electrical overstress event at the input pad 41. An electrostatic discharge (ESD) event is an example of an electrical overstress event. The input pad 41 and/or the overstress protection circuit can include any suitable combination of features discussed in Section V.

Figure 9:
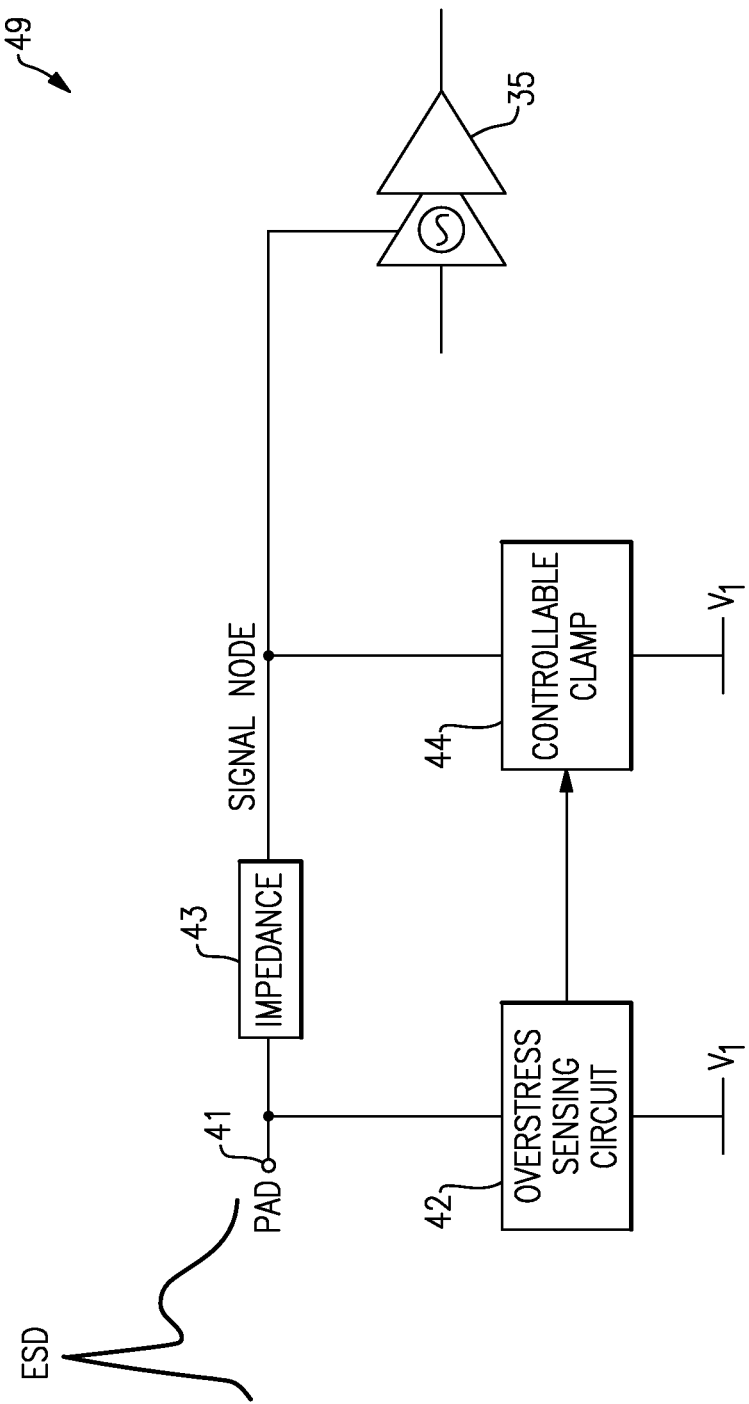
FIG. 9 is a schematic block diagram of a front end integrated circuit that includes an overstress protection circuit and a power amplifier that includes an injection-locked oscillator driver stage according to an embodiment.

FIG. 9 is a schematic block diagram of a front end integrated circuit 49 that includes an overstress protection circuit and a power amplifier 35 that includes an injection-locked oscillator driver stage according to an embodiment. The power amplifier 35 is an example of the power amplifier 5 discussed above. The power amplifier 35 includes an injection-locked oscillator driver stage. The power amplifier 35 is controllable by a control signal. The power amplifier 35 can include any suitable combination of features discussed in Section IV. The front end integrated circuit 49 also includes an input pad 41 configured to receive the control signal. The overstress protection circuit includes an overstress sensing circuit 42 electrically connected between the input pad 41 and a first supply node $V_1$, an impedance element 43 electrically connected between the input pad 41 and a signal node, and a controllable clamp 44 electrically connected between the signal node and the first supply node $V_1$. The overstress sensing circuit 42 is configured to activate the controllable clamp 44 in response to detecting an electrical overstress event at the input pad 41. An electrostatic discharge (ESD) event is an example of an electrical overstress event. The input pad 41 and/or the overstress protection circuit can include any suitable combination of features discussed in Section V.

Packaged modules can include an integrated antenna and a front integrated circuit on a common packaging substrate. The front end integrated circuit can be positioned in an interior of a radio frequency shielding structure. The shielding structure can include a shielding layer formed over a front end integrated such that the antenna is unshielded opposite the common packaging substrate. The radio frequency shielding structure can shield the front end integrated circuit from electromagnetic interference from the integrated antenna and/or from other components outside of the radio frequency shielding structure. Alternatively or additionally, the radio frequency shielding structure can shield the antenna and/or other components from electromagnetic interference from the front end integrated circuit. Accordingly, an antenna can be integrated in a packaged module and the radio frequency shielding structure can reduce electromagnetic interference between components of a packaged module. According to some embodiments, the integrated antenna can be a multi-layer antenna. In some instances, multi-layer antenna can have a first portion implemented on a first side of the substrate and a second portion in implemented on a second side of the substrate that is opposite to the first side of the substrate. Some example packaged modules with an integrated antenna and a front end integrated circuit on an interior of a radio frequency shielding structure will be described with reference to FIGS. 10 to 14. FIGS. 10 to 14 illustrate packaged modules without a shielding layer that is formed over the front end integrated circuit and not over the antenna. Such a shielding layer can be formed, for example, in accordance with any of the principles and advantages discussed in Section VI.

Figure 10:
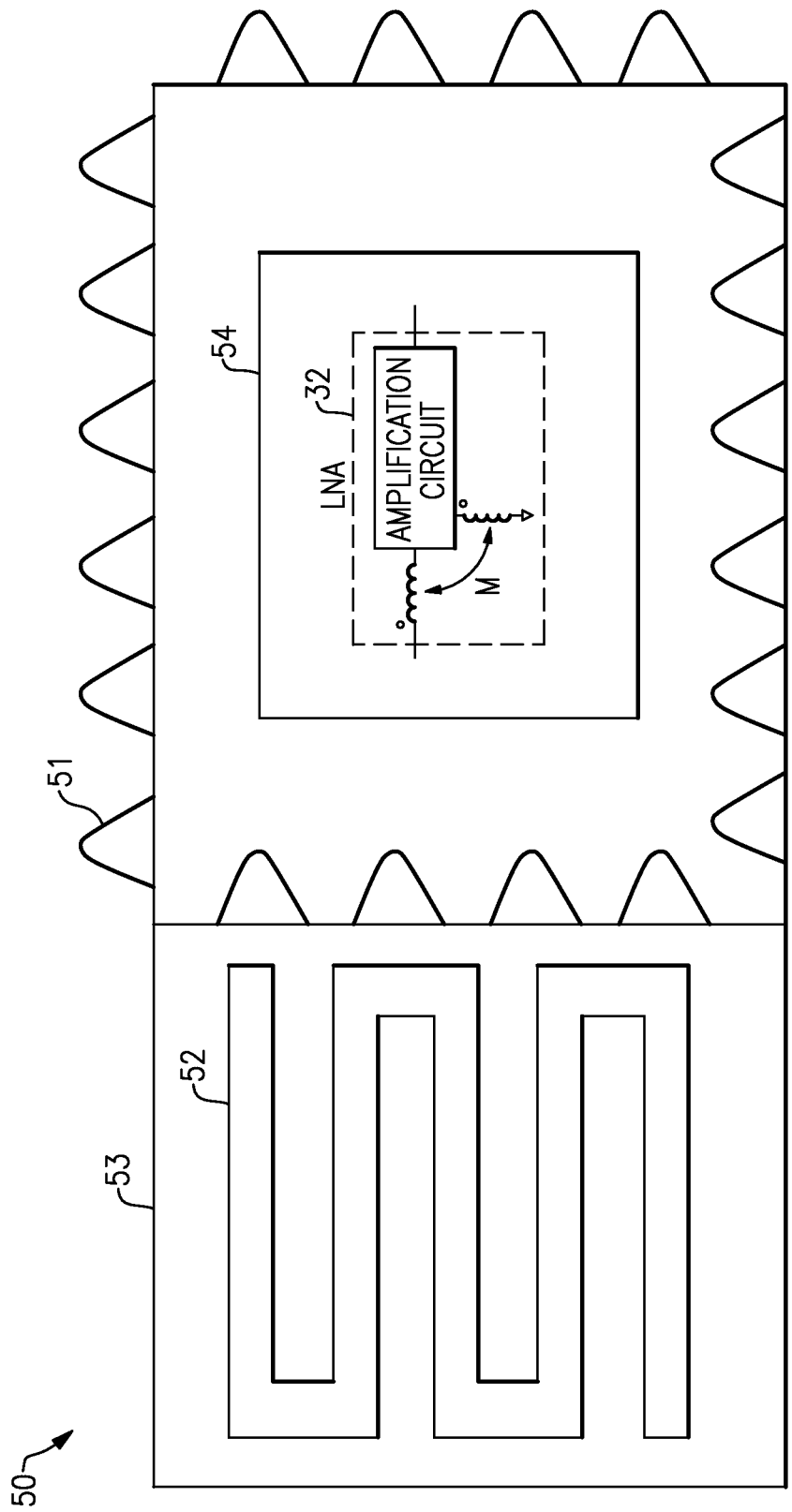
FIG. 10 is a schematic diagram of a packaged module that includes a low noise amplifier with magnetically coupled inductors within a radio frequency shielding structure and an antenna external to the radio frequency shielding structure according to an embodiment.

FIG. 10 is a schematic diagram of a packaged module 50 that includes a low noise amplifier 32 with magnetically coupled inductors within a radio frequency shielding structure 51 and an antenna 52 external to the radio frequency shielding structure 51 according to an embodiment. FIG. 10 shows the packaged module 50 in plan view without a top shielding layer of the radio frequency shielding structure 51. The packaged module 50 includes a package substrate 53, a radio frequency shielding structure 51 extending above the package substrate 53, and a front end integrated circuit 54 positioned in an interior of the radio frequency shielding structure 51, and an antenna 52 on the package substrate 53 external to the radio frequency shielding structure 51. The radio frequency shielding structure 51 can include one or more suitable features discussed in Section VI. The antenna 52 can include one or more suitable features discussed in Section VI. The package substrate 53 can include one or more suitable features discussed in Section VI. The front end integrated circuit 54 includes a low noise amplifier 32 that includes a first inductor, an amplification circuit, and a second inductor magnetically coupled to the first inductor to provide negative feedback to linearize the low noise amplifier 32. The low noise amplifier 32 is an example of the low noise amplifier 6 discussed above. The low noise amplifier 32 can include any suitable combination of features discussed in Section I.

Figure 11:
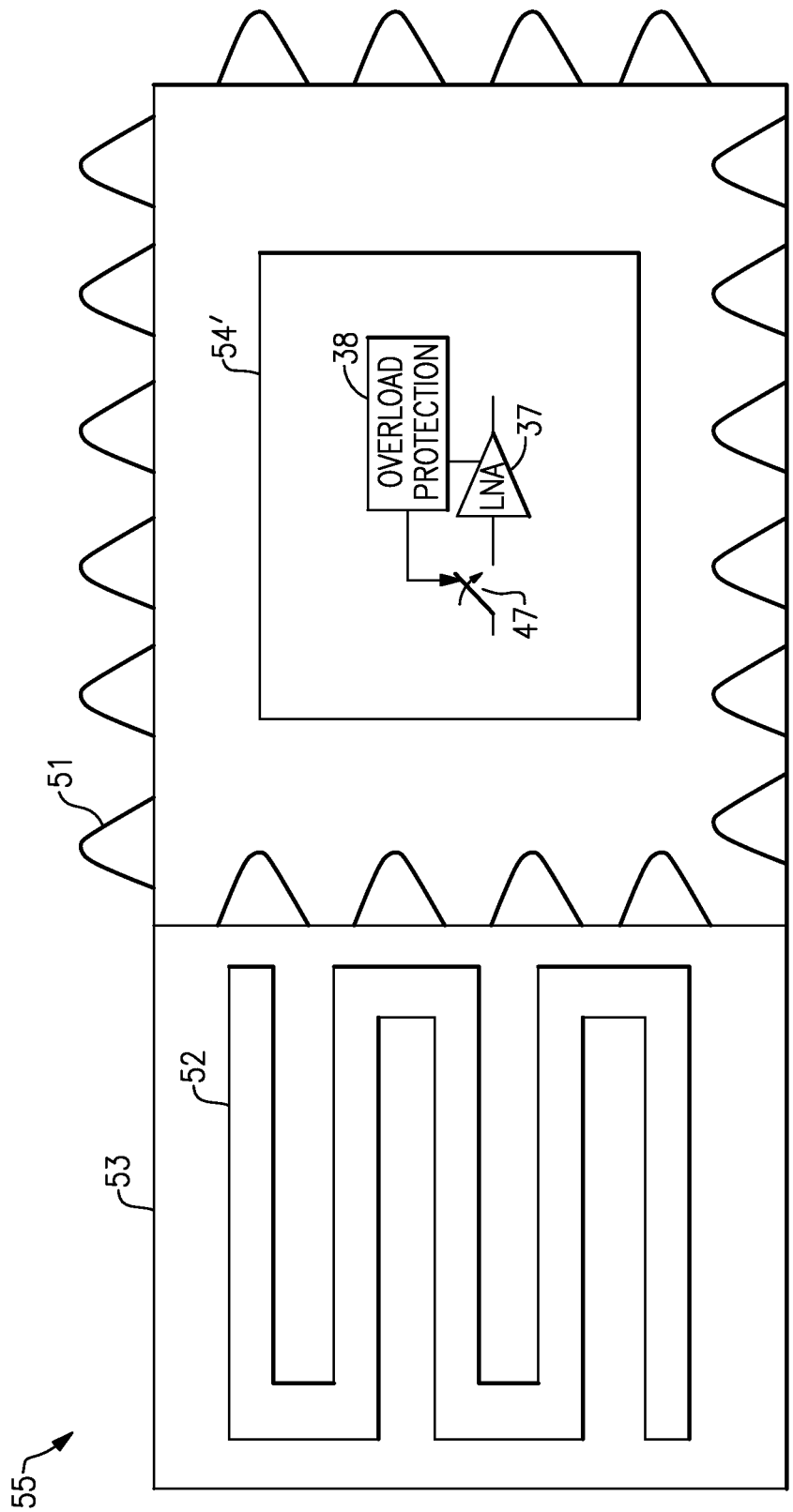
FIG. 11 is a schematic diagram of a packaged module that includes a low noise amplifier and an overload protection circuit within a radio frequency shielding structure and an antenna external to the radio frequency shielding structure according to an embodiment.

FIG. 11 is a schematic diagram of a packaged module 55 that includes a low noise amplifier 37 and an overprotection circuit 38 within a radio frequency shielding structure 52 and an antenna external to the radio frequency shielding structure 52 according to an embodiment. FIG. 11 shows the packaged module 55 in plan view without a top shielding layer of the radio frequency shielding structure 51. The packaged module 55 includes a package substrate 53, a radio frequency shielding structure 51 extending above the package substrate 53, and a front end integrated circuit 54' positioned in an interior of the radio frequency shielding structure 51, and an antenna 52 on the package substrate 53 external to the radio frequency shielding structure 51. The radio frequency shielding structure 51 can include one or more suitable features discussed in Section VI. The antenna 52 can include one or more suitable features discussed in Section VI. The package substrate 53 can include one or more suitable features discussed in Section VI. The front end integrated circuit 54' includes an antenna-side switch 47, a low noise amplifier 37 including an input electrically coupled to the antenna-side switch 47, and an overload protection circuit 38 configured to adjust an impedance of the antenna-side switch 47 based on a signal level of the low noise amplifier 37. The low noise amplifier 37 is an example of the low noise amplifier 6 discussed above. The antenna-side switch 47 is an example of the antenna-side switch 2 discussed above. The low noise amplifier 37 and/or the overload protection circuit 38 and/or the antenna-side switch 47 can include any suitable combination of features discussed in Section II.

Figure 12:
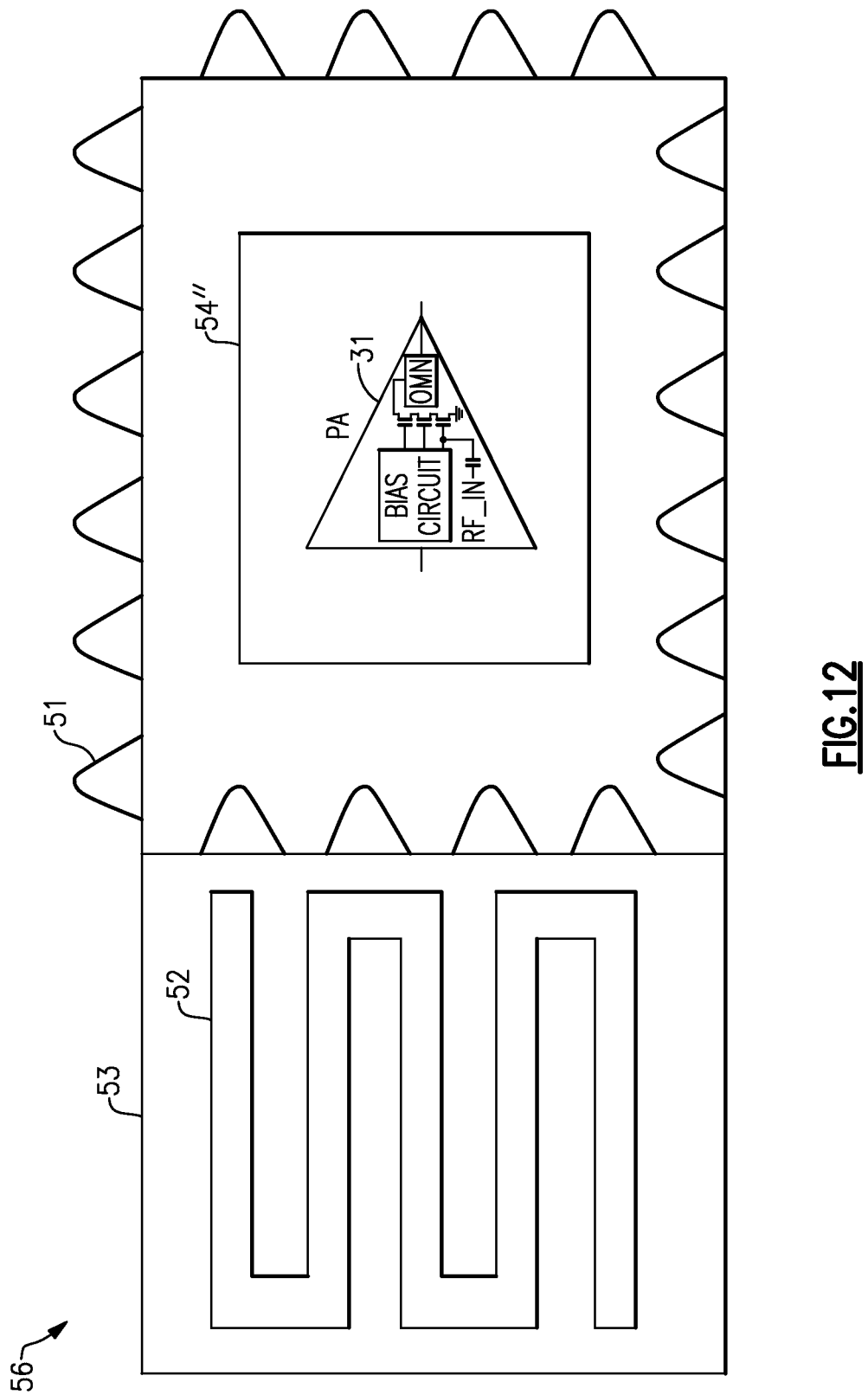
FIG. 12 is a schematic diagram of a packaged module that includes a multi-mode power amplifier within a radio frequency shielding structure and an antenna external to the radio frequency shielding structure according to an embodiment.

FIG. 12 is a schematic diagram of a packaged module 56 that includes a multi-mode power amplifier 31 within a radio frequency shielding structure 51 and an antenna 52 external to the radio frequency shielding structure 51 according to an embodiment. The packaged module 56 includes a package substrate 53, a radio frequency shielding structure 51 extending above the package substrate 53, and a front end integrated circuit 54" positioned in an interior of the radio frequency shielding structure 51, and an antenna 52 on the package substrate 53 external to the radio frequency shielding structure 51. The radio frequency shielding structure 51 can include one or more suitable features discussed in Section VI. The antenna 52 can include one or more suitable features discussed in Section VI. The package substrate 53 can include one or more suitable features discussed in Section VI. The front end integrated circuit 54" includes a multi-mode power amplifier 31 that includes a stacked output stage including a transistor stack of two or more transistors. The multi-mode power amplifier 31 also includes a bias circuit configured to control a bias of at least one transistor of the transistor stack based on a mode of the multi-mode power amplifier. The multi-mode power amplifier 31 is an example of the power amplifier 5 discussed above. The multi-mode power amplifier 31 can include any suitable combination of features discussed in Section III.

Figure 13:
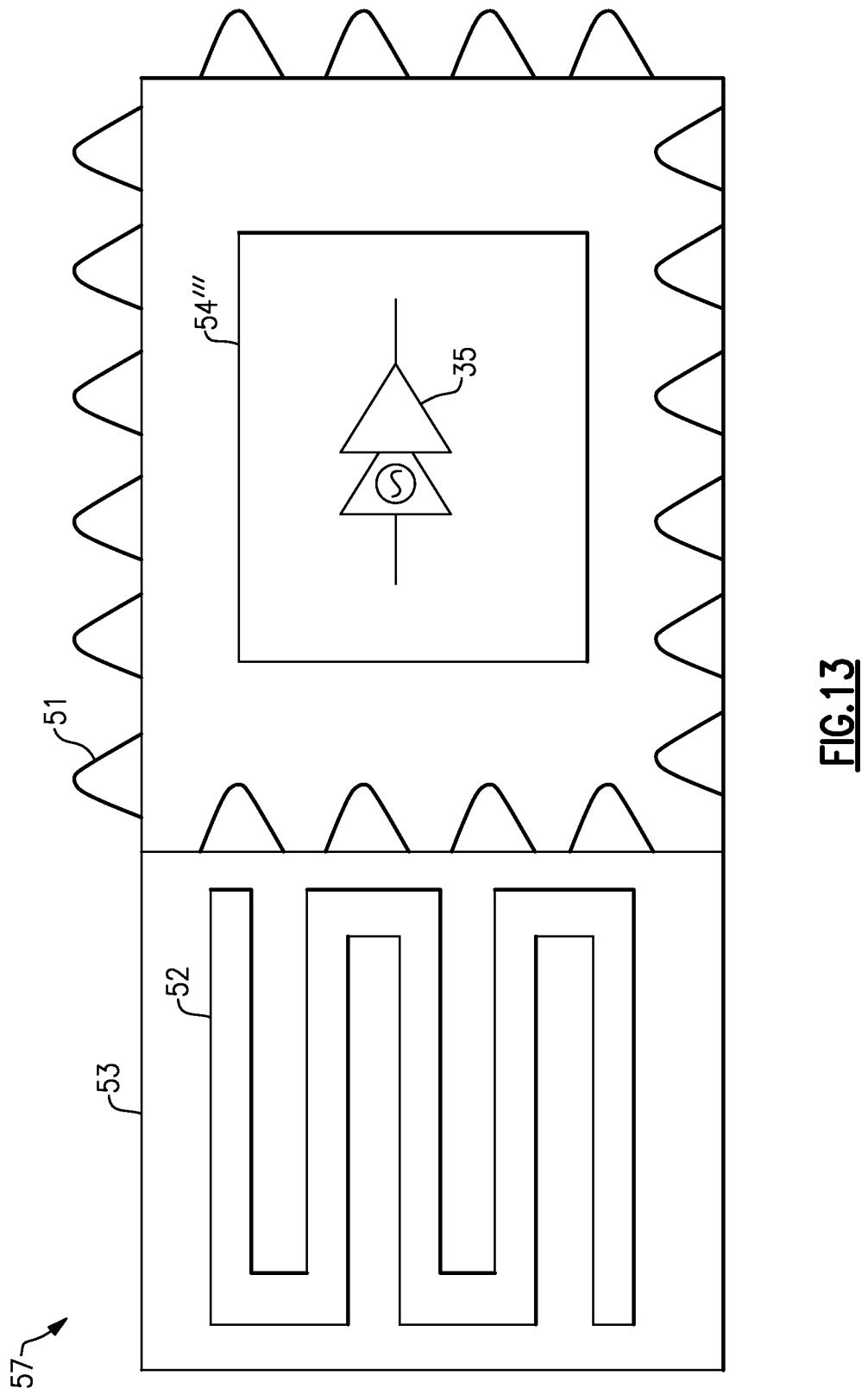
FIG. 13 is a schematic diagram of a packaged module that includes an injection-locked oscillator driver stage within a radio frequency shielding structure and an antenna external to the radio frequency shielding structure according to an embodiment.

FIG. 13 is a schematic diagram of a packaged module 57 that includes a power amplifier 35 with an injection-locked oscillator driver stage within a radio frequency shielding structure 51 and an antenna 52 external to the radio frequency shielding structure 51 according to an embodiment. The packaged module 56 includes a package substrate 53, a radio frequency shielding structure 51 extending above the package substrate 53, and a front end integrated circuit 54''' positioned in an interior of the radio frequency shielding structure 51, and an antenna 52 on the package substrate 53 external to the radio frequency shielding structure 51. The radio frequency shielding structure 51 can include one or more suitable features discussed in Section VI. The antenna 52 can include one or more suitable features discussed in Section VI. The package substrate 53 can include one or more suitable features discussed in Section VI. The front end integrated circuit 54''' includes an injection-locked oscillator driver stage. As illustrated, the power amplifier 35 includes an injection-locked oscillator driver stage. The power amplifier 35 is an example of the power amplifier 5 discussed above. The power amplifier 35 and/or the injection-locked oscillator driver stage can include any suitable combination of features discussed in Section IV.

Figure 14:
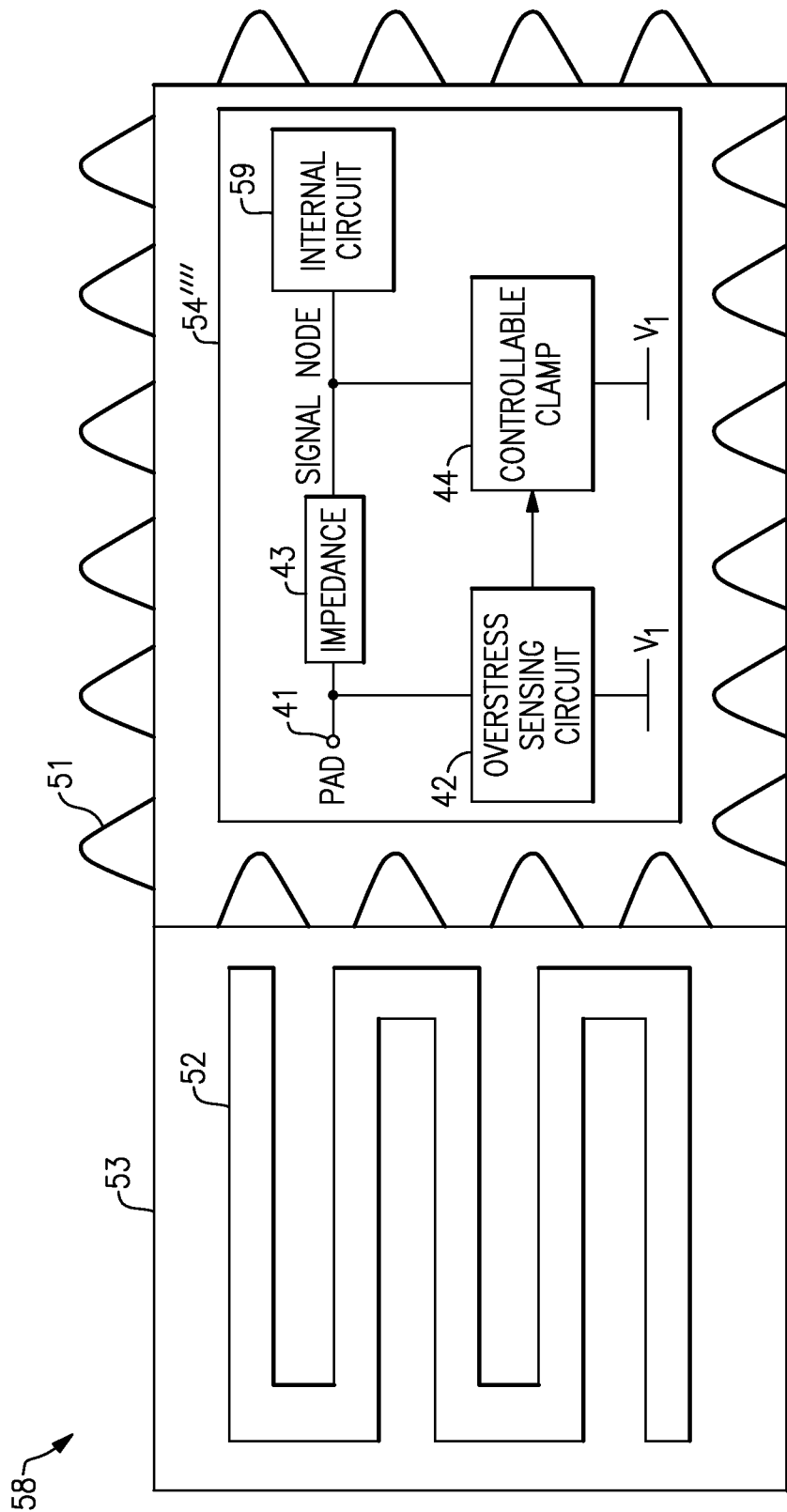
FIG. 14 is a schematic diagram of a packaged module that includes an overstress protection circuit within a radio frequency shielding structure and an antenna external to the radio frequency shielding structure according to an embodiment.

FIG. 14 is a schematic diagram of a packaged module 58 that includes an overstress protection circuit within a radio frequency shielding structure 51 and an antenna 52 external to the radio frequency shielding structure 51 according to an embodiment. The packaged module 56 includes a package substrate 53, a radio frequency shielding structure 51 extending above the package substrate 53, and a front end integrated circuit 54'''' positioned in an interior of the radio frequency shielding structure 51, and an antenna 52 on the package substrate 53 external to the radio frequency shielding structure 51. The radio frequency shielding structure 51 can include one or more suitable features discussed in Section VI. The antenna 52 can include one or more suitable features discussed in Section VI. The package substrate 53 can include one or more suitable features discussed in Section VI. The front end integrated circuit 54'''' includes a pad 41, an overstress protection circuit, and an internal circuit 59 electrically connected to a signal node. The overstress protection circuit includes an overstress sensing circuit 42 electrically connected between the pad 41 and a first supply node $V_1$, an impedance element 43 electrically connected between the pad 41 and the signal node, and a controllable clamp 44 electrically connected between the signal node and the first supply node $V_1$. The overstress sensing circuit 42 is configured to activate the controllable clamp 44 in response to detecting an electrical overstress event at the pad 41. The overstress protection circuit can include any suitable combination of features discussed in Section V.

Packaged modules can include an antenna shielded from a front integrated circuit by a ground plane of a multi-layer substrate. The ground plane can shield the front end integrated circuit from electromagnetic interference from the antenna. Alternatively or additionally, the ground plane can shield the antenna from electromagnetic interference from the front end integrated circuit. Accordingly, an antenna can be integrated in a packaged module and the ground plane can reduce electromagnetic interference between components of a packaged module. Some example packaged modules with a ground plane positioned between an antenna and a front end integrated circuit will be described with reference to FIGS. 15A to 15F.

FIG. 15A is a cross section of a packaged module 60 that includes a ground plane 61 between an antenna 62 and a front end integrated circuit 63 according to an embodiment. The packaged module 60 includes a multi-layer substrate 64 including a ground plane 61, an antenna 62 on a first side of the multi-layer substrate 64, and a front end integrated circuit 63 on a second side of the multi-layer substrate 64. The ground plane 61 is positioned between the antenna 62 and the front end integrated circuit 63. The ground plane 61 is operable to provide shielding for the front end integrated circuit 63. The packaged module 60 can include any suitable combination of features discussed in Section VII.

As illustrated, the packaged module 60 also includes an insulating layer 65 disposed between the antenna layer 62 and the ground plane 61, other layers 66 (e.g., including signal routing and/or passive components), vias 67 extending from the ground plane 61 to the bottom side of the multi-layer substrate 64, molding material 68 encapsulating the front end integrated circuit 63, through mold vias 69 extending through the molding material 68, and solder bumps 70.

FIGS. 15B to 15F are example cross sections of the packaged module 60 that include various front end integrated circuits 63. In these figures, ground solder bumps 70 surround a front end integrated circuit and form a portion of a shielding structure around the front end integrated circuit. As illustrated, the ground solder bumps 70 surround signal routing solder bumps 73. The signal routing solder bumps 73 provide at least a portion of a connection between a front end integrated circuit 63 with metal routing in a routing layer that is disposed between the front end integrated circuit 63 and the ground plane 61. Although FIGS. 15B to 15F illustrate circuitry included in a front end integrated circuit, most front end integrated circuits will also include other circuitry that is not illustrated in these figures. In some embodiments, a front end integrated circuit 63 includes circuitry associated with two or more of FIGS. 15B to 15F.

As shown in FIG. 15B, the front end integrated circuit 63 can include a low noise amplifier 32 that includes a first inductor, an amplification circuit, and a second inductor magnetically coupled to the first inductor to provide negative feedback to linearize the low noise amplifier 32. The low noise amplifier 32 is an example of the low noise amplifier 6 discussed above. The low noise amplifier 32 can include any suitable combination of features discussed in Section I.

As shown in FIG. 15C, the front end integrated circuit 63 can include an antenna-side switch 47, a low noise amplifier 37 including an input electrically coupled to the antenna 62 via the antenna-side switch 47, and an overload protection circuit 38 configured to adjust an impedance of the antenna-side switch 47 based on a signal level of the low noise amplifier 37. The low noise amplifier 37 is an example of the low noise amplifier 6 discussed above. The low noise amplifier 37 and/or the overload protection circuit 38 can include any suitable combination of features discussed in Section II.

As shown in FIG. 15D, the front end integrated circuit 63 can include a multi-mode power amplifier 31 that includes a stacked output stage including a transistor stack of two or more transistors. The multi-mode power amplifier 31 also includes a bias circuit configured to control a bias of at least one transistor of the transistor stack based on a mode of the multi-mode power amplifier. The multi-mode power amplifier 31 is an example of the power amplifier 5 discussed above. The multi-mode power amplifier 31 can include any suitable combination of features discussed in Section III.

Figure 15F:
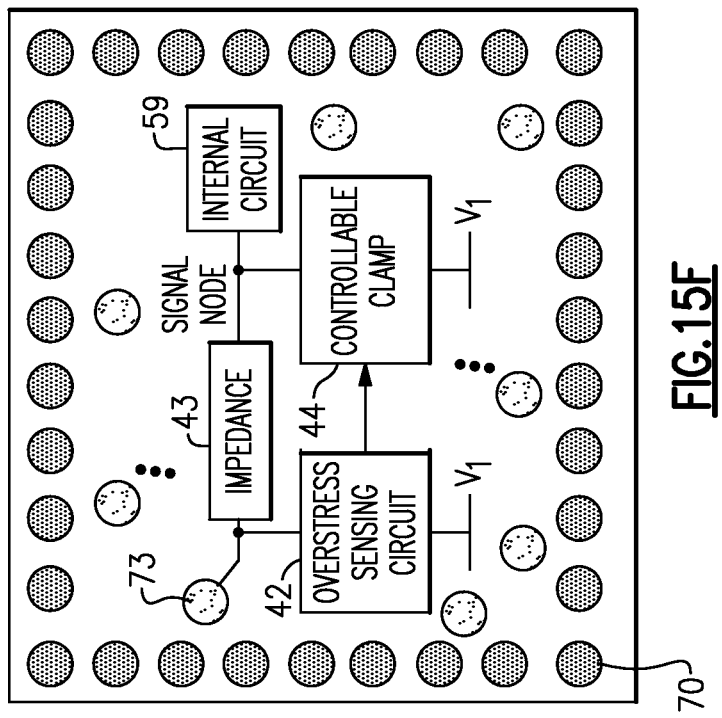
Figure 15E:
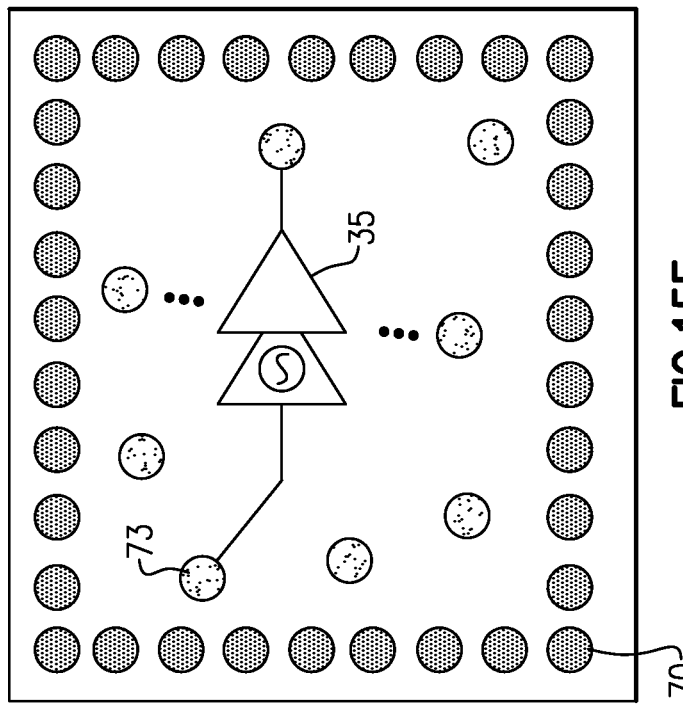

As shown in FIG. 15E, the front end integrated circuit 63 can include an injection-locked oscillator driver stage. As illustrated, a power amplifier 35 includes an injection-locked oscillator driver stage. The power amplifier 35 is an example of the power amplifier 5 discussed above. The power amplifier 35 and/or the injection-locked oscillator driver stage can include any suitable combination of features discussed in Section IV.

As shown in FIG. 15F, the front end integrated circuit 63 can include a pad (connected to a signal routing solder bump 73 in FIG. 15F), an overstress protection circuit, and an internal circuit 59 electrically connected to a signal node. The overstress protection circuit includes an overstress sensing circuit 42 electrically connected between the pad and a first supply node $V_1$, an impedance element 43 electrically connected between the pad and the signal node, and a controllable clamp 44 electrically connected between the signal node and the first supply node $V_1$. The overstress sensing circuit 42 is configured to activate the controllable clamp 44 in response to detecting an electrical overstress event at the pad. The overstress protection circuit can include any suitable combination of features discussed in Section V.

Packaged modules can include a crystal and integrated circuits within a common package. Such packaged modules can include a crystal, a first integrated circuit (e.g., a system on a chip (SoC)) disposed between the crystal and a substrate, and a second integrated circuit. Such a packaged module can be referred to as a system-in-a package (SiP). Some example packaged modules with a first integrated circuit disposed between a crystal and a package substrate will be described with reference to FIGS. 16 to 20. These example modules include components arranged to achieve a relatively small module size. Such modules can have decreased crystal trace parasitic capacitance and/or reduced coupling between crystal routing traces and other relatively sensitive paths within the module.

Figure 16:
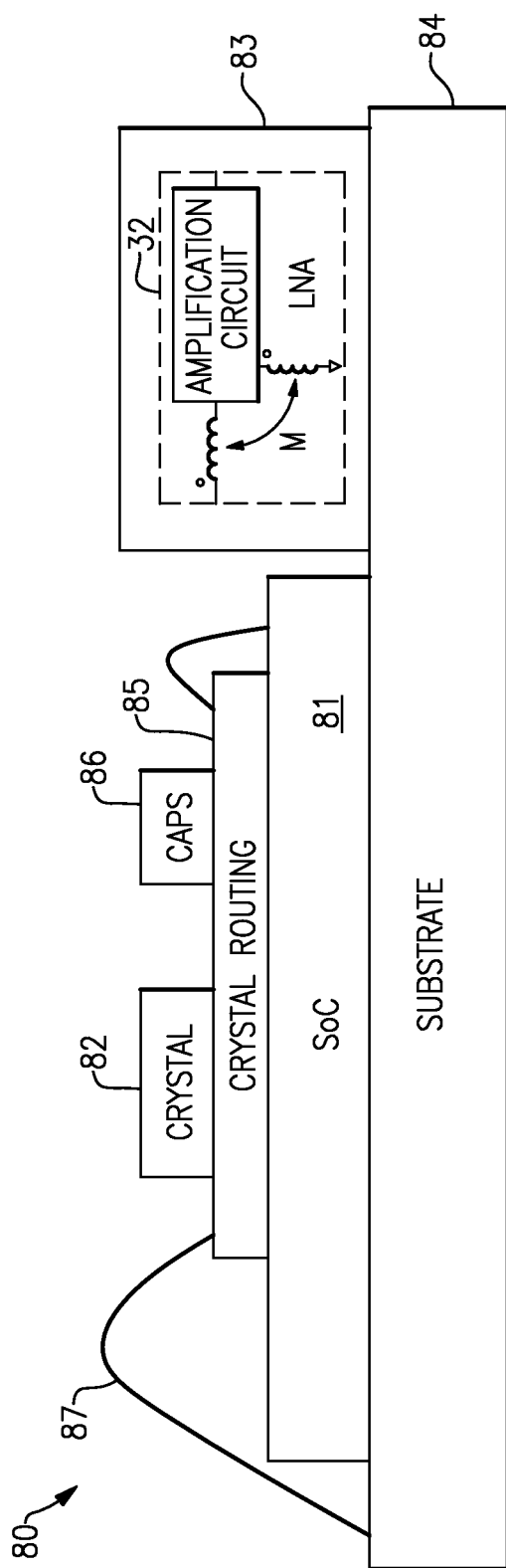
FIG. 16 is a cross section of a packaged module that includes an integrated circuit, a crystal vertically integrated with the integrated circuit, and an other integrated circuit that includes a low noise amplifier with magnetically coupled inductors according to an embodiment.

FIG. 16 is a cross section of a packaged module 80 that includes an integrated circuit 81, a crystal 82 vertically integrated with the integrated circuit 81, and an other integrated circuit 83 that includes a low noise amplifier 32 with magnetically coupled inductors according to an embodiment. The packaged module 80 includes a package substrate 84, a first integrated circuit 81 supported by the package substrate 84, and a crystal 82 supported by the package substrate 84. The first integrated circuit 81 is disposed between the crystal 82 and the package substrate 84. The packaged module 80 also includes a second integrated circuit 83 supported by the package substrate 84. The second integrated circuit 83 is not necessarily drawn to scale. As illustrated in FIG. 16, the packaged module 80 can also include a routing substrate or interposer 85, one or more load capacitors 86, and one or more wire bonds 87. The package substrate 84 can include one or more suitable features discussed in Section VIII. The first integrated circuit 81 can include one or more suitable features discussed in Section VIII. The crystal 82 can include one or more suitable features discussed in Section VIII. The second integrated circuit 83 can include any suitable front end circuitry discussed herein. As illustrated, the second integrated circuit 83 includes a low noise amplifier 32 that includes a first inductor, an amplification circuit, and a second inductor magnetically coupled to the first inductor to provide negative feedback to linearize the low noise amplifier 32. The low noise amplifier 32 is an example of the low noise amplifier 6 discussed above. The low noise amplifier 32 can include any suitable combination of features discussed in Section I.

Figure 17:
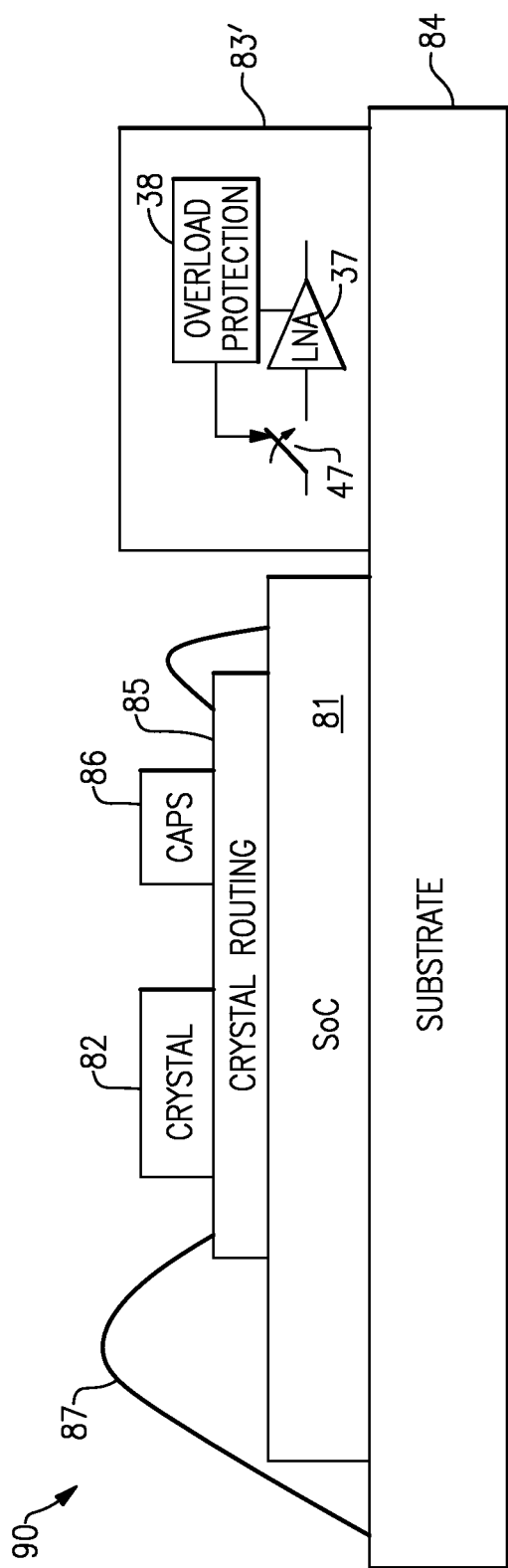
FIG. 17 is a cross section of a packaged module that includes an integrated circuit, a crystal vertically integrated with the integrated circuit, and an other integrated circuit that includes a low noise amplifier and an overload protection circuit according to an embodiment.

FIG. 17 is a cross section of a packaged module 90 that includes an integrated circuit 81, a crystal 82 vertically integrated with the integrated circuit 81, and an other integrated circuit 83' that includes a low noise amplifier 37 and an overload protection circuit 38 according to an embodiment. The packaged module 90 includes a package substrate 84, a first integrated circuit 81 supported by the package substrate 84, and a crystal 82 supported by the package substrate 84. The first integrated circuit 81 is disposed between the crystal 82 and the package substrate 84. The packaged module 90 also includes a second integrated circuit 83' supported by the package substrate 84. The package substrate 84 can include one or more suitable features discussed in Section VIII. The first integrated circuit 81 can include one or more suitable features discussed in Section VIII. The crystal 82 can include one or more suitable features discussed in Section VIII. The second integrated circuit 83' is not necessarily drawn to scale. The second integrated circuit 83' can include any suitable front end circuitry discussed herein. As illustrated, the second integrated circuit 83' includes an antenna-side switch 47, a low noise amplifier 37 including an input electrically coupled to the antenna-side switch 47, and an overload protection circuit 38 configured to adjust an impedance of the antenna-side switch 47 based on a signal level of the low noise amplifier 37. The low noise amplifier 37 is an example of the low noise amplifier 6 discussed above. The antenna-side switch 47 is an example of the antenna-side switch 2 discussed above. The low noise amplifier 37 and/or the overload protection circuit 38 and/or the antenna-side switch 47 can include any suitable combination of features discussed in Section II.

Figure 18:
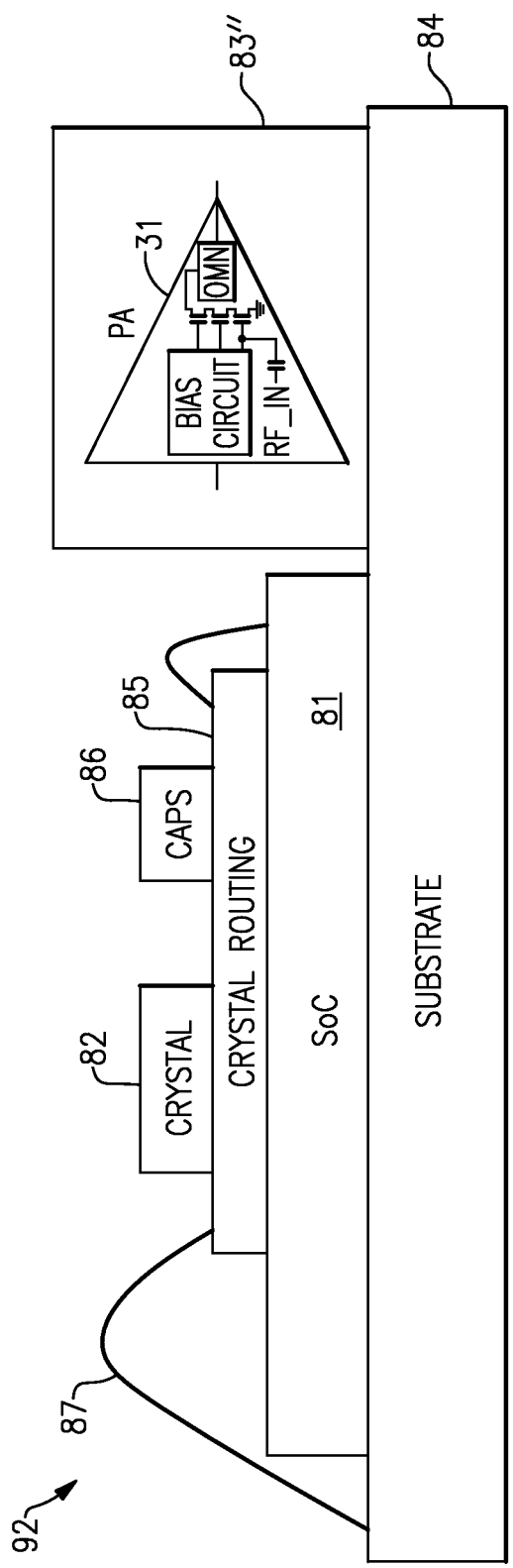
FIG. 18 is a cross section of a packaged module that an integrated circuit, a crystal vertically integrated with the integrated circuit, and an other integrated circuit that includes a multi-mode power amplifier according to an embodiment.

FIG. 18 is a cross section of a packaged module 92 that an integrated circuit 81, a crystal 82 vertically integrated with the integrated circuit 81, and an other integrated circuit 83" that includes a multi-mode power amplifier 31 according to an embodiment. The packaged module 92 includes a package substrate 84, a first integrated circuit 81 supported by the package substrate 84, and a crystal 82 supported by the package substrate 84. The first integrated circuit 81 is disposed between the crystal 82 and the package substrate 84. The packaged module 92 also includes a second integrated circuit 83" supported by the package substrate 84. The package substrate 84 can include one or more suitable features discussed in Section VIII. The first integrated circuit 81 can include one or more suitable features discussed in Section VIII. The crystal 82 can include one or more suitable features discussed in Section VIII. The second integrated circuit 83" is not necessarily drawn to scale. The second integrated circuit 83" includes a multi-mode power amplifier 31 that includes a stacked output stage including a transistor stack of two or more transistors. The multi-mode power amplifier 31 also includes a bias circuit configured to control a bias of at least one transistor of the transistor stack based on a mode of the multi-mode power amplifier. The multi-mode power amplifier 31 is an example of the power amplifier 5 discussed above. The multi-mode power amplifier 31 can include any suitable combination of features discussed in Section III.

Figure 19:
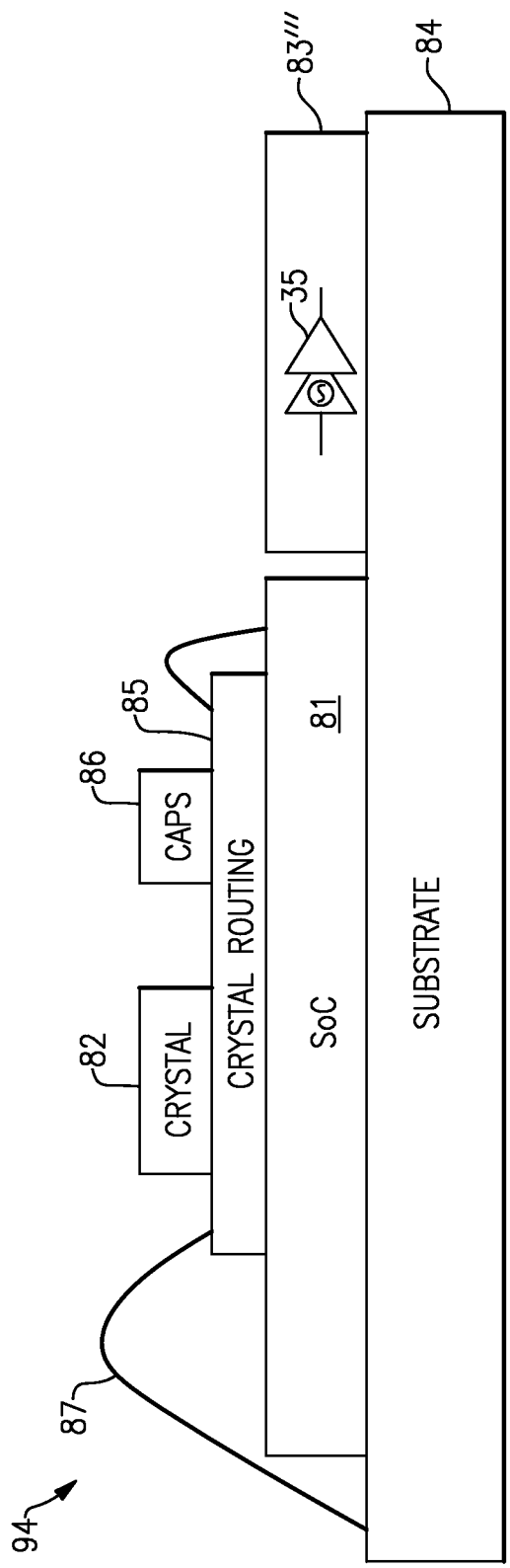
FIG. 19 is a cross section of a packaged module that includes an integrated circuit, a crystal vertically integrated with the integrated circuit, and an other integrated circuit that includes a power amplifier with an injection-locked oscillator driver stage according to an embodiment.

FIG. 19 is a cross section of a packaged module 94 that includes an integrated circuit 81, a crystal 82 vertically integrated with the integrated circuit 81, and an other integrated circuit 83'" that includes a power amplifier 35 with an injection-locked oscillator driver stage according to an embodiment. The packaged module 94 includes a package substrate 84, a first integrated circuit 81 supported by the package substrate 84, and a crystal 82 supported by the package substrate 84. The first integrated circuit 81 is disposed between the crystal 82 and the package substrate 84. The packaged module 94 also includes a second integrated circuit 83''' supported by the package substrate 84. The package substrate 84 can include one or more suitable features discussed in Section VIII. The first integrated circuit 81 can include one or more suitable features discussed in Section VIII. The crystal 82 can include one or more suitable features discussed in Section VIII. The second integrated circuit 83''' is not necessarily drawn to scale. The second integrated circuit 83''' includes a power amplifier 35 with an injection-locked oscillator driver stage. The power amplifier 35 is an example of the power amplifier 5 discussed above. The power amplifier 35 can include any suitable combination of features discussed in Section IV.

Figure 20:
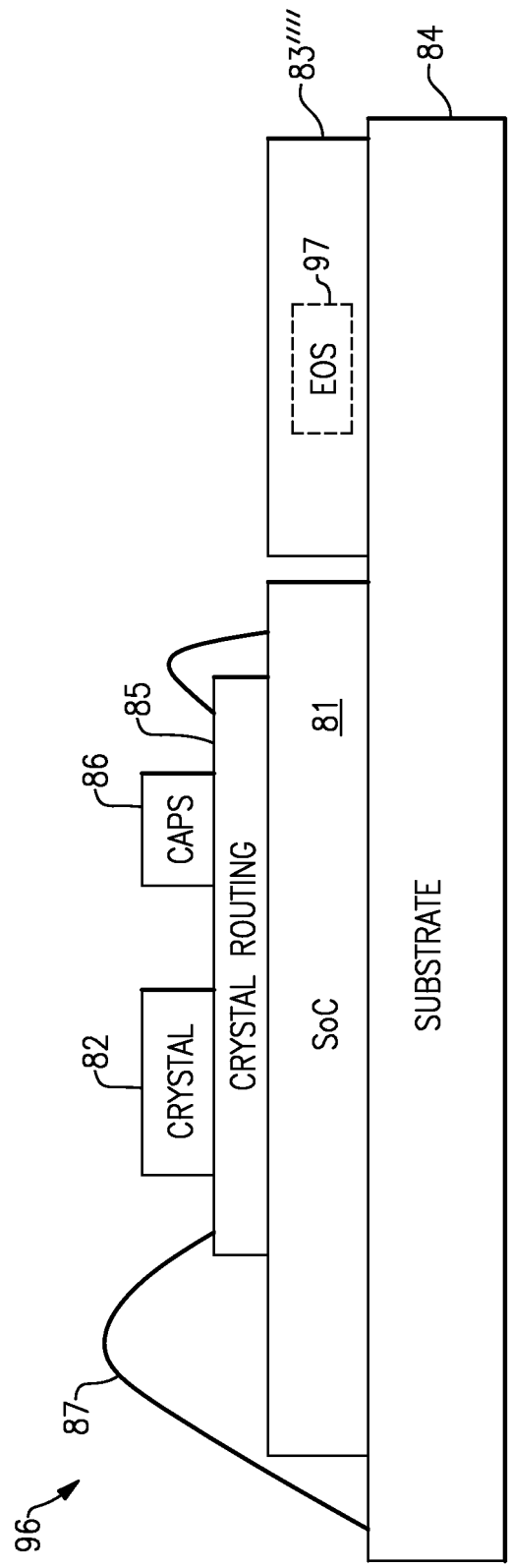
FIG. 20 is a cross section of a packaged module that includes an integrated circuit, a crystal vertically integrated with the integrated circuit, and an other integrated circuit that includes an overstress protection circuit according to an embodiment.

FIG. 20 is a cross section of a packaged module 96 that includes an integrated circuit 81, a crystal 82 vertically integrated with the integrated circuit 81, and an other integrated circuit 83'''' that includes an overstress protection circuit 97 according to an embodiment. The packaged module 96 includes a package substrate 84, a first integrated circuit 81 supported by the package substrate 84, and a crystal 82 supported by the package substrate 84. The first integrated circuit 81 is disposed between the crystal 82 and the package substrate 84. The packaged module 96 also includes a second integrated circuit 83'''' supported by the package substrate 84. The package substrate 84 can include one or more suitable features discussed in Section VIII. The first integrated circuit 81 can include one or more suitable features discussed in Section VIII. The crystal 82 can include one or more suitable features discussed in Section VIII. The second integrated circuit 83'''' is not necessarily drawn to scale. The second integrated circuit 83'''' includes an overstress protection circuit 97. The second integrated circuit 83'''' can also include a pad and an internal circuit electrically connected to a signal node. In an embodiment, the overstress protection circuit 97 includes an overstress sensing circuit electrically connected between the pad and a first supply node, an impedance element electrically connected between the pad and the signal node, and a controllable clamp electrically connected between the signal node and the first supply node. The overstress sensing circuit is configured to activate the controllable clamp in response to detecting an electrical overstress event at the pad. The overstress protection circuit 97 can include any suitable combination of features discussed in Section V.

Packaged modules can include a crystal assembly. The crystal assembly can be disposed between an integrated circuit, such as a system on a chip (SoC), and a package substrate. This can result in shorter crystal traces and enable the packaged module to be more physically compact. The crystal assembly can include a crystal oscillator within a housing that also includes one or more conductive pillars for routing signals from the SoC to a package substrate and/or to provide thermal conductivity. Some example packaged modules with a crystal assembly will be described with reference to FIGS. 21 to 25.

Figure 21:
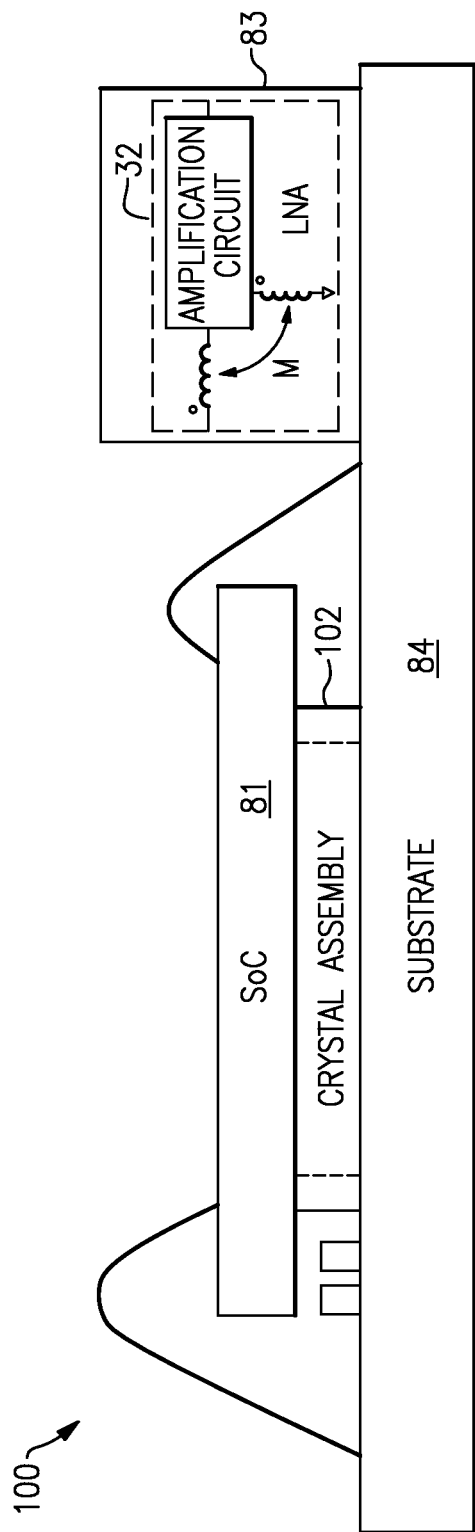
FIG. 21 is a cross section of a packaged module that includes an integrated circuit, a crystal assembly under the integrated circuit, and an other integrated circuit that includes a low noise amplifier with magnetically coupled inductors according to an embodiment.

FIG. 21 is a cross section of a packaged module 100 that includes an integrated circuit 81, a crystal assembly 102 under the integrated circuit 81, and an other integrated circuit 83 that includes a low noise amplifier 32 with magnetically coupled inductors according to an embodiment. The packaged module 100 includes a package substrate 84, a first integrated circuit 81 supported by the package substrate 84, and a crystal assembly 102 supported by the package substrate 84 and disposed between the first integrated circuit 81 and the package substrate 84. The packaged module 100 also includes a second integrated circuit 83 supported by the package substrate 84. The second integrated circuit 83 is not necessarily drawn to scale. The package substrate 84 can include one or more suitable features discussed in Section VIII. The first integrated circuit 81 can include one or more suitable features discussed in Section VIII. The crystal assembly 102 can include one or more suitable features discussed in Section VIII. The second integrated circuit 83 can include any suitable front end circuitry discussed herein. As illustrated, the second integrated circuit 83 includes a low noise amplifier 32 that includes a first inductor, an amplification circuit, and a second inductor magnetically coupled to the first inductor to provide negative feedback to linearize the low noise amplifier 32. The low noise amplifier 32 is an example of the low noise amplifier 6 discussed above. The low noise amplifier 32 can include any suitable combination of features discussed in Section I.

Figure 22:
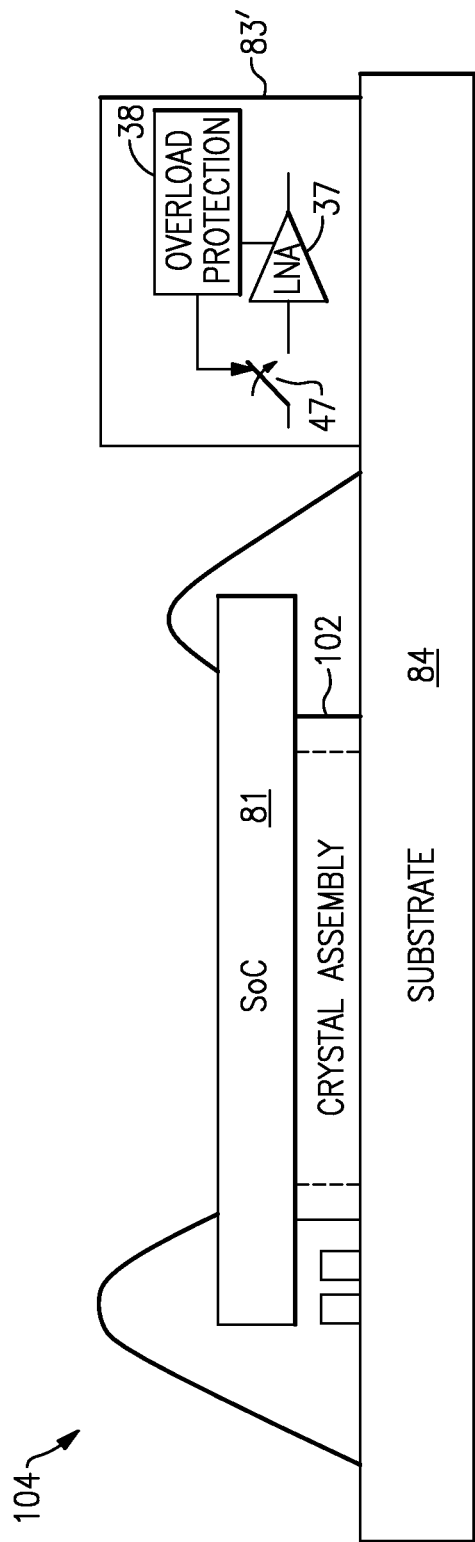
FIG. 22 is a cross section of a packaged module that includes an integrated circuit, a crystal assembly under the integrated circuit, and an other integrated circuit that includes a low noise amplifier and an overload protection circuit according to an embodiment.

FIG. 22 is a cross section of a packaged module 104 that includes an integrated circuit 81, a crystal assembly 102 under the integrated circuit 81, and an other integrated circuit 83' that includes a low noise amplifier 37 and an overload protection circuit 38 according to an embodiment. The packaged module 104 includes a package substrate 84, a first integrated circuit 81 supported by the package substrate 84, and a crystal assembly 102 supported by the package substrate 84 and disposed between the first integrated circuit 81 and the package substrate 84. The packaged module 104 also includes a second integrated circuit 83' supported by the package substrate 84. The second integrated circuit 83' is not necessarily drawn to scale. The package substrate 84 can include one or more suitable features discussed in Section VIII. The first integrated circuit 81 can include one or more suitable features discussed in Section VIII. The crystal assembly 102 can include one or more suitable features discussed in Section VIII. The second integrated circuit 83' can include any suitable front end circuitry discussed herein. As illustrated, the second integrated circuit 83' includes an antenna-side switch 47, a low noise amplifier 37 including an input electrically coupled to the antenna-side switch 47, and an overload protection circuit 38 configured to adjust an impedance of the antenna-side switch 47 based on a signal level of the low noise amplifier 37. The low noise amplifier 37 is an example of the low noise amplifier 6 discussed above. The antenna-side switch 47 is an example of the antenna-side switch 2 discussed above. The low noise amplifier 37 and/or the overload protection circuit 38 and/or the antenna-side switch 47 can include any suitable combination of features discussed in Section II.

Figure 23:
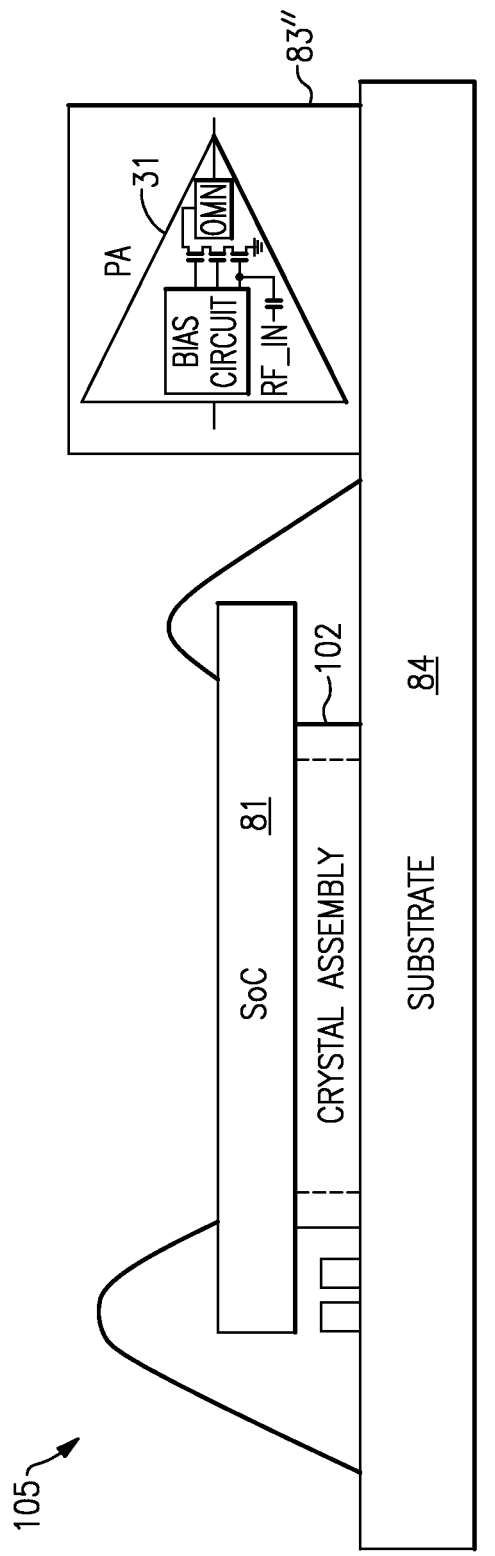
FIG. 23 is a cross section of a packaged module that an integrated circuit, a crystal assembly under the integrated circuit, and an other integrated circuit that includes a multi-mode power amplifier according to an embodiment.

FIG. 23 is a cross section of a packaged module 105 that an integrated circuit 81, a crystal assembly 102 under the integrated circuit 81, and an other integrated 83" circuit that includes a multi-mode power amplifier 31 according to an embodiment. The packaged module 105 includes a package substrate 84, a first integrated circuit 81 supported by the package substrate 84, and a crystal assembly 102 supported by the package substrate 84 and disposed between the first integrated circuit 81 and the package substrate 84. The packaged module 105 also includes a second integrated circuit 83" supported by the package substrate 84. The package substrate 84 can include one or more suitable features discussed in Section VIII. The first integrated circuit 81 can include one or more suitable features discussed in Section VIII. The crystal assembly 102 can include one or more suitable features discussed in Section VIII. The second integrated circuit 83" is not necessarily drawn to scale. The second integrated circuit 83" includes a multi-mode power amplifier 31 that includes a stacked output stage including a transistor stack of two or more transistors. The multi-mode power amplifier 31 also includes a bias circuit configured to control a bias of at least one transistor of the transistor stack based on a mode of the multi-mode power amplifier. The multi-mode power amplifier 31 is an example of the power amplifier 5 discussed above. The multi-mode power amplifier 31 can include any suitable combination of features discussed in Section III.

Figure 24:
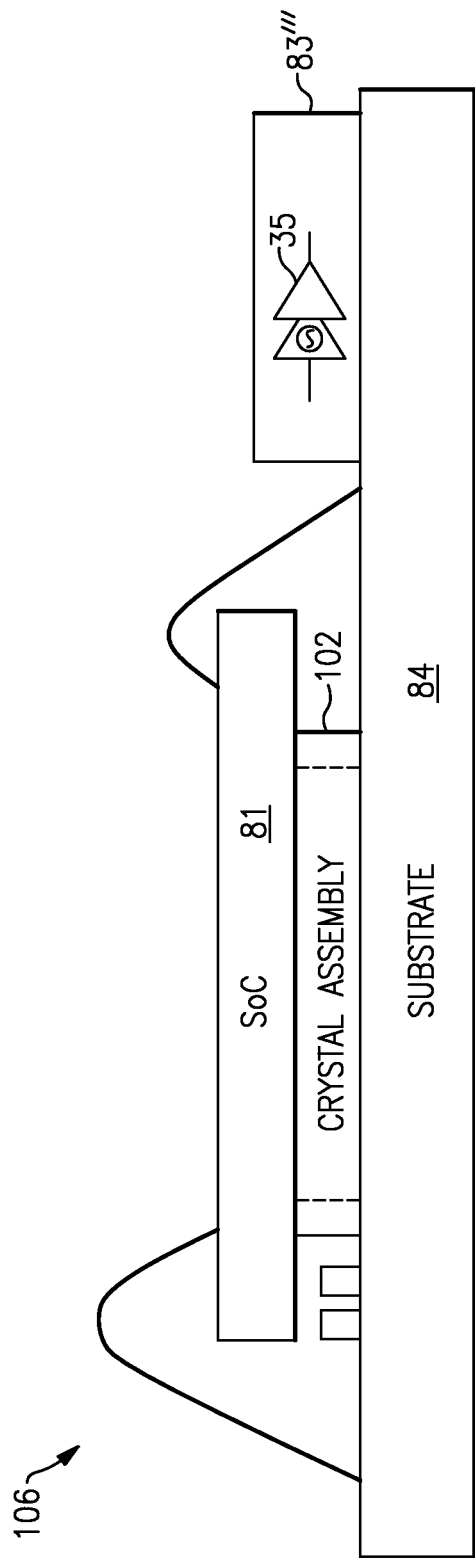
FIG. 24 is a cross section of a packaged module that includes an integrated circuit, a crystal assembly under the integrated circuit, and an other integrated circuit that includes a power amplifier with an injection-locked oscillator driver stage according to an embodiment.

FIG. 24 is a cross section of a packaged module 106 that includes an integrated circuit 81, a crystal assembly 102 under the integrated circuit 81, and an other integrated circuit 83''' that includes a power amplifier 35 with an injection-locked oscillator driver stage according to an embodiment. The packaged module 106 includes a package substrate 84, a first integrated circuit 81 supported by the package substrate 84, and a crystal assembly 102 supported by the package substrate 84 and disposed between the first integrated circuit 81 and the package substrate 84. The packaged module 106 also includes a second integrated circuit 83''' supported by the package substrate 84. The second integrated circuit 83''' is not necessarily drawn to scale. The package substrate 84 can include one or more suitable features discussed in Section VIII. The first integrated circuit 81 can include one or more suitable features discussed in Section VIII. The crystal assembly 102 can include one or more suitable features discussed in Section VIII. The second integrated circuit 83''' includes a power amplifier 35 with an injection-locked oscillator driver stage. The power amplifier 35 is an example of the power amplifier 5 discussed above. The power amplifier 35 can include any suitable combination of features discussed in Section IV.

FIG. 25 is a cross section of a packaged module 108 that includes an integrated circuit 81, a crystal assembly 102 under the integrated circuit 81, and an other integrated circuit 83'''' that includes an overstress protection circuit 97 according to an embodiment. The packaged module 108 includes a package substrate 84, a first integrated circuit 81 supported by the package substrate 84, and a crystal assembly 102 supported by the package substrate 84 and disposed between the first integrated circuit 81 and the package substrate 84. The packaged module 108 also includes a second integrated circuit 83'''' supported by the package substrate 84. The second integrated circuit 83'''' is not necessarily drawn to scale. The package substrate 84 can include one or more suitable features discussed in Section VIII. The first integrated circuit 81 can include one or more suitable features discussed in Section VIII. The crystal assembly 102 can include one or more suitable features discussed in Section VIII. The second integrated circuit 83'''' includes an overstress protection circuit 97. The second integrated circuit 83'''' can also include a pad and an internal circuit electrically connected to a signal node. In an embodiment, the overstress protection circuit 97 includes an overstress sensing circuit electrically connected between the pad and a first supply node, an impedance element electrically connected between the pad and the signal node, and a controllable clamp electrically connected between the signal node and the first supply node. The overstress sensing circuit is configured to activate the controllable clamp in response to detecting an electrical overstress event at the pad. The overstress protection circuit 97 can include any suitable combination of features discussed in Section V.

Packaged modules can include a stacked filter assembly. The stacked filter assembly can be arranged so as to reduce a footprint and/or physical size of a packaged module. A stacked filter assembly can include passive components packaged as surface mount devices (e.g., one or more capacitors, one or more inductors, and/or one or more resistors) and arranged as a stack. Some example packaged modules with a stacked filter assembly will be described with reference to FIGS. 26 to 30.

Figure 26:
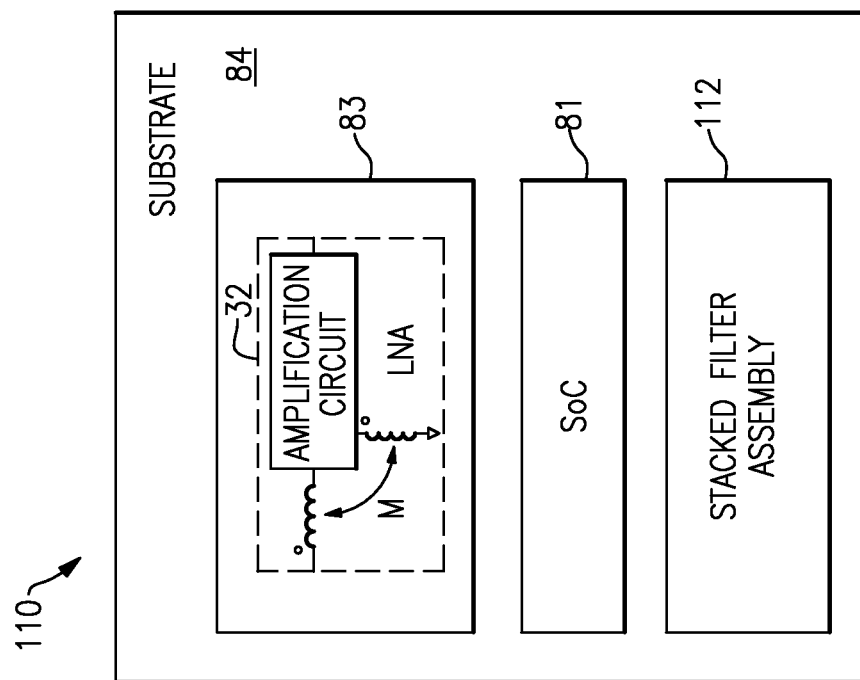
FIG. 26 is a block diagram of a packaged module that includes a stacked filter assembly and a low noise amplifier with magnetically coupled inductors according to an embodiment.

FIG. 26 is a block diagram of a packaged module 110 that includes a stacked filter assembly 112 and a low noise amplifier 32 with magnetically coupled inductors according to an embodiment. The packaged module 110 includes a package substrate 84, a front end integrated circuit 83 supported by the package substrate 84, and a stacked filter assembly 112 supported by the package substrate 84. The stacked filter assembly 112 can filter a signal associated with the front end integrated circuit 83. The packaged module 110 also includes an other integrated circuit 81 supported by the package substrate 84. The package substrate 84 can include one or more suitable features discussed in Section VIII. The other integrated circuit 81 can include one or more suitable features discussed in Section VIII. The stacked filter assembly 112 can include one or more suitable features discussed in Section VIII. The front end integrated circuit 83 can include any suitable front end circuitry discussed herein. As illustrated, the front end integrated circuit 83 includes a low noise amplifier 32 that includes a first inductor, an amplification circuit, and a second inductor magnetically coupled to the first inductor to provide negative feedback to linearize the low noise amplifier 32. The low noise amplifier 32 is an example of the low noise amplifier 6 discussed above. The low noise amplifier 32 can include any suitable combination of features discussed in Section I.

Figure 27:
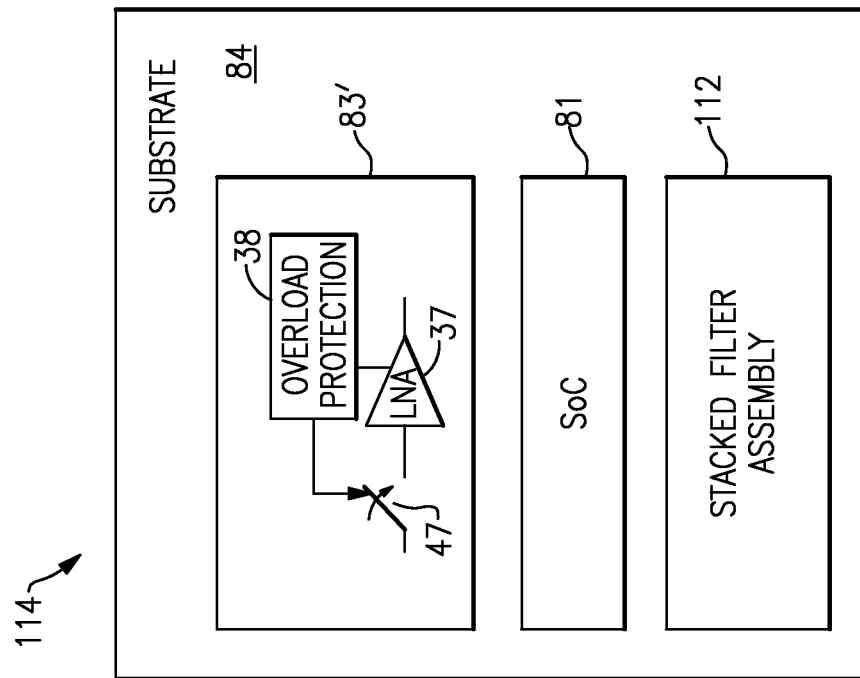
FIG. 27 is a block diagram of a packaged module that includes a stacked filter assembly and a low noise amplifier and an overload protection circuit according to an embodiment.

FIG. 27 is a block diagram of a packaged module 114 that includes a stacked filter assembly 112 and a low noise amplifier 37 and an overload protection circuit 38 according to an embodiment. The packaged module 114 includes a package substrate 84, a front end integrated circuit 83' supported by the package substrate 84, and a stacked filter assembly 112 supported by the package substrate 84. The stacked filter assembly 112 can filter a signal associated with the front end integrated circuit 83'. The packaged module 110 also includes an other integrated circuit 81 supported by the package substrate 84. The package substrate 84 can include one or more suitable features discussed in Section VIII. The other integrated circuit 81 can include one or more suitable features discussed in Section VIII. The stacked filter assembly 112 can include one or more suitable features discussed in Section VIII. As illustrated, the front end integrated circuit 83' includes an antenna-side switch 47, a low noise amplifier 37 including an input electrically coupled to the antenna-side switch 47, and an overload protection circuit 38 configured to adjust an impedance of the antenna-side switch 47 based on a signal level of the low noise amplifier 37. The low noise amplifier 37 is an example of the low noise amplifier 6 discussed above. The antenna-side switch 47 is an example of the antenna-side switch 2 discussed above. The low noise amplifier 37 and/or the overload protection circuit 38 and/or the antenna-side switch 47 can include any suitable combination of features discussed in Section II.

Figure 28:
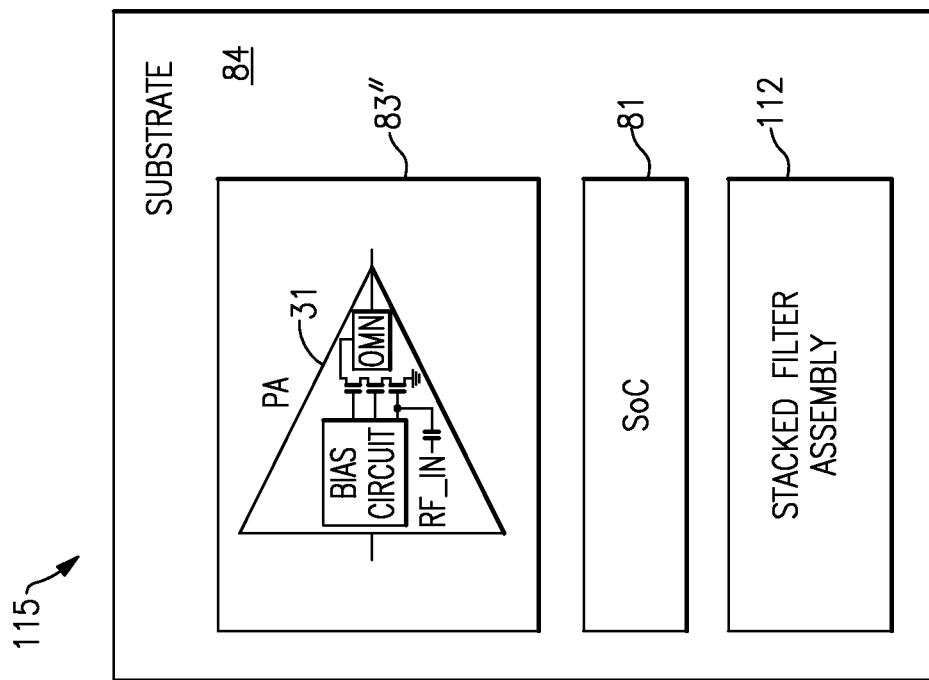
FIG. 28 is a block diagram of a packaged module that includes a stacked filter assembly and a multi-mode power amplifier according to an embodiment.

FIG. 28 is a block diagram of a packaged module 115 that includes a stacked filter assembly 112 and a multi-mode power amplifier 31 according to an embodiment. The packaged module 115 includes a package substrate 84, a front end integrated circuit 83" supported by the package substrate 84, and a stacked filter assembly 112 supported by the package substrate 84. The stacked filter assembly 112 can filter a signal associated with the front end integrated circuit

83''. The packaged module 115 also includes an other integrated circuit 81 supported by the package substrate 84. The package substrate 84 can include one or more suitable features discussed in Section VIII. The other integrated circuit 81 can include one or more suitable features discussed in Section VIII. The stacked filter assembly 112 can include one or more suitable features discussed in Section VIII. The front end integrated circuit 83''' includes a multi-mode power amplifier 31 that includes a stacked output stage including a transistor stack of two or more transistors. The multi-mode power amplifier 31 also includes a bias circuit configured to control a bias of at least one transistor of the transistor stack based on a mode of the multi-mode power amplifier. The multi-mode power amplifier 31 is an example of the power amplifier 5 discussed above. The multi-mode power amplifier 31 can include any suitable combination of features discussed in Section III.

Figure 29:
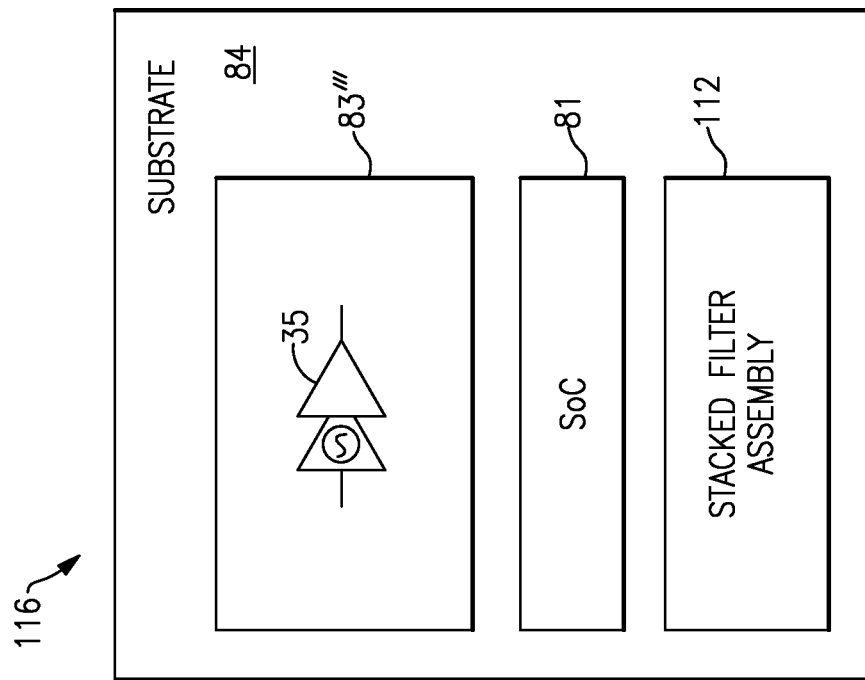
FIG. 29 is a block diagram of a packaged module that includes a stacked filter assembly and a power amplifier with an injection-locked oscillator driver stage according to an embodiment.

FIG. 29 is a block diagram of a packaged module 116 that includes a stacked filter assembly 112 and a power amplifier 35 with an injection-locked oscillator driver stage according to an embodiment. The packaged module 116 includes a package substrate 84, a front end integrated circuit 83''' supported by the package substrate 84, and a stacked filter assembly 112 supported by the package substrate 84. The stacked filter assembly 112 can filter a signal associated with the front end integrated circuit 83'''. The packaged module 116 also includes an other integrated circuit 81 supported by the package substrate 84. The package substrate 84 can include one or more suitable features discussed in Section VIII. The other integrated circuit 81 can include one or more suitable features discussed in Section VIII. The stacked filter assembly 112 can include one or more suitable features discussed in Section VIII. The front end integrated circuit 83''' includes a power amplifier 35 with an injection-locked oscillator driver stage. The power amplifier 35 is an example of the power amplifier 5 discussed above. The power amplifier 35 can include any suitable combination of features discussed in Section IV.

Figure 30:
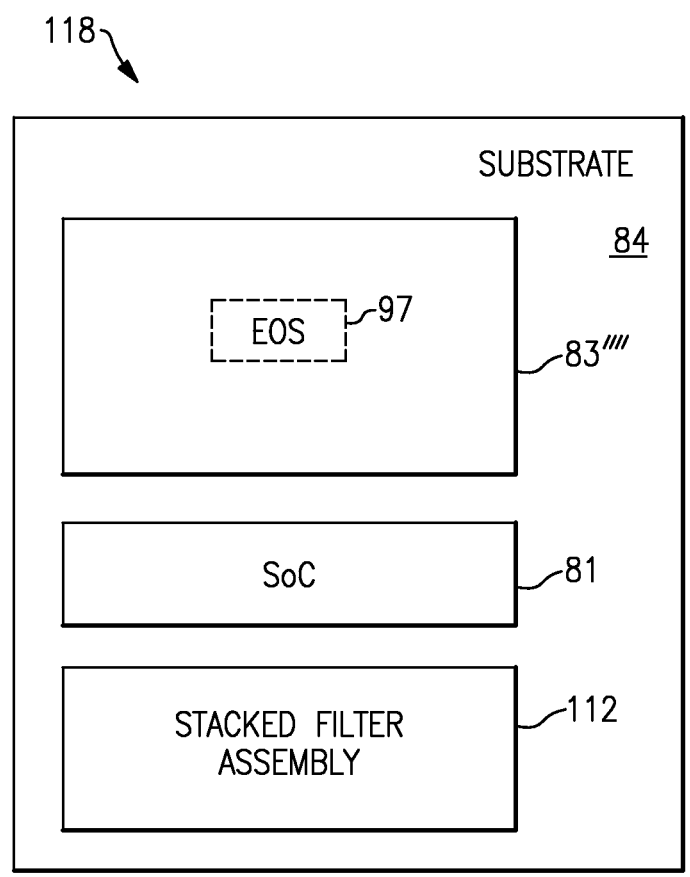
FIG. 30 is a block diagram of a packaged module that includes a stacked filter assembly an overstress protection circuit according to an embodiment.

FIG. 30 is a block diagram of a packaged module 118 that includes a stacked filter assembly 112 and an overstress protection circuit 97 according to an embodiment. The packaged module 118 includes a package substrate 84, a front end integrated circuit 83'''' supported by the package substrate 84, and a stacked filter assembly 112 supported by the package substrate 84. The stacked filter assembly 112 can filter a signal associated with the front end integrated circuit 83''''. The packaged module 118 also includes an other integrated circuit 81 supported by the package substrate 84. The package substrate 84 can include one or more suitable features discussed in Section VIII. The other integrated circuit 81 can include one or more suitable features discussed in Section VIII. The stacked filter assembly 112 can include one or more suitable features discussed in Section VIII. The front end integrated circuit 83'''' includes an overstress protection circuit 97. The front end integrated circuit 83'''' can also include a pad and an internal circuit electrically connected to a signal node. In an embodiment, the overstress protection circuit 97 includes an overstress sensing circuit electrically connected between the pad and a first supply node, an impedance element electrically connected between the pad and the signal node, and a controllable clamp electrically connected between the signal node and the first supply node. The overstress sensing circuit is configured to activate the controllable clamp in response to detecting an electrical overstress event at the pad. The overstress protection circuit 97 can include any suitable combination of features discussed in Section V.

Internet of Things Applications

One example application of the front end systems herein is to enable various objects with wireless connectivity, such as for Internet of things (IoT). IoT refers to a network of objects or things, such as devices, vehicles, and/or other items that are embedded with electronics that enable the objects to collect and exchange data (for instance, machine-to-machine communications) and/or to be remotely sensed and/or controlled. The front end systems herein can be used to enable wireless connectivity of various objects, thereby allowing such objects to communicate in an IoT network. The front end systems discussed herein can be implemented in IoT applications to enable wireless connectivity to expand the way consumers manage information and their environment. Such front end systems can enable the new and emerging IoT applications, which can bring people and things closer to vital information wherever it is desired. Although IoT is one example application of front end systems herein, the teachings herein are applicable to a wide range of technologies and applications. Some example IoT applications will now be discussed.

IoT devices can be implemented in automotive systems. From telematics to infotainment systems, lighting, remote keyless entry, collision avoidance platforms, toll transponders, video displays, vehicle tracking tools, and the like, front end systems in accordance with any suitable principles and advantages discussed herein can help enable convenience and safety features for the connected vehicle.

IoT devices can be implemented in connected home environments. Front end systems in accordance with any suitable principles and advantages discussed herein can allow homeowners greater control over their home environment. IoT devices can be implemented in a host of devices including smart thermostats, security systems, sensors, light switches, smoke and carbon monoxide alarms, routers, high definition televisions, gaming consoles and much more.

IoT devices can be implemented in industrial contexts. From smart city applications to factory automation, building controls, commercial aircraft, vehicle tracking, smart metering, LED lighting, security cameras, and smart agriculture functions, front ends systems in accordance with any suitable principles and advantages discussed herein can enable these applications and meet specifications.

IoT devices can be implemented in machine-to-machine contexts. IoT devices can enable machine-to-machine communications that can transform the way organizations do business. From manufacturing automation to telemetry, remote control devices, and asset management, front end systems discussed herein can provide cellular, short-range, and global positioning solutions that support a wide range of machine-to-machine applications.

IoT devices can be implemented in medical applications. Front end systems in accordance with any suitable principles and advantages discussed herein can enable medical devices and the communication of information that is improving the care of millions of people worldwide. Front end systems in accordance with any suitable principles and advantages discussed herein can be integrated into product designs that enable the miniaturization of medical devices and enhance data transmission. Amplifiers, such as power amplifiers and low noise amplifiers, in accordance with any suitable principles and advantages discussed herein can be implemented in medical instruments.

IoT devices can be implemented in mobile devices. The communication landscape has changed in recent years as consumers increasingly seek to be connected everywhere and all the time. Front end systems in accordance with any suitable principles and advantages discussed herein can be compact, energy and cost efficient, meeting size and performance constraints, while enabling a great consumer experience. Wireless mobile devices, such as smartphones, tablets and WLAN systems, can include a front end system in accordance with any suitable principles and advantages discussed herein.

IoT devices can be implemented in smart energy applications. Utility companies are modernizing their systems using computer-based remote control and automation that involves two-way communication. Some benefits to utilities and consumers include optimized energy efficiency, leveling and load balancing on the smart grid. Front end systems in accordance with any suitable principles and advantages discussed herein can be implemented in smart meters, smart thermostats, in-home displays, ZigBee/802.15.4, Bluetooth, and Bluetooth low energy applications.

IoT devices can be implemented in wearable devices. Wearable devices, such as smartwatches, smart eyewear, fitness trackers and health monitors, can include front end systems in accordance with any suitable principles and advantages discussed herein to enable relatively small form factor solutions that consume relatively low power and enable always on connectivity. This can allow applications to run in the background for lengthy periods of time without a battery recharge, for example.

Any suitable principles and advantages discussed herein can implemented in an IoT network, IoT object, a vehicle, industrial equipment, a corresponding front end system, a corresponding circuit board, the like, or any suitable combination thereof. Some examples will now be discussed.

Figure 31:
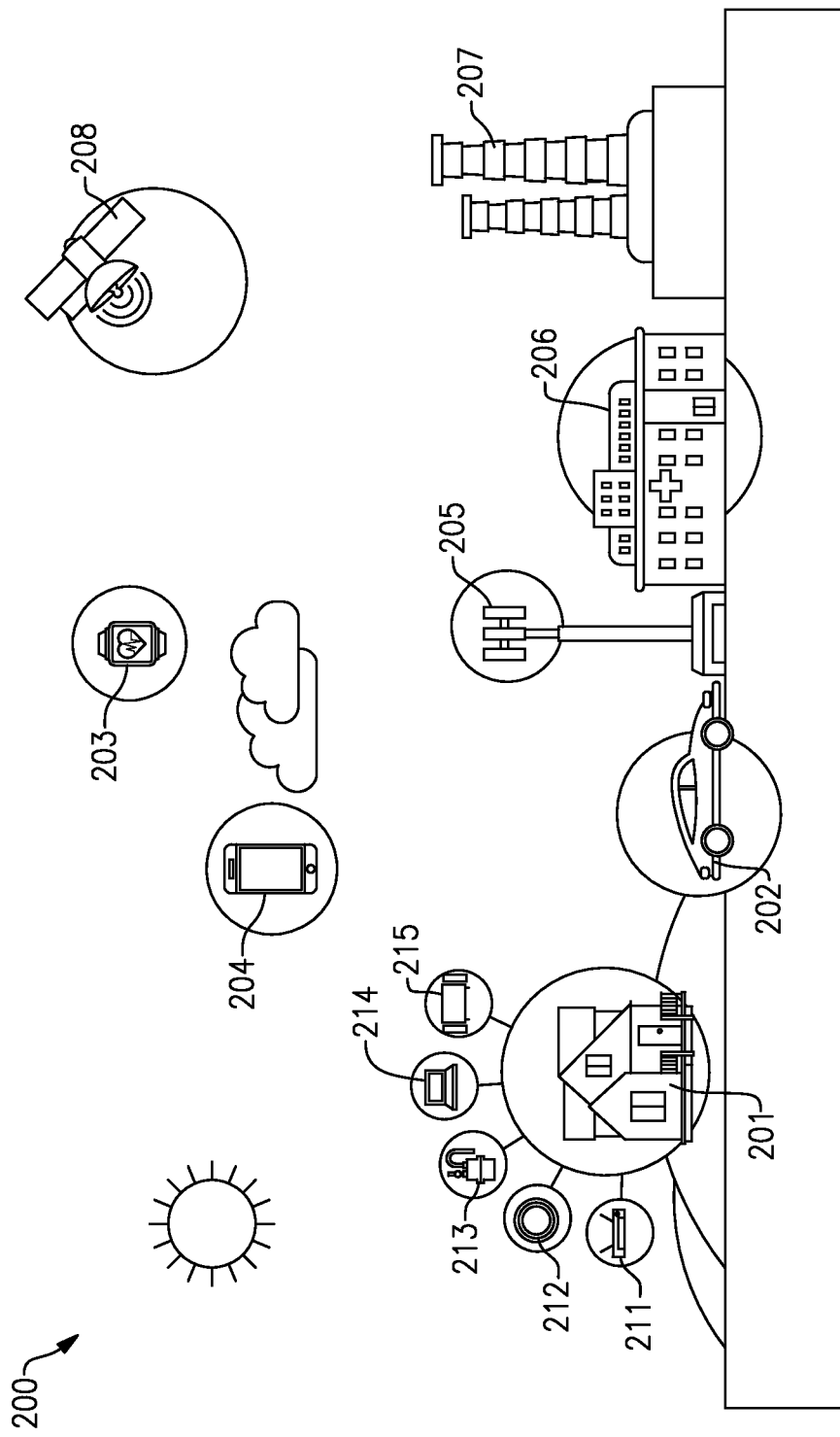
FIG. 31 is a schematic diagram of one example of an Internet of things (IoT) network.

FIG. 31 is a schematic diagram of one example of an IoT network 200. The IoT network 200 includes a smart home 201, a smart vehicle 202, a wearable 203, a mobile device 204, a base station 205, a smart hospital 206, a smart factory 207, and a smart satellite 208. One or more of the IoT-enabled objects of FIG. 31 can include a front end system, such as a front end module and/or front-end integrated circuit, implemented in accordance with the teachings herein.

The smart home 201 is depicted as including a wide variety of IoT-enabled objects, including an IoT-enabled router 211, an IoT-enabled thermostat 212, an IoT-enabled meter 213, IoT-enabled laptop 214, and an IoT-enabled television 215. Although various examples of IoT-enable objects for a smart home are shown, a smart home can include a wide variety of IoT-enabled objects. Examples of such IoT-enabled objects include, but are not limited to, an IoT-enabled computer, an IoT-enabled laptop, an IoT-enabled tablet, an IoT-enabled computer monitor, an IoT-enabled television, an IoT-enabled media system, an IoT-enabled gaming system, an IoT-enabled camcorder, an IoT-enabled camera, an IoT-enabled modem, an IoT-enabled router, an IoT-enabled kitchen appliance, an IoT-enabled telephone, an IoT-enabled air conditioner, an IoT-enabled washer, an IoT-enabled dryer, an IoT-enabled copier, an IoT-enabled facsimile machine, an IoT-enabled scanner, an IoT-enabled printer, an IoT-enabled scale, an IoT-enabled home assistant (for instance, a voice-controlled assistant device), an IoT-enabled security system, an IoT-enabled thermostat, an IoT-enabled smoke detector, an IoT-enabled garage door, an IoT-enabled lock, an IoT-enabled sprinkler, an IoT-enabled water heater, and/or an IoT-enabled light.

As shown in FIG. 31, the smart vehicle 202 also operates in the IoT network 200. The smart vehicle 202 can include a wide variety of IoT-enabled objects, including, but not limited to, an IoT-enabled infotainment system, an IoT-enabled lighting system, an IoT-enabled temperature control system, an IoT-enabled lock, an IoT-enabled ignition, an IoT-enabled collision avoidance system, an IoT-enabled toll transponder, and/or an IoT-enabled vehicle tracking system. In certain implementations, the smart vehicle 202 can communicate with other smart vehicles to thereby provide vehicle-to-vehicle (V2V) communications. Furthermore, in certain implementations the smart vehicle 202 can operate using vehicle-to-everything (V2X) communications, thereby communicating with traffic lights, toll gates, and/or other IoT-enabled objects.

The wearable 203 of FIG. 31 is also IoT-enabled. Examples of IoT-enabled wearables include, but are not limited to, an IoT-enabled watch, an IoT-enabled eyewear, an IoT-enabled fitness tracker, and/or an IoT-enabled biometric device.

The IoT network 200 also includes the mobile device 204 and base station 205. Thus, in certain implementations user equipment (UE) and/or base stations of a cellular network can operate in an IoT network and be IoT-enabled. Furthermore, a wide variety of IoT-enabled objects can communication using existing network infrastructure, such as cellular infrastructure.

With continuing reference to FIG. 31, IoT is not only applicable to consumer devices and objects, but also to other applications, such as medical, commercial, industrial, aerospace, and/or defense applications. For example, the smart hospital 206 can include a wide variety of IoT-enabled medical equipment and/or the smart factory 207 can include a wide variety of IoT-enabled industrial equipment. Furthermore, airplanes, satellites, and/or aerospace equipment can also be connected to an IoT network. Other examples of IoT applications include, but are not limited to, asset tracking, fleet management, digital signage, smart vending, environmental monitoring, city infrastructure (for instance, smart street lighting), toll collection, and/or point-of-sale.

Although various examples of IoT-enabled objects are illustrated in FIG. 31, an IoT network can include a wide variety of types of objects. Furthermore, any number of such objects can be present in an IoT network. For instance, an IoT network can include millions or billions of IoT-enable objects or things.

IoT-enabled objects can communicate using a wide variety of communication technologies, including, but not limited to, Bluetooth, ZigBee, Z-Wave, 6LowPAN, Thread, Wi-Fi, NFC, Sigfox, Neul, and/or LoRaWAN technologies. Furthermore, certain IoT-enabled objects can communicate using cellular infrastructure, for instance, using 2G, 3G, 4G (including LTE, LTE-Advanced, and/or LTE-Advanced Pro), and/or 5G technologies.

Figure 32A:
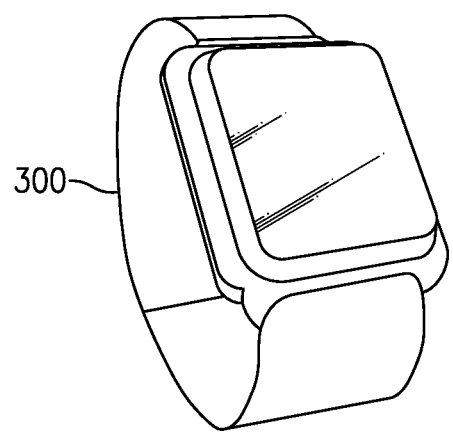
FIG. 32A is a schematic diagram of one example of an IoT-enabled watch.

FIG. 32A is a schematic diagram of one example of an IoT-enabled watch 300. The IoT-enabled watch 300 illustrates one example of a smart wearable that can include a front end system implemented in accordance with one or more features disclosed herein.

Figure 32B:
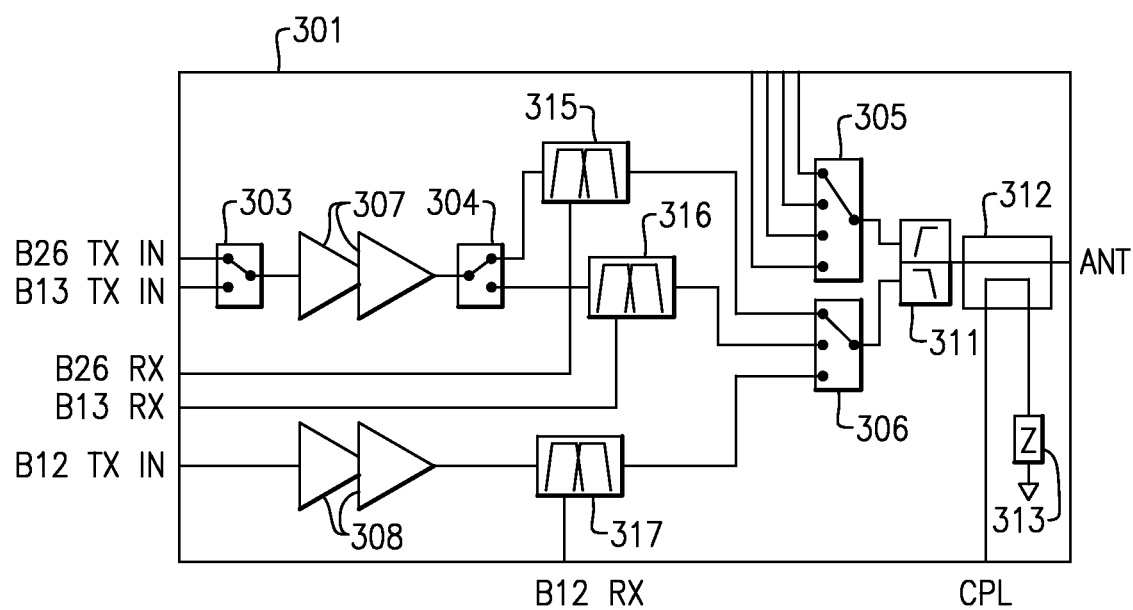
FIG. 32B is a schematic diagram of one example of a front end system for an IoT-enabled object.

FIG. 32B is a schematic diagram of one example of a front end system 301 for an IoT-enabled object, such as the IoT-enabled watch 300 of FIG. 32A. The front end system 301 includes a first transceiver-side switch 303, a second transceiver-side switch 304, a first antenna-side switch 305, a second antenna-side switch 306, a first power amplifier 307, a second power amplifier 308, a duplexer 311, a directional coupler 312, a termination impedance 313, a first band selection filter 315, a second band selection filter 316, and a third band selection filter 317.

In the illustrated embodiment, the first transceiver-side switch 303 selects between a Band 26 transmit input pin (B26 TX IN) and a Band 13 transmit input pin (B13 TX IN). The second transceiver-side switch 303 controls connection of the output of the first power amplifier 307 to the first band selection filter 315 or the first band selection filter 316. Thus, the first power amplifier 307 selectively amplifies Band 26 or Band 13, in this example. Additionally, the second power amplifier 308 amplifies a Band 12 transmit input pin (B12 TX IN). After suitable filtering by the band selection filters 315-317, the second antenna-side switch 306 selects a desired transmit signal for providing to an antenna pin (ANT) via the duplexer 311 and the directional coupler 312. As shown in FIG. 32B, the directional coupler 312 is terminated by the termination impedance 313. Additionally, the first antenna-side switch 305 provides a signal received on the antenna pin (ANT) to a desired receive output pin (four in this example) of the front end system 301. The illustrated front end system 301 also includes various additional pins to provide additional functionality, such as enhanced monitoring of transmit power. For instance, front end system 301 includes a directional coupler output pin (CPL), and feedback pins (B12 RX, B13 RX, and B26 RX) for providing feedback signals associated with transmit signals (for Band 12, Band 13, and Band 26, respectively) generated by the power amplifiers.

The front end system 301 can incorporate one or more features described in the sections herein.

Figure 33A:
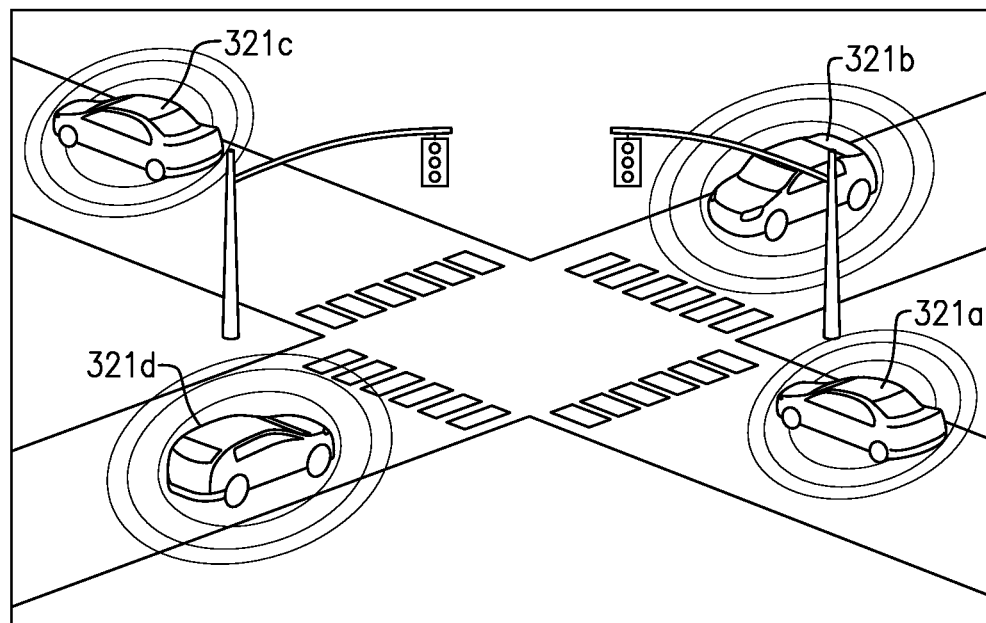
FIG. 33A is a schematic diagram of one example of IoT-enabled vehicles.

FIG. 33A is a schematic diagram of one example of IoT-enabled vehicles 321a-321d. Each of the IoT-enabled vehicles 321a-321d includes a front end system for enabling wireless vehicle-to-vehicle communications. The IoT-enabled vehicles 321a-321d can include a front end system implemented in accordance with one or more features disclosed herein.

Figure 33B:
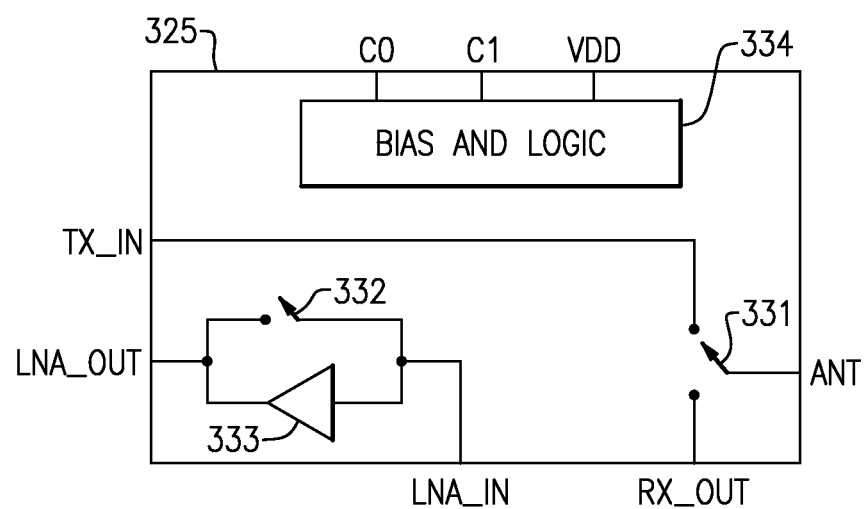
FIG. 33B is a schematic diagram of another example of a front end system for an IoT-enabled object.

FIG. 33B is a schematic diagram of another example of a front end system 325 for an IoT-enabled object. The front end system 325 includes an antenna-side switch 331, a bypass switch 332, an LNA 333, and a bias and logic circuit 334.

The front end system 325 includes control pins (C0 and C1) for controlling the front end system 325 and a supply voltage pin (VDD) for powering the front end system 325. The antenna-side switch 331 selectively connects an antenna pin (ANT) to a transmit signal pin (TX_IN) or a receive signal pin (RX_OUT). The LNA 333 includes an input connected to an LNA input pin (LNA_IN) and an output connected to the LNA output pin (LNA_OUT). The LNA 333 is selectively bypassed by the bypass switch 332. Using external conductors and components, the LNA input pin (LNA_IN) can be connected to the receive signal pin (RX_OUT) either directly or indirectly (for instance, via a filter or other components). Furthermore, an external power amplifier can provide a transmit signal to the transmit signal pin (TX_IN).

The front end system 325 can incorporate one or more features described in the sections herein.

Figure 34A:
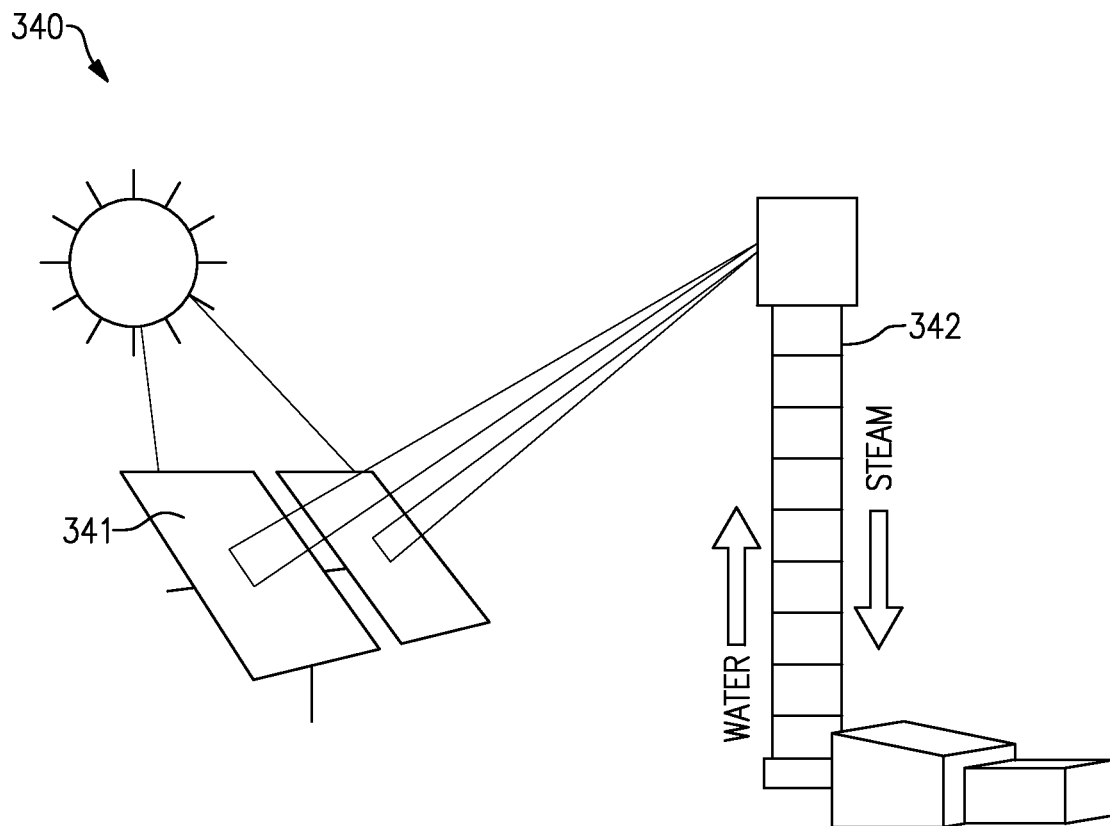
FIG. 34A is a schematic diagram of one example of IoT-enabled industrial equipment.

FIG. 34A is a schematic diagram of one example of IoT-enabled industrial equipment 340. In the illustrated embodiment, the IoT-enabled industrial equipment 340 includes heliostats 341 for reflecting light to a solar receiver and turbine 342. The IoT-enabled industrial equipment 340 can include one or more front end systems for a variety of purposes, such as providing angular positional control of the heliostats 341 to control concentration of solar energy directed toward the solar receiver and turbine 342. The IoT-enabled industrial equipment 340 can include a front end system implemented in accordance with one or more features disclosed herein.

Figure 34B:
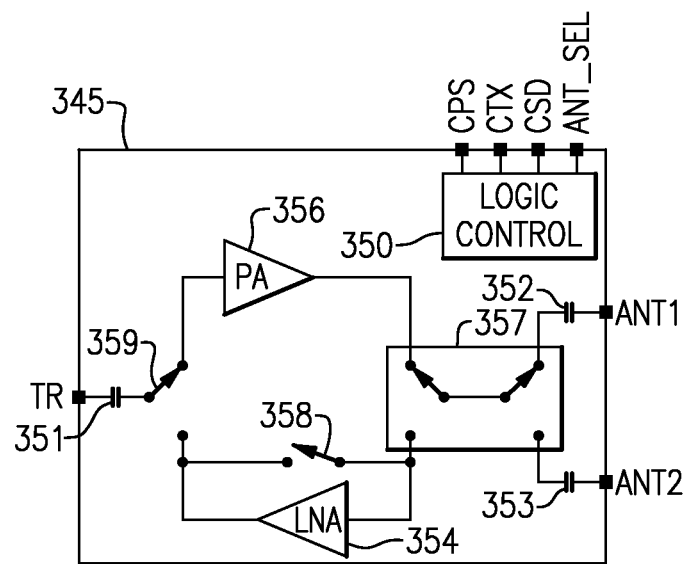
FIG. 34B is a schematic diagram of another example of a front end system for an IoT-enabled object.

FIG. 34B is a schematic diagram of another example of a front end system 345 for an IoT-enabled object, such as the IoT-enabled industrial equipment 340 of FIG. 34A.

The front end system 345 includes a logic control circuit 350, a transceiver DC blocking capacitor 351, a first antenna DC blocking capacitor 352, a second antenna DC blocking capacitor 353, an LNA 354, a power amplifier 356, an antenna-side switch 357, a bypass switch 358, and a transceiver-side switch 359.

The front end system 345 includes control pins (CPS, CTX, CSD, ANT_SEL) for controlling the front end system 345. The antenna-side switch 357 selectively connects either a first antenna pin (ANT1) or a second antenna pin (ANT2) to either an output of the power amplifier 356 or the bypass switch 358/input to the LNA 354. Additionally, the bypass switch 358 selectively bypasses the LNA 354. Furthermore, the transceiver-side switch 359 selectively connected the transceiver pin (TR) to either an input of the power amplifier 356 or the bypass switch 358/output to the LNA 354. The DC blocking capacitors 351-353 serve to provide DC blocking to provide enhanced flexibility in controlling internal DC biasing of the front end system 345.

The front end system 345 can incorporate one or more features described in the sections herein.

Figure 35A:
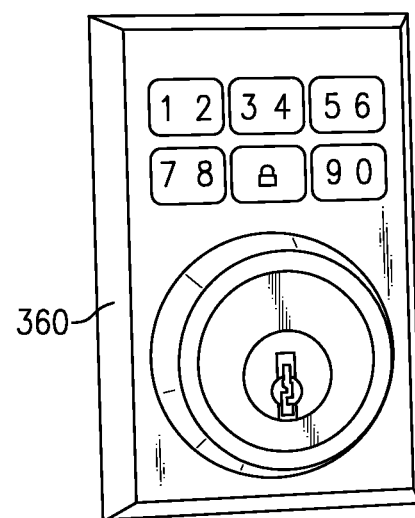
FIG. 35A is a schematic diagram of one example of an IoT-enabled lock.

FIG. 35A is a schematic diagram of one example of an IoT-enabled lock 360. The IoT-enabled lock 360 illustrates one example of an IoT-enabled object that can include a front end system implemented in accordance with one or more features disclosed herein.

Figure 35B:
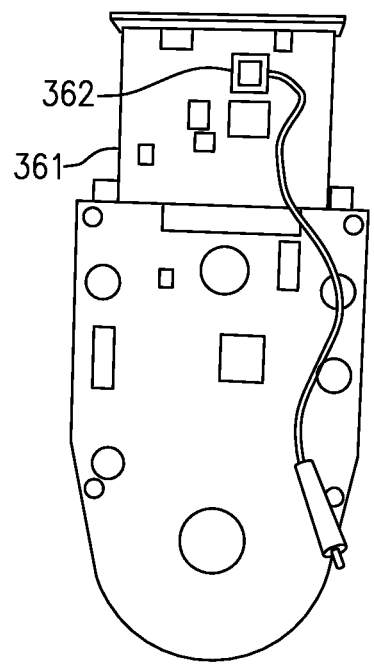
FIG. 35B is a schematic diagram of one example of a circuit board for the IoT-enabled lock of FIG. 35A.

FIG. 35B is a schematic diagram of one example of a circuit board 361 for the IoT-enabled lock 360 of FIG. 35A. The circuit board 361 includes a front end system 362, which can incorporate one or more features described in the sections herein.

Figure 36A:
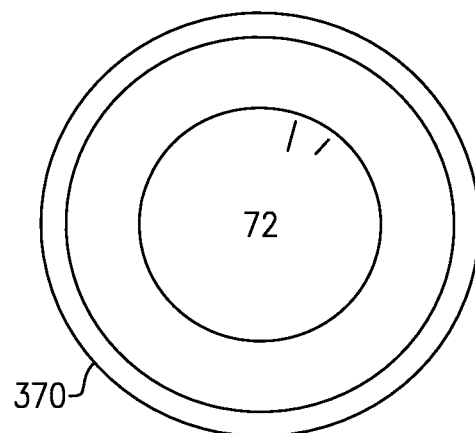
FIG. 36A is a schematic diagram of one example of an IoT-enabled thermostat.

FIG. 36A is a schematic diagram of one example of IoT-enabled thermostat 370. The IoT-enabled thermostat 370 illustrates another example of an IoT-enabled object that can include a front end system implemented in accordance with one or more features disclosed herein.

Figure 36B:
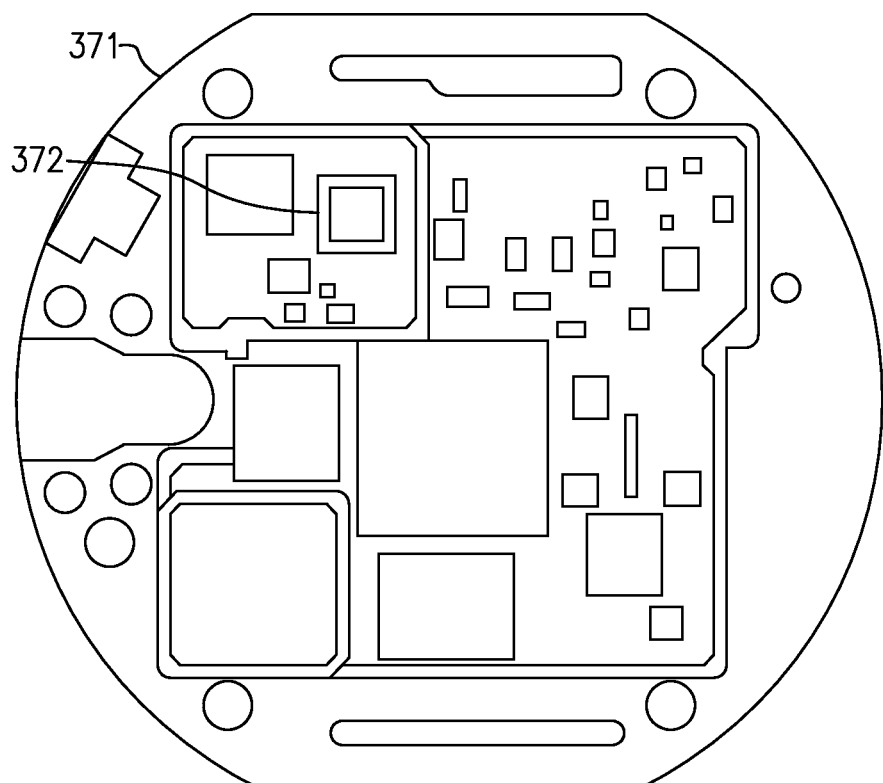
FIG. 36B is a schematic diagram of one example of a circuit board for the IoT-enabled thermostat of FIG. 36A.

FIG. 36B is a schematic diagram of one example of a circuit board 371 for the IoT-enabled thermostat 370 of FIG. 36A. The circuit board 371 includes a front end system 372, which can incorporate one or more features described in the sections herein.

Figure 37A:
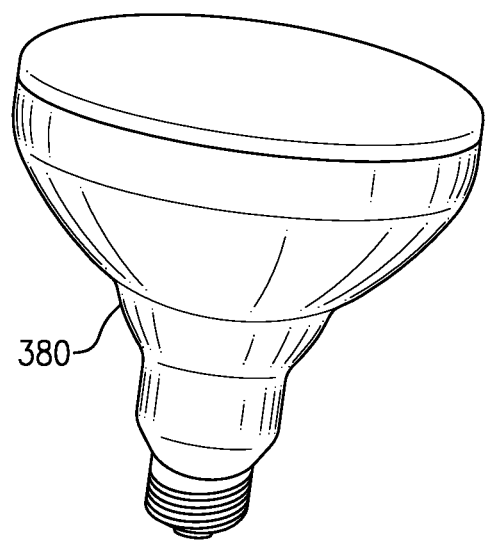
FIG. 37A is a schematic diagram of one example of IoT-enabled light.

FIG. 37A is a schematic diagram of one example of IoT-enabled light 380.

The IoT-enabled light 380 illustrates another example of an IoT-enabled object that can include a front end system implemented in accordance with one or more features disclosed herein.

Figure 37B:
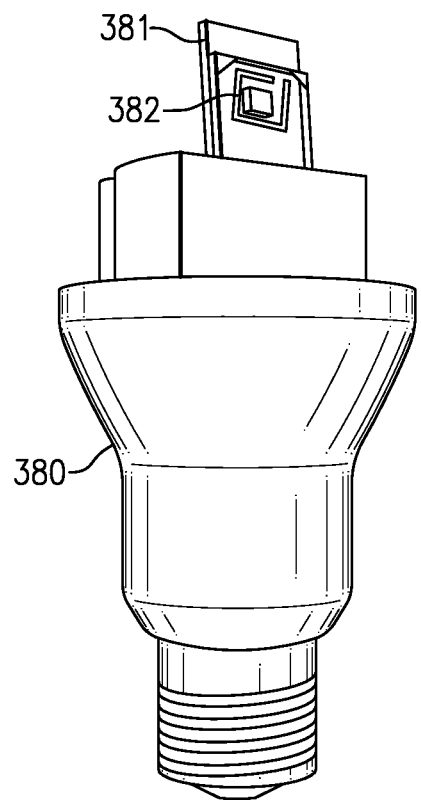
FIG. 37B is a schematic diagram of one example of a circuit board for the IoT-enabled light of FIG. 37A.

FIG. 37B is a schematic diagram of one example of a circuit board 381 for the IoT-enabled light 380 of FIG. 37A. FIG. 37B also depicts a base portion of the IoT-enabled light 380 for housing the circuit board 381. The circuit board 381 includes a front end system 382, which can incorporate one or more features described in the sections herein.

Radio Frequency Systems

FIGS. 38A-38F illustrates various schematic block diagrams of examples of radio frequency systems that include a front end system, such as a front end module or front end integrated circuit. The radio frequency systems of FIGS. 38A-38F can incorporate one or more features described in the sections herein. In certain implementations, a radio frequency system, such as any of the radio frequency systems of FIGS. 38A-38F, is implemented on a circuit board (for instance, a printed circuit board (PCB)) of a wireless communication device, such as a mobile phone, a tablet, a base station, a network access point, customer-premises equipment (CPE), an IoT-enabled object, a laptop, and/or a wearable electronic device.

Figure 38A:
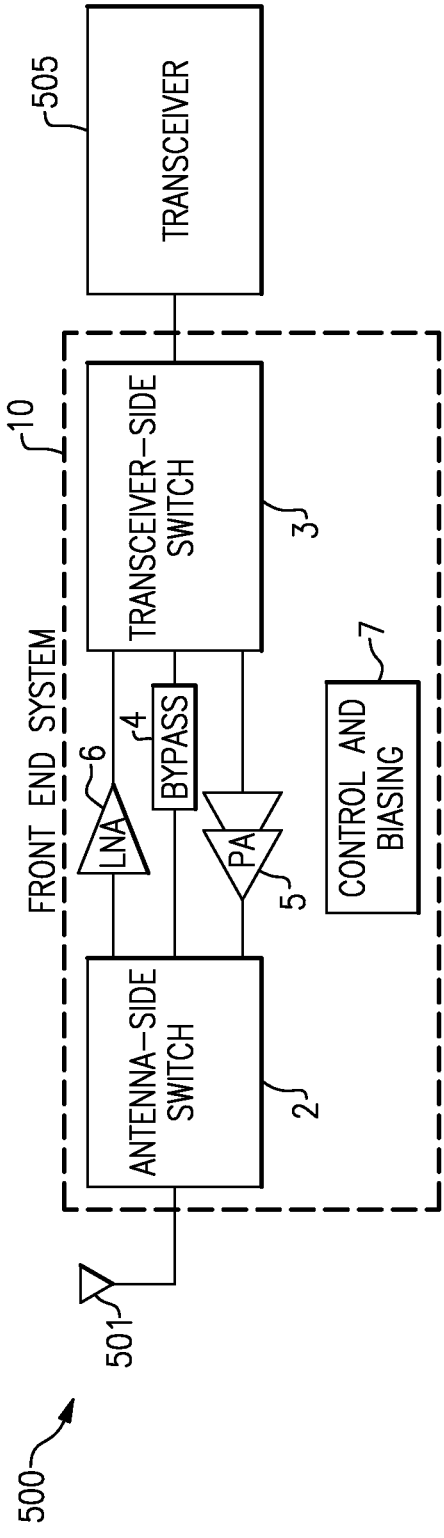
FIG. 38A illustrates a schematic block diagram of one example of a radio frequency system.

FIG. 38A illustrates a schematic block diagram of one example of a radio frequency system 500. The radio frequency system 500 includes an antenna 501, a front end system 10, and a transceiver 505. As was discussed above, the front end system 10 can incorporate one or more features described in the sections herein.

The antenna 501 operates to wirelessly transmit RF signals received via the antenna-side switch 2. The RF transmit signals can include RF signals generated by the power amplifier 5 and/or RF signals sent via the bypass circuit 4. The antenna 501 also operates to wirelessly receive RF signals, which can be provided to the LNA 6 and/or the bypass circuit 4 via the antenna-side switch 2. Although an example where a common antenna is used for transmitting and receiving signals, the teachings herein are also applicable to implementations using separate antennas for transmission and reception. Example implementations of the antenna 501 include, but are not limited to, a patch antenna, a dipole antenna, a ceramic resonator, a stamped metal antenna, a laser direct structuring antenna, and/or a multi-layered antenna.

The transceiver 505 operates to provide RF signals to the transceiver-side switch 3 for transmission and/or to receive RF signals from the transceiver-side switch 3. The transceiver 505 can communicate using a wide variety communication technologies, including, but not limited to, one or more of 2G, 3G, 4G (including LTE, LTE-Advanced, and/or LTE-Advanced Pro), 5G, WLAN (for instance, Wi-Fi), WPAN (for instance, Bluetooth and/or ZigBee), WMAN (for instance, WiMAX), and/or GPS technologies.

Figure 38B:
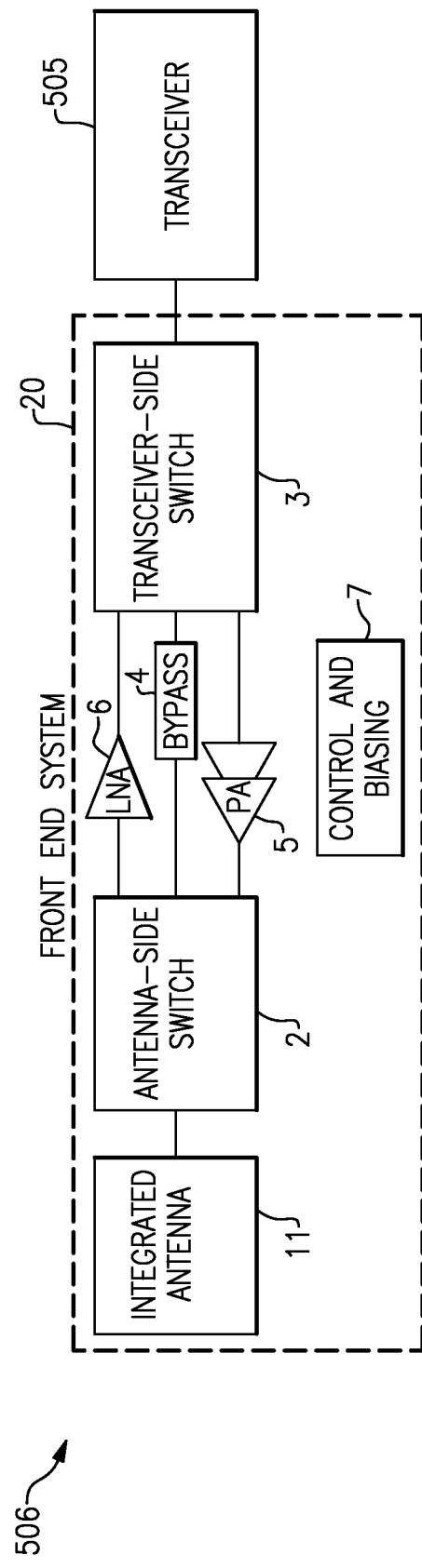
FIG. 38B illustrates a schematic block diagram of another example of a radio frequency system.

FIG. 38B illustrates a schematic block diagram of another example of a radio frequency system 506. The radio frequency system 506 includes a front end system 20 and a transceiver 505. As was discussed above, the front end system 20 can incorporate one or more features described in the sections herein.

Figure 38C:
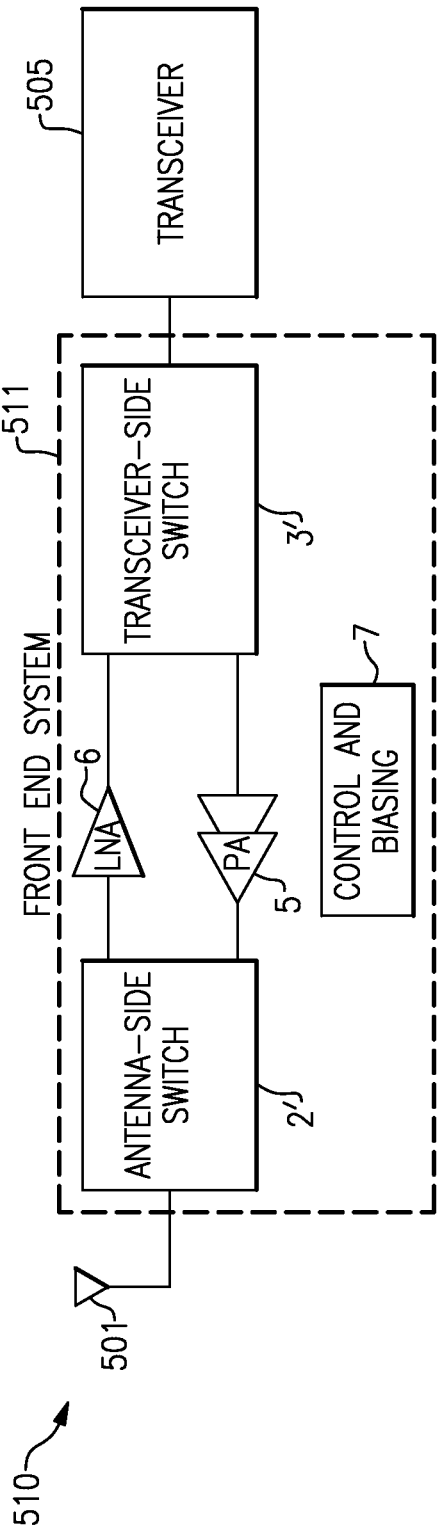
FIG. 38C illustrates a schematic block diagram of another example of a radio frequency system.

FIG. 38C illustrates a schematic block diagram of another example of a radio frequency system 510. The radio frequency system 510 includes an antenna 501, a front end system 511, and a transceiver 505. The front end system 511 of FIG. 38C is similar to the front end system 10 of FIG. 38A, except that the bypass path including the bypass circuit 4 has been omitted and the antenna-side switch 2' and the transceiver-side switch 3' include one less throw. Thus, the antenna-side switch 2' is configured to selectively electrically connect the antenna 501 to either an input to the LNA 6 or an output of the power amplifier 5. Additionally, the transceiver-side switch 3' is configured to selectively electrically connect the transceiver 505 to either an output to the LNA 6 or an input of the power amplifier 5.

Figure 38D:
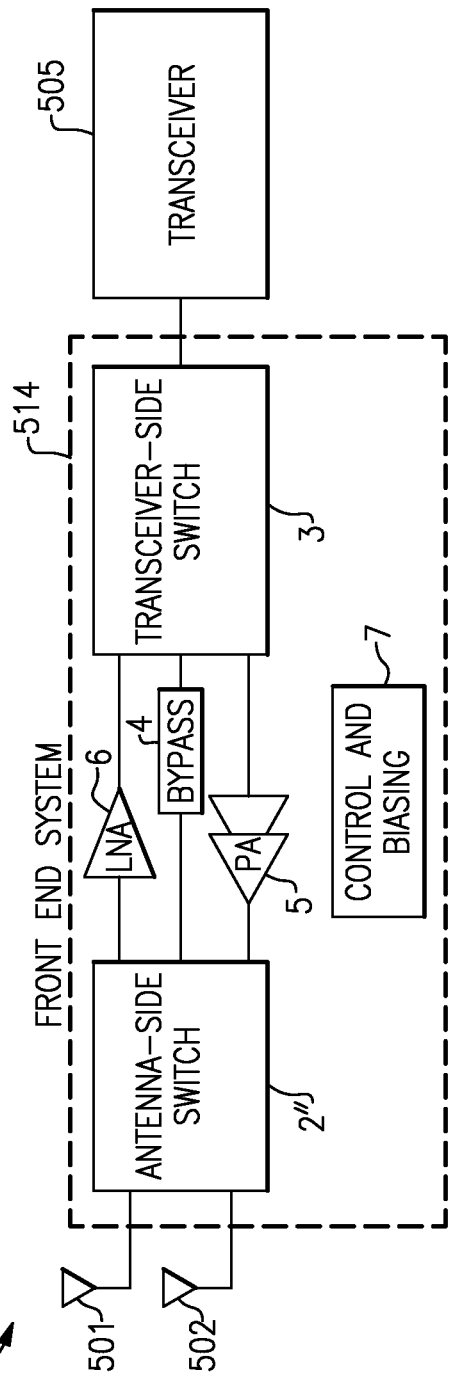
FIG. 38D illustrates a schematic block diagram of another example of a radio frequency system.

FIG. 38D illustrates a schematic block diagram of another example of a radio frequency system 512. The radio frequency system 512 includes a first antenna 501, a second antenna 502, a front end system 514, and a transceiver 505. The front end system 514 of FIG. 38D is similar to the front end system 10 of FIG. 38A, except that the antenna-side switch 2" includes an additional throw to provide connectivity to an additional antenna. Thus, the bypass circuit 4, the power amplifier 5, and/or the LNA 6 can be selectively electrically connected to the first antenna 501 and/or the second antenna 502. Although an example of a radio frequency system with two antennas is shown, a radio frequency system can include more or fewer antennas.

Multiple antennas can be included in a radio frequency system for a wide variety of reasons. In one example, the first antenna 501 and the second antenna 502 correspond to a transmit antenna and a receive antenna, respectively. In a second example, the first antenna 501 and the second antenna 502 are used for transmitting and/or receiving signals associated with different frequency ranges (for instance, different bands). In a third example, the first antenna 501 and the second antenna 502 support diversity communications, such as multiple-input multiple-output (MIMO) communications and/or switched diversity communications. In a fourth example, the first antenna 501 and the second antenna 502 support beamforming of transmit and/or receive signal beams.

FIG. 38E illustrates a schematic block diagram of another example of a radio frequency system 520. The radio frequency system 520 includes an antenna 501, a front end system 524, and a transceiver 505. The front end system 524 of FIG. 38E is similar to the front end system 10 of FIG. 38A, except that the transmit path including the power amplifier 5 has been omitted and the antenna-side switch 2' and the transceiver-side switch 3' include one less throw. Thus, the antenna-side switch 2' is configured to selectively electrically connect the antenna 501 to either an input to the LNA 6 or the bypass circuit 4. Additionally, the transceiver-side switch 3' is configured to selectively electrically connect the transceiver 505 to either an output to the LNA 6 or the bypass circuit 4.

FIG. 38F illustrates a schematic block diagram of another example of a radio frequency system 530. The radio frequency system 530 includes a power amplifier 5, an antenna 501, a front end system 534, and a transceiver 505. The front end system 534 of FIG. 38F is similar to the front end system 10 of FIG. 38A, except that the power amplifier 5 has been omitted and the front end system 534 includes input/output ports for coupling to throws of the antenna-side switch 2 and transceiver-side switch 3. A power amplifier 5 external to the front end system 534 can be electrically connected between these input/output ports such that the power amplifier 5 is included in the transmit signal path between the antenna-side switch 2 and transceiver-side switch 3. The power amplifier 5 can be included in a different packaged module and/or embodied on a different die than the illustrated elements of the front end system 534.

Wireless Communication Devices

Figure 39A:
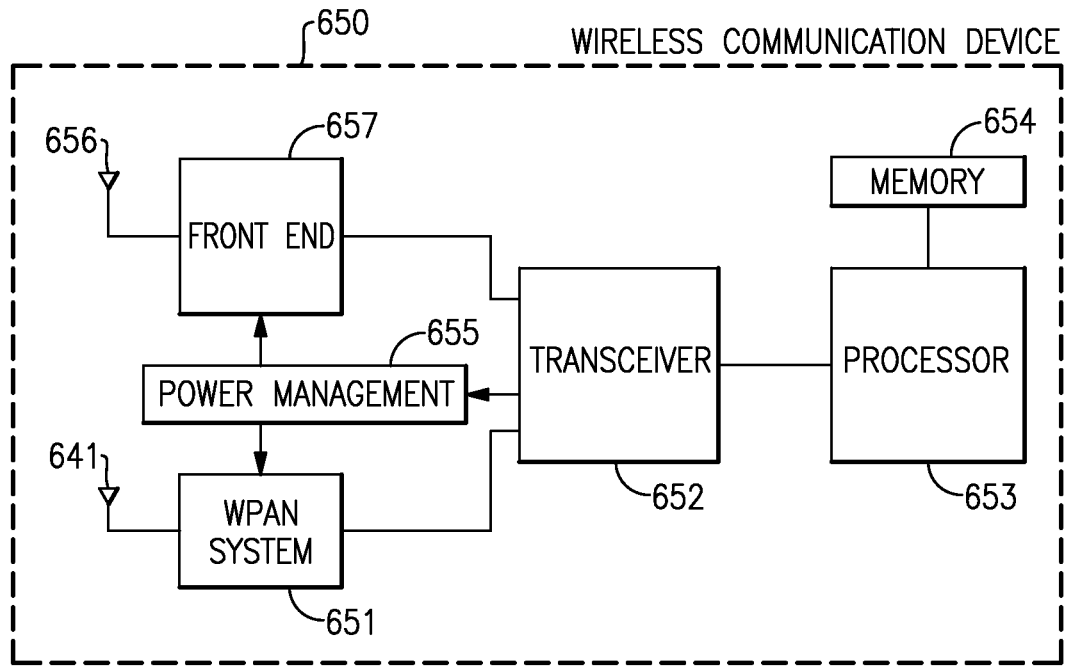
FIG. 39A is a schematic diagram of one example of a wireless communication device.

FIG. 39A is a schematic diagram of one example of a wireless communication device 650. The wireless communication device 650 includes a first antenna 641, a wireless personal area network (WPAN) system 651, a transceiver 652, a processor 653, a memory 654, a power management block 655, a second antenna 656, and a front end system 657.

Any of the suitable combination of features disclosed herein can be implemented in the wireless communication device 650. For example, the WPAN system 651 and/or the front end system 657 can be implemented using any of the features described above and/or in the sections below.

The WPAN system 651 is a front end system configured for processing radio frequency signals associated with personal area networks (PANs). The WPAN system 651 can be configured to transmit and receive signals associated with one or more WPAN communication standards, such as signals associated with one or more of Bluetooth, ZigBee, Z-Wave, Wireless USB, INSTEON, IrDA, or Body Area Network. In another embodiment, a wireless communication device can include a wireless local area network (WLAN)

system in place of the illustrated WPAN system, and the WLAN system can process Wi-Fi signals.

Figure 39B:
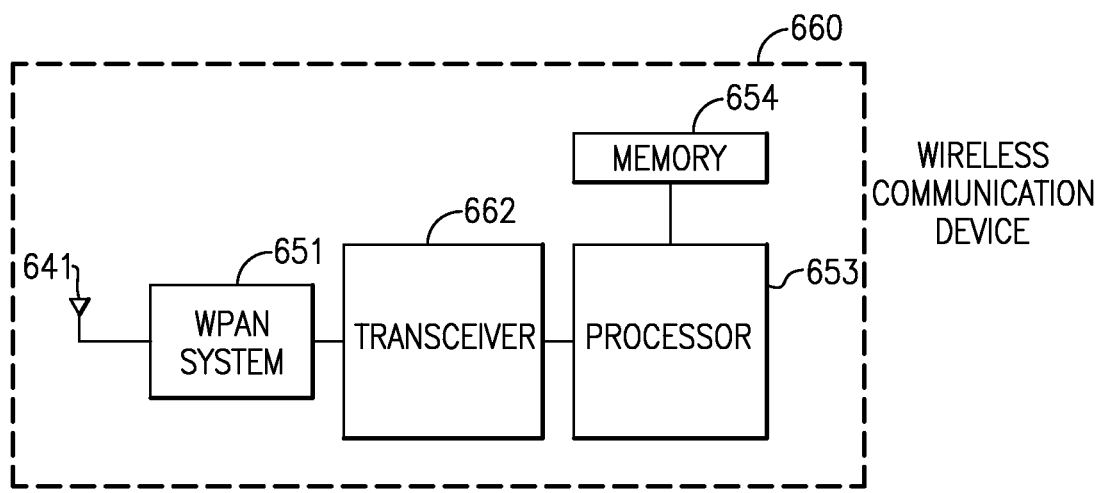
FIG. 39B is a schematic diagram of another example of a wireless communication device.

FIG. 39B is a schematic diagram of another example of a wireless communication device 660. The illustrated wireless communication device 660 of FIG. 39B is a device configured to communicate over a PAN. This wireless communication device 660 can be relatively less complex than the wireless communication device 650 of FIG. 39A. As illustrated, the wireless communication device 660 includes an antenna 641, a WPAN system 651, a transceiver 662, a processor 653, and a memory 654. The WPAN system 660 can include any suitable combination of features disclosed herein. For example, the WPAN system 651 can be implemented using any of the features described above and/or in the sections below.

Figure 39C:
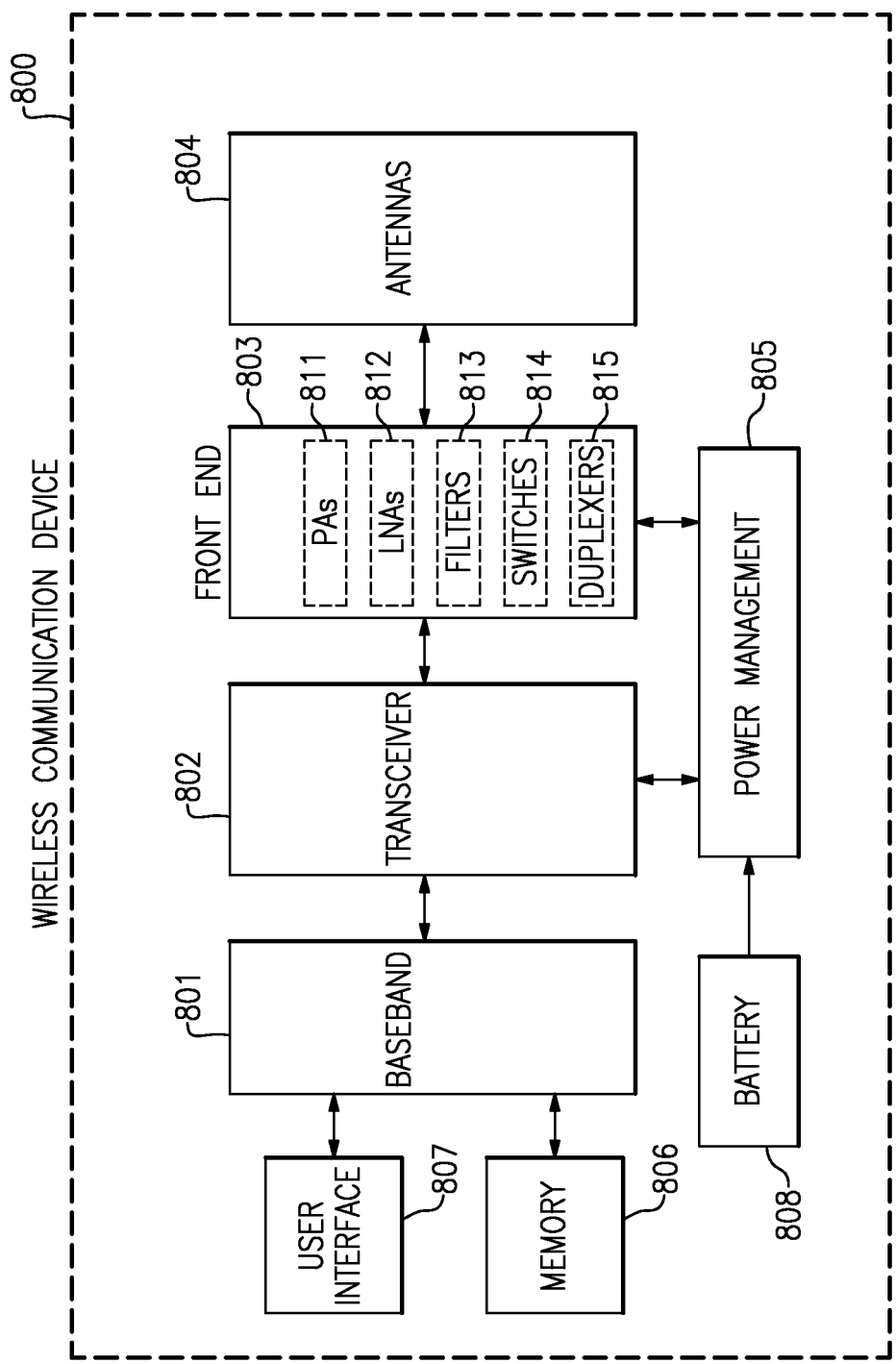
FIG. 39C is a schematic diagram of another example of a wireless communication device.

FIG. 39C is a schematic diagram of another example of a wireless communication device 800. The wireless communication device 800 includes a baseband system 801, a transceiver 802, a front-end system 803, one or more antennas 804, a power management system 805, a memory 806, a user interface 807, and a battery 808.

The wireless communication device 800 can be used communicate using a wide variety of communications technologies, including, but not limited to, 2G, 3G, 4G (including LTE, LTE-Advanced, and LTE-Advanced Pro), 5G, WLAN (for instance, Wi-Fi), WPAN (for instance, Bluetooth and ZigBee), WMAN (for instance, WiMAX), and/or GPS technologies.

The transceiver 802 generates RF signals for transmission and processes incoming RF signals received from the antennas 804. It will be understood that various functionalities associated with the transmission and receiving of RF signals can be achieved by one or more components that are collectively represented in FIG. 39C as the transceiver 802. In one example, separate components (for instance, separate circuits or dies) can be provided for handling certain types of RF signals.

The front-end system 803 aids in conditioning signals transmitted to and/or received from the antennas 804. In the illustrated embodiment, the front-end system 803 includes one or more power amplifiers (PAs) 811, one or more low noise amplifiers (LNAs) 812, one or more filters 813, one or more switches 814, and one or more duplexers 815. However, other implementations are possible.

For example, the front-end system 803 can provide a number of functionalities, including, but not limited to, amplifying signals for transmission, amplifying received signals, filtering signals, switching between different bands, switching between different power modes, switching between transmission and receiving modes, duplexing of signals, multiplexing of signals (for instance, diplexing or triplexing), or some combination thereof.

Any of the suitable combination of features disclosed herein can be implemented in the wireless communication device 800. For example, the front end system 803 can be implemented using any of the features described above and/or in the sections below.

In certain implementations, the wireless communication device 800 supports carrier aggregation, thereby providing flexibility to increase peak data rates. Carrier aggregation can be used for both Frequency Division Duplexing (FDD) and Time Division Duplexing (TDD), and may be used to aggregate a plurality of carriers or channels. Carrier aggregation includes contiguous aggregation, in which contiguous carriers within the same operating frequency band are aggregated. Carrier aggregation can also be non-contiguous, and can include carriers separated in frequency within a common band or in different bands.

The antennas 804 can include antennas used for a wide variety of types of communications. For example, the antennas 804 can include antennas for transmitting and/or receiving signals associated with a wide variety of frequencies and communications standards.

In certain implementations, the antennas 804 support MIMO communications and/or switched diversity communications. For example, MIMO communications use multiple antennas for communicating multiple data streams over a single radio frequency channel. MIMO communications benefit from higher signal to noise ratio, improved coding, and/or reduced signal interference due to spatial multiplexing differences of the radio environment. Switched diversity refers to communications in which a particular antenna is selected for operation at a particular time. For example, a switch can be used to select a particular antenna from a group of antennas based on a variety of factors, such as an observed bit error rate and/or a signal strength indicator.

The wireless communication device 800 can operate with beamforming in certain implementations. For example, the front-end system 803 can include phase shifters having variable phase controlled by the transceiver 802. Additionally, the phase shifters are controlled to provide beam formation and directivity for transmission and/or reception of signals using the antennas 804. For example, in the context of signal transmission, the phases of the transmit signals provided to the antennas 804 are controlled such that radiated signals from the antennas 804 combine using constructive and destructive interference to generate an aggregate transmit signal exhibiting beam-like qualities with more signal strength propagating in a given direction. In the context of signal reception, the phases are controlled such that more signal energy is received when the signal is arriving to the antennas 804 from a particular direction. In certain implementations, the antennas 804 include one or more arrays of antenna elements to enhance beamforming.

The baseband system 801 is coupled to the user interface 807 to facilitate processing of various user input and output (I/O), such as voice and data. The baseband system 801 provides the transceiver 802 with digital representations of transmit signals, which the transceiver 802 processes to generate RF signals for transmission. The baseband system 801 also processes digital representations of received signals provided by the transceiver 802. As shown in FIG. 39C, the baseband system 801 is coupled to the memory 806 of facilitate operation of the wireless communication device 800.

The memory 806 can be used for a wide variety of purposes, such as storing data and/or instructions to facilitate the operation of the wireless communication device 800 and/or to provide storage of user information.

The power management system 805 provides a number of power management functions of the wireless communication device 800. In certain implementations, the power management system 805 includes a PA supply control circuit that controls the supply voltages of the power amplifiers 811. For example, the power management system 805 can be configured to change the supply voltage(s) provided to one or more of the power amplifiers 811 to improve efficiency, such as power added efficiency (PAE).

As shown in FIG. 39C, the power management system 805 receives a battery voltage from the battery 808. The battery 808 can be any suitable battery for use in the wireless communication device 800, including, for example, a lithium-ion battery.

Section I—Low Noise Amplifier with Impedance Transformation Circuit

In accordance with some embodiments of this disclosure, this section of the present disclosure relates to a low noise amplifier (LNA) with an impedance transformation circuit. The impedance transformation circuit includes magnetically coupled inductors to linearize the LNA. As indicated above, aspects of this section may be combined with other aspects of one or more other sections to further improve the performance of front end systems and related devices, integrated circuits, modules, and methods in which they are employed.

There are several performance parameters for any given low noise amplifier design to satisfy simultaneously. Supply current for a low noise amplifier is often pre-determined. In such circumstances, there are relatively few variables that can be manipulated to set the overall behavior of the circuit. This section provides one more controlling variable to set the overall performance of the circuit. In particular, linearity can be improved by implementing features of this section.

In an LNA, linearity can be a significant parameter. It can be desirable for an LNA to have a relatively high linearity. Linearity can be measured by a 1 dB compression point and/or a 3rd order intermodulation. Accordingly, a 1 dB compression point and/or a 3rd order intermodulation of an LNA can be significant. Specifications for LNAs and other circuits are specifying higher linearity with lower supply current. This trend is expected to continue. Such specifications can be challenging to meet while also meeting other performance specifications. Accordingly, there is a need for LNAs with improved linearity.

This section provides a new way to control the input match of an LNA, and in such a way the linearity of the LNA can be improved. For instance, using the principles and advantages discussed in this section, the 1 dB compression point and 3rd order intermodulation can be improved. This section provides circuits that can extend inductively degenerated amplifier concepts such that both self and mutual inductance effects can improve linearity of an LNA, instead of only self-inductive degeneration.

An LNA can include an inductively degenerated common source or common emitter amplifying device. The inductive degeneration can linearize such a circuit. In addition, the degeneration inductor can set the input impedance of the circuit in conjunction with the size and bias current of the amplifying device. A series input matching inductor at the input can be included to achieve a desired input impedance and obtain a relatively good input match.

Aspects of this disclosure relate to an LNA with magnetic coupling between a degeneration inductor (e.g., a source degeneration inductor or an emitter degeneration inductor) and a series input inductor. These magnetically coupled inductors can in effect provide a transformer, with a primary winding in series with the input and a secondary winding electrically connected where the degeneration inductor is electrically connected to the amplifying device (e.g., at the source of a field effect transistor amplifying device or at the emitter of a bipolar transistor amplifying device). The phase of the magnetic coupling can be significant. This phase is indicated by the dot notation in the accompanying drawings. With the magnetically coupled inductors disclosed herein, inductively degenerated amplifier concepts can be extended by using both self and mutual inductance.

In the LNAs discussed herein, several effects can occur at the same time. Typically, metal oxide semiconductor (MOS) LNAs have a voltage gain from the input of the circuit to a gate of the amplifying device. This voltage gain can degrade the 3rd order intermodulation (IIP3) performance of the circuit. An attenuator is typically not used to reduce signal amplitude because such an attenuator can undesirably degrade the noise performance of the circuit. The LNAs discussed herein can include a negative feedback circuit. An amplifying device of an LNA can receive a radio frequency (RF) signal by way of a first inductor that is magnetically coupled to a degeneration inductor. The first inductor can have a first end configured to receive the RF signal and a second end electrically coupled to the amplifying device. The impedance looking into a node at the first end of the first inductor (e.g., node n2 in FIGS. 41A to 41F) can be increased and the voltage at a node at the second end of the first inductor (e.g., node n3 in FIGS. 41A to 41F) can be decreased. This may not reduce the gain, but the effect can allow the circuit to be scaled differently, with a larger amplifying device. The higher input impedance can also allow the inductance of the input match inductor that provides the RF signal to the first inductor to have a lower value. This can be advantageous when an on chip match inductor is implemented, as the Q of such devices can be limited, and the effective series impedance of the input matching inductor can degrade the noise performance of the LNA. For instance, in one implementation, the input match inductor value is approximately half the value it would otherwise be without the magnetically coupled inductors. While the circuits discussed herein may not give the absolutely best possible noise match, the magnetically coupled inductors can allow the input match inductor to have a lower inductance and thereby recover at least some of the noise performance. The negative feedback provided by magnetically coupled inductors discussed herein can provide an amplifier with increased linearity.

One aspect of this disclosure is an impedance transformation circuit for use in an amplifier, such as a low noise amplifier. The impedance transformation circuit includes a matching circuit including a first inductor. The impedance transformation circuit also includes a second inductor. The first and second inductors are magnetically coupled to each other to provide negative feedback to linearize the amplifier.

The second inductor can be a degeneration inductor, such as a source degeneration inductor or an emitter degeneration inductor. The first inductor can provide a radio frequency signal to an amplification circuit of the amplifier. The first inductor, the second inductor, and the amplification circuit of amplifier can be embodied on a single die.

The matching circuit can further include a series inductor having a first end and a second end, in which the first end is configured to receive a radio frequency signal and the second end is electrically coupled to the first inductor. The matching circuit can further include a shunt capacitor electrically coupled to the first end of the series inductor and/or a direct current (DC) blocking capacitor configured to provide the radio frequency signal to the series inductor.

Another aspect of this disclosure is a low noise amplifier (LNA). The LNA includes a matching circuit including a first inductor, an amplification circuit configured to receive a radio frequency signal by way of the first inductor and to amplify the radio frequency signal, and a second inductor. The first and second inductors are magnetically coupled to each other to provide negative feedback to linearize the LNA.

The amplification circuit can include a common source amplifier or a common emitter amplifier. A cascode transistor can be arranged in series with either of these amplifiers. Such a cascode transistor can be a common drain amplifier or a common base amplifier. The second inductor can be a source degeneration inductor or an emitter degeneration inductor.

The first inductor, the second inductor, and the amplification circuit of amplifier are can be embodied on a single die. The matching circuit can further include a series inductor having a first end and a second end, in which the first end is configured to receive the radio frequency signal and the second end is electrically coupled to the first inductor. The matching circuit can further include a shunt capacitor electrically coupled to the first end of the series inductor and/or a direct current (DC) blocking capacitor configured to provide the radio frequency signal to the series inductor.

Another aspect of this disclosure is a front end system that includes a low noise amplifier, a bypass path, and a multi-throw switch. The low noise amplifier includes a matching circuit including a first inductor, an amplification circuit configured to receive a radio frequency signal by way of the first inductor and to amplify the radio frequency signal, and a second inductor magnetically coupled with the first inductor to provide negative feedback to linearize the amplification circuit. The multi-throw switch has at least a first throw electrically connected to the low noise amplifier and a second throw electrically connected to the bypass path.

The front end system can further include a power amplifier, such as any of the power amplifiers discussed herein. The multi-throw switch can have a third throw electrically coupled to the power amplifier. The low noise amplifier, the bypass path, the multi-throw switch, and the power amplifier can be embodied on a single die.

The front end system can further include a second multi-throw switch having at least a first throw electrically connected to the low noise amplifier and a second throw electrically connected to the bypass path, in which the low noise amplifier is included in a first signal path between the multi-throw switch and the second multi-throw switch, and in which the bypass path is included in a second signal path between the multi-throw switch and the second multi-throw switch.

The multi-throw switch can electrically connect an input of the low noise amplifier to an antenna in a first state, and the multi-throw switch can electrically connect the bypass path to the antenna in a second state. The front end system can further include the antenna. The antenna can be integrated with the low noise amplifier, the bypass path, and the multi-throw switch.

The low noise amplifier, the multi-throw switch, and the bypass path can be embodied on a single die. The front end system can include a package enclosing the low noise amplifier, the multi-throw switch, and the bypass path.

In the front end system, the LNA can include any suitable combination of features of the LNAs and/or amplifiers discussed herein.

FIGS. 40A to 40D illustrate example low noise amplifier that include impedance transformation circuits with magnetically coupled inductors arranged to linearize the low noise amplifiers. Any of these low noise amplifiers can be implemented in a receive path in an RF system. The low noise amplifiers can be implemented by any suitable process technology, such as silicon-on-insulator process technology. Any combination of features of the low noise amplifiers of FIGS. 40A to 40D can be implemented as suitable.

Figure 40A:
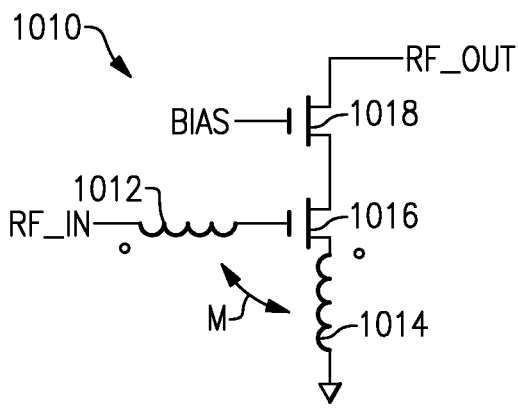
FIG. 40A is a schematic diagram of a low noise amplifier that includes field effect transistors and an impedance transformation circuit according to an embodiment.

FIG. 40A is a schematic diagram of a low noise amplifier (LNA) 1010 that includes an impedance transformation circuit according to an embodiment. As illustrated, the LNA 1010 includes an impedance transformation circuit and an amplification circuit. The illustrated impedance transformation circuit includes a first inductor 1012 and a second inductor 1014. The illustrated amplification circuit includes field effect transistors 1016 and 1018.

The second inductor 1014 illustrated in FIG. 40A is a source degeneration inductor that can provide self-inductive degeneration. The first inductor 1012 and the second inductor 1014 can together provide mutual inductance effects that can improve linearity of the LNA 1010. The first inductor 1012 and the second inductor 1014 can together function as a transformer, with a primary winding in series with a gate of the field effect transistor 1016 and a secondary winding electrically connected at the source of the field effect transistor 1016. As illustrated, the first inductor 1012 is magnetically coupled with the second inductor 1014. Accordingly, these inductors can provide negative feedback to linearize the LNA 1010. The dot notation in FIG. 40A indicates the phase of magnetic coupling between the first inductor 1012 and the second inductor 1014.

The amplification circuit illustrated in FIG. 40A includes a common source amplifier 1016 and a common gate amplifier 1018. An RF input signal RF_IN can be provided to the gate of the common source amplifier 1016 by way of the first inductor 1012. As illustrated, the common gate amplifier 1018 is arranged in series with the common source amplifier 1016. Accordingly, the common gate amplifier 1018 can be referred to as a cascode transistor or a cascode field effect transistor. A bias circuit can provide a bias signal BIAS to the gate of the common gate amplifier 1018. The common gate amplifier 1018 can provide an RF output signal RF_OUT.

Figure 40B:
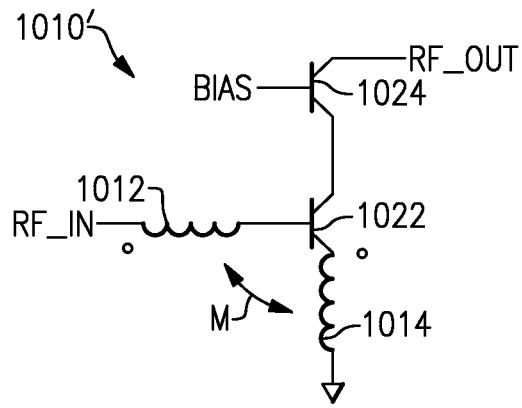
FIG. 40B is a schematic diagram of a low noise amplifier that includes bipolar transistors an impedance transformation circuit according to an embodiment.

FIG. 40B is a schematic diagram of a low noise amplifier 1010' that includes an impedance transformation circuit according to an embodiment. The low noise amplifier 1010' of FIG. 40B is similar to the low noise amplifier 1010 of FIG. 40A, except that the amplification circuit in FIG. 40B is implemented by bipolar transistors instead of field effect transistors. As illustrated in FIG. 40B, the amplification circuit includes bipolar transistors 1022 and 1024. The amplification circuit of FIG. 40B includes a common emitter amplifier 1022 in series with a common base amplifier 1024. The second inductor 1014 of FIG. 40B is an emitter degeneration inductor.

Figure 40C:
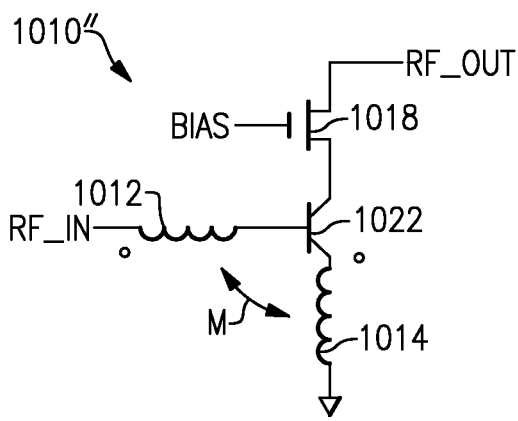
FIG. 40C is a schematic diagram of a low noise amplifier that includes a bipolar transistor, a field effect transistor, and an impedance transformation circuit according to an embodiment.

FIG. 40C is a schematic diagram of a low noise amplifier 1010" that includes an impedance transformation circuit according to an embodiment. An amplification circuit of an LNA can include a bipolar transistor and a field effect transistor. The bipolar transistor and the field effect transistor of such an LNA can be arranged in a stack. FIG. 40C illustrates an example of an LNA 1010" that includes a bipolar transistor and a field effect transistor arranged in a stack. As illustrated in FIG. 40C, the LNA 1010" includes a bipolar transistor 1022 arranged as a common emitter amplifier and a cascode filed effect transistor 1018 arranged as a common gate amplifier. Alternatively, a low noise amplifier can include a common source amplifier and a common base amplifier arranged in a stack.

Figure 40D:
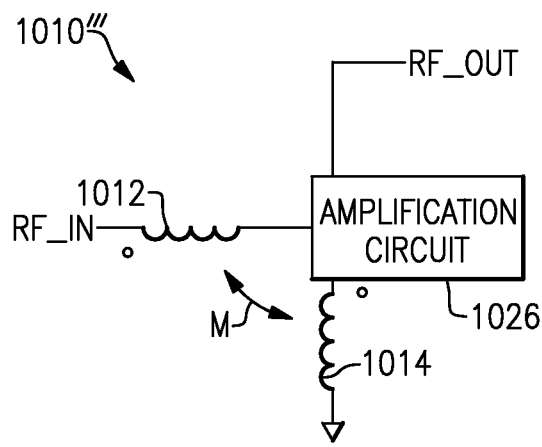
FIG. 40D is a schematic diagram of a low noise amplifier that includes an amplification circuit and an impedance transformation circuit according to an embodiment.

FIG. 40D is a schematic diagram of a low noise amplifier 1010''' that includes an impedance transformation circuit according to an embodiment. The amplification circuits shown in FIGS. 40A to 40C are example amplification circuits that can be implemented in connection with an impedance transformation circuit that includes magnetically coupled inductors that provide negative feedback to linearize an LNA. FIG. 40D shows that the first inductor 1012 and the second inductor 1014 can be implemented in connection with any suitable amplification circuit, as shown by amplification circuit 1026. The amplification circuit 1026 can be implemented by the amplification circuit of FIG. 40A, the amplification circuit of FIG. 40B, the amplification circuit of FIG. 40C, or any other suitable amplification circuit.

Figure 41A:
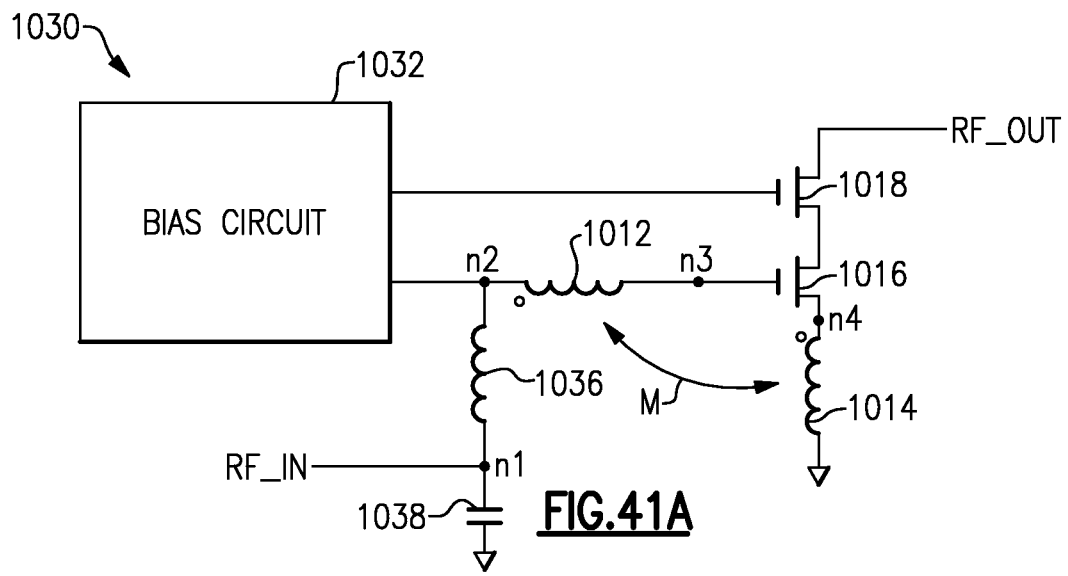
FIG. 41A is a schematic diagram of a low noise amplifier system according to an embodiment.
Figure 41B:
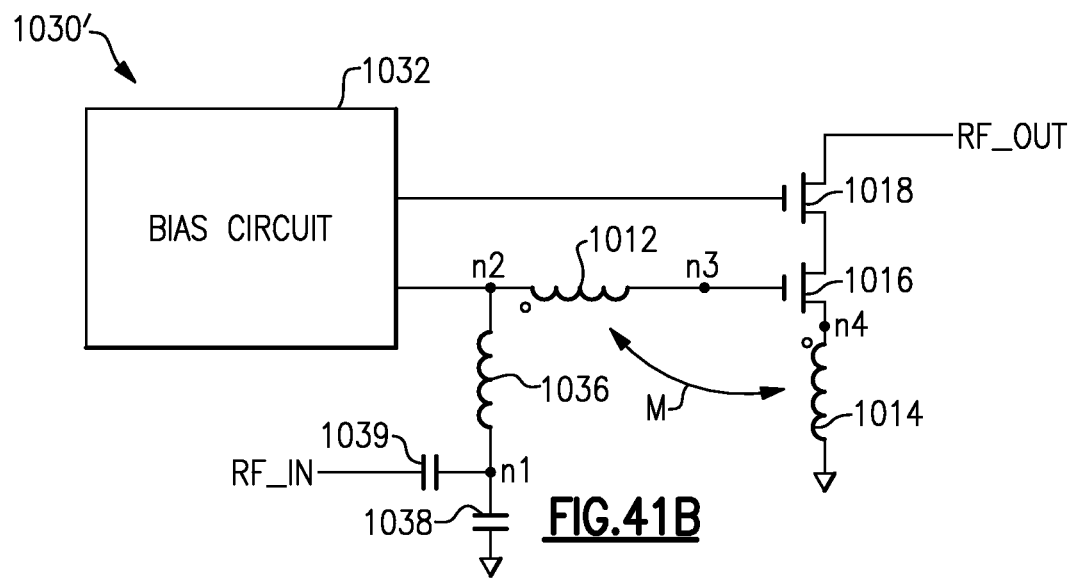
FIG. 41B is a schematic diagram of a low noise amplifier system according to an embodiment.
Figure 41C:
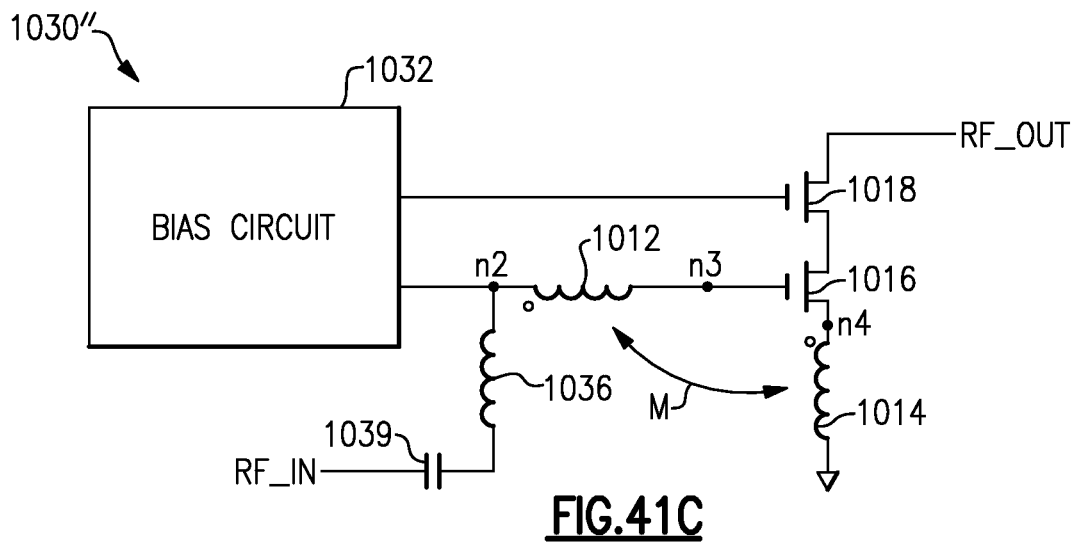
FIG. 41C is a schematic diagram of a low noise amplifier system according to an embodiment.

FIGS. 41A, 41B, and 41C are schematic diagrams of low noise amplifier systems that include low noise amplifiers according to certain embodiments. These LNAs include different input matching circuits. Any of the principles and advantages of these matching circuits can be implemented in connection with any of the amplifiers discussed herein as appropriate.

FIG. 41A is a schematic diagram of a low noise amplifier system 1030 that includes an LNA and a bias circuit 1032. The LNA illustrated in FIG. 41A includes a matching circuit, an amplification circuit, and a degeneration inductor. The amplification circuit of this LNA corresponds to the amplification circuit of the LNA 1010 of FIG. 40A. It will be understood that any of the principles and advantages discussed with reference to FIGS. 41A to 41O can be implemented in connection with other suitable amplification circuits, such as the amplification circuit of the LNA 1010' of FIG. 40B and/or the amplification circuit 1026 of the LNA 1010" of FIG. 40C. In FIG. 41B, the inductors 1012 and 1104 are magnetically coupled to each other and can function as discussed above.

The matching circuit illustrated in FIG. 41A includes the first inductor 1012, a series inductor 1036, and a shunt capacitor 1038. The matching circuit can provide input impedance matching for the LNA. The RF input signal RF_IN can be provided at node n1. The shunt capacitor 1038 is electrically connected to the series inductor 1036 at node n1. The shunt capacitor 1038 can provide impedance matching at node n1. For instance, the impedance of the shunt capacitor 1038 can terminate at a phase corresponding to a fundamental frequency of the RF input signal RF_IN. The RF input signal RF_IN can be provided to the amplification circuit of the LNA by way of the series inductor 1036 and the first inductor 1012. Magnetic coupling between the first inductor 1012 and the second inductor 1014 can increase the impedance at node n2. Accordingly, the impedance at node n1 can be increased by this magnetic coupling. Thus, with the increase in impedance from this magnetic coupling, the inductance of the first inductor 1012 and/or the inductance of the series inductor 1036 can be decreased and provide similar input matching. This can advantageously decrease the physical area of the first inductor 1012 and/or the series inductor 1036, which can be significant. Inductors with relatively lower inductance can also improve noise performance of the LNA.

The bias circuit 1032 can provide a first bias for the common source amplifier 1016 at node n2. The first bias can be provided to the gate of the common source amplifier 1016 by way of the first inductor 1012. In some instances, the bias circuit 32 can provide a second bias to the gate of the common gate amplifier 1018. The bias circuit 1032 can be implemented by any suitable bias circuit.

The low noise amplifier system 1030' of FIG. 41B is similar to the low noise amplifier system 1030 of FIG. 41A, except that the matching circuit of the LNA in FIG. 41B also includes a DC blocking capacitor 1039. As illustrated, the DC blocking capacitor 1039 is coupled between a received RF signal and node n1. The DC blocking capacitor 1039 can block DC signal components of the RF input signal RF_IN from being provided to node n1.

The low noise amplifier system 1030" of FIG. 41C is similar to the low noise amplifier system 1030' of FIG. 41B, except that the matching circuit of the LNA in FIG. 41C does not include the shunt capacitor 1038.

Figure 41D:
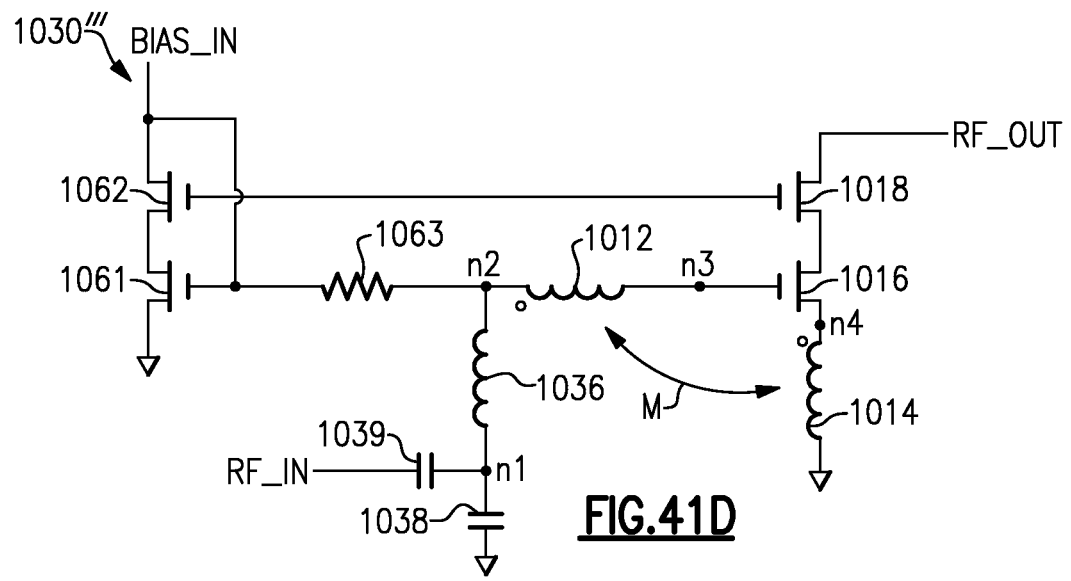
FIG. 41D is a schematic diagram of a low noise amplifier system that includes an illustrative bias circuit according to an embodiment.

FIG. 41D is schematic diagram of low noise amplifier system 1030''' that includes an example bias circuit according to an embodiment. The bias circuit of FIG. 41D is an example of the bias circuit 1032 of FIGS. 41A to 41O. The bias circuit can include a current mirror to provide a bias signal to an amplification circuit of an LNA. As illustrated in FIG. 41D, the bias circuit includes transistors 1061 and 1062, and a biasing element 1063, such as a resistor. The bias circuit is configured to provide a bias voltage to the transistor 1016 by way of the biasing element 1063. The biasing input signal BIAS_IN can be a current provided by a current source.

Figure 41E:
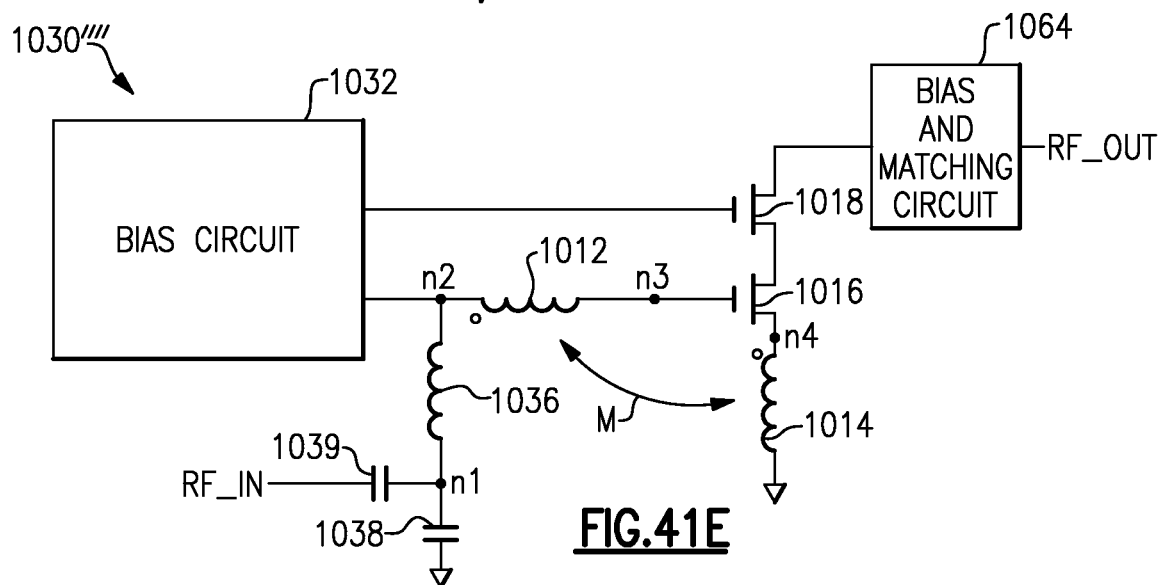
FIG. 41E is a schematic diagram of a low noise amplifier system with a bias and matching circuit according to an embodiment.

FIG. 41E is schematic diagram of low noise amplifier system 1030'''' that includes a bias and matching circuit 1064 coupled to an output of a low noise amplifier according to an embodiment. The bias and matching circuit 1064 can include any suitable circuit elements to bias the output of the LNA and/or to provide impedance matching at the output of the LNA. The bias and matching circuit 1064 can be implemented in connection with any of the LNAs discussed herein.

Figure 41F:
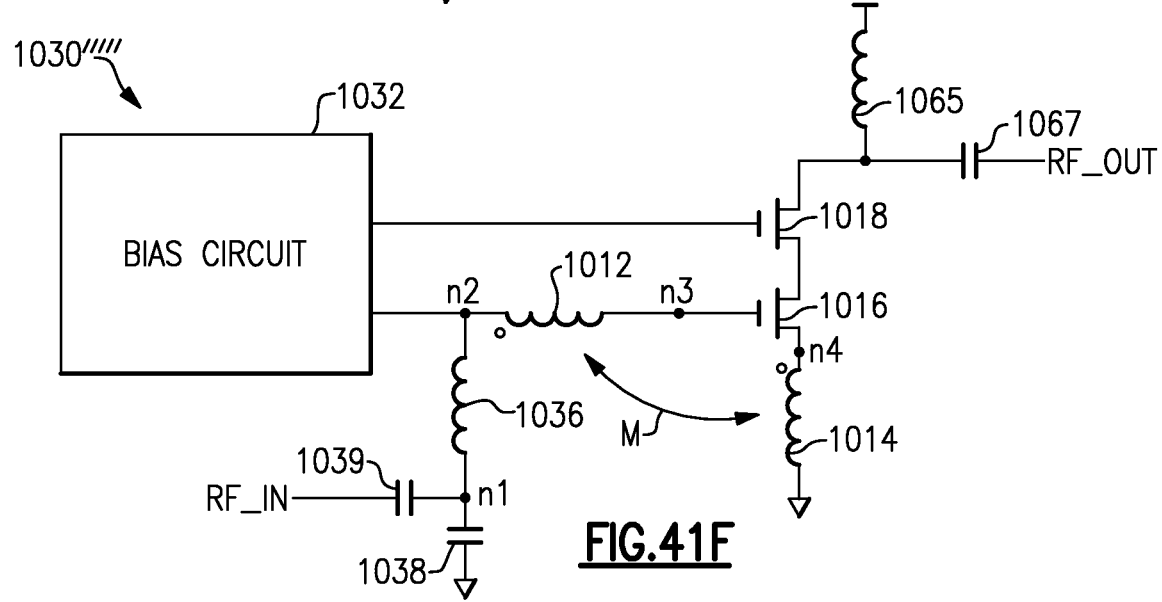
FIG. 41F is a schematic diagram of a low noise amplifier system that includes an illustrative bias and matching circuit according to an embodiment.

FIG. 41F is schematic diagram of low noise amplifier system 1030''''' that includes an example bias and matching circuit coupled to an output of a low noise amplifier according to an embodiment. The bias and matching circuit of FIG. 41F is an example of the bias and matching circuit 1064 of FIG. 41E. The bias and matching circuit of FIG. 41F includes an inductor 1065 and a capacitor 1067. The inductor 1065 can provide a bias to the output of the LNA. The capacitor 1067 can provide impedance matching. Other suitable passive impedance networks can alternatively be implemented to provide biasing and impedance matching at the output of the LNA.

Figure 42:
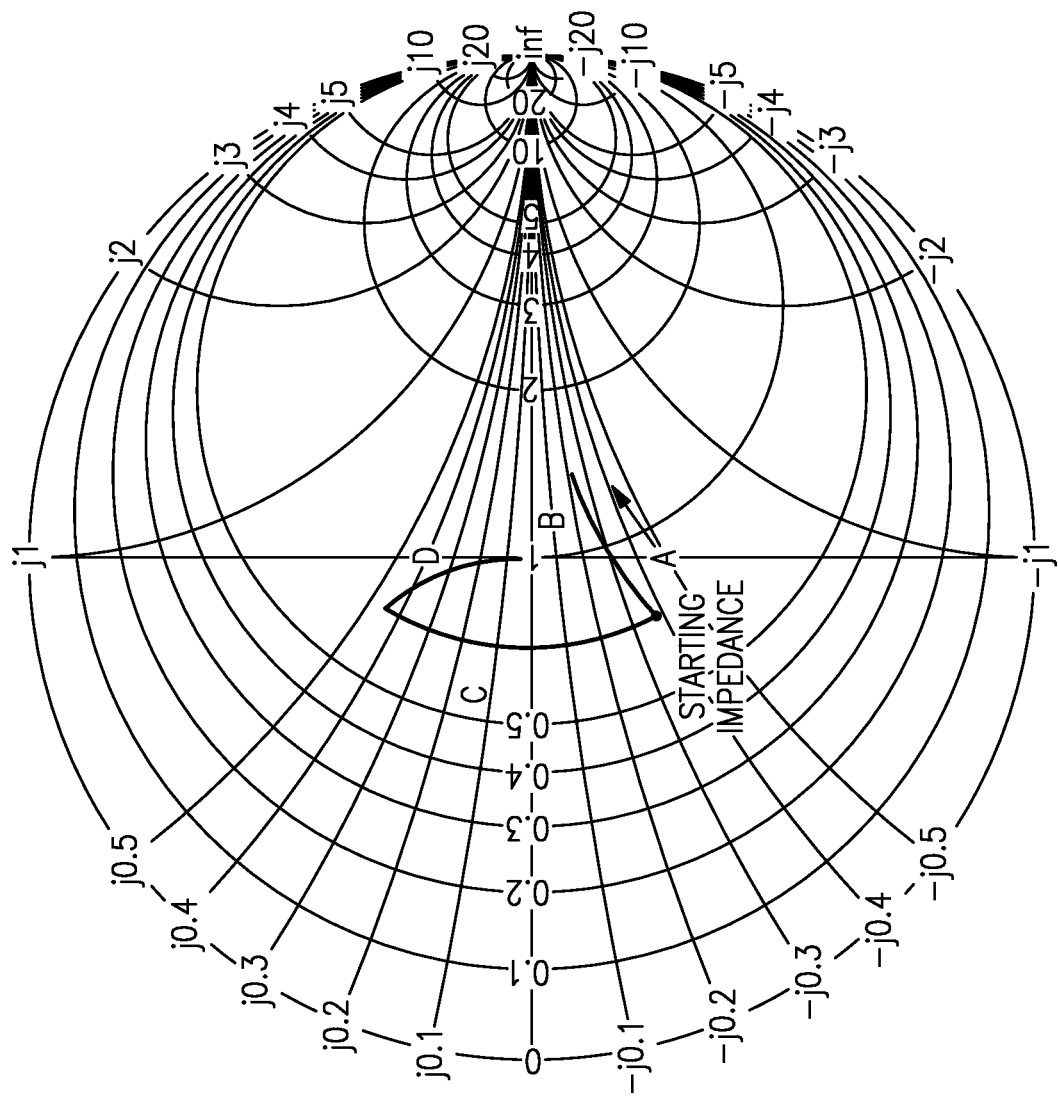
FIG. 42 is a Smith chart corresponding to the passive impedance network of FIG. 41A.

FIG. 42 is a Smith chart corresponding to the matching circuit and the degeneration inductor of the low noise amplifier system of FIG. 41A. This Smith chart shows how the input impedance from the starting impedance varies when the magnetically coupled inductors 1012 and 1014 are implemented. The arrow on this chart shows the direction for increasing magnetic coupling. Locus A shows how the impedance at node n2 of FIG. 41A varies as the coupling factor is changed between the first inductor 1012 and the second inductor 1014. Locus A is relatively close to the effect of adding a series resistance. Locus B is the addition of the series inductor 1036, from the point where locus A crosses the 50 Ohm resistance line. The net effect is that the series inductor 1036 can also be significantly smaller (e.g., in the example shown B=1 nH and C=2.7 nH at 2.5 GHz). Locus C shows the effect of the series inductor 1036. Locus D shows the effect of the shunt capacitor 1038.

Figure 43:
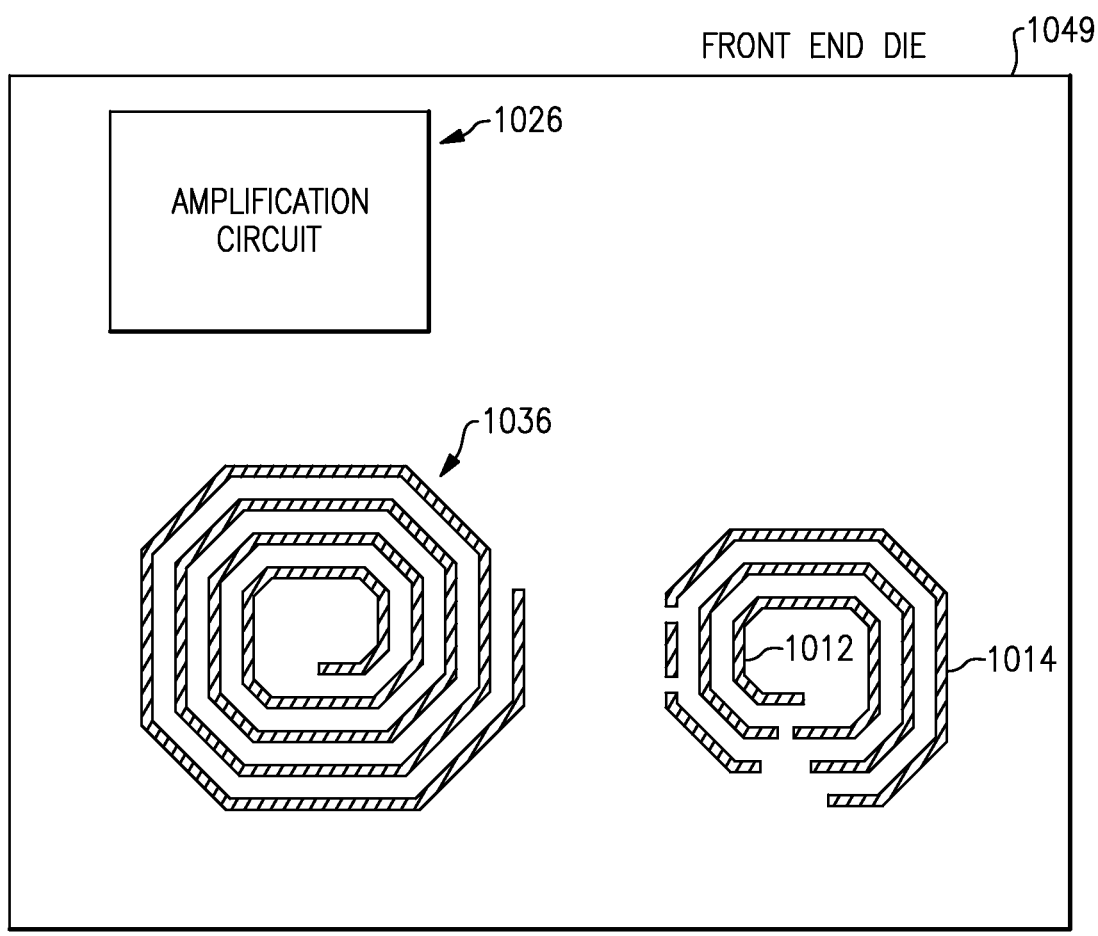
FIG. 43 illustrates a physical layout of magnetically coupled inductors of a low noise amplifier according to an embodiment.

Some or all of the circuit elements of the LNAs and/or front end systems discussed above can be implemented on a single semiconductor die. FIG. 43 illustrates a physical layout of magnetically coupled inductors of a low noise amplifier according to an embodiment. As illustrated, a die 1049 includes an amplification circuit 1026, a first inductor 1012, and a second inductor 1014 that is magnetically coupled with the first inductor 1012. The die 1049 can also include a series inductor 1036, as illustrated. The die 1049 can be manufactured using any suitable process technology.

As one example, the die 1049 can be a semiconductor-on-insulator die, such as a silicon-on-insulator die.

The first inductor 1012 and the second inductor 1014 can each include one or more annular turns. The first inductor 1012 and the second inductor 1014 can be interleaved with each other. In some instances, the first inductor 1012 and/or the second inductor 1014 can be implemented in two metal layers with conductive connections between metals in the two metal layers. This can lower resistance of the metal and increase the quality factor of an inductor.

The first inductor 1012 and the second inductor can be wound around a magnetic core in some instances. Alternatively, a magnetic core can be implemented around the first inductor 1012 and the second inductor 1014 in certain applications.

While FIG. 43 is not necessarily to scale, this drawing illustrates that the first inductor 1012 and the second inductor 1014 can be relatively large and can consume significant physical die area. As also illustrated, the series inductor 1036 can be relatively large and can consume significant physical die area. Accordingly, reducing the inductance and thus the size of the first inductor 1012 (and/or the series inductor 1036 described above) can result in a significant reduction in physical area consumed by an LNA.

The low noise amplifiers discussed herein, which can be as described earlier in this section, can be included in any suitable front end system, packaged module, semiconductor die (e.g., a semiconductor-on-insulator die, such as a silicon-on-insulator die), wireless communication device (e.g., a mobile phone, such as a smart phone), or the like.

Section II—Overload Protection of Low Noise Amplifier

In accordance with some embodiments of this disclosure, this section of the present disclosure relates to overload protection of low noise amplifiers (LNAs). In certain configurations, an LNA system includes an input switch having an analog control input that controls an impedance of the input switch, an LNA that amplifies a radio frequency (RF) input signal received from the input switch, and an overload protection circuit that provides feedback to the input switch's analog control input based on detecting a signal level of the LNA. The overload protection circuit detects whether or not the LNA is overloaded. Additionally, when the overload protection circuit detects an overload condition, the overload protection circuit provides feedback to the analog control input of the switch to increase the impedance of the switch and reduce the magnitude of the RF input signal received by the LNA. As indicated above, aspects of this section may be combined with other aspects of one or more other sections to further improve the performance of front end systems and related devices, integrated circuits, modules, and methods in which they are employed.

Large input signals can cause overload conditions to arise in a low noise amplifier (LNA). For example, in certain applications, an LNA is specified to tolerate a high overload signal that is substantially higher than a normal operating signal level.

Absent an overload protection scheme, providing a large input signal to an LNA can result in high current and/or voltage manifesting in circuitry of the LNA, such as transistors used for amplification. Such high current and/or voltage can cause permanent electrical overstress damage to the amplification transistors such that they are no longer able to operate and/or such that their operation is impaired.

Apparatus and methods for overload protection of LNAs are provided herein. In certain configurations, an LNA system includes an input switch having an analog control input that controls an impedance of the input switch, an LNA that amplifies a radio frequency (RF) input signal received from the input switch, and an overload protection circuit that provides feedback to the input switch's analog control input based on detecting a signal level of the LNA. The overload protection circuit detects whether or not the LNA is overloaded. Additionally, when the overload protection circuit detects an overload condition, the overload protection circuit provides feedback to the analog control input of the switch to increase the impedance of the switch and reduce the magnitude of the RF input signal received by the LNA.

The overload protection schemes herein can be used to limit large current and/or voltage swing conditions manifesting within circuitry of an LNA.

In certain implementations, the input switch is also used for controlling signal connectivity and/or routing. For example, the input switch can be part of a multi-throw switch used to facilitate routing of signals transmitted and received via an antenna. Using the input switch for both overload protection and signal routing can reduce overhead and/or enhance performance by sharing circuitry for multiple functions. For example, using an input switch that is already in a receive signal path provides overload protection without increasing the insertion loss of the receive path. Thus, the overload protection circuit has no or a relatively small impact on the LNA's performance.

The teachings herein can be used to control the impedance of an input switch to attenuate an incoming RF signal to a safe level. For an input switch, such as a metal-oxide-semiconductor (MOS) transistor switch, an analog control input can be used to control the input switch's impedance. For example, the impedance of a MOS transistor switch can be controlled based on an analog voltage level provided to the MOS transistor's gate.

In certain implementations herein, the overload protection circuit controls the analog control input of the input switch with an overload protection signal that is based on a detected signal level of the LNA, such as an input signal level, internal signal level, and/or output signal level. Additionally, the overload protection circuit provides feedback to the input switch's analog control input via the overload protection signal to prevent a large input signal from damaging the LNA.

In certain configurations, the impedance of the input switch can be controlled based not only on the overload protection signal from the overload protection circuit, but also on one or more digital control signals. For example, in certain implementations, the overload protection circuit includes a limiter enable circuit connected between an output of the overload protection circuit and the analog control input to the input switch. The limiter enable circuit controls the input switch based on one or more digital control signals, such as a switch enable signal and/or limiter enable signal. For example, the limiter enable circuit can be used to disconnect the overload protection circuit from the analog control input when the input switch is in an off state and/or when overload protection is disabled.

The signal level of the LNA can be detected in a wide variety of ways, such as by using any suitable signal detector. For example, a signal detector can be used to detect an input signal level of the LNA, an internal signal level of the LNA, and/or an output signal level of the LNA. For instance, detection at the LNA's output avoids noise figure degradation, but can degrade the LNA's linearity. In contrast, detection at the LNA's input may degrade noise figure.

Detection at the output also relaxes design constraints of the detector, since the output signal level is higher than the input signal level.

In certain implementations, the LNA includes an output rectifier circuit that clips or limits an output voltage level of the LNA. Including the output rectifier circuit can enhance performance, since the output rectifier circuit can have a faster turn-on time relative to a time taken by feedback from the overload protection circuit to increase the impedance of the input switch. In one example, the output rectifier is implemented using clamping diodes. Once the overload protection circuit's control loop responds to provide feedback, the signal level is turned down or decreased to a safe level via control of the impedance of the input switch.

A network or circuit connected in shunt with a signal path can impact overall noise or linearity performance. By providing overload protection using an input switch already present, the LNA need not include an additional circuit in shunt or series to protect against overload.

The overload protection circuits herein can provide signal attenuation at the LNA's input via increasing impedance of the input switch. Accordingly, the overload protection schemes herein can be used to protect against both high voltage and high current. Furthermore, reducing the RF input signal to the LNA protects all circuitry of the LNA. In contrast, an implementation using only an output voltage clamp may not fully protect certain circuits of the LNA and/or high currents may nevertheless flow in the LNA when clamping.

The LNA overload protection schemes disclosed herein are applicable to a wide variety of RF systems, including, but not limited to, smartphones, base stations, handsets, wearable electronics, and/or tablets.

Figure 44:
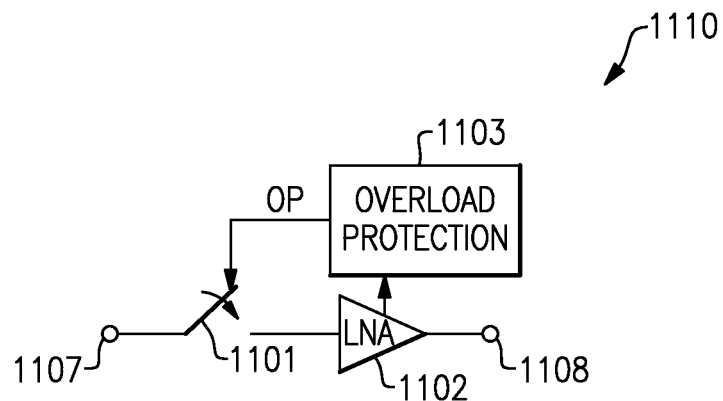
FIG. 44 is a schematic diagram of a low noise amplifier (LNA) system with overload protection according to one embodiment.

FIG. 44 is a schematic diagram of an LNA system 1110 according to one embodiment. The LNA system 1110 includes an input switch 1101, an LNA 1102, and an overload protection circuit or signal limiter 1103. The LNA system 1110 further includes an input terminal 1107 and an output terminal 1108.

The LNA 1102 provides amplification to an RF input signal received from the input terminal 1107 via the input switch 1101. The LNA 1102 provides an amplified RF output signal on the output terminal 1108. In certain configurations, the input terminal 1107 is electrically connected to an antenna and the output terminal 1108 is electrically connected to a transceiver. For instance, the transceiver can include a demodulator that downconverts the amplified RF output signal from the LNA 1102 to baseband or an intermediate frequency.

The input switch 1101 includes an analog control input used to control the input switch's impedance between the input terminal 1107 and an input to the LNA 1102. In certain configurations, the input switch 1101 includes at least one metal-oxide-semiconductor (MOS) transistor having a gate that serves as the analog control input. By controlling an analog gate voltage of the MOS transistor, an impedance of the input switch can be controlled.

As shown in FIG. 44, the overload protection circuit 1103 detects a signal level of the LNA 1102 to determine whether or not an overload condition is present. Additionally, the overload protection circuit 1103 generates an overload protection signal OP operable to provide feedback to the analog control input of the switch 1101. When the overload protection circuit 1103 detects an overload condition, the overload protection circuit 1103 increases the impedance of the input switch 1101, thereby reducing the magnitude of the RF input signal received by the LNA 1102. Thus, the overload protection circuit 1103 serves as a signal limiter that limits large current and voltage swing conditions manifesting within amplification transistors of the LNA 1102.

In certain implementations, the input switch 1101 corresponds to part of a multi-throw switch used to facilitate routing of signals transmitted and received via an antenna. For example, the input terminal 1107 can be connected to an antenna of a wireless device. Using the input switch 1101 for both overload protection and routing signals can reduce overhead and/or enhance performance. Thus, during normal signaling conditions when no overload condition is present, the overload protection circuit 1103 has no or a relatively small impact on the performance of the LNA 1102. For instance, since the input switch 1101 is included for signal routing, the overload protection scheme need not increase an insertion loss between the input terminal 1107 and the output terminal 1108.

Although not illustrated in FIG. 44, the LNA system 1110 can include other components and/or circuitry. For example, in one embodiment, the LNA system 1110 further includes a limiter enable circuit connected between the output of the overload protection circuit 1103 and the analog control input to the input switch 1101. In certain implementations, the limiter enable circuit can be used to selectively connect the output of the overload protection circuit 1103 and the input switch's analog control input based on a state of a switch enable signal.

Figure 45A:
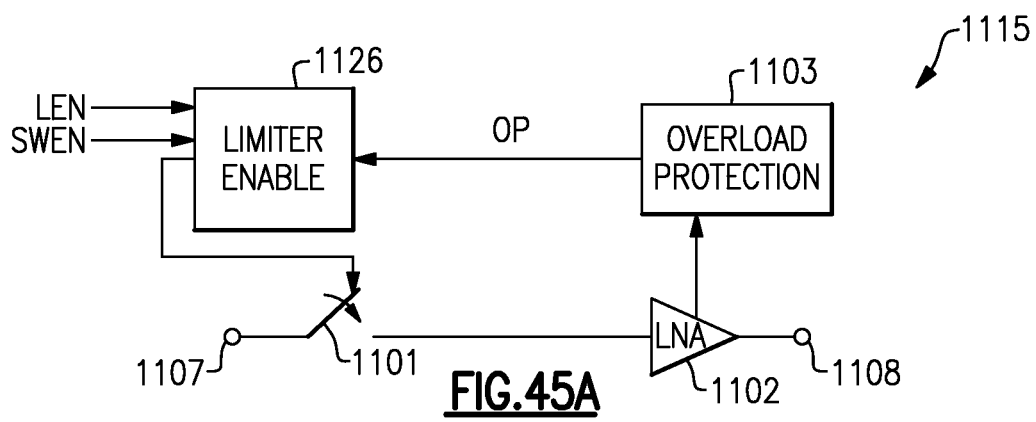
FIG. 45A is a schematic diagram of an LNA system with overload protection according to another embodiment.

FIG. 45A is a schematic diagram of an LNA system 1115 according to another embodiment. The LNA system 1115 of FIG. 45A includes the input terminal 1107, the output terminal 1108, the input switch 1101, the LNA 1102, and the overload protection circuit 1103, which can be as described earlier. The LNA system 1115 further includes a limiter enable circuit 1126.

The LNA system 1115 of FIG. 45A is similar to the LNA system 1110 of FIG. 44, except that the LNA system 1115 further includes the limiter enable circuit 1126. As shown in FIG. 45A, the limiter enable circuit 1126 receives a limiter enable signal LEN and a switch enable signal SWEN, in this embodiment. Although FIG. 45A illustrates one example of digital control signals for a limiter enable circuit, other implementations are possible.

The limiter enable circuit 1126 receives the overload protection signal OP from the overload protection circuit 1103. The limiter enable signal LEN can be used to selectively enable overload protection/signal limiter functionality based on a state of digital control signals received by the limiter enable circuit 1126.

In the illustrated embodiment, when the switch enable signal SWEN and limiter enable signal LEN are enabled, the limiter enable circuit 1126 provides the overload protection signal OP to the analog control input of the input switch 1101. However, when the switch enable signal SWEN is disabled, the limiter enable circuit 1126 controls the analog control input to turn off the input switch 1101. Additionally, when the limiter enable signal LEN is disabled, the input switch 1101 can be turned on or off based on the state of the switch enable signal SWEN.

Including the limiter enable circuit 1126 between the output of the overload protection circuit 1103 and the analog control input of the input switch 1101 provides a number of advantages. For example, the limiter enable circuit 1126 allows the switch state to be controlled by a logic signal, while also allowing the overload protection circuit 1103 to provide feedback to the input switch's analog control input when desired.

For example, when the switch enable signal SWEN is in a disabled state, the limiter enable circuit 1126 disconnects the output of the overload protection circuit 1103 from the analog control input and turns off the input switch 1101. However, when the switch enable signal SWEN and the limiter enable signal LEN are in enabled states, the limiter enable circuit 1126 connects the output of the overload protection circuit 1103 to the analog control input of the input switch 1101.

Figure 45B:
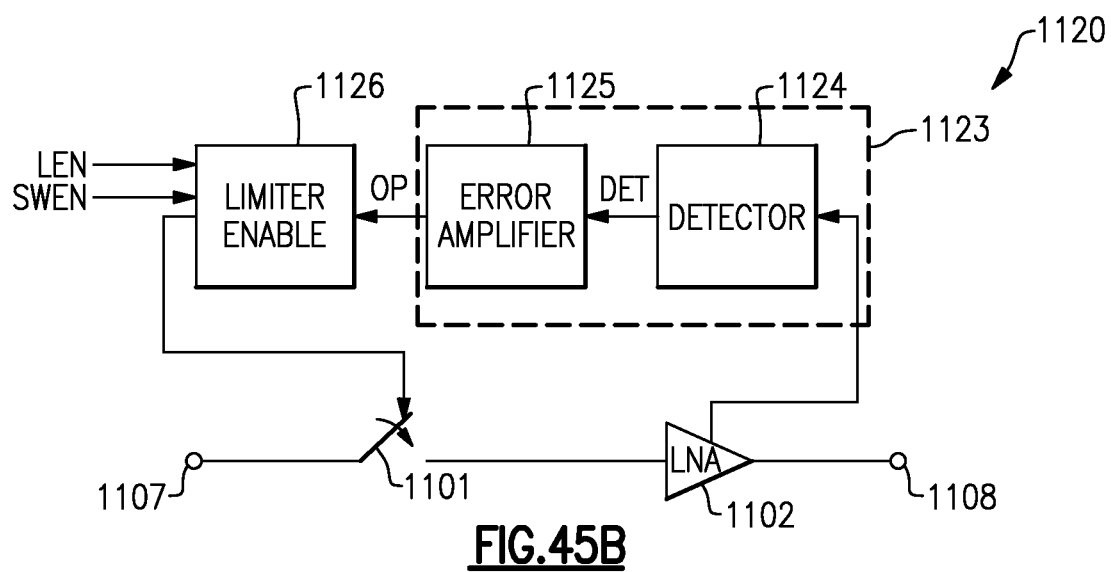
FIG. 45B is a schematic diagram of an LNA system with overload protection according to another embodiment.

FIG. 45B is a schematic diagram of an LNA system 1120 according to another embodiment. The LNA system 1120 includes the input terminal 1107, the output terminal 1108, the input switch 1101, the LNA 1102, and the limiter enable circuit 1126, which can be as described earlier. The LNA system 1120 further includes an overload protection circuit or signal limiter 1123.

The illustrated overload protection circuit 1123 includes a detector 1124 and an error amplifier 1125. The detector 1124 generates a detection signal DET based on detecting a signal level of the LNA 1102. The detector 1124 can sense the signal level of the LNA 1102 in a variety of ways, including, for example, output signal detection, input signal detection, and/or detection of an intermediate voltage and/or current.

As shown in FIG. 45B, the error amplifier 1125 amplifies the detection signal DET to generate an overload protection signal OP, which is provided to the limiter enable circuit 1126. In certain implementations, the error amplifier 1125 amplifies a difference between the detection signal DET and a reference signal.

Although FIG. 45B illustrates one embodiment of an overload protection circuit, the overload protection circuits herein can be implemented in a wide variety of ways.

Figure 46A:
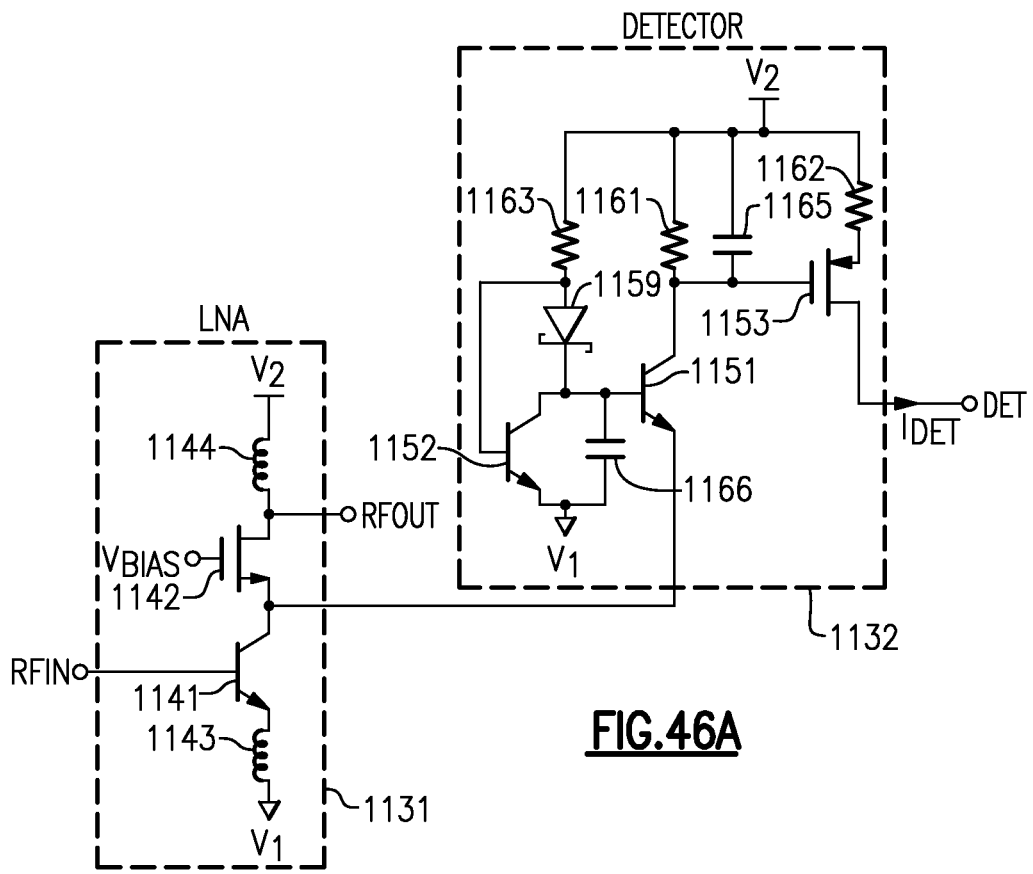
FIG. 46A is a schematic diagram of an LNA and a detector according to one embodiment.

FIG. 46A is a schematic diagram of an LNA 1131 and a detector 1132 according to one embodiment. The LNA 1131 includes an LNA input RFIN and an LNA output RFOUT. The detector 1132 includes a detector input coupled to an internal node of the LNA 1131 and a detector output DET.

The LNA 1131 further includes an amplification NPN transistor 1141, a cascode n-type metal-oxide-semiconductor (NMOS) transistor 1142, an emitter degeneration inductor 1143, and a biasing inductor 1144. Although one implementation of an LNA is shown in FIG. 46A, the teachings herein are applicable to LNAs implemented in a wide variety of ways, including but not limited to, LNAs using more or fewer transistors and/or transistors of different device types and/or polarities.

As shown in FIG. 46A, the base of the amplification NPN transistor 1141 is connect to the LNA input RFIN, and the collector of the amplification NPN transistor 1141 is connected to a source of the cascode NMOS transistor 1142. The emitter degeneration inductor 1143 is electrically connected between an emitter of the amplification NPN transistor 1141 and a first voltage V1 (for instance, ground), and the biasing inductor 1144 is electrically connected between a drain of the cascode NMOS transistor 1142 and a second voltage V2 (for instance, a power supply). The gate of the cascode NMOS transistor 1142 is biased by a bias voltage VBIAS and the drain of the cascode NMOS transistor 1142 is connected to the LNA output RFOUT. For clarity of the figures, bias circuitry of the LNA 1131 has not been shown. However, the LNA 1131 can be biased in a wide variety of ways.

The illustrated detector 1132 includes a first detection NPN transistor 1151, a second detection NPN transistor 1152, a detection p-type metal-oxide-semiconductor (PMOS) transistor 1153, a Schottky diode 1159, a first resistor 1161, a second resistor 1162, a third resistor 1163, a first capacitor 1165, and a second capacitor 1166. Although one implementation of a detector is shown in FIG. 46A, the teachings herein are applicable to detectors implemented in a wide variety of ways.

In the illustrated embodiment, the detector 1132 generates a detection current IDET at the detector output DET. The magnitude of the detection current IDET is based on a detected signal level of the LNA 1131, and in particular to a signal swing at the collector of the amplification NPN transistor 1141. However, a signal detector can detect an LNA's signal level in other ways. Moreover, although the illustrated detector 1132 generates a detection current, other configurations are possible, including but not limited to, implementations in which a detector generates a detection voltage.

At high signal power the voltage at the collector of the amplification NPN transistor 1141 saturates the first detection NPN transistor 1151, which gives rise to a flow of rectified current through the first detection NPN transistor 1151. The rectified current is filtered by the first capacitor 1165 to generate a voltage the controls a gate of the detection PMOS transistor 1153. Thus, when the LNA 1131 is in overload, a detection current IDET flows from the detector 1132.

The illustrated embodiment depicts one implementation of an LNA and detector suitable for use in an LNA system, such as the LNA system 1120 of FIG. 45B. Although FIG. 46A illustrates one embodiment of an LNA and detector, the teachings herein are applicable to LNAs and detectors implemented in a wide variety of ways.

Figure 46B:
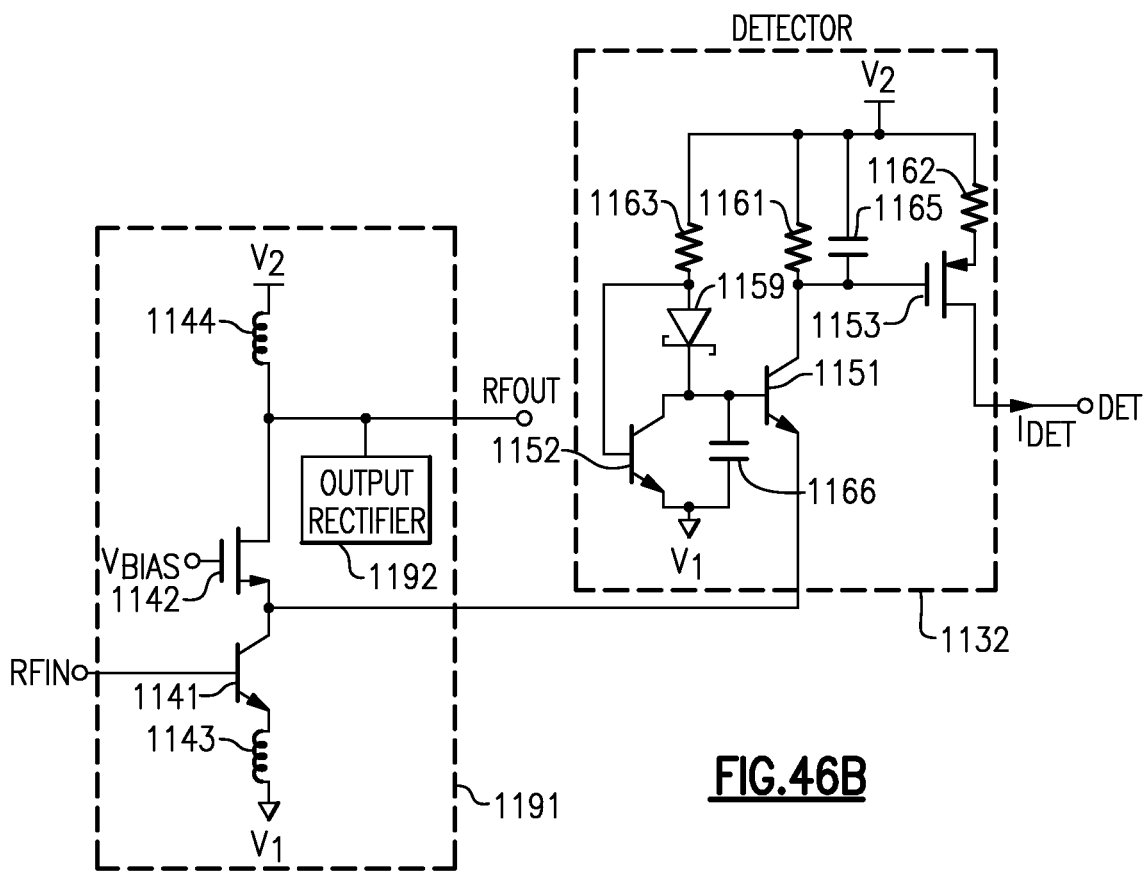
FIG. 46B is a schematic diagram of an LNA and a detector according to another embodiment.

FIG. 46B is a schematic diagram of an LNA 1191 and a detector 1132 according to another embodiment. The schematic diagram of FIG. 46B is similar to the schematic diagram of FIG. 46A, except that the LNA 1191 of FIG. 46B further includes an output rectifier circuit 1192 electrically connected to the LNA output RFOUT.

In certain implementations, such as the embodiment of FIG. 46B, an LNA is protected not only using an overload protection circuit that provides feedback to an input switch, but also using an output rectifier circuit that clips or limits an output voltage level of the LNA. Including the output rectifier circuit can enhance performance, since the output rectifier circuit can have a faster turn-on time relative to a time taken by feedback from the overload protection circuit to increase the impedance of the input switch. Once the overload protection circuit's control loop responds to provide feedback, the signal level is turned down or decreased to a safe level via control of the impedance of the input switch.

In one embodiment, the output rectifier circuit 1192 is implemented using clamping diodes. For example, the output rectifier can include one or more diode networks electrically connected between the LNA output RFOUT and one or more reference voltages, for instance, between the LNA output RFOUT and the first voltage V1 and/or between the LNA output RFOUT and the second voltage V2.

Figure 47:
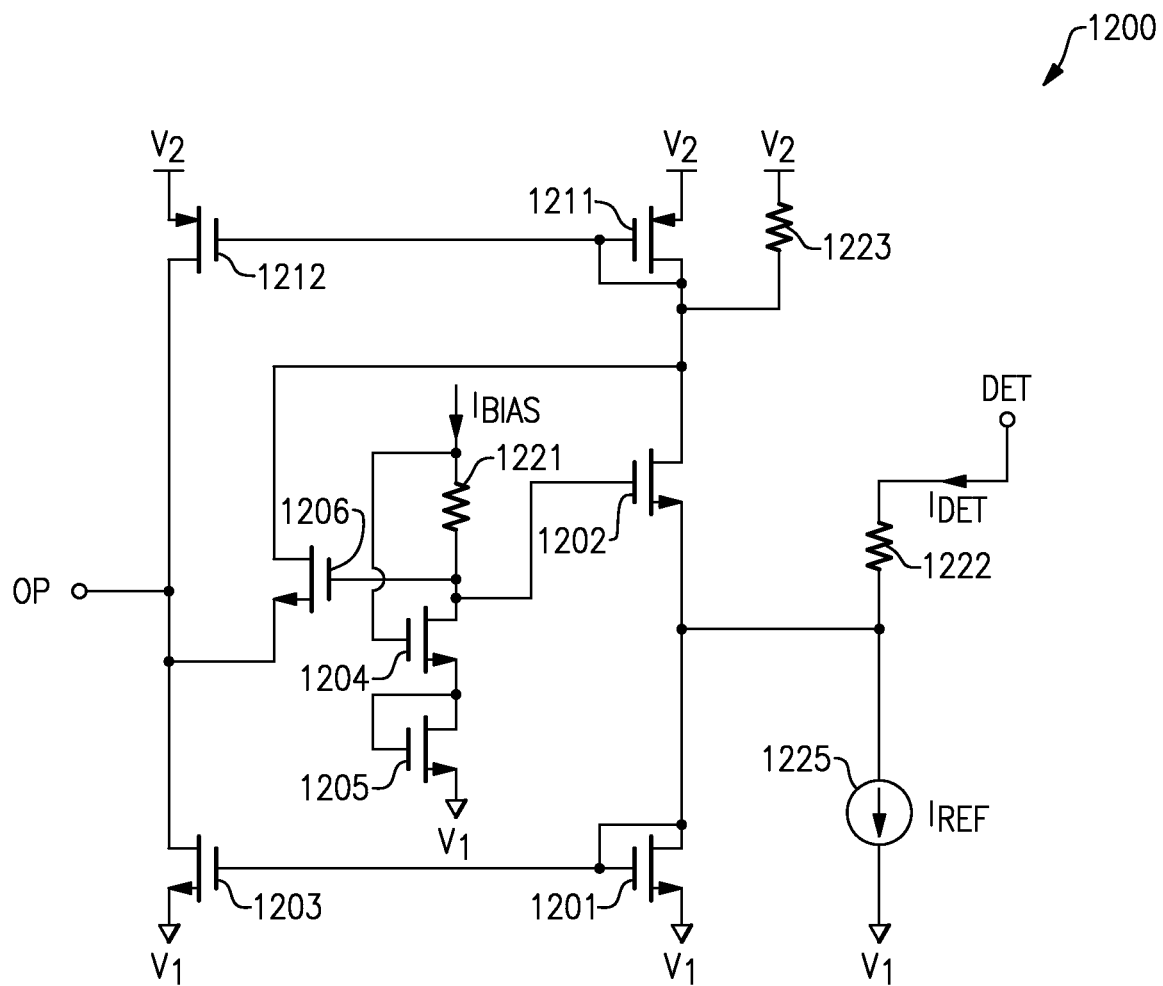
FIG. 47 is a schematic diagram of an error amplifier according to one embodiment.

FIG. 47 is a schematic diagram of an error amplifier 1200 according to one embodiment. The error amplifier 1200 includes a first NMOS transistor 1201, a second NMOS transistor 1202, a third NMOS transistor 1203, a fourth NMOS transistor 1204, a fifth NMOS transistor 1205, a sixth NMOS transistor 1206, a first PMOS transistor 1211, a second PMOS transistor 1212, a first resistor 1221, a second resistor 1222, a third resistor 1223, and a reference current source 1225. The error amplifier 1200 includes a detection input DET for receiving a detection signal from a detector. The error amplifier 1200 further includes an overload protection output OP, which can be used to control an analog control input of an input switch.

In the illustrated embodiment, a detection current IDET from a detector (for example, the detector 1132 of FIGS. 46A-46B) is received by the error amplifier 1200. When the detection current IDET is greater than the reference current IREF of the reference current source 1225, the second NMOS transistor 1202 can turn off and the first NMOS transistor 1201 can conduct. Since the first and third NMOS transistors 1201, 1203 operate as a first current mirror and the first and second PMOS transistors 1211, 1212 operate as a second current mirror, the overload protection output OP is pulled down when the detection current IDET is greater than the reference current IREF.

The first resistor 1221 aids in preventing the first and second NMOS transistors 1201, 1202 from simultaneously conducting. For example, the first resistor 1221 operates in conjunction with the fourth and fifth NMOS transistors 1204, 1205 to bias the first and second NMOS transistors 1201, 1202 near conduction, while inhibiting simultaneously conduction. This in turn prevents a continuously linear closed loop when the error amplifier 1200 is connected in a feedback loop from an LNA to an analog control input of an input switch. As shown in FIG. 47, a bias current IBIAS is used to bias the first resistor 1221 and the fourth and fifth NMOS transistors 1204, 1205.

At very high input power to an LNA, a detector can generate a relatively large detection signal, which can result in the overload protection output OP being controlled to the first voltage V1. At intermediate input power levels, the circuit can exhibit blocking oscillator behavior. In certain implementations, there is no continuous linear signal path around the loop, but instead a switched oscillatory behavior.

In certain implementations, the feedback signal generated at the overload protection output OP can be provided to a limiter enable circuit (for example, the limiter enable circuit 1126 of FIGS. 45A-45B), which in turn can selectively provide the feedback signal to an analog control input of an input switch. When a large input signal is present during an overload condition, the overload protection output OP goes low (in this embodiment), which in can turn off the input switch either fully or partially.

For example, the input switch includes an analog control input, and thus the magnitude of the input signal to an LNA can be controlled using the overload protection output OP. Since turning off the input switch partially reduces the input signal strength to the LNA and a corresponding value of the detector signal DET, a closed loop is provided. The closed loop exhibits different behavior at different input power levels. At very high power, the input switch is fully off and substantially no input signal is provided to the LNA. At intermediate power levels, when the loop exhibits some oscillatory behavior, the overload protection output OP can operate at a DC level with a superimposed AC component. In certain implementations, the input switch filters the AC component, since the input switch can be implemented to have a time constant lower than the period of the oscillatory signal. Accordingly, the loop can behave as though it were under linear control.

In certain configurations, the loop does not respond to any signal levels encountered in normal operation, only to higher overload conditions. The protection loop has a finite response time, and thus may not protect against instantaneous voltage peaks. However, the protection loop can limit total exposure of the LNA to high currents. In certain configurations, an LNA further includes an output rectifier to bolster protection against instantaneous voltage peaks.

In the illustrated embodiment, the overload protection output OP is normally high. However, when an overload condition is detected, the overload protection output OP is a continuously variable level, that can vary between the voltages of the first voltage V1 and the second voltage V2. The analog or continuous signal level of the overload protection output OP arises from the error amplifier 1200 operating in a closed loop. The overload protection output OP is controlled to a voltage level that depends on an input power to the LNA and operating conditions, such as temperature.

The illustrated embodiment depicts one implementation of an error amplifier for use in an LNA system, such as the LNA system 1120 of FIG. 45B. Although one embodiment of an error amplifier is shown in FIG. 47, an error amplifier can be implemented in other ways.

Figure 48A:
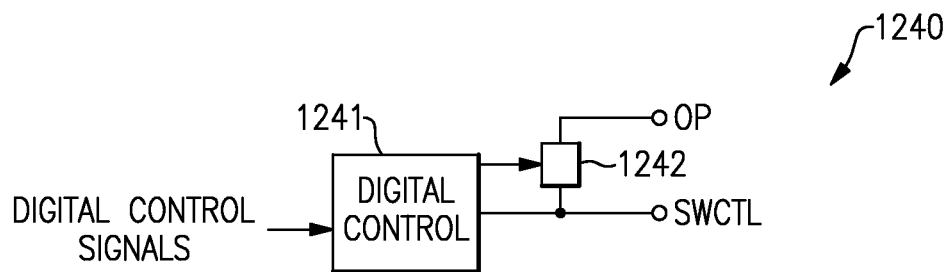
FIG. 48A is a schematic diagram of a limiter enable circuit according to one embodiment.

FIG. 48A is a schematic diagram of a limiter enable circuit 1240 according to one embodiment. The limiter enable circuit 1240 includes a digital control circuit 1241 and a feedback enable circuit 1242. The limiter enable circuit 1240 receives an overload protection signal OP and one or more digital control signals, and generates a switch control signal SWCTL used to control an analog control input of an input switch, such as the input switch 1101 of FIG. 44.

As shown in FIG. 48A, the digital control circuit 1241 receives one or more digital control signals, which the digital control circuit 1241 processes to control whether or not the feedback enable circuit 1242 is turned on or off. When the feedback enable circuit 1242 is turned on, the overload protection signal OP is used to control an analog voltage level of the switch control signal SWCTL. However, when feedback enable circuit 1242 is turned off, the digital control circuit 1241 digitally controls the switch control signal SWCTL.

Figure 48B:
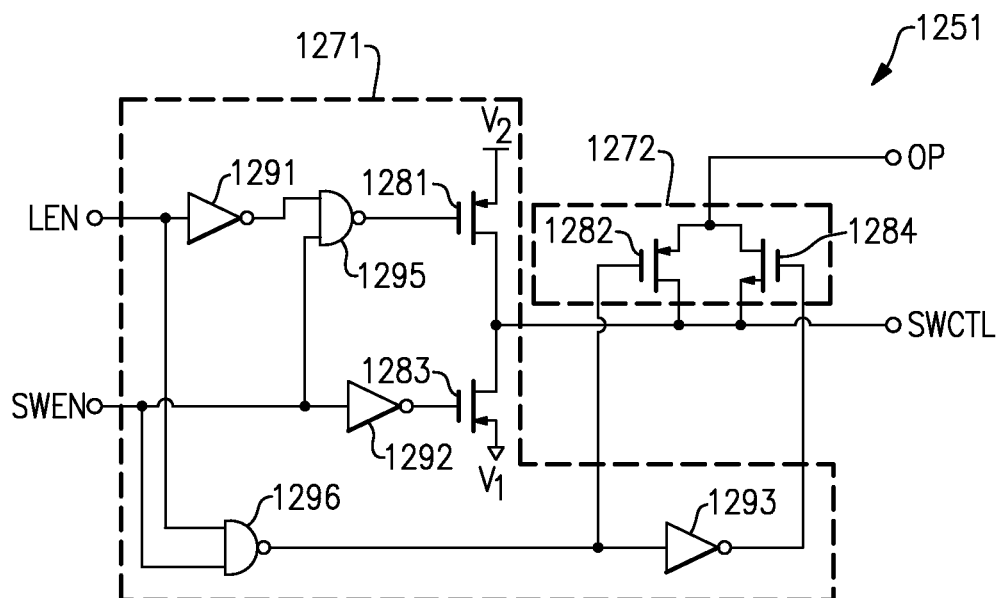
FIG. 48B is a schematic diagram of a limiter enable circuit according to another embodiment.

FIG. 48B is a schematic diagram of a limiter enable circuit 1251 according to another embodiment. The limiter enable circuit 1251 includes a digital control circuit 1271 that includes a first inverter 1291, a second inverter 1292, a third inverter 1293, a first NAND gate 1295, a second NAND gate 1296, a first PMOS transistor 1281, and a first NMOS transistor 1283. The limiter enable circuit 1251 further includes a feedback enable circuit 1272 that includes a second PMOS transistor 1282 and a second NMOS transistor 1284.

In the illustrated embodiment, the digital control circuit 1271 receives a limiter enable signal LEN and a switch enable signal SWEN. The digital control circuit 1271 controls whether or not the feedback enable circuit 1272 is enabled based on a state of the limiter enable signal LEN and the switch enable signal SWEN, in this embodiment.

For example, in the illustrated embodiment, when the limiter enable signal LEN is logically low (corresponding to disabled, in this embodiment), the digital control circuit 1271 turns off the feedback enable circuit 1272 and digitally controls the switch control signal SWCTL to have the same state as the switch enable signal SWEN. Additionally, when the limiter enable signal LEN is logically low and the switch enable signal SWEN is logically low, the digital control circuit 1271 shuts off the feedback enable circuit 1272 and digitally controls the switch control signal SWCTL logically low, in this embodiment. However, when the limiter enable signal LEN and the switch enable signal SWEN are logically high, the digital control circuit 1271 turns off the feedback enable circuit 1272 and the overload protection signal OP controls the switch enable signal SWCTL.

Although FIG. 48B illustrates one embodiment of a limiter control circuit in accordance with the teachings herein, limiter control circuits can be implemented in a wide variety of ways. Moreover, the teachings herein are applicable to implementations in which a limiter control circuit is omitted.

Figure 49:
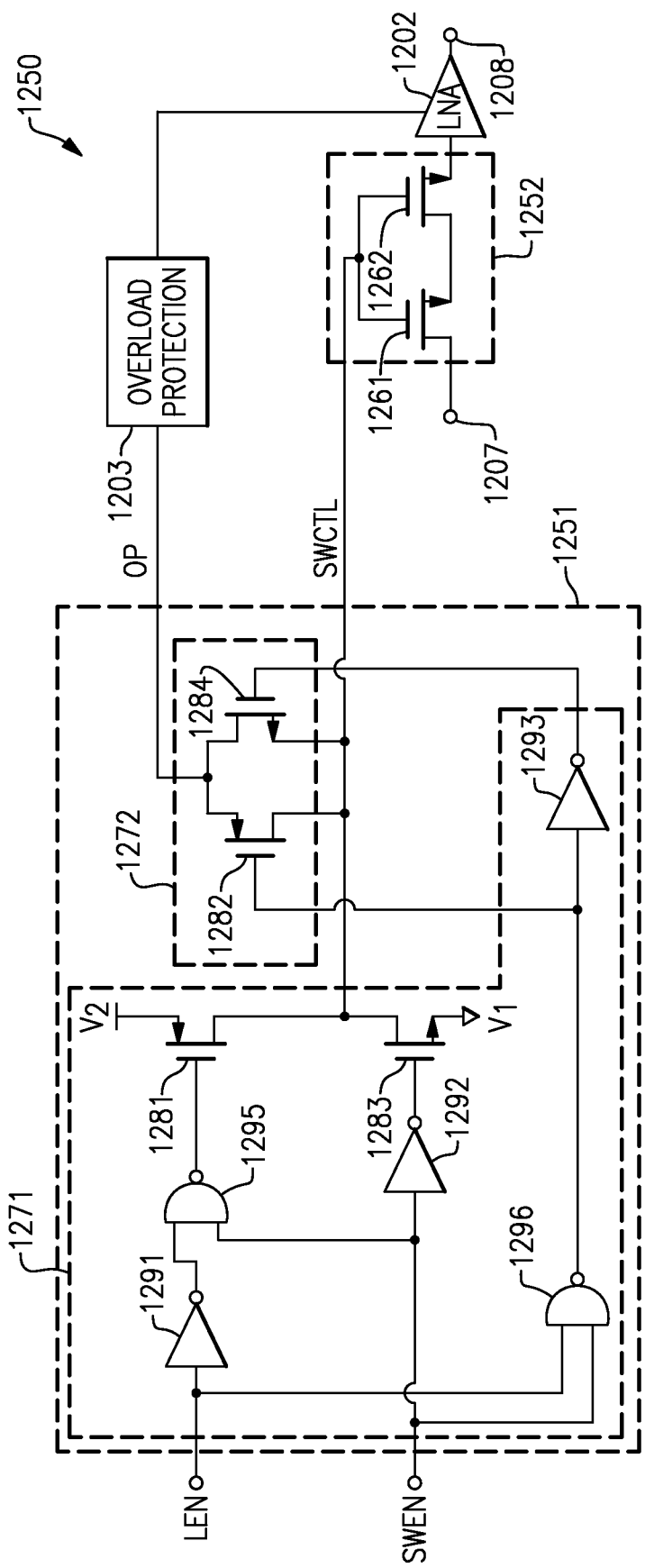
FIG. 49 is a schematic diagram of an LNA system with overload protection according to another embodiment.

FIG. 49 is a schematic diagram of an LNA system 1250 according to another embodiment. The LNA system 1250 includes the input terminal 1107, the output terminal 1108, the LNA 1102, the overload protection circuit 1103, and the limiter enable circuit 1251, which can be as described earlier. The LNA system 1250 further includes an input switch 1252.

The illustrated input switch 1252 includes a first NMOS transistor 1261 and a second NMOS transistor 1262 electrically connected in series with one another. In the illustrated embodiment, the gates of the NMOS transistors 1261, 1262 serve as the analog control input to the input switch 1252. Additionally, the RF input signals passes from the input terminal 1107 to the input of the LNA 1102 via the channels of the NMOS transistors 1261, 1262. Although one implementation of an input switch is shown, an input switch can be implemented in other ways.

As shown in FIG. 49, the limiter enable circuit 1251 is connected between an output of the overload protection circuit or limiter 1103 and the analog control input to the input switch 1252. The logic of the limiter enable circuit 1251 is implemented to disconnect the overload protection circuit 1103 from the analog control input when the switch enable signal SWEN and/or limiter enable signal LEN is disabled.

Thus, the overload protection circuit 1103 controls the analog control input of the input switch 1252 when the switch enable signal SWEN and limiter enable signal LEN are enabled. However, when the switch enable signal SWEN is disabled, the limiter enable circuit 1251 can control the analog control input to the first voltage V1 (for instance, ground or a negative voltage), to turn off the input switch 1252. Additionally, the limiter enable signal LEN is used to disable overload protection/signal limiter functionality. Thus, when the limiter enable signal LEN is disabled, the input switch 1252 can be turned on or off based on the state of the switch enable signal SWEN.

The switch enable signal SWEN and limiter enable LEN can be generated in a variety of ways. In certain configurations, an integrated circuit (IC) includes one or more registers used to control a state of the switch enable signal SWEN and/or limiter enable LEN. For example, the one or more registers can be programmed by a transceiver over an interface, such as a serial peripheral interface. However, the switch enable signal SWEN and/or limiter enable signal LEN can be generated in other ways, such as being provided via pins of the IC.

Additional details of the LNA system 1250 can be as described herein.

An input switch 1101, an LNA 1102, and an overload protection circuit 1103, which can be as described earlier in this section, can be included in any suitable front end system, packaged module, semiconductor die (e.g., a semiconductor-on-insulator die, such as a silicon-on-insulator die), wireless communication device (e.g., a mobile phone, such as a smart phone), or the like.

Section III—Multi-Mode Power Amplifier

In accordance with some embodiments of this disclosure, this section of the present disclosure relates to a multi-mode power amplifier. A multi-mode power amplifier circuit includes a stacked amplifier and a bias circuit. The stacked amplifier includes at least a first transistor and a second transistor in series with each other. The stacked amplifier is operable in at least a first mode and a second mode. The bias circuit is configured to bias the second transistor to a linear region of operation in the first mode and to bias the second transistor as a switch in the second mode. In certain embodiments, the stacked amplifier can be a power amplifier stage configured to receive a supply voltage that has a different voltage level in the first mode than in the second mode. As indicated above, aspects of this section may be combined with other aspects of one or more other sections to further improve the performance of front end systems and related devices, integrated circuits, modules, and methods in which they are employed.

It can be desirable to manage the amplification of an RF signal, as amplifying the RF signal to an incorrect power level or introducing significant distortion to the original RF signal can cause a wireless communication device to transmit out of band and/or violate compliance with an accepted standard. Biasing a power amplifier device can be a significant part of managing the amplification because it can determine the voltage and/or current operating point of the amplifying devices within the power amplifier.

Certain power amplifier circuits include stacked power amplifier topologies. For instance, device stacking for silicon-on-insulator power amplifier circuit topologies can overcome relatively low breakdown voltages of scaled transistors. Such device stacking can be beneficial in applications in which a stacked amplifier is exposed to a relatively large voltage swing, such as a voltage swing exceeding about 2.75 Volts. Stacking several transistors, such as 3 or 4 transistors, can result in a power amplifier with desirable operating characteristics. For instance, a power amplifier with such stacked transistors can behave desirably for supply voltages in a range between about 3 Volts to about 3.6 Volts and voltage swings approaching about 8 Volts without experiencing significant hot carrier injection (HCI) and corresponding long-term effects of reduced transistor drain current and increased transistor leakage.

Multi-mode power amplifiers can include a supply control circuit that provides the power amplifier with a power supply voltage that can vary depending on a mode of operation of the power amplifier. As an example, in a multiple power-mode, variable supply power amplifier, a lower supply voltage can be provided in a lower power mode and a higher supply voltage can be provided in a higher power mode. In some instances, a power amplifier can include multiple stages and the supply voltage provided to the stacked output stage can be varied depending on the power mode while a different supply voltage for an earlier stage remains substantially constant. When a supply voltage for a power amplifier is reduced in a lower power mode for efficiency purposes, the supply voltage can be significantly lower than for a higher power mode. For example, the supply voltage for a lower power mode can be about 60% below the supply voltage for a higher mode. Such a reduction in supply voltage can result in reduced drain-to-source voltage (VDS) headroom operation that drives stacked-device field effect transistor (FET) topologies into early power compression, which can in turn reduce the attainable output 1 dB compression point (OP1 dB), saturated power (PSAT), and/or power-added efficiency (PAE) of the power amplifier.

Aspects of this section relate to a stacked amplifier and bias circuit. The stacked amplifier includes at least a first transistor and a second transistor in series with each other. The stacked amplifier is operable in at least a first mode and a second mode. The bias circuit is configured to bias the second transistor to a linear region of operation in the first mode. The bias circuit is configured to bias the second transistor as a switch in the second mode. Accordingly, the bias circuit can bias the stacked amplifier such that the stacked amplifier behaves like there is at least one less transistor in the stack in the second mode relative to the first mode. Such operation can result in meeting design specifications for different power modes, in which a supply voltage provided to the stacked amplifier is lower in the second mode than in the first mode.

For example, in a stacked silicon-on-insulator power amplifier, an output stage can include a stacked architecture with a common source transistor in series with one or more common gate transistors. This can prevent breakdown during high and/or medium power modes of operation (e.g., modes in which a supply voltage for the output stage are 3 Volts and 1.8 Volts, respectively). In the lowest power mode of operation (e.g., a mode with a supply voltage for the output stage of 1.2 Volts), both the specified power supply level and the voltage swing can be better accommodated by having at least one less transistor in the stack. In certain implementations, a common gate transistor in the stacked amplifier being operated as a switch (as opposed to a common gate stage) by turning it ON hard enough such that its VDS is sufficiently low (e.g., less than about 100 mV or less than about 75 mV) to thereby reduce and/or minimize its effect on the headroom and allowing improved OP1 dB and PSAT (e.g., about 13 dBm).

Accordingly, certain embodiments discussed herein can overcome problems associated with operating a stacked-transistor silicon-on-insulator power amplifier topology in multiple modes of operation with a relatively large difference in supply voltage provided to the power amplifier in different modes of operation. For instance, a triple-stacked-transistor silicon-on-insulator power amplifier topology operable in three power modes in which a lowest power-mode has a supply voltage that is about 60% below the supply voltage for a highest power mode can operate with desirable performance in accordance with the principles and advantages discussed herein.

Embodiments of this disclosure relate to using a common power amplifier for multiple modes of operation. Using the same power amplifier for several power modes can be desirable, as this can prevent increased die area and complications with matching networks and RF-signal routing associated with using different power amplifiers for different power modes.

Embodiments of this disclosure can be implemented with semiconductor-on-insulator technology, such as silicon-on-insulator technology. Using silicon-on-insulator technology and stacked transistor topologies can enable power amplifiers to be implemented in relatively inexpensive and relatively reliable technology. Moreover, the desirable performance of low-noise amplifiers (LNAs) and/or multi-throw RF switches in silicon-on-insulator technology can enable a stacked transistor silicon-on-insulator power amplifier to be implemented as part of a complete front end integrated circuit (FEIC) solution that includes transmit, receive, and switching functionality with desirable performance.

Figure 50:
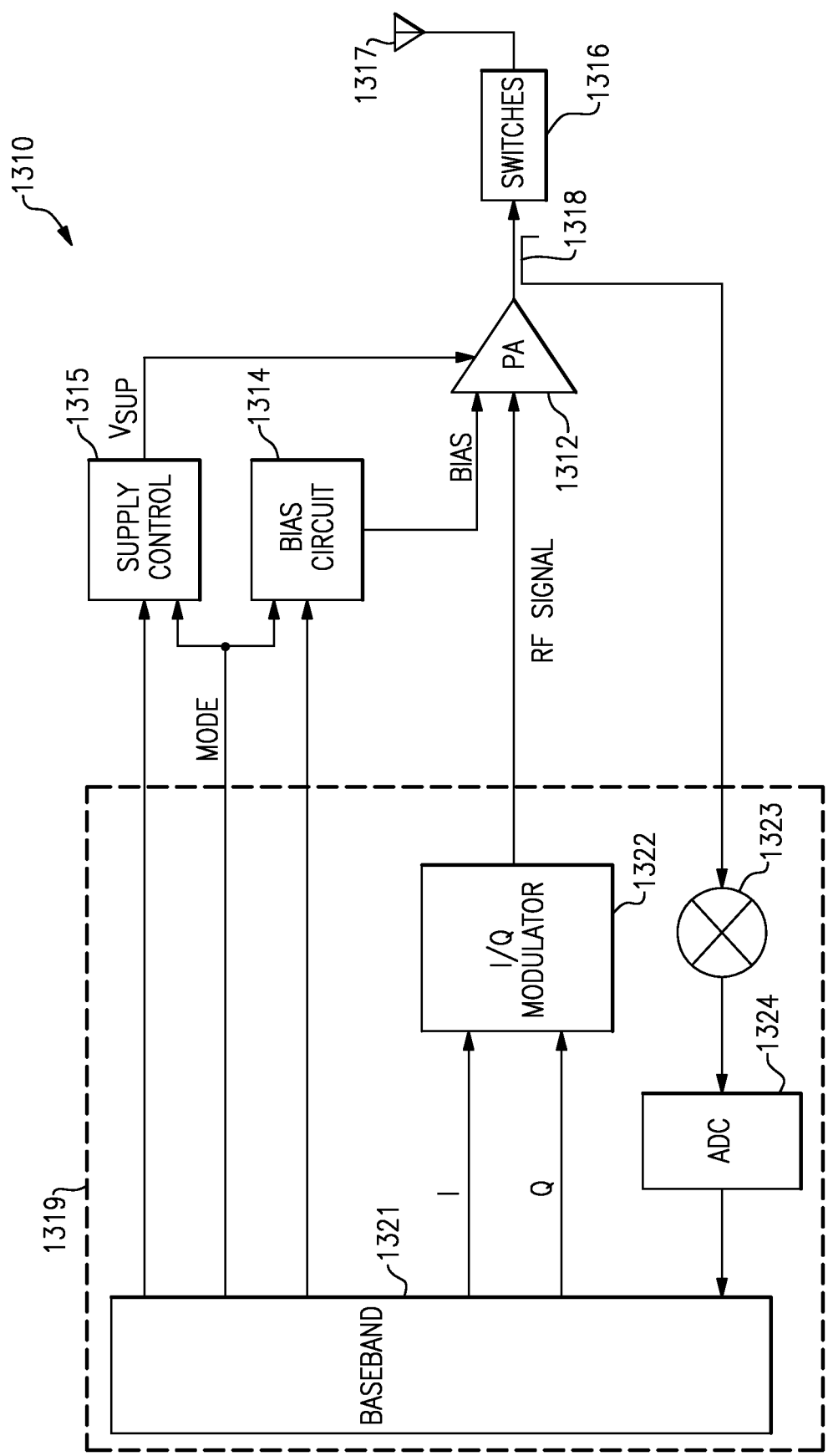
FIG. 50 is a schematic diagram of an example power amplifier system.

FIG. 50 is a schematic diagram of a power amplifier system 1310. The illustrated power amplifier system 1310 includes a power amplifier 1312, a bias circuit 1314, a supply control circuit 1315, switches 1316, an antenna 1317, a directional coupler 1318, and a transmitter 1319. The power amplifier system 1310 can operate in multiple modes of operation. The multiples modes of operation can include at least two different modes of operation in which the supply control circuit 1315 provides a supply voltage VSUP having different voltage levels to the power amplifier 1312. The bias circuit 1314 can bias the power amplifier 1312 differently in two or more of the at least two different modes of operation. A power amplifier circuit can include the power amplifier 1312 and the bias circuit 1314. The illustrated transmitter 1319 includes a baseband processor 1321, an I/Q modulator 1322, a mixer 1323, and an analog-to-digital converter (ADC) 1324. The transmitter 1319 can be included in a transceiver that also includes circuitry associated with receiving signals from an antenna (for instance, the antenna 1317) over one or more receive paths.

The power amplifier 1312 can amplify an RF signal. The RF signal can be provided by the I/Q modulator 1322 of the transmitter 1319. The amplified RF signal generated by the power amplifier 1312 can be provided to the antenna 1317 by way of the switches 1316. The amplified RF signal can have a substantially constant envelope in certain applications. The amplified RF signal can have a variable envelope in some applications. Moreover, the power amplifier 1312 can provide an amplified RF signal that has a substantially constant envelope in one mode and a variable envelope in another mode. The power amplifier 1312 can be operated in multiple modes, such as multiple power modes. The power amplifier 1312 can include a stacked transistor topology, such as any of the stacked topologies discussed herein. The power amplifier 1312 can be implemented by silicon-on-insulator technology. The power amplifier 1312 can include field effect and/or bipolar transistors.

The voltage level of the supply voltage VSUP provided to the power amplifier 1312 can be different in different modes of operation. The supply control circuit 1315 can be any suitable circuit to provide the supply voltage VSUP to the power amplifier 1312. The supply control circuit 1315 can include a direct current to direct current (DC-DC) converter, for example. The supply control circuit 15 can include any other suitable switching regulator, such a buck and/or boost converter in certain implementations.

In certain implementations, the power amplifier 1312 is a multi-stage power amplifier. The supply control circuit 1315 can provide different supply voltages for different stages of the multi-stage power amplifier. The voltage level of the supply voltage VSUP provided to an output stage of the power amplifier 1312 can be significantly lower (e.g., about 60% lower) in one mode of operation than in another mode of operation. Significant differences in the voltage level of the supply voltage can result in reduced headroom operation that can drive a stacked transistor circuit topology into early power compression. Early power compression can degrade performance of the power amplifier 1312. For instance, early power compression can reduce OP1 dB, PSAT, PAE, the like, or any combination thereof of the power amplifier 1312.

The bias signal BIAS received by the power amplifier 1312 from the bias circuit 1314 can bias the power amplifier 1312 for operation in the various modes of the multiple modes. The bias circuit 1314 can be implemented by any suitable bias circuit for the power amplifier 1312. The bias circuit 1314 can bias a transistor in a stacked transistor power amplifier stage of the power amplifier 1312 to a linear region of operation in a first mode and bias the transistor in the stacked transistor power amplifier stage as a switch in a second mode in which the voltage level of the supply voltage VSUP is significantly lower than in the first mode. For instance, a common gate transistor (or a common base transistor in a bipolar implementation) of the stacked transistor power amplifier stage can be operated in the linear region in the first mode and turned ON hard to act as a switch in the second mode. This can reduce or eliminate the common gate transistor's effect on headroom when the transistor is biased as a switch. Accordingly, the OP1 dB and PSAT can be improved in the second mode.

In the illustrated power amplifier system 1310, the directional coupler 1318 is coupled between the output of the power amplifier 1312 and the input of the switches 1318, thereby allowing a measurement of output power of the power amplifier 1312 that does not include insertion loss of the switches 1317. The sensed output signal from the directional coupler 1318 can be provided to the mixer 1323, which can multiply the sensed output signal by a reference signal of a controlled frequency so as to downshift the frequency content of the sensed output signal to generate a downshifted signal. The downshifted signal can be provided to the ADC 1324, which can convert the downshifted signal to a digital format suitable for processing by the baseband processor 1321.

By including a feedback path between the output of the power amplifier 1312 and the baseband processor 1321, the baseband processor 1321 can be configured to dynamically adjust the I and Q signals to optimize the operation of the power amplifier system 1310. For example, configuring the power amplifier system 1310 in this manner can aid in controlling the power added efficiency (PAE) and/or linearity of the power amplifier 1312.

The baseband signal processor 1321 can generate an I signal and a Q signal, which can be used to represent a sinusoidal wave or signal of a desired amplitude, frequency, and phase. For example, the I signal can be used to represent an in-phase component of the sinusoidal wave and the Q signal can be used to represent a quadrature component of the sinusoidal wave, which can be an equivalent representation of the sinusoidal wave. In certain implementations, the I and Q signals can be provided to the I/Q modulator 1322 in a digital format. The baseband processor 1321 can be any suitable processor configured to process a baseband signal. For instance, the baseband processor 1321 can include a digital signal processor, a microprocessor, a programmable core, or any combination thereof. Moreover, in some implementations, two or more baseband processors 1321 can be included in the power amplifier system 1310.

The I/Q modulator 1322 can receive the I and Q signals from the baseband processor 1321 and to process the I and Q signals to generate an RF signal. For example, the I/Q modulator 1322 can include digital-to-analog converters (DACs) configured to convert the I and Q signals into an analog format, mixers for upconverting the I and Q signals to radio frequency, and a signal combiner for combining the upconverted I and Q signals into an RF signal suitable for amplification by the power amplifier 1312. In certain implementations, the I/Q modulator 1322 can include one or more filters configured to filter frequency content of signals processed therein.

Transistor stacking can be implemented in silicon-on-insulator power amplifiers. For instance, such transistor stacking can be implemented in the power amplifier 1312 of FIG. 50. The transistor stacking can overcome relatively low breakdown voltages of scaled transistors, especially when exposed to voltage swing exceeding a voltage swing that can be accommodated by each transistor in the stacked such as 2.75 Volts.

Figure 51:
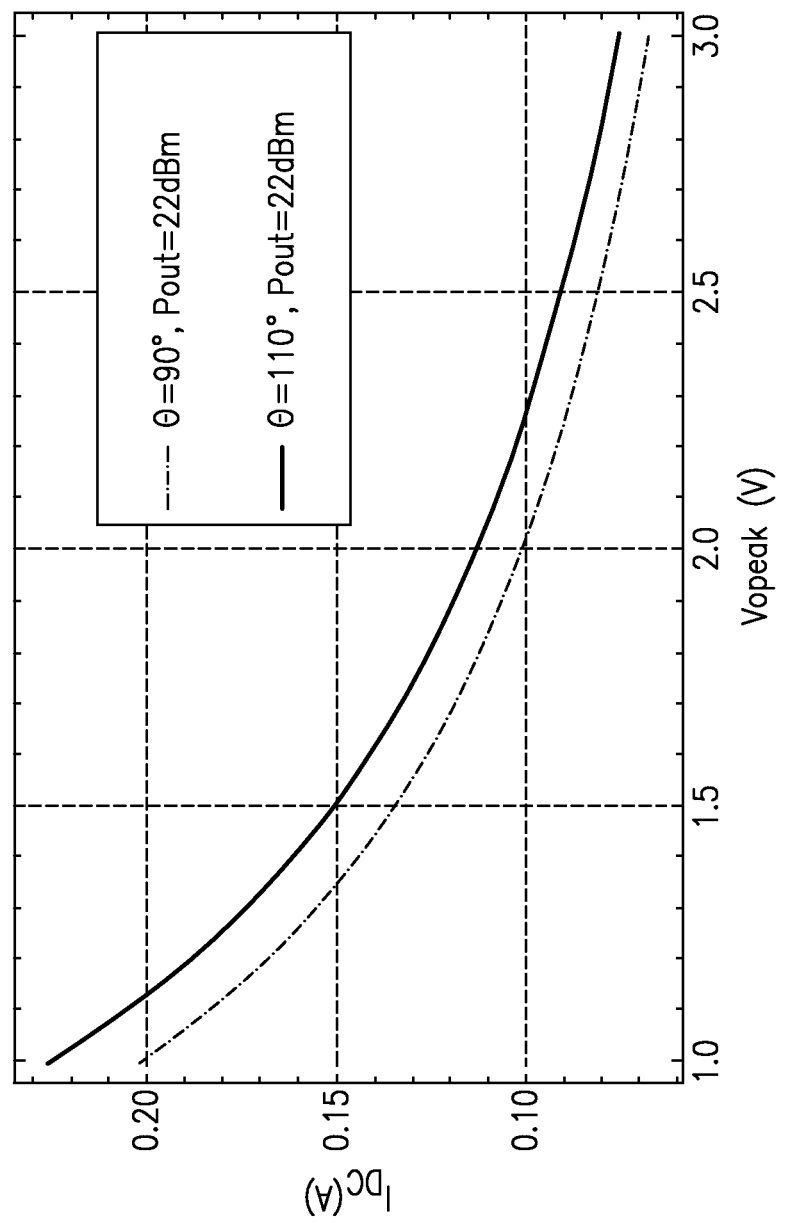
FIG. 51 is a graph illustrating a relationship between peak output voltage and direct current (DC) current for different conduction angles of a stacked amplifier at a fixed output power level.

FIG. 51 is a graph illustrating a relationship between peak output voltage and direct current (DC) current for conduction angles of a stacked amplifier at a fixed output power level.

Figure 52A:
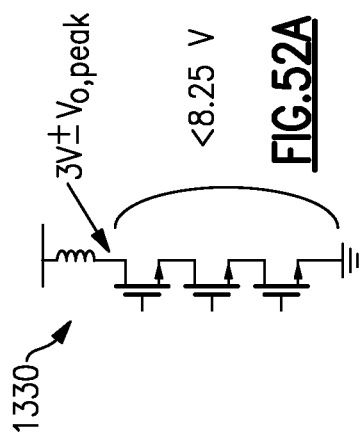
FIG. 52A illustrates a stacked amplifier with three transistors in the stack and a maximum allowable voltage swing of the stacked amplifier for a supply voltage.

FIG. 52A illustrates a stacked amplifier 1330 with three transistors in the stack and a voltage swing of the stacked amplifier for a supply voltage. Stacking three transistors as shown in FIG. 52A can enable power amplifier operation to work well with supply voltages between about 3 Volts to 3.6 Volts and voltage swings approaching greater than 8 Volts. For example, when each transistor in the stack can accommodate a voltage swing of up to about 2.75 Volts, the three stacked transistors can together accommodate a voltage swing of up to about 8.25 Volts without experiencing significant hot carrier injection (HCI) and corresponding long-term effects of reduced transistor drain current and increased transistor leakage.

Figure 52B:
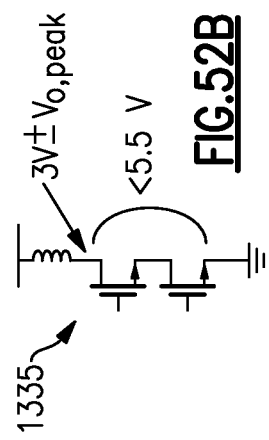
FIG. 52B illustrates a stacked amplifier with two transistors in the stack and a maximum allowable voltage swing of the stacked amplifier for the same supply voltage as FIG. 52A.

FIG. 52B illustrates a stacked amplifier 1335 with two transistors in the stack and a voltage swing of the stacked amplifier for the same supply voltage as FIG. 52A. Compared to the stacked amplifier 1330, the stacked amplifier 1335 can accommodate about two thirds of the voltage swing. As an example, when each transistor in the stacked amplifier 1335 can accommodate a voltage swing of up to about 2.75 Volts, the two stacked transistors can together accommodate a voltage swing of up to about 5.5 Volts without introducing significant HCI effects. Accordingly, the stacked amplifier 1335 may not be suitable for applications with voltage swings of greater than 5.5 Volts in this example. As such, for applications with voltage swings of greater than 5.5 Volts, three or more transistors can be included in series with each other in a stacked amplifier.

For amplifiers operable with variable supply voltage levels in multiple power modes, headroom can be reduced in lower power modes with lower supply voltages. This can drive the stacked amplifier into early compression, which can reduce OP1 dB and PAE. By having at least one less transistor in the stack, problems associated with reduced headroom can be reduced or eliminated. Accordingly, the stacked amplifier 1335 can be more suitable than the stacked amplifier 1330 when the supply voltage has a lower voltage level. Embodiments discussed herein relate to biasing stacked amplifiers such that they behave like the stacked amplifier 1330 in a first mode with a supply voltage having a relatively high voltage level and such that they behave like the stacked amplifier 1335 in a second mode with the supply voltage having a relatively low voltage level. As such, this biasing can enable the stacked amplifier to accommodate a relatively high voltage swing when the supply voltage has a relatively high voltage level and also to reduce or eliminate problems associated with headroom when the supply voltage has a relatively low voltage level.

Figure 53A:
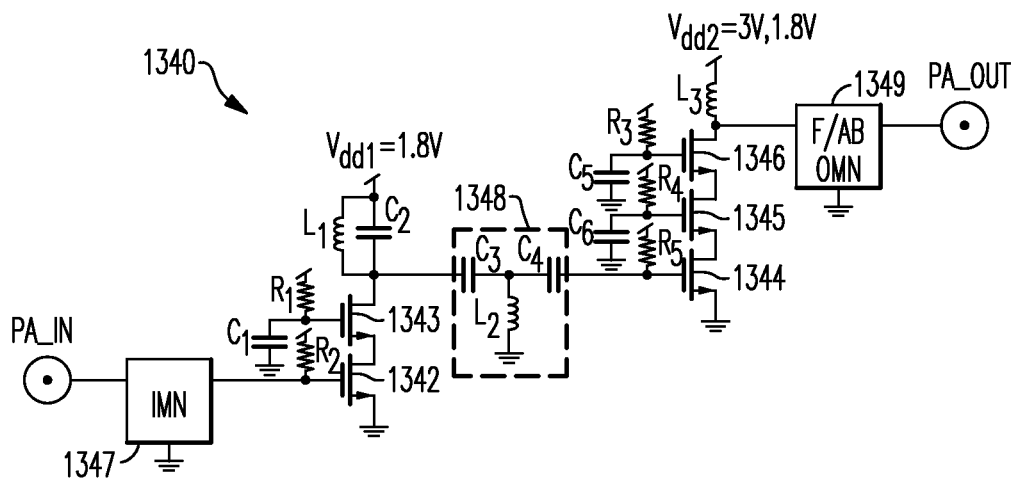
FIG. 53A is a schematic diagram of a triple-stacked power amplifier architecture with conceptual biasing illustrated for two modes of operation according to an embodiment.

FIG. 53A is a schematic diagram of a power amplifier system 1340 with conceptual biasing illustrated for two modes of operation of a stacked output stage according to an embodiment. The illustrated power amplifier system 1340 includes an input stage, an output stage, matching networks, and biasing circuit elements. The power amplifier system can receive an RF input signal PA_IN and provide an amplified RF output signal PA_OUT. The power amplifier 1312 of FIG. 50 can be implemented in accordance with any of the principles and advantages of the power amplifier system 1340.

As illustrated, the input stage includes a stacked amplifier implemented by transistors 1342 and 1343. Such an amplifier can be referred to as a cascode amplifier. The stacked amplifier of the input stage can be biased by conceptual biasing circuit elements R1 and R2. The conceptual bias circuit elements R1 and R2 can be implemented by any suitable biasing circuit elements and can include circuitry in additional to and/or in place of the illustrated resistors. An AC grounding gate capacitor C1 can be electrically connected to the common gate transistor 1343. In some other implementations, the input stage can alternatively include an injection-lockable power oscillator that can be frequency and phase locked to an input modulated signal. The input stage can receive an input stage supply voltage Vdd1. A parallel LC circuit including an inductor L1 and a capacitor C2 can provide the input stage supply voltage Vdd1 to the stacked amplifier of the input stage. The input stage supply voltage Vdd1 can be substantially the same in different modes of operation.

The output stage of the illustrated power amplifier system 1340 is a triple-stacked amplifier. The illustrated output stage includes two common gate transistors 1345 and 1346 in series with a common source transistor 1344. The transistors 1344, 1345, and 1346 can be silicon-on-insulator transistors. The transistor 1345 can be biased to a linear region of operation by conceptual biasing circuit element R4. Similarly, the transistor 1346 can be biased to a linear region of operation by conceptual biasing circuit element R3. The conceptual bias circuit elements R3 and R4 can be implemented by any suitable biasing circuit elements and can include circuitry in additional to and/or in place of the illustrated resistors. AC grounding gate capacitors C5 and C6 can be electrically connected to gates of the common gate transistors 1346 and 1345, respectively. The transistor 1344 can be biased by a biasing circuit element R5. Such a triple-stacked output stage can prevent breakdown in modes of operation in which an output stage supply voltage Vdd2 is 3 Volts and 1.8 Volts, respectively, for example. In the circuit illustrated in FIG. 53A, the output stage supply voltage Vdd2 being 3 Volts corresponds to a first mode and the output stage supply voltage Vdd2 being 1.8 Volts corresponds to a third mode.

The power amplifier system 1340 can include matching networks for impedance matching. The illustrated matching networks include an input matching network 1347, an inter-stage matching network 1348, and an output matching network 1349. In FIG. 53A, an input matching network 1347 is electrically coupled between an input of the power amplifier system and the input stage. The inter-stage matching network 1348 can include any suitable circuit elements for inter-stage impedance matching. An inter-stage matching network between stages of power amplifiers discussed herein can include a T-network and/or a pi-network in certain applications. The illustrated inter-stage matching network 1348 includes capacitors C3 and C4 and inductor L2 arranged as a T-network. The output matching network 1349 can be a class F output matching network, a class AB output matching network, a class B output matching network, or any other suitable output matching network. The output stage of the power amplifier system 1340 can drive any suitable load.

Figure 53B:
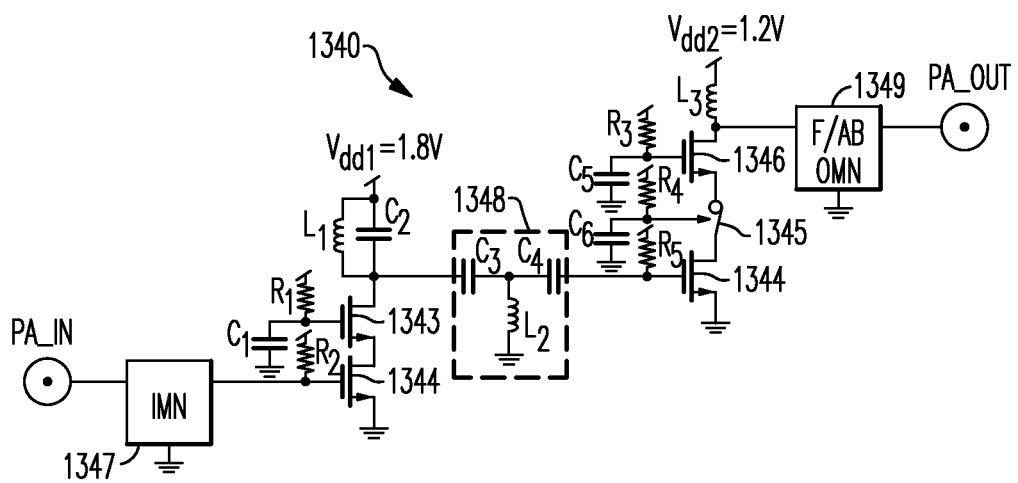
FIG. 53B is a schematic diagram of the triple-stacked power amplifier architecture of FIG. 53A with conceptual biasing illustrated for a different mode of operation.

FIG. 53B is a schematic diagram of the power amplifier system 1340 of FIG. 53A with biasing illustrated for a second mode of operation according to an embodiment. The second mode of operation can be a lower power mode than the modes associated with the biasing in FIG. 53A. As illustrated in FIG. 53B, the output stage supply voltage Vdd2 is 1.2 Volts. The common gate transistor 1345 is biased so as to operate as a switch instead of a common gate stage in FIG. 53B. The common gate transistor 1345 can be turned ON hard enough such that its VDS is sufficiently low (e.g., less than about 100 mV or less than about 75 mV) to make its effect on headroom insignificant. This can allow the PSAT to about around 13 dBm in the second mode of operation in certain implementations.

Accordingly, the power amplifier system 1340 can operate in at least three different power modes with different output stage supply voltages. In the example of FIGS. 53A and 53B, the output stage supply voltage Vdd2 can be 3 Volts in a high power mode, the output stage supply voltage Vdd2 can be 1.8 Volts in a medium power mode, and the output stage supply voltage Vdd2 can be 1.2 Volts in a low power mode. The high power mode can be a first mode, the lower power mode can be a second mode, and the medium power mode can be a third mode. The common gate transistor 1345 can be biased to a linear region of operation in the high power mode and the medium power mode, as illustrated in FIG. 53A. In the low power mode, the common gate transistor 1345 can be biased to as a switch, as illustrated in FIG. 53B. As such, the same power amplifier can be used in multiple power modes of operation while meeting performance specifications for each of the multiple power modes.

Figure 53C:
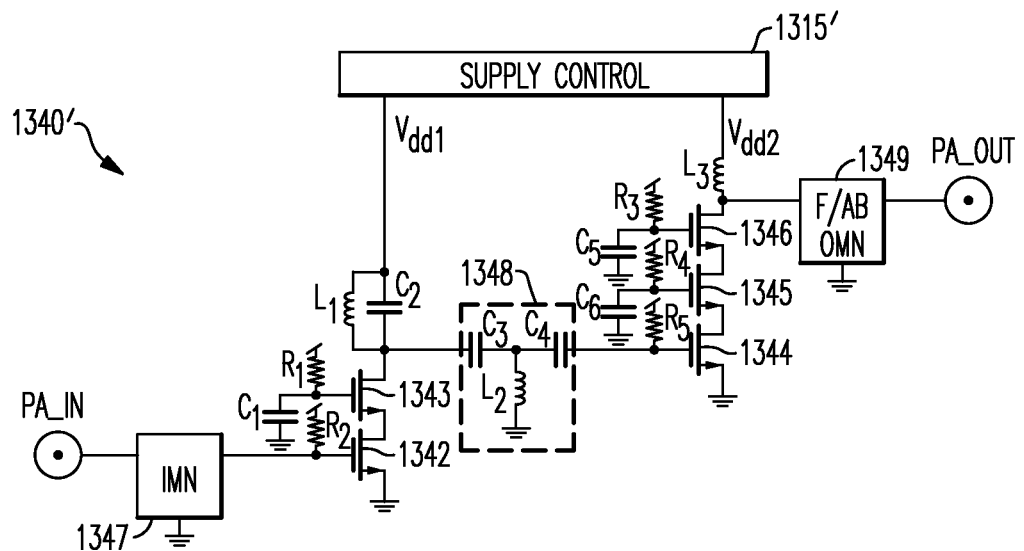
FIG. 53C is a schematic diagram of a power amplifier system with conceptual biasing illustrated for a first mode of operation according to an embodiment.
Figure 53D:
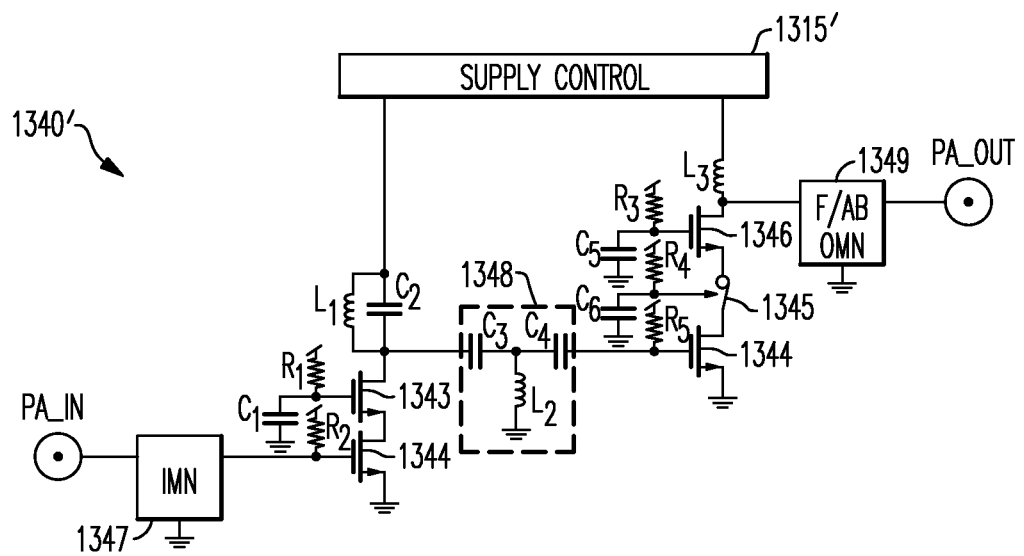
FIG. 53D is a schematic diagram of the power amplifier system of FIG. 53C with conceptual biasing illustrated for a second mode of operation.

FIG. 53C is a schematic diagram of a power amplifier system 1340' with conceptual biasing illustrated for a first mode of operation according to an embodiment. FIG. 53D is a schematic diagram of the power amplifier system 1340' of FIG. 53C with conceptual biasing illustrated for a second mode of operation. The power amplifier system 1340' is like the power amplifier system 1340 of FIGS. 53A and 53B except that a supply control circuit 1315' is included. The supply control circuit 1315' can implement any suitable features of the supply control circuit 1315 of FIG. 50. The supply control circuit 1315' can provide the input stage supply voltage Vdd1 and the output stage supply voltage Vdd2 to the power amplifier. The input stage supply voltage Vdd1 can have substantially the same voltage level in different modes of operation. The supply control circuit 1315' can provide the output stage supply voltage Vdd2 such that the output stage supply voltage Vdd2 has a higher voltage level in the first mode corresponding to FIG. 53C than in the second mode corresponding to FIG. 53D. The supply control circuit 1315' can include any suitable circuit configured to perform this functionality. For instance, the supply control circuit 1315' can include a DC-DC converter or any other suitable switching regulator, such a buck and/or boost converter in certain implementations.

FIGS. 53A to 53D show an embodiment of an output stage of a power amplifier. FIGS. 54A to 57B illustrate embodiments of stacked amplifiers and bias circuits. Any of the principles and advantages discussed with reference to any of these figures can be implemented in the power amplifier 1312 of FIG. 50 and/or the output stage of the power amplifier system 1340. Moreover, any of the principles and advantages of the stacked amplifiers and bias circuits discussed herein can be implemented in other contexts.

Figure 54A:
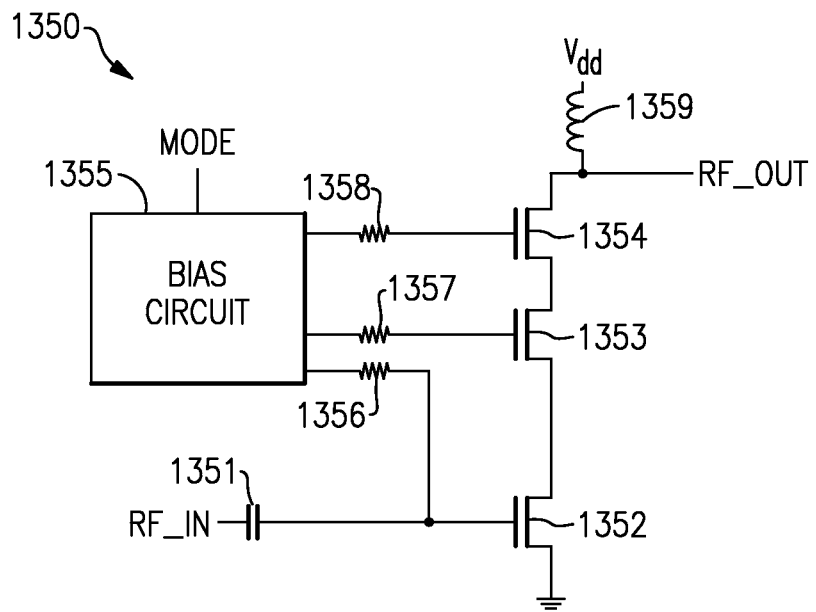
FIG. 54A is a schematic diagram of a stacked amplifier and a bias circuit in a first mode according to an embodiment.

FIG. 54A is a schematic diagram of an amplification circuit 1350 that includes a stacked amplifier and a bias circuit in a first mode according to an embodiment. The stacked amplifier can amplify an RF signal. A DC blocking capacitor 1351 can provide an RF signal to an input of the stacked amplifier. As illustrated, the stacked amplifier includes transistors 1352, 1353, and 1354 arranged in series with each other. The transistors 1352, 1353, and 1354 can be silicon-on-insulator field effect transistors. The bias circuit 1355 can bias the transistors of the stacked amplifier. The bias circuit 1355 can dynamically bias the transistors of the stacked amplifier responsive to a control signal MODE. The stacked amplifier can receive bias signals by way of biasing circuit elements 1356, 1357, and 1358. In the first mode, the bias circuit 1355 biases the transistor 1353 to a linear region of operation. The stacked amplifier can receive a supply voltage $V_{dd}$ by way of an inductor 1359.

Figure 54B:
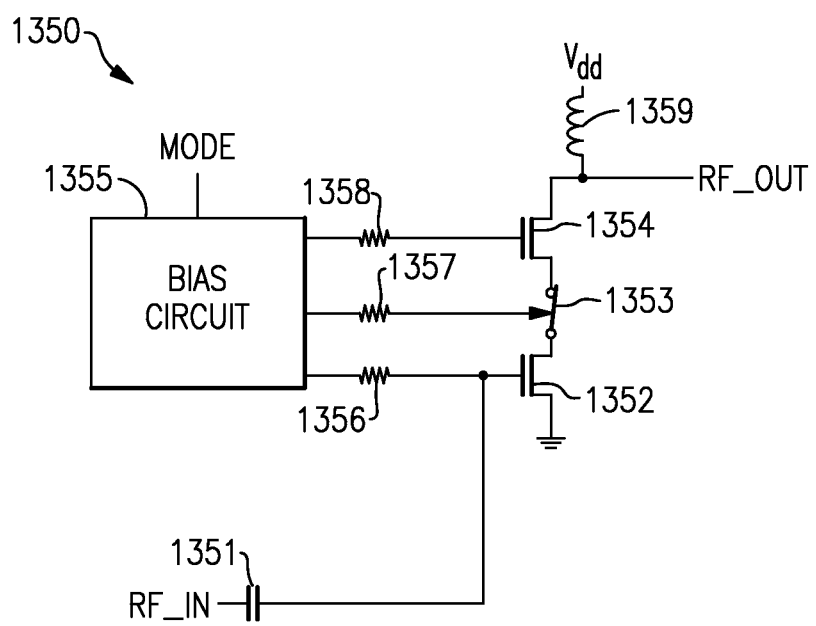
FIG. 54B is a schematic diagram of the stacked amplifier and the bias circuit of FIG. 54A in a second mode according to an embodiment.

FIG. 54B is a schematic diagram of the amplification circuit 1350 of FIG. 54A in a second mode according to an embodiment. The second mode can be associated with a lower power than the first mode. In the second mode of operation, the supply voltage $V_{dd}$ provided to the stacked amplifier can have a higher voltage level than in the first mode. The mode control signal MODE provided to the bias circuit 1355 can be at a different signal level and/or in a different state. Responsive to the mode control signal MODE, the bias circuit 1355 can bias the transistor 1353 as a switch. The transistor 1353 can operate in a saturation region of operation in the second mode.

Figure 55A:
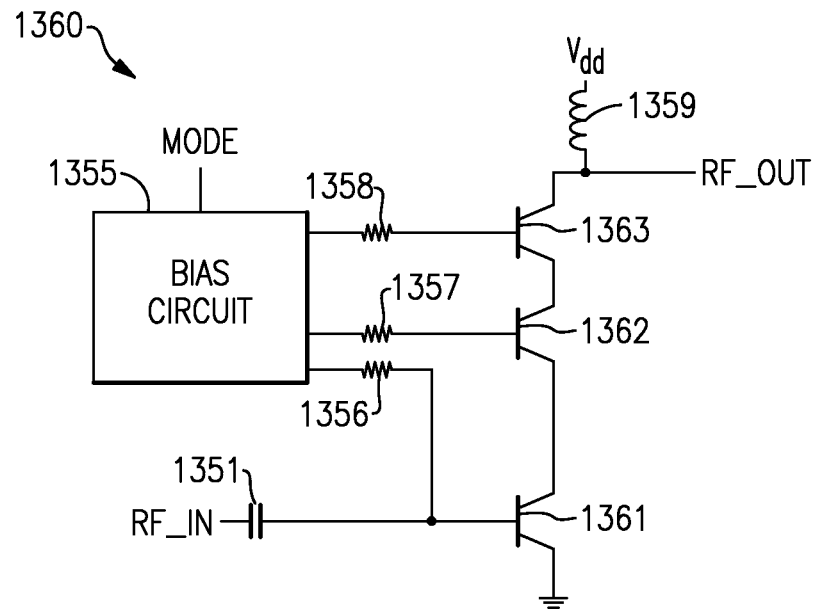
FIG. 55A is a schematic diagram of a stacked amplifier with bipolar transistors and a bias circuit in a first mode according to an embodiment.

FIG. 55A is a schematic diagram of an amplification circuit 1360 that includes a stacked amplifier and a bias circuit in a first mode according to an embodiment. The amplification circuit 1360 is like the amplification circuit 1350 except the stacked amplifier is implemented by bipolar transistors. As illustrated in FIG. 55A, the stacked amplifier includes two common base transistors 1362 and 1363 in series with a common emitter transistor 1361. The bipolar transistors illustrated in FIG. 55A can be implemented by semiconductor-on-insulator technology. Any suitable circuit topologies discussed and/or illustrated herein with field effect transistors can alternatively be implemented by bipolar transistors. According to some other embodiments, the amplification circuit 1360 can include an RF impedance, such as an inductor, disposed between the bias circuit 1355 and the base of the transistor 1361 in place of the resistor illustrated in FIGS. 55A and 55B. Alternatively or additionally, an amplification circuit with a stacked bipolar amplifier can be implemented without resistors disposed between a bias circuit and one or more of the bipolar transistors of the stack.

Figure 55B:
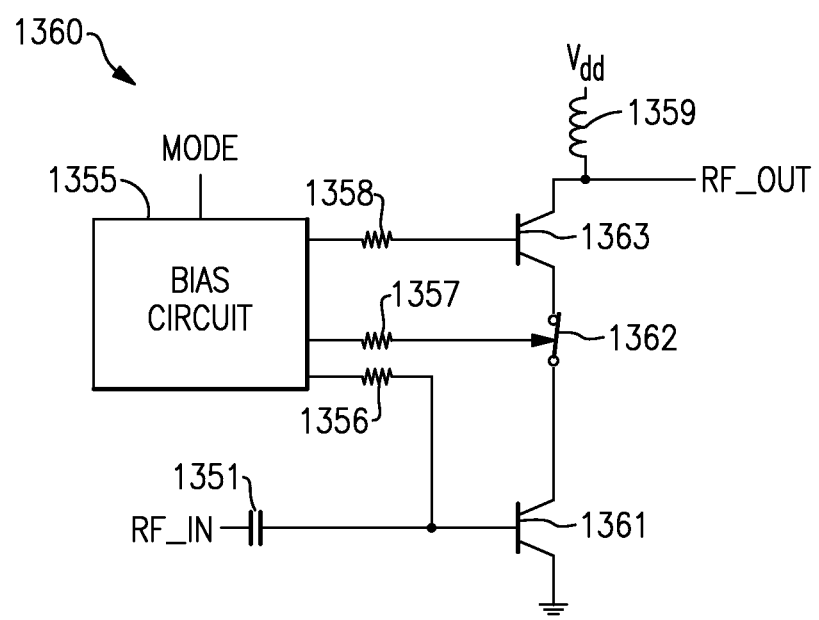
FIG. 55B is a schematic diagram of the stacked amplifier and the bias circuit of FIG. 55A in a second mode of operation according to an embodiment.

FIG. 55B is a schematic diagram of the amplification circuit 1360 of FIG. 55A in a second mode of operation according to an embodiment. In the second mode of operation, the transistor 1362 is biased as a switch.

Figure 56A:
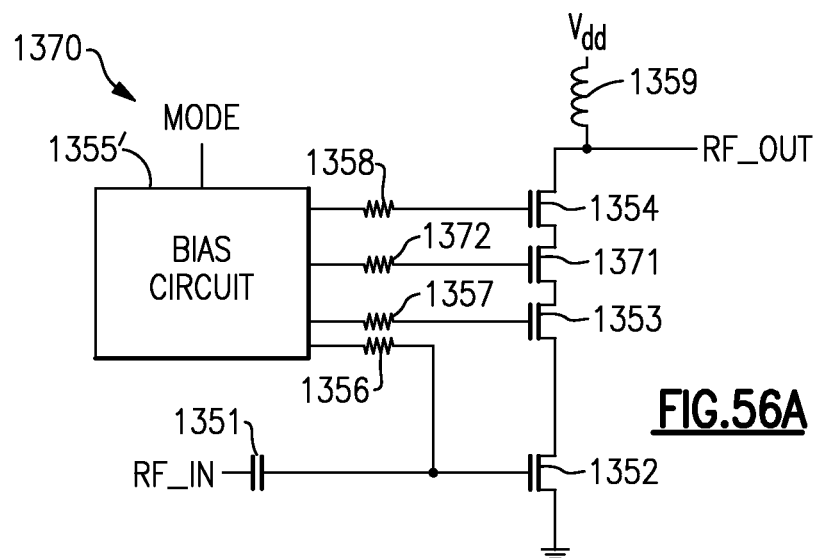
FIG. 56A is a schematic diagram of a stacked amplifier with four transistors in the stack and a bias circuit in a first mode according to an embodiment.

FIG. 56A is a schematic diagram of an amplification circuit 1370 that includes stacked amplifier with four transistors in the stack and a bias circuit in a first mode according to an embodiment. The amplification circuit 1370 is like the amplification circuit 1350 except the stacked amplifier is implemented by four transistors that are in series with each other. The stacked amplifier illustrated in FIG. 56A includes transistors 1352, 1353, 1371, and 1354. By having an additional transistor in the stack relative to the stacked amplifier shown in FIG. 54A, the stacked amplifier in FIG. 56A can accommodate a larger voltage swing. The bias circuit 1355' can bias the transistor 1371 by way of a biasing circuit element 1372. In the first mode, the transistors 1353 and 1371 can be biased in a linear region of operation.

Figure 56B:
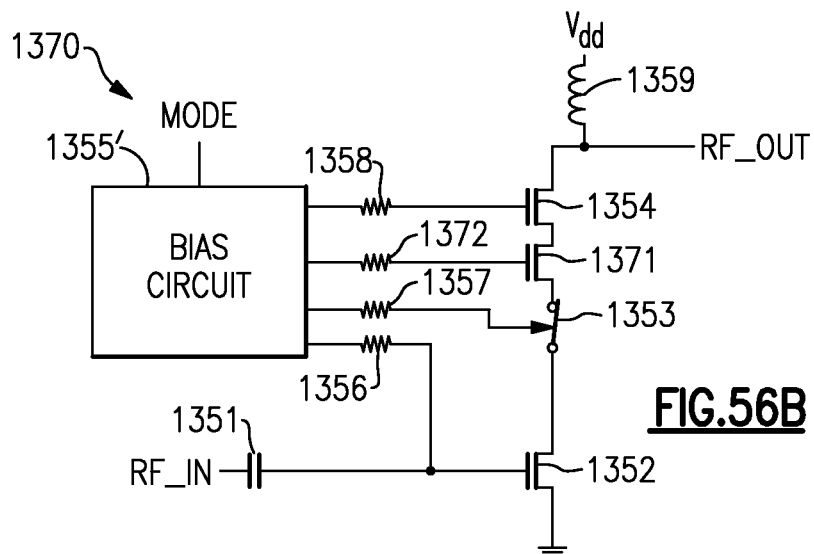
FIG. 56B is a schematic diagram of the stacked amplifier and the bias circuit of FIG. 56A in a different mode.
Figure 56C:
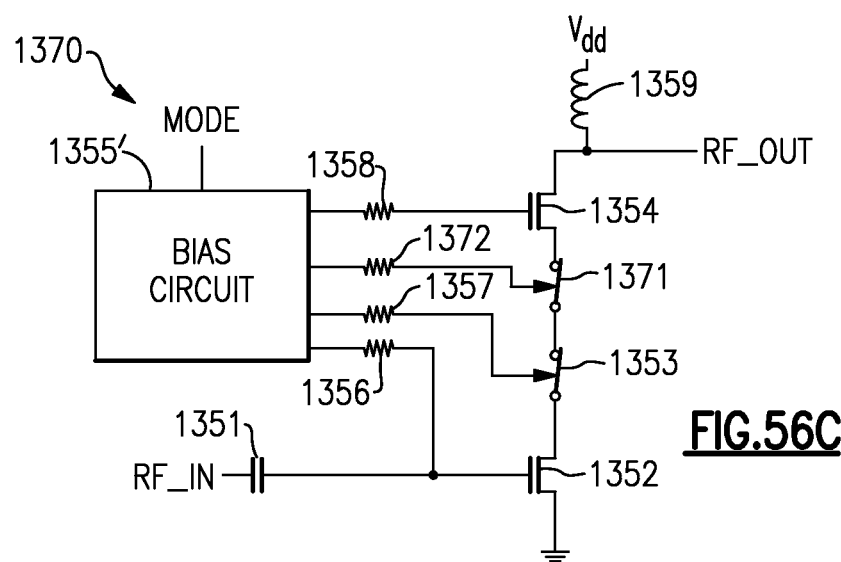
FIG. 56C is a schematic diagram of the stacked amplifier and the bias circuit of FIG. 56A in a different mode than FIGS. 56A and 56B.

FIGS. 56B and 56C are schematic diagrams of the stacked amplifier and the bias circuit of FIG. 56A in different modes according to an embodiment. As shown in FIG. 56B, the transistor 1353 can be biased as a switch in a second mode. The stacked amplifier of FIG. 56B can behave like a triple stack when the transistor 1353 is biased as a switch and the other transistors of the stack are biased as gain stages. As shown in FIG. 56C the transistors 1353 and 1371 can be biased as switches in another mode. The stacked amplifier of FIG. 56C can behave like a double stack when the transistors 1353 and 1371 are biased as switches and the other transistors of the stack are biased as gain stages. Accordingly, the bias circuit 1355' can bias the stacked amplifier of FIGS. 56A to 56C to behave as if 2, 3, or 4 transistors are in the stack. The principles and advantages discussed in this section can also be applied to stacked amplifiers having five or more transistors in series with each other.

Figure 57A:
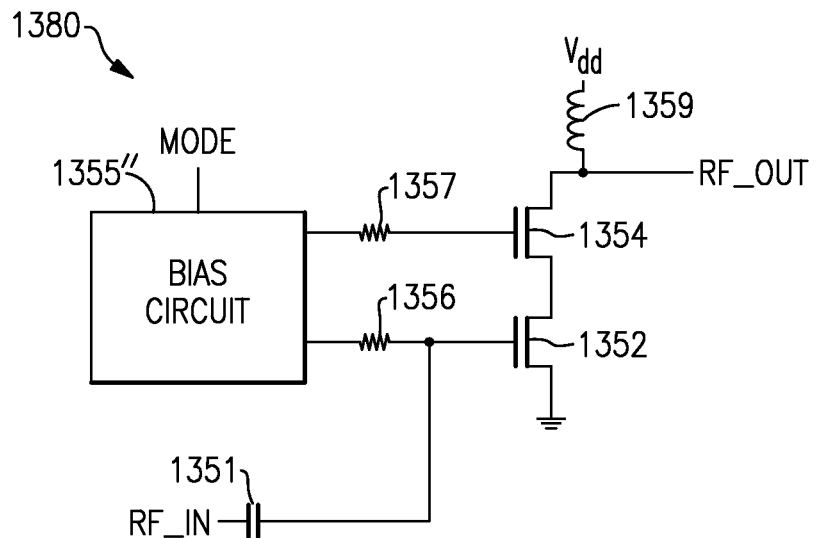
FIG. 57A is a schematic diagram of a stacked amplifier with two transistors in the stack and a bias circuit in a first mode according to an embodiment.

FIG. 57A is a schematic diagram of an amplification circuit 1380 that includes a stacked amplifier with two transistors in the stack and a bias circuit in a first mode according to an embodiment. The amplification circuit 1380 is like the amplification circuit 1350 except that the stacked amplifier is implemented by two transistors that are in series with each other. As shown in FIG. 57A, the bias circuit 1355" can bias the transistor 1353 to a linear region of operation in the first mode.

Figure 57B:
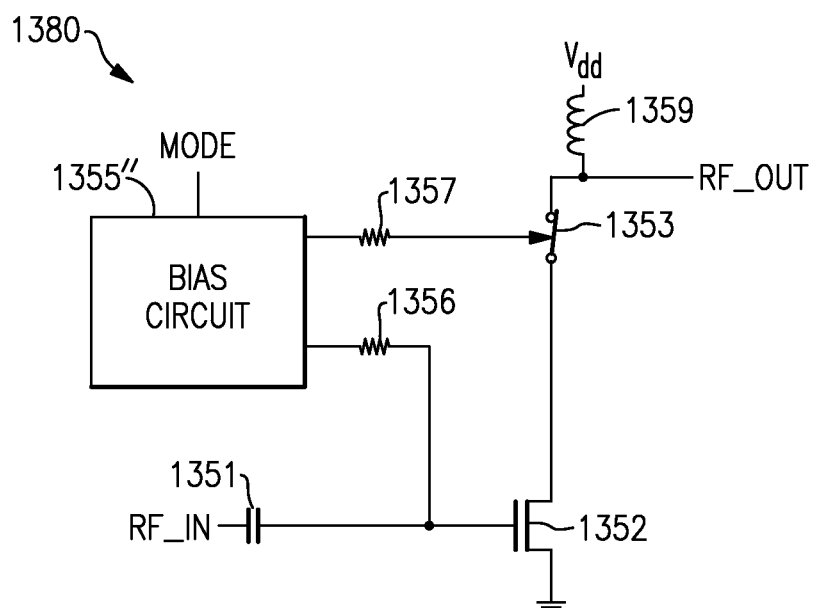
FIG. 57B is a schematic diagram of the stacked amplifier and the bias circuit of FIG. 57A in a second mode according to an embodiment.

FIG. 57B is a schematic diagram of the amplification circuit 1380 of FIG. 57A in a second mode according to an embodiment. As shown in FIG. 57A, the bias circuit 1355" can bias the transistor 1353 in as a switch in the second mode.

Figure 58A:
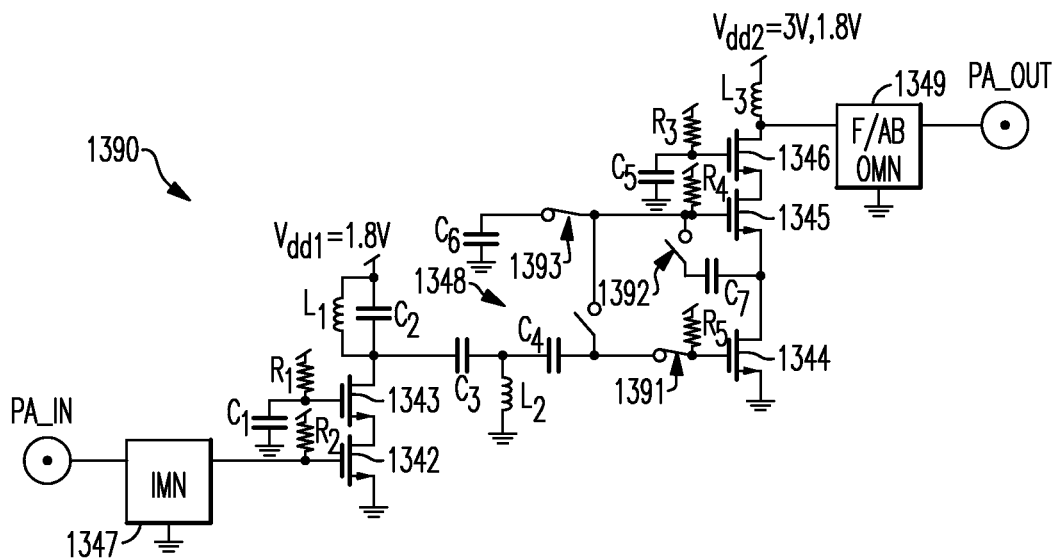
FIG. 58A is a schematic diagram of a triple-stacked power amplifier architecture having a switch to selectively provide an input signal to different transistors in the triple-stack according to an embodiment.
Figure 58B:
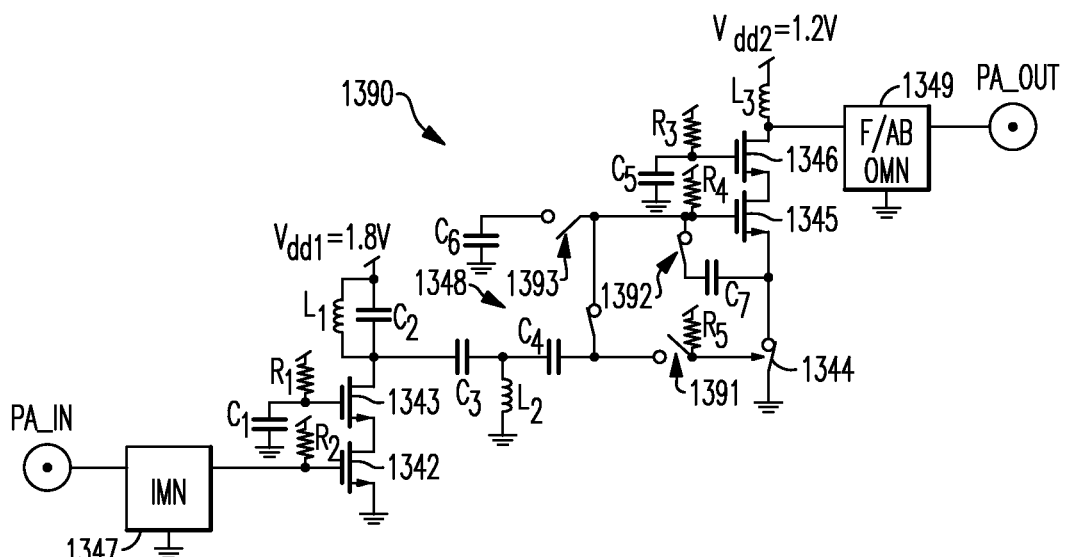
FIG. 58B is a schematic diagram of the triple-stacked power amplifier architecture of FIG. 58A with the conceptual biasing illustrated for a different mode of operation according to an embodiment.

FIG. 58A is a schematic diagram of a power amplifier system 1390 with biasing illustrated for two modes of operation according to an embodiment. FIG. 58B is a schematic diagram of the power amplifier system 1390 of FIG. 58A with biasing illustrated for a different mode of operation according to an embodiment. The power amplifier system 1390 is like the power amplifier system 1340 except that additional switches 1391, 1392, and 1393 are included and a different transistor in the stack can be biased as a switch in a mode associated with a lower output stage supply voltage. Any suitable control circuit can control the switches 1391, 1392, and 1393. In the power amplifier system 1390, the transistor 1344 can be biased to operate as a common source amplifier as shown in FIG. 58A or as a switch as shown in FIG. 58B.

The switch 1391 can selectively electrically couple an output of the input stage to different transistors of the output stage in different modes of operation. The switch 1391 can provide an RF input signal for the output stage to the transistor 1344 in as shown in FIG. 58A. The switch 1391 can provide the RF input signal to the output stage to the transistor 1345 in a different mode as shown in FIG. 58B. The switch 1391 can be a multi-throw switch, such as a single pole double throw switch.

The switch 1392 can maintain an RF inter-stage match. The switch 1392 can electrically couple a capacitor $C_7$ to the gate of the transistor 1345 to maintain the RF inter-stage match when the transistor 1344 is biased as a switch as shown in FIG. 58B. When the transistor 1345 is biased as a common gate amplifier as shown in FIG. 58A, the switch 1392 can electrically disconnect the capacitor $C_7$ from the gate of the transistor 1345.

The switch 1393 can electrically connects AC grounding gate capacitor $C_6$ to the gate of transistor 1345 when the transistor 1345 is configured as a common gate amplifier as shown in FIG. 58A. The switch 1393 can disconnect AC grounding gate capacitor $C_6$ from the gate of transistor 1345 when the transistor 1345 is configured as a common source amplifier as shown in FIG. 58B.

Any suitable combination of features of the power amplifier systems 1340 and 1390 can be implemented together with each other. The power amplifier 1312 of FIG. 50 can be implemented in accordance with any of the principles and advantages of the power amplifier system 1390. The power amplifier system 1390 can be implemented in accordance with any of the principles and advantages discussed herein, such as with reference to any of FIGS. 54A to 57B.

The multi-mode power amplifiers discussed herein, which can be as described earlier in this section, can be included in any suitable front end system, packaged module, semiconductor die (e.g., a semiconductor-on-insulator die, such as a silicon-on-insulator die), wireless communication device (e.g., a mobile phone, such as a smart phone), or the like.

Section IV—Power Amplifier with Injection-Locked Oscillator Driver Stage

In accordance with some embodiments of this disclosure, this section of the present disclosure relates to a power amplifier with an injection-locked oscillator driver stage. In certain configurations, a multi-mode power amplifier includes a driver stage implemented using an injection-locked oscillator and an output stage having an adjustable supply voltage that changes based on a mode of the multi-mode power amplifier. By implementing the multi-mode power amplifier in this manner, the multi-mode power amplifier exhibits excellent efficiency, including when the voltage level of the adjustable supply voltage is relatively low. As indicated above, aspects of this section may be combined with other aspects of one or more other sections to further improve the performance of front end systems and related devices, integrated circuits, modules, and methods in which they are employed.

Certain power amplifiers are operable in multiple power modes. Implementing a power amplifier with multi-mode operation can provide a number of advantages relative to an implementation including a separate power amplifier associated with each power mode. For example, multi-mode power amplifiers can occupy a relatively small chip area. Additionally, multi-mode power amplifiers can avoid complications with matching networks and signal routing associated with using a different power amplifier for each power mode.

In mobile applications, prolonging battery lifetime can be significant. One function in mobile applications that consumes a significant amount of battery charge is power amplification.

A supply control circuit can provide a multi-mode power amplifier with a supply voltage that can vary or change depending on a mode of operation of the power amplifier. The mode of operation can be selected to achieve desired performance while increasing efficiency and/or extending battery life. Thus, the supply control circuit can employ various power management techniques to change the voltage level of the supply voltage to improve the power amplifier's power added efficiency (PAE).

One technique for improving power amplifier efficiency is to provide a variable supply voltage with selectable voltage levels based on power mode. For instance, a lower supply voltage can be provided in a lower power mode and a higher supply voltage can be provided in a higher power mode. The multi-mode power amplifier can include any suitable number of supply voltage levels and corresponding power modes, for instance, 2 power modes, 3 power modes, or 4 or more power modes.

In certain configurations, a power amplifier includes multiple stages and the supply voltage provided to a final or output stage can be varied depending on the power mode while a different supply voltage for at least one driver stage can remain substantially constant.

When a supply voltage for a power amplifier is reduced in a lower power mode for efficiency purposes, the supply voltage can be significantly lower than for a higher power mode. In one example, the supply voltage for a lower power mode can be about 60% below the supply voltage for a higher mode. However, other supply voltage levels are possible.

Apparatus and methods for power amplifiers with an injection-locked driver stage are provided herein. In certain configurations, a multi-mode power amplifier includes a driver stage implemented using an injection-locked oscillator and an output stage having an adjustable supply voltage that changes based on a mode of the multi-mode power amplifier. By implementing the power amplifier in this manner, the power amplifier can exhibit excellent efficiency, including when the voltage level of the adjustable supply voltage is relatively low.

For example, in a low power mode, the adjustable supply voltage used to power the output stage is decreased, and the driver stage has a relatively large impact on the power amplifier's overall efficiency. By implementing the driver stage using an injection-locked oscillator, the overall efficiency of the multi-mode power amplifier is relatively high across different power modes.

The multi-mode power amplifiers discussed herein can exhibit excellent efficiency in a variety of applications, such as applications in which a driver stage operates using a substantially fixed voltage and an output stage operates with large differences in supply voltage across different modes of operation.

The power amplifiers disclosed herein can be implemented using a variety of semiconductor processing technologies, including, but not limited to, semiconductor-on-insulator technology, such as silicon-on-insulator (SOI) technology. Using SOI technology can enable implementation of power amplifiers in a relatively inexpensive and/or reliable manufacturing process. Moreover, desirable performance of low-noise amplifiers (LNAs) and/or radio frequency (RF) switches in SOI technology enables a power amplifier to be implemented as part of a front end integrated circuit (FEIC) that provides transmit, receive, and switching functionality.

Figure 59:
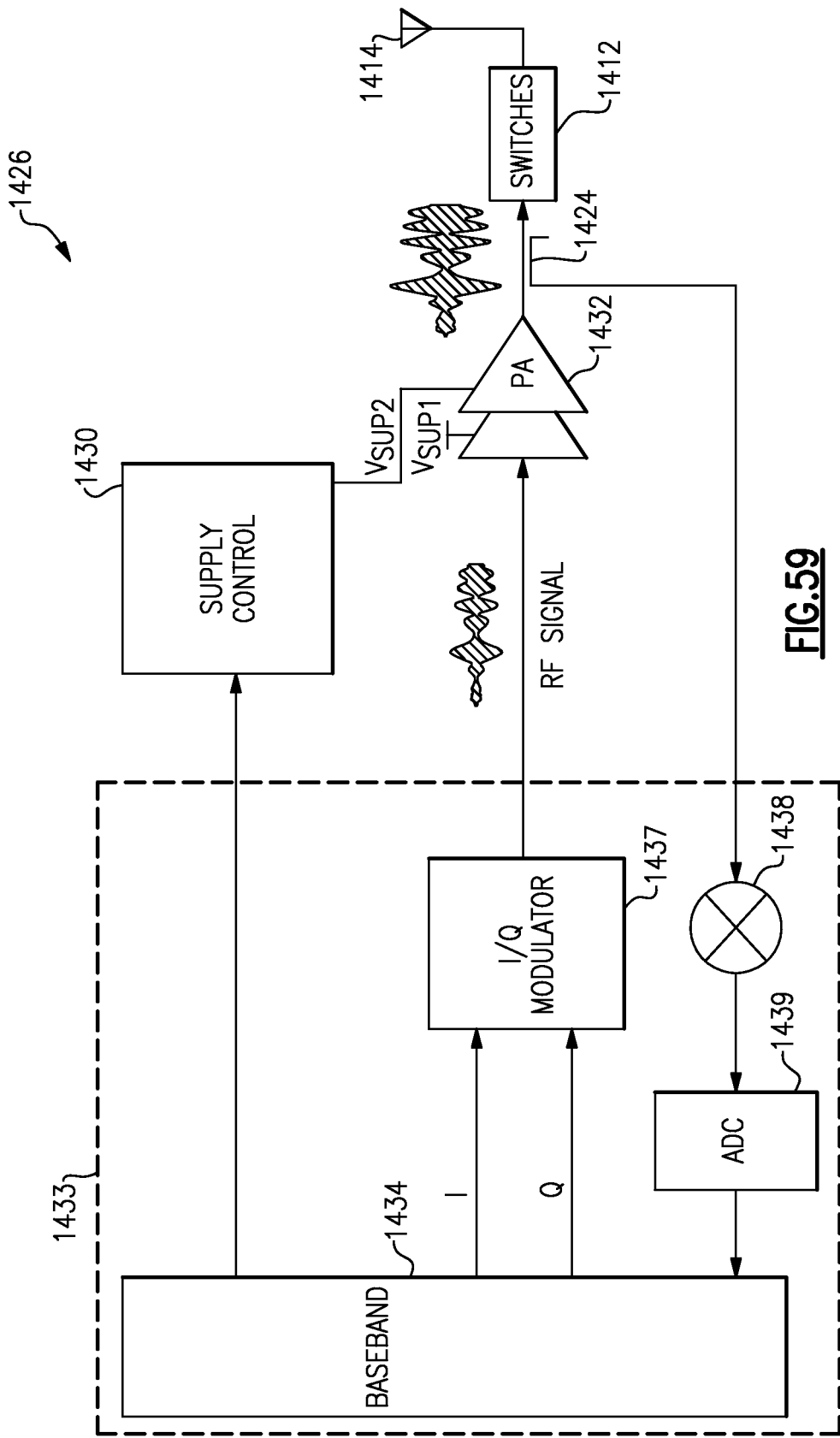
FIG. 59 is a schematic diagram of one example of a power amplifier system.

FIG. 59 is a schematic diagram of one example of a power amplifier system 1426. The illustrated power amplifier system 1426 includes a multi-mode power amplifier 1432, a supply control circuit 1430, switches 1412, an antenna 1414, a directional coupler 1424, and a transmitter 1433.

The power amplifier system 1426 operates in multiple modes of operation. The multiple modes include at least two different modes of operation in which the supply control circuit 1430 provides a supply voltage of different voltage levels to the multi-mode power amplifier 1432.

The illustrated transmitter 1433 includes a baseband processor 1434 an I/Q modulator 1437, a mixer 1438, and an analog-to-digital converter (ADC) 1439. The transmitter 1433 can be included in a transceiver that also includes circuitry associated with receiving signals from an antenna (for instance, the antenna 1414 or a separate antenna) over one or more receive paths.

The multi-mode power amplifier 1432 provides amplification to an RF signal. As shown in FIG. 59, the RF signal can be provided by the I/Q modulator 1437 of the transmitter 1433. The amplified RF signal generated by the multi-mode power amplifier 1432 can be provided to the antenna 1414 by way of the switches 1412. The multi-mode power amplifier 1432 can include a driver stage implemented using an injection-locked oscillator, such as any of the injection-locked oscillator topologies discussed herein.

In certain implementations, the multi-mode power amplifier 1432 is implemented using SOI technology. Implementing a power amplifier in this manner aids in integrating the power amplifier with other circuitry, including, for example, the switches 1412.

As shown in FIG. 59, the multi-mode power amplifier 1432 receives a first supply voltage $V_{SUP1}$ for a driver stage and a second supply voltage $V_{SUP2}$ for an output stage. In the illustrated embodiment, the supply control circuit 1430 controls the voltage level of the second supply voltage $V_{SUP2}$ based on a mode signal received from the transmitter 1433. In certain configurations, the voltage level of the first supply voltage $V_{SUP1}$ provided to the power amplifier's driver stage is substantially constant across two or more operating modes, but the voltage level of the second supply voltage $V_{SUP2}$ provided to the power amplifier's output stage changes based on the selected operating mode.

The supply control circuit 1430 can be any suitable circuit for providing the first supply voltage $V_{SUP1}$ and second supply voltage $V_{SUP2}$ to the multi-mode power amplifier 1432. In certain configurations, the supply control circuit 1430 includes at least one DC-to-DC converter, such as a buck converter, a boost converter, and/or a buck-boost converter.

In certain configurations, the voltage level of the second supply voltage $V_{SUP2}$ can be significantly lower (e.g., about 60% lower) in one mode of operation relative to another mode of operation. Significant differences in the voltage level of the supply voltage can result in decreased efficiency.

The baseband signal processor 1434 can generate an I signal and a Q signal, which can be used to represent a sinusoidal wave or signal of a desired amplitude, frequency, and phase. For example, the I signal can be used to represent an in-phase component of the sinusoidal wave and the Q signal can be used to represent a quadrature component of the sinusoidal wave, which can be an equivalent representation of the sinusoidal wave. In certain implementations, the I and Q signals can be provided to the I/Q modulator 1437 in a digital format. The baseband processor 1434 can be any suitable processor configured to process a baseband signal. For instance, the baseband processor 1434 can include a digital signal processor, a microprocessor, a programmable core, or any combination thereof. Moreover, in some implementations, two or more baseband processors 1434 can be included in the power amplifier system 1426.

The I/Q modulator 1437 can receive the I and Q signals from the baseband processor 1434 and to process the I and Q signals to generate an RF signal. For example, the I/Q modulator 1437 can include digital-to-analog converters (DACs) configured to convert the I and Q signals into an analog format, mixers for upconverting the I and Q signals to radio frequency, and a signal combiner for combining the upconverted I and Q signals into an RF signal suitable for amplification by the multi-mode power amplifier 1432. In certain implementations, the I/Q modulator 1437 can include one or more filters configured to filter frequency content of signals processed therein.

In the illustrated power amplifier system 1426, the directional coupler 1424 is positioned between the output of the multi-mode power amplifier 1432 and the input of the switches 1412, thereby allowing a measurement of output power of the multi-mode power amplifier 1432 that does not include insertion loss of the switches 1412. The sensed output signal from the directional coupler 1424 can be provided to the mixer 1438, which can multiply the sensed output signal by a reference signal of a controlled frequency so as to downshift the frequency content of the sensed output signal to generate a downshifted signal. The downshifted signal can be provided to the ADC 1439, which can convert the downshifted signal to a digital format suitable for processing by the baseband processor 1434.

By including a feedback path between the output of the multi-mode power amplifier 1432 and the baseband processor 1434, the baseband processor 1434 can be configured to dynamically adjust the I and Q signals to optimize the operation of the power amplifier system 1426. For example, configuring the power amplifier system 1426 in this manner can aid in providing power control, compensating for transmitter impairments, and/or in performing digital pre-distortion (DPD). Although one example of a sensing path for a power amplifier is shown, other implementations are possible.

Figure 60:
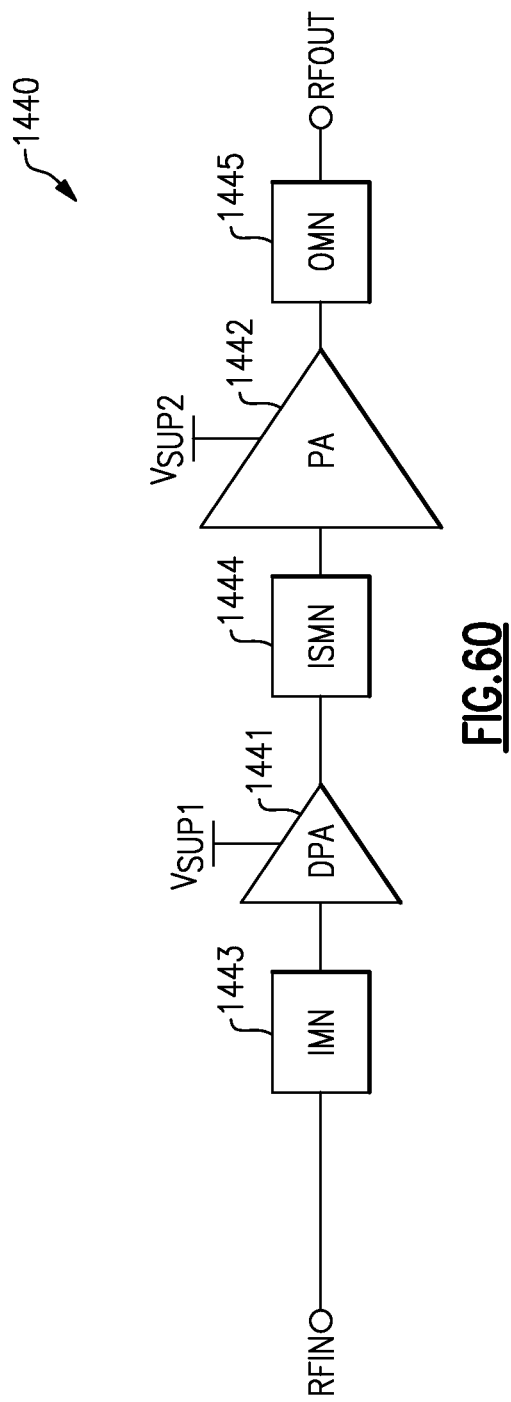
FIG. 60 is a schematic diagram of one example of a multi-mode power amplifier.

FIG. 60 is a schematic diagram of one example of a multi-mode power amplifier 1440. The multi-mode power amplifier 1440 includes a driver stage 1441, an output stage 1442, an input matching network 1443, an interstage matching network 1444, and an output matching network 1445.

As shown in FIG. 60, the driver stage 1441 is powered by a first supply voltage $V_{SUP1}$ and the output stage 1442 is powered by a second supply voltage $V_{SUP2}$. The driver stage 1441 receives an RF input signal RFIN via the input matching network 1443, and generates an amplified RF signal. The output stage 1442 receives the amplified RF signal via the interstage matching network 1444, and further amplifies the amplified RF signal to generate an RF output signal RFOUT.

Figure 61A:
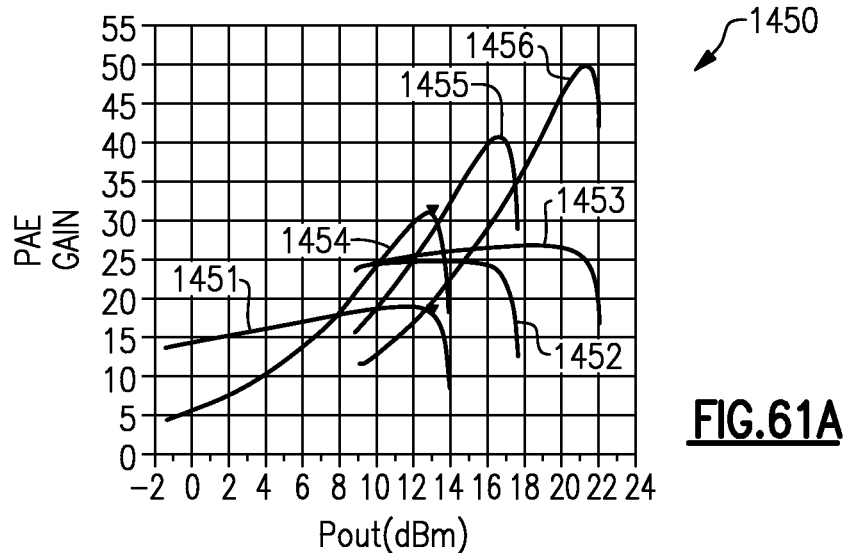
FIGS. 61A, 61B, and 61C show graphs of simulation results for one implementation of the multi-mode power amplifier of FIG. 60.
Figure 61B:
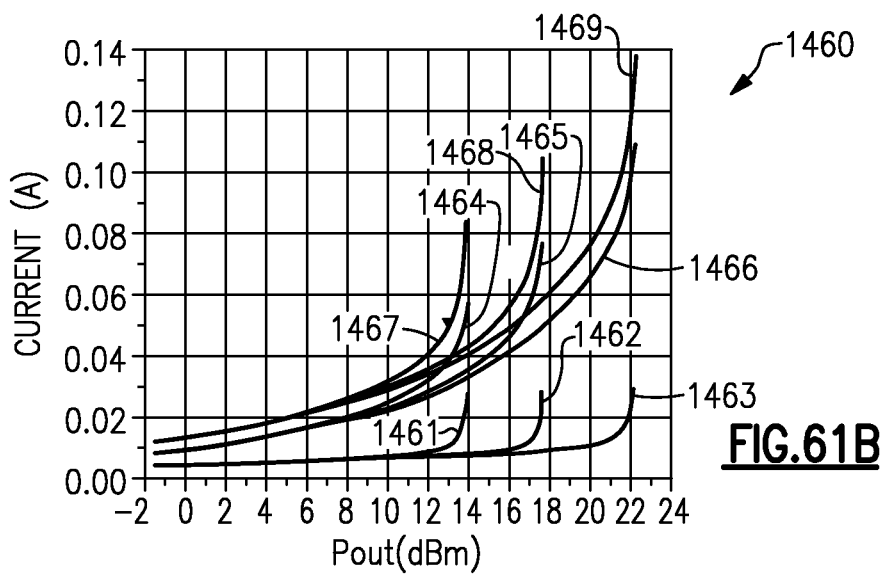
Figure 61C:
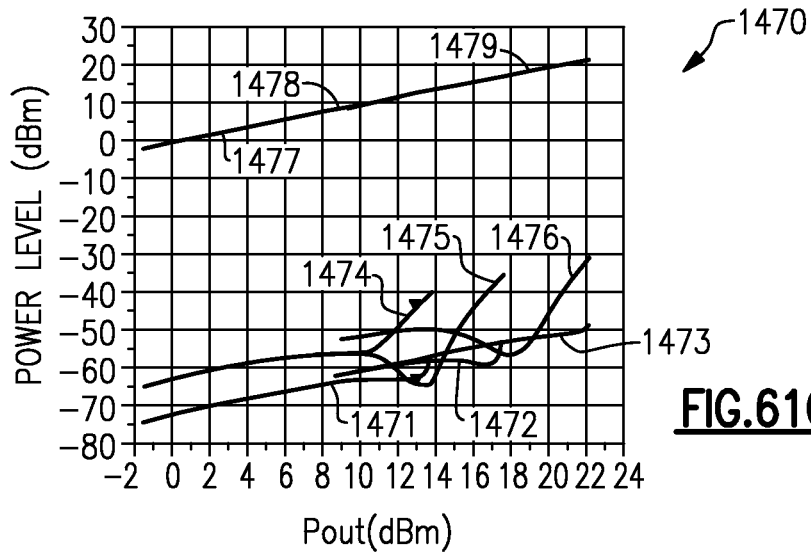

FIGS. 61A-61C show graphs of simulation results for one example of the multi-mode power amplifier of FIG. 60. The graphs include simulation results in a low power mode (13-dBm) in which $V_{SUP1}$ is 1.8 V and $V_{SUP2}$ is 1.2 V, a medium power mode (16-dBm) in which $V_{SUP1}$ is 1.8 V and $V_{SUP2}$ is 1.8 V, and a high power mode (21-dBm) in which $V_{SUP1}$ is 1.8 V and $V_{SUP2}$ is 3.0 V. The driver stage 1441 and output stage 1442 are each implemented using a common source amplifier with SOI FETs.

Although FIG. 61A-61C illustrate simulation results of a multi-mode power amplifier, lab testing was also performed and yielded similar results.

FIG. 61A shows a graph 1450 of power added efficiency (PAE) and gain versus output power. The graph 1450 includes a first gain plot 1451 for the low power mode, a second gain plot 1452 for the medium power mode, and a third gain plot 1453 for the high power mode. Additionally, the graph 1450 includes a first PAE plot 1454 for the low power mode, a second PAE plot 1455 for the medium power mode, and a third PAE plot 1456 for the high power mode.

FIG. 61B shows a graph 1460 of current consumption versus output power. The graph 1460 includes a first driver stage current consumption plot 1461 for the low power mode, a second driver stage current consumption plot 1462 for the medium power mode, and a third driver stage current consumption plot 1463 for the high power mode. Additionally, the graph 1460 includes a first output stage current consumption plot 1464 for the low power mode, a second output stage current consumption plot 1465 for the medium power mode, and a third output stage current consumption plot 1466 for the high power mode. Furthermore, the graph 1460 includes a first total current consumption plot 1467 for the low power mode, a second total current consumption plot 1468 for the medium power mode, and a third total current consumption plot 1469 for the high power mode.

As shown in FIG. 61B, the driver stage and the output stage have a relatively comparable current consumption in the low power mode, which leads to the driver stage having relatively large impact on overall efficiency. Moreover, since the supply voltage of the output stage decreases to about 33% below that of the driver stage in this example, the output stage saturates at a lower output power level. Thus, both power gain and current consumption of the driver stage have a relatively large impact on overall efficiency in the low power mode.

Accordingly, efficiency of the driver stage is important for overall PAE in the low power mode.

FIG. 61C shows a graph 1470 of power level versus output power. The graph 1470 includes a second harmonic frequency power plot 1471 for the low power mode, a second harmonic frequency power plot 1472 for the medium power mode, and a second harmonic frequency power plot 1473 for the high power mode. Additionally, the graph 1470 includes a third harmonic frequency power plot 1474 for the low power mode, a third harmonic frequency power plot 1475 for the medium power mode, and a third harmonic frequency power plot 1476 for the high power mode. Furthermore, the graph 1470 includes a fundamental frequency power plot 1477 for the low power mode, a fundamental frequency power plot 1478 for the medium power mode, and a fundamental frequency power plot 1479 for the high power mode.

In certain configurations herein, a multi-mode power amplifier includes a driver stage implemented using an injection-locked oscillator and an output stage having an adjustable supply voltage that changes with a mode of the multi-mode power amplifier. By implementing the power amplifier in this manner, the power amplifier can exhibit excellent efficiency, including in a low power mode. For example, in the low power mode, the adjustable supply voltage used to power the output stage is decreased, and the driver stage has a relatively large impact on overall efficiency of the power amplifier. By implementing the driver stage using an injection-locked oscillator, the overall efficiency of the multi-mode power amplifier is relatively high across different modes.

An RF system can include a separate power amplifier die to provide devices having higher efficiency and/or higher breakdown voltages. For example, an RF system can use a Gallium Arsenide (GaAs) die, a Gallium Nitride (GaN) die, or a Silicon Germanium (SiGe) die in which a high impedance load line provides relatively high voltage swing and relatively low current consumption. However, using a separate power amplifier die can increase the cost of the RF system and/or impact performance of other components of the RF system. For example, it may be desirable to implement the power amplifier in SOI technologies, since RF switches and/or low noise amplifiers (LNAs) can exhibit superior performance when implemented using SOI processes relative to other technologies.

In certain configurations herein, an RF front-end integrated circuit (FEIC) is provided. The RF FEIC is fabricated using an SOI process, and includes at least one LNA, at least one RF switch, and at least one power amplifier. By integrating the power amplifier with the LNA and/or switch, overall cost is reduced. Moreover, the LNA and/or RF switch exhibit superior performance relative to configurations in which the LNA and/or RF switch are fabricated using other processes. The power amplifier can be integrated with the LNA and switch to provide a front-end for an RF transceiver on a single chip.

The multi-mode power amplifiers disclosed herein can provide enhanced performance relative to a single-stage power amplifier that uses an injection-locked oscillator. For example, an injection-locked oscillator includes an inductor-capacitor (LC) resonator or tank that is injection-locked to an RF input signal. When the supply voltage of an injection-locked oscillator is changed with operating mode, the injection-locked oscillator can be detuned. For example, a change to the supply voltage can shift the center frequency of oscillation and/or change the range of frequencies that the oscillator can be injection-locked to. This in turn can make the injection-locked oscillator susceptible to undesired operation such as quasi-lock and/or fast-beat modes.

Accordingly, using an injection-locked oscillator driver stage with a substantially constant supply voltage in combination with a variable supply voltage output stage provides robust performance relative to a single-stage power amplifier that uses an injection-locked oscillator.

Figure 62A:
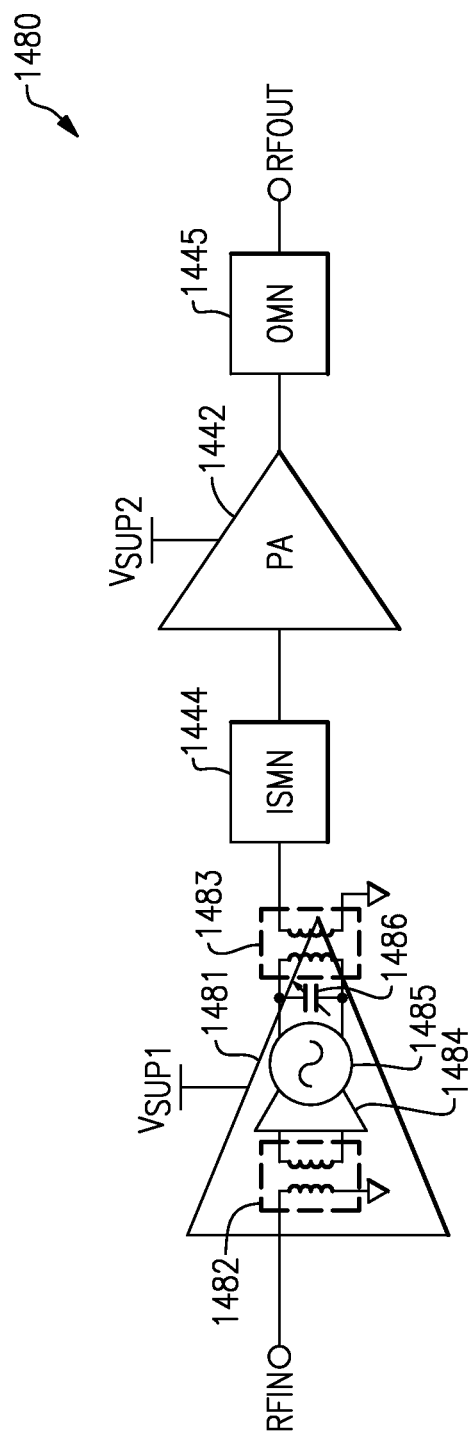
FIG. 62A is a schematic diagram of a multi-mode power amplifier according to one embodiment.

FIG. 62A is a schematic diagram of a multi-mode power amplifier 1480 according to one embodiment. The multi-mode power amplifier 80 includes an injection-locked oscillator driver stage 1481, an output stage 1442, an interstage matching network 1444, and an output matching network 1445.

The injection-locked oscillator driver stage 1481 is powered by a first supply voltage $V_{SUP1}$, and the output stage 1442 is powered by a second supply voltage $V_{SUP2}$. The injection-locked oscillator driver stage 1481 receives an RF input signal RFIN, and generates an amplified RF signal. The output stage 1442 receives the amplified RF signal via the interstage matching network 1444, and further amplifies the amplified RF signal to generate an RF output signal RFOUT.

Although the illustrated embodiment includes two stages, the multi-mode power amplifier 1480 can include one or more additional stages. For example, the multi-mode power amplifier can include a preceding stage before the injection-locked oscillator driver stage 1481 and/or an additional stage included between the injection-locked oscillator driver stage 1481 and the output stage 1442.

As shown in FIG. 62A, the injection-locked oscillator driver stage 1481 includes an input transformer or balun 1482, an output transformer or balun 1483, a signal injecting circuit 1484, a negative transconductance circuit 1485, and a capacitor 1486. Additionally, the capacitor 1486 operates with an inductance of the output transformer 1483 in an LC tank or resonator.

The negative transconductance circuit 1485 provides energy to maintain the LC tank in resonance. When injection-locked, the LC tank oscillates at a frequency substantially equal to the frequency of the RF input signal RFIN. The output transformer 1483 serves to convert a differential signal of the LC tank resonator to a single-ended signal suitable for driving the input to the output stage 1442.

Configuring the injection-locked oscillator driver stage 1481 to provide differential to single-ended signal conversion reduces or eliminates the impact of output balun loss on overall power amplifier efficiency relative to an implementation including a fully differential output stage.

In certain implementations, the capacitor 1486 includes a controllable capacitance component, such as a variable and/or programmable capacitor. Providing controllable capacitance aids in tuning a range of frequencies over which the injection-locked oscillator driver stage 1481 can be locked to. In addition to explicit capacitor structures, the capacitor 1486 can also include one or more parasitic capacitances, such as parasitic diffusion capacitances of transistors of the negative transconductance circuit 1485.

The injection-locked oscillator driver stage 1481 operates with very low power consumption relative to driver stages implemented as a common source or common emitter amplifier. During operation, the injection-locked oscillator driver stage 1481 is locked in frequency and phase with respect to the RF input signal RFIN, and operates to generate an injection-locked RF signal. In certain configurations, the RF input signal RFIN is a modulated signal having a substantially constant signal envelope.

In the illustrated embodiment, the first supply voltage VSUP1 operates with a substantially constant voltage level across operating modes of the multi-mode power amplifier 1480. Thus, when the mode of the multi-mode power amplifier 1480 changes, the oscillation center frequency and associated locking range of the injection-locked oscillator driver stage 1481 remains substantially unchanged. Configuring the multi-mode power amplifier 1480 provides robust performance across different operating modes.

In contrast, a multi-mode power amplifier using an injection-locked oscillator in an output stage can become detuned in response to supply voltage changes. For example, the oscillation center frequency and/or tuning range of such an injection-locked oscillator can change in different power modes, thereby degrading performance.

The illustrated injection-locked oscillator driver stage 1481 provides a differential-to-single-ended signal conversion operation prior to amplification by the output stage 1442.

By implementing differential-to-singled-ended conversion in the injection-locked oscillator driver stage 1481, superior power efficiency performance can be achieved. In particular, performing the conversion at a lower signal power level provides higher efficiency relative to performing the conversion at a higher signal power level. For instance, a loss of L dB due to signal conversion has a larger impact at the output of the output stage 1442 relative to the same amount of loss at the input of the output stage 1442.

The output stage 1442 can be implemented in a wide variety of ways. In a first example, the output stage 1442 is implemented as a common source amplifier including an NMOS transistor having a gate that receives an input signal, a source electrically connected to a ground voltage, and a drain that generates the RF output signal RFOUT. In a second example, the output stage 1442 is implemented as a cascode amplifier including a stack of two or more NMOS transistors, and the input signal is provided to a gate of the bottommost transistor in the stack and the output signal is provided from a drain of the uppermost transistor in the stack.

Although various examples of the output stage 1442 have been described, the output stage 1442 can be implemented in a wide variety of ways, including, but not limited to, implementations using bipolar transistors or implementations using a combination of field-effect transistors and bipolar transistors.

The interstage matching network 1444 provides impedance matching between the output of the driver stage 1481 and an input to the output stage 1442. Additionally, the output matching network 1445 provides output impedance matching to the output stage 1442. In certain implementations, the interstage matching network 1444 and/or the output matching network 1445 provide harmonic termination, DC biasing, and/or aid in achieved a desired load line impedance.

Including the interstage matching network 1444 and the output matching network 1445 increase power transfer relative to a configuration in which the impedance matching networks are omitted. The impedance matching networks can be implemented in a wide variety of ways.

In the illustrated embodiment, the input transformer or balun 1482 serves at least in part to provide input impedance matching, thereby reducing component count and/or area. However, other implementations are possible.

Additional details of the multi-stage amplifier 1480 can be as described herein.

Figure 62B:
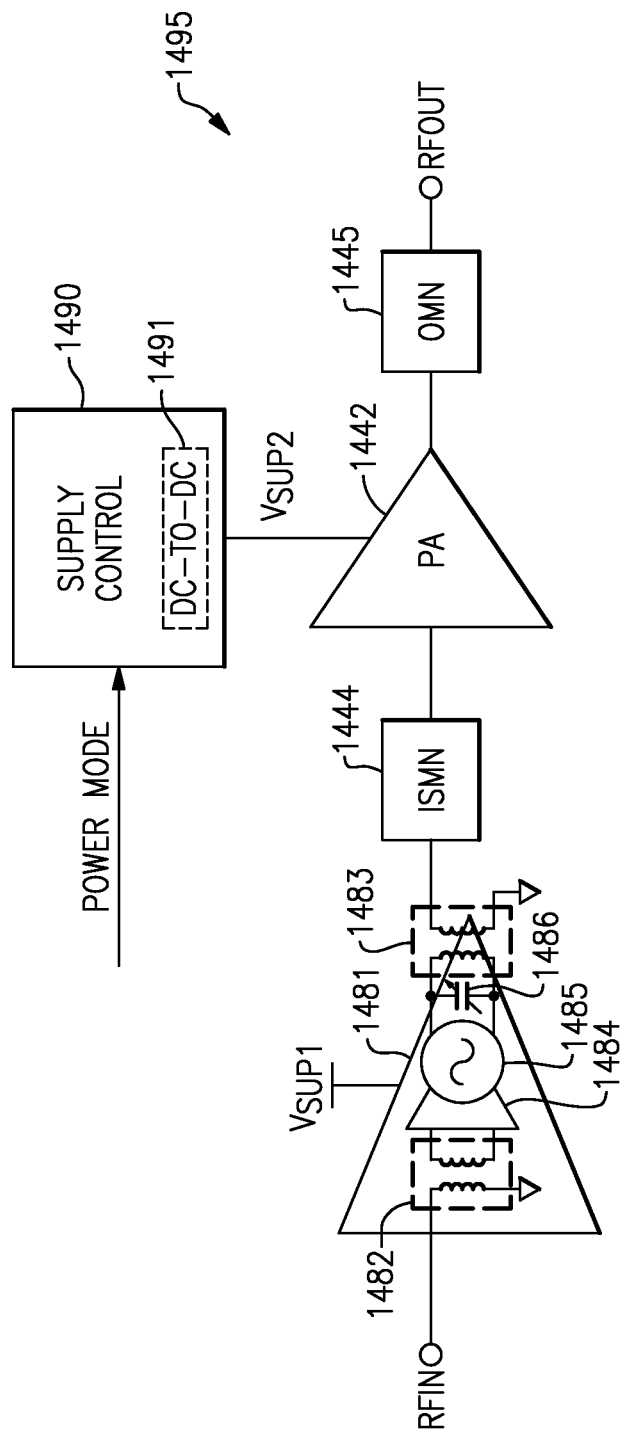
FIG. 62B is a schematic diagram of a multi-mode power amplifier according to another embodiment.

FIG. 62B is a schematic diagram of a multi-mode power amplifier 1495 according to another embodiment. The multi-mode power amplifier 1495 of FIG. 62B is similar to the multi-mode power amplifier 1480 of FIG. 62A, except that the multi-mode power amplifier 1495 of FIG. 62B includes a supply control circuit 1490 that controls a voltage level of the second supply voltage VSUP2 based on a power mode signal. In the illustrated embodiment, the supply control circuit 1490 includes a DC-to-DC converter 1491 for efficiently regulating the second supply voltage VSUP2 to a desired voltage level.

Figure 63:
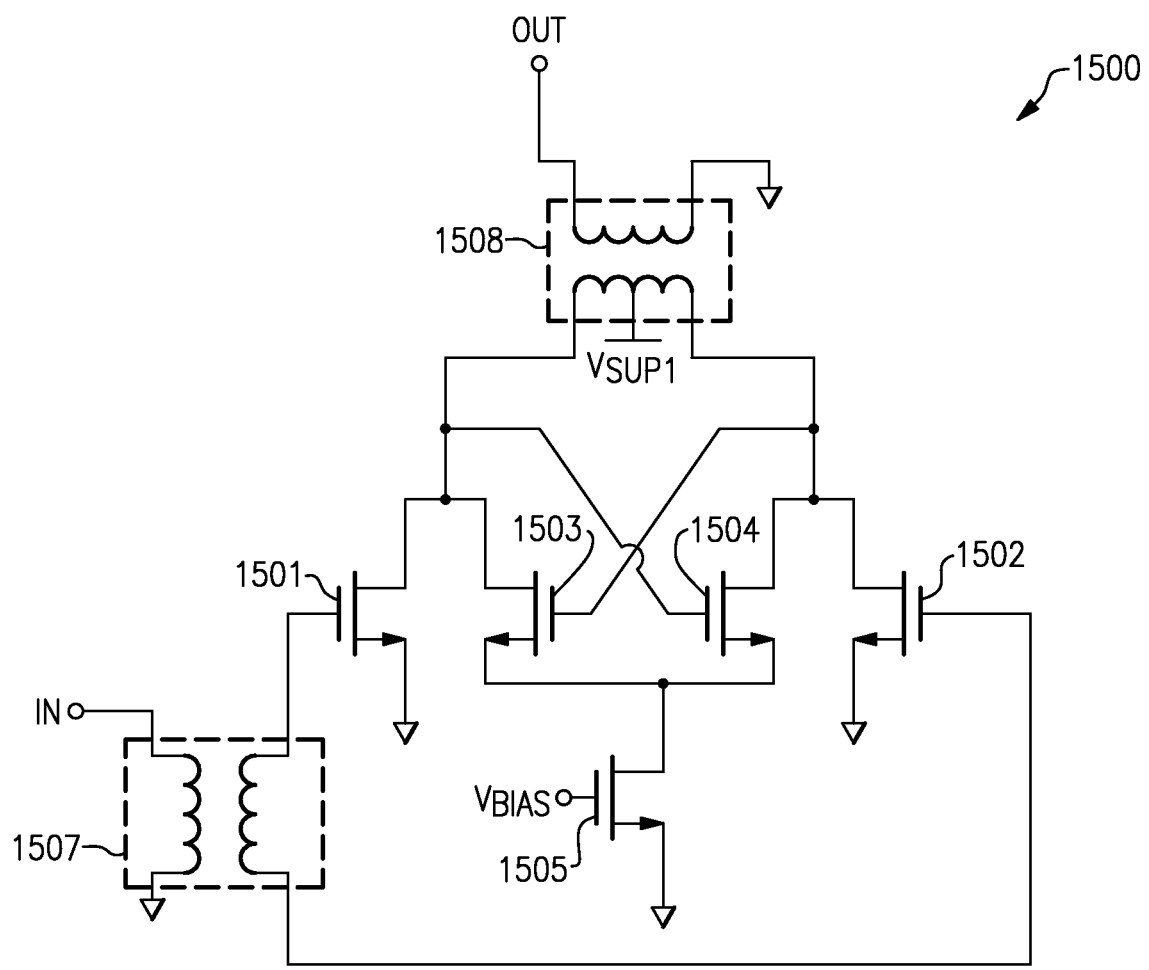
FIG. 63 is a schematic diagram of an injection-locked oscillator driver stage according to one embodiment.

FIG. 63 is a schematic diagram of an injection-locked oscillator driver stage 1500 according to one embodiment. The illustrated injection-locked oscillator driver stage 1500 includes an input transformer or balun 1507, an output transformer or balun 1508, a first signal injecting n-type metal oxide semiconductor (NMOS) transistor 1501, a second signal injecting NMOS transistor 1502, a first negative transconductance NMOS transistor 1503, a second negative transconductance NMOS transistor 1504, and a bias NMOS transistor 1505.

As shown in FIG. 63, the injection-locked oscillator driver stage 1500 receives a single-ended RF input signal IN and generates a single-ended RF output signal OUT. Additionally, the injection-locked oscillator driver stage 1500 is powered using the first supply voltage $V_{SUP1}$. In the illustrated embodiment, the first supply voltage $V_{SUP1}$ is provided to a center tap of a first winding of the output transformer 1508.

The first and second negative transconductance NMOS transistors 1503, 1504 are cross-coupled with one another, and operate as a negative transconductance circuit. The first winding of the output transformer 1508 is electrically connected between the drain of the first negative transconductance NMOS transistor 1503 and the drain of the second negative transconductance NMOS transistor 1504.

The output transformer 1508 serves to convert a differential-ended signal corresponding to a voltage difference between the drains of the negative transconductance NMOS transistors 1503, 1504 to the single-ended injection-locked RF output signal OUT. In the illustrated embodiment, the singled-ended injection-locked RF output signal OUT is generated by a second winding of the output transformer 1508, and is referenced to a ground voltage.

The injection-locked oscillator driver stage 1500 includes an LC tank associated with the inductance of the output transformer 1508 and a parasitic capacitance at the drains of the negative transconductance NMOS transistors 1503, 1504. In certain implementations, the LC tank of the injection-locked oscillator driver stage 1500 further includes an explicit capacitor, such as controllable capacitance component to provide tuning range.

The bias NMOS transistor 1505 controls a bias current of the negative transconductance NMOS transistors 1503, 1504 and the LC tank's oscillation amplitude.

In the illustrated embodiment, the gate of the bias NMOS transistor 1505 receives a bias voltage VBIAS, which controls the amount of bias current of the negative transconductance NMOS transistors 1503, 1504. In certain implementations, the bias voltage $V_{BIAS}$ is controllable, such as by digital programming via an IC interface (for instance, a MIPI RFFE bus or I$^2$C bus). The bias voltage VBIAS can be provided to the gate of the bias NMOS transistor 1505 through a resistive feed to aid in providing isolation to circuitry that generates the bias voltage $V_{BIAS}$, which can be generated using any suitable bias circuitry.

The negative transconductance NMOS transistors 1503, 1504 provide energy to the LC tank to maintain oscillations. When the RF input signal IN is not present, the oscillation frequency of the LC tank resonator can be about equal to the LC tank's resonant frequency.

The input transformer 1507 serves to convert the single-ended RF input signal IN to a differential signal provided to the gates of the signal injecting NMOS transistors 1501, 1502. As shown in FIG. 63, the drains of the first and second signal injecting NMOS transistors 1501, 1502 are electrically connected to the drains of the first and second negative transconductance NMOS transistors 1503, 1504, respectively. When the RF input signal IN is sufficiently large, the signal injecting NMOS transistors 1501, 1502 provide sufficient signal injection to lock the oscillation frequency and phase of the LC oscillator to the frequency of the RF input signal IN.

The injection-locked oscillator driver stage 1500 illustrates one embodiment of a driver stage that can be used in the multi-mode power amplifiers described herein. However, an injection-locked oscillator driver stage can be implemented in other ways.

Additional details of the injection-locked oscillator driver stage 1500 can be as described herein.

The multi-mode power amplifiers discussed herein, which can be as described earlier in this section, can be included in any suitable front end system, packaged module, semiconductor die (e.g., a semiconductor-on-insulator die, such as a silicon-on-insulator die), wireless communication device (e.g., a mobile phone, such as a smart phone), or the like.

Section V—Electrical Overstress Protection

In accordance with some embodiments of this disclosure, this section of the present disclosure relates to electrical overstress (EOS) protection circuits. Such EOS protection circuits can divert charge associated with an EOS event away from a signal node to provide EOS protection. As indicated above, aspects of this section may be combined with other aspects of one or more other sections to further improve the performance of front end systems and related devices, integrated circuits, modules, and methods in which they are employed.

To protect a pin or pad of an integrated circuit (IC) from electrical overstress (EOS) events, the IC can include an EOS protection circuit connected between the pad and ground. To prevent the EOS protection circuit from interfering with normal operation of the IC, it is desirable for the EOS protection circuit to be turned off and non-conducting when normal operating conditions or voltage levels are present at the pad, and to turn on and conduct to provide overstress protection in response to an EOS event occurring.

Certain EOS protection circuits are implemented using a number of series-connected diodes between a pad and ground. For example, an EOS protection circuit can include a number of diodes in series to provide a trigger voltage sufficiently above normal operating voltage levels of the pad. To prevent the EOS protection circuit from accidentally triggering and conducting in the presence of normal operating voltage levels, the number of series-connected diodes can be selected such that the resulting trigger voltage is safely above the maximum operating voltage of the pad.

However, such a protection scheme can limit and/or constrain EOS protection. For example, the trigger voltage of an EOS protection circuit implemented with multiple diodes in series can be based on a sum of the forward voltages of the diodes. For instance, the trigger voltage of an EOS protection circuit with about n identical series-connected diodes can be about n*Vf, where Vf is the forward voltage of each diode.

A diode's forward voltage can reduce with temperature. To prevent unintended activation at high temperatures by normal signaling, the EOS protection circuit can be implemented with a minimum number of diodes sufficient to avoid conduction under normal operating conditions. However, when a sufficient number of diodes are included to accommodate both the maximum pad voltage during normal operation, a desired voltage margin, process variation, and the maximum operating temperature of the IC, EOS protection is typically reduced at normal temperatures and conditions.

For example, when the EOS protection circuit is implemented in this manner, the EOS protection circuit's trigger voltage can be relatively high at normal operating temperatures, thereby resulting in an increase in peak voltage levels under ESD conditions and a corresponding degradation in overstress protection.

Accordingly, providing EOS protection using only series-connected diodes to ground may be insufficient in certain applications, since too many series-diodes may be desired to avoid conduction under normal signaling conditions across process and/or temperature variations.

In other implementations, a diode is electrically connected between the pad and a power high supply voltage to provide EOS protection. However, during an EOS event, overstress current can flow into the power high supply voltage. Although a clamp circuit can be used to limit a voltage increase of the power high supply rail during an EOS event, the clamp circuit can decrease power performance by generating leakage current, which can be unacceptable in certain low power applications.

Apparatus and methods for EOS protection circuits are provided in this section. In certain configurations, an EOS protection circuit includes an overstress sensing circuit electrically connected between a pad and a first supply node, an impedance element electrically connected between the pad and a signal node, a controllable clamp electrically connected between the signal node and the first supply node and selectively activatable by the overstress sensing circuit, and an overshoot limiting circuit electrically connected between the signal node and a second supply node. The overstress sensing circuit activates the controllable clamp when an EOS event is detected at the pad. Thus, the EOS protection circuit can divert charge associated with the EOS event away from the signal node to provide EOS protection.

In certain implementations, the overstress sensing circuit includes a plurality of series-connected diodes and a first field-effect transistor (FET), such as a first metal-oxide-semiconductor (MOS) transistor. Additionally, the controllable clamp includes a second FET, such as a second MOS transistor, having a gate voltage that is controlled based on a gate voltage of the first FET. For example, the first and second FETs can be implemented as a current mirror. Under EOS conditions at the pad, current flows through the overstress sensing circuit's series-connected diodes, thereby turning on the first and second FETs and activating the controllable clamp.

Additionally, the inclusion of the impedance element between the pad and the signal node should result in the voltage of the signal node being less than that of the pad in response to a voltage increase at the pad. Additionally, the overshoot limiting circuit can hold the voltage at the signal node to a relatively low value until the controllable clamp is activated. Implementing the EOS protection circuit in this manner can reduce the peak current injected into the second supply node and reduce voltage overshoot at the signal node. The reduction in peak current can lead to a smaller supply clamp (for instance, a more compact circuit layout) between the first and second supply nodes and a corresponding decrease in the IC's static power dissipation.

Accordingly, the teachings in this section can be used to provide enhanced EOS protection. Additionally, protecting an IC's pads using one or more of the EOS protection circuits described herein can lead to a smaller and/or lower leakage supply clamp.

In certain configurations, the first supply node corresponds to ground. In such configurations, the EOS protection circuit advantageously shunts charge of the EOS event to a node exhibiting very low impedance and/or enhanced thermal dissipation relative to other supply nodes.

Figure 64:
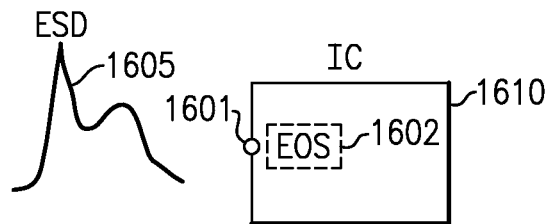
FIG. 64 is a schematic diagram of one example of an integrated circuit that can include one or more electrical overstress (EOS) protection circuits.

FIG. 64 is a schematic diagram of an IC 1610. As shown in FIG. 64, the IC 1610 can include one or more pins or pads 1601 that can be exposed to EOS conditions, such as an ESD event 1605. The IC 1610 can include at least one EOS protection circuit 1602 implemented in accordance with the teachings herein. A wireless or mobile device can include one or more of the ICs of FIG. 64. The wireless device can include EOS protection circuits implementing one or more features of this section. For example, wireless device can include multiple semiconductor chips or ICs, and one or more of the ICs can include EOS protection circuits implemented in accordance with the teachings herein.

Figure 65A:
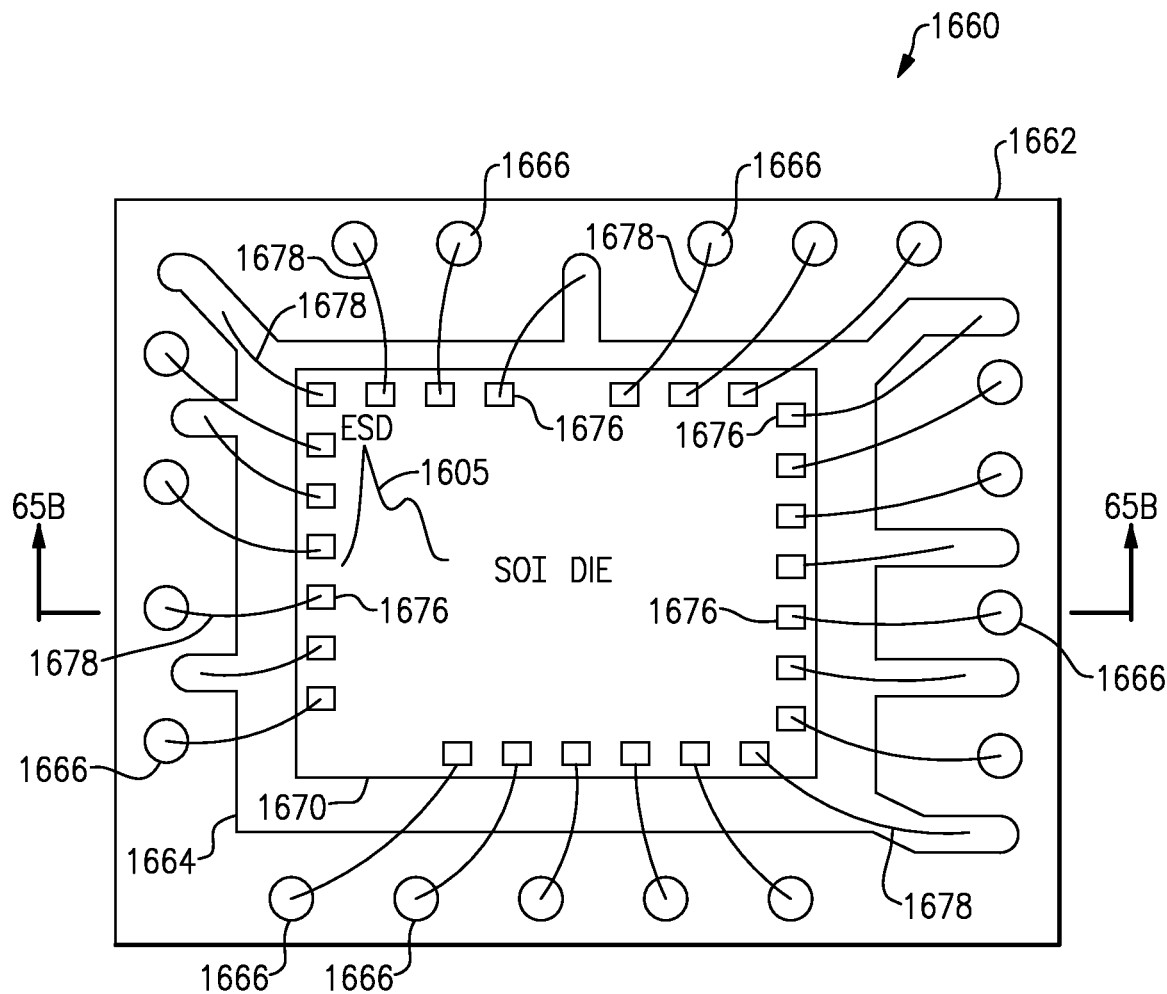
FIG. 65A is a schematic diagram of one example of a module that can include one or more EOS protection circuits.
Figure 65B:
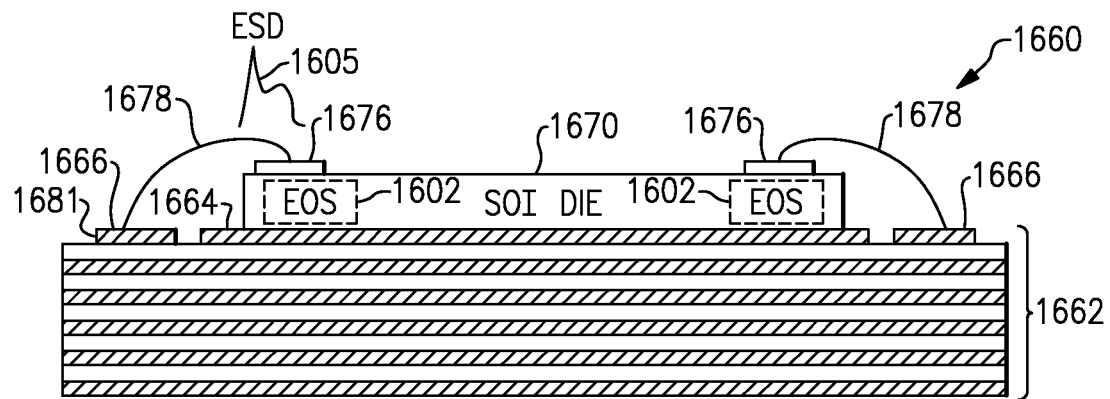
FIG. 65B is a cross section of the module of FIG. 65A taken along the lines 65B-65B.

FIG. 65A is a schematic diagram of one example of a module 1660 that can include one or more EOS protection circuits. FIG. 65B is a cross section of the module 1660 of FIG. 65A taken along the lines 65B-65B. The module 1660 includes a module substrate or laminate 1662, a silicon-on-insulator (SOI) die 1670, and bond wires 1678. In certain implementations, the module 1660 corresponds to a front end module.

The module substrate 1662 includes a die attach pad 1664 and bond pads 1666. As shown in FIG. 65A, the SOI die 1670 is attached to the die attach pad 1664 of the module substrate 1662. As depicted in FIG. 65B, the module substrate 1662 can include a plurality of conductive and non-conductive layers laminated together, and the die attach pad 1664 and the bond pads 1666 can be formed from a conductive layer 1681 disposed on the surface of the module substrate used to attach the SOI die 1670.

The SOI die 1670 includes pads 1676 that can be exposed to EOS events, such as the ESD event 1605. At least a portion of the pads 1676 of the SOI die 1670 can include corresponding EOS protection circuits 1602 implemented in accordance with the teachings herein.

Figure 65C:
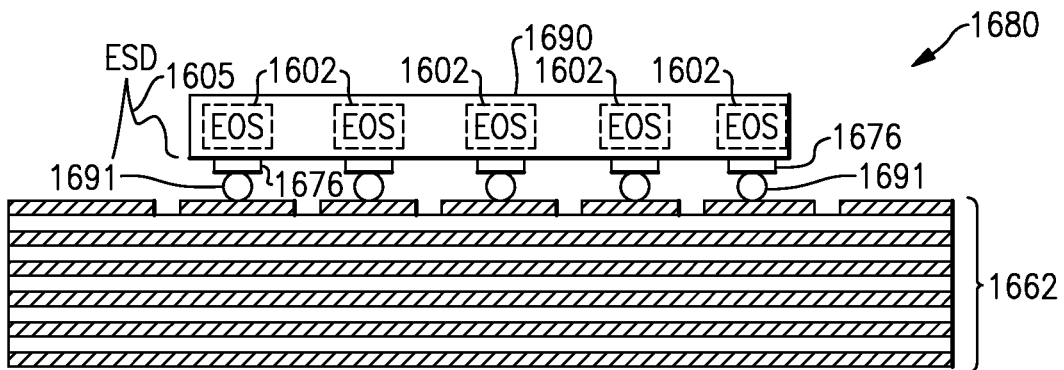
FIG. 65C is a cross section of a module according to another embodiment.

FIG. 65C is a cross section of a module 1680 according to another embodiment.

The module 80 of FIG. 65C is similar to the module 1660 of FIGS. 65A-65B, except that the module 1680 is implemented using a flip-chip configuration. For example, rather than using wire bonds to electrically connect the SOI die 1690 to the module substrate 1662, the SOI die 1690 of FIG. 65C has been flipped upside down and attached to the module substrate 1662 using bumps 1691, which can be solder bumps. At least a portion of the pads 1676 of the SOI die 1670 can include EOS protection circuits 1602 implemented in accordance with the teachings herein.

Accordingly, in certain implementations described herein, EOS protection circuits are included in a die implemented using a flip-chip arrangement.

Although FIGS. 65A-65C illustrate example modules including an SOI die that includes one or more EOS protection circuits, the teachings herein are applicable to other configurations of modules and/or dies.

Figure 66A:
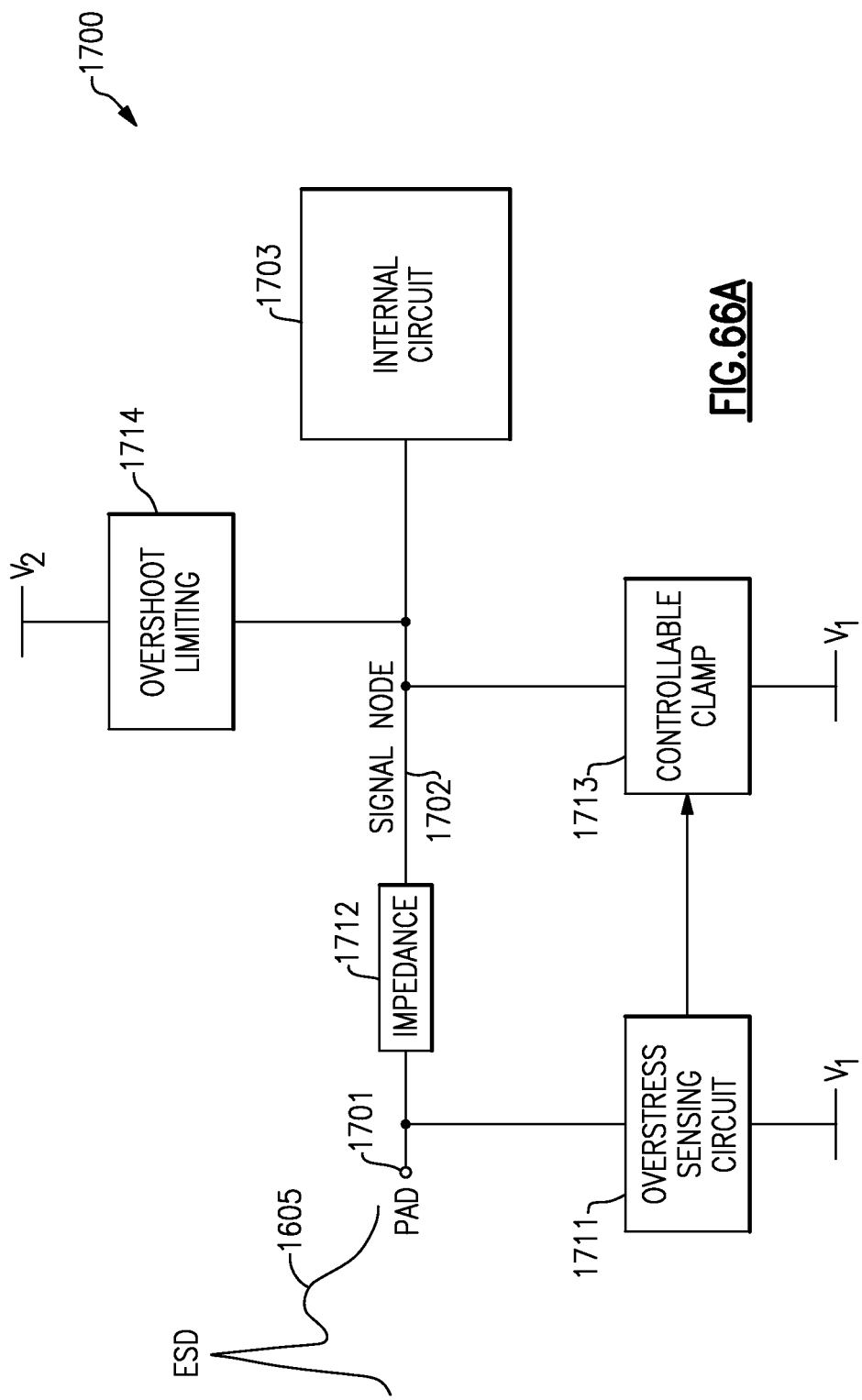
FIG. 66A is a schematic diagram of an integrated circuit (IC) interface including an EOS protection circuit according to one embodiment.

FIG. 66A is a schematic diagram of an IC interface 1700 including an EOS protection circuit according to one embodiment. The IC interface 1700 includes a pad 1701, an internal circuit 1703, and an EOS protection circuit including an overstress sensing circuit 1711, an impedance element 1712, a controllable clamp 1713, and an overshoot protection or limiting circuit 1714.

The IC interface 1700 can undesirably encounter EOS events, such as the ESD event 1605 at the pad 1701. Absent a protection mechanism, the EOS event 1605 can lead to IC damage, such as gate oxide rupture, junction breakdown, and/or metal damage. For example, the internal circuit 1703 can include sensitive transistors and/or structures that can be damaged absent an EOS protection mechanism.

As shown in FIG. 66A, the overstress sensing circuit 1711 is electrically connected between the pad 1701 and a first supply node or rail V1. Additionally, the impedance element 1712 is electrically connected between the pad 1701 and a signal node 1702. Furthermore, the controllable clamp 1713 is electrically connected between the signal node 1702 and the first supply node V1, and is selectively activatable by the overstress sensing circuit 1711. Additionally, the overshoot limiting circuit 1714 is electrically connected between the signal node 1702 and a second supply node or rail V2.

The overstress sensing circuit 1711 is electrically connected to the pad 1701, and detects when an EOS event, such as ESD event 1605, is received at the pad 1701. When the EOS event is detected, the overstress sensing circuit 1711 activates the controllable clamp 1713 to provide a low impedance path between the signal node 1702 and the first supply node V1. Thus, the EOS protection circuit is arranged to divert charge associated with the EOS event away from the signal node 1702 to provide EOS protection.

The overstress sensing circuit 1711 and the controllable clamp 1713 can be implemented in a wide variety of ways. In one embodiment, the overstress sensing circuit 1711 includes a plurality of series-connected diodes and a first FET. Additionally, the controllable clamp 1713 includes a second FET having a gate voltage controlled based on a gate voltage of the first FET. When an EOS event is received at the pad 1701, current flows through the overstress sensing circuit's series-connected diodes, thereby activating the first and second FETs.

With continuing reference to FIG. 66A, the impedance element 1712 is electrically connected between the pad 1701 and the signal node 1702. Thus, when an EOS event increases the voltage of the pad 1701 relative to the first supply node V1, the impedance element 1712 provides a voltage drop that results in the voltage of the signal node 1702 being less than that of the pad 1701. The illustrated EOS protection circuit further includes the overshoot limiting circuit 1714, which transitions from high to low impedance when the voltage of the signal node 1702 increases above the voltage of the second supply node V2 by a trigger voltage of the overshoot limiting circuit 1714.

Including the impedance element 1712 and the overshoot limiting circuit 1714 can maintain the voltage level of the signal node 1702 relatively low when an EOS event is present. In particular, the overshoot limiting circuit 1714 holds or limits the voltage at the signal node 1702 to a relatively low level until the overstress sensing circuit 1711 activates the controllable clamp 1713. Additionally, the impedance element 1712 provides a voltage drop that allows the overshoot limiting circuit 1714 to maintain the signal node's voltage to a relatively low voltage level even when the EOS event causes the voltage of the pad 1701 to increase to a relatively high voltage level.

Accordingly, the illustrated configuration of the impedance element 1712 and the overshoot limiting circuit 1714 can aids maintaining the signal node 1702 at a relatively low voltage level. Furthermore, the inclusion of the impedance element 1712 can reduce the amount of charge that is injected into the second supply node V2 via the overshoot limiting circuit 1714 relative to a configuration in which the signal node 1702 is directly connected to the pad 1701. Accordingly, the illustrated configuration can exhibit a relatively small amount of peak current injection into the second supply node V2 and reduces voltage overshoot of the signal node 1702 during an EOS event. In certain implementations, the reduction in peak current leads to a smaller supply clamp (for example, the supply clamp 1757 of FIG. 66C) between the first and second supply nodes V1, V2 and a corresponding decrease in the IC's static power dissipation.

Additional details of the IC interface 1700 can be as described earlier.

FIG. 66B is a schematic diagram of an IC interface 1730 including an EOS protection circuit according to another embodiment. The IC interface 1730 includes a pad 1701, an internal circuit 1703, and an EOS protection circuit including an overstress sensing circuit 1711, an impedance element 1712, a controllable clamp 1713, an overshoot limiting circuit 1714, a first reverse protection circuit 1731, and a second reverse protection circuit 1732.

The IC interface 1730 of FIG. 66B is similar to the IC interface 1700 of FIG. 66A, except that the IC interface 1730 further includes the first reverse protection circuit 1731 and the second reverse protection circuit 1732. In certain implementations, the overstress sensing circuit 1711 is implemented to activate the controllable clamp 1713 in response to detecting a positive polarity EOS event that increases the voltage of the pad 1701 relative to the first supply node V1.

In the illustrated embodiment, the first reverse protection circuit 1731 and the second reverse protection circuit 1732 can protect the IC interface 1730 against a negative EOS event that decreases the voltage of the pad 1701 relative to the first supply node V1. The first reverse protection circuit 1731 is electrically connected between the pad 1701 and the first supply node V1, and transitions from high to low impedance when the voltage of the pad 1701 falls below the voltage of the first supply node V1 by a trigger voltage of the first reverse protection circuit 1731. Additionally, the second reverse protection circuit 1732 is electrically connected between the signal node 1702 and the first supply node V1, and transitions from high to low impedance when the voltage of the signal node 1702 falls below the voltage of the first supply node V1 by a trigger voltage of the second reverse protection circuit 1732.

Although the illustrated IC interface 1730 of FIG. 66B includes two reverse protection circuits, more or fewer reverse protection circuits can be included. In one embodiment, the first reverse protection circuit 1731 is included and the second reverse protection circuit 1732 is omitted. In another embodiment, the first reverse protection circuit 1731 is omitted and the second reverse protection circuit 1732 is included.

Additional details of the IC interface 1730 can be as described earlier.

Figure 66C:
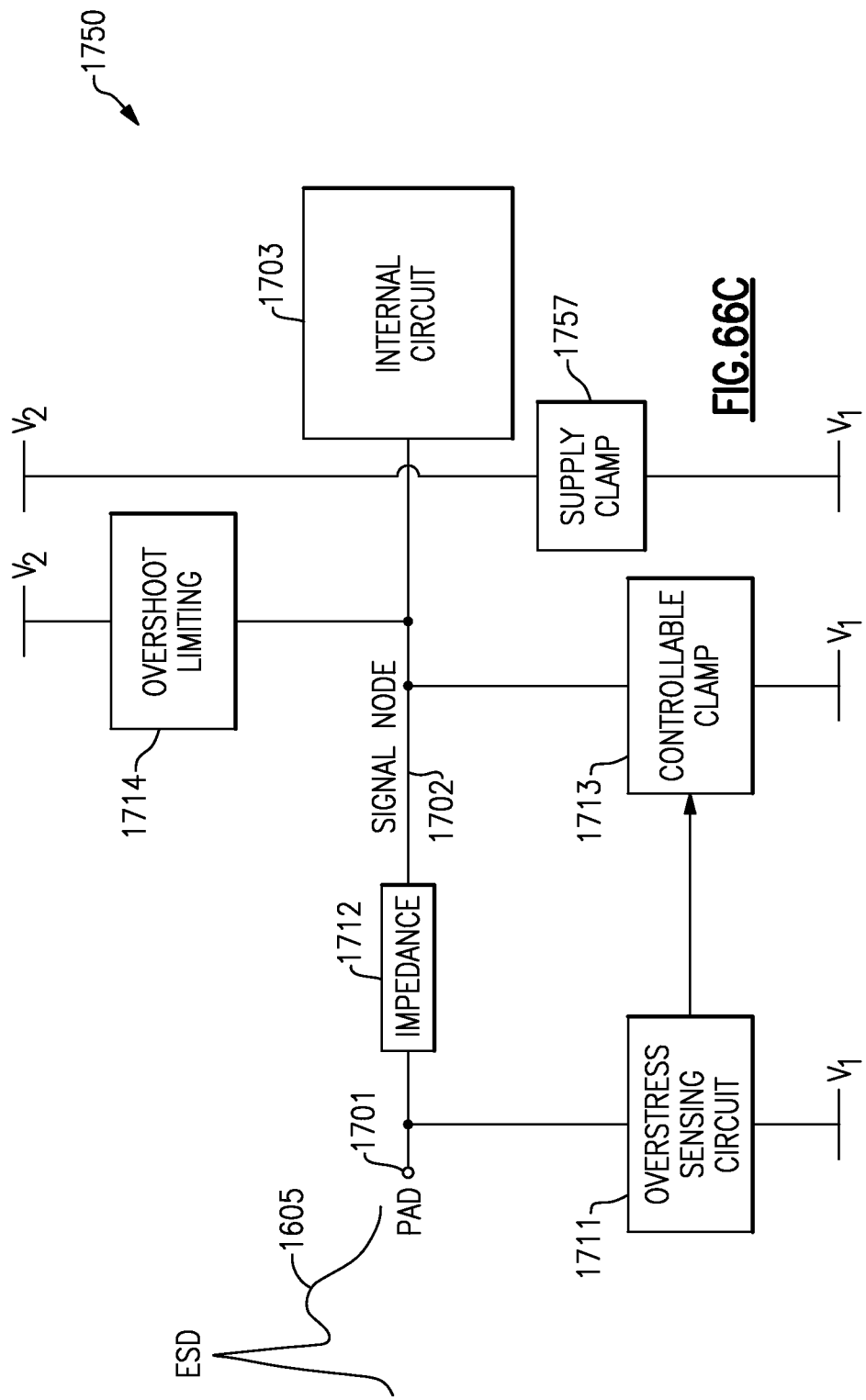
FIG. 66C is a schematic diagram of an IC interface including an EOS protection circuit according to another embodiment.

FIG. 66C is a schematic diagram of an IC interface 1750 including an EOS protection circuit according to another embodiment. The IC interface 1750 includes a pad 1701, an internal circuit 1703, and an EOS protection circuit including an overstress sensing circuit 1711, an impedance element 1712, a controllable clamp 1713, an overshoot limiting circuit 1714, and a supply clamp 1757.

The IC interface 1750 of FIG. 66C is similar to the IC interface 1700 of FIG. 66A, except that the IC interface 1750 further includes the supply clamp 1757. In certain implementations, the supply clamp 1757 can help limit a voltage difference between the second supply node V2 and the first supply node V1 during an overstress event.

Additional details of the IC interface 1750 can be as described earlier.

Figure 67:
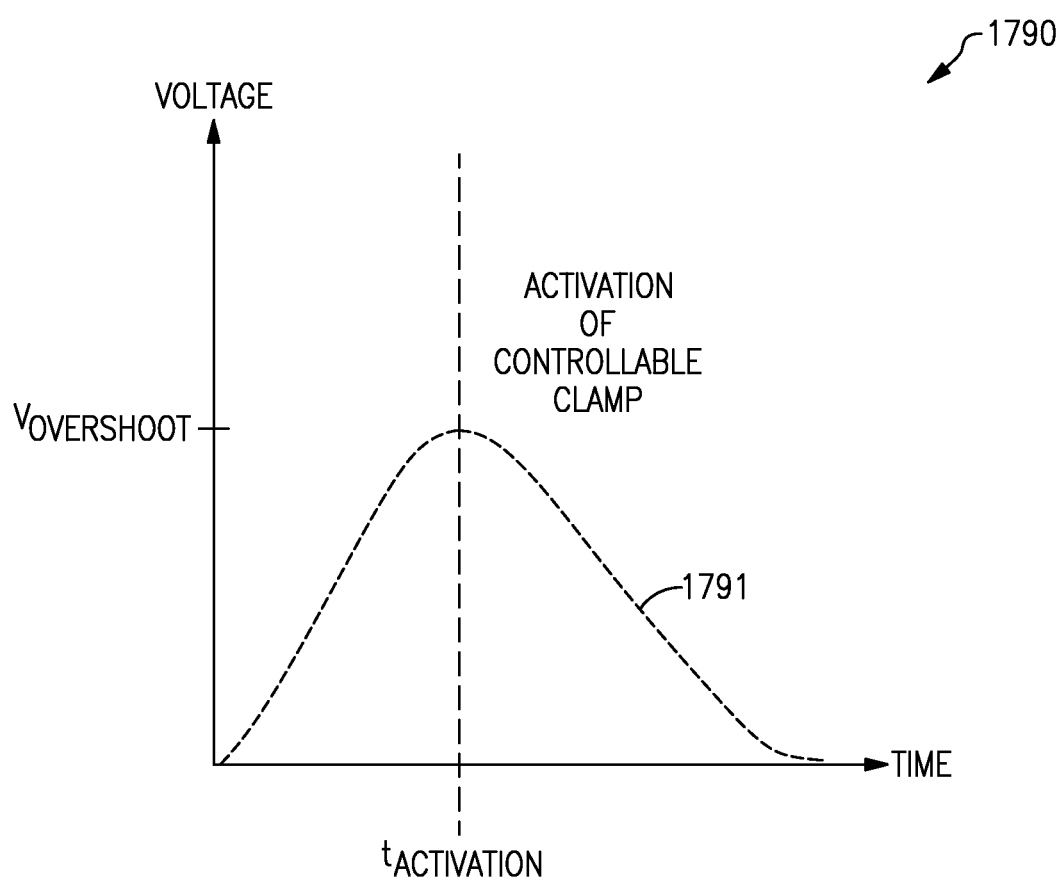
FIG. 67 is one example of a graph of voltage versus time for the EOS protection circuit of FIG. 66A.

FIG. 67 is one example of a graph 1790 of voltage versus time for the EOS protection circuit of FIG. 66A. The graph 1790 includes a plot 1791 of the voltage of the signal node 1702 of FIG. 66A versus time.

The graph 1790 begins at time zero, in which an EOS event is received at the pad 1701. The graph 1790 has been annotated to show an activation time tACTIVATION, corresponding to a time at which the controllable clamp 1713 is activated or turned on by the overstress sensing circuit 1711. The activation time tACTIVATION can be associated with a delay in detecting the EOS event and in providing a control voltage and/or current of sufficient magnitude to activate the controllable clamp 1713.

As shown in FIG. 67, the voltage of the signal node 1702 can increase during a period of time in which the controllable clamp 1713 is not activated. By including the impedance element 1712 and the overshoot limiting circuit 1714, the voltage overshoot VOVERSHOOT of signal node 1702 can be decreased. Reducing voltage overshoot can provide enhanced protection to the internal circuit 1703 and/or reduce charge injection to the second supply node V2 via the overshoot limiting circuit 1714.

Although FIG. 67 illustrates one example of a graph of voltage versus time for the EOS protection circuit of FIG. 66A, other results are possible. For example, simulated and/or measured results can vary based on implementation and/or application.

Figure 68A:
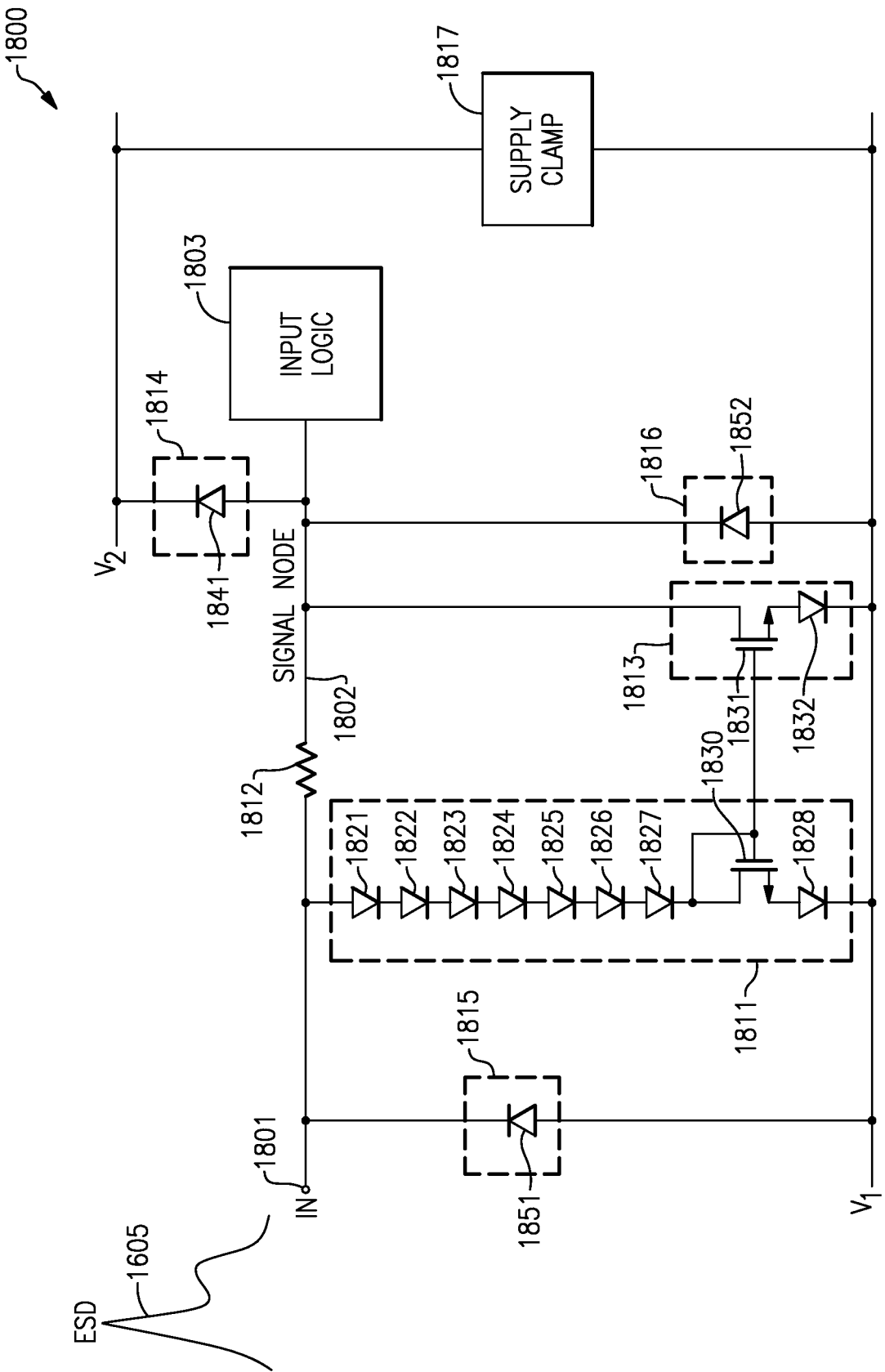
FIG. 68A is a schematic diagram of an IC interface including an EOS protection circuit according to another embodiment.

FIG. 68A is a schematic diagram of an IC interface 1800 including an EOS protection circuit according to another embodiment. The IC interface 1800 includes an input pad 1801, an input logic circuit 1803, and an EOS protection circuit including an overstress sensing circuit 1811, a resistor 1812, a controllable clamp 1813, an overshoot limiting circuit 1814, a first reverse protection circuit 1815, a second reverse protection circuit 1816, and a supply clamp 1817.

The IC interface 1800 can receive EOS events such as the ESD event 1605 at the input pad 1801. Absent a protection mechanism, the EOS event can lead to IC damage, such as damage to the input logic circuit 1803 that is electrically connected to the signal node 1802.

The illustrated EOS protection circuit provides bidirectional EOS protection against both positive polarity EOS events that increase the voltage of the input pad 1801 relative to the first supply node V1 and against negative polarity EOS events that decrease the voltage of the input pad 1801 relative to the first supply node V1.

As shown in FIG. 68A, the overstress sensing circuit 1811 is electrically connected between the input pad 1801 and a first supply node V1. The overstress sensing circuit 1811 includes first to eighth diodes 1821-1828, respectively, and a first n-type metal oxide semiconductor (NMOS) transistor 1830. As shown in FIG. 68A, the first to seventh diodes 1821-1827 are electrically connected in series from anode to cathode between the input pad 1801 and a drain of the first NMOS transistor 1830. Additionally, the eighth diode 1828 includes an anode electrically connected to a source of the first NMOS transistor 1830 and a cathode electrically connected to the first supply node V1. The first NMOS transistor 1830 is diode-connected, and includes a gate and drain electrically connected to one another.

The illustrated controllable clamp 1813 includes a second NMOS transistor 1831 and a clamp diode 1832. The second NMOS transistor 1831 includes a drain electrically connected to the signal node 1802, and a source electrically connected to the first supply node V1 via the clamp diode 1832. Including the clamp diode 1832 in the controllable clamp 1813 can aid in reducing the clamp's leakage current when normal signaling conditions are present and the controllable clamp 1813 is turned off. As shown in FIG. 68A, the gate of the second NMOS transistor 1831 of the controllable clamp 1813 is electrically connected to the gate of the first NMOS transistor 1830 of the overstress sensing circuit 1811.

In the illustrated embodiment, the first NMOS transistor 1830 of the overstress sensing circuit 1811 and the second NMOS transistor 1831 of the controllable clamp 1813 are connected as a current mirror. Although a specific implementation of overstress sensing circuit and controllable clamp are shown, the teachings herein are applicable to a wide variety of overstress sensing circuits and controllable clamps.

The overstress sensing circuit 1811 activates the controllable clamp 1813 when a positive polarity EOS event is detected at the input pad 1801. For example, when the voltage at the input pad 1801 is sufficiently high, a current can flow through the first to eighth diodes 1821-1828 and the first NMOS transistor 1830, thereby controlling the gate voltage of the first NMOS transistor 1830 to a sufficient voltage to turn on the second NMOS transistor 1831. The activation voltage of the overstress sensing circuit 1811 can be based on a forward voltage of the diodes 1821-1828 and a threshold voltage of the first NMOS transistor 1830.

As shown in FIG. 68A, the resistor 1812 is electrically connected between the input pad 1801 and the signal node 1802. Additionally, the overshoot limiting circuit 1814 is electrically connected between the signal node 1802 and the second supply node V2. In the illustrated configuration, the overshoot limiting circuit 1814 includes an overshoot limiting diode 1841 including an anode electrically connected to the signal node 1802 and a cathode electrically connected to the second supply node V2. Implementing the overshoot limiting circuit 1814 in this manner can provide the overshoot limiting circuit 1814 with a relatively low trigger voltage that is about equal to a forward voltage of the overshoot limiting diode 1841. However, other configurations are possible, such as implementations selected based on signaling levels and/or processing constraints.

When an EOS event increases the voltage of the input pad 1801 relative to the first supply node V1, the resistor 1812 provides a voltage drop that results in the voltage of the signal node 1802 being less than that of the input pad 1801. Including the resistor 1812 and the overshoot limiting circuit 1814 can maintain the voltage level of the signal node 1802 relatively low when an EOS event is present. In particular, the overshoot limiting circuit 1814 holds the voltage at the signal node 1802 to a relatively low level until the overstress sensing circuit 1811 activates the controllable clamp 1813. Additionally, the resistor 1812 provides a voltage drop that allows the overshoot limiting circuit 1814 to maintain the signal node's voltage to a relatively low voltage level even when the EOS event causes the voltage of the input pad 1801 to increase to a relatively high voltage level.

Furthermore, the inclusion of the resistor 1812 can reduce the amount of charge that is injected into the second supply node V2 via the overshoot limiting circuit 1814 relative to a configuration in which the signal node 1802 is directly connected to the input pad 1801. Accordingly, the illustrated configuration can exhibit a relatively small amount of peak current injection into the second supply node V2 and reduces voltage overshoot of the signal node 1802 during an EOS event. The reduction in peak current leads to a reduction in a size of the supply clamp 1817 and a corresponding decrease in leakage current.

In the illustrated embodiment, the resistor 1812 is an explicit resistor (for instance, a thin-film resistor), and corresponds to more than mere parasitic resistance.

The illustrated EOS protection circuit further includes the first reverse protection circuit 1815 and the second reverse protection circuit 1816, which aid in providing protection against negative polarity EOS events that decrease the voltage of the input pad 1801 relative to the first supply node V1. In the illustrated embodiment, the first reverse protection circuit 1815 includes a diode 1851 including an anode electrically connected to the first supply node V1 and a cathode electrically connected to the input pad 1801. Additionally, the second reverse protection circuit 1816 includes a diode 1852 including an anode electrically connected to the first supply node V1 and a cathode electrically connected to the signal node 1802. However, other configurations are possible.

Additional details of the IC interface 1800 can be as described earlier.

Figure 68B:
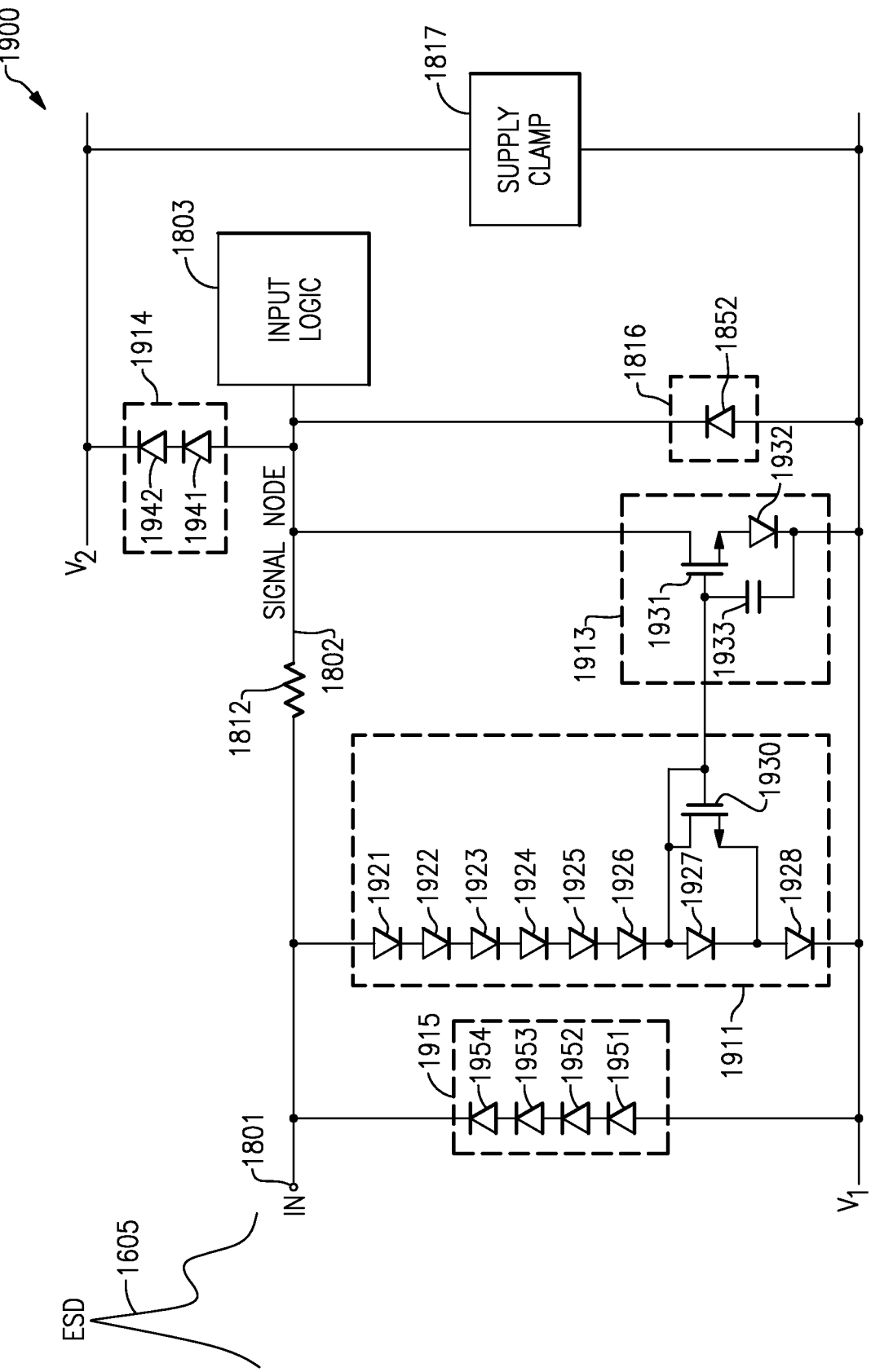
FIG. 68B is a schematic diagram of an IC interface including an EOS protection circuit according to another embodiment.

FIG. 68B is a schematic diagram of an IC interface 1900 including an EOS protection circuit according to another embodiment. The IC interface 1900 includes an input pad 1701, an input logic circuit 1803, and an EOS protection circuit including an overstress sensing circuit 1911, a resistor 1812, a controllable clamp 1913, an overshoot limiting circuit 1914, a first reverse protection circuit 1915, a second reverse protection circuit 1816, and a supply clamp 1817.

The EOS protection circuit of FIG. 68B is similar to the EOS protection circuit of FIG. 68A, except that the EOS protection circuit of FIG. 68B includes different implementations of certain circuits.

For example, in the embodiment illustrated in FIG. 68B, the overstress sensing circuit 1911 includes first to eight diodes 1921-1928, respectively, and a first NMOS transistor 1930. The first to eight diodes 1921-1928 are electrically connected in series from anode to cathode between the input pad 1801 and the first supply node V1, and control a voltage at which the overstress sensing circuit 1911 detects overstress. Additionally, the first NMOS transistor 1930 includes a drain and gate electrically connected to the anode of the seventh diode 1927, and a source electrically connected to a cathode of the seventh diode 1927.

The illustrated controllable clamp 1913 of FIG. 68B includes the second NMOS transistor 1931 and clamp diode 1932, which can be similar to the second NMOS transistor 1831 and clamp diode 1832 described earlier with respect to FIG. 68A. The controllable clamp 1913 of FIG. 68B further includes the capacitor 1933, which is electrically connected between the gate of the second NMOS transistor 1931 and the first supply node V1. The capacitor 1933 can aid in stabilizing a control voltage used to activate the controllable clamp 1913, thereby helping to prevent unintended activation.

The illustrated overshoot limiting circuit 1914 of FIG. 68B includes a first diode 1941 and a second diode 1942 electrically connected in series from anode to cathode between the signal node 1802 and the second supply node V2. Although the overshoot limiting circuit 1914 includes two diodes in series, more or fewer diodes can be included. Moreover, other implementations of overshoot limiting circuits are possible, such as implementations selected based on signaling levels and/or processing constraints.

The illustrated first reverse protection circuit 1915 includes first to fourth diodes 1951-1954 electrically connected in series from anode to cathode between the first supply node V1 and the input pad 1801. However, other configurations are possible, including, but not limited to, implementations with more or fewer diodes in series.

Additional details of the IC interface 1900 can be as described earlier.

The electrical overstress protection circuits discussed herein, which can be as described earlier in this section, can be included in any suitable front end system, packaged module, semiconductor die (e.g., a semiconductor-on-insulator die, such as a silicon-on-insulator die), wireless communication device (e.g., a mobile phone, such as a smart phone), or the like. For example, a front end system can include one or more semiconductor chips or ICs that include EOS protection circuits implemented in accordance with the teachings herein. Any of the principles and advantages of the EOS protection circuits discussed herein can be implemented in combination with any other suitable features discussed herein that could benefit from an EOS protection circuits.

Section VI—Selective Shielding of Radio Frequency Modules

In accordance with some embodiments of this disclosure, this section of the present disclosure relates to selectively shielded radio frequency modules. A radio frequency module can include a package substrate, a radio frequency shielding structure extending above the package substrate, a radio frequency component over the package substrate and in an interior of the radio frequency shielding structure, and an antenna on the package substrate external to the radio frequency shielding structure. The shielding structure can include a shielding layer providing a shield over the radio frequency component and leaving the radio frequency module unshielded over the antenna. As indicated above, aspects of this section may be combined with other aspects of one or more other sections to further improve the performance of front end systems and related devices, integrated circuits, modules, and methods in which they are employed.

Certain radio frequency (RF) modules can include a shielding structure to provide shielding for electromagnetic interference. Some such shielding structures can shield an entire module and/or all circuitry of a module. In certain instances, shielding may only be desired over a portion of a module. For instance, in a module with an RF circuit and an integrated antenna, it can be desirable to provide a shield around the RF circuit and leave the antenna unshielded. This can provide RF isolation for the RF circuit and also allow the antenna to receive and/or transmit signals without the shielding structure interfering. Accordingly, products with selective shielding can be desirable. Moreover, methods to form a shield over a selected portion of a module that are accurate and repeatable can be desirable for high volume manufacturing.

Aspects of this section relate to methods of partially shielding a radio frequency module. Such methods can include forming a shielding layer over a shielded portion of the radio frequency module and leaving an unshielded portion of the radio frequency module unshielded. The shielding layer can shield a radio frequency circuit of the radio frequency module and leave an antenna of the radio frequency module unshielded. The shielding layer can be formed by way of an additive process or a subtractive process. For instance, the shielding layer can be formed by masking a portion of the radio frequency module with a mask, forming a shielding layer, and removing the mask so as to leave the area that was previously masked unshielded. As another example, the shielding layer can be formed by forming a conductive layer over the module and removing the conductive layer over a portion of the radio frequency module. A laser can be used to remove the conductive layer over the portion of the radio frequency module.

Another aspect of this section is a packaged radio frequency (RF) module that is partially shielded. The RF module includes a package substrate, an RF shielding structure extending above the package substrate, an RF component over the package substrate and in an interior of the RF shielding structure, and an antenna on the package substrate external to the RF shielding structure.

FIG. 69 is a schematic diagram of an example RF module 2010 that includes an RF component 2012 and an integrated antenna 2014 according to an embodiment. The RF module 2010 can be a system in a package. FIG. 69 shows the RF module 2010 in plan view without a top shielding layer. The top shielding layer can be formed, for example, in accordance with any of the processes described with reference to FIG. 72A, FIG. 73A, FIG. 74A, FIG. 75A, or FIG. 76A. As illustrated, the RF module 2010 includes the RF component 2012 on a package substrate 2016, the antenna 2014 on the package substrate 2016, and wire bonds 2018 attached to the package substrate 2016 and surrounding the RF component 2012. The antenna 2014 of the RF module 2010 is outside of an RF shielding structure around the RF component 2012. Accordingly, the antenna 2014 can wirelessly receive and/or transmit RF signals without being shielded by the shielding structure around the RF component 2012. At the same time, the shielding structure can provide RF isolation between the RF component 2012 and the antenna 2014 and/or other electronic components.

The RF component 2012 can include any suitable circuitry configured to receive, process, and/or provide an RF signal. For instance, the RF component 2012 can include an RF front end, a crystal, a system on a chip, or any combination thereof. In certain implementations, the RF component 2012 can include a power amplifier, a low-noise amplifier, an RF switch, a filter, a matching network, a crystal, or any combination thereof. An RF signal can have a frequency in the range from about 30 kHz to 300 GHz. In accordance with certain communications standards, an RF signal can be in a range from about 450 MHz to about 6 GHz, in a range from about 700 MHz to about 2.5 GHz, or in a range from about 2.4 GHz to about 2.5 GHz. In certain implementations, the RF component 2012 can receive and/or provide signals in accordance with a wireless personal area network (WPAN) standard, such as Bluetooth, ZigBee, Z-Wave, Wireless USB, INSTEON, IrDA, or Body Area Network. In some other implementations, the RF component and receive and/or provide signals in accordance with a wireless local area network (WLAN) standard, such as Wi-Fi.

The antenna 2014 can be any suitable antenna configured to receive and/or transmit RF signals. The antenna 2014 can be a folded monopole antenna in certain applications. The antenna 2014 can be any suitable shape. For instance, the antenna 2014 can have a meandering shape as shown in FIG. 69. In other embodiments, the antenna can be U-shaped, coil shaped, or any other suitable shape for a particular application. The antenna 2014 can transmit and/or receive RF signals associated with the RF component 2012. The antenna 2014 can occupy any suitable amount of area of the packaging substrate 2016. For instance, the antenna 2014 can occupy from about 10% to 75% of the area of the package substrate 2016 in certain implementations.

The antenna 2014 can be printed on the packaging substrate 2016. A printed antenna can be formed from one or more conductive traces on the packaging substrate 2016. The one or more conductive traces can be formed by etching a metal pattern on the packaging substrate 2016. A printed antenna can be a microstrip antenna. Printed antennas can be manufactured relatively inexpensively and compactly due to, for example, their 2-dimensional physical geometries. Printed antennas can have a relatively high mechanical durability.

The package substrate 2016 can be a laminate substrate. The package substrate 2016 can include one or more routing layers, one or more insulating layers, a ground plane, or any combination thereof. In certain applications, the package substrate can include four layers. The RF component 2012 can be electrically connected to the antenna 2014 by way of metal routing in a routing layer of the packaging substrate 2016 in certain applications.

The wire bonds 2018 are part of an RF shielding structure around the RF component 2012. An RF shielding structure can be any shielding structure configured to provide suitable shielding associated with RF signals. The wire bonds 2018 can provide RF isolation between the antenna 2014 and the RF component 2012 so as to prevent electromagnetic interference between these components from significantly impacting performance of the antenna 2014 and/or the RF component 2012. The wire bonds 2018 can surround the RF component 2012 as illustrated. The wire bonds 2018 can be arranged around the RF component 2012 in any suitable arrangement, which can be rectangular as illustrated or non-rectangular in some other implementations. In the RF module 2010 illustrated in FIG. 69, the wire bonds 2018 form four walls around the RF component 2012. The wire bonds 2018 can be arranged such that adjacent wire bonds are spaced apart from each other by a distance to provide sufficient RF isolation between the RF component 2012 and other electronic components.

Figure 70:
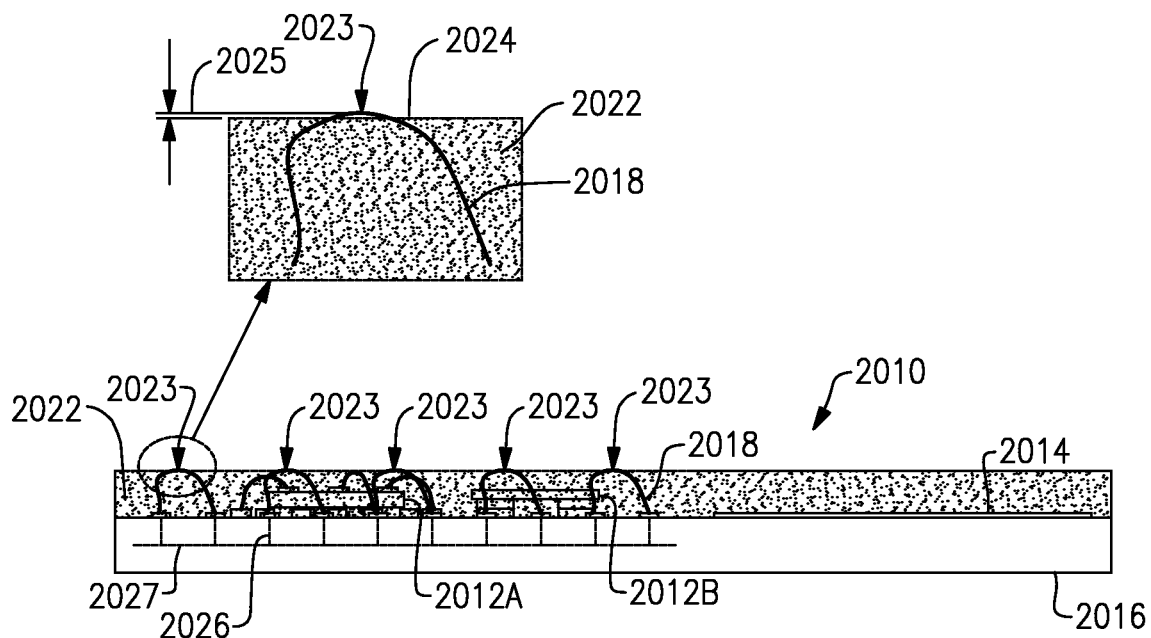
FIG. 70 is a cross sectional view of the radio frequency module of FIG. 1 prior to forming a shielding layer over the radio frequency component according to an embodiment.

FIG. 70 is a cross sectional view of the radio frequency module 2010 of FIG. 69 prior to forming a shielding layer over the radio frequency component 2012 according to an embodiment. As illustrated in FIG. 70, molding material 2022 can be disposed over the RF component 2012, the wire bonds 2018, and the antenna 2014. In FIG. 70, the RF component 2012 includes two die 2012A and 2012B on the package substrate 2016. Upper portions 2023 of wire bonds 2018 can extend above upper surface 2024 of an overmold structure of the molding material 2022 that is otherwise over the wire bonds 2018. The wire bonds 2018 can extend above the upper surface 2024 to a top point 2025 of the wire bonds 2018. The upper portions 2023 of the wire bonds 2018 can be exposed by removing molding material after forming an overmold structure of the molding material 2022. Having the upper portions 2023 of the wire bonds 2018 exposed as shown in FIG. 70 can allow a conductive layer over the molding material 2022 to be in contact with the wire bonds 2018 to thereby provide an electrical connection. FIG. 70 also illustrates vias 2026 in the package substrate 2016. The wire bonds 2018 can be electrically connected to a ground plane 2027 of the package substrate 2016 by way of the vias 2026. The wire bonds 2018 can be electrically connected to a ground contact of a system board on which the module 2010 is disposed by way of the vias 2026.

Figure 71:
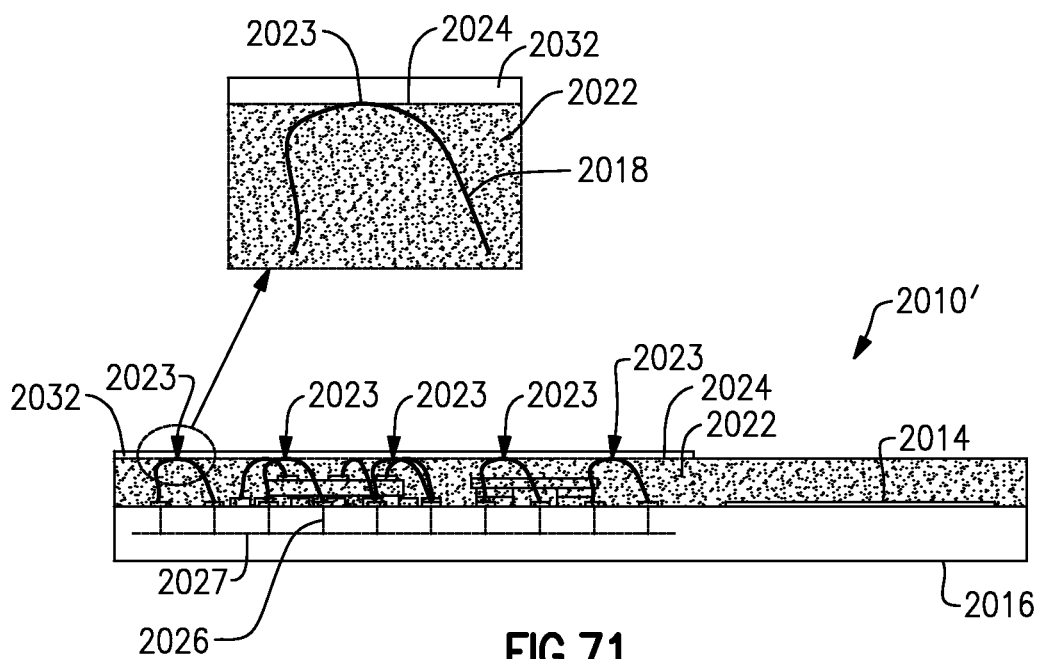
FIG. 71 is a cross sectional view of the radio frequency module of FIG. 1 with a shielding layer over the radio frequency component and not over the antenna according to an embodiment.

FIG. 71 is a cross sectional view of the radio frequency module of FIG. 69 with a shielding layer over the radio frequency component and not over the antenna according to an embodiment. The RF module 2010' illustrated in FIG. 71 includes a shielding layer 2032 formed over the upper surface 2024 of the overmold structure over the RF component 2012. The shielding layer 2032 is formed over a shielded portion of the RF module 2010' and an unshielded portion of the RF module 2010' is left unshielded opposite the package substrate 2016. As illustrated, the antenna 2014 is included in the unshielded portion of the RF module 2010'. The shielding layer 2032 is formed of electrically conductive material. As shown in FIG. 71, the shielding layer 2032 is in contact with wire bonds 2018.

A shielding structure around the RF component 2012 includes the shielding layer 2032 and the wire bonds 2018. The shielding structure can also include vias 2026 in the package substrate 2016, a ground plane 2027 in the package substrate 2016, ground pads and/or a ground plane of a system board on which the RF module 2010 is disposed, or any suitable combination thereof. The RF shielding structure can function as a Faraday cage around the RF component 2012. The RF shielding structure can be configured at a ground potential. The RF shielding structure around the RF component 2012 can shield the RF component 2012 from signals external to the shielding structure and/or shield circuits outside of the shielding structure from the RF component 2012. The antenna 2014 is external to the shielding structure in FIG. 71.

A shielding layer, such as the shielding layer 2032 of FIG. 71, can be formed over a portion of an RF module and a different portion of the RF module can be unshielded opposite a package substrate. Prior to forming the shielding layer over an RF module in methods of forming the shielding layer discussed herein, the RF module can have molding material over an antenna and wire bonds with exposed upper portions that extend beyond of surface of an overmold structure of the molding material (e.g., as shown in FIG. 70). Examples methods of forming such a shielding layer will be discussed with reference to FIGS. 72A to 76I. RF modules discussed herein can include a shielding layer formed by any of these methods as appropriate and/or by any suitable operations discussed with reference to any of these methods. The shielding layer can be formed over a selected portion of an RF module by an additive process or a subtractive process. The methods of forming shielding layers discussed herein can be implemented in high volume manufacturing. Such methods can be automated in an accurate and repeatable manner.

FIG. 72A is a flow diagram of an illustrative process 2040 that includes forming a shielding layer over a radio frequency component of a module and leaving an antenna unshielded according to an embodiment. The process 2040 involves forming a shielding layer over a portion of an RF module by a subtractive method. In the process 2040, a shielding layer can be formed over a plurality of RF modules, such as RF modules of a strip, concurrently. A conductive layer can be formed over the RF modules and the conductive layer can be removed over a selected portion of each of the RF modules using a laser. Methods of forming a shielding layer involving laser removal of a portion of a conductive layer can be advantageous for manufacturing RF modules that are relatively small in size. FIGS. 72B to 72E illustrate an example module or strip of modules corresponding to various stages of the process of FIG. 72A according to an embodiment.

At block 2042, RF modules that include an RF component and an integrated antenna are provided. The RF modules can include one or more conductive features, such as wire bonds, disposed between the RF component and the antenna. The conductive features are RF isolation structures that are included in a shielding structure. FIG. 72B illustrates an example RF module 2010A that can be provided at block 2042. The RF module 2010A can correspond to the RF module 2010 of FIGS. 69 and 70. As illustrated, the RF module 2010A of FIG. 72B includes an RF component 2012 that includes components 2012A, 2012B, and 2012C. As also illustrated in FIG. 72B, the wire bonds 2018 can surround the RF component. Upper portions of the wire bonds 2018 can be exposed, for example, as illustrated in FIG. 70.

A conductive layer can be formed over RF modules at block 2044. The conductive layer can be in contact with wire bonds of the RF modules. The conductive layer can be a conformal layer formed by physical vapor deposition (PVD). A conductive material can be sputtered over a strip of RF modules. A strip of RF module can be any suitable array of multiple RF modules that are processed together. Sputtering can provide a conductive layer than is smoother than conductive layers formed by some other processes. The conductive material layer can include any suitable conductive material for RF shielding. For example, the conductive material can be copper. Copper can provide desirable electromagnetic interference shielding and copper is also relatively inexpensive. Another example conductive material for the conductive layer is tungsten nickel. A protective layer can be formed over the conductive layer. This can prevent corrosion of the conductive layer. As an example, a titanium layer can be provided over a copper conductive layer to protect the copper. FIG. 72C shows a strip of RF modules 2043 with a conductive layer 2041 formed over the entire upper surface of the strip of RF modules 2043.

At block 2046, the conductive layer can be removed over an antenna of an RF module. For instance, a laser can remove the conductive layer over the antenna of the RF module. The laser can remove any suitable portion of the conductive layer over the RF module. Laser beams can be applied concurrently to two or more RF modules of the group of RF modules. For instances, portions of the conductive layer over an antenna of each of the RF modules of the strip of RF modules can be removed concurrently. In some instances, laser beams can be applied sequentially to different RF modules of the group of RF modules. Removing a portion of the conductive layer with a laser can leave features on the RF module. For example, burn features, such as a halo ring, can be present on an RF component after laser removal of a portion of the conductive layer. Laser removal can result in a rougher surface finish over the antenna relative to some other methods of forming a partially shielded RF module, such as methods that involve masking.

FIG. 72D shows a laser beam 2045 being applied to an RF module to remove a portion of the conductive layer 2041. The laser can selectively remove the conductive layer over the RF module such that the RF module is left with an unshielded portion 2047 and a shielded portion 2049. Accordingly, a shielding layer can be disposed over the RF component and the antenna can be unshielded opposite the package substrate. As such, the antenna can transmit and/or receive RF signals without the shielding layer interfering. While FIG. 72D illustrates the laser beam 2045 being applied to one module, laser beams can be applied to a group of RF modules at block 2046 of the process 2046.

Referring to FIG. 72A, the strip of RF modules can be singulated into individual RF modules at block 2048. Accordingly, singulation can occur after forming a shielding layer over a portion of an RF module. FIG. 72E shows a singulated RF module 2010A' that includes a shielding layer over a portion of the packaging substrate.

FIG. 73A is a flow diagram of an illustrative process 2050 that includes forming a shielding layer over a radio frequency component of a module and leaving an antenna unshielded according to an embodiment. The process 2050 involves forming a shielding layer over a portion of an RF module by an additive method. In the process 2050, masking material can be applied over selected portions of a plurality of RF modules of a strip, a conductive layer can be formed over the RF modules and the masking material, and the masking material can be removed. Methods of forming a shielding layer involving masking can be advantageous for manufacturing RF modules that are relatively large in size and/or for forming a shielding layer for a relatively small number of RF modules concurrently. FIGS. 73B to 73F illustrate an example module or strip of modules corresponding to various stages of the process of FIG. 73A according to an embodiment.

At block 2051, RF modules that include an RF component and an integrated antenna are provided. The RF modules can include one or more conductive features, such as wire bonds, disposed between the RF component and the antenna. The conductive features are RF isolation structures that are included in a shielding structure. FIG. 73B illustrates an example RF module 2010A that can be provided at block 2051. The RF module 2010A can correspond to the RF module 2010 of FIGS. 69 and 70. The RF module 2010A of FIG. 73B can also correspond to the RF module 2010A of FIG. 72B. As illustrated, the RF module 2010A of FIG. 73B includes an RF component 2012 that includes components 2012A, 2012B, and 2012C. As also illustrated in FIG. 73B, the wire bonds 2018 can surround the RF component.

A masking material can be provided over selected portions of RF modules at block 2053. A strip of RF modules can be masked concurrently and/or sequentially at block 2053. The masking material can be relatively high temperature tape. The masking material can be applied over the antenna of each of the RF modules of a strip of RF modules. FIG. 73C shows a strip 2052 of RF modules with masking material 2054 formed over a selected portion of each RF module of the strip 2052.

At block 2055, a conductive layer is formed over the strip of RF modules. The conductive layer can be in contact with wire bonds of the RF modules. The conductive layer can be formed by way of PVD or spraying conductive material over the strip of RF modules. For example, the conductive layer can be formed in accordance with any of the principles and advantages discussed with reference to block 2044 of the process 2040. As another example, the conductive layer can be formed by spraying conductive paint, such as silver (Ag) based conductive paint, over the strip of RF modules. FIG. 73D shows a strip 2052' of RF modules with a top surface covered by a conductive layer 2041.

The masking material is removed at block 2057. For instance, tape can be removed in any suitable manner. By removing the masking material, portions of the conductive layer that were formed over the masking material are also removed. Accordingly, the portion of the RF module that was covered by the masking material can be unshielded opposite the packaging substrate. Removing the masking material can leave features on the RF module. For example, a whisker feature and/or a relatively sharp step can be present from removing the masking material. FIG. 73E shows a strip 2052" of RF modules with a top surface having shielded portions 2049 and unshielded portions 2047. In the shielded portions 2049, a shielding layer 2032 is included in a shielding structure around the RF component 2012 of each RF module.

The strip of RF modules can be singulated into individual RF modules at block 2058. In the process 2050, singulation is performed after forming a shielding layer over a portion of an RF module. FIG. 73F shows an RF module 2010A' that includes a shielding layer over a portion of the packaging substrate. The RF module 2010A' of FIG. 73F can be similar to the RF module 2010A' of FIG. 72E except that the RF module 2010A' of FIG. 73F can include features resulting from removing a mask over the antenna and the RF module 2010A' of FIG. 72E can include features resulting from laser removal of material of the shielding layer over the antenna.

Certain processes, such as the process 2050 of FIG. 73A and the process 2060 of FIG. 74B, include forming a shielding layer prior to singulation of RF modules. In some other processes, the shielding layer can be formed after singulation of RF modules. In such processes, a conformal structure can be formed along one or more edges of a singulated module while forming a conductive layer over the singulated module. The conformal structure can be included in a shielding structure around an RF component. The conformal structure implemented in place of wire bonds along one or more sides of an RF component. FIGS. 74A, 75A, and 76A are examples of processes that include forming a shielding layer after singulation of RF modules.

FIG. 74A is a flow diagram of an illustrative process 2060 that includes forming a shielding layer over a radio frequency component of a module and leaving an antenna unshielded according to an embodiment. The process 2060 involves forming a shielding layer over a portion of an RF module by an additive method. In the process 2060, masking material can be applied over selected portions of a plurality of RF modules of a strip, the RF modules can be singulated, a conductive layer can be formed over the RF modules and the masking material, and the masking material can be removed. FIGS. 74B to 74F illustrate an example module, strip of modules, or group of singulated modules corresponding to various stages of the process of FIG. 74A according to an embodiment.

At block 2061, RF modules that include an RF component and an integrated antenna are provided. The RF modules can include one or more conductive features, such as wire bonds, disposed between the RF component and the antenna. The conductive features are RF isolation structures that are included in a shielding structure. FIG. 74B illustrates an example RF module 2010B that can be provided at block 2061. The RF module 2010B can generally correspond to the RF module 2010 of FIGS. 69 and 70 and the RF module 2010A of FIGS. 72B and 73B. The RF module 2010B includes wire bonds 2018 around fewer sides of the RF component 2012 than the RF modules 2010 and 2010A. As illustrated in FIG. 74B, the wire bonds 2018 are disposed between the RF component 2012 and the antenna 2014. The illustrated wire bonds 2018 form a wall of wire bonds between the RF component 2012 and the antenna 2014. As also illustrated, the RF module 2010B of FIG. 74B includes an RF component 2012 that includes components 2012A, 2012B, and 2012C.

A masking material can be provided over selected portions of RF modules at block 2063. A strip of RF modules can be masked concurrently and/or sequentially at block 2063. The masking material can be relatively high temperature tape. The masking material can be relatively low adhesion tape. The masking material can be applied over the antenna of each of the RF modules of a strip of RF modules. FIG. 74C shows a strip 2052 of RF modules with masking material 2054 formed over a selected portion of each RF module of the strip 2052.

At block 2065, RF modules can be singulated. For instance, a jig saw can separate individual RF modules from each other. The singulated RF modules can be provided to a PVD ring. FIG. 74D shows a group of singulated RF modules 2066 prior to a shielding layer being formed thereon.

A conductive layer is formed over the singulated RF modules at block 2067. The conductive layer can be in contact with wire bonds of a singulated RF module. The conductive layer can be formed by way of sputtering. For example, the conductive layer can be formed in accordance with any of the principles and advantages discussed with reference to block 2044 of the process 2040 as applied to singulated modules. FIG. 74E shows a group of singulated RF modules 2066' with a conductive layer formed thereon. The conductive layer is substantially parallel to a package substrate of the RF module.

At block 2067, conformal conductive layers can also be formed along edges of singulated RF modules. The conformal conductive layers can be substantially orthogonal to and in contact with the conductive layer that is substantially parallel to the package substrate. Accordingly, the shielding structure around the RF component can include the wire bonds 2018 around one side of the RF component, conformal conductive layers around three sides of the RF component, and a shielding layer over the RF component. In other embodiments, wire bonds can be disposed along two or three sides of the RF component and conformal conductive layers can be disposed along the other side(s) of the RF component. Examples of such embodiments correspond to FIGS. 77E and 77F.

The masking material is removed at block 2069. The masking material can be removed while the singulated RF modules are picked and placed into a tray. The masking material can be removed in any suitable manner, such as peeling the masking material or dissolving the masking material. By removing the masking material, portions of the conductive layer that were formed over the masking material are removed. Accordingly, the portion of the RF module that was covered by the masking material can be unshielded opposite the packaging substrate. Removing the masking material can leave features on the RF module. For example, a whisker feature and/or a relatively sharp step can be present from removing the masking material. FIG. 74F shows an RF module 2010B' that includes a shielding layer over a portion of the packaging substrate.

FIG. 75A is a flow diagram of an illustrative process 2070 that includes forming a shielding layer over a radio frequency component of a module and leaving an antenna unshielded according to an embodiment. The process 2070 involves forming a shielding layer over a portion of an RF module by a subtractive method. For instance, a selected portion of a conductive layer of a singulated RF module can be removed using a laser in the process 2070 instead of by masking in the process 2060 of FIG. 74A. The process 2070 involves forming a conductive layer over the singulated RF modules and then removing a selected portion of the conductive layer. FIGS. 75B to 75F illustrate an example module or group of singulated modules corresponding to various stages of the process of FIG. 75A according to an embodiment.

At block 2071, RF modules that include an RF component and an integrated antenna are provided. The RF modules can include one or more conductive features, such as wire bonds, disposed between the RF component and the antenna. The conductive features are RF isolation structures that are included in a shielding structure. FIG. 75B illustrates an example RF module 2010B that can be proved at block 2071. The RF module 2010B can generally correspond to the RF module 2010 of FIGS. 69 and 70 and the RF module 2010A of FIGS. 72B and 73B. The RF module 2010B of FIG. 75B can correspond to the RF module 2010B of FIG. 74B. As illustrated, the RF module 2010B of FIG. 75B includes an RF component 2012 that includes components 2012A, 2012B, and 20120. As also illustrated in FIG. 75B, the wire bonds 2018 are disposed between the RF component 2012 and the antenna 2014. The illustrated wire bonds 2018 form a wall of wire bonds between the RF component 2012 and the antenna 2014.

RF modules can be singulated at block 2073. For instance, a jig saw can separate individual RF modules from each other. The singulated RF modules can be provided to a PVD ring. FIG. 75B shows a group of singulated RF modules 2074 prior to a conductive layer being formed thereon. The RF modules 2074 can correspond to the RF modules 2066 of FIG. 74D without masking material formed thereon.

A conductive layer is formed over the singulated RF modules at block 2075. The conductive layer can be in contact with wire bonds of the singulated RF module. The conductive layer can be formed by way of sputtering. For example, the conductive layer can be formed in accordance with any of the principles and advantages discussed with reference to block 2044 of the process 2040 as applied to singulated modules. FIG. 74C shows a group of singulated RF modules 2074' with a conductive layer formed thereon. The conductive layer is substantially parallel to a package substrate of the RF module.

At block 2075, conformal conductive layers can also be formed along edges of singulated RF modules. The conformal conductive layers can be substantially orthogonal to and in contact with the conductive layer that is substantially parallel to the package substrate. Accordingly, the shielding structure around the RF component can include the wire bonds 2018 around one side of the RF component, conformal conductive layers around three sides of the RF component, and a shielding layer over the RF component. In other embodiments, wire bonds can be disposed along two or three sides of the RF component and conformal conductive layers can be disposed along the other side(s) of the RF component. Examples of such embodiments correspond to FIGS. 77E and 77F.

A selected portion of the conductive layer can be removed over an antenna of an RF module at block 2077. For instance, a laser can remove the conductive layer over the antenna of the RF module. Removing a portion of the conductive layer with a laser can leave features on the RF module. For example, burn features, such as a halo ring, can be present on an RF component after laser removal of a portion of the conductive layer. Laser removal can result in a rougher surface finish over the antenna relative to some other methods of forming a partially shielded RF module, such as methods that involve masking. The laser removal can involve any of the principles and discussed with reference to block 2046 of the process 2040 as applied to laser removal of a selected portion of a conductive layer of one or more singulated RF modules. In the process 2070, laser removal is performed after singulation. By contrast, in the process 2040, laser removal of a selected portion of the conductive layer is performed prior to singulation.

FIG. 74E shows a laser beam 2045 being applied to a singulated RF module. The laser can selectively remove the conductive layer over the RF module so that the RF module is left with an unshielded portion 2047 and a shielded portion 2049. Accordingly, a shielding layer can be disposed over the RF component and the antenna can be unshielded opposite the package substrate. As such, the antenna can transmit and/or receive RF signals without the shielding layer interfering.

At block 2077, singulated RF modules are picked and placed into a tray. FIG. 74F shows an RF module 2010B' that includes a shielding layer over a portion of the packaging substrate that includes an RF component.

FIG. 76A is a flow diagram of an illustrative process 2080 that includes forming a shielding layer over a radio frequency component of a module and leaving an antenna unshielded according to an embodiment. The process 2080 involves forming a shielding layer over a portion of an RF module by an additive method. Masking material can be applied over a panel of RF modules, the masking material can be cut and a portion of the masking material can be removed, a conductive layer can be formed, and the remaining masking material can be removed. FIGS. 76B to 76I illustrate an example module, strip of modules, or group of singulated modules corresponding to various stages of the process of FIG. 76A according to an embodiment.

At block 2081, RF modules that include an RF component and an integrated antenna are provided. The RF modules can include one or more conductive features, such as wire bonds, disposed between the RF component and the antenna. The conductive features are RF isolation structures that are included in a shielding structure. FIG. 76B illustrates an example RF module 2010B that can be provided at block 2081. The RF module 2010B can generally correspond to the RF module 2010 of FIGS. 69 and 70 and the RF module 2010A of FIGS. 72B and 73B. The RF module 2010B of FIG. 76B can correspond to the RF module 2010B of FIG. 74B and the RF module 2010B of FIG. 75B. As illustrated, the RF module 2010B of FIG. 76B includes an RF component 2012 that includes components 2012A, 2012B, and 2012C. As illustrated in FIG. 76B, the wire bonds 2018 are disposed between the RF component 2010B and the antenna 2014. The illustrated wire bonds 2018 form a wall of wire bonds between the RF component 2010B and the antenna 2014.

A masking material can be provided over RF modules at block 2083. The masking material can cover a strip of RF modules. The masking material can include any suitable features of the masking materials discussed herein. FIG. 76C shows a strip 2082 of RF modules with masking material 2054 formed over the top surface of each of the RF modules of the strip 2052. While the masking material is formed over the entire top surface of the RF modules in FIG. 76C, the masking material can be formed over any suitable portion of the top surface of the RF modules in some other embodiments.

The masking material can be laser cut at block 2085. The masking material can be laser cut such that masking material can be over the RF modules in any desired shape. Such desired shapes may be rectangular. In some other embodiments, the desired shapes can be non-rectangular. For instance, curved features, circular features, elliptical features, non-rectangular polygonal features, or any combination thereof can be laser cut. FIG. 76D shows a strip 2082' of RF modules with masking material 2054 that is laser cut.

At block 2087, a portion of the masking material can be removed. Accordingly, masking material can remain over a portion of an RF module that will be unshielded after the process 2080. For instance, the masking material can remain over the antenna of an RF module. FIG. 76E shows a strip 2082" of RF modules with masking material 2054 after partial removal.

RF modules can be singulated at block 2089. For instance, a jig saw can separate individual RF modules from each other. The singulated RF modules can be provided to a PVD ring. FIG. 76F shows a group of singulated RF modules 2090 prior to a conductive layer being formed thereon. FIG. 76G shows a singulated RF module with masking material 2054 over a portion that will be unshielded after the process 2080. The group of singulated RF modules 2090 can include a plurality of such modules. The RF modules 2090 can correspond to the RF modules 2066 of FIG. 74D with a different pattern of masking material formed thereon.

A conductive layer is formed over the singulated RF modules at block 2091. The conductive layer can be in contact with wire bonds of a singulated RF module. The conductive layer can be sputtered over the RF modules. The conductive layer can be formed by way of PVD. For example, the conductive layer can be formed in accordance with any of the principles and advantages discussed with reference to forming the conductive layer in any of the methods discussed herein as suitable. FIG. 76H shows a group of singulated RF modules 2090' with conductive layers formed thereon. The conductive layer of each RF module is substantially parallel to a package substrate of the RF module.

At block 2091, conformal conductive layers can also be formed along edges of singulated RF modules. The conformal conductive layers can be substantially orthogonal to and in contact with the conductive layer that is substantially parallel to the package substrate. Accordingly, the shielding structure around the RF component can include the wire bonds 18 around one side of the RF component, conformal conductive layers around three sides of the RF component, and a shielding layer over the RF component. In other embodiments, wire bonds can be disposed along two or three sides of the RF component and conformal conductive layers can be disposed along the other side(s) of the RF component. Examples of such embodiments correspond to FIGS. 77E and 77F.

The remaining masking material is removed at block 2093. The masking material can be removed in any suitable manner. By removing the masking material, portions of the conductive layer that were formed over the masking material are removed. Accordingly, the portion of the RF module that was covered by the masking material can be unshielded opposite the packaging substrate. Removing the masking material can leave features on the RF module. For example, a whisker feature and/or a relatively sharp step can be present from removing the masking material. FIG. 76I shows a RF module 2010B' with a top surface having a shielded portion and an unshielded portion. In the shielded portion, a shielding layer can be included in a shielding structure around an RF component. The antenna of the RF module can be unshielded opposite the package substrate in the unshielded portion.

At block 2095, singulated RF modules are picked and placed into a tray.

FIGS. 77A to 77F are schematic diagrams of examples of selectively shielded RF modules according to certain embodiments. Any of the principles and advantages discussed in connection with any of these embodiments can be implemented in connection with any other of these embodiments and/or any other embodiments discussed herein as suitable. Similar to FIG. 69, the RF modules of FIGS. 77A to 77F are shown in plan view without a top shielding layer.

The top shielding layer can be formed, for example, in accordance with any of the principles and advantages discussed with reference to one or more of the processes of FIG. 72A, FIG. 73A, FIG. 74A, FIG. 75A, or FIG. 76A. A shielding layer can be formed over the RF component of each of these RF modules and the antenna of each of these RF modules can be unshielded. Wire bonds of each of these modules can be in contact with the shielding layer such that both the wire bonds and the shielding layer are part of a shielding structure around an RF component. Although FIGS. 77A to 77F illustrate RF modules with a single antenna, any suitable principles and advantages discussed herein can be applied to RF modules that include two or more integrated antennas.

FIGS. 77A to 77F illustrate various RF modules in accordance with the principles and advantages discussed herein. Each of these RF modules can be selectively shielded in accordance with any suitable principles and advantages discussed herein. FIGS. 77A to 77F illustrate that various RF components can be implemented within a shielding structure, that various shielding structures can be implemented, that antennas can have various shapes and/or positions, or any suitable combination thereof. For instance, FIG. 77A shows an example of an RF component that includes three different elements. Other RF components can alternatively or additionally be implemented. FIGS. 77B, 77C, 77E, and 77F show that shielding structures can include one, two, or three walls of wire bonds and conductive conformal structure(s) can be disposed along other sides of the RF module to shield the RF component. Wire bonds can surround the RF component of the RF module in embodiments in which a shielding layer is formed prior to singulation of the RF modules. A conformal layer can be disposed along at least one side the RF component of the RF module in embodiments in which a shielding layer is formed after singulation of the RF modules. The conformal structure can include any suitable conductive material. For example, the conductive conformal structure can include the same conductive material as the shielding layer in certain applications. FIGS. 77D, 77E, and 77F show example antenna positions and shapes. Any of the RF modules discussed herein can include an antenna that is suitably positioned and of any suitable size and shape for a particular application.

FIG. 77A is a schematic diagram of an example RF module 2010A according to an embodiment. The RF module 2010A of FIG. 77A shows that the RF component 2012 of FIG. 69 can include a system on a chip 2012A, a front end integrated circuit 2012B, and a crystal 2012C. The RF module 2010A of FIG. 77A is an example of an RF module that can be provided in the process 2040 of FIG. 72A and/or in the process 2050 of FIG. 73A.

FIG. 77B is a schematic diagram of an example RF module 2010B according to an embodiment. The RF module 2010B of FIG. 77B is an example of an RF module that can be provided in the process 2060 of FIG. 74A, the process 2070 of FIG. 75A, or the process 2080 of FIG. 76A. The RF module 2010B of FIG. 77B is like the RF module 2010 of FIG. 69 except that wire bonds 2018 are not surrounding the RF component 2012. In FIG. 77B, wire bonds 2018 are disposed between the RF component 2012 and the antenna 2014. The remaining sides around the RF component in FIG. 77B are free from wire bonds.

FIG. 77C shows the radio frequency module of FIG. 77B after a shielding layer 2032 and a conductive conformal structure 2098 are formed. As illustrated in FIG. 77C, the conductive conformal structure 2098 can be formed along the outer edges of the module 2010B'. Such a conductive conformal structure can be formed, for example, as described in connection with the process 2060 of FIG. 74A, the process 2070 of FIG. 75A, or the process 2080 of FIG. 76A. Accordingly, the shielding structure around the RF component 2012 in FIG. 77C includes wire bonds 2018 disposed between the RF component 2012 and the antenna 2014 and a conductive conformal structure 2098 that includes three conformal conductive sides along edges of the RF module 2010B'. The wire bonds 2018 and the conformal conductive surfaces can be in contact with the shielding layer 2032 disposed over the RF component 2012. The wire bonds 2018 illustrated in FIGS. 77B and 77C are arranged as a wall. In some other instances, the conductive conformal structure can also be along edges of the module 2010B' around the antenna 2014. The shielding layer can be formed over the RF component 2012 and the antenna 2014 can be unshielded opposite the package substrate 2016.

FIG. 77D is a schematic diagram of an example RF module 2010C according to an embodiment. The RF module 20100 of FIG. 77D is like the RF module 2010 of FIG. 69 except that an antenna 2014A surrounds the RF component 2012 and the antenna 2014A has a different shape than the antenna 2014 of FIG. 69. A shielding layer opposite the package substrate 2016 can shield the RF component 2012 and leave the antenna 2014A unshielded.

FIG. 77E is a schematic diagram of an example RF module 2010D according to an embodiment. The RF module 2010D of FIG. 77E is like the RF module 2010 of FIG. 69 except both the shielding structure and the antenna are different. In the RF module 2010D shown in FIG. 77E, the shielding structure includes three walls of wire bonds 2018 around the RF component 2012. A conformal conductive layer can be formed along the side that is free from wire bonds. The conformal conductive layer and a shielding layer can be included in the shielding structure. The antenna 2014B has a different position and shape than the antenna 2014 of FIG. 69. The antenna 2014B shown in FIG. 77E is disposed around three of four side of the RF component 2012. A shielding layer opposite the package substrate 2016 can shield the RF component 2012 and leave the antenna 2014B unshielded.

FIG. 77F is a schematic diagram of an example RF module 2010E according to an embodiment. The RF module 2010E of FIG. 77F is like the RF module 2010 of FIG. 69 except the shielding structure and the antenna are different. In the RF module 2010E shown in FIG. 77F, the shielding structure includes two walls of wire bonds 2018 around the RF component 2012. A conformal conductive layer can be formed along the sides that are free from wire bonds. The conformal conductive layer and a shielding layer can be included in the shielding structure. The antenna 20140 has a different position and shape than the antenna 2014 of FIG. 69. The antenna 2014C shown in FIG. 77F is disposed around two of four sides of the RF component 2012. A shielding layer opposite the package substrate 2016 can shield the RF component 2012 and leave the antenna 20140 unshielded.

Radio frequency modules can be selectively shielded such that a shielding layer opposite a package substrate covers any suitable portion of the radio frequency module. Such a shielding layer can have any suitable pattern for a desired application. The pattern can be formed by ablating conductive material, such as by laser scribing, and/or by removing a mask to remove conductive material. The pattern can have any suitable shape and/or size. For instance, such a pattern could cover an RF component shown in any of FIGS. 77A to 77F.

The unshielded portion of the radio frequency module can be exposed by ablation. An ablation pattern can be any suitable pattern for a desired application. For example, the ablation pattern can be a line, multiple lines such as multiple intersecting lines, a block, etc. Removing masking material can alternatively perform a similar function as ablating conductive material. Accordingly, an unshielded portion of a radio frequency module can have a shape of one or more lines and/or one or more blocks in plan view. In some instances, an unshielded portion of a radio frequency module can separate different shielded portions of the radio frequency module.

While the radio frequency modules of FIGS. 77A to 77F include an unshielded portion over an antenna, an unshielded portion can be over one or more other circuit elements (such as one or more matching circuits, one or more filters, one or more duplexers, the like, or any suitable combination thereof) and/or between circuitry of different portions of a radio frequency module. In certain applications, shielding structures can be segmented to keep one portion of a radio frequency module from interfering with another portion of the radio frequency module.

FIGS. 77G to 77J are diagrams of examples of selectively shielded RF modules according to certain embodiments. Any of the principles and advantages discussed in connection with any of these embodiments can be implemented in connection with any other of these embodiments and/or any other embodiments discussed herein as suitable. For instance, the top shielding layers of FIGS. 77G to 77J can be formed in accordance with any suitable principles and advantages discussed with reference to one or more of FIG. 72A, FIG. 73A, FIG. 74A, FIG. 75A, or FIG. 76A.

FIG. 77G illustrates a shielded radio frequency module 2010F' with an ablation pattern leaving a portion of the radio frequency module unshielded according to an embodiment. The ablation pattern can extend over a top of the radio frequency module 2010F' and also over opposing sides of the radio frequency module 2010F'. The ablation pattern can be formed by laser scribing, for example. Such laser scribing can remove conductive material and leave an unshielded portion 2047A that is free from the conductive material over a molding material. The laser scribing can also remove some molding material (e.g., about 5 microns of molding material) in the unshielded portion 2047A. A width of the illustrated ablation pattern can be in a range from about 40 to 150 microns, such as about 100 microns, in certain applications.

As shown in FIG. 77G, unshielded portion 2047A separates a first shielding structure from a second shielding structure. The first shielding structure can provide shielding for an RF component. The illustrated first shielding structure includes a top shielding layer 2032A and three conformal sides. The three conformal sides can be substantially orthogonal to the top shielding layer 2032A. The conformal sides can be connected to ground and provide a ground connection for the top shielding layer 2032A. The first shielding structure can also include wire bonds on the fourth side adjacent to the unshielded portion 2047A. Such wire bonds can be in contact with the top shielding layer 2032A. Alternatively, a conductive conformal structure can be formed along the fourth side and in contact with the top shielding layer 2032A. The second shielding structure can provide shielding for another electronic component, such as another RF component. The illustrated second shielding structure includes a top shielding layer 2032B and three conformal sides. The three conformal sides can be substantially orthogonal to the top shielding layer 2032B. The conformal sides can be connected to ground and provide a ground connection for the top shielding layer 2032B. The second shielding structure can also include wire bonds on the fourth side adjacent to the unshielded portion 2047A. Such wire bonds can be in contact with the top shielding layer 2032B. Alternatively, a conductive conformal structure can be formed along the fourth side and in contact with the top shielding layer 2032B. In certain applications, the first shielding structure and the second shielding structure are both open on opposing sides of the unshielded portion 2047A in a direction substantially orthogonal to the top shielding layers.

FIG. 77H illustrates a selectively shielded radio frequency module 2010G' according to an embodiment. In FIG. 77H, the unshielded portion 2047A is wider than in FIG. 77G. The unshielded portion 2047A can have a width in a range from about 300 microns to 700 microns, such as about 500 microns. The unshielded portion 2047A can have any suitable dimension for a particular application.

FIG. 77I illustrates a selectively shielded radio frequency module 2010H' with an unshielded portion 2047A between two shielded portions according to an embodiment. The radio frequency module 2010H' illustrates that two RF components of the same radio frequency module can shielded by different shielding structures. These RF components can be any suitable RF components, such as RF components operating in different frequency bands (e.g., a high band and a low band). In the radio frequency module 2010H', a first shielding structure provides shielding for a first RF component 2012-1 and a second shielding structure provides shielding for a second RF component 2012-2. The shielding structures of the radio frequency module 2010H' can reduce and/or eliminate inference between the first RF component 2012-1 and the second RF component 2012-2. The first RF component 2012-1 is positioned between a top shielding layer 2032A of the first shielding structure and a package substrate. The second RF component 2012-2 is positioned between a top shielding layer 2032B of the second shielding structure and the package substrate.

Conformal layers can form at least three sides of the first shielding structure of the radio frequency module 2010H'. Similarly, conformal layers can form at least three sides of the second shielding structure of the radio frequency module 2010H'. In certain applications, the first shielding structure and the second shielding structure are both open on opposing sides of the unshielded portion 2047A in a direction substantially orthogonal to the top shielding layers. In some instances, one or more conductive features can be disposed between the first RF component 2012-1 and the second RF component 2012-B. For example, the first shielding structure can include one or more wire bonds disposed between the RF component 2012-1 and the unshielded portion 2047A, in which the one or more wire bonds are in contact with the top shielding layer 2032A. Alternatively or additionally, the second shielding structure can include one or more wire bonds disposed between the RF component 2012-2 and the unshielded portion 2047A, in which the one or more wire bonds are in contact with the top shielding layer 2032B. As another example, the first shielding structure can include a conformal structure disposed between the RF component 2012-1 and the unshielded portion 2047A and/or the second shielding structure can include a conformal structure disposed between the RF component 2012-2 and the unshielded portion 2047A. Such a conformal structure can be formed in accordance with any suitable principles and advantages discussed with reference to FIGS. 81A and 81B, for example. In some applications, laser scribing can remove conductive material within a through mold via so that the bottom of the through mold via can correspond to the unshielded portion 2047A.

FIG. 77J illustrates a selectively shielded radio frequency module 2010I' with an unshielded portion between shielded portions according to an embodiment. The radio frequency module 2010I' illustrates another example unshielded portion 2047B and example RF components 2012-1, 2012-2A and 2012-2B, and 2012-3. The unshielded portion 2047B can be formed by ablating a conductive material over the module with a laser scribe, for example. As illustrated by FIG. 77J, the unshielded portion 47B can segment a shielding structure into more than two separate shielding structures. The radio frequency module 2010I' is an example in which 3 different components are packaged together (SoC 2012-1, front end 2012-2A and SOC 2012-2, and crystal 2012-3) and are separated from each other by the unshielded portion 2047B. In some embodiments, one or more conductive features in contact with a top shielding layer can be on one or both sides of some or all of the unshielded portion 2047B. The one or more conductive features can include one or more wire bonds and/or a conformal structure.

Integrated antennas can be printed on a package substrate, for example, as discussed above. In certain embodiments, an integrated antenna can be a multi-layer antenna. For instance, a portion of an integrated antenna can be on a surface of a package substrate and another portion of the integrated antenna can be implemented in another layer above or below the portion of the integrated antenna on the surface of the package substrate. As an example, a portion of an integrated antenna can be printed on a first side of a package substrate and another portion of the integrated antenna can be on a second side of the package substrate, in which the first side opposes the second side. As another example, of an integrated antenna can be printed on a first side of a package substrate and another portion of the integrated antenna can be implemented over a molding layer of a radio frequency module. In some applications, a multi-layer antenna can implement an antenna in a smaller foot print relative to similar a single layer antenna. This can reduce a footprint of the antenna and consequently reduce a footprint of a radio frequency module that includes the antenna.

FIGS. 78A and 78B illustrate a radio frequency module 2100 that includes an integrated antenna implemented on opposing sides of a package substrate 2016. The illustrated integrated antenna is multi-layer antenna. Any suitable principles and advantages of the RF module 2100 can be implemented in combination with any of the other embodiments discussed herein. The antenna can include traces on opposing sides of the package substrate. FIG. 78A is a top view of the radio frequency module 2100. FIG. 78B is a bottom view of the radio frequency module 2100.

As shown in FIG. 78A, a first portion 2104A of an antenna can be on a first side of a packaging substrate on which the RF component 2012 is also disposed. The first portion 2104A can be implemented by a conductive trace. The first portion 2104A of the antenna can be electrically connected to a second portion 2104B of the antenna by one or more vias that extends through the packaging substrate 2016. The first portion 2104A and the second portion 2104B can together implement the antenna of the RF module 2100.

As shown in FIG. 78B, the second portion 2104B of the antenna can be on an opposite side of the packaging substrate 2016 than the first portion 2104A. The second portion 2104B can be implemented by a conductive trace. One or more pads can be disposed on the second portion 2104B of the antenna. As also shown in FIG. 78B, pads 2108A to 2108E can be contact with the second portion 2104B of the antenna. The pads 2108A to 2108E can be exposed for providing connections between the antenna and a system board on which the RF module 2100 is disposed. The pads 2108A to 2108E can be soldered to the system board. One or more of the pads 2108A to 2108E can serve as an anchor point to align the antenna of the RF module 2100 with the system board.

Referring back to FIG. 78A, the illustrated RF module 2100 includes a matching circuit 2106 that is implemented on the packaging substrate 2016 external to the shielding structure. The illustrated matching circuit 2106 is electrically connected to the antenna. The matching circuit 2106 can provide impedance matching associated with the antenna. The matching circuit 2106 can include any suitable matching circuit elements, such as one or more capacitors and/or one or more inductors. As illustrated, the matching circuit 2106 includes three passive circuit elements 2106A, 2106B, and 21060. The matching circuit 2106 can include more or fewer circuit elements in other applications. For instance, a matching circuit can include two inductors in certain applications. The matching circuit 2106 can have a relatively high activity factor. Accordingly, implementing the matching circuit 2106 external to the shielding structure can allow heat associated with the matching circuit 2106 to dissipate outside of the shielding structure.

FIGS. 79A and 79B illustrate a radio frequency module 2110 that includes an integrated antenna partially implemented over molding material 2022. The illustrated integrated antenna is multi-layer antenna. Any suitable principles and advantages of the RF module 2110 can be implemented in combination with any of the other embodiments discussed herein. FIG. 79A shows a partial view of the RF module 2110 with molding material omitted for illustrative purposes. FIG. 79B shows a view of the RF module 2110 with the molding material 2022. In FIGS. 79A and 79B, the antenna includes a first portion 2114A and a second portion 2114B. The first portion 2114A can be a conductive trace on the package substrate 2016. The second portion 2114B can be disposed over molding material 2022 of the RF module 2110. The second portion 2114B can include patterned conductive material over the molding material 2022. The second portion 2114B can be implemented by the same material as the shielding layer 2032 of a shielding structure of the RF module 2110. The second portion 2114B can be formed during an operation during which the shielding layer 2032 is formed. The second portion 2114B of the antenna and the shielding layer 2032 can be approximately the same distance from the packaging substrate 2016. One or more wire bonds 2116 can electrically connect the first portion 2114A of the antenna with the second portion of the antenna 2114B.

It can be desirable to reduce the physical size of an RF module with an integrated antenna. Certain antenna designs can reduce the physical size and/or footprint of such an RF module having an integrated antenna. FIG. 80 illustrates an RF module 2120 with an integrated antenna 2124 shielded from an RF component. Any suitable principles and advantages of the RF module 2120 can be implemented in combination with any of the other embodiments discussed herein. With the antenna 2124, the RF module 2120 can have a length that is reduced about 15% to 20% relative to some other antenna designs. Accordingly, the RF module 2120 can have a smaller footprint that such other antenna designs.

Although the RF modules shown in FIGS. 77A to 77E include wire bonds disposed between an RF component and an integrated antenna, other conductive structures can provide shielding between the RF component and the integrated antenna in certain embodiments. For example, a conductive conformal structure can provide such shielding. Accordingly, a conductive conformal structure can be disposed between an RF component and an integrated antenna in an RF module in accordance with any suitable principles and advantages discussed herein.

Any of the processes of forming a shielding layer over a radio frequency component of a module and leaving an antenna unshielded discussed herein can be modified to form such a conformal layer. For example, a through mold via can be formed through molding material of a molding structure of an RF module. Laser scribing can remove the molding material to form such a through mold via. Then a conductive layer can be formed over the RF module by sputtering or any other suitable manner. This can form a conductive layer over the molding material and within the through mold via, including along a sidewall of the through mold via. The conductive layer can then be removed over the integrated antenna such that the antenna of the RF module is unshielded over the packaging substrate. Such removal can be performed in accordance with any suitable principles and advantages discussed herein, such as laser removal of conductive material over the antenna and/or removing masking material over the antenna. After removing the conductive layer over the antenna, a conductive conformal structure can remain within the through mold via. This conductive conformal structure can be in contact with the shielding layer over the RF component and be included in the shielding structure around the RF component. Accordingly, this conductive conformal structure can provide shielding between the RF component and the antenna of the RF module.

FIG. 81A illustrates an RF module 2130 with a through mold via 2132. The through mold via 2132 can be formed by laser scribing, for example. The through mold via 2132 can have one or more sloped sidewalls. As illustrated, the through mold via 2132 is disposed between RF component 2012 and the antenna 2014. The RF module 2130 includes a conductive layer 2134 over molding material 2022. The conductive layer 2134 is also formed over the sloped sidewalls of the through mold via 2132. The sloped sidewalls of the through mold via 2132 can enable a conductive conformal structure between the RF component 2012 and the antenna 2014 to be formed when the conductive layer is formed over the RF component 2012. With sloped sidewalls, a conductive conformal structure can be formed with desirable step coverage between the antenna 2014 and RF component 2012.

FIG. 81B illustrates an RF module 2130' after the conductive layer 2134 shown in FIG. 81A is removed over an antenna 2014. In the RF module 2130', a shielding structure around the RF component 2012 includes the shielding layer 2032 and a conductive conformal structure 2136 over a sidewall of the through mold via 2132. The conductive conformal structure 2136 is arranged to provide shielding between the RF component 2012 and the antenna 2014. Other sides of the RF component 2012 can also be shielded by a conductive conformal structure. For instance, the RF component 2012 of the RF module 2130' can be surrounded by a conductive conformal structure.

FIGS. 82A and 82B are diagrams of a shielded RF component on a carrier with a printed antenna according to an embodiment. FIG. 82A is a top view and FIG. 82B is a side view. As shown in FIGS. 82A and 82B, a carrier 2140 can have an antenna 2014 printed thereon. The carrier 2140 can be a package substrate, such as a laminate substrate. The carrier 2140 can have fewer layers compared to the package substrates 2016 discussed above. For example, in certain applications, the carrier 2140 can include two layers and the package substrate 2016 can include four layers. An RF component 2012 can be shielded by a shielding structure 2142, which can be a conformal shielding structure as illustrated. A packaged component 2144 can be disposed on the carrier 2140 laterally from the antenna 2014. Accordingly, the antenna 2014 can transmit and/or receive signals without the shielding structure 2142 interfering. The packaged component 2144 can be disposed on the carrier 2140 such that a ground pad on the carrier 2140 is electrically connected to the conformal shielding structure. The packaged component 2144 can include a system in a package with a conformal shielding structure. The packaged component 2144 can include molded system in a package with its own package substrate.

Front end systems discussed herein can be implemented in accordance with any suitable principles and advantages of selective shielding discussed in this section. Any of the modules discussed in this section can be included in a wireless communication device, such as an IoT device or mobile phone (e.g., a smart phone). Any of the RF modules discussed in this section can include or be included in a wireless personal area network (WPAN) system. A WPAN system is an RF front end system configured for processing RF signals associated with personal area networks (PANs). A WPAN system can be configured to transmit and receive signals associated with one or more WPAN communication standards, such as signals associated with one or more of Bluetooth, ZigBee, Z-Wave, Wireless USB, INSTEON, IrDA, or Body Area Network. Any of the RF modules discussed in this section can include or be included in a wireless local area network (WLAN) system. A WLAN system can process wireless local area network signals, such as Wi-Fi signals.

Some of the embodiments described in this section have provided examples in connection with RF components, front end system and/or wireless communications devices. However, the principles and advantages of the embodiments of this section can be used for any other systems or apparatus that could benefit from any of the selective shielding techniques, shielding structures, integrated antennas, circuits, or any combination thereof described herein. Although described in the context of RF circuits, one or more features described in this section can be utilized in packaging applications involving non-RF components. Similarly, one or more features described in this section can also be utilized in packaging applications without electromagnetic isolation functionality. Moreover, while embodiments discussed in this section include an RF shielding structure and an antenna external to the shielding structure, other electronic components can be on a package substrate of a module and external to a RF shielding structure on the package substrate instead of or in addition to an antenna. The principles and advantages discussed in this section can be applied to two or more shielding structures around electronic components on a packaging substrate and an antenna on the packaging substrate that is external to each of the two or more shielding structures. Any of the principles and advantages of the embodiments discussed in this section can be used in any other systems or apparatus that could benefit from any of the selective shielding features discussed herein.

Section VII—Shielded Radio Frequency Component with Integrated Antenna

In accordance with some embodiments of this disclosure, this section of the present disclosure relates to a shielded radio frequency component with an integrated antenna. An antenna can be on a first side of a multi-layer substrate and a radio frequency component can be disposed on a second side of the multi-layer substrate such that a ground plane of the multi-layer substrate is positioned between the antenna and the radio frequency component. Conductive features can be disposed around the radio frequency component and electrically connected to the ground plane. The conductive features and the ground plane can provide shielding for the radio frequency component. In certain embodiments, the conductive features can include bumps, such as solder bumps and/or copper pillars. As indicated above, aspects of this section may be combined with other aspects of one or more other sections to further improve the performance of front end systems and related devices, integrated circuits, modules, and methods in which they are employed.

There is a desire for a relatively low cost packaging technology to shield circuits to reduce radiated harmonics and also allow for an antenna unshielded from receiving and/or transmitting signals. Aspects of this section relate to a shielded package with an integrated antenna. A laminated substrate can be fabricated in which an antenna is printed on the top layer and a ground plane for shielding is included in a layer underneath the top layer. Other layers of the laminate substrate can implement signal routing. An electronic component, such as a radio frequency (RF) component, can be disposed along a bottom layer of the laminate substrate. Bumps can be disposed around the electronic component and electrically connected to the ground plane. The bumps can be solder bumps in certain applications. The bumps can include copper pillars in various applications. The bumps can attach the module to a carrier or directly to a system board. The electronic component can be surrounded by bumps. For example, outside edges of the electronic component can have ground bumps that are connected to the ground plane by way of vias. The ground bumps around the electronic component can be connected to ground of a carrier or system board. Accordingly, a shielding structure with can be completed when the module is placed onto a carrier or system board. The shielding structure can function as a Faraday cage around the electronic component. The shielding structure around the electronic component can shield the electronic component from signals external to the shielding structure and/or shield circuits outside of the shielding structure from the electronic component.

One aspect of this section is a module that includes a multi-layer substrate, an antenna, a radio frequency (RF) component, and conductive features disposed around the RF component. The multi-layer substrate has a first side and a second side opposite to the first side. The multi-layer substrate includes a ground plane. The antenna is on the first side of the multi-layer substrate. The RF component is on the second side of the multi-layer substrate such that the ground plane is positioned between the antenna and the RF component. The conductive features are disposed around the RF component and electrically connected to the ground plane. The conductive features and the ground plane configured to provide shielding for the RF component.

Another aspect of this section is an RF circuit assembly that includes a laminate substrate having a first side and a second side opposite the first side, a printed antenna on the first side of the laminate substrate, an RF component attached on the second side of the laminate substrate, and a plurality of bumps disposed around the RF component. The laminate substrate includes a ground plane that is positioned between the printed antenna and the RF component. The bumps form at least a portion of an electrical connection to the ground plane to thereby form at least a portion of a shielding structure around the RF component. The bumps can include solder bumps and/or copper pillars.

Another aspect of this section is system board assembly that includes a laminate substrate having a first side and a second side opposite to the first side, a printed antenna on the first side of the laminate substrate, an RF component attached on the second side of the laminate substrate, a plurality of bumps disposed around the RF component, and a system board. The laminate substrate includes at least one layer forming a ground plane. The ground plane is positioned between the printed antenna and the RF component. The plurality of bumps is electrically connected to the ground plane. The system board includes ground pads electrically connected to ground plane by way of the plurality of bumps such that a shielding structure is formed around the RF component.

FIG. 83A shows a cross section of an antenna in a package system 2210 according to an embodiment. The antenna in a package system 2210 is an example of a radio frequency module. The antenna in a package system 2210 includes an antenna integrated with and shielded from an RF component. The antenna is unshielded from transmitting RF signals to and receiving RF signals from remote to the system. Accordingly, the antenna can transmit and/or receive any suitable RF signal. The antenna can transmit and/or receive RF signals for a system on a chip (SOC). In certain embodiments, the antenna of the antenna in a package system 2210 can be arranged to transmit and/or receive Bluetooth and/or ZigBee signals.

The illustrated antenna in a package system 2210 includes a multi-layer substrate 2212 that includes an antenna layer 2214, a ground plane 2216, an insulating layer 2220, and an other layer 2222. An RF component 2218 is attached to the multi-layer substrate 2212 on a side opposite the antenna layer 2214. The ground plane 2216 is disposed between the antenna layer 2214 and the RF component 2218 such that the ground plane 2216 provides shielding between the RF component 2218 and the antenna layer 2214. The antenna 2214 can be in communication with the RF component 2218 by way of one or more wire bonds, by way of one or more vias extending through the substrate 2212 outside of the shielding structure, by way of magnetic coupling, or any suitable combination thereof.

The multi-layer substrate 2212 can be a laminate substrate. The insulating layer 2220 can be disposed between the antenna layer 2214 and the ground plane 2216. The insulating layer 2220 can include any suitable dielectric material. The multi-layer substrate 2212 can include one or more other layers 2222, which can implement signal routing and/or passive components. Vias 2224 extending from the ground plane 2216 to the bottom side of the multi-layer substrate 2212 shown in FIG. 83A can provide ground connections at the bottom side of the multi-layer substrate 2212. In some implementations, each of the vias 2224 can be implemented by several vias through different insulating layers connected to each other by metal in component layers disposed between insulating layers.

The RF component 2218 can include any suitable circuitry configured to receive and/or provide an RF signal. For instance, the RF component 2218 can include a power amplifier, a low-noise amplifier, an RF switch, a filter, a matching network, or any combination thereof. An RF signal can have a frequency in the range from about 30 kHz to 300 GHz. In accordance with certain communications standards, RF signal can be in a range from about 450 MHz to about 6 GHz, in a range from about 700 MHz to about 2.5 GHz, or in a range from about 2.4 GHz to about 2.5 GHz. In certain implementations, the RF component 2218 can receive and/or provide signals in accordance with a wireless personal area network (WPAN) standard, such as Bluetooth, ZigBee, Z-Wave, Wireless USB, INSTEON, IrDA, or Body Area Network. In some other implementations, the RF component and receive and/or provide signals in accordance with a wireless local area network (WLAN) standard, such as Wi-Fi.

The RF component 2218 can be encapsulated in molding material 2226. Through mold vias 2228 can extend through the molding material 2226 to bumps 2229. The bumps 2229 can be any suitable conductive bumps, such as solder bumps, solder balls, copper pillars, or the like. The bumps 2229 can facilitate mounting of the antenna in a package system 2210 onto a system board. Bumps 2229 can be in physical contact with through mold vias 2228. Accordingly, the bumps 2229 can be electrically connected to the ground plane 2216 by way of through mold vias 2228 and vias 2224 in the multi-layer substrate 2212. While two bumps 2229, two through mold vias 2228, and two vias 2224 are illustrated in the cross section of FIG. 83A, any suitable number of such elements can be included in the antenna in a package system 2210 to provide a suitable ground connection and/or to provide suitable shielding around the RF component 2218. For instance, the bumps 2229 can extend along outer edges of the antenna in a package system 2210 to surround the RF component 2218 in plan view. Corresponding through mold vias 2228 and vias 2224 can be implemented with such bumps 2229.

FIG. 83B shows a cross section of an antenna in a package system 2210' according to an embodiment. The antenna in a package system 2210' is another example of a radio frequency module. The antenna in a package system 2210' of FIG. 83B is similar the antenna in a package system 2210 of FIG. 83A except that the RF component 2218 is unencapsulated in the antenna in a package system 2210' and the bumps 2229 are in physical contact with vias 2224 in the multi-layer substrate 2212. In some applications, the antenna in a package system 2210' can be mounted onto a carrier.

FIG. 84 shows a cross section of an antenna in a package system 2230 with bumps providing standoff according to an embodiment. FIG. 84 shows that after reflow bumps 2232 can extend farther from a module than a solder resist 2234. This can enable the bumps 2232 to provide standoff between an RF component and a system board or other substrate on which an antenna in a package system 2230 is disposed. Any suitable features shown in FIG. 84 can be implemented in connection with any of the antenna in a package systems discussed herein.

FIGS. 85A to 85C illustrate example system board assemblies. Any suitable principles and advantages associated with these system board assemblies can be implemented with any of the antenna in a package systems and/or any of the RF modules discussed herein. FIG. 85A illustrates a system board assembly 2240 with an antenna in a package system 2210 and other component(s) 2242 disposed on a system board 2244 according to an embodiment. The system board 2244 can be any suitable application board, such as a phone board for a mobile phone. Bumps 2229 of the antenna in a package system 2210 can be in physical contact with one or more ground connections of the system board 2244. Accordingly, a shielding structure can at least partly surround the RF component 2218 of the antenna in a package system 2210 in three dimensions. The shielding structure can provide shielding between the RF component 2218 and the antenna layer 2214 of the antenna in a package system 2210. The shielding structure can provide shielding between the RF component 2218 and one or more other components 2242 disposed on the system board 2244. Accordingly, the RF component 2218 can be shielded from radiation emitted by the one or more other components 2242. At the same time, the other component(s) 2242 can be shielded from radiation emitted from the RF component 2218. The other component(s) 2242 can include any other circuitry on the system board 2244, such as other RF circuitry, a baseband processor, memory, the like, or any suitable combination thereof.

FIG. 85B illustrates cross section of a system board assembly 2240 with an antenna in a package module and another component 2242 disposed on a system board 2244 according to an embodiment. As illustrated, the system board 2244 includes ground pads 2241A in contact with bumps 2229. In FIG. 85B, inner bumps 2243 are surrounded by a shielding structure that includes bumps 2229. The inner bumps 2243 can provide electrical connections between circuitry of the RF component 2218 and the system board 2244. Pads 2241B on the system board 2244 can be electrically connected to the RF component 2218 by way of respective bumps 2243, vias 2228', routing metal 2247, and vias 2245. The antenna of the antenna layer 2214 can be electrically connected to a pad 22410 of the system board 2244. As illustrated, a wire bond 2246 electrically connects the antenna to the pad 2241C. The system board 2244 can provide signal routing between the antenna and the RF component 2218 and/or the other components 2242.

FIG. 85C illustrates cross section of a system board assembly 2240' with an antenna in a package module and another component 2242 disposed on a system board 2244 according to an embodiment. The system board assembly 2240' is like the system board assembly 2240 of FIG. 85B except that a different antenna in a package system is implemented. In the system board assembly 2240', pads 2241B on the system board 2244 can be electrically connected to the RF component 2218 by way of respective bumps 2243, vias 2245, and routing metal 2247.

FIG. 86 is a cross sectional view of an antenna in a package system 2248 according to an embodiment. The illustrated antenna in a package system 2248 includes several components of the antenna in a package systems of FIGS. 83A and 83B. In FIG. 86, more details regarding the layers 2222 are illustrated. In the illustrated antenna in a package system 2248, the layers 2222 can implement signal routing. As shown in FIG. 86, the RF component 2218 and the molding material 2226 can be thicker in the illustrated vertical dimension than the multi-layer substrate 2212.

FIGS. 87A and 87B are example cross sectional views of layers radio frequency circuit assemblies 2250 and 2250', respectively, with integrated antennas according to certain embodiments. These figures generally illustrate the layers of the radio frequency circuit assemblies. Details of some examples of the illustrated layers of FIGS. 87A and 87B are provided in connection with FIGS. 88A to 89D.

In FIG. 87A, the illustrated radio frequency circuit assembly 2250 includes an antenna layer 2214, a ground plane 2216, an insulating layer 2220 disposed between the antenna layer 2214 and the ground plane 2216, a component layer 2251, routing layers 2252, 2255, 2257, and insulating layers 2253, 2254, 2256, and 2258. The routing layers 2252, 2255, 2257, the insulating layers 2220, 2253, 2254, 2256, and 2258, and the ground plane 2216 can be included in a laminated substrate. The antenna layer 2214 can also be considered part of the laminated substrate. The component layer 2251 can be integrated with the laminated substrate. The component layer 2251 can include any of the RF components discussed herein, such as the RF component 2218. The component layer 2251 can include a semiconductor die that includes RF circuits.

Each of the routing layers can have insulating layers on opposing sides to insulate the routing layers from others routing layers and/or other layers, such as the ground plane 2216 or the component layer 2251. As illustrated, an insulating layer 2253 is disposed between the ground plane 2216 and the routing layer 2252 closest to the ground plane 2216. As also shown in FIG. 87A, an insulating layer 2258 is disposed between the component layer 2251 and the routing layer 2257 closest to the component layer 2251. The insulating layers can be formed of, for example, any suitable dielectric material. The routing layers can implement metal routing. Vias (not illustrated in FIG. 87A) extending through an insulating layer can provide connections between metal in layers on opposing sides of the insulating layer.

Any suitable number of routing layers can be included in a radio frequency circuit assembly. For instance, the radio frequency circuit assembly 2250' of FIG. 87B includes one routing layer 2252. As another example, the radio frequency circuit assembly 2250 of FIG. 87A includes three routing layers 2252, 2255, 2257. Relatively more routing layers can be implemented to handle an increasing amount of signal routing between circuitry of the component layer 2251. Alternatively or additionally, relatively more routing layers can be implemented to handle an increasing amount of signal routing between circuitry of the component layer 2251 and circuitry external to a radio frequency circuit assembly 2250 and/or 2250'. Signal routing can be shielded by a shielding structure that includes the ground plane 2216 and vias through the insulating layers of the radio frequency circuit assembly 2250 and/or 2250' connected with ground solder bumps and disposed around an RF component of the component layer 2251. Such vias can be electrically connected to conductive features, such as bumps, disposed around the RF component in the component layer 2251. Passive components, such as one or more spiral inductors, can be implemented in one or more of the routing layers. One or more passive components in routing layer(s) can be included in a matching network associated with radio frequency circuitry of the component layer 2251.

The antenna layer 2214 of any of the antenna in a package systems discussed herein can include any suitable printed antenna. A printed antenna can be formed from one or more conductive traces on a substrate. The one or more conductive traces can be formed by etching a metal pattern on the substrate. A printed antenna can be a microstrip antenna. Printed antennas can be manufactured relatively inexpensively and compactly due to, for example, their 3-dimensional physical geometries. Printed antennas can have a relatively high mechanical durability.

FIGS. 88A and 88B illustrate example printed antennas of radio frequency circuit assemblies according to certain embodiments. These figures illustrate examples of a top view of a radio frequency circuit assembly, such as the radio frequency circuit assembly 2250 and/or 2250'. The antenna 2260 can be any suitable shape. For instance, the antenna 2260 can be U-shaped as shown in FIG. 88A. The antenna 2260 in FIG. 88A can be a folded quarter wave antenna. As another example, the antenna 2260' can be a meandering shape as shown in FIG. 88B. The antenna can be coil shaped in certain implementations. The antenna can be a loop antenna in some implementations. The antenna of the antenna layer 2214 and/or 2214' can serve as an antenna for a system on a chip. The antenna can transmit and/or receive any suitable wireless communication signal. Such antennas can be configured to transmit and/or receive Bluetooth and/or ZigBee signals, for example. The antenna of the antenna layer can be in communication with transmit and/or receive circuitry by way of one or more wire bonds, by way of one or more vias extending through a substrate on which the antenna is disposed (e.g., outside of the shielding structure), by way of magnetic coupling, or any suitable combination thereof. The antenna of the antenna layer can be in communication with an RF component shielded from an antenna by a shielding structure by way of one or more wire bonds, by way of one or more vias extending through a substrate on which the antenna is disposed (e.g., outside of the shielding structure), by way of magnetic coupling, or any suitable combination thereof.

FIGS. 89A to 89D illustrate example component layers of radio frequency circuit assemblies according to certain embodiments. These figures include schematic views of a bottom view of a radio frequency circuit assembly, such as the radio frequency circuit assembly 2250 and/or 2250'.

As illustrated in FIGS. 89A to 89D, ground bumps 2229 can surround an RF component and form a portion of a shielding structure around the RF component. The ground bumps 2229 can be disposed along each edge of the component layer 2251. The ground bumps 2229 can be soldered or otherwise connected to a ground connection of a carrier assembly such that the ground plane 2216, the bumps 2229, and ground of the carrier assembly together provide three-dimensional shielding of the RF component. The carrier assembly can be implemented by ethylvinylbenzene (EVB) or another laminate, for example.

As illustrated, the ground bumps 2229 surround signal routing bumps 2271. The signal routing bumps 2271 can provide at least a portion of a connection between circuitry of the component layer 2251 with metal routing in a routing layer that is disposed between the component layer 2251 and the ground plane 2216. Alternatively or additionally, the signal routing bumps 2271 can provide at least a portion of an electrical connection between circuitry of the RF component 2218 and a system board on which an antenna in a package system is disposed.

The example component layers of FIGS. 89A to 89D illustrate various electronic components that can be shielded from the antenna of the antenna layer 2214 by the ground plane 2216. Each of these figures illustrates circuitry that can be included within a shielding structure. Other circuitry and/or components can alternatively or additionally be included within such a shielding structure. For instance, one or more of a crystal, a front end integrated circuit, or a system on a chip can be included within the shielding structure. As one example, a crystal, a front end integrated circuit, and a system on a chip can be implemented within the shielding structure and shielded from an integrated antenna by the shielding structure.

FIG. 89A illustrates a component layer 2251 that includes an RF component 2218 connected to signal routing bumps 2271. Some example RF components are illustrated in FIGS. 89B to 89D. FIG. 89B illustrates a component layer 2251' that includes a low noise amplifier (LNA) 2272 and a matching network 2273. FIG. 89C illustrates a component layer 2251" that includes a power amplifier 2274 and a matching network 2275. FIG. 89D illustrates a component layer 2251''' that includes an LNA 2272, a power amplifier 2274, and matching networks 2273 and 2275. The circuits illustrated in FIGS. 89A to 89D are connected to signal routing bumps 2271 and are surrounded by the ground bumps 2229 in a respective component layer. In some other implementations, the matching network 2273 and/or the matching network 2275 can include one or more passive component (e.g., one or more resistors, one or more capacitors, and/or one or more inductors implemented in a routing layer disposed between a component layer and a ground plane.

Front end systems discussed herein can be implemented in accordance with any suitable principles and advantages of a shielded radio frequency component with an integrated antenna discussed in this section. Packaged modules discussed in this section can be relatively low cost laminate based front end modules that combine low noise amplifiers with power noise amplifiers and/or RF switches in certain implementations. Some such packaged modules can be multi-chip modules. The integrated antenna of such RF modules can be implemented in accordance with any of the principles and advantages discussed herein. These RF front end modules can be antenna in a package systems. The integrated antenna can be implemented in an antenna layer on a first side of a substrate that is shielded from the circuits of the RF front end on a second side of the substrate at least partly by a ground plane implemented in a layer of the substrate.

Any of the embodiments discussed in this section can be included in a wireless communication device, such as an IoT device or mobile phone (e.g., a smart phone). Any of the embodiments discussed in this section can include or be included in a wireless personal area network (WPAN) system. A WPAN system is an RF front end system configured for processing RF signals associated with personal area networks (PANs). A WPAN system can be configured to transmit and receive signals associated with one or more WPAN communication standards, such as signals associated with one or more of Bluetooth, ZigBee, Z-Wave, Wireless USB, INSTEON, IrDA, or Body Area Network. Any of the embodiments discussed in this section can include or be included in a wireless local area network (WLAN) system. A WLAN system can process wireless local area network signals, such as Wi-Fi signals.

Some of the embodiments described in this section have provided examples in connection with RF components, front end modules and/or wireless communications devices. However, the principles and advantages of the embodiments can be used for any other systems or apparatus that could benefit from any of the shielding associated with an integrated antenna described in this section. Although described in the context of RF circuits, one or more features described herein can also be utilized in packaging applications involving non-RF components. Similarly, one or more features described herein can also be utilized in packaging applications without the electromagnetic isolation functionality. Any of the principles and advantages of the embodiments discussed can be used in any other systems or apparatus that could benefit from the antennas and/or the shielding structures discussed herein. Any of the principles and advantages of the embodiments discussed in this section can be used in any other systems or apparatus that could benefit from any of the technology described in this section.

Section VIII—Packaged Module with Stacked Components

In accordance with some embodiments of this disclosure, this section of the present disclosure relates to a packaged module with stacked components. A packaged module can be a system-in-a package (SiP). The SiP can include integrated circuits (ICs) including system-on-a-chip (SoC) and discrete components using vertical integration technologies to integrate at least some of the components. A feature of the SiP is a relatively small package size in length (x dimension) and width (y dimension). This section provides a number of options to stack the SoC, crystal, surface mount components (SMTs), and a front-end integrated circuit (FEIC) on a substrate. As the crystal is generally smaller than the SoC, the footprint of the crystal and crystal routing can effectively be removed from the x and y dimensions of the SiP. In addition to reducing package size, other advantages that can be realized include decreased crystal trace parasitic capacitance and/or reduced coupling between the crystal routing traces and other sensitive paths on the substrate. As indicated above, aspects of this section may be combined with other aspects of one or more other sections to further improve the performance of front end systems and related devices, integrated circuits, modules, and methods in which they are employed.

Any of the SiPs, multi-chip modules (MCMs), and other packaged devices or other components described in this section, including those having vertically integrated/stacked configurations can be configured to implement wireless RF transceiver and/or front end functionality. For instance, such devices can be configured to support one or more wireless local area network (WLAN) standards such as Wi-Fi or Bluetooth (e.g., compliant with one or more of the IEEE 802.11 family of standards), and/or one or more cellular technologies, such as Long Term Evolution (LTE), Global System for Mobile Communications (GSM), Wideband Code Division Multiple Access (WCDMA), and/or Enhanced Data Rates for GSM Evolution (EDGE).

In the SiPs of this section, a substrate can provide the interconnections to form at least a portion of an electric circuit. In an embodiment, a printed circuit board (PCB) or some other board can mechanically support and electrically connect electrical components using conductive tracks, pads, and/or other features laminated onto a substrate. In an embodiment, a SiP includes a number of ICs mounted on a substrate and enclosed in a single package. The integrated circuits in the SiP can be internally connected by fine wires that are bonded to the package. In an embodiment, SoC includes an IC that integrates one or more components of an electronic system into a single substrate. In an embodiment, a multi-chip module (MCM) includes an electronic assembly that includes multiple integrated circuits (ICs), semiconductor dies, and/or other discrete components integrated onto a unifying substrate.

FIG. 90A illustrates an example top view of a multi-chip module (MCM) 2300 including a system-in-a-chip (SoC) 2302, a front-end integrated circuit (FEIC) 2304, a crystal 2308, crystal load capacitors 2306, and other surface mount devices on a substrate 2312, which includes traces and other interconnect devices to electrically connect the SMT components and components 2302, 2304, 2306, 2308. The crystal 2308 and the crystal load capacitors 2306 can form at least a portion of a crystal oscillator.

FIG. 90A further illustrates relatively long crystal traces 2310 providing electrical communication between the crystal 2308 and the SoC 2302. Due to the horizontal layout of the MCM 2300, the crystal traces 2310 can be susceptible to introducing parasitic capacitance to the MCM circuitry and increase coupling between the crystal routing traces 2310 and other sensitive paths on the substrate 2312. The parasitic capacitance can adversely affect the startup margin. The startup margin is the ability of the crystal to start oscillating at power up, and is defined as R/ESR, where R is the maximum series resistance added to the crystal path that allows oscillation and ESR is the equivalent series resistance of the crystal.

FIG. 90B is an example block diagram of the MCM 2300 and illustrates the MCM 2300 including the SoC 2302, which includes at least a microcontroller (or microprocessor) and a radio. The illustrated MCM 2300 further includes the FEIC 2304 which includes at least one of a power amplifier (PA), a low noise amplifier (LNA), and a radio frequency switch, such as double pole double throw switch. The illustrated MCM 2300 further includes the crystal 2308 and crystal traces 2310.

FIG. 90C is an example side view of the MCM 2300 and illustrates the horizontal layout of the SoC 2302, the FEIC 2304, the load capacitors 2306, and the crystal 2308 on the substrate 2312.

A multi-chip module (MCM) can include an electronic assembly, such as a package with a number of conductor terminals such as "pins", where multiple integrated circuits (ICs), semiconductor dies and/or other discrete components are integrated, typically onto a unifying substrate, so that in use it is treated as if it were a single component as though a larger IC.

A system on a chip or system on chip (SoC) is an integrated circuit (IC) that integrates all components of a computer or other electronic system into a single chip. It may include digital, analog, mixed-signal, and/or radio-frequency functions on a single chip substrate.

A front-end integrated circuit (FEIC) or a front-end module (FEM) can include at least one of a power amplifier (PA), a low noise amplifier (LNA), and radio frequency switch, such as a double pole double throw switch. The RF front end can include the circuitry between the antenna up to and including the mixer stage, such that the RF front-end includes the components in the receiver that process the signal at the original incoming radio frequency (RF), before it is converted to a lower intermediate frequency (IF).

RF front end circuitry can use a local oscillator (LO) that generates a radio frequency signal at an offset from the incoming signal, which is mixed with the incoming signal. The LO can include a crystal oscillator, which includes an electronic oscillator circuit that uses the mechanical resonance of a vibrating crystal of piezoelectric material to create an electrical signal with a precise frequency.

A crystal oscillator is an electronic oscillator circuit that uses a piezoelectric resonator, such as a crystal, as its frequency-determining element. Crystal is a common term used in electronics for the frequency-determining component, a wafer of quartz crystal or ceramic with electrodes connected to it. The frequency determining component can be referred to as a piezoelectric resonator.

Load capacitors are associated with the crystal and can function to approximately match the total capacitance seen from the crystal looking into the crystal oscillator circuit, in order to operate the crystal at a desired frequency.

Crystals can include separate components for use in crystal oscillator circuits. The crystal can be packaged with the load capacitors. In some instances, a crystal oscillator includes the crystal, the load capacitors, and an amplifier incorporated in a single package with the crystal oscillator circuit.

A system-in-package or system-in-a-package (SiP) includes one or more integrated circuits enclosed in a single module or package. Dies containing integrated circuits may be stacked vertically on a substrate. They can be internally connected by wire bonds that are bonded to the package. Alternatively, with a flip chip technology, bump (e.g., solder bumps) can be used to make electrical connections among stacked chips.

SiP dies can be stacked vertically or tiled horizontally, unlike slightly less dense multi-chip modules, which place dies horizontally on a carrier. An SiP can connect the dies with standard off-chip wire bonds or bumps, unlike slightly denser three-dimensional integrated circuits which connect stacked silicon dies with conductors running through the die.

Novel 3-D packaging techniques are disclosed herein for stacking chip dies and/or passive components, such as capacitors and resistors, into a compact area on a substrate. Novel embodiments to stack a SoC and a crystal are disclosed herein. Further, various novel stacking assemblies and novel stacking configurations are disclosed within. FIGS. 91-106 illustrate various embodiments of a system-in-a-package. Any of these systems-in-a-package can be used in a wireless communication device.

FIG. 91 illustrates an embodiment of a system-in-a-package (SiP) 2400 for use in a wireless device. SiP 2400 includes a SoC 2402, a FEIC 2404, a packaging substrate 2412, a crystal 2408, one or more load capacitors 2406, a routing substrate or interposer 2414, one or more ground bond wires 2420, and one or more wire bonds 2418 that electrically connect the crystal 2408 to the SoC 2402. In an embodiment, the one or more wire bonds 2418 electrically connect the crystal 2408 to a crystal oscillator circuit on the SoC 2402.

FIG. 91 shows the one or more load capacitors 2406 as being external to the SoC 2402. In some other embodiments, the SoC 2402 includes the one or more load capacitors 2406.

The illustrated SoC 2402 is epoxied to the substrate 2412 and wire bonded to the substrate 2412. The routing substrate 2414 is stacked on top of the SoC 2402. The crystal 2408 and its load capacitors 2406 can then be soldered on the top of the routing substrate 2414.

The routing substrate 2414 holds the crystal 2408 and the capacitors 2406 and routes signals to the crystal 2408. In an embodiment, the routing substrate 2414 includes a single layer or a multi-layer laminate.

In an embodiment, the one or more ground bond wires 2420 are in communication with a ground node, such as a ground plane, a grounded via or the like, on the substrate 2412 and the routing substrate 2414 in turn routes the ground signal to the crystal 2408. In an embodiment, the one or more wire bonds 2418 are in communication with devices, such as a crystal oscillator or the like, on the SoC 2402 and the routing substrate 2414, which in turn, routes the signals to the crystal 2408.

Stacking the crystal 2408 and the capacitors 2406 permits the substrate 2412 be smaller (have a smaller footprint) than the substrate 2312 and provides the same or similar functionality. An advantage of stacking the crystal 2408 and the capacitors 2406 is not only space savings, but also the length of at least one trace between the crystal 2408 and the SoC 2402 can be significantly reduced. It can be desirable to have as short a trace as possible between a crystal and a SoC to reduce parasitic capacitance of the trace. By stacking the crystal 2408 over the SoC 2402, the trace is all but eliminated and the opportunity for parasitic capacitance to develop is greatly reduced. In an embodiment, the signals to/from the crystal 2408 are routed from the SoC 2402 directly to the routing substrate 2414 by way of the one or more wire bonds 2418. Another benefit of reducing the traces in communication with the crystal 2508 is a reduced opportunity of coupling between the crystal path and other sensitive paths on the substrate 2412, such as RF traces that are in communication with the FEIC 2404, for example.

FIG. 92 illustrates an embodiment of a system-in-a-package 2500 for use in a wireless device. SiP 2500 includes a SoC 2502, a FEIC 2504, a packaging substrate 2512, a crystal 2508, one or more load capacitors 2506, a routing substrate 2514, one or more ground bond wires 2520, and one or more wire bonds 2518 that electrically connect the crystal 2508 to the SoC 2502. In an embodiment, the one or more wire bonds 2518 electrically connect the crystal 2508 to a crystal oscillator on the SoC 2502.

The SiP 2500 is similar to the SiP 2400 except that the SoC 2502 includes a flip chip package. The SoC 2502 is soldered to the substrate 2512. Similar to the stacking arrangement of the SiP 2400, the routing substrate 2514 is stacked on top of the SoC 2502 and the crystal 2508 and its load capacitors 2506 are then soldered on the top of the routing substrate 2514. In an embodiment, the SoC 2502 is immediately adjacent to the substrate 2512 and to the routing substrate 2514; and the crystal 2508 is immediately adjacent to the routing substrate 2514. Advantageously, the SiP 2500 can provides space savings, reduced length of traces in the crystal path, decreased parasitic capacitance, decreased signal coupling, or any combination thereof.

FIG. 93 illustrates an embodiment of a system-in-a-package 2600 for use in a wireless device. SiP 2600 includes a SoC 2602, a FEIC 2604, a packaging substrate 2612, a crystal 2608, one or more load capacitors 2606, one or more wire bonds 2620 that electrically connect signals from the SoC 2602 to traces on the substrate 2612, and one or more wire bonds 2618 that electrically connect signals associated with the crystal 2608 to signals associated with the SoC 2602 by way of routing traces on the substrate 2612. In the SiP 2600, the crystal 2608 is over the substrate 2612 and the SoC 2602 is stacked directly over the crystal 2608, without a routing substrate between the SoC 2602 and the crystal 2608. In an embodiment, the crystal 2608 is immediately adjacent to the SoC 2602 and the substrate 2612. In an embodiment, the footprint of the SoC 2602 is larger than the footprint of the crystal 2608, which creates an overhang volume that is bounded by the sides of the crystal 2608, the portion of the SoC 2602 that extends beyond crystal 2608, and the portion of the substrate 2612 that is within the footprint of the SoC 2602 and not covered by the crystal 2608.

In an embodiment, the load capacitors 2606 and/or the FEIC 2604 are placed outside of the SoC footprint. In another embodiment, the load capacitors 2606 and/or the FEIC 2604 are placed between the SoC 2602 and the crystal 2608 within the SoC footprint. In another embodiment, the load capacitors 2606 and/or the FEIC 2604 are placed within the overhang volume.

There are several factors to consider when utilizing the overhang volume. Factors to consider include, but are not limited to, the thickness of the SoC, bond wire types, an amount of pressure used to bond the bond wire to the SoC without cracking the SoC, an amount of overhang that can be supported, and the like.

FIG. 94A illustrates another embodiment of a system-in-a-package 2700 for use in a wireless device. SiP 500 includes a SoC 2702, a FEIC 2704, a packaging substrate 2712, a crystal 2708a, and one or more load capacitors 2706a. The crystal 2708a includes a flip chip or controlled collapse chip connection (C4) package and is stacked over the SoC 2702, which is over the substrate 2712. In an embodiment, the FEIC 2704 and the load capacitors 2706a are placed on the substrate 2712 beside the SoC 2702.

In an embodiment, the crystal 2708 is soldered to the SoC 2702 through the solder bumps of the flip chip package to matching pads on the SoC 2702. In an embodiment, there are no wire bonds between the crystal 2708 and the SoC 2702. In an embodiment, when the crystal 2708 is soldered to the SoC 2702, the crystal 2708 and the SoC 2702 are in electrical communication, such that a length of a trace between the crystal 2708 and a crystal oscillator on the SoC 2702 is short.

FIG. 94B illustrates another embodiment of a surface mount crystal 2708b for use in a system-in-a-package. In this embodiment, the crystal 2708b is flipped on its back, such that the crystal bond pads are up. The top of the package of the crystal 2708b is bonded or epoxied to the layer below. In an embodiment, the layer below the crystal 2708b includes a SoC. In another embodiment, the layer below the crystal 2708b includes the substrate. Bond wires from the bond pads of the crystal 2708b bond down to connect ground, crystal oscillator connections, load caps, the like, or any combination thereof.

FIG. 94C illustrates another embodiment of a surface mount crystal 2708c and at least one surface mount load capacitor 2706c for use in a system-in-a-package. In this embodiment, the crystal 2708c is flipped on its back, such that the crystal bond pads are up. The top of the package of the crystal 2708c is bonded or epoxied to the layer below. In an embodiment, the layer below the crystal 2708c includes a SoC. In another embodiment, the layer below the crystal 2708c includes the substrate. The surface mount load capacitor 2706c is bonded directly onto the crystal bond pads of the flipped crystal 2708c. Bond wires from the bond pads of the surface mount load capacitor 2706c bond down to connect ground, crystal oscillator connections, the like, or any suitable combination thereof.

FIG. 94D illustrates another embodiment of a surface mount crystal 2708d and at least one surface mount load capacitor 2706d for use in a system-in-a-package. In this embodiment, the crystal 2708d is flipped on its back, such that the crystal bond pads are up. The top of the package of the crystal 2708d is bonded or epoxied to the layer below. In an embodiment, the layer below the crystal 2708d includes a SoC. In another embodiment, the layer below the crystal 2708d includes the substrate. In this embodiment, the surface mount load capacitor 2706d is too small to bridge the gap between the bond pads on the crystal 2708d. A bond wire from the bond pad of the surface mount load capacitor 2706d to the bond pad of the crystal 2708d can bridge the gap between the bond pads on the crystal 2708d. A bond wire from the bond pad of the surface mount load capacitor 2706d and a bond wire from the bond pad of the crystal 2708d bond down to connect ground, crystal oscillator connections, the like, or any suitable combination thereof.

In other embodiments, the crystal 2708b, the crystal 2708c and the surface mount load capacitor 2706c, or the crystal 2708d and the load capacitor 2706d are flipped such that the bond pads of the crystal 2708b, the crystal 2708c and the surface mount load capacitor 2706c, or the crystal 2708d and the load capacitor 2706d are down and set directly on a SoC or a substrate.

FIG. 95 illustrates another embodiment of a system-in-a-package 2800 for use in a wireless device. SiP 2800 includes a SoC 2802, an FEIC 2804, a packaging substrate 2812, a crystal 2808, and one or more load capacitors 2806. The crystal 2808 is over the substrate 2812, the SoC 2802 is over the crystal 2808, and the FEIC 2804 is over the SoC 2802. The SiP 2800 further includes a ground plane 2822 between the FEIC 2804 and the SoC 2802. As illustrated, the footprint of the SoC 2802 is larger than the footprint of the crystal 2808, which creates an overhang volume that is bounded by the sides of the crystal 2808, the portion of the SoC 2802 that extends beyond crystal 2808, and the portion of the substrate 2812 that is within the footprint of the SoC 2802 and not covered by the crystal 2808. As shown in FIG. 95, the load capacitors 2806 can be positioned between the substrate 2812 and the SoC 2802 in the footprint of the SoC 2802. This can save space. In an embodiment, the load capacitors 2806 are placed in the overhang volume.

FIG. 96 illustrates another embodiment of a system-in-a-package 2900 for use in a wireless device. SiP 2900 includes a SoC 2902, an FEIC 2904, a packaging substrate 2912, a crystal 2908, one or more load capacitors 2906, and one or more supports 2924. The crystal 2908 is over the substrate 2912 and the SoC 2902 is over the crystal 2908. In an embodiment, the SoC 2902 is immediately adjacent to the crystal 2908; and the crystal 2908 is immediately adjacent to the substrate 2912. In an embodiment, the footprint of the SoC 2902 is larger than the footprint of the crystal 2908, which creates an overhang volume that is bounded by the sides of the crystal 2908, the portion of the SoC 2902 that extends beyond crystal 2908, and the portion of the substrate 2912 that is within the footprint of the SoC 2902 and not covered by the crystal 2908.

Supports 2924 are placed between the SoC 2902 and the substrate 2912, near the crystal 2908, to provide support for the SoC 2902. In an embodiment, the supports 2924 are placed in the overhang volume. In an embodiment, the support 2924 includes conductive material, such as copper or the like, and electrically connects a ground pad on the SoC 2902 with a ground trace or ground plane of the substrate 2912, in addition to providing mechanical support. In another embodiment, the support 2924 electrically connects a signal other than ground to a pad or trace on the substrate 2912.

In an embodiment, the load capacitors 2906 are placed in the footprint of the SoC 2902 and near the crystal 2908. In an embodiment, the load capacitors 2906 are placed in the overhang volume. In an embodiment, the height of the load capacitors 2906 is less than the space between the SoC 2902 and the substrate 2912. To increase the height of the capacitors 2906, a shim or spacer 2926 can be placed on top of the load capacitors 2906 to fill the space between the load capacitors 2906 and the SoC 2902. The spacer 2926 plus the load capacitors 2906 provides support for the SoC 2902. Further, the spacer 2926 can be used to compensate for any tilt that may occur do to stacking uneven components as such tilt can cause manufacturing problems when assembling any of the SiPs discussed herein, such as the SiP 2400, 2500, 2600, 2700, 2800, and/or 2900. In an embodiment, the spacer 2926 can be placed over or under any other component that is tucked in the space between the SoC 2902 and the substrate 2912. Alternatively or additionally, a spacer can be positioned between a component (e.g., a load capacitor 2906) and the substrate 2912.

FIG. 97 illustrates another embodiment of a system-in-a-package 3000 for use in a wireless device. SiP 3000 includes a SoC 3002, an FEIC 3004, a packaging substrate 3012, a crystal 3008, one or more load capacitors 3006, and one or more supports 3024. The crystal 3008 is over the substrate 3012 and the SoC 3002 is over the crystal 3024. In an embodiment, the footprint of the SoC 3002 is larger than the footprint of the crystal 3008, which creates an overhang volume that is bounded by the sides of the crystal 3008, the portion of the SoC 3002 that extends beyond crystal 3008, and the portion of the substrate 3012 that is within the footprint of the SoC 3002 and not covered by the crystal 3008.

The supports 3024 are placed between the SoC 3002 and the substrate 3012, near the crystal 3008, to provide support for the SoC 3002. In an embodiment, the supports 3024 are placed in the overhang volume. In an embodiment, the load capacitors 3006 are placed in the footprint of the SoC 3002 and near the crystal 3008. In an embodiment, the load capacitors 3006 are placed in the overhang volume. Further, the FEIC 3004 is under the substrate 3012 on an opposite side of the substrate 3012 from the crystal 3008.

In certain embodiments, any of the packaging substrates discussed herein, such as one or more of the packaging substrates 2412, 2512, 2612, 2712, 2812, 2912, or 3012, include a substrate, a laminate, a multi-layer laminate, an interposer, and the like, and is configured to provide a physical connection and traces for signal routing for at least one component of a corresponding SiP, such as one or more of the SiP 2400, 2500, 2600, 2700, 2800, 2900, or 3000.

Any of the SoCs discussed herein, such as one or more of the SoC 2402, 2502, 2602, 2702, 2802, 2902, or 3002, can include a baseband subsystem and radio for a portable wireless device. In an embodiment, the radio includes a receiver and a transmitter. In an embodiment, the baseband subsystem includes a microprocessor configured to receive a clock signal. In certain embodiments, any of the SoCs discussed herein, such as one or more of the SoCs 2402, 2502, 2602, 2702, 2802, 2902, or 3002, includes an integrated circuit that integrates components of an electronic system into a single chip. In an embodiment, the one or more of the SoCs 2402, 2502, 2602, 2702, 2802, 2902, or 3002 includes one or more of digital, analog, mixed-signal, and RF functions. The EM358x by Silicon Labs, Austin, Tex., is an example of a SoC that integrates a processor, a transceiver, memory, and serial communication on an IC.

In an embodiment, one or more of the FEICs 2404, 2504, 2604, 2704, 2804, 2904, or 3004 includes a front-end system, such as SKY65249-11 by Skyworks Solutions, Woburn, Mass., for example, which includes a power amplifier, an input filter, a power detector, harmonic filters, and a switch in a laminate package. In certain embodiments, one or more of the FEICs 2404, 2504, 2604, 2704, 2804, 2904, or 3004 includes other front-end modules.

FIG. 98A1 illustrates an example crystal assembly 3108 including an enclosure, housing or case 3132 and one or more pillars 3134 along one or more sides of the housing 3132. In an embodiment, the pillars or vias 3134 include a conductive material, such as solder, metal, copper, gold, nickel gold-plated metal, the like, or any suitable alloy thereof, and the housing 3132 includes a non-conductive material. In an embodiment, the housing 3132 further includes a lid 3130. In an embodiment, the lid 3130 includes a non-conductive material, such as ceramic, glass and epoxy, woven glass and polyester, alumina, polyimide, the like, or any suitable combination thereof.

The pillars or vias 3134 are formed from a top surface of the housing 3132 to a bottom surface of the housing 3132 and provide electrical and/or thermal conduction. In an embodiment, the pillars 3134 are formed at least partially within the sides of the housing 3132. In another embodiment, the housing 3132 is formed with one or more tubes along one or more sides of the housing 3132, such that filling the tubes with solder forms the pillars 3134. In another embodiment, the pillars 3134 are formed as cylindrical, rectangular, or the like, tubes or columns outside, partially with, or within the housing 3132.

In an embodiment, the tops and the bottoms of the pillars 3134 form pads 3136 around the perimeter of the housing 3132. In another embodiment, the pillars 3134 are in electrical communication with the pads 3136 formed along the top and bottom surfaces of the pillars 3134. In an embodiment, the pads 3136 are configured as surface mount pads. In another embodiment, the pads 3136 are wire bondable. In another embodiment, the pads 3136 are configured to be soldered to solder balls of ball-grid array packaged integrated circuit.

In an embodiment, the lid 3130 includes a ceramic substrate material and/or other non-conductive material and can be configured as a routing substrate, interposer, or circuit board. As illustrated in FIG. 98A1, the lid 3130 further includes routing 3133 and pads 3135, where the routing 3133 is configured to carry a signal between the pads 3135. In an embodiment, the routing and pads are formed on the lid 3130 according to routing substrate, interposer, or circuit board fabrication techniques. In an embodiment, a first wire bond 3131 is bonded to a first pillar 3134 and a second wire bond 3131 is bonded to a second pillar 3134. Wire bonds 3131 communicate a signal from one of the wire bond-connected pillars 3134 through the pads 3135 and trace 3133 on the lid 3130 to the other of the wire bond-connected pillar 3134.

FIG. 98A2 illustrates the crystal assembly 3108 further including a conductive layer 3137 wrapped around four sides of the crystal assembly 3108. The conductive layer 3137 is in electrical communication with each of the pillars 3134. In an embodiment, the wrapped conductive layer 3137 includes copper, plated copper, where the plating material can be solder, tin, gold over nickel, and the like, or any other conductive material. In another embodiment, the wrapped conductive layer can be plated onto the one, two, three, or four sides of the crystal assembly 3108, where the plating material can be solder, tin, gold over nickel, and the like.

In other embodiments, the wrapped conductive layer 3137 wraps around one, two, three, or four of the sides of the crystal assembly 3108 and is in electrical communication with the pillars 3134 of the one, two, three, or four of the sides, respectively. In an embodiment, the pillars 3134 in electrical communication with the wrapped conductive layer 3137 are connected to ground. The combination of the grounded pillars 3134 and the wrapped conductive layer 3137 forms a "super ground". The super ground can reduce inductance coupling onto the ground and provide better signal isolation.

In another embodiment, the pillars 3134 in electrical communication with the wrapped conductive layer 3137 form a radio frequency (RF) shield to shield the devices within the cavity of the enclosure 3132 from RF interference.

In another embodiment, the pillars 3134 in electrical communication with the wrapped conductive layer 3137 form a heat sink to dissipate heat. For example, the pillars 3134 and wrapped conductive layer 3137 can dissipate heat generated by a power amplifier placed above or below the crystal assembly 3108 and in thermal contact with the heat sink formed by the pillars 3134 and the wrapped conductive layer 3137.

FIG. 98B1 illustrates a cross-sectional view of the example crystal assembly 3108 including the lid 3130, the housing 3132, and one or more pillars 3134. The crystal assembly 3108 further includes a crystal 3138 housed within the housing 3132. As illustrated, the crystal assembly 3108 further includes one or more load capacitors 3140, oscillator circuitry 3142, and an FEIC 3144 housed within the housing 3132 of the crystal assembly 3108. One or more integrated circuit die can be housed within the housing 3132.

FIG. 9862 illustrates a cross-sectional view of the example crystal assembly 3108 including the lid 3130, the housing 3132, and one or more pillars 3134. The crystal assembly 3108 further includes the crystal 3138 housed within the housing 3132. As illustrated in FIG. 9862, the crystal assembly 3108 further includes the one or more load capacitors 3140, the oscillator circuitry 3142, and a surface acoustic wave (SAW) device 3145 housed within the housing 3132 of the crystal assembly 3108. Examples of SAW devices 3145 include filters, delay lines, correlators and DC to DC converters. One or more integrated circuit die are housed within the housing 3132.

The embodiment of FIG. 9862 illustrates the SAW device 3145, such as a SAW filter, and the crystal 3138 in the same physical cavity formed within the crystal assembly 3108. In an embodiment, the crystal assembly 3108 is hermetically sealed. In another embodiment, the cavity is gas-filled, and the crystal assembly is hermetically sealed. Placing the SAW device and the crystal in the same physical cavity can advantageously save space on the module.

FIG. 98C illustrates a bottom view of the example crystal assembly 3108. In an embodiment, the crystal assembly 3108 further includes one or more pads 3152 in communication with one or more of the components 3138, 3140, 3142, 3144 housed within the housing 3132.

FIG. 98D illustrates an example system-in-a-package 3100 including a flip chip SoC 3102 above the crystal assembly 3108. As illustrated, the lid 3130 of the crystal assembly 3108 is disposed between the crystal 3138 and the flip chip SoC 3102. In an embodiment, a ball-grid array 3106 of the flip-chip SoC 3102 is in communication with one or more of the pillars 3134 and/or pads 3136. The system-in-a-package 3100 further includes a substrate 3104 in electrical communication with the flip-chip SoC 3102.

FIG. 98E illustrates an example system-in-a-package 3110 including the flip chip SoC 3102 beneath the crystal assembly 3108. As illustrated in FIG. 98E, the packaging of the crystal assembly 3108 is disposed between the crystal 3138 and the flip chip SoC 3102. In an embodiment, the ball-grid array 3106 of the flip-chip SoC 3102 is in communication with one or more of the pillars 3134 and/or pads 3136. The system-in-a-package 3110 further includes the substrate 3104 in electrical communication with the flip-chip SoC 3102.

FIG. 98F illustrates an example circuit assembly 3120 including an integrated circuit 3146 mounted to the lid 3130 of the crystal assembly 3108. Wirebonds 3148 electrically connect pads 3150 of the integrated circuit 3146 to the pillars 3134 or pads 3136. In an embodiment, the integrated circuit 3146 includes a front-end-integrated-circuit (FEIC). In another embodiment, the integrated circuit 3146 includes at least a portion of one or more of radio frequency transmitter circuitry and radio frequency receiver circuitry.

Any suitable crystal or crystal assembly discussed herein can be packaged without a load capacitor. Any suitable crystal or crystal assembly discussed herein can be packaged with one or more load capacitors. Any suitable crystal or crystal assembly discussed herein can form at least part of a crystal oscillator.

Any of the crystals discussed herein can include a CX2016DB16000D0HZLC1 by Kyocera of Yamagata, Japan. Crystals discussed herein can have a suitable dimension for a particular application. For example, in some instances, any of the crystals discussed herein can be is approximately 1.60 mm±0.10 mm by approximately 2.00 mm±0.10 mm.

Table 1 illustrates example ratings and Table 2 illustrates example electrical characteristics for an embodiment of the crystal 2408, 2508, 2608, 2708, 2808, 2908, 3008, 3138.

TABLE 1

| Items | SYMB. | Rating | Unit |
|---|---|---|---|
| Operating Temperature Range | Topr | −25 to +75 | ° C. |
| Storage Temperature Range | Tstg | −40 to +85 | ° C. |

TABLE 2

| Items | SYMB. | Electrical Specification | | | Unit | Test Condition |
| | | Min | Typ. | Max | | |
|---|---|---|---|---|---|---|
| Mode of Vibration | | | Fundamental | | | |
| Nominal Frequency | F0 | | 16 | | MHz | |
| Nominal Temperature | $T_{NOM}$ | | +25 | | ° C. | |
| Load Capacitance | CL | 8.0 | | | pF | |
| Frequency Tolerance | df/F | −20.0 | | +20.0 | PPM | +25 ± 3° C. |
| Frequency Temperature Characteristics | df/F | −20.0 | | +20.0 | | −25 to 75° C. |
| Frequency Aging Rate | | −1.0 | | +1.0 | | $1^{St}$ Year +25 ± 3° C. |
| Equivalent Series Resistance | ESR | | | 150 | Ω | |
| Drive Level | Pd | 0.01 | | 100 | μW | |
| Insulation Resistance | IR | 500 | | | MΩ | 100 V(DC) |

As indicated in Table 2, the equivalent series resistance (ESR) of the crystal 2408, 2508, 2608, 2708, 2808, 2908, 3008, 3138 is approximately 150 Ohms. In another embodiment, the ESR is approximately 100 Ohms. In a further embodiment, ESR is between approximately 100 Ohms and approximately 200 Ohms. In another embodiment, the ESR is between approximately 75 Ohms and approximately 200 Ohms, between approximately 75 ohms and approximately 150 Ohms, between approximately 75 Ohms and approximately 100 Ohms, less than approximately 200 Ohms, less than approximately 150 Ohms, less than approximately 100 Ohms, or less than approximately 75 Ohms.

In other embodiments, the any of the crystals 2408, 2508, 2608, 2708, 2808, 2908, 3008, 3138 can have different specifications.

FIGS. 99-105 illustrate example novel stacking options for passive components, surface mount devices (SMD), integrated circuits, stacked assemblies, laminates, and combinations thereof.

FIG. 99 illustrates an example stacked assembly 3200 that includes a bottom layer 3202, a top layer 3204 positioned over the bottom layer 3202, and one or more supports 3206 in between the top layer 3204 and the bottom layer 3202 to provide support for the top layer 3204. In an embodiment, one end of the support 3206 is immediately adjacent to the bottom layer 3202 and an opposite end of the support 3206 is immediately adjacent to the top layer 3204.

The supports 3206 can be positioned such that an overhang 3208 is formed on at least both sides of the stacked assembly 3200 between an outside 3206a of the support 3206, the bottom layer 3202, and the top layer 3204. Further, the supports 3206 can be positioned such that a cavity 3210 is formed between insides 3206b of the supports 3206, the bottom layer 3202, and the top layer 3204.

The bottom layer 3202 can be, for example, a laminate, an IC, a die, a surface mount device, a crystal, a SoC, or the like. In an embodiment, an IC, a die, a flip-chip die, a wirebond die, a surface mount device, a crystal, SoC, and an assembly, for example, can be placed within the overhang 3208 and immediately adjacent to the bottom layer 3202. In another embodiment, an IC, a die, a flip-chip die, a wirebond die, a surface mount device, a crystal, SoC, and an assembly, for example, can be placed within the cavity 3210 and immediately adjacent to the bottom layer 3202. In a further embodiment, the assembly within the cavity 3210 or the overhang 3208 can be any suitable assembly described herein.

The top layer 3204 can be, for example, a laminate, an IC, a die, a surface mount device, a crystal, a SoC, or the like. In a further embodiment, the laminate includes a dual sided laminate and either or both sides of the dual-sided laminate can comprise an IC, a die, a surface mount device, a crystal, a SoC, or the like. In an embodiment, the top layer 3204 includes a ball grid array with one or more surface mount devices in communication with a respective one or more solder balls of the ball grid array.

In an embodiment, the support 3206 includes an IC, a die, a crystal, a surface mount device, a rectangular or cylindrical pillar or post, and the like, to support the top layer 3204. In an embodiment, the support 3206 functions as a mechanical support. In another embodiment, the support 3206 functions as a mechanical support as well as providing an electrical function. For example, a surface mount device, such as a resistor, a capacitor, or an inductor, could form a connection between the bottom layer 3202 and the top layer 3204 and be part of an electrical circuit. In another embodiment, the support 3206 includes a conductive material and forms a ground connection between the bottom layer 3202 and the top layer 3204.

FIGS. 100A1-100D illustrates example bonding configurations from a bond source 3370 to surface mount devices 3312, 3332, 3342, 3352. In an embodiment, the bond source 3370 includes a die, an IC, a surface mount device, a laminate or any other item that a first end of a wire bond can be bonded to. In an embodiment, bond source 3370 is immediately adjacent to a laminate 3304. In an embodiment, laminate 3304 is configured to further route signals traveling along one or more of the surface mount connections of FIGS. 100A-100D.

FIG. 100A illustrates a first wire bond 3310 bonded between the bond source 3370 and a first end of the horizontally oriented surface mount device 3312, and a second wire bond 3320 bonded between the bond source 3370 and a second end of the surface mount device 3312 to form a series connection between the bond source 3370 and the surface mount device 3312.

FIG. 100B illustrates a wire bond 3330 bonded between the bond source 3370 and a first end of the horizontally oriented surface mount device 3332, where a second end of the surface mount device 3332 is in electrical communication with one or more traces and/or pads formed on the laminate 3304.

FIG. 100C illustrates a wire bond 3340 bonded between a first end of the vertically oriented surface mount device 3342 where a second end of the surface mount device 3342 is in electrical communication with one or more traces and/or pads formed on the laminate 3304.

FIG. 100D illustrates a wire bond 3350 bonded between a first end of the vertically oriented surface mount device 3352 and another wire bond 3360 bonded between the first end of the surface mount device 3352 and bondable device 3362 to form a shunt or parallel connection between the surface mount device 3352 and the bondable device 3362. The surface mount device 3352 is mounted on the laminate 3304 in a vertical position as illustrated. In another embodiment, the surface mount device 3352 is mounted on the laminate 3304 in a horizontal position. The bondable device 3362 can be a surface mount device, a die, an IC, part of the laminate 3304, or any device with a bondable surface.

FIGS. 101A1-101D2 illustrate example space saving stacking configurations and corresponding example circuit diagrams for surface mount parts, components, devices, the like, or any suitable combination thereof. Stacking the surface mount components to form circuits or portions of circuits saves physical layout space on substrates, such as laminate substrates, compared to mounting each surface mount component directly onto the substrate. Further, traces can interconnect the surface mount components on the substrate to form portions of an electrical circuit. The direct connection between two stacked surface mount parts can eliminates at least one trace from the substrate to save additional space. In an embodiment, the stacked surface mount components are included in one or more filter circuits configured to filter radio frequency signals. The surface mount devices include one or more inductors, one or more capacitors, one or more resistors, or any suitable combination thereof. The surface mount components can include active and/or passive surface mount devices in various applications.

FIG. 101A1 illustrates a surface mount stacking assembly 3410 including a first horizontally positioned surface mount device 3412 stacked over and immediately adjacent to a second horizontally positioned surface mount device 3414, where the second surface mount device 3414 is over and immediately adjacent to a bottom layer 3416. In an embodiment, the contacts of the first surface mount device 3412 are in electrical communication with respective contacts of the second surface mount device 3414.

FIG. 101A2 illustrates an example filter circuit 3415. In an embodiment, the stacking configuration 3410 includes the filter circuit 3415. As illustrated, the filter circuit 3415 is a parallel LC circuit. In other embodiments, other filter circuits and/or other circuits can be formed using the surface mount stacking assembly 3410.

FIG. 101B1 illustrates a surface mount stacking assembly 3420 including a first vertically oriented surface mount device 3422 stacked on end over and immediately adjacent to a second vertically oriented surface mount device 3424. A first end of the surface mount device 3422 is in electrical communication with a first end of the second surface mount device 3424, and a second end of the second surface mount device 3424 is over and immediately adjacent to a bottom layer 3426. In an embodiment, the second end of the second surface mount device 3424 is in electrical communication with one or more pads and/or traces on the bottom layer 3426.

FIG. 101B2 illustrates an example filter circuit 3425. In an embodiment, the stacking configuration 3420 includes the filter circuit 3425. As illustrated, the filter circuit 3425 includes two resistors in series with each other. In other embodiments, other filter circuits and/or other circuits can be formed using the surface mount stacking assembly 3420.

FIG. 101C1 illustrates a surface mount stacking assembly 3430 including a horizontally oriented first surface mount device 3432, a horizontally oriented second surface mount device 3434, and a horizontally oriented third surface mount device 3438. In an embodiment, the first surface mount device 3432 and the second surface mount device 3434 are over and immediately adjacent to a bottom layer 3436 and spaced apart such that a first end of the third surface mount device 3438 is stacked over a first end of the first surface mount device 3432 and a second end of the third surface mount device 3438 is stacked over a first end of the second surface mounted device 3434. In an embodiment, the surface mount devices 3432, 3434, 3438 are electrically connected in series. In an embodiment, the stacking configuration 3430 has a smaller footprint than the footprint formed by mounting three surface mount devices on the bottom layer 3436 to form a series connection.

FIG. 101C2 illustrates a surface mount stacking assembly 3440 including a first vertically oriented surface mount device 3442, a second vertically oriented surface mount device 3444, and a third horizontally oriented surface mount device 3448. The first surface mount device 3442 is over and immediately adjacent to a bottom layer 3446 such that a first end of the first surface mount device 3442 is in electrical communication with pads or traces on the bottom layer 3446. The second surface mount device 3444 is over and immediately adjacent to the bottom layer 3446. A first end of the second surface mount device 3444 can be in electrical communication with one or more pads and/or traces on the bottom layer 3446.

Further, the first and second surface mount devices 3442 and 3444, respectively, of FIG. 101C2 are spaced apart such that a first end of the third surface mount device 3448 is over and in electrical communication with a second end of the first surface mount device 3442 and a second end of the third surface mount device 3448 is over and in electrical communication with a second end of the second surface mount device 3444.

In an embodiment, the surface mount stacking assemblies 3430 and/or 3440 include a pi (π) filter topology. An example pi filter circuit 3445 is illustrated in FIG. 101C3. As illustrated, the pi filter circuit 3445 includes two capacitors and an inductor. In an embodiment, the stacking configuration 3440 has a smaller footprint than the footprint formed by mounting three similar surface mount devices on the bottom layer 3436 and/or 3446 to form the pi filter circuit.

In another embodiment, the stacking configuration 3440 can be flipped over such that surface mount device 3448 is over the bottom layer 3446, and surface mount devices 3442 and 3444 are over surface mount device 3448.

FIG. 101D1 illustrates a surface mount stacking assembly 3450 including a first surface mount device 3452, a second surface mount device 3454, a third surface mount device 3458, and a fourth surface mount device 3460. In a first embodiment, as illustrated in FIG. 101D1, the first, second, and third surface mount devices 3452, 3454, 3458 form the surface mount stacking assembly 3440 over and immediately adjacent to a bottom layer 3456, and the fourth surface mount device 3460 is stacked over and immediately adjacent to the third surface mount device 3458. In an embodiment, pads of the fourth surface mount device 3460 are in electrical communication with corresponding pads of the third surface mount device 3458.

In a second embodiment (not illustrated), the first, second, and third surface mount devices 3452, 3454, 3458 form the surface mount stacking assembly 3440 over and immediately adjacent to the bottom layer 3456, and the fourth surface mount device 3460 is stacked beside and immediately adjacent to the third surface mount device 3458 and also over and immediately adjacent to the first and second surface mount devices 3452, 3454. In an embodiment, pads of the fourth surface mount device 3460 are in electrical communication with corresponding pads of the third surface mount device 3458 and the corresponding pads of the first and second surface mount devices 3452, 3454.

In a third embodiment (not illustrated), the first, second, and third surface mount devices 3452, 3454, 3458 form the stacking configuration 3430 over and immediately adjacent to the bottom layer 3456, and the fourth surface mount device 3460 is stacked over and immediately adjacent to the third surface mount device 3458. In an embodiment, pads of the fourth surface mount device 3460 are in electrical communication with corresponding pads of the third surface mount device 3458.

In a fourth embodiment (not illustrated), the first, second, and third surface mount devices 3452, 3454, 3458 form the surface mount stacking assembly 3430 over and immediately adjacent to the bottom layer 3456, and the fourth surface mount device 3460 is stacked beside and immediately adjacent to the third surface mount device 3458 and also over and immediately adjacent to the first and second surface mount devices 3452, 3454. In an embodiment, pads of the fourth surface mount device 3460 are in electrical communication with corresponding pads of the third surface mount device 3458 and the corresponding pads of the first and second surface mount devices 3452, 3454.

In a fifth embodiment (not illustrated), the surface mount stacking assembly 3450 can be flipped over such that surface mount device 3460 is over the bottom layer 3456, surface mount device 3458 is over surface mount device 3460, and surface mount devices 3452 and 3454 are each over a different end of surface mount device 3458.

In an embodiment, the surface mount stacking assembly 3450 includes a band-reject or notch filter topology that can be configured to form a notch or reject at specific frequencies. An example band-reject filter circuit 3455 is illustrated in FIG. 101D2. In an embodiment, a surface mount stacking assembly that includes a first surface mount stacking assembly 3450 beside a second surface mount stacking assembly 3450 such that both the first and second surface mount stacking assemblies 3450 share surface mount device 3454 and implement a band-reject filter circuit with a notch at two specified frequencies.

In an embodiment, the stacking configuration 3450 has a smaller footprint than the footprint formed by mounting four surface mount devices on the bottom layer 3456 to form the band-reject or notch filter topology. Since any node or pad of any of the surface mount devices 3412, 3414, 3422, 3424, 3432, 3434, 3438, 3442, 3444, 3448, 3452, 3454, 3458, 3460 can be configured for bonding, additional surface mount devices and/or various combinations of the stacking structures 3410, 3420, 3430, 3440, 3450, for example, can be combined to create structures with a more complex topology.

Surface mount devices 3412, 3414, 3422, 3424, 3432, 3434, 3438, 3442, 3444, 3448, 3452, 3454, 3458, 3460 can be, for example, passive components, such as capacitors, resistors, or inductors, discrete semiconductors, such as transistors or diodes, integrated circuits, the like, or any suitable combination thereof, and can have relatively short pins or leads of various styles, flat contacts, a matrix of solder balls (BGAs), or terminations on the body of the component.

FIG. 101E illustrates an example circuit board layout 3470 of a multichip module. In an embodiment, the layout 3470 forms at least a portion of a circuit, SiP, SoC, or MCM for use in a portable transceiver. In an embodiment, components L3, C2, C3 form a first antenna filter, components L4, C6, C7 form a second antenna filter, and components L5, C8, C9 form a third antenna filter. As illustrated in the layout 3470, the footprint of the first antenna filter includes the footprint of each of the components L3, C2, C3 and the traces between the components. Likewise the footprint of the second antenna filter includes the footprint of each of the components L4, C6, C7 and the corresponding traces, and the footprint of the third antenna filter includes the footprint of each of the components L5, C8, C9 and the corresponding traces. Further, the layout 3470 includes traces that provide electrical connections between device U1 and several components, such as at least C15, C26, C29, C32, C33. These traces also occupy space on the circuit board layout 3470.

FIG. 101F illustrates an example circuit board layout 3480 with example bonding configurations and example stacking configurations that reduce the form factor of the circuitry. In FIG. 101F, components L2, C2, C3 are stacked to form a first surface mount stacking assembly 3490, components L4, C6, C7 have been stacked to form a second surface mount stacking assembly 3490, and components L5, C8, C9 have been stacked to form a third surface mount stacking assembly 3490. Components C2, C3, C6, C7, C8, and C9 are capacitors. Components L2, L4, and L5 are inductors. In an embodiment, the surface mount stacking assembly 3490 is configured as the surface mount stacking assembly 3440 and the components are electrically connected as illustrated in circuit 3445. In some embodiments, the surface mount stacking assemblies 3490 include high-pass filters, low-pass filters, band pass filters, at least a portion of an output matching network, the like, or any suitable combination thereof.

Advantageously, surface mount stacking assemblies 3490 have a smaller footprint (take up less physical area on the circuit board layout) than the individual surface mount components L3, L4, L5, C2, C3, C6, C7, C8, C9 of the circuit board layout 3407 of FIG. 101E. For example, the layout 3480 can be smaller than the layout 3470 of FIG. 101E. This can be significant as electronic devices continue to shrink in size. Alternatively or additionally, smaller and more expensive components that are used in layout 3470 due to space constraints can be replaced with larger, less expensive components in the layout 3480.

In FIG. 101F, traces between components C15, C26, C29, C32, C33 and device U1 have been removed and replaced with wire bonds 3485 that electrically couple components C15, C26, C29, C32, C33 with an associated wire bondable location on device U1. In an embodiment, first ends of the wire bonds 3485 are bonded directly to the corresponding surface mount component and second ends of the wire bonds 3485 are bonded directly to a corresponding location on the device U1. In another embodiment, first ends of the wire bonds 3485 are bonded directly to the corresponding surface mount component and second ends of the wire bonds 3485 are bonded directly a bondable location on the circuit board layout 3480. Examples of wire bonds 3485 are illustrated in FIGS. 100A-100D. Advantageously, replacing the traces on the layout 3480 with the wire bonds 3485 allows the layout 3480 to be smaller than the layout 3470. Alternatively or additionally, smaller and more expensive components that are used in layout 3470 due to space constraints can be replaced with larger, less expensive components in the layout 3480.

FIG. 102 illustrates an example stacked assembly 3500 including a first integrated circuit die 3502 mounted over and immediately adjacent to a laminate 3506. The stacked assembly 3500 further includes a second integrated circuit die 3504 stacked over and immediately adjacent to the first integrated circuit die 3502. The first and second integrated circuit die 3502, 3504 are in electrical communication with pads and traces on the laminate 3506 by way of wire bonds 3508.

FIG. 103 illustrates an example stacked assembly 3600 including a first integrated circuit die 3602 in electrical communication with a laminate 3606 by way of one or more wire bonds 3608. The stacked assembly 3600 further includes a second integrated circuit die 3604 over and immediately adjacent to the first integrated circuit die 3602. The first integrated circuit die 3602 is configured to electrically connect with the second integrated circuit die 3604. In an embodiment, the second integrated circuit die 3604 includes a crystal. In another embodiment, the second integrated circuit die 3604 is configured as a surface mount device. In a further embodiment, the second integrated circuit die 3604 is configured as a flip chip die. Such a flip chip die can be electrically connected to other components of the stacked assembly 3600, such as the second integrated circuit die 3604, by way of bumps.

In an embodiment, any of the stacking configurations 3410, 3420, 3430, 3440, 3450 and/or any of the stacked assemblies 3500, 3600 can be positioned in the cavity 3210 or the overhang 3206 of FIG. 99.

FIG. 104 illustrates an example stacked assembly 3700 including supports 3724a, 3724b and a spacer 3726 that provide support for a top layer 3708 over a bottom layer 3706. A potential problem with the supports 3724a, 3724b are error tolerances. For example, one support 3724a could be higher than another support 3724b. A spacers 3726, for example, can be placed in between the support 3724b and the top layer 3708 or the bottom layer 3706 to offset any difference in height between supports. In an embodiment, the spacers 3726 include a material that can be "squished" or compressed to fit in the gap that results from any difference in height between support 3724a and support 3724b.

FIG. 105 illustrates an example circuit assembly 3800 including a plurality of stacked assemblies 3810, 3820, 3830, a plurality of wire bonds 3818, and a bottom layer 3806. Stacked assembly 3800 illustrates one embodiment of multiple stacked assemblies 3810, 3820, 3830 that can be assembled over and immediately adjacent to the bottom layer 3806. In an embodiment, stacked assembly 3820 fits at least partially in an overhang provided by stacked assembly 3810. The illustrated circuit assembly 3800 further includes wire bonds 3818 providing electrical communication between the stacked assembly 3810 and pads and/or traces on the bottom layer 3806, between stacked assembly 3810 and stacked assembly 3820, and between stacked assembly 3810 and stacked assembly 3830.

The circuit assemblies described herein can further include an overmold structure formed of a molding material.

The molding material is pliable and moldable in process and becomes hard when cured. In an embodiment, the overmold structure covers at least a portion of the top of the substrate and one or more components located on the top portion of the substrate, where the bottom surface of the substrate is free from the overmold structure in order to make electrical connections to the circuit assembly. In other embodiments, the overmold structure covers at least a portion of the bottom surface of the substrate and one or more components located on the bottom of the substrate. Electrical connections to the circuit assemblies described herein can be made from the top of the substrate.

FIG. 106 is an example block diagram of a system in a package (SiP) 3900 including a crystal 3908, a SoC 3902, and an FEIC 3904. The SiP 3900 further includes connectivity 3906 to provide signal interconnections, packaging 3912, such as a package substrate and/or an overmold, for packaging of the circuitry, and other circuitry 3910, such as load capacitors associated with the crystal 3908, filters, modulators, demodulators, down converters, the like, or any suitable combination thereof. The SiP 3900 can include any suitable features of one or more of the SiPs 2400, 2500, 2600, 2700, 2800, 2900, 3000, 3100, 3200, 3500, 3600, 3700, or 3800.

FIG. 107 is an example block diagram illustrating a wireless device 4000 including a SiP 4100, where the SiP 4100 includes a SoC 4102, an FEIC 4104, and a crystal 4108. In an embodiment, the wireless device 4000 includes a portable transceiver 4000. In an embodiment, SoC 4102 includes a baseband subsystem 4010, receiver 4070, and transmitter 4050. The crystal 4108 supplies clock information for the SoC 4102. In an embodiment, SiP 4100 includes any suitable features of one or more of the SiPs 2400, 2500, 2600, 2700, 2800, 2900, 3000, 3100, 3200, 3500, 3600, 3700, 3800, or 3900.

The illustrated wireless device 4000 includes a speaker 4002, a display 4004, a keyboard 4006, and a microphone 4008, all connected to the baseband subsystem 4010. A power source 4042, which may be a direct current (DC) battery or other power source, is also connected to the baseband subsystem 4010 to provide power to the wireless device 4000. In a particular embodiment, wireless device 4000 can be, for example but not limited to, a portable telecommunication device such as a mobile cellular telephone. The speaker 4002 and the display 4004 receive signals from baseband subsystem 4010. Similarly, the keyboard 4006 and the microphone 4008 supply signals to the baseband subsystem 4010. The keyboard 4006 can be implemented by a touch screen displayed by the display 4004 in certain implementations.

The baseband subsystem 4010 includes a microprocessor (μP) 4020, memory 4022, analog circuitry 4024, and a digital signal processor (DSP) 4026 in communication by way of bus 4028. Bus 4028, although shown as a single bus, may be implemented using multiple busses connected as desired among the subsystems within the baseband subsystem 4010. The baseband subsystem 4010 may also include one or more of an application specific integrated circuit (ASIC) 4032 or a field programmable gate array (FPGA) 4030.

The microprocessor 4020 and memory 4022 provide the signal timing, processing, and storage functions for wireless device 4000. The analog circuitry 4024 provides the analog processing functions for the signals within baseband subsystem 4010. In FIG. 107, the baseband subsystem 4010 provides control signals to a transmitter 4050, a receiver 4070, and a power amplifier circuit 4080.

A wireless device can include more or fewer components than illustrated in FIG. 107. The control signals provided by the baseband subsystem 4010 control the various components within the wireless device 4000. The function of the transmitter 4050 and the receiver 4070 may be integrated into a transceiver.

The illustrated baseband subsystem 4010 also includes an analog-to-digital converter (ADC) 4034 and digital-to-analog converters (DACs) 4036 and 4038. In this example, the DAC 4036 generates in-phase (I) and quadrature-phase (Q) signals provided to signal lines 4040 connected to a modulator 4052. The ADC 4034, the DAC 4036, and the DAC 4038 also communicate with the microprocessor 4020, the memory 4022, the analog circuitry 4024, and the DSP 4026 by way of bus 4028. The DAC 4036 converts the digital communication information within baseband subsystem 4010 into an analog signal for transmission to the modulator 4052 by way of connection 4040. Connection 4040, while shown as two directed arrows, carries the information that is to be transmitted by the transmitter 4050 after conversion from the digital domain to the analog domain.

The transmitter 4050 includes the modulator 4052, which modulates the analog information on connection 4040 and provides a modulated signal to upconverter 4054. The upconverter 4054 transforms the modulated signal to an appropriate transmit frequency and provides the upconverted signal to the power amplifier circuit 4080. The power amplifier circuit 4080 amplifies the signal to an appropriate power level for the system in which the wireless device 4000 is designed to operate.

The data on connection 4040 is generally formatted by the baseband subsystem 4010 into in-phase (I) and quadrature (Q) components. The I and Q components may take different forms and be formatted differently depending upon the communication standard being employed.

The front-end module 4104 includes the power amplifier (PA) circuit 4080 and a switch/low noise amplifier (LNA) circuit 4072 including a low noise amplifier. In an embodiment, the switch/low noise amplifier circuit 4072 further includes an antenna system interface that may include, for example, a diplexer (or a duplexer) having a filter pair that allows simultaneous passage of both transmit signals and receive signals.

The power amplifier circuit 4080 supplies the amplified transmit signal to the switch/low noise amplifier circuit 4072. The amplified transmit signal is supplied from the front-end module 4004 to the antenna 4060 when the switch is in the transmit mode.

A signal received by antenna 4060 will be provided from the switch/low noise amplifier circuit 4072 of the front-end module 4004 to the receiver 4070 when the switch is in the receive mode. The low noise amplifier amplifies the received signal.

If implemented using a direct conversion receiver (DCR), the downconverter 4074 converts the amplified received signal from an RF level to a baseband level (e.g., to a direct current (DC) level), or a near-baseband level (e.g., approximately 100 kHz). Alternatively, the amplified received RF signal may be downconverted to an intermediate frequency (IF) signal in certain applications. The downconverted signal is provided to the filter 4076. The filter 4076 includes at least one filter stage to filter the received downconverted signal.

The filtered signal is sent from the filter 4076 to the demodulator 4078. The demodulator 4078 recovers the transmitted analog information and supplies a signal representing this information by way of connection 4086 to the ADC 4034. The ADC 4034 converts the analog information to a digital signal at baseband frequency and the signal propagates by way of bus 4028 to the DSP 4026 for further processing.

Many other variations of stacked components than those described herein will be apparent from this disclosure. Different combinations of the components illustrated in SiPs 2400, 2500, 2600, 2700, 2800, 2900, 3000, 3100, 3200, 3500, 3600, 3700, or 3800 are possible to form a variety of SiPs that can be used in wireless devices to provide smaller footprints, reduced parasitic capacitance, decreased signal cross-coupling, the like, or any combination thereof.

APPLICATIONS, TERMINOLOGY, AND CONCLUSION

Any of the embodiments described herein can be implemented in association with wireless communications devices, such as any suitable Internet of Things (IoT) device. The principles and advantages of the embodiments can be implemented in any suitable systems, packaged module, integrated circuit, or the like that could benefit from any feature of one or more embodiments described herein. The teachings herein are applicable to a variety of systems. Examples of such systems include, but are not limited to, mobile phones, tablets, base stations, network access points, customer-premises equipment (CPE), IoT-enabled objects, laptops, and wearable electronics. Thus, the embodiments herein can be included in various electronic devices, including, but not limited to, consumer electronic products. Although this disclosure includes some example embodiments, the teachings described herein can be applied to a variety of structures. Any of the principles and advantages discussed herein can be implemented in association with radio frequency circuits configured to process signals in a range from about 30 kHz to 300 GHz, such as in a range from about 450 MHz to 6 GHz.

Aspects of this disclosure can be implemented in various electronic devices. Examples of the electronic devices can include, but are not limited to, consumer electronic products, parts of the consumer electronic products such as integrated circuits and/or packaged radio frequency modules, uplink wireless communication devices, wireless communication infrastructure, electronic test equipment, etc. Examples of the electronic devices can include, but are not limited to, a mobile phone such as a smart phone, a wearable computing device such as a smart watch or an ear piece, a telephone, a television, a computer monitor, a computer, a modem, a hand-held computer, a laptop computer, a tablet computer, a personal digital assistant (PDA), a microwave, a refrigerator, an automobile, a stereo system, a DVD player, a CD player, a digital music player such as an MP3 player, a radio, a camcorder, a camera, a digital camera, a portable memory chip, a washer, a dryer, a washer/dryer, a copier, a facsimile machine, a scanner, a multi-functional peripheral device, a wrist watch, a clock, etc. Further, the electronic devices can include unfinished products.

Unless the context requires otherwise, throughout the description and the claims, the words "comprise," "comprising," "include," "including" and the like are generally to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application when appropriate. Where the context permits, words in the above Detailed Description using the singular or plural number may also include the plural or singular number, respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and acts of the various embodiments described above can be combined to provide further embodiments. The accompanying claims and their equivalents are intended to cover such forms or modifications as would fall within the scope and spirit of the disclosure.

What is claimed is:

1. A packaged module comprising:
a package substrate;
a radio frequency shielding structure extending above the package substrate;
a front end integrated circuit positioned in an interior of the radio frequency shielding structure, the front end integrated circuit including a multi-mode power amplifier circuit that includes an input stage and a stacked output stage that is coupled to the input stage by way of an inter-stage matching network, the stacked output stage including a transistor stack of two or more transistors arranged in series with each other, and a bias circuit configured to bias the transistor stack such that the stacked output stage functions like there is at least one less transistor in the transistor stack in a second mode relative to a first mode; and
an antenna on the package substrate external to the radio frequency shielding structure.

2. The packaged module of claim 1 wherein the antenna is a configured to transmit a radio frequency signal from the multi-mode power amplifier circuit.

3. The packaged module of claim 1 wherein the antenna is a multi-layer antenna.

4. The packaged module of claim 1 wherein a first portion of the antenna is on a first side of the package substrate and a second portion of the antenna is on a second side of the package substrate, the second side opposing the first side.

5. The packaged module of claim 1 wherein the bias circuit is configured to bias a transistor of the transistor stack to a linear region of operation in the first mode, and as a switch in the second mode.

6. The packaged module of claim 5 wherein the second mode is associated with a lower power than the first mode.

7. The packaged module of claim 5 wherein the stacked output stage is configured to receive an output stage supply voltage and the input stage is configured to receive an input stage supply voltage, the output stage supply voltage having a lower voltage level in the second mode relative to the first mode, and the input stage supply voltage having substantially the same voltage level in the first and second modes.

8. The packaged module of claim 1 wherein the stacked output stage is operable in at least three different modes.

9. The packaged module of claim 1 wherein the transistor stack is configured to accommodate a larger maximum allowable voltage swing in the first mode than in the second mode.

10. The packaged module of claim 1 wherein the radio frequency shielding structure includes a plurality of wire bonds and a shielding layer substantially parallel to the package substrate, the wire bonds disposed between the antenna and the front end integrated circuit, and the wire bonds in contact with the shielding layer.

11. The packaged module of claim 1 wherein the radio frequency shielding structure includes wire bond walls disposed around at least two sides of the front end integrated circuit, and each of the wire bonds of the wire bond walls is at a ground potential.

12. The packaged module of claim 1 wherein the radio frequency shielding structure includes a shielding layer substantially parallel to the package substrate, the front end integrated circuit is disposed between the shielding layer and the package substrate, and the front end integrated circuit is fully covered by the shielding layer.

13. The packaged module of claim 12 further comprising a protective layer over the shielding layer such that the shielding layer is disposed between the protective layer and the front end integrated circuit.

14. The packaged module of claim 1 wherein the front end integrated circuit is a semiconductor-on-insulator die.

15. A wireless communication device comprising:
a packaged module including a radio frequency shielding structure; a front end integrated circuit positioned in an interior of the radio frequency shielding structure, the front end integrated circuit including a multi-mode power amplifier circuit that includes an input stage and a stacked output stage that is coupled to the input stage by way of an inter-stage matching network, the stacked output stage including a transistor stack of two or more transistors arranged in series with each other, and a bias circuit configured to bias the transistor stack such that the stacked output stage functions like there is at least one less transistor in the transistor stack in a second mode relative to a first mode; and an antenna external to the radio frequency shielding structure; and
a transceiver in communication with the front end integrated circuit.

16. The wireless communication device of claim 15 wherein the wireless communication device is an Internet of things device.

17. The wireless communication device of claim 15 wherein the front end integrated circuit further includes a low noise amplifier and multi-throw switch; the multi-throw switch is configured to electrically connect the low noise amplifier to the antenna in a first state and to electrically connect the multi-mode power amplifier circuit to the antenna in a second state; and the low noise amplifier includes a first inductor, an amplification circuit, and a second inductor magnetically coupled to the first inductor to provide negative feedback to linearize the low noise amplifier.

18. A method of radio frequency signal transmission, the method comprising:
amplifying a radio frequency signal with a multi-mode power amplifier circuit in a first mode, the multi-mode power amplifier circuit including an input stage and a stacked output stage that is coupled to the input stage by way of an inter-stage matching network, the stacked output stage including a transistor stack of two or more transistors arranged in series with each other, and the transistor stack including a transistor biased in a linear mode of operation in the first mode;
biasing the transistor of the transistor stack to operate as a switch for a second mode such that the stacked output stage functions like there is at least one less transistor in the transistor stack in the second mode relative to the first mode;
amplifying the radio frequency signal with the multi-mode power amplifier circuit in the second mode; and
transmitting the radio frequency with an antenna of a packaged module, the antenna being positioned external to a radio frequency shielding structure of the packaged module, and the multi-mode power amplifier circuit being positioned in an interior of the radio frequency shielding structure of the packaged module.

19. The method of claim 18 further comprising a supply voltage to the stacked output stage such that the supply voltage has a higher voltage level in the first mode than in the second mode.

20. The method of claim 18 wherein the radio frequency shielding structure includes a plurality of wire bonds disposed between the antenna and a front end integrated circuit that includes the multi-mode power amplifier circuit.

* * * * *